US012787635B2

(12) United States Patent
Lee et al.

(10) Patent No.: US 12,787,635 B2
(45) Date of Patent: *Nov. 3, 2026

(54) COMPOSITION, LAYER INCLUDING THE COMPOSITION, LIGHT-EMITTING DEVICE INCLUDING THE COMPOSITION, AND ELECTRONIC APPARATUS INCLUDING THE LIGHT-EMITTING DEVICE

(71) Applicant: SAMSUNG DISPLAY CO., LTD., Yongin-si (KR)

(72) Inventors: Kum Hee Lee, Suwon-si (KR); Byungjoon Kang, Seoul (KR); Seungyeon Kwak, Suwon-si (KR); Myungsun Sim, Suwon-si (KR); Banglin Lee, Suwon-si (KR); Sunghun Lee, Hwaseong-si (KR); Jeoungin Yi, Seoul (KR); Byoungki Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1102 days.

This patent is subject to a terminal disclaimer.

(21) Appl. No.: 17/837,109

(22) Filed: Jun. 10, 2022

(65) Prior Publication Data

US 2023/0054166 A1 Feb. 23, 2023

(30) Foreign Application Priority Data

Jun. 11, 2021 (KR) ........................ 10-2021-0076312
Jun. 9, 2022 (KR) ........................ 10-2022-0070184

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 8,330,351 B2 12/2012 Adamovich et al.
8,426,042 B2 4/2013 Takada et al.
(Continued)

FOREIGN PATENT DOCUMENTS

CN 101916829 A 12/2010
EP 2465912 A1 6/2012
(Continued)

OTHER PUBLICATIONS

KR Office Action issued Jul. 3, 2024 of KR Patent Application No. 10-2022-0070184.
(Continued)

*Primary Examiner* — Tae H Yoon
(74) *Attorney, Agent, or Firm* — CANTOR COLBURN LLP

(57) ABSTRACT

A composition, including a first compound represented by Formula 1 and a second compound represented by Formula 2:

$$Ir(L_{11})_{n11}(L_{12})_{n12}(L_{13})_{n13} \quad \text{Formula 1}$$

$$Ir(L_{21})_{n21}(L_{22})_{n22}(L_{23})_{n23} \quad \text{Formula 2}$$

wherein $L_{11}$, $L_{12}$, $L_{13}$, $L_{21}$, $L_{22}$, and $L_{23}$ are each i) a bidentate ligand bonded to Ir of Formula 1 or 2 via two nitrogen atoms, ii) a bidentate ligand bonded to Ir of Formula 1 or 2 via a nitrogen atom and a carbon atom, or iii) a bidentate ligand bonded to Ir of Formula 1 or 2 via two (Continued)

carbon atoms, $L_{11}$, $L_{12}$, and $L_{13}$ are different from one another; n11, n12, n21, and n22 are each independently 1 or 2; n13 and n23 are each independently 0 or 1; a sum of n11, n12, and n13 is 3; a sum of n21, n22, and n23 is 3; and $L_{11}$ and $L_{21}$ are different from each other.

17 Claims, 1 Drawing Sheet

(51) Int. Cl.
*C09K 11/06* (2006.01)
*H10K 85/30* (2023.01)
*H10K 85/40* (2023.01)
*H10K 50/11* (2023.01)

(52) U.S. Cl.
CPC ...... *H10K 85/40* (2023.02); *C09K 2211/1029* (2013.01); *C09K 2211/1048* (2013.01); *C09K 2211/185* (2013.01); *H10K 50/11* (2023.02)

(56) References Cited

U.S. PATENT DOCUMENTS

| | | | |
|---|---|---|---|
| 8,431,243 B2 | 4/2013 | Kwong et al. | |
| 9,064,822 B2 | 6/2015 | Park et al. | |
| 9,212,197 B2 * | 12/2015 | Kottas | C07F 15/0033 |
| 9,331,299 B2 | 5/2016 | Xu et al. | |
| 9,570,701 B2 | 2/2017 | Lee | |
| 9,655,199 B2 | 5/2017 | Weaver et al. | |
| 9,685,617 B2 | 6/2017 | Beers et al. | |
| 11,459,348 B2 | 10/2022 | Kwak et al. | |
| 2003/0218418 A9 | 11/2003 | Sato et al. | |
| 2004/0137267 A1 | 7/2004 | Igarashi et al. | |
| 2008/0203360 A1 | 8/2008 | Jung et al. | |
| 2011/0089821 A1 | 4/2011 | Furugori et al. | |
| 2011/0227049 A1 | 9/2011 | Xia et al. | |
| 2012/0292600 A1 | 11/2012 | Kottas et al. | |
| 2012/0319146 A1 | 12/2012 | Adamovich et al. | |
| 2014/0197389 A1 | 7/2014 | Adamovich et al. | |
| 2015/0228697 A1 | 8/2015 | Liu et al. | |
| 2015/0295198 A1 | 10/2015 | Xu et al. | |
| 2015/0295199 A1 | 10/2015 | Yamamoto et al. | |
| 2015/0318506 A1 | 11/2015 | Zhou et al. | |
| 2016/0071625 A1 | 3/2016 | Kita et al. | |
| 2016/0079548 A1 | 3/2016 | Kita et al. | |
| 2016/0093814 A1 | 3/2016 | Hwang et al. | |
| 2018/0013077 A1 | 1/2018 | Boudreault et al. | |
| 2018/0287070 A1 | 10/2018 | Ji et al. | |
| 2018/0342680 A1 | 11/2018 | Adamovich et al. | |
| 2018/0374409 A1 | 12/2018 | Lee et al. | |
| 2019/0006608 A1 | 1/2019 | Koo et al. | |
| 2019/0157354 A1 | 5/2019 | Lee et al. | |
| 2019/0165292 A1 | 5/2019 | Hong et al. | |
| 2019/0326526 A1 | 10/2019 | Kwak et al. | |
| 2020/0071346 A1 | 3/2020 | Choi et al. | |
| 2020/0212319 A1 | 7/2020 | Choi et al. | |
| 2020/0308202 A1 | 10/2020 | Cho et al. | |
| 2020/0335708 A1 | 10/2020 | Lee et al. | |
| 2021/0083205 A1 | 3/2021 | Hwang et al. | |
| 2021/0104691 A1 | 4/2021 | Lee et al. | |
| 2021/0355148 A1 | 11/2021 | Choi et al. | |
| 2022/0402952 A1 | 12/2022 | Kwak et al. | |
| 2023/0025356 A1 | 1/2023 | Lee et al. | |
| 2023/0050840 A1 | 2/2023 | Yi et al. | |
| 2023/0054166 A1 | 2/2023 | Lee et al. | |
| 2023/0105127 A1 | 4/2023 | Kwak et al. | |
| 2023/0112032 A1 | 4/2023 | Sim et al. | |
| 2023/0134873 A1 | 5/2023 | Kim et al. | |
| 2023/0371359 A1 | 11/2023 | Hwang et al. | |

FOREIGN PATENT DOCUMENTS

| | | | |
|---|---|---|---|
| EP | 2927234 | A1 | 10/2015 |
| JP | 2003068465 | A | 3/2003 |
| JP | 2003077674 | A | 3/2003 |
| JP | 2004221065 | A | 8/2004 |
| JP | 2004319456 | A | 11/2004 |
| JP | 2013243236 | A | 12/2013 |
| KR | 20060086541 | A | 8/2006 |
| KR | 101357943 | B1 | 2/2014 |
| KR | 1020160090780 | A | 8/2016 |
| KR | 1020190115422 | A | 10/2019 |
| KR | 1020190123238 | A | 10/2019 |
| KR | 1020200027896 | A | 3/2020 |
| KR | 1020200083198 | A | 7/2020 |
| KR | 102149685 | B1 | 9/2020 |
| KR | 20200107830 | A | 9/2020 |
| KR | 1020200115008 | A | 10/2020 |
| KR | 1020200122194 | A | 10/2020 |
| KR | 1020210141385 | A | 11/2021 |
| WO | 02104080 | A1 | 12/2002 |
| WO | 2005112520 | A1 | 11/2005 |
| WO | WO 2013161739 | A1 * | 10/2013 |

OTHER PUBLICATIONS

Extended European Search Report issued dated Oct. 6, 2022 of EP Patent Application No. 22178099.2.

Extended European Search Report issued Dec. 22, 2022 of EP Patent Application No. 22178153.7.

Lamansky, Sergey, et al. "Highly phosphorescent bis-cyclometalated iridium complexes: synthesis, photophysical characterization, and use in organic light emitting diodes." Journal of the American Chemical Society 123.18 (2001): 4304-4312. (Year: 2001).

Office Action issued Dec. 26, 2024 of CN Patent Application No. 202210659937.4.

Office Action issued Oct. 26, 2024 of KR Patent Application No. 10-2021-0076311.

Tian-Yi Li et al., "Rational design of phosphorescent iridium(III) complexes for emissioncolor tunability and their applications in OLEDs," Coordination Chemistry Reviews, Jul. 10, 2018, pp. 55-92, vol. 374.

Watanabe, Yuichiro, Hisahiro Sasabe, and Junji Kida. "Review of molecular engineering for horizontal molecular orientation in organic light-emitting devices." Bulletin of the Chemical Society of Japan 92.3 (2019): 716-728. (Year: 2019).

* cited by examiner

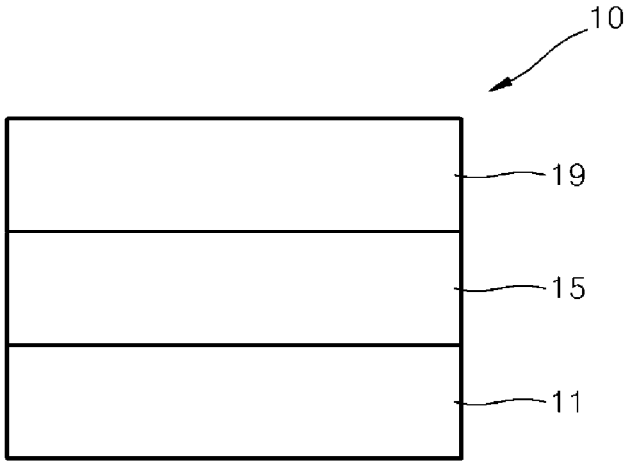
10
19
15
11

COMPOSITION, LAYER INCLUDING THE COMPOSITION, LIGHT-EMITTING DEVICE INCLUDING THE COMPOSITION, AND ELECTRONIC APPARATUS INCLUDING THE LIGHT-EMITTING DEVICE

CROSS-REFERENCE TO RELATED APPLICATION

This application claims priority to Korean Patent Applications Nos. 10-2021-0076312, filed on Jun. 11, 2021, and 10-2022-0070184, filed on Jun. 9, 2022, both in the Korean Intellectual Property Office, and all benefits accruing therefrom under 35 U.S.C. § 119, the entire contents of which are incorporated by reference herein.

BACKGROUND

1. Field

Provided are a composition, a layer including the composition, a light-emitting device including the composition, and an electronic apparatus including the light-emitting device.

2. Description of the Related Art

From among light-emitting devices, organic light-emitting devices (OLEDs) are self-emissive devices, which have improved characteristics in terms of viewing angles, response time, luminance, driving voltage, and response speed, and produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

Provided are a composition capable of providing excellent luminescence efficiency and lifespan characteristics and the like, a layer including the composition, a light-emitting device including the composition, an electronic apparatus including the light-emitting device.

Additional aspects will be set forth in part in the description, which follows and, in part, will be apparent from the description, or may be learned by practice of the presented embodiments as described herein.

According to an aspect, provided is a composition including a first compound represented by Formula 1 and a second compound represented by Formula 2.

$$Ir(L_{11})_{n11}(L_{12})_{n12}(L_{13})_{n13} \quad \text{Formula 1}$$

$$Ir(L_{21})_{n21}(L_{22})_{n22}(L_{23})_{n23} \quad \text{Formula 2}$$

wherein, in Formulae 1 and 2, $L_{11}$, $L_{12}$, $L_{13}$, $L_{21}$, $L_{22}$, and $L_{23}$ are each:

i) a bidentate ligand bonded to iridium (Ir) of Formula 1 via two nitrogen atoms, or a bidentate ligand bonded to iridium of Formula 2 via two nitrogen atoms, ii) a bidentate ligand bonded to iridium of Formula 1 via a nitrogen atom and a carbon atom, or a bidentate ligand bonded to iridium of Formula 2 via a nitrogen atom and a carbon atom, or iii) a bidentate ligand bonded to iridium of Formula 1 via two carbon atoms, or a bidentate ligand bonded to iridium of Formula 2 via two carbon atoms, $L_{11}$, $L_{12}$, and $L_{13}$ are different from one another, n11 and n12 are each independently 1 or 2, n13 is 0 or 1, the sum of n11, n12, and n13 is 3, $L_{21}$, $L_{22}$, and $L_{23}$ are different from one another, n21 and n22 are each independently 1 or 2, n23 is 0 or 1, the sum of n21, n22, and n23 is 3, and $L_{11}$ and $L_{21}$ are different from each other.

According to another aspect, provided is a layer including the composition described herein.

According to another aspect, provided is a light-emitting device including a first electrode, a second electrode, and an organic layer located between the first electrode and the second electrode, wherein the organic layer includes an emission layer, and wherein the organic layer includes the composition described herein.

In one or more embodiments, the emission layer of the light-emitting device may include the composition described herein.

According to another aspect, provided is an electronic apparatus including the light-emitting device described herein.

BRIEF DESCRIPTION OF THE DRAWING

The above and other aspects, features, and advantages of certain embodiments will be more apparent from the following description taken in conjunction with the accompanying drawings, in which The FIGURE shows a schematic cross-sectional view of a light-emitting device according to aspects of one or more embodiments.

DETAILED DESCRIPTION

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

A composition according to one or more embodiments includes a first compound represented by Formula 1 and a second compound represented by Formula 2:

$$Ir(L_{11})_{n11}(L_{12})_{n12}(L_{13})_{n13}$$ Formula 1

$$Ir(L_{21})_{n21}(L_{22})_{n22}(L_{23})_{n23}$$ Formula 2 wherein each of Formulae 1 and 2 includes one iridium (Ir).

Each of the first compound and the second compound may be electrically neutral.

In Formulae 1 and 2, $L_{11}$, $L_{12}$, $L_{13}$, $L_{21}$, $L_{22}$, and $L_{23}$ are each independently:

i) a bidentate ligand bonded to iridium (Ir) of Formula 1 via two nitrogen atoms, or a bidentate ligand bonded to iridium of Formula 2 via two nitrogen atoms, ii) a bidentate ligand bonded to iridium of Formula 1 via a nitrogen atom and a carbon atom, or a bidentate ligand bonded to iridium of Formula 2 via a nitrogen atom and a carbon atom, or iii) a bidentate ligand bonded to iridium of Formula 1 via two carbon atoms, or a bidentate ligand bonded to iridium of Formula 2 via two carbon atoms.

In one or more embodiments, in Formulae 1 and 2, $L_{11}$, $L_{12}$, $L_{13}$, $L_{21}$, $L_{22}$, and $L_{23}$ may each be a bidentate ligand bonded to iridium in Formula 1 or 2 via a nitrogen atom and a carbon atom.

$L_{11}$, $L_{12}$, and $L_{13}$ in Formula 1 are different from one another.

In Formula 1, n11 and n12 are each independently 1 or 2, and n13 is 0 or 1. The sum of n11, n12, and n13 is 3.

In one or more embodiments, in Formula 1, i) n11 may be 1, n12 may be 2, and n13 may be 0; or ii) n11 may be 2, n12 may be 1, and n13 may be 0.

$L_{21}$, $L_{22}$, and $L_{23}$ in Formula 2 are different from one another.

In Formula 2, n21 and n22 re each independently 1 or 2, and n23 is 0 or 1. The sum of n21, n22, and n23 is 3.

In one or more embodiments, in Formula 2, i) n21 may be 1, n22 may be 2, and n23 may be 0; or ii) n21 may be 2, n22 may be 1, and n23 may be 0.

Each of the first compound and the second compound may be a heteroleptic complex.

In one or more embodiments, n13 in Formula 1 may be 0, and n23 in Formula 2 may be 0.

In Formulae 1 and 2, $L_{11}$ may be a ligand represented by Formula 1-1, $L_{12}$ may be a ligand represented by Formula 1-2, $L_{13}$ may be a ligand represented by Formula 1-1 or a ligand represented by Formula 1-2, $L_{21}$ may be a ligand represented by Formula 2-1, $L_{22}$ may be a ligand represented by Formula 2-2, and $L_{23}$ may be a ligand represented by Formula 2-1 or a ligand represented by Formula 2-2:

Formula 1-1

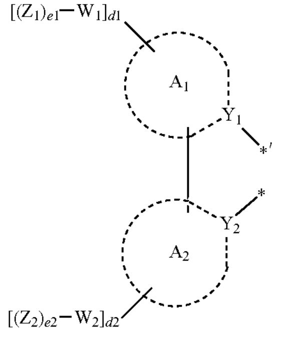

-continued

Formula 1-2

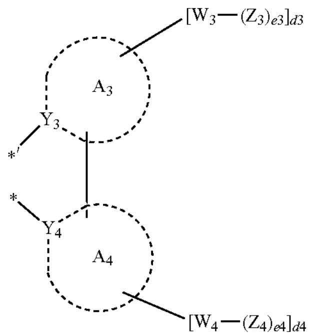

Formula 2-1

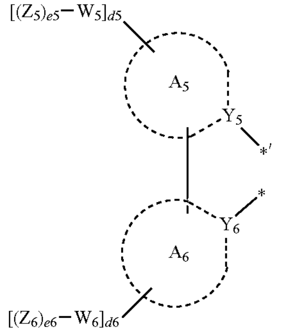

Formula 2-2

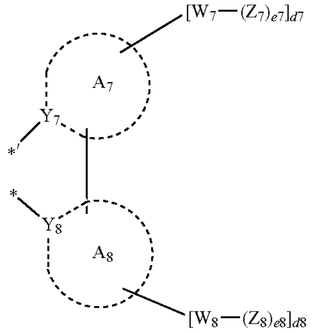

wherein $Y_1$ to $Y_8$ in Formulae 1-1, 1-2, 2-1, and 2-2 may each independently be N or C.

In one or more embodiments, $Y_1$, $Y_3$, $Y_5$, and $Y_7$ may be N, and $Y_2$, $Y_4$, $Y_6$, and $Y_8$ may be C.

In one or more embodiments, i) $Y_1$ and $Y_2$ may each be C, ii) $Y_3$ and $Y_4$ may each be C, iii) $Y_5$ and $Y_6$ may each be C, or iv) $Y_7$ and $Y_8$ may each be C.

In Formulae 1, 2, 1-1, 1-2, 2-1, and 2-2, i) a bond between $Y_1$ and iridium, a bond between $Y_3$ and iridium, a bond between $Y_5$ and iridium, and a bond between $Y_7$ and iridium may each be a coordinate bond, and ii) a bond between $Y_2$ and iridium, a bond between $Y_4$ and iridium, a bond between $Y_6$ and iridium, and a bond between $Y_8$ and iridium may each be a covalent bond. Thus, each of the first compound and the second compound may be electrically neutral.

In Formulae 1-1, 1-2, 2-1, and 2-2, ring $A_1$, ring $A_2$, ring $A_3$, ring $A_4$, ring $A_5$, ring $A_6$, ring $A_7$, and ring $A_8$ may each independently be a $C_5$-$C_{30}$ carbocyclic group or a $C_1$-$C_{30}$ heterocyclic group.

In one or more embodiments, i) ring $A_1$, ring $A_3$, ring $A_5$, and ring $A_7$ may each be a $C_1$-$C_{30}$ heterocyclic group, and ii) ring $A_2$, ring $A_4$, ring $A_6$, and ring $A_8$ may each independently be a $C_5$-$C_{30}$ carbocyclic group or a $C_1$-$C_{30}$ heterocyclic group.

In one or more embodiments, i) ring $A_1$, ring $A_3$, ring $A_5$, and ring $A_7$ may each be a $C_1$-$C_{30}$ heterocyclic group, ii) ring $A_2$, ring $A_4$, ring $A_6$, and ring $A_8$ may each independently be a $C_5$-$C_{30}$ carbocyclic group or a $C_1$-$C_{30}$ heterocyclic group, iii) $Y_1$, $Y_3$, $Y_5$, and $Y_7$ may each be N, and iv) $Y_2$, $Y_4$, $Y_6$, and $Y_8$ may each be C.

In one or more embodiments, in Formulae 1-1, 1-2, 2-1, and 2-2, ring $A_1$, ring $A_3$, ring $A_5$, and ring $A_7$ may each independently be i) ring T1, ii) a condensed ring in which two or more ring T1 are condensed with each other, or iii) a condensed ring in which at least one ring T1 and at least one ring T2 are condensed with each other, ring T1 may be a pyridine group, a pyrimidine group, a pyrazine group, a pyridazine group, a triazine group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and ring T2 may be a cyclopentane group, a cyclopentene group, a furan group, a thiophene group, a pyrrole group, a silole group, a borole group, a phosphole group, a germole group, a selenophene group, an adamantane group, a norbornane group, a norbornene group, a cyclohexane group, a cyclohexene group, or a benzene group.

In one or more embodiments, in Formulae 1-1, 1-2, 2-1, and 2-2, ring $A_2$, ring $A_4$, ring $A_6$, and ring $A_8$ may each be i) a first ring, ii) a second ring, iii) a condensed ring in which two or more first rings are condensed with each other, iv) a condensed ring in which two or more second rings are condensed with each other, or v) a condensed ring in which at least one first ring and at least one second ring are condensed with each other, the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, in Formulae 1-1, 1-2, 2-1, and 2-2, ring $A_1$, ring $A_3$, ring $A_5$, and ring $A_7$ may each independently be an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an iso-oxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidino pyrrole group, a pyrimidino pyrazole group, a pyrimidino imidazole group, a pyrimidino oxazole group, a pyrimidino isoxazole group, a pyrimidino thiazole group, a pyrimidino isothiazole group, a pyrimidino oxadiazole group, a pyrimidinothiadiazole group, a naphthopyrrole group, a naphthopyrazole group, a naphthoimidazole group, a naphthooxazole group, a naphthoisoxazole group, a naphthothiazole group, a naphthoisothiazole group, a naphthooxadiazole group, a naphthothiadiazole group, a phenanthrenopyrrole group, a phenanthrenopyrazole group, a phenanthrenoimidazole group, a phenanthrenooxazole group, a phenanthrenoisoxazole group, a phenanthrenothiazole group, a phenanthrenoisothiazole group, a phenanthrenooxadiazole group, a phenanthrenothiadiazole group, a 5,6,7,8-tetrahydroisoquinoline group, a 5,6,7,8-tetrahydroquinoline group, a pyridine group condensed with a cyclohexane group, or a pyridine group condensed with a norbornane group.

In one or more embodiments, in Formulae 1-1, 1-2, 2-1, and 2-2, ring $A_2$, ring $A_4$, ring $A_6$, and ring $A_8$ may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an iso-oxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a naphthopyrrole group, a naphthopyrazole group, a naphthoimidazole group, a naphthooxazole group, a naphthoisoxazole group, a naphthothiazole group, a naphthoisothiazole group, a naphthooxadiazole group, a naphthothiadiazole group, a phenanthrenopyrrole group, a phenanthrenopyrazole group, a phenanthrenoimidazole group, a phenanthrenooxazole group, a phenanthrenoisoxazole group, a phenanthrenothiazole group, a phenanthrenoisothiazole group, a phenanthrenooxadiazole group, a phenanthrenothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

Ring $A_1$ and ring $A_3$ in Formulae 1-1 and 1-2 may be different from each other.

In one or more embodiments, a $Y_1$-containing monocyclic group in ring $A_1$, a $Y_2$-containing monocyclic group in ring $A_2$, and a $Y_4$-containing monocyclic group in ring $A_4$ may each be a 6-membered ring. In other words, ring $A_1$, ring $A_2$, and ring $A_4$ may each comprise a 6-membered ring. For example, ring $A_1$ and ring $A_2$ may each be a 6-membered ring, and ring $A_4$ may comprise a 6-membered ring.

In one or more embodiments, a $Y_3$-containing monocyclic group in ring $A_3$ may be a 6-membered ring. In other words, ring $A_3$ may comprise a 6-membered ring.

In one or more embodiments, a $Y_3$-containing monocyclic group in ring $A_3$ may be a 5-membered ring. In other words, ring $A_3$ may comprise a 5-membered ring.

In one or more embodiments, a $Y_1$-containing monocyclic group in ring $A_1$ may be a 6-membered ring, and a $Y_3$-containing monocyclic group in ring $A_3$ may be a 5-membered ring. In other words, ring $A_1$ may comprise a 6-membered ring and ring $A_3$ may comprise a 5-membered ring. For example, ring $A_1$ may be a 6-membered ring and ring $A_3$ may comprise a 5-membered ring.

Ring $A_5$ and ring $A_7$ in Formulae 2-1 and 2-2 may be identical to each other.

In one or more embodiments, a $Y_5$-containing monocyclic group in ring $A_5$, a $Y_6$-containing monocyclic group in ring $A_6$, and a $Y_8$-containing monocyclic group in ring $A_8$ may each be a 6-membered ring. In other words, ring $A_5$, ring $A_6$, and ring $A_8$ may each comprise a 6-membered ring. For example, ring $A_5$ and ring $A_6$ may each be a 6-membered ring, and ring $A_8$ may comprise a 6-membered ring.

In one or more embodiments, a $Y_7$-containing monocyclic group in ring $A_7$ may be a 6-membered ring. In other words, ring $A_7$ may comprise a 6-membered ring. For example, ring $A_7$ may be a 6-membered ring.

In one or more embodiments, a $Y_7$-containing monocyclic group in ring $A_7$ may be a 5-membered ring. In other words, ring $A_7$ may comprise a 5-membered ring. For example, ring $A_7$ may be a 5-membered ring.

In one or more embodiments, a $Y_5$-containing monocyclic group in ring $A_5$ and a $Y_7$-containing monocyclic group in ring $A_7$ may each be a 6-membered ring.

In one or more embodiments, ring $A_1$, ring $A_3$, ring $A_5$, and ring $A_7$ in Formulae 1-1, 1-2, 2-1, and 2-2 may each independently be i) an A group, ii) a polycyclic group in which two or more A groups are condensed with each other, or iii) a polycyclic group in which at least one A group and at least one B group are condensed with each other, the A group may be a pyridine group, a pyrimidine group, a pyridazine group, a pyrazine group, or a triazine group, and the B group may be a cyclohexane group, a cyclohexene group, a norbornane group, a benzene group, a furan group, a thiophene group, a selenophene group, a pyrrole group, a cyclopentadiene group, or a silole group.

In one or more embodiments, in Formulae 1-2 and 2-2, ring $A_3$ and ring $A_7$ may each independently be i) a C group, ii) a polycyclic group in which two or more C groups are condensed with each other, or iii) a polycyclic group in which at least one C group and at least one D group are condensed with each other, the C group may be a pyrrole group, a pyrazole group, an imidazole group, a triazole group, an oxazole group, an isoxazole group, a thiazole group, or an isothiazole group, and the D group may be a cyclohexane group, a cyclohexene group, a norbornane group, a benzene group, a furan group, a thiophene group, a selenophene group, a cyclopentadiene group, a silole group, a pyridine group, a pyrimidine group, a pyridazine group, a pyrazine group, or a triazine group.

In one or more embodiments, ring $A_1$ and ring $A_5$ in Formulae 1-1 and 2-1 may each independently be:

a pyridine group, a pyrimidine group, a pyridazine group, or a pyrazine group; or a pyridine group, a pyrimidine group, a pyridazine group, or a pyrazine group, each condensed with at least one of a cyclohexane group, a norbornane group, a benzene group, or a combination thereof.

In one or more embodiments, ring $A_3$ and ring $A_7$ in Formulae 1-2 and 2-2 may each independently be:

a pyridine group, a pyrimidine group, a pyridazine group, or a pyrazine group;

a pyridine group, a pyrimidine group, a pyridazine group, or a pyrazine group, each condensed with at least one of a cyclohexane group, a norbornane group, a benzene group, or a combination thereof; or an imidazole group, a benzimidazole group, a naphthoimidazole group, a phenanthrenoimidazole group, a pyridinooimidazole group, an oxazole group, a benzoxazole group, a naphthooxazole group, a phenanthrenooxazole group, a pyridinoooxazole group, a thiazole group, a benzothiazole group, a naphthothiazole group, a phenanthrenothiazole group, or a pyridinoothiazole group.

In one or more embodiments, ring $A_2$ and ring $A_4$ in Formulae 1-1 and 1-2 may be different from each other.

In one or more embodiments, ring $A_6$ and ring $A_8$ in Formulae 2-1 and 2-2 may be different from each other.

In one or more embodiments, ring $A_2$, ring $A_4$, ring $A_6$, and ring $A_8$ in Formulae 1-1, 1-2, 2-1, and 2-2 may each independently be i) an E group, ii) a polycyclic group in which two or more E groups are condensed with each other, or iii) a polycyclic group in which at least one E group and at least one F group are condensed with each other, the E group may be a benzene group, a pyridine group, a pyrimidine group, a pyridazine group, a pyrazine group, or a triazine group, and the F group may be a furan group, a thiophene group, a selenophene group, a pyrrole group, a cyclopentadiene group, a silole group, a pyrazole group, an imidazole group, an oxazole group, a thiazole group, an isoxazole group, or an isothiazole group.

In one or more embodiments, ring $A_2$ in Formula 1-1 may be a polycyclic group in which two or more E groups and at least one F group are condensed with each other.

In one or more embodiments, ring $A_4$ in Formula 1-2 may be a polycyclic group in which two or more E groups and at least one F group are condensed with each other.

In one or more embodiments, ring $A_6$ in Formula 2-1 may be a polycyclic group in which two or more E groups and at least one F group are condensed with each other.

In one or more embodiments, ring $A_8$ in Formula 2-2 may be a polycyclic group in which two or more E groups and at least one F group are condensed with each other.

In one or more embodiments, ring $A_2$ and ring $A_6$ in Formulae 1-1 and 2-1 may each independently be:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with at least one of a cyclohexane group, a norbornane group, a benzene group, or a combination thereof.

In one or more embodiments, ring $A_4$ and ring $A_8$ in Formulae 1-2 and 2-2 may each independently be:

a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, an azadibenzosilole group or a phenanthrobenzofuran group; or a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or an azadibenzosilole group, each condensed with at least one of a benzene group, a pyridine group, a pyrimidine group, a pyridazine group, a pyrazine group, a cyclohexane group, a norbornane group, a furan group, a thiophene group, a selenophene group, a pyrrole group, a cyclopentadiene group, a silole group, a pyrazole group, an imidazole group, an oxazole group, a thiazole group, an isoxazole group, an isothiazole group, or a combination thereof.

$W_1$ to $W_8$ in Formulae 1-1, 1-2, 2-1, and 2-2 may each independently be a single bond, a $C_1$-$C_{20}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, $W_1$ to $W_8$ in Formulae 1-1, 1-2, 2-1, and 2-2 may each independently be:

a single bond; or a $C_1$-$C_{20}$ alkylene group, a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In one or more embodiments, $W_1$ to $W_8$ in Formulae 1-1, 1-2, 2-1, and 2-2 may each independently be:

a single bond; or a benzene group, a naphthalene group, a pyridine group, a fluorene group, a carbazole group, a dibenzofuran group, or a dibenzothiophene group, each unsubstituted or substituted with at least one $R_{10a}$.

In one or more embodiments, $W_1$ to $W_8$ in Formulae 1-1, 1-2, 2-1, and 2-2 may each independently be:

a single bond; or a $C_1$-$C_{20}$ alkylene group, a benzene group, a naphthalene group, a dibenzofuran group, or a dibenzothiophene group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

$Z_1$ to $Z_8$ in Formulae 1-1, 1-2, 2-1, and 2-2 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$). $Q_1$ to $Q_9$ are respectively as described herein.

In one or more embodiments, $Z_1$ to $Z_8$ in Formulae 1-1, 1-2, 2-1, and 2-2 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_1$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl) phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a deuterated phenyl group, a fluorinated phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), wherein $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, $Z_1$ to $Z_8$ in Formulae 1-1, 1-2, 2-1, and 2-2 may each independently be:

hydrogen, deuterium, —F, or a cyano group;

a $C_1$-$C_{20}$ alkyl group that is unsubstituted or substituted with at least one of deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof;

a $C_3$-$C_{10}$ cycloalkyl group, a $C_1$-$C_{10}$ a heterocycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with at least one of deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_1$-$C_{20}$ alkylthio group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or a combination thereof; or —Si($Q_3$)($Q_4$)($Q_5$) or —Ge($Q_3$)($Q_4$)($Q_5$).

In one or more embodiments, in Formula 1-1, e1 and d1 may each not be 0, and one or more $Z_1$(s) may each independently be:

a $C_1$-$C_{20}$ alkyl group that is unsubstituted or substituted with at least one of deuterium, —F, a phenyl group, or a combination thereof;

—Si($Q_3$)($Q_4$)($Q_5$); or

—Ge($Q_3$)($Q_4$)($Q_5$).

$Q_3$ to $Q_5$ are respectively as described herein.

In one or more embodiments, in Formula 2-1, e5 and d5 may each not be 0, and one or more $Z_5$(s) may each independently be:

a $C_1$-$C_{20}$ alkyl group that is unsubstituted or substituted with at least one of deuterium, —F, a phenyl group, or a combination thereof;

—Si($Q_3$)($Q_4$)($Q_5$); or

—Ge($Q_3$)($Q_4$)($Q_5$).

$Q_3$ to $Q_5$ are respectively as described herein.

In one or more embodiments, $Q_3$ to $Q_5$ may each independently be:

a $C_1$-$C_{60}$ alkyl group unsubstituted or substituted with at least one of deuterium, a $C_1$-$C_{60}$ alkyl group, a $C_6$-$C_{60}$ aryl group, or a combination thereof; or a $C_6$-$C_{60}$ aryl group unsubstituted or substituted with at least one of deuterium, a $C_1$-$C_{60}$ alkyl group, a $C_6$-$C_{60}$ aryl group, or a combination thereof.

In one or more embodiments, $Q_3$ to $Q_5$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

In one or more embodiments, $Q_3$ to $Q_5$ may be identical to each other (i.e., the same).

In one or more embodiments, two or more of $Q_3$ to $Q_5$ may be different from each other.

In one or more embodiments, $Z_1$ to $Z_8$ in Formulae 1-1, 1-2, 2-1, and 2-2 may each independently be: hydrogen, deuterium, —F, —$CH_3$, —$CD_3$, —$CD_2H$, —$CDH_2$, —$CF_3$, —$CF_2H$, —$CFH_2$, a $C_1$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-227, a group represented by one of Formulae 9-201 to 9-227 in which at least one hydrogen is substituted with deuterium, a group represented by one of Formulae 9-201 to 9-227 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —Si($Q_3$)($Q_4$)($Q_5$), or —Ge($Q_3$)($Q_4$)($Q_5$), wherein $Q_3$ to $Q_5$ are respectively as described herein:

9-1

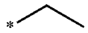

9-2

9-3

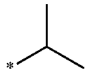

9-4

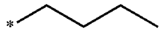

9-5

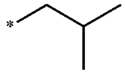

9-6

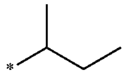

9-7

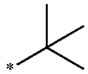

9-8

9-9

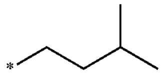

9-10

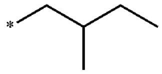

9-11

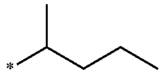

9-12

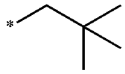

9-13

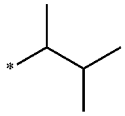

9-14

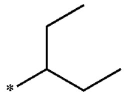

9-15

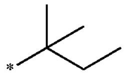

9-16

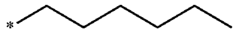

9-17

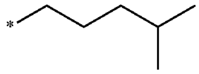

-continued 9-18

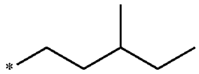

9-19

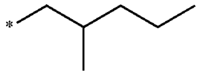

9-20

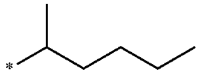

9-21

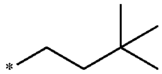

9-22

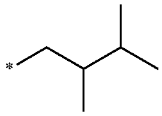

9-23

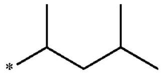

9-24

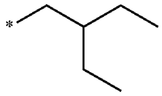

9-25

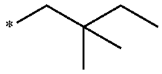

9-26

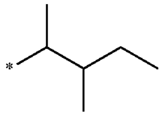

9-27

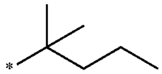

9-28

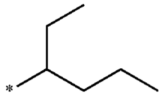

9-29

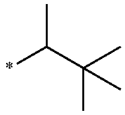

9-30

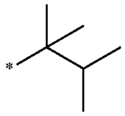

9-31

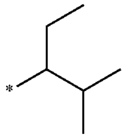

9-32

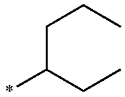

-continued
9-33
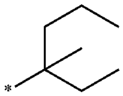
9-34
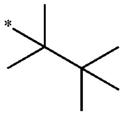
9-35
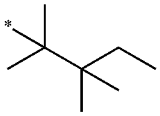
9-36
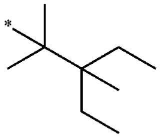
9-37
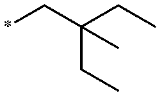
9-38
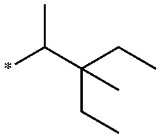
9-39
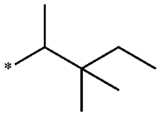
9-201
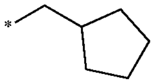
9-202
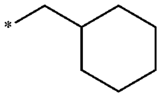
9-203
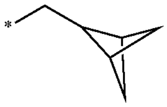
9-204
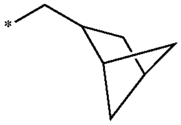
9-205
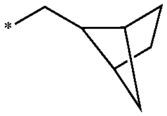
-continued
9-206
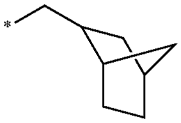
9-207
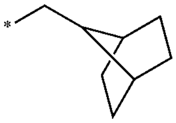
9-208
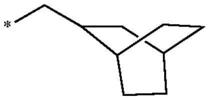
9-209
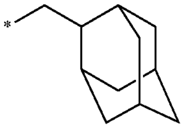
9-210
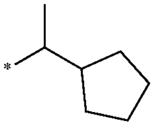
9-211
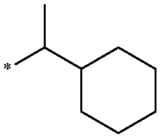
9-212
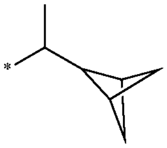
9-213
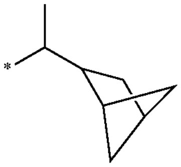
9-214
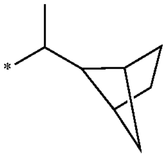
9-215
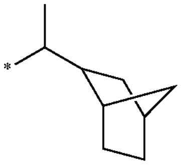

-continued
9-216
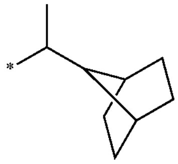
9-217
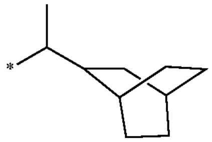
9-218
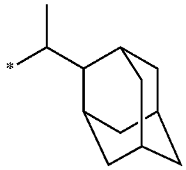
9-219
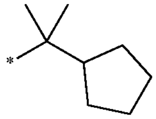
9-220
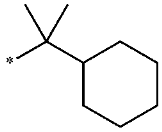
9-221
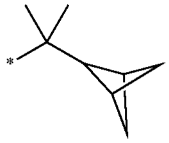
9-222
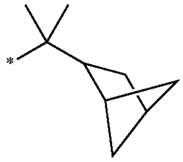
9-223
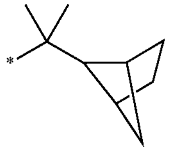
9-224
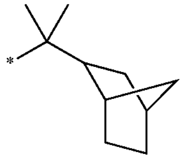
9-225
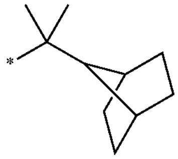
-continued
9-226
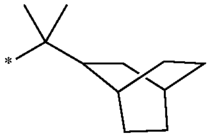
9-227
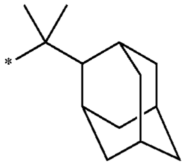
10-1
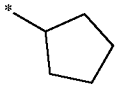
10-2
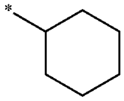
10-3
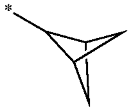
10-4
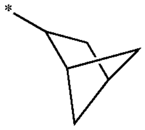
10-5
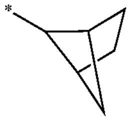
10-6
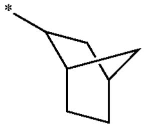
10-7
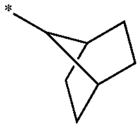
10-8
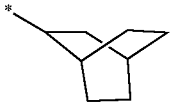
10-9
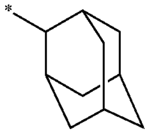
10-10
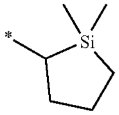

-continued
10-11
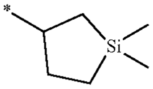
10-12
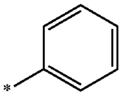
10-13
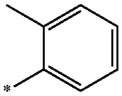
10-14
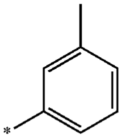
10-15
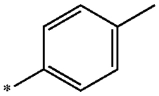
10-16
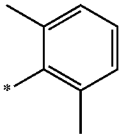
10-17
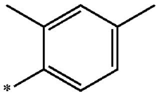
10-18
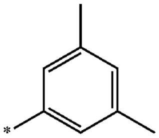
10-19
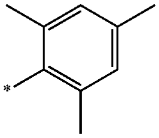
10-20
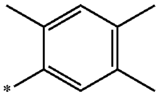
10-21
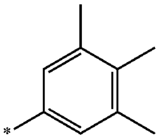
10-22
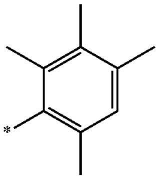
-continued
10-23
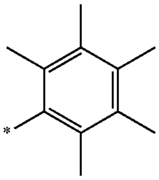
10-24
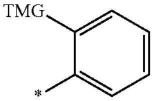
10-25
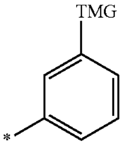
10-26
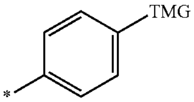
10-27
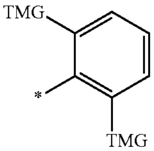
10-28
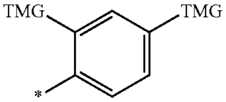
10-29
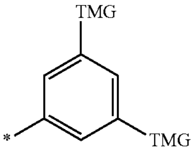
10-30
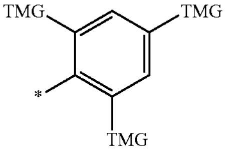
10-31
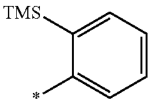
10-32
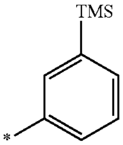
10-33
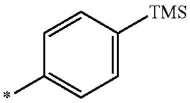

-continued
10-34
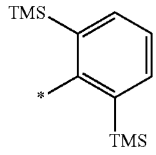
10-35
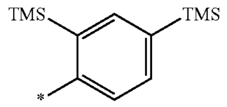
10-36
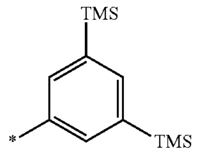
10-37
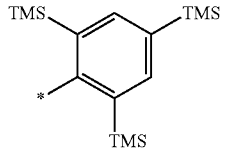
10-38
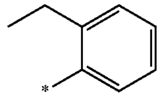
10-39
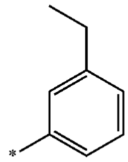
10-40
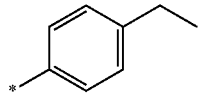
10-41
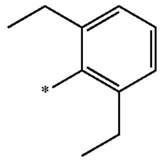
10-42
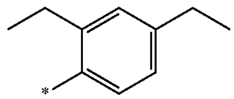
10-43
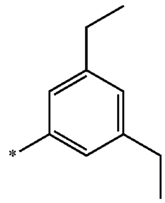
-continued
10-44
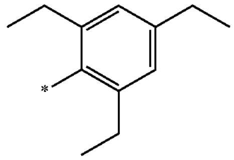
10-45
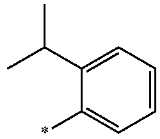
10-46
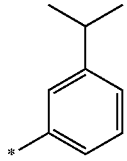
10-47
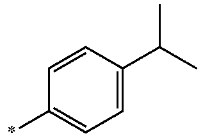
10-48
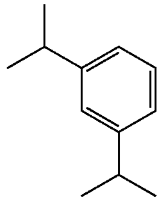
10-49
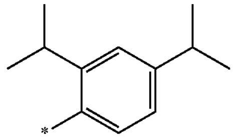
10-50
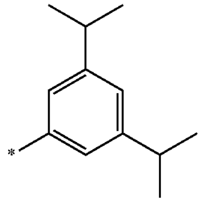
10-51
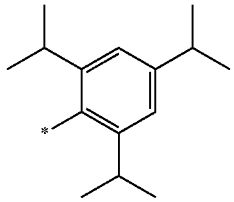
10-52
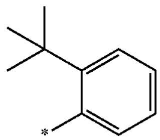

-continued
10-53
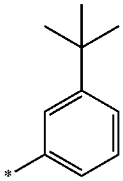
10-54
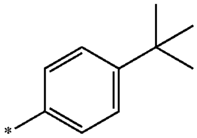
10-55
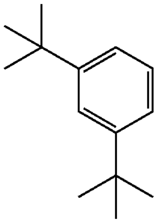
10-56
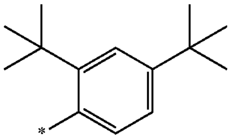
10-57
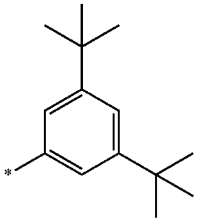
10-58
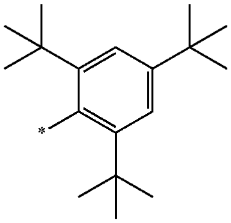
10-59
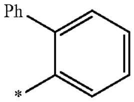
10-60
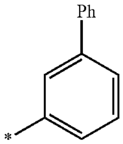
10-61
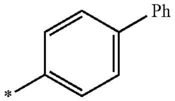
-continued
10-62
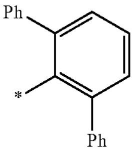
10-63
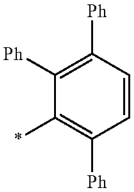
10-64
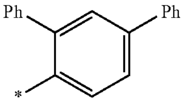
10-65
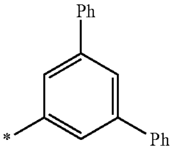
10-66
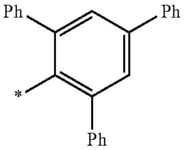
10-67
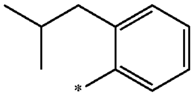
10-68
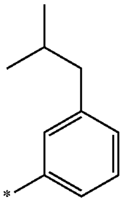
10-69
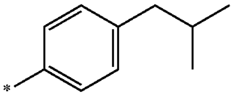
10-70
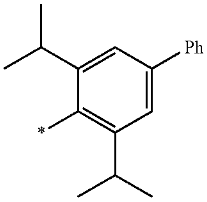

-continued
10-71
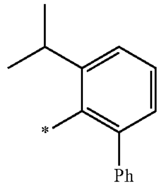
10-72
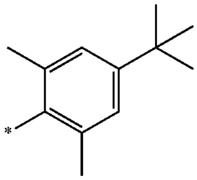
10-73
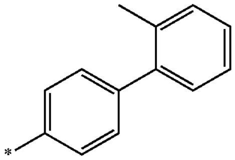
10-74
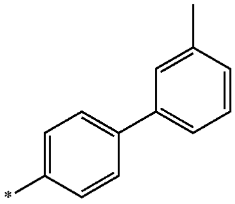
10-75
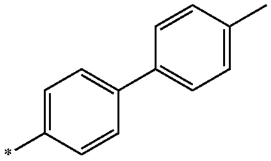
10-76
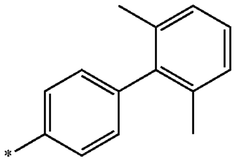
10-77
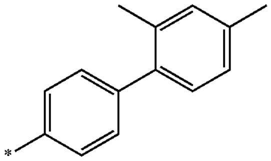
10-78
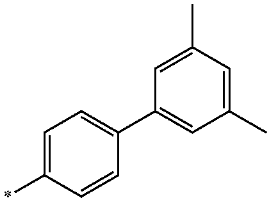
-continued
10-79
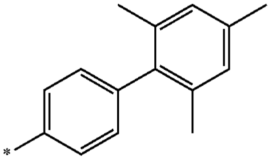
10-80
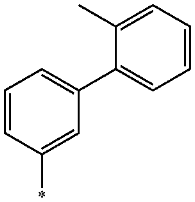
10-81
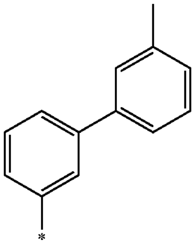
10-82
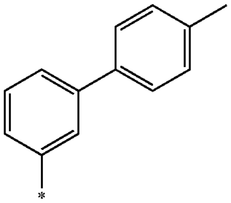
10-83
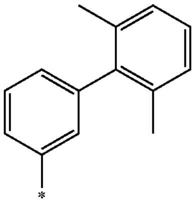
10-84
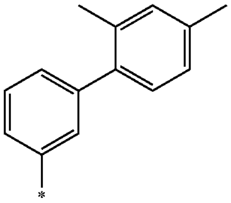
10-85
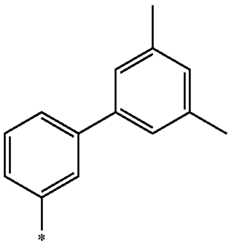

-continued
10-86
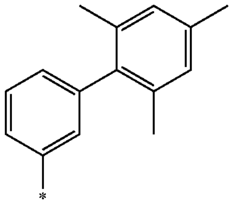
10-87
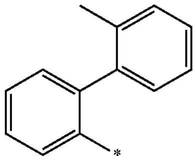
10-88
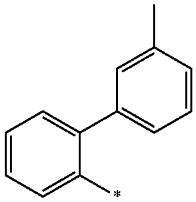
10-89
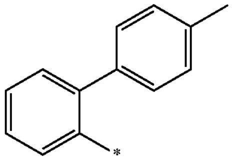
10-90
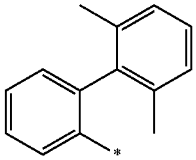
10-91
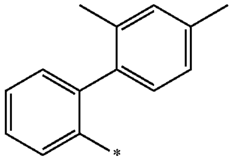
10-92
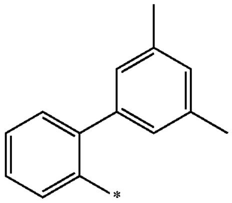
10-93
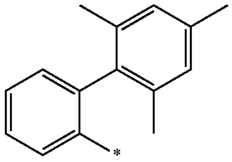
-continued
10-94
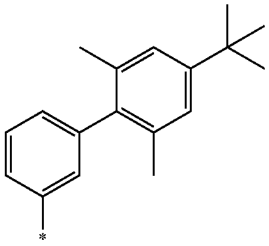
10-95
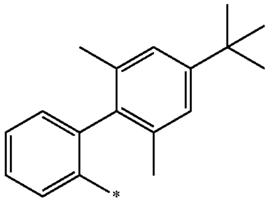
10-96
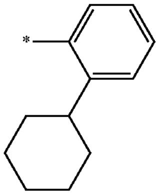
10-97
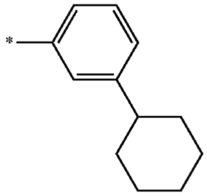
10-98
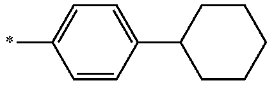
10-99
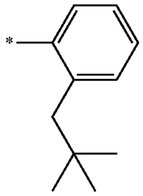
10-100
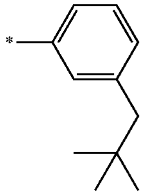
10-101
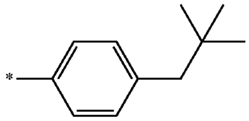

-continued
10-102
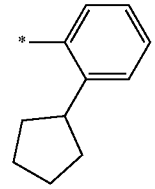
10-103
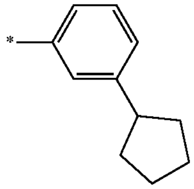
10-104
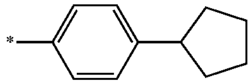
10-105
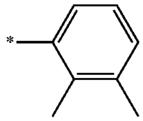
10-106
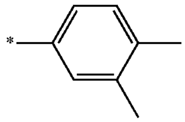
10-107
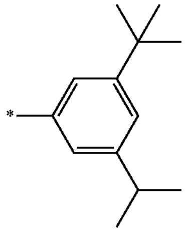
10-108
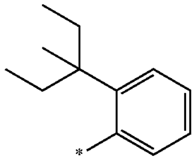
10-109
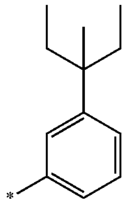
10-110
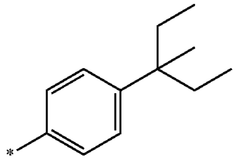
-continued
10-111
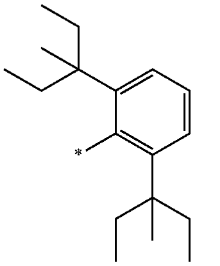
10-112
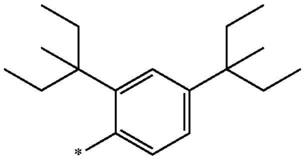
10-113
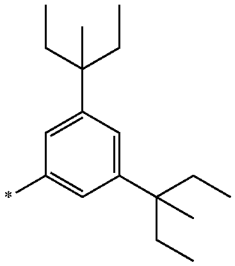
10-114
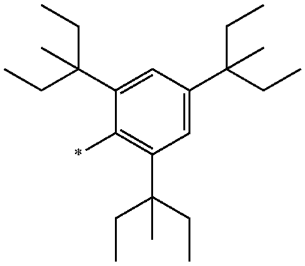
10-115
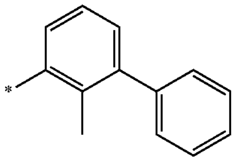
10-116
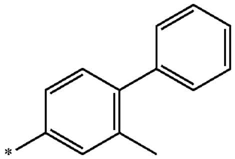
10-117
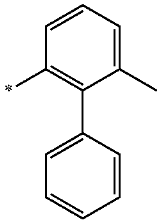

-continued
10-118
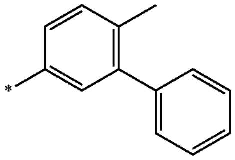
10-119
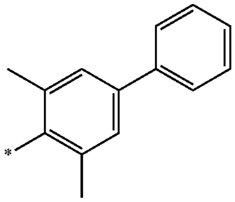
10-120
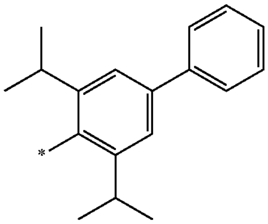
10-121
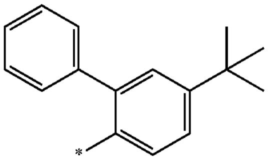
10-122
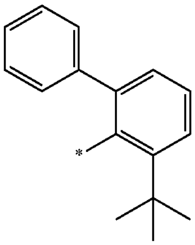
10-123
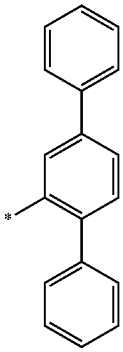
-continued
10-124
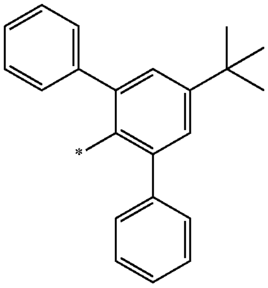
10-125
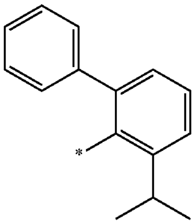
10-126
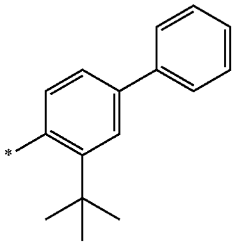
10-127
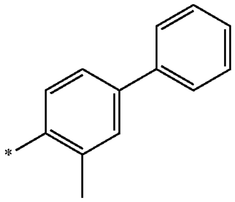
10-128
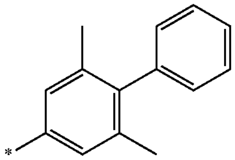
10-129
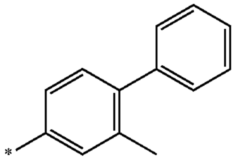
10-201
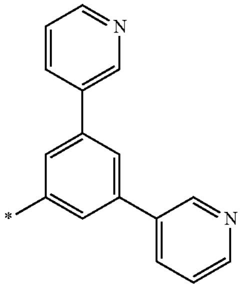

-continued
10-202
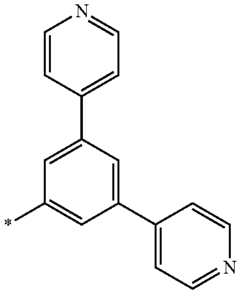
10-203
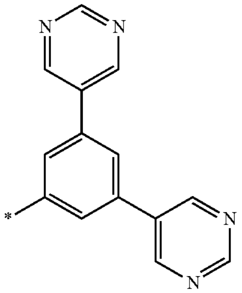
10-204
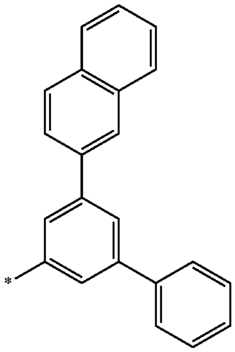
10-205
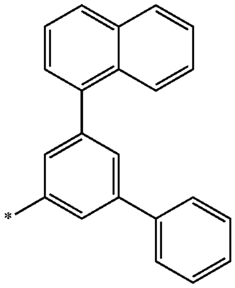
10-206
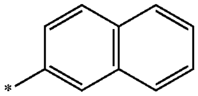
10-207
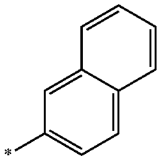
-continued
10-208
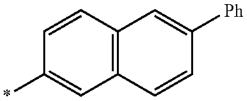
10-209
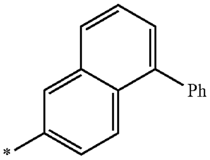
10-210
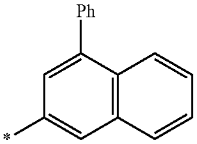
10-211
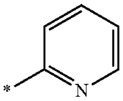
10-212
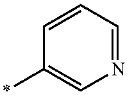
10-213
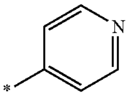
10-214
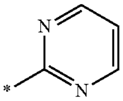
10-215
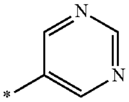
10-216
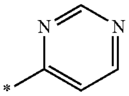
10-217
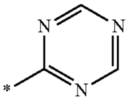
10-218
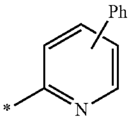
10-219
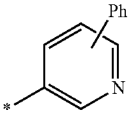
10-220
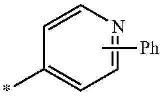

-continued
10-221
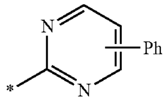
10-222
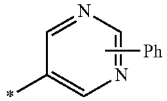
10-223
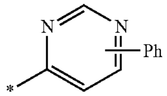
10-224
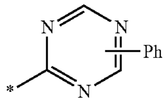
10-225
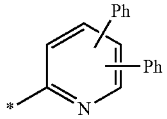
10-226
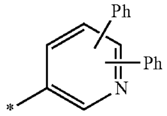
10-227
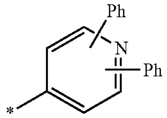
10-228
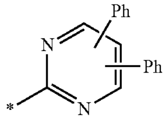
10-229
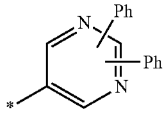
10-230
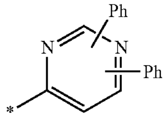
10-231
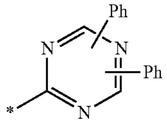
10-232
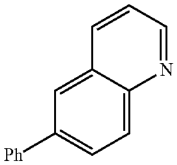
-continued
10-233
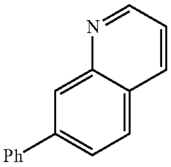
10-234
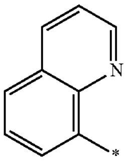
10-235
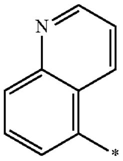
10-236
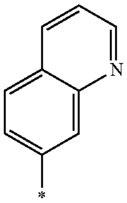
10-237
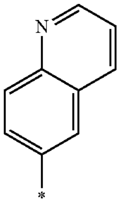
10-332
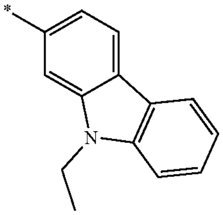
10-333
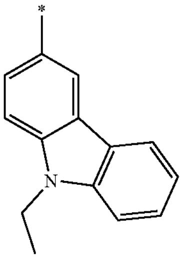

-continued
10-334
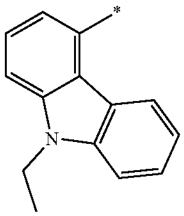
10-335
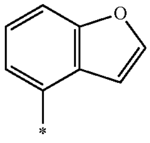
10-336
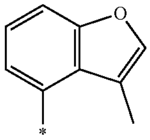
10-337
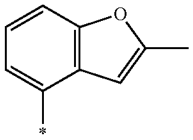
10-338
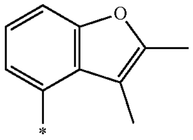
10-339
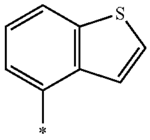
10-340
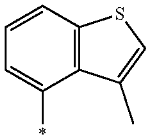
10-341
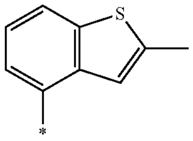
10-342
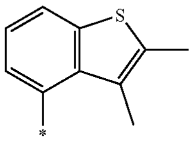
-continued
10-343
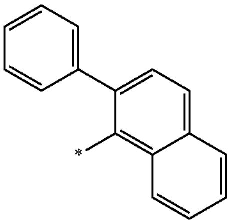
10-344
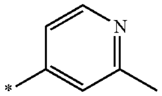
10-345
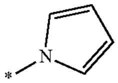
10-346
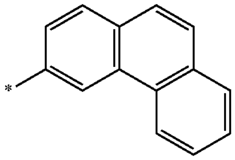
10-347
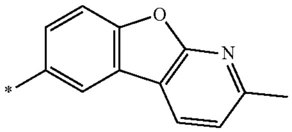
10-348
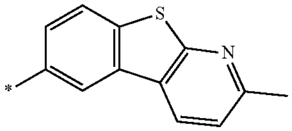
10-349
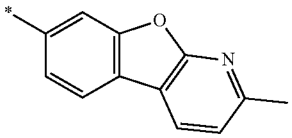
10-350
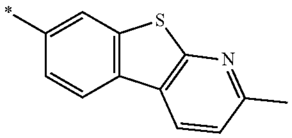
10-238
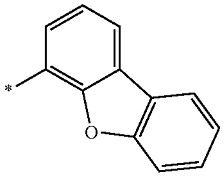

-continued
10-239
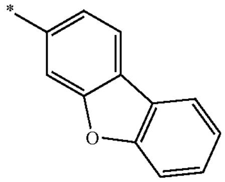
10-240
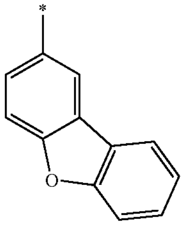
10-241
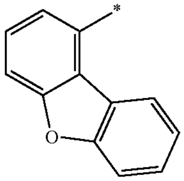
10-242
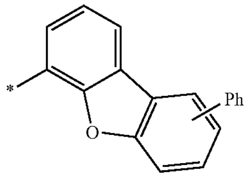
10-243
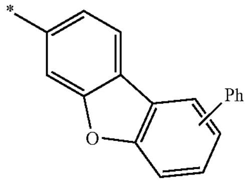
10-244
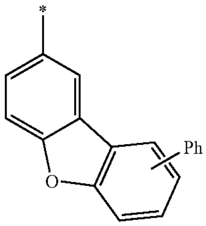
10-245
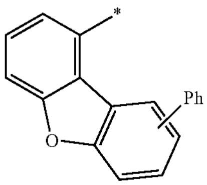
10-246
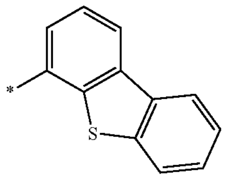
-continued
10-247
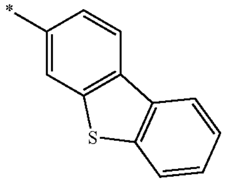
10-248
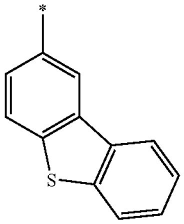
10-249
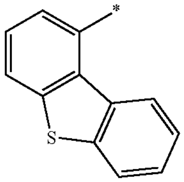
10-250
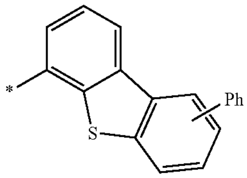
10-251
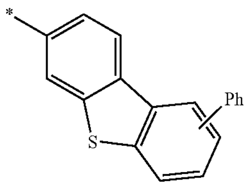
10-252
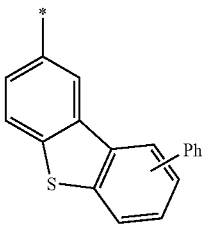
10-253
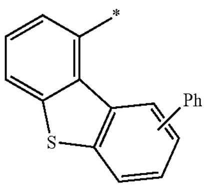
10-254
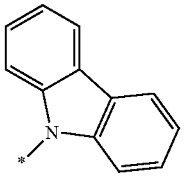

-continued
10-255
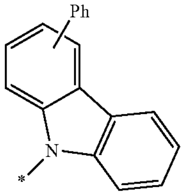
10-256
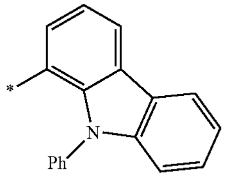
10-257
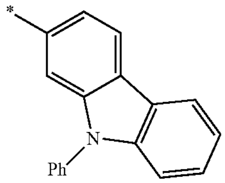
10-258
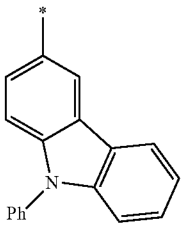
10-259
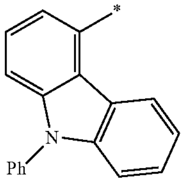
10-260
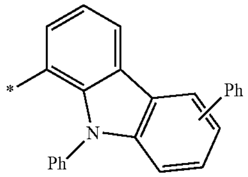
10-261
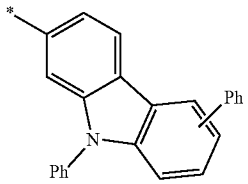
10-262
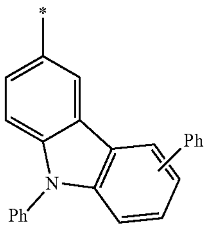
-continued
10-263
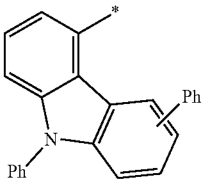
10-264
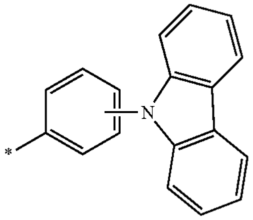
10-265
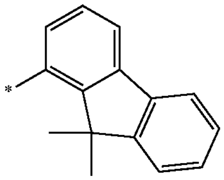
10-266
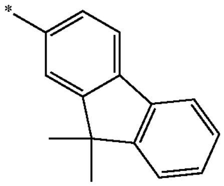
10-267
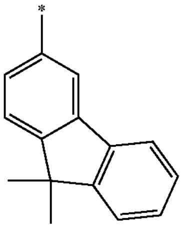
10-268
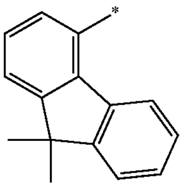
10-269
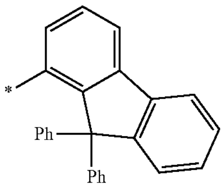
10-270
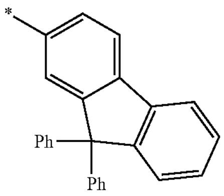

-continued
10-271
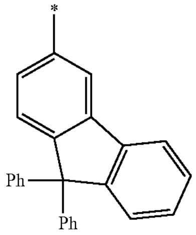
10-272
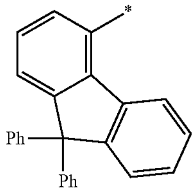
10-273
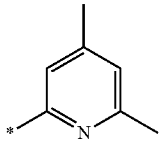
10-274
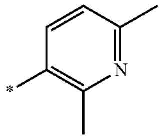
10-275
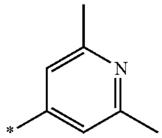
10-276
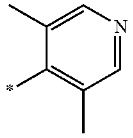
10-277
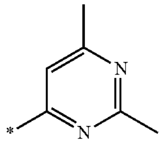
10-278
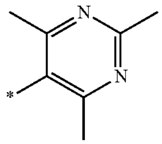
10-279
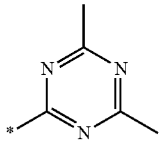
-continued
10-280
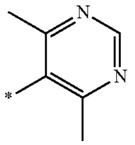
10-281
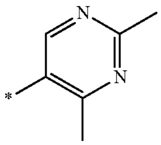
10-282
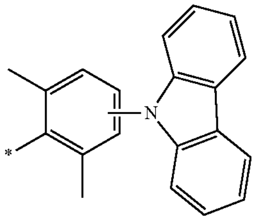
10-283
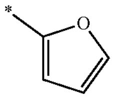
10-284
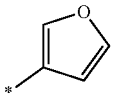
10-285
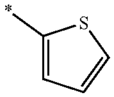
10-286
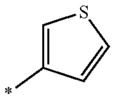
10-287
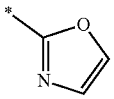
10-288
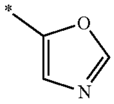
10-289
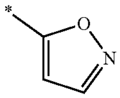
10-290
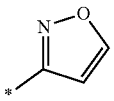
10-291
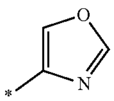

-continued
10-292
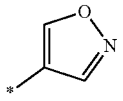
10-293
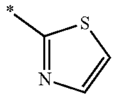
10-294
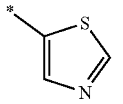
10-295
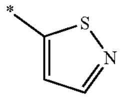
10-296
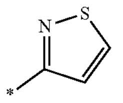
10-297
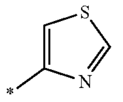
10-298
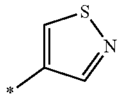
10-299
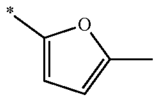
10-300
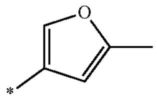
10-301
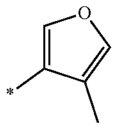
10-302
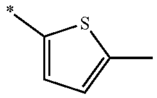
10-303
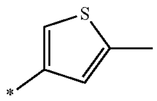
10-304
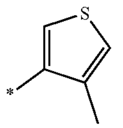
-continued
10-305
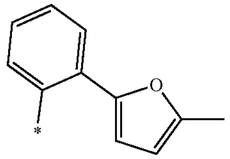
10-306
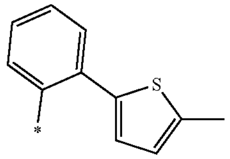
10-307
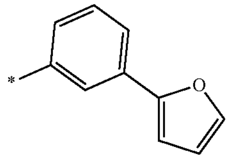
10-308
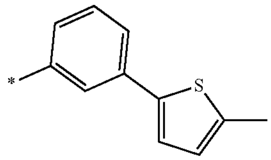
10-309
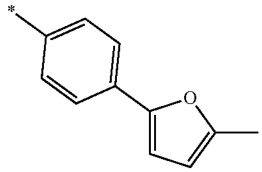
10-310
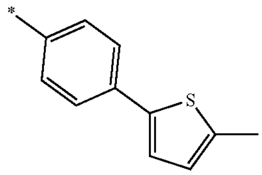
10-311
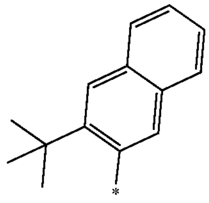
10-312
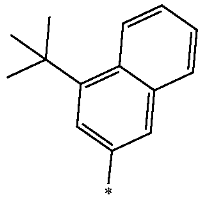

-continued
10-313
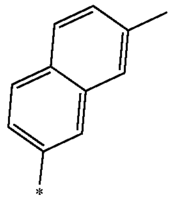
10-314
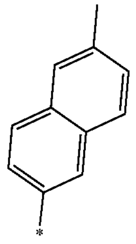
10-315
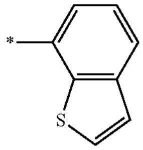
10-316
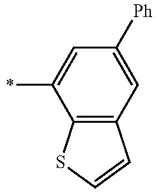
10-317
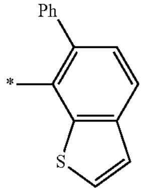
10-318
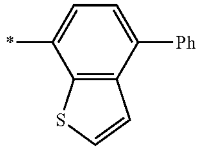
10-319
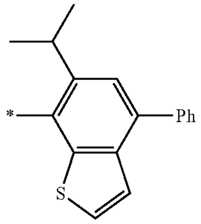
-continued
10-320
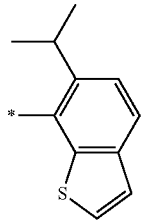
10-321
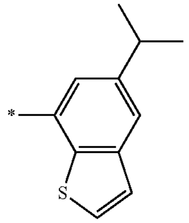
10-322
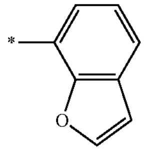
10-323
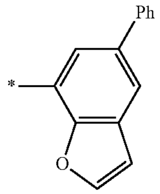
10-324
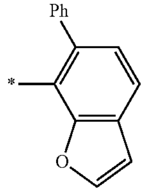
10-325
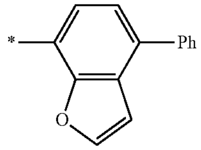
10-326
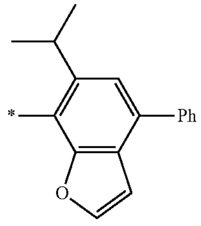

-continued
10-327
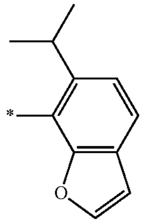
10-328
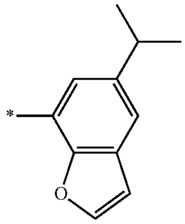
10-329
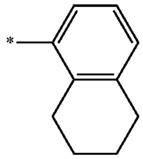
10-330
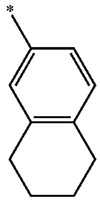
10-331
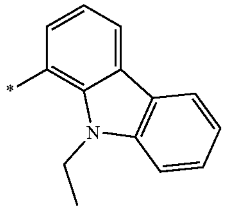
10-332
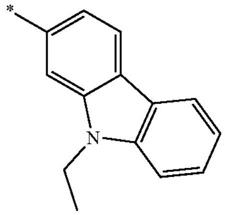
10-333
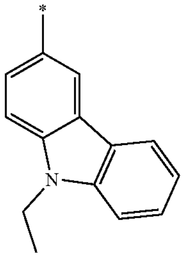
-continued
10-334
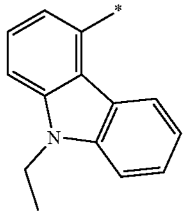
10-335
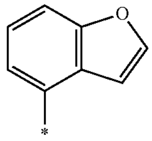
10-336
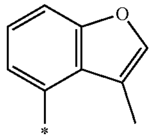
10-337
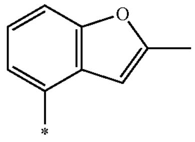
10-338
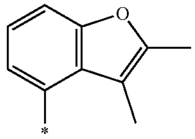
10-339
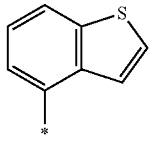
10-340
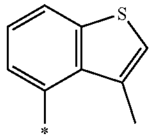
10-341
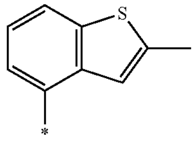
10-342
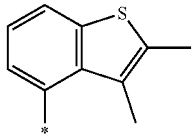

-continued 10-343

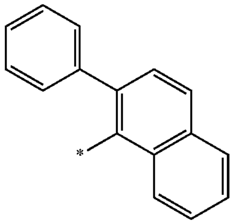

10-344

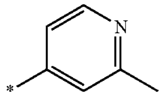

10-345

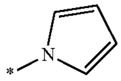

10-346

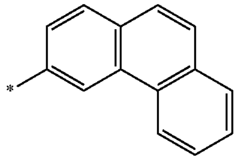

10-347

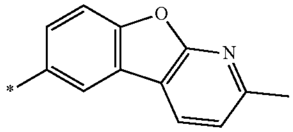

10-348

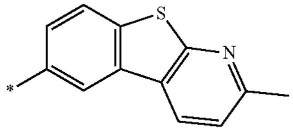

10-349

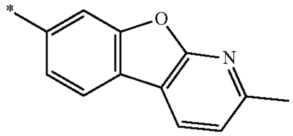

10-350

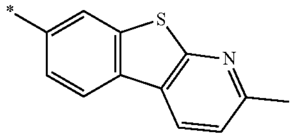

In Formulae 9-1 to 9-39, 9-201 to 9-227, 10-1 to 10-129, and 10-201 to 10-350, * indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-227 in which at least one hydrogen is substituted with deuterium" may be, for example, a group represented by one of Formulae 9-501 to 9-514 and 9-601 to 9-636:

9-501

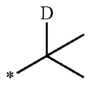

-continued 9-502

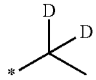

9-503

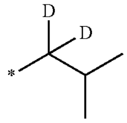

9-504

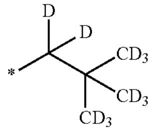

9-505

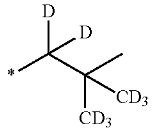

9-506

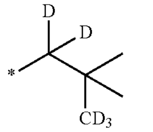

9-507

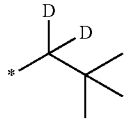

9-508

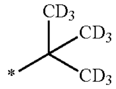

9-509

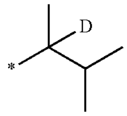

9-510

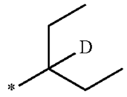

9-511

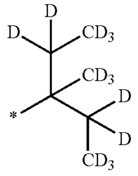

9-512

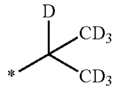

9-513

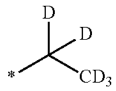

-continued
9-514
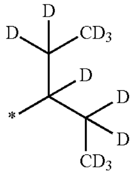
9-601
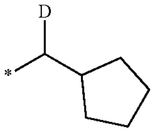
9-602
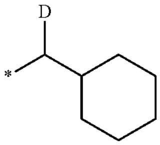
9-603
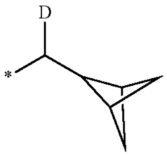
9-604
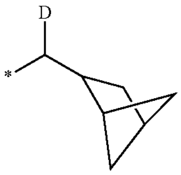
9-605
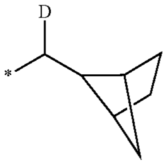
9-606
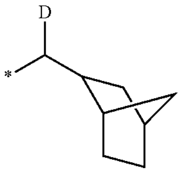
9-607
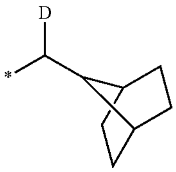
9-608
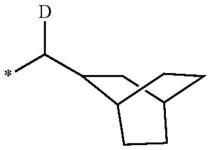
-continued
9-609
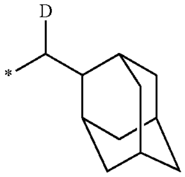
9-610
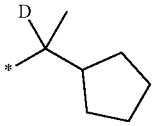
9-611
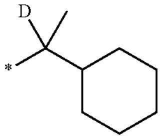
9-612
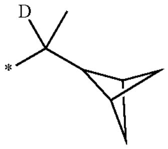
9-613
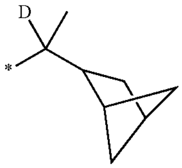
9-614
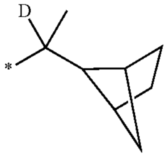
9-615
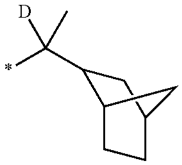
9-616
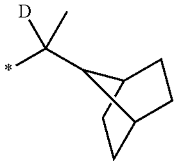
9-617
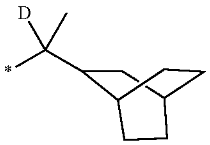

-continued
9-618
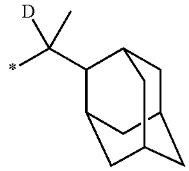
9-619
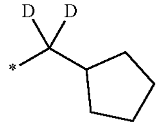
9-620
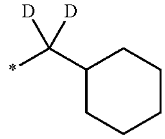
9-621
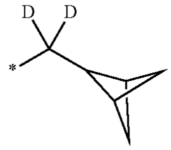
9-622
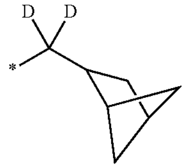
9-623
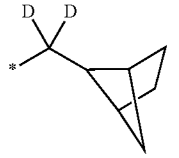
9-624
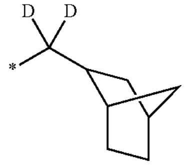
9-625
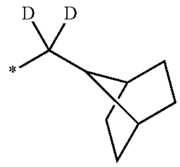
9-626
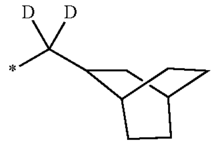
-continued
9-627
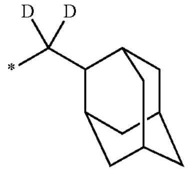
9-628
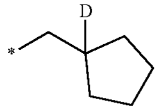
9-629
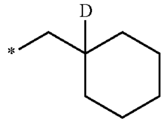
9-630
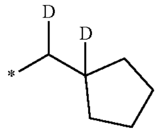
9-631
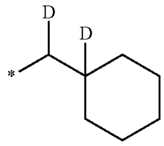
9-632
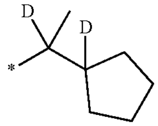
9-633
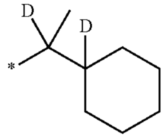
9-634
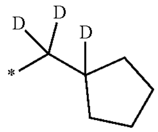
9-635
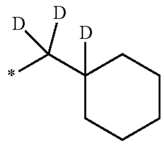
9-636
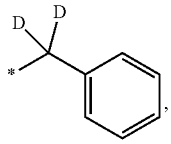
,
wherein * indicates a binding site to a neighboring atom
The "group represented by one of Formulae 9-1 to 9-39 in which at least one hydrogen is substituted with —F" and the "group represented by one of Formulae 9-201 to 9-227 in which at least one hydrogen is substituted with —F" may be, for example, a group represented by one of Formulae 9-701 to 9-710:

9-701

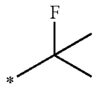

9-702

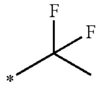

9-703

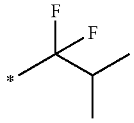

9-704

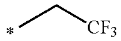

9-705

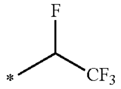

9-706

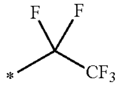

9-707

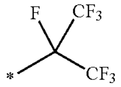

9-708

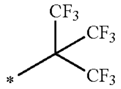

9-709

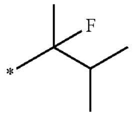

9-710

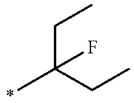

wherein * indicates a binding site to a neighboring atom

The "group represented by one of Formulae 10-1 to 10-129 in which at least one hydrogen is substituted with deuterium" and the "group represented by one of Formulae 10-201 to 10-350 in which at least one hydrogen is substituted with deuterium" may be, for example, a group represented by one of Formulae 10-501 to 10-553:

10-501

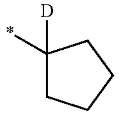

-continued 10-502

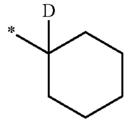

10-503

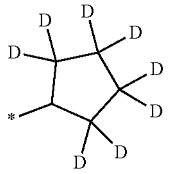

10-504

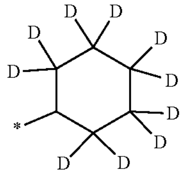

10-505

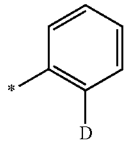

10-506

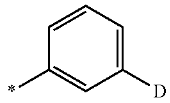

10-507

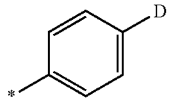

10-508

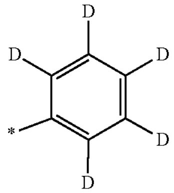

10-509

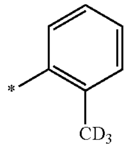

10-510

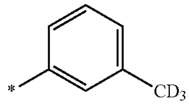

10-511

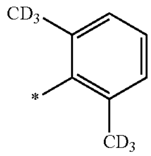

-continued
10-512
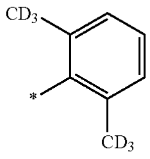
10-513
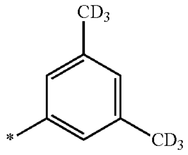
10-514
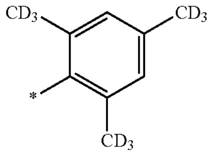
10-515
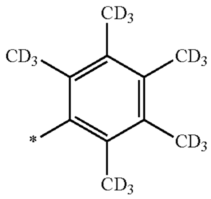
10-516
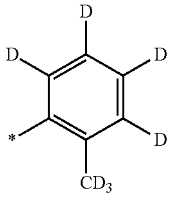
10-517
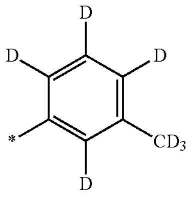
10-518
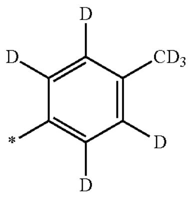
10-519
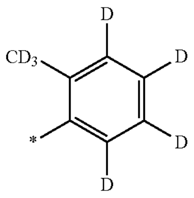
-continued
10-520
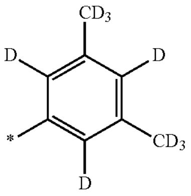
10-521
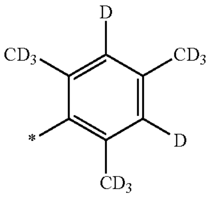
10-522
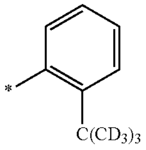
10-523
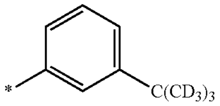
10-524
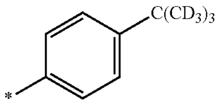
10-525
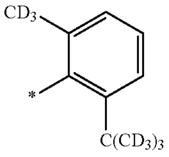
10-526
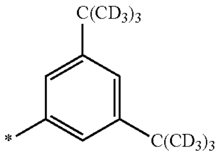
10-527
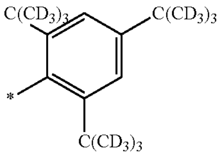
10-528
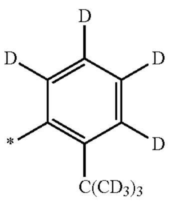

-continued
10-529
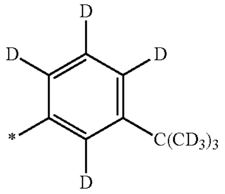
10-530
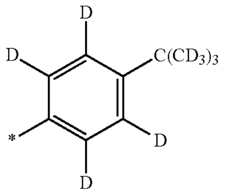
10-531
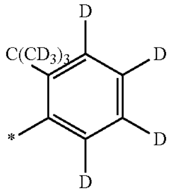
10-532
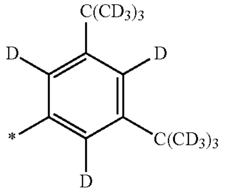
10-533
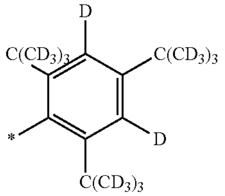
10-534
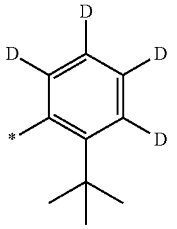
10-535
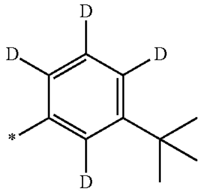
-continued
10-536
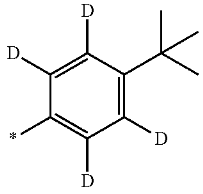
10-537
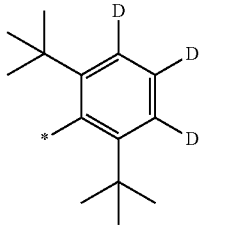
10-538
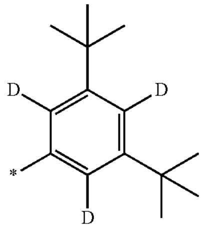
10-540
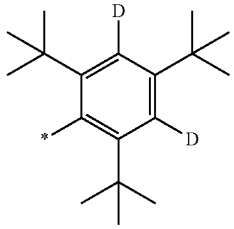
10-541
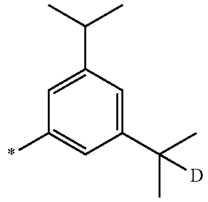
10-542
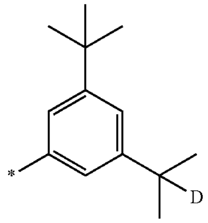
10-543
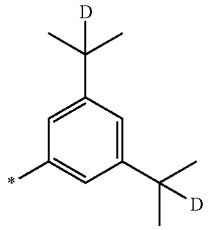

-continued
10-544
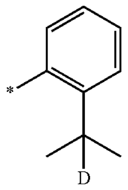
10-545
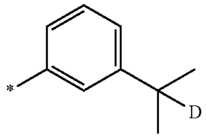
10-546
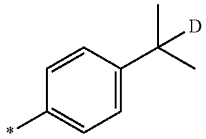
10-547
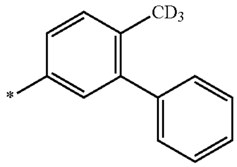
10-548
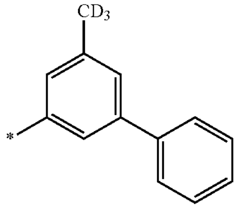
10-549
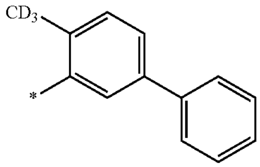
10-550
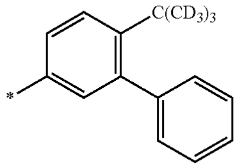
10-551
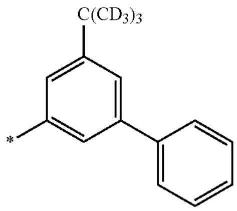
10-552
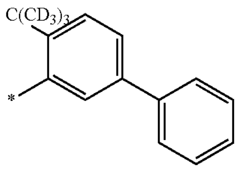
-continued
10-553
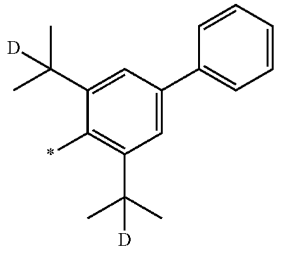
wherein * indicates a binding site to a neighboring atom
The "group represented by one of Formulae 10-1 to 10-129 in which at least one hydrogen is substituted with —F" and the "group represented by one of Formulae 10-201 to 10-350 in which at least one hydrogen is substituted with —F" may be, for example, a group represented by one of Formulae 10-601 to 10-617:
10-601
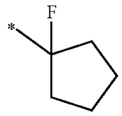
10-602
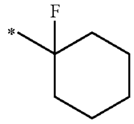
10-603
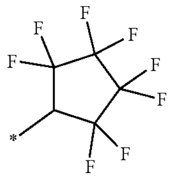
10-604
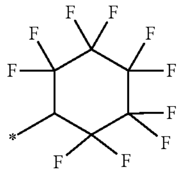
10-605
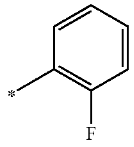
10-606
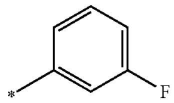
10-607
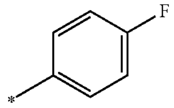

-continued 10-608

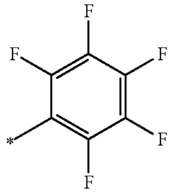

10-609

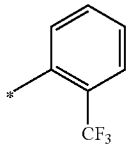

10-610

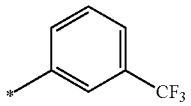

10-611

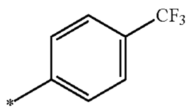

10-612

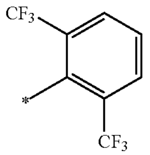

10-613

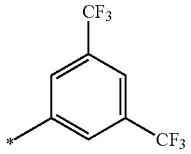

10-614

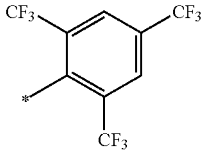

10-615

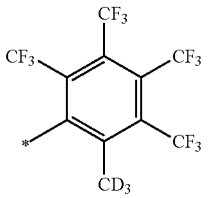

10-616

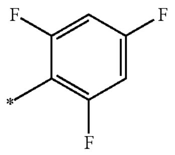

-continued 10-617

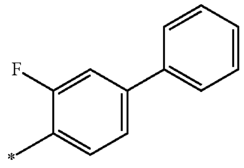

wherein * indicates a binding site to a neighboring atom.

e1 to e8 and d1 to d8 in Formulae 1-1, 1-2, 2-1, and 2-2 indicates numbers of $Z_1$ to $Z_8$ group(s), a group represented by $*—[W_1—(Z_1)_{e1}]$, a group represented by $*—[W_2—(Z_2)_{e2}]$, a group represented by $*—[W_3—(Z_3)_{e3}]$, a group represented by $*—[W_4—(Z_4)_{e4}]$, a group represented by $*—[W_5—(Z_5)_{e5}]$, a group represented by $*—[W_6—(Z_6)_{e6}]$, a group represented by $*—[W_7—(Z_7)_{e7}]$, and a group represented by $*—[W_8—(Z_8)_{e8}]$, respectively, and may each independently be an integer from 0 to 20. When e1 is 2 or more, two or more of $Z_1$(s) may be identical to or different from each other, when e2 is 2 or more, two or more of $Z_2$(s) may be identical to or different from each other, when e3 is 2 or more, two or more of $Z_3$(s) may be identical to or different from each other, when e4 is 2 or more, two or more of $Z_4$(s) may be identical to or different from each other, when e5 is 2 or more, two or more of $Z_5$(s) may be identical to or different from each other, when e6 is 2 or more, two or more of $Z_6$(s) may be identical to or different from each other, when e7 is 2 or more, two or more of $Z_7$(s) may be identical to or different from each other, when e8 is 2 or more, two or more of $Z_8$(s) may be identical to or different from each other, when d1 is 2 or more, two or more of groups represented by $*—[W_1—(Z_1)_{e1}]$ may be identical to or different from each other, when d2 is 2 or more, two or more of groups represented by $*—[W_2—(Z_2)_{e2}]$ may be identical to or different from each other, when d3 is 2 or more, two or more of groups represented by $*—[W_3—(Z_3)_{e3}]$ may be identical to or different from each other, when d4 is 2 or more, two or more of groups represented by $*—[W_4—(Z_4)_{e1}]$ may be identical to or different from each other, when d5 is 2 or more, two or more of groups represented by $*—[W_5—(Z_5)_{e5}]$ may be identical to or different from each other, when d6 is 2 or more, two or more of groups represented by $*—[W_6—(Z_6)_{e6}]$ may be identical to or different from each other, when d7 is 2 or more, two or more of groups represented by $*—[W_7—(Z_7)_{e7}]$ may be identical to or different from each other, and when d8 is 2 or more, two or more of groups represented by $*—[W_8—(Z_8)_{e8}]$ may be identical to or different from each other. In one or more embodiments, e1 to e8 and d1 to d8 in Formulae 1-1, 1-2, 2-1, and 2-2 may each independently be 0, 1, 2, or 3.

* and *' herein each indicate a binding site to a neighboring atom, unless otherwise stated.

In Formulae 1-1, 1-2, 2-1, and 2-2, one or more of i) two or more of a plurality of $Z_1$(s), ii) two or more of a plurality of $Z_2$(s), iii) two or more of a plurality of $Z_3$(s), iv) two or more of a plurality of $Z_4$(s), v) two or more of a plurality of $Z_5$(s), vi) two or more of a plurality of $Z_6$(s), vii) two or more of a plurality of $Z_7$(s), and viii) two or more of a plurality of $Z_8$(s) may respectively optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ may be as described in connection with $Z_1$ herein.

* and *' in Formulae 1-1, 1-2, 2-1, and 2-2 each indicate a binding site to iridium in Formulae 1 and 2.

In one or more embodiments, a group represented by

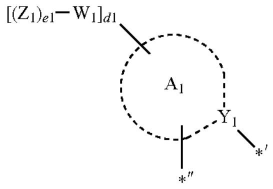

in Formula 1-1 may be a group represented by one of Formulae A1-1 to A1-3.

In one or more embodiments, a group represented by

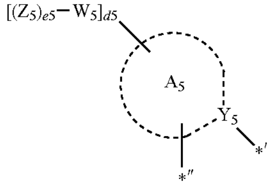

in Formula 2-1 may be a group represented by one of Formulae A5-1 to A5-3:

A1-1

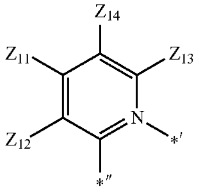

A1-2

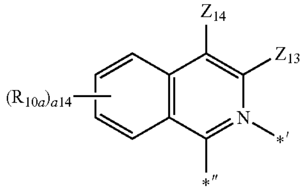

A1-3

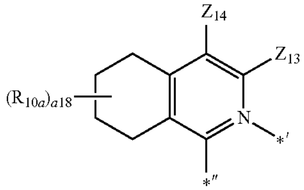

A5-1

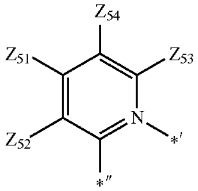

-continued

A5-2

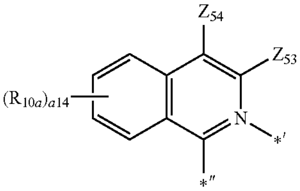

A5-3

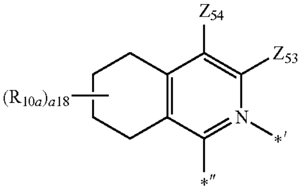

In Formulae A1-1 to A1-3 and A5-1 to A5-3, $Z_{11}$ to $Z_{14}$ are respectively as described in connection with $Z_1$ herein, $Z_{51}$ to $Z_{54}$ are respectively as described in connection with $Z_5$ herein, $R_{10a}$ is as described herein, a14 may be an integer from 0 to 4, a18 may be an integer from 0 to 8,

*' indicates a binding site to iridium in Formulae 1 and 2, and

*" indicates a binding site to ring $A_2$ or ring $A_6$.

In one or more embodiments, at least one of $Z_{11}$, $Z_{12}$, and $Z_{14}$ (for example, $Z_{14}$) in Formulae A1-1 to A1-3 and at least one of $Z_{51}$, $Z_{52}$, and $Z_{54}$ (for example, $Z_{54}$) in Formulae A5-1 to A5-3 may each independently be:

a $C_1$-$C_{20}$ alkyl group that is unsubstituted or substituted with at least one of deuterium, —F, a phenyl group, or a combination thereof;

—$Si(Q_3)(Q_4)(Q_5)$; or

—$Ge(Q_3)(Q_4)(Q_5)$.

In one or more embodiments, $Y_3$ in Formula 1-2 and $Y_7$ in Formula 2-2 may each be N, and a group represented by

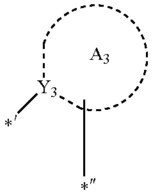

in Formula 1-2, and a group represented by

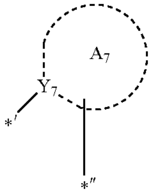

in Formula 2-2 may each independently be a group represented by one of Formulae NR1 to NR48:
NR1
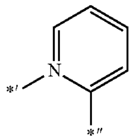
NR2
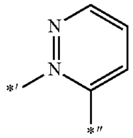
NR3
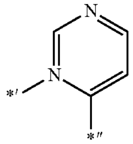
NR4
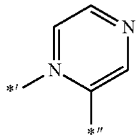
NR5
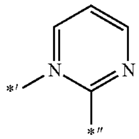
NR6
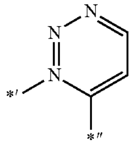
NR7
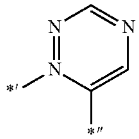
NR8
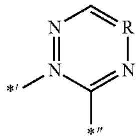
NR9
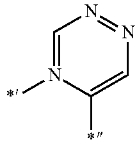
RN10
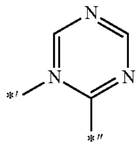
-continued
NR11
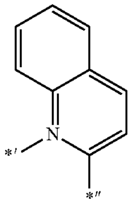
NR12
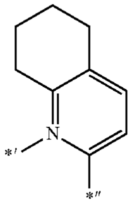
NR13
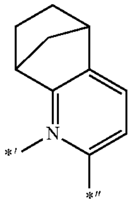
NR14
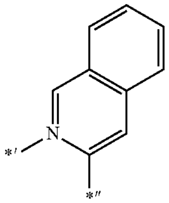
NR15
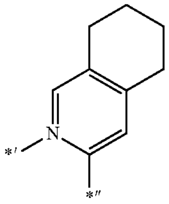
NR16
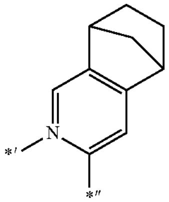
NR17
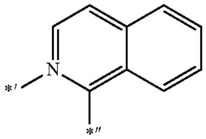
NR18
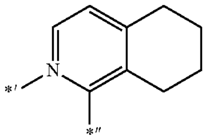

-continued
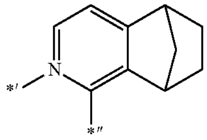
NR19
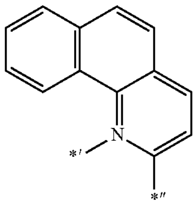
NR20
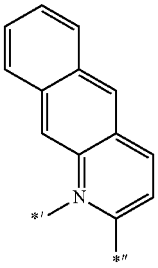
NR21
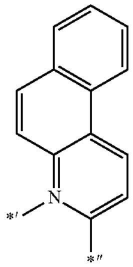
NR22
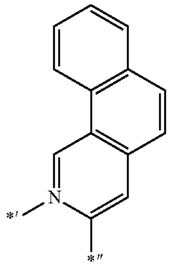
NR23
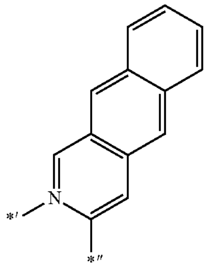
NR24
-continued
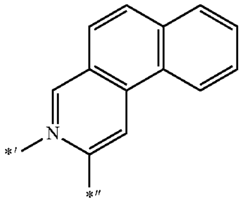
NR25
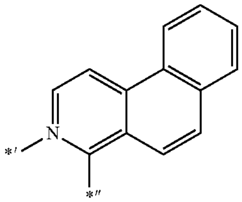
NR26
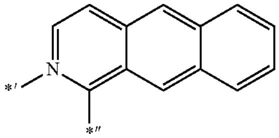
NR27
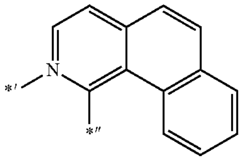
NR28
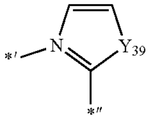
NR29
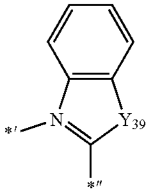
NR30
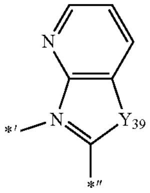
NR31
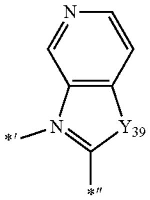
NR32

-continued
NR33
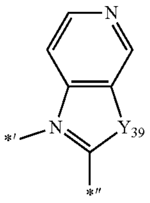
NR34
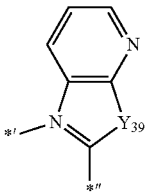
NR35
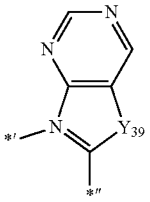
NR36
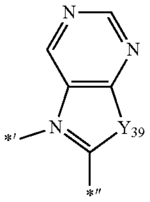
NR37
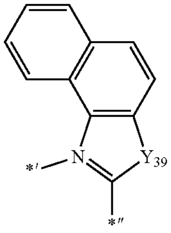
NR38
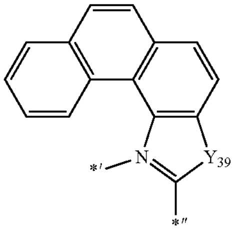
NR39
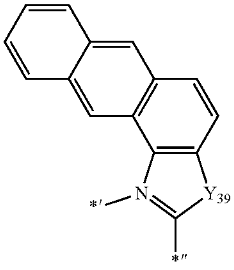
-continued
NR40
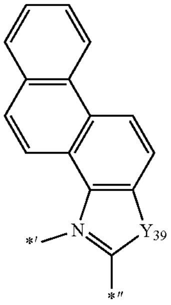
NR41
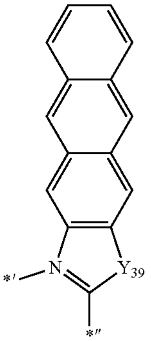
NR42
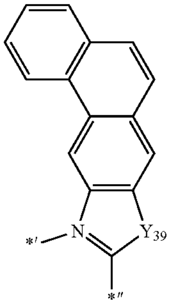
NR43
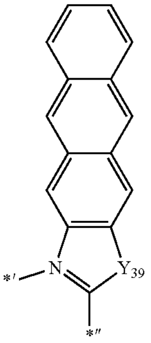
NR44
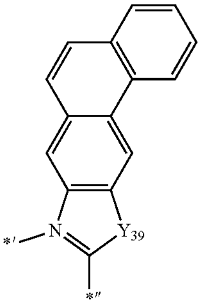

-continued

NR45

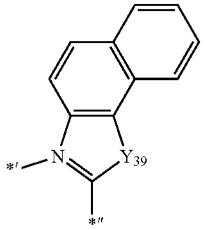

NR46

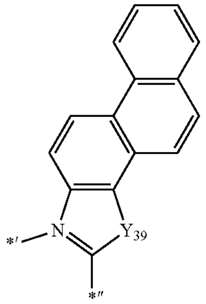

NR47

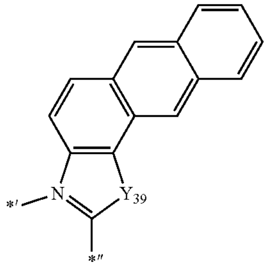

NR48

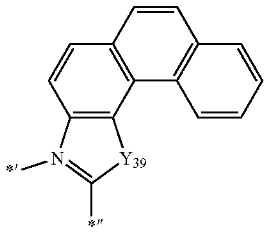

wherein, in Formulae NR1 to NR48, $Y_{39}$ may be O, S, Se, N—[$W_3$—$(Z_3)_{e3}$], N—[$W_7$—$(Z_7)_{e7}$], $C(Z_{39a})(Z_{39b})$, $C(Z_{79a})(Z_{79b})$, $Si(Z_{39a})(Z_{39b})$, or $Si(Z_{79a})(Z_{79b})$, $W_3$, $W_7$, $Z_3$, $Z_7$, e3, and e7 are respectively as described herein, $Z_{39a}$ and $Z_{39b}$ are respectively as described in connection with $Z_3$ herein, and $Z_{79a}$ and $Z_{79b}$ are each as described in connection with $Z_7$ herein,

*' indicates a binding site to iridium in Formula 1 or 2, and

*" indicates a binding site to ring $A_4$ or ring $A_8$.

In one or more embodiments, a group represented by

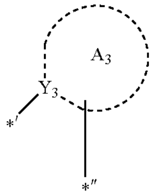

in Formula 1-2 may be a group represented by one of Formulae NR30 to NR48.

In one or more embodiments, $Y_2$ in Formula 1-1, $Y_4$ in Formula 1-2, $Y_6$ in Formula 2-1, and $Y_8$ in Formula 2-2 may each be C, and a group represented by

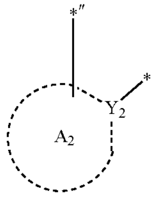

in Formula 1-1, a group represented by

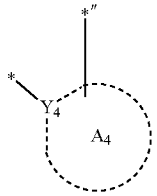

in Formula 1-2, a group represented by

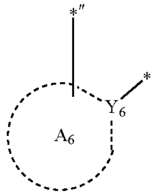

in Formula 2-1, and a group represented by

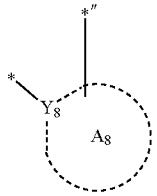

in Formula 2-2 may each independently be a group represented by one of Formulae CR1 to CR29:

CR1

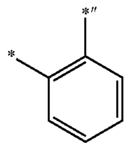

-continued
CR2
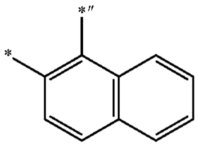
CR3
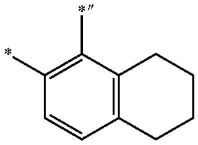
CR4
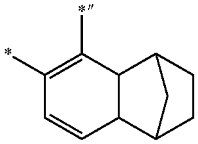
CR5
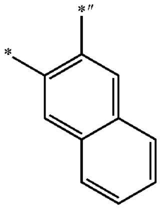
CR6
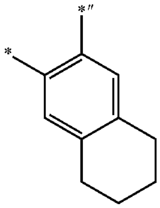
CR7
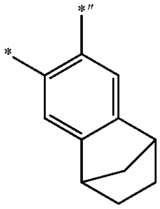
CR8
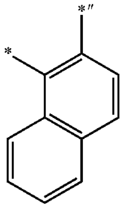
CR9
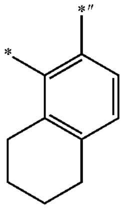
-continued
CR10
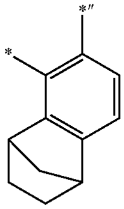
CR11
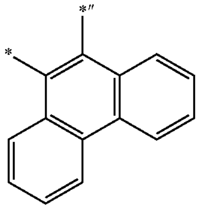
CR12
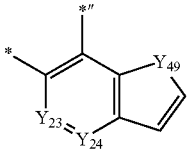
CR13
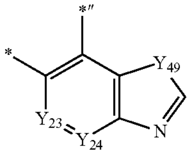
CR14
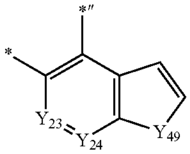
CR15
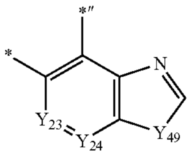
CR16
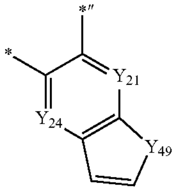
CR17
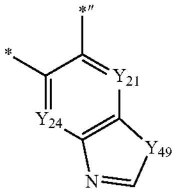

-continued

CR18

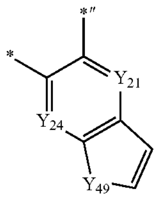

CR19

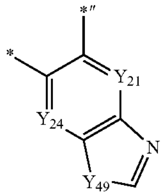

CR20

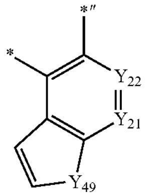

CR21

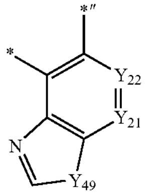

CR22

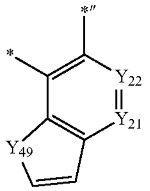

CR23

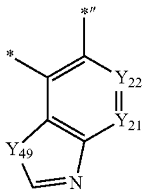

CR24

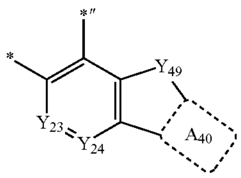

-continued

CR25

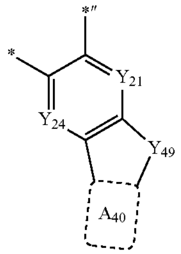

CR26

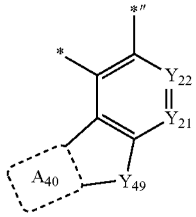

CR27

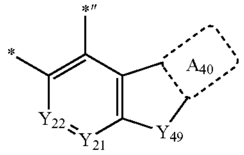

CR28

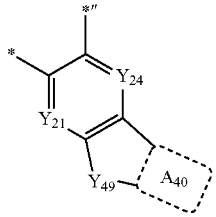

CR29

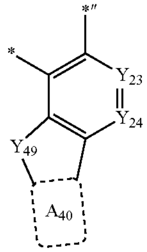

wherein, in Formulae CR1 to CR29, $Y_{49}$ may be O, S, Se, N—[$W_2$—$(Z_2)_{e2}$], N—[$W_4$—$(Z_4)_{e4}$], N—[$W_6$—$(Z_6)_{e6}$], N—[$W_8$—$(Z_8)_{e8}$], $C(Z_{29a})(Z_{29b})$, $C(Z_{49a})(Z_{49b})$, $C(Z_{69a})(Z_{69b})$, $C(Z_{89a})(Z_{89b})$, $Si(Z_{29a})(Z_{29b})$, $Si(Z_{49a})(Z_{49b})$, $Si(Z_{69a})(Z_{69b})$, or $Si(Z_{89a})(Z_{89b})$, $W_2$, $W_4$, $W_6$, $W_8$, $Z_2$, $Z_4$, $Z_6$, $Z_8$, e2, e4, e6, and e8 are respectively as described herein, $Z_{29a}$ and $Z_{29b}$ are respectively as described in connection with $Z_2$ herein, $Z_{49}$a and $Z_{49b}$ are respectively as described in connection with $Z_4$ herein, $Z_{69a}$ and $Z_{69b}$ are respectively as described in connection with $Z_6$ herein, and $Z_{89a}$ and $Z_{89b}$ are respectively as described in connection with $Z_8$ herein, $Y_{21}$ to $Y_{24}$ may each independently be N or C, ring $A_{40}$ may be a $C_5$-$C_{30}$ carbocyclic group or a $C_1$-$C_{30}$ heterocyclic group (for example, a benzene group, a naphthalene group, a phenanthrene group, a pyridine group, a pyrimidine group, a pyrazine group, a pyridazine group, a quinoline group, an isoquinoline group, a benzoquinoline group, a benzoisoquinoline group, a quinoxaline group, a benzoquinoxaline group, a quinazoline group, or benzoquinazoline group),

*' indicates a binding site to iridium in Formulae 1 and 2, and

*" indicates a binding site to ring $A_1$, ring $A_3$, ring $A_5$, and ring $A_7$.

In one or more embodiments, a group represented by

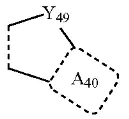

in Formulae CR24 to CR29 may be a group represented by one of Formulae CR(1) to CR(13):

CR(1)

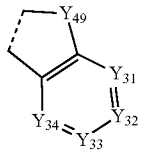

CY(2)

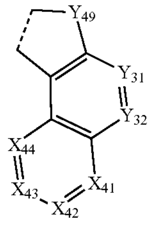

CR(3)

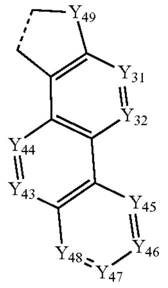

CR(4)

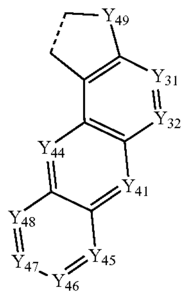

-continued

CR(5)

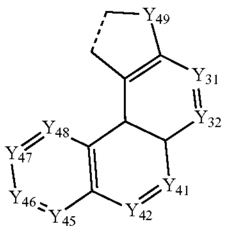

CR(6)

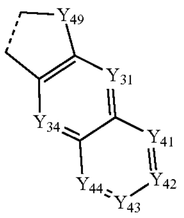

CR(7)

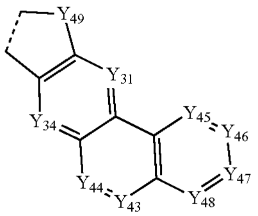

CR(8)

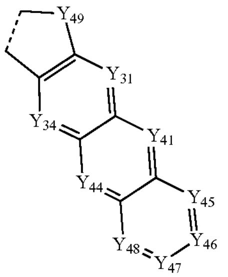

CR(9)

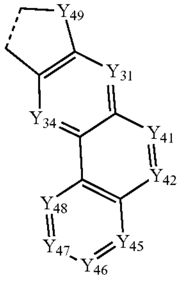

CR(10)

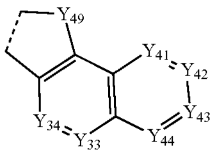

CR(11)

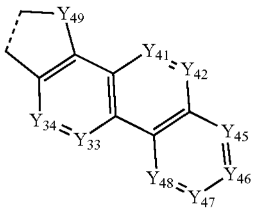

-continued

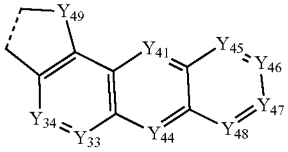

CR(12)

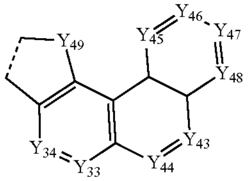

CR(13)

wherein, in Formulae CR(1) to CR(13), $Y_{49}$ is as described herein, and $Y_{31}$ to $Y_{34}$ and $Y_{41}$ to $Y_{48}$ may each independently be C or N.

In one or more embodiments, the first compound may include at least one deuterium.

In one or more embodiments, the second compound may include at least one deuterium.

The first compound may emit a first light including a first spectrum, and λP(1) may be an emission peak wavelength (in nanometers, nm) of the first spectrum.

The second compound may emit a second light including a second spectrum, and λP(2) may be an emission peak wavelength (nm) of the second spectrum.

The λP(1) and the λP(2) may be evaluated from a photoluminescence (PL) spectra measured for a first film and a second film, respectively.

As used herein, the "first film" is a film including the first compound, and the "second film" is a film including the second compound. The first film and the second film may be manufactured using various methods such as any method, for example, a vacuum deposition method, a coating and heating method. The first film and the second film may further include other compounds, for example, a host described herein, in addition to the first compound and the second compound.

In one or more embodiments, each of the λP(1) and the λP(2) may be about 480 nm to about 580 nm, or about 510 nm to about 570 nm.

In one or more embodiments, an absolute value of a difference between the λP(1) and the λP(2) may be about 0 nm to about 30 nm, about 0 nm to about 20 nm, or about 0 nm to about 10 nm.

In one or more embodiments, the first light and the second light may each be green light.

In one or more embodiments, the first light may be green light, and the second light may be yellow-green light.

In one or more embodiments, the first light and the second light may each be yellow-green light.

In one or more embodiments, the first light may be yellow-green light, and the second light may be yellow light.

In one or more embodiments, the first light and the second light may each be yellow light.

In one or more embodiments, $L_{11}$ and $L_{13}$ in Formula 1, $L_{21}$ and $L_{23}$ in Formula 2, a ligand represented by Formula 1-1, and a ligand represented by Formula 2-1 may each independently be represented by one of Formulae A1 to A380:

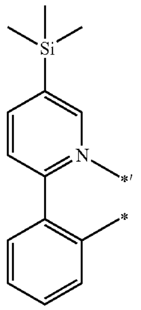

A1

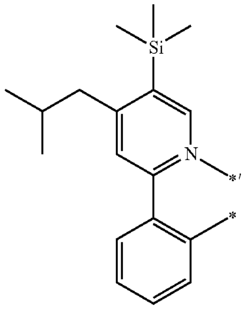

A2

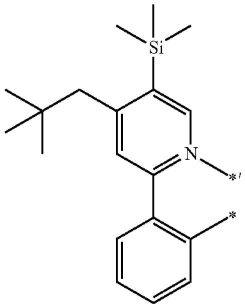

A3

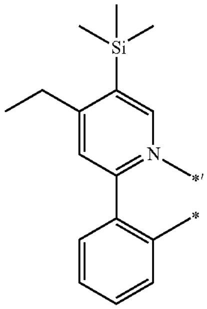

A4

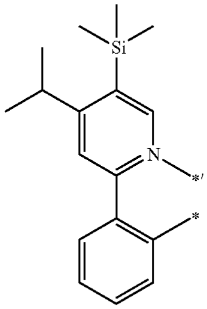

A5

-continued
A6
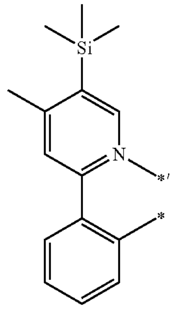
A7
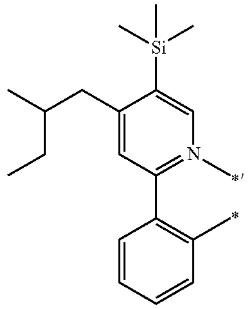
A8
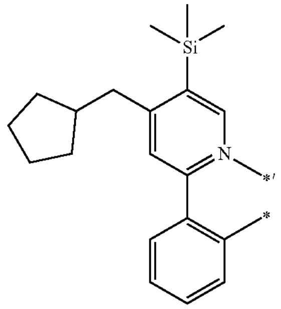
A9
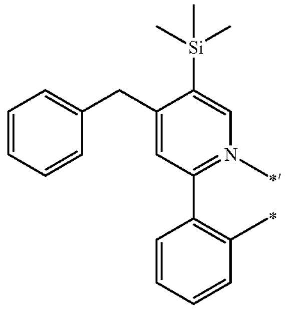
A10
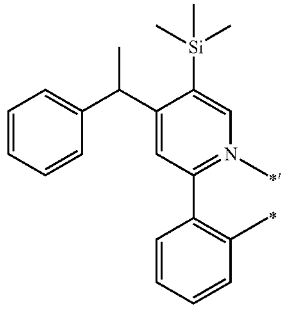
-continued
A11
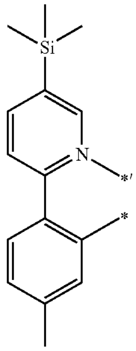
A12
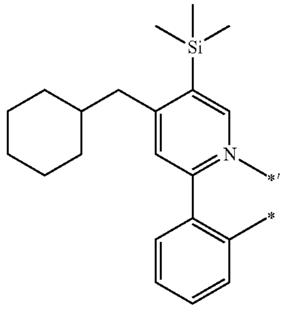
A13
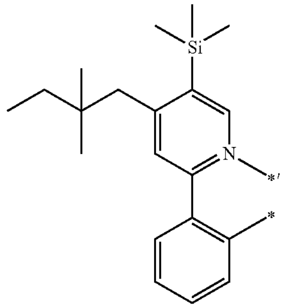
A14
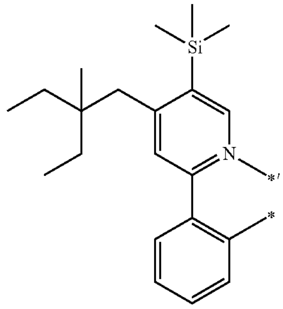
A15
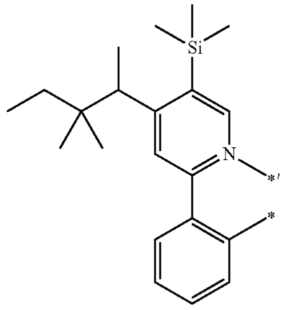

-continued
A16
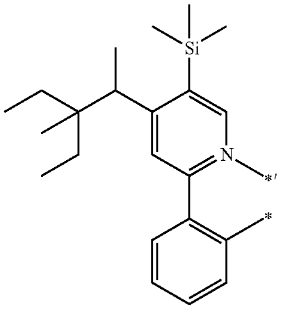
A17
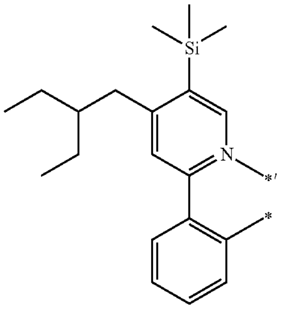
A18
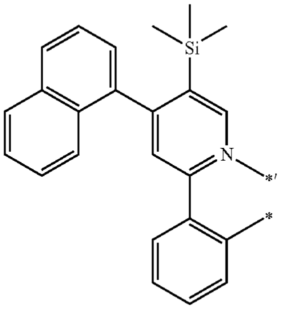
A19
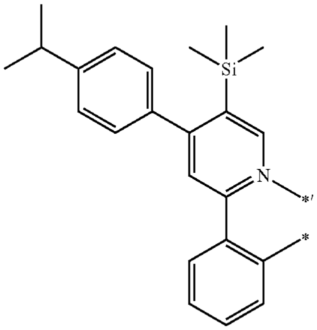
A20
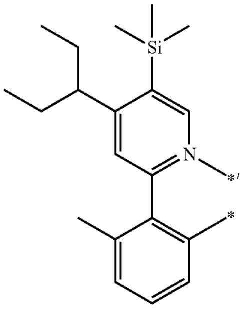
-continued
A21
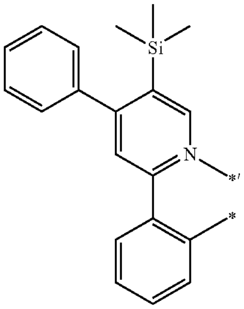
A22
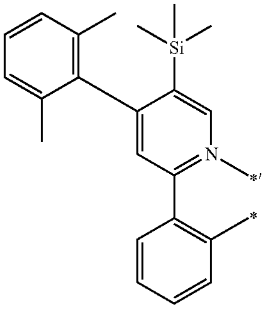
A23
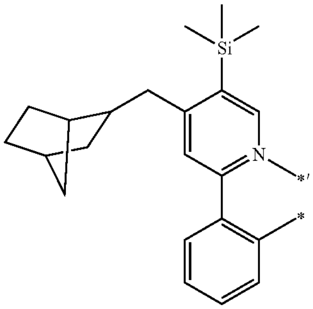
A24
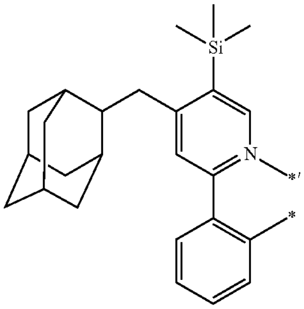
A25
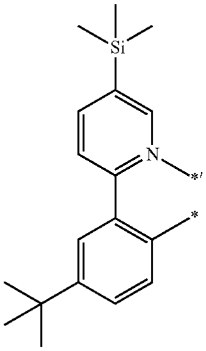

-continued
A26
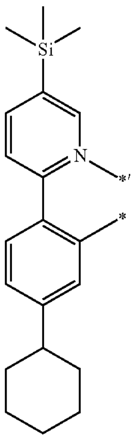
A27
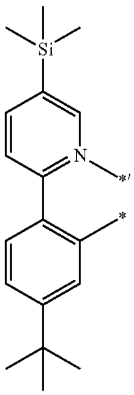
A28
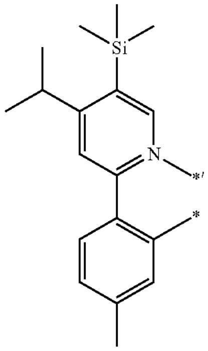
A29
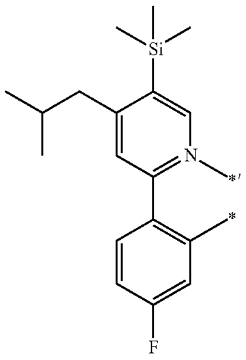
-continued
A30
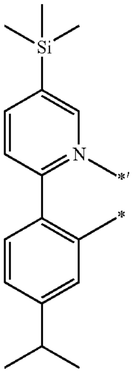
A31
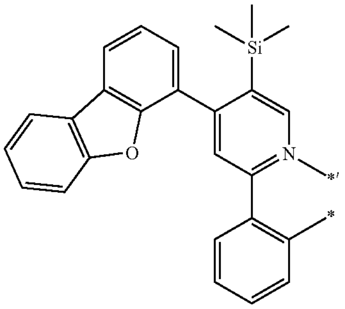
A32
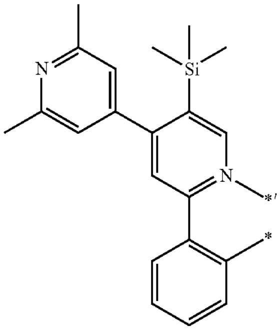
A33
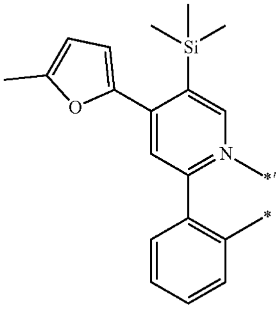

A34
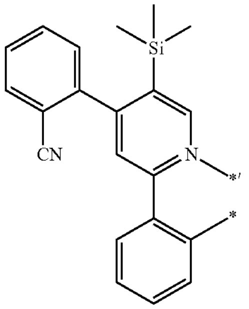
A35
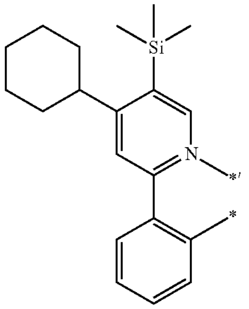
A36
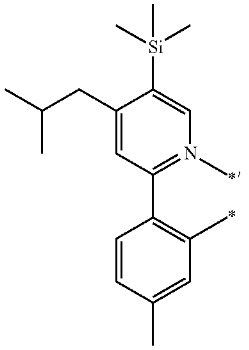
A37
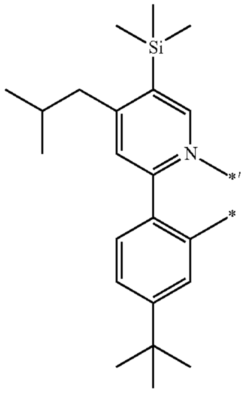
A38
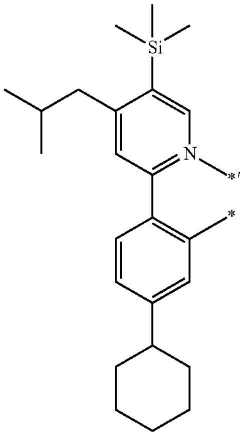
A39
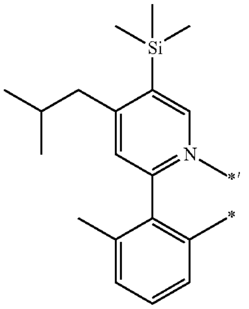
A40
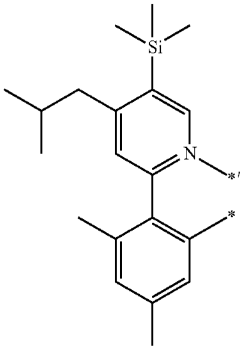
A41
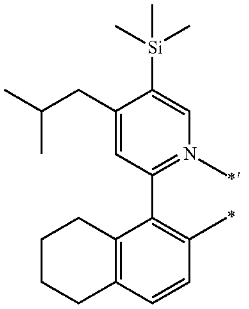

-continued
A42
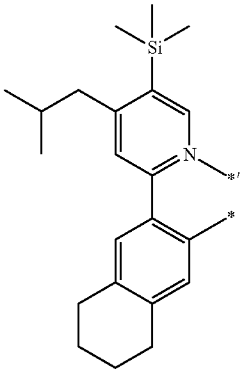
A43
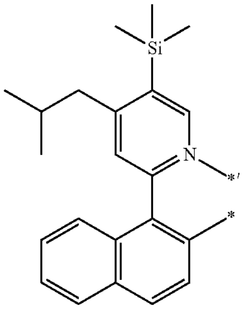
A44
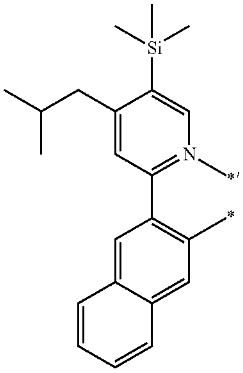
A45
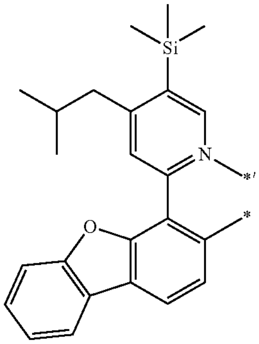
-continued
A46
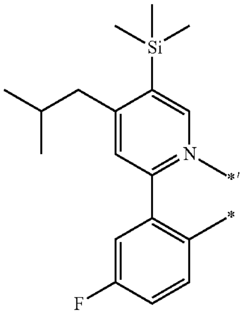
A47
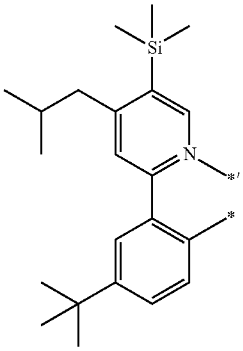
A48
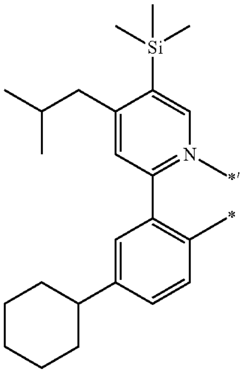
A49
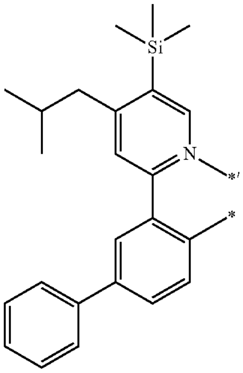

-continued
A50
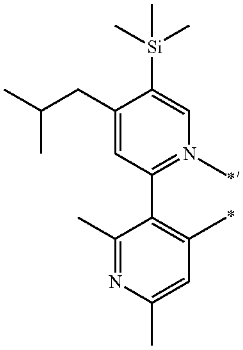
A51
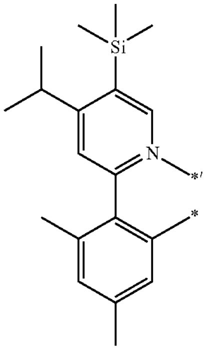
A52
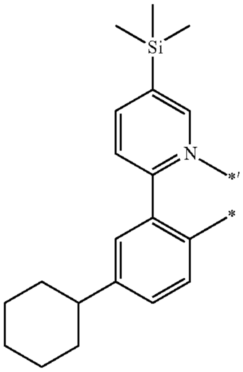
A53
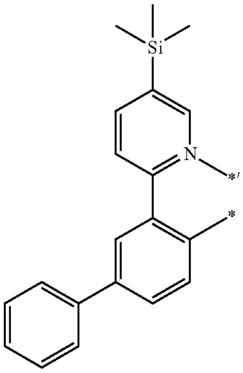
-continued
A54
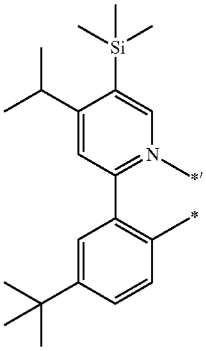
A55
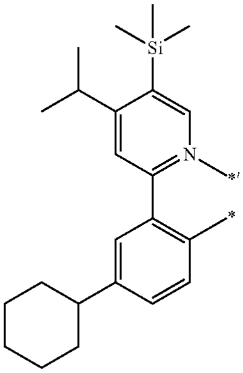
A56
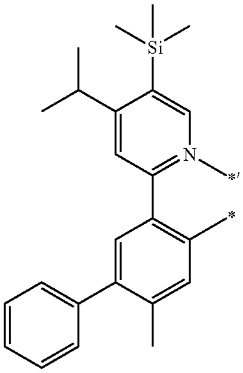
A57
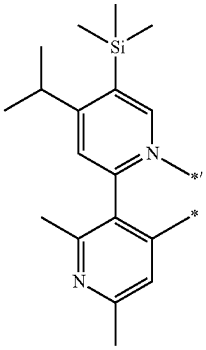

-continued
A58
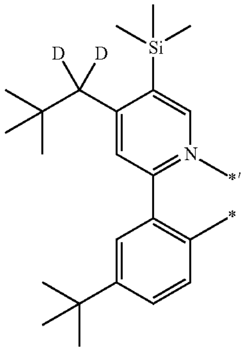
A59
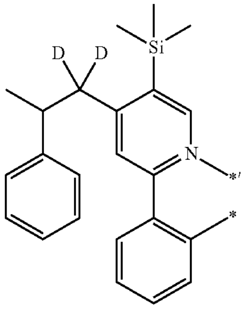
A60
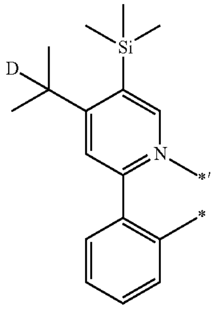
A61
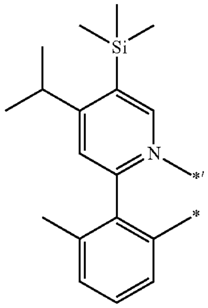
A62
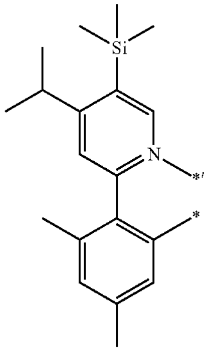
-continued
A63
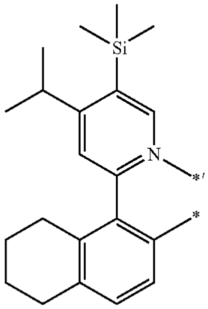
A64
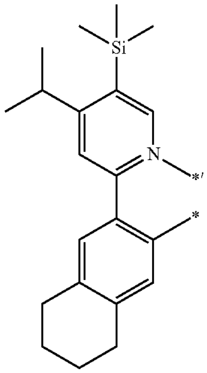
A65
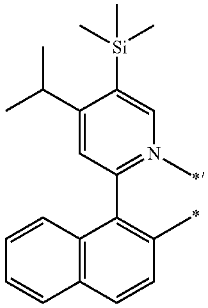
A66
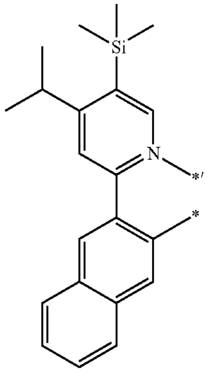

A67
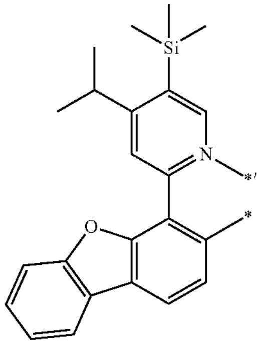
A68
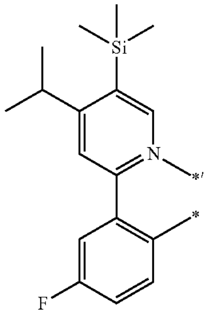
A69
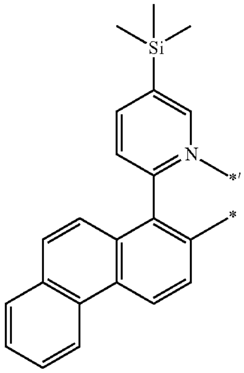
A70
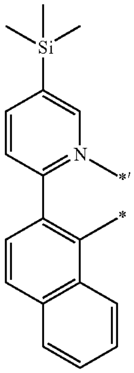
A71
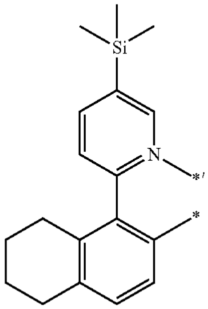
A72
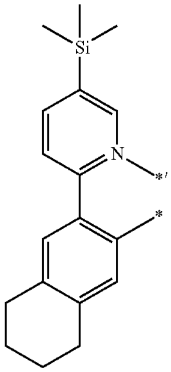
A73
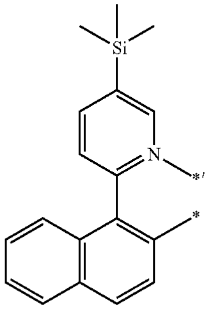
A74
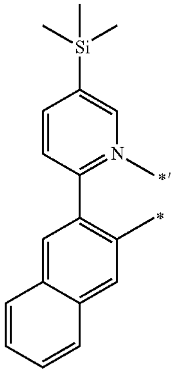

-continued
A75
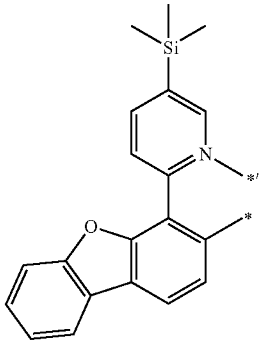
A76
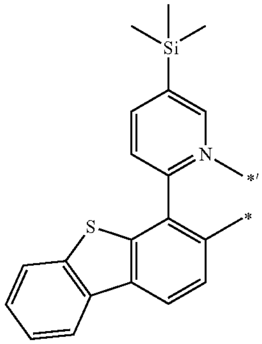
A77
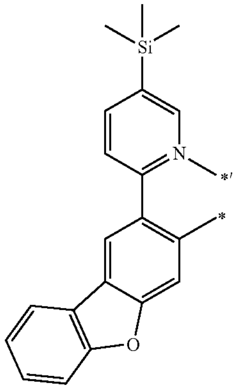
A78
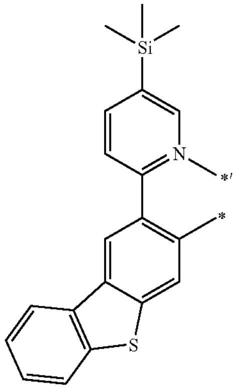
-continued
A79
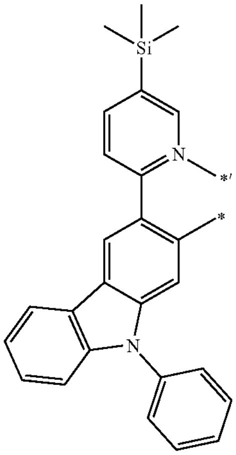
A80
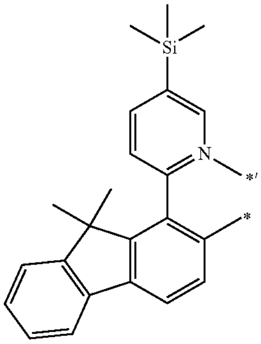
A81
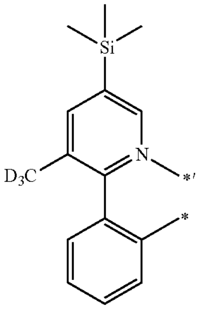
A82
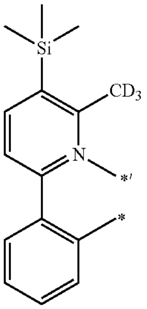

-continued
A83
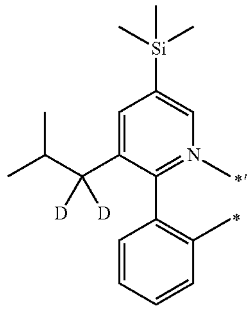
A84
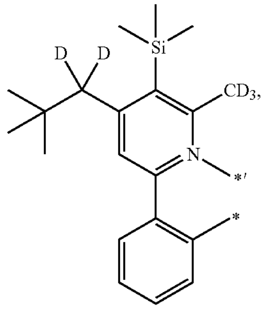
A85
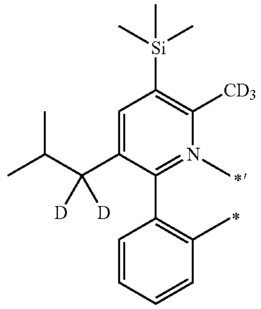
A86
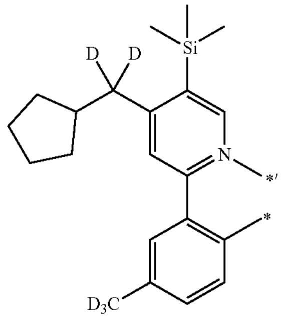
A87
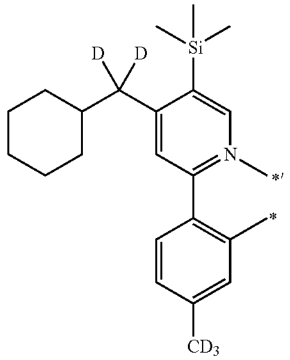
-continued
A88
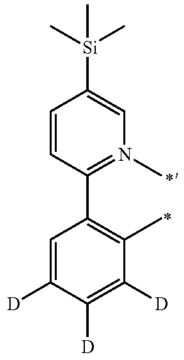
A89
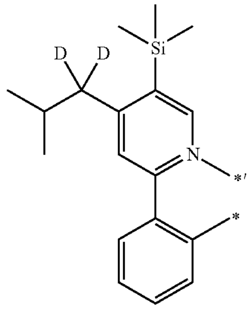
A90
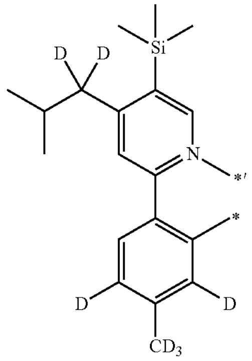
A91
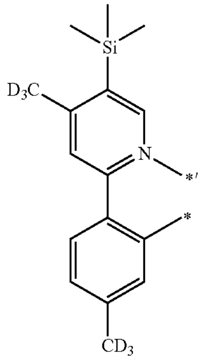

-continued
A92
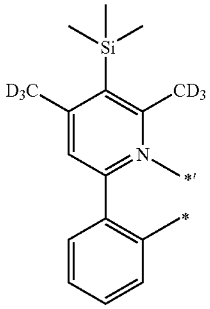
A93
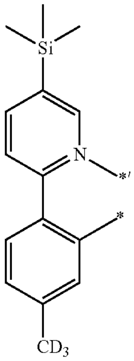
A94
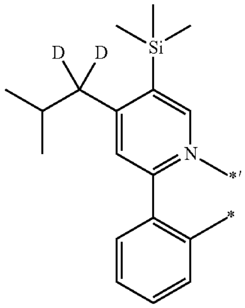
A95
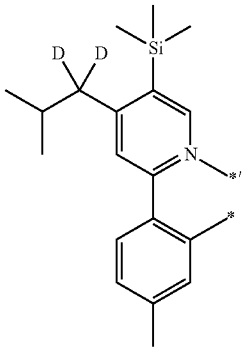
-continued
A96
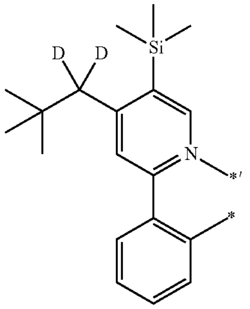
A97
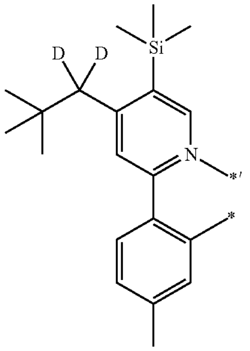
A98
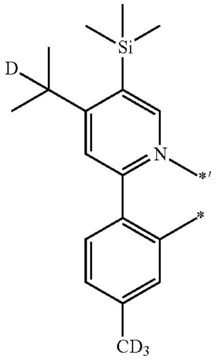
A99
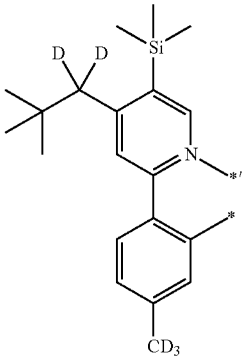

-continued
A100
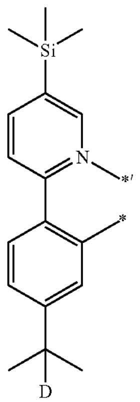
A101
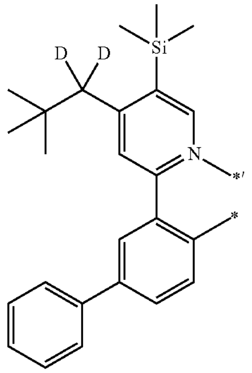
A102
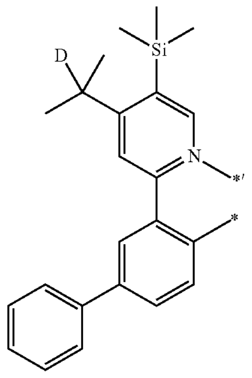
A103
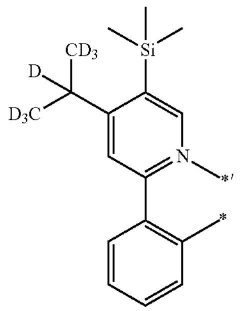
-continued
A104
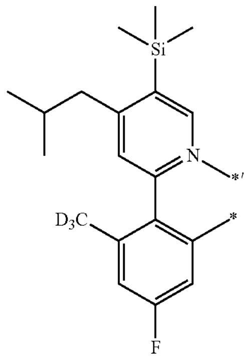
A105
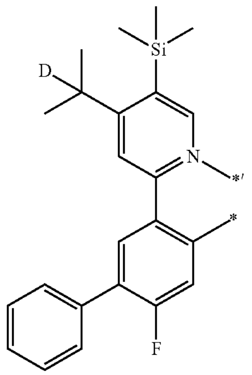
A106
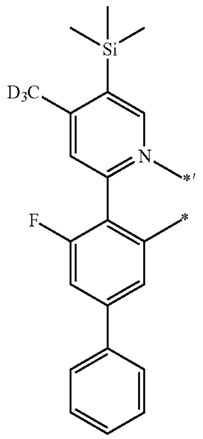
A107
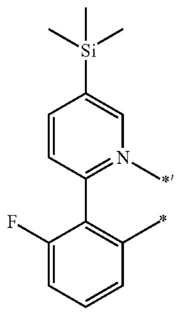

-continued
A108
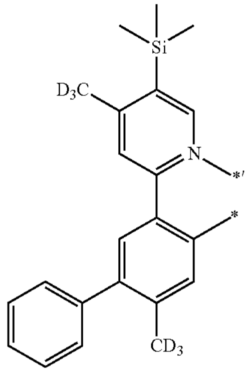
A109
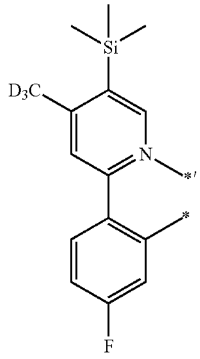
A110
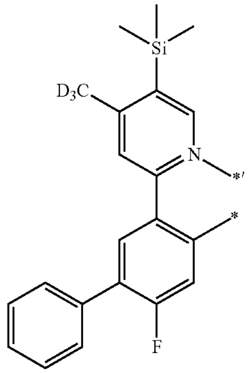
A111
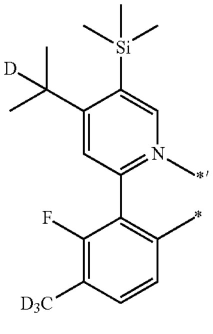
-continued
A112
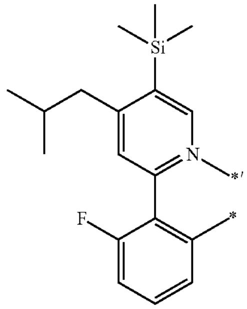
A113
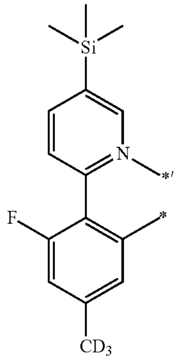
A114
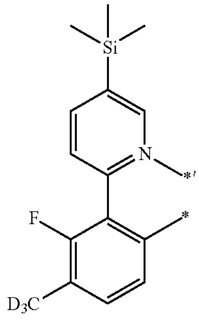
A115
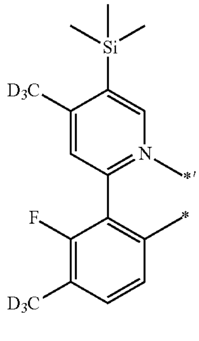

-continued
A116
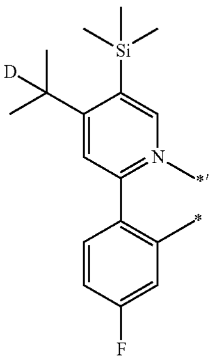
A117
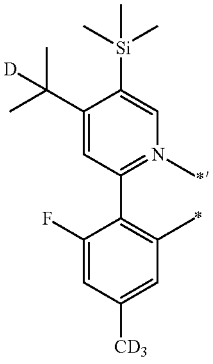
A118
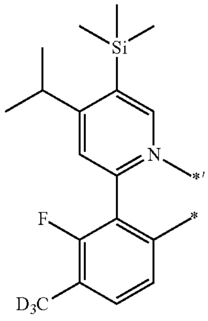
A119
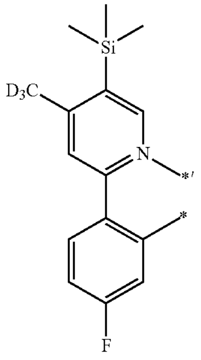
-continued
A120
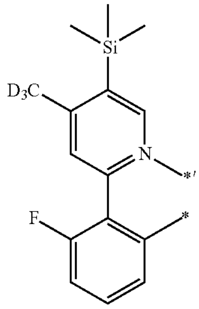
A121
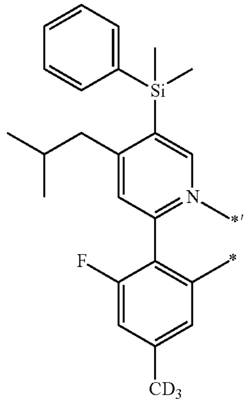
A122
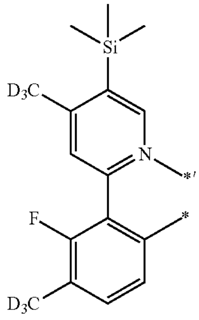
A123
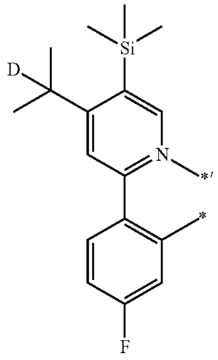

-continued
A124
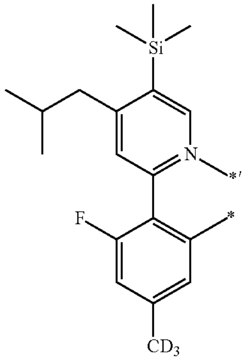
A125
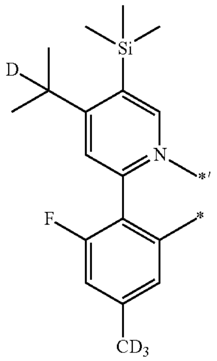
A126
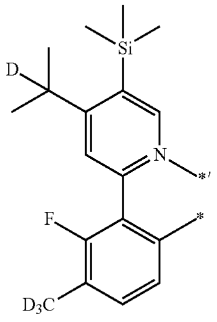
A127
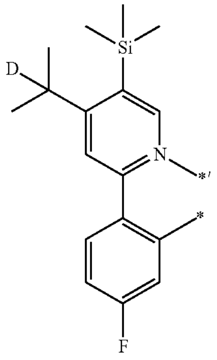
-continued
A128
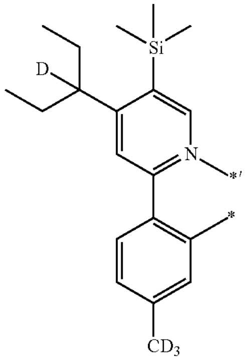
A129
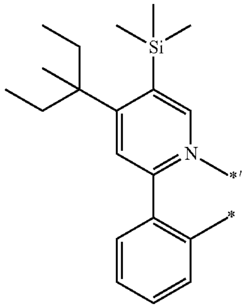
A130
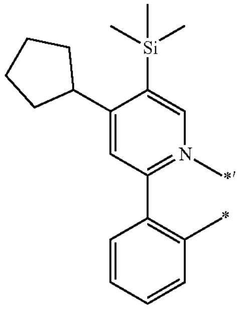
A131
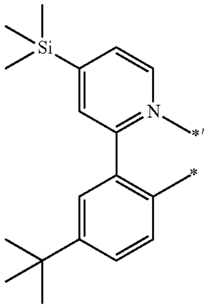

-continued
A132
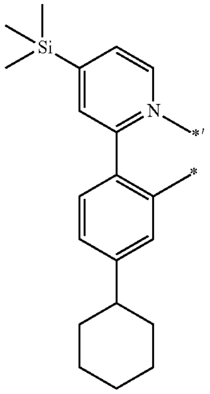
A133
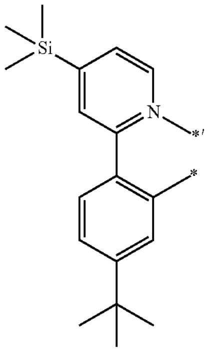
A134
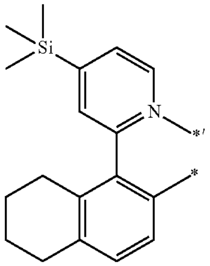
A135
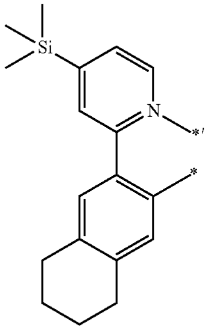
A136
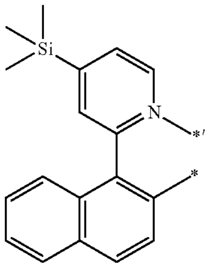
-continued
A137
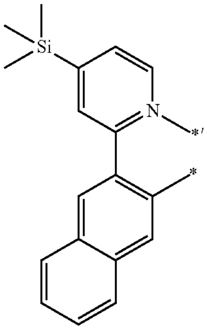
A138
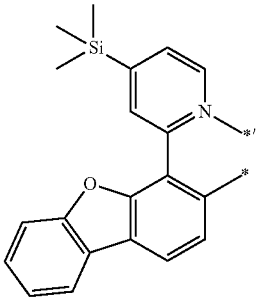
A139
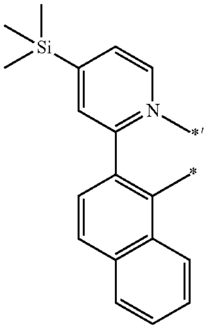
A140
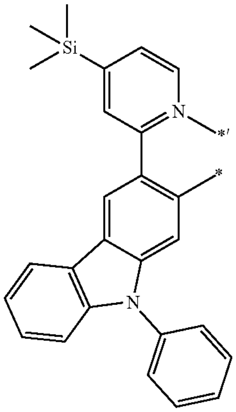

-continued
A141
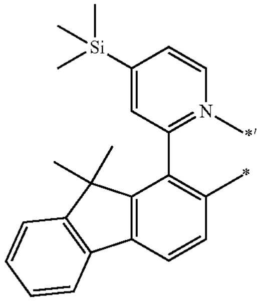
A142
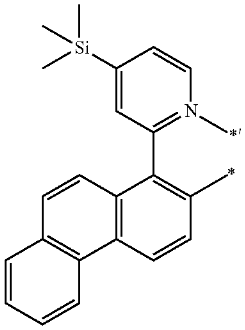
A143
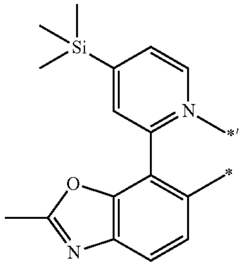
A144
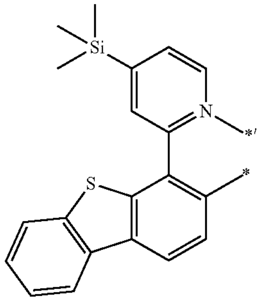
A145
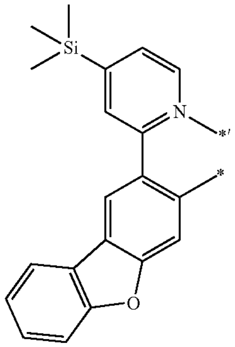
-continued
A146
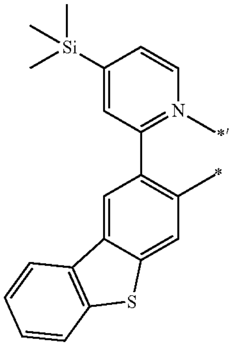
A147
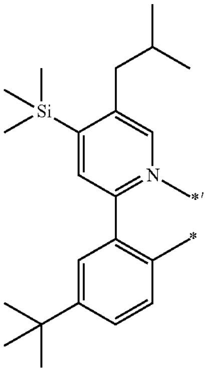
A148
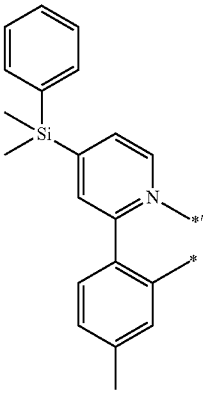
A149
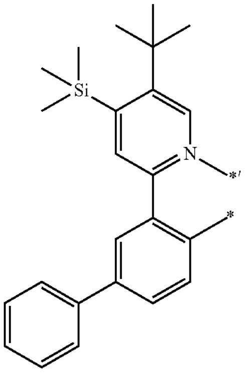

-continued
A150
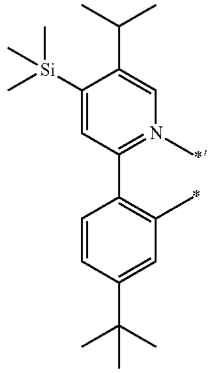
A151
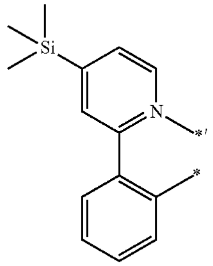
A152
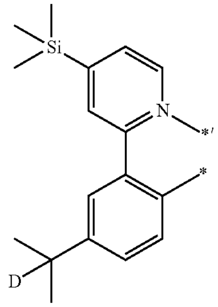
A153
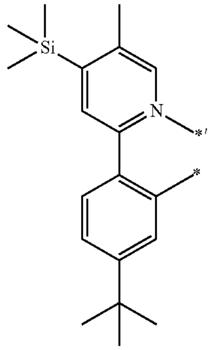
A154
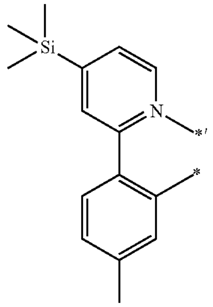
-continued
A155
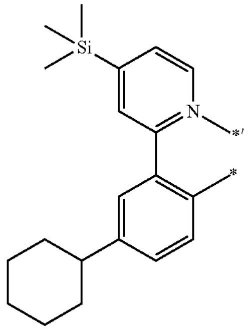
A156
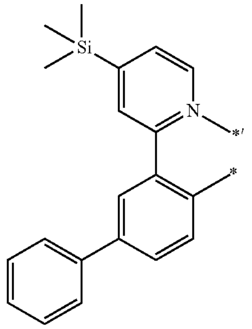
A157
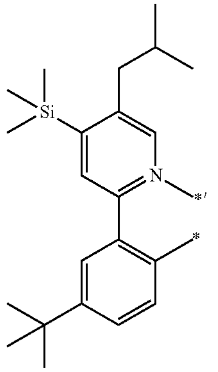
A158
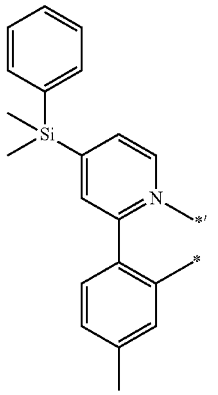

A159
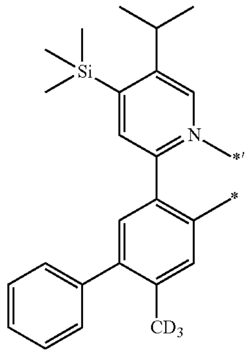
A160
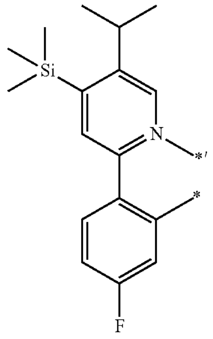
A161
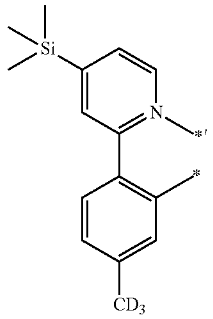
A162
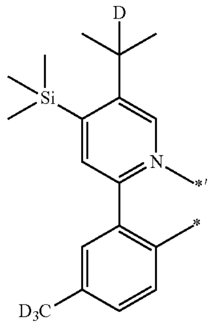
A163
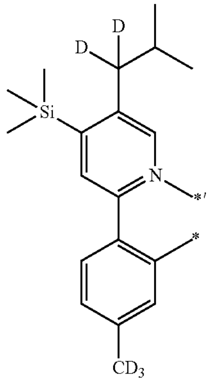
A164
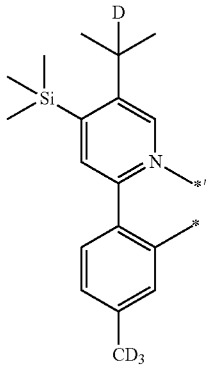
A165
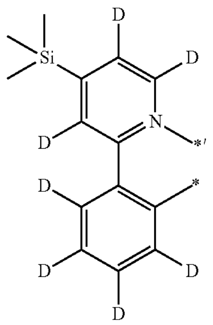
A166
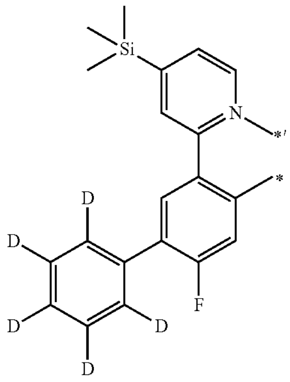

-continued
A167
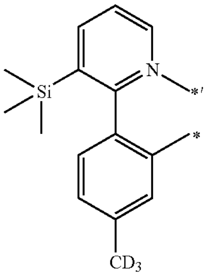
A168
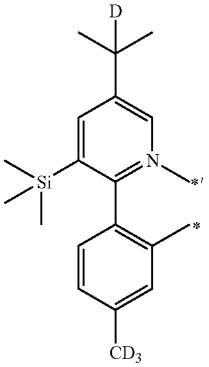
A169
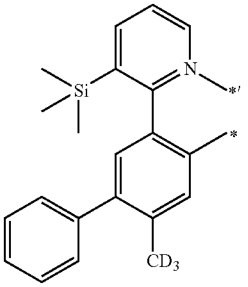
A170
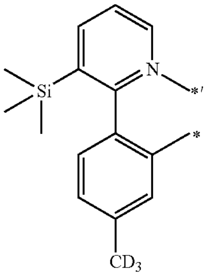
A171
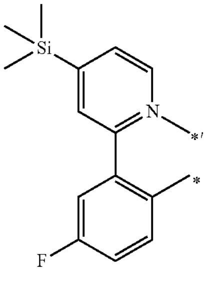
-continued
A172
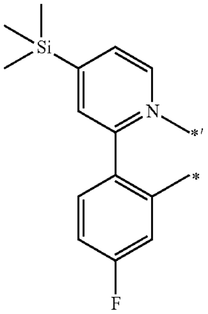
A173
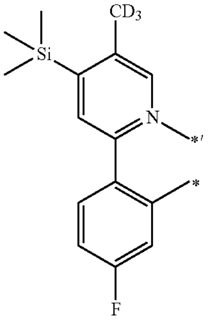
A174
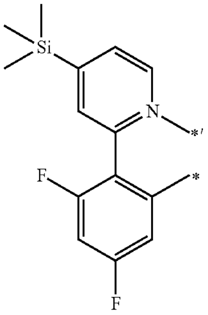
A175
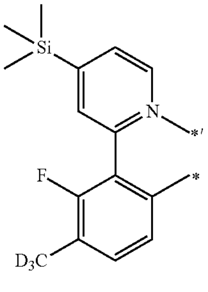
A176
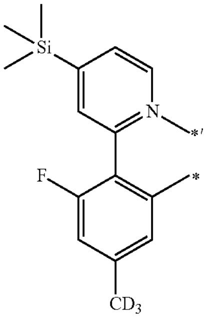

-continued
A177
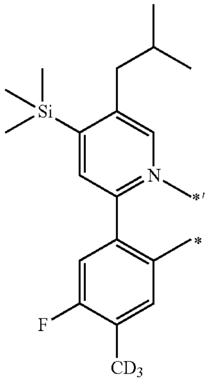
A178
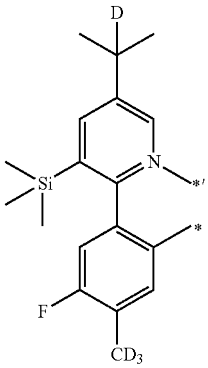
A179
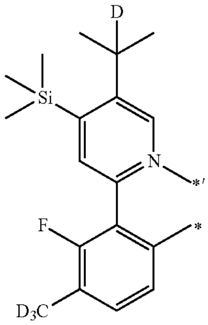
A180
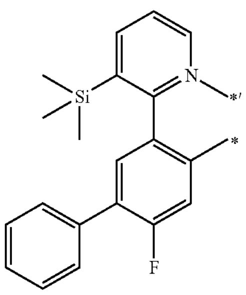
-continued
A181
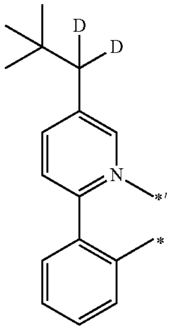
A182
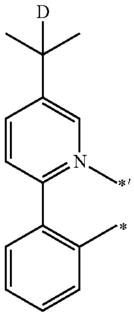
A183
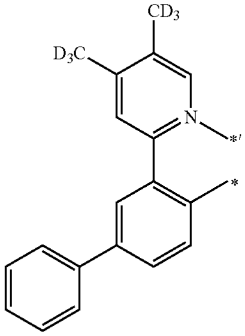
A184
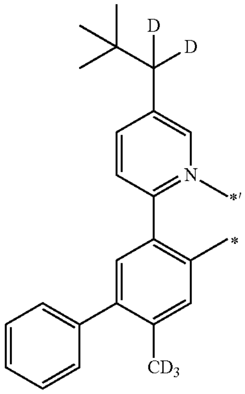

-continued
A185
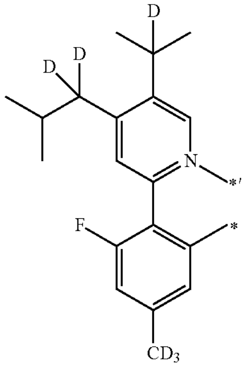
A186
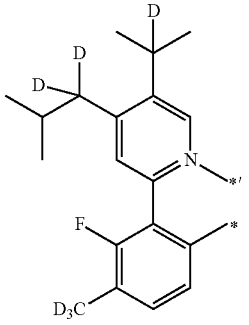
A187
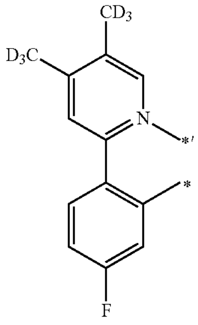
A188
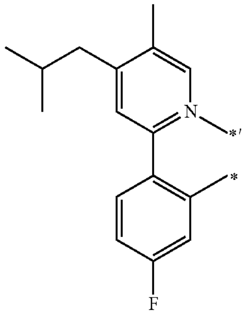
-continued
A189
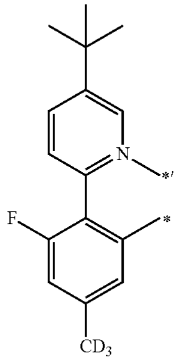
A190
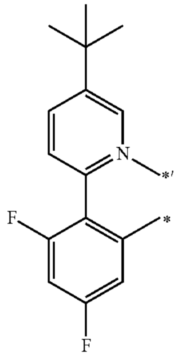
A191
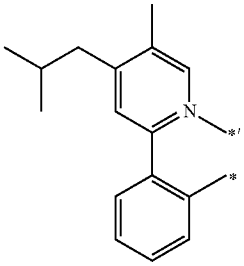
A192
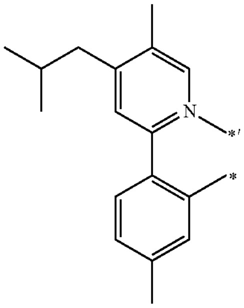
A193
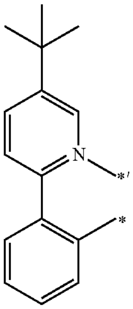

-continued
A194
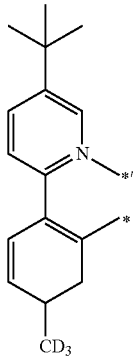
A195
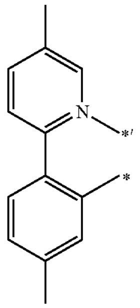
A196
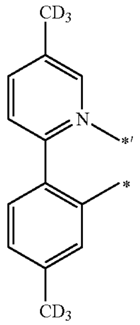
A197
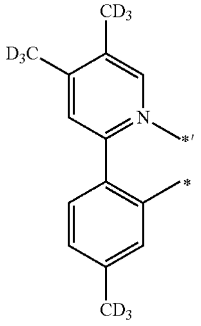
-continued
A198
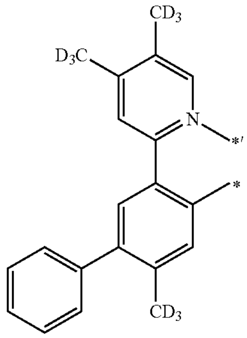
A199
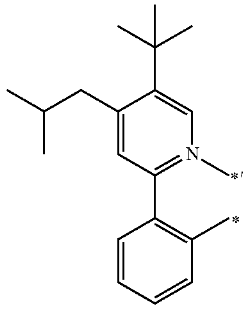
A200
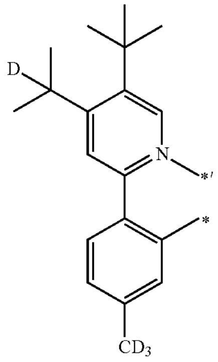
A201
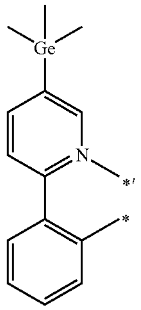

-continued
A202
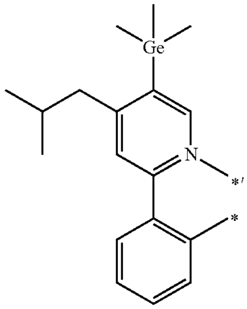
A203
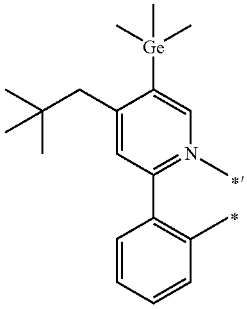
A204
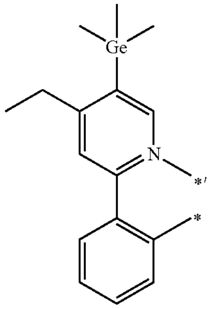
A205
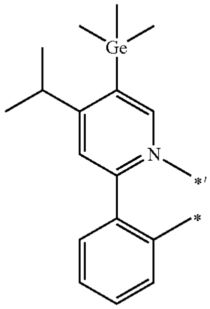
A206
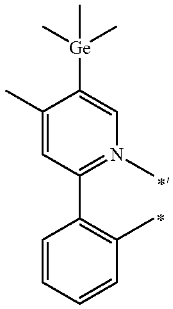
-continued
A207
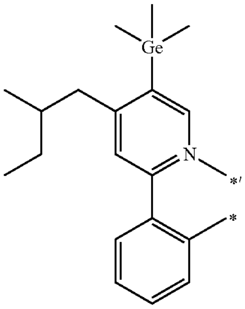
A208
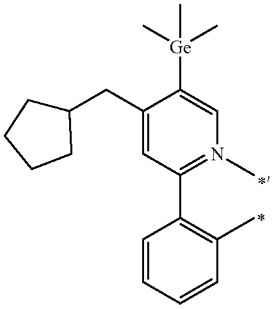
A209
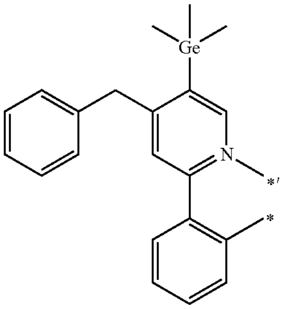
A210
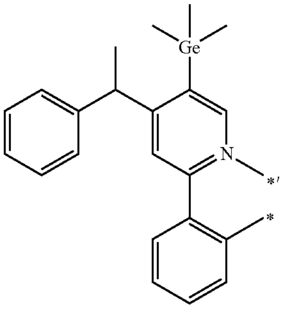
A211
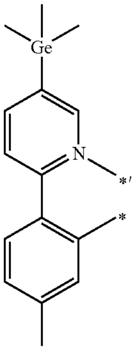

-continued
A212
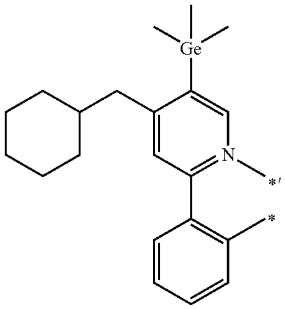
A213
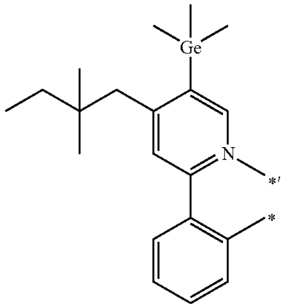
A214
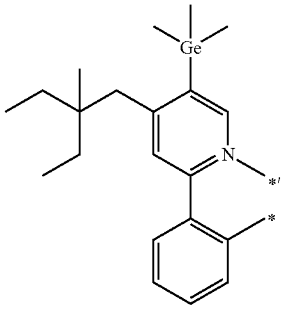
A215
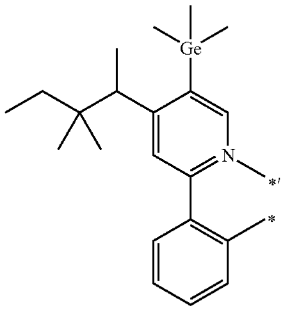
A216
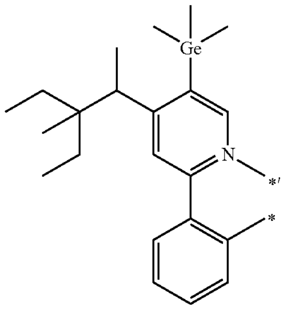
-continued
A217
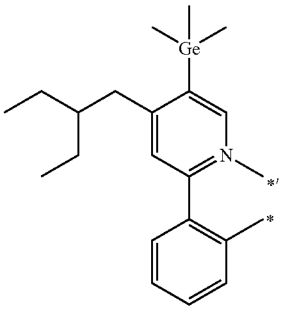
A218
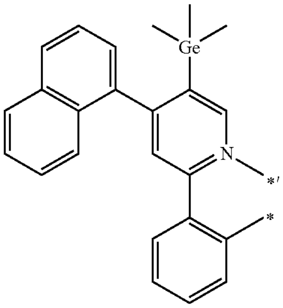
A219
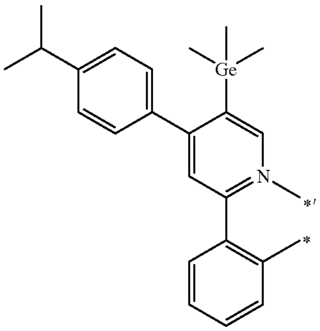
A220
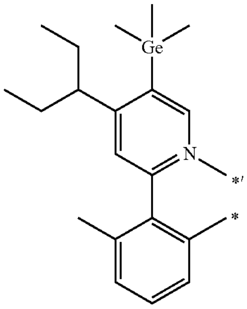
A221
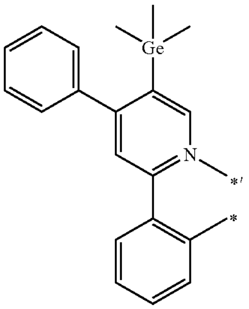

-continued
A222
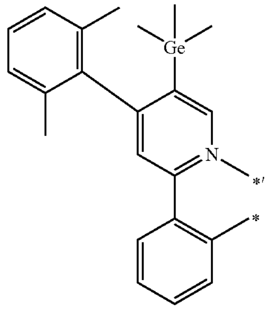
A223
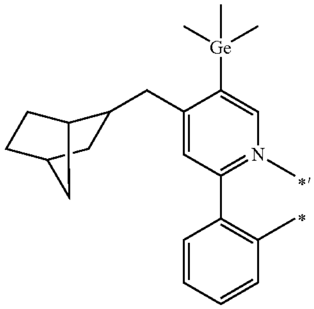
A224
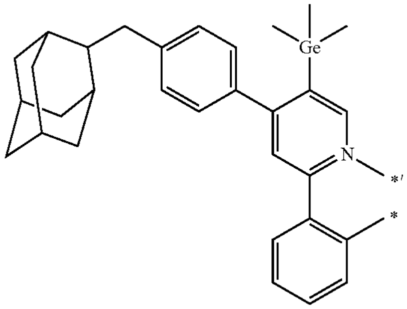
A225
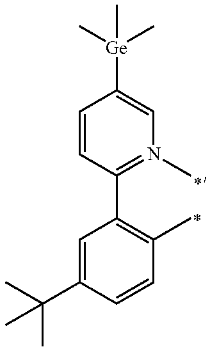
-continued
A226
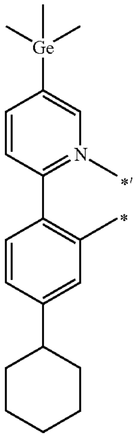
A227
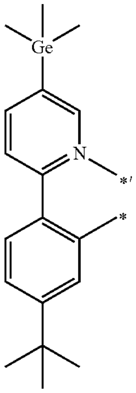
A228
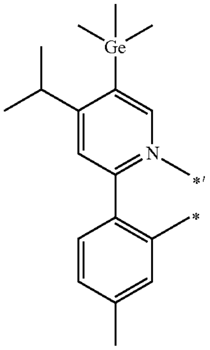
A229
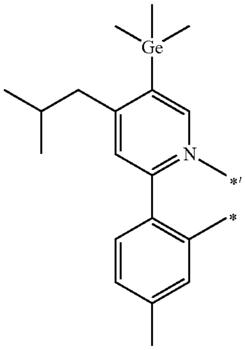

-continued
A230
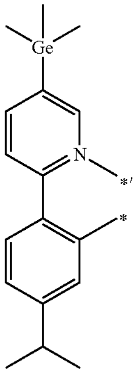
A231
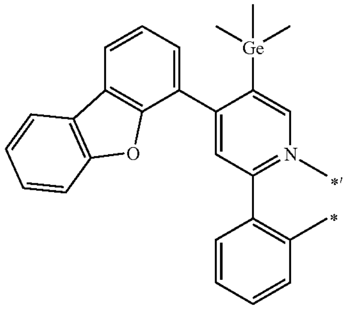
A232
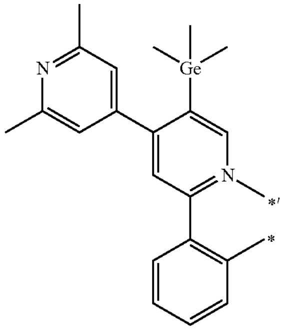
A233
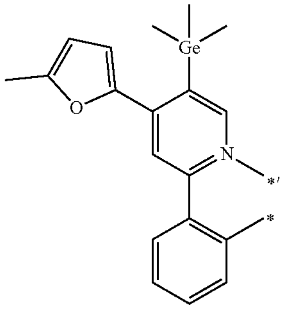
A234
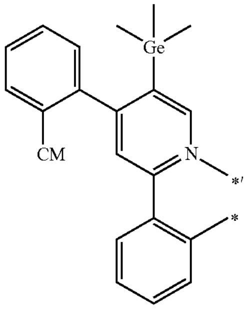
-continued
A235
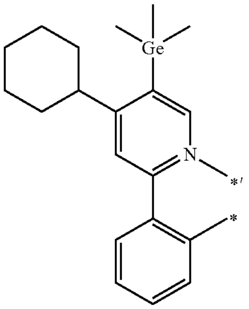
A236
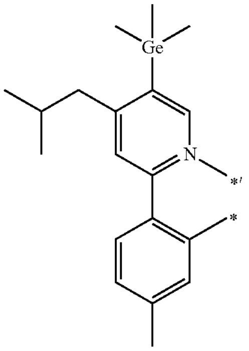
A237
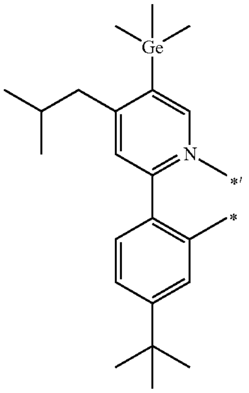
A238
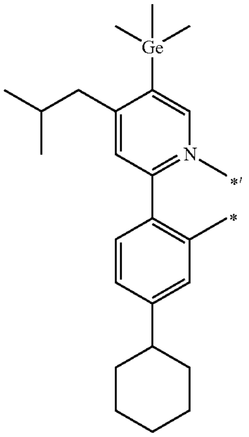

-continued
A239
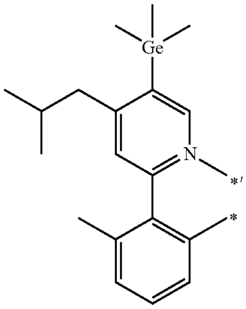
A240
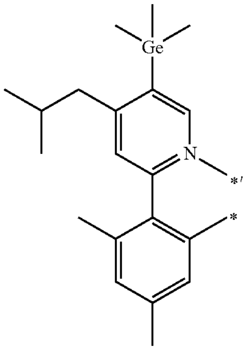
A241
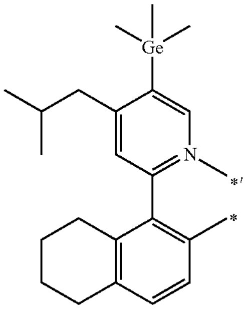
A242
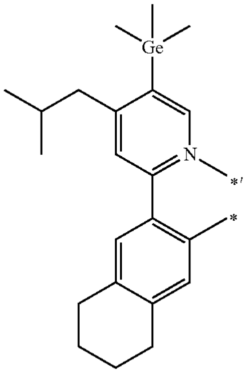
-continued
A243
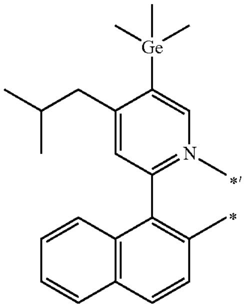
A244
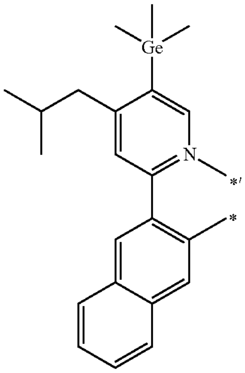
A245
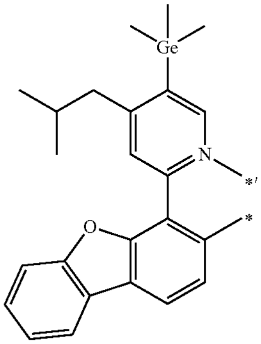
A246
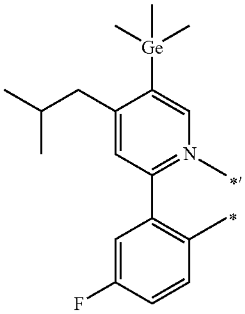

-continued
A247
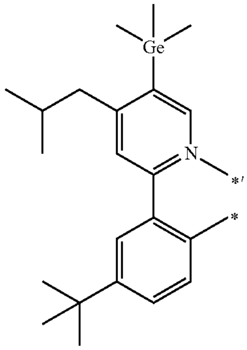
A248
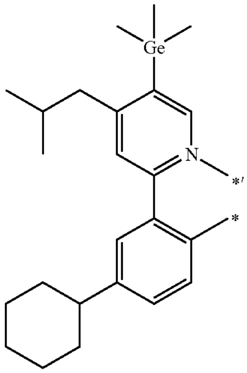
A249
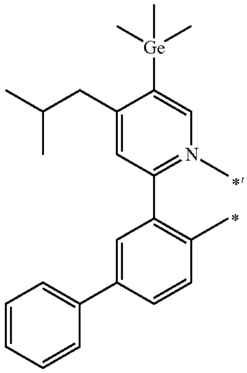
A250
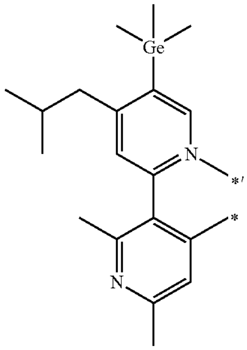
-continued
A251
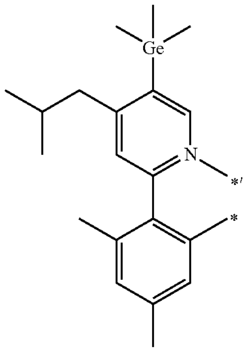
A252
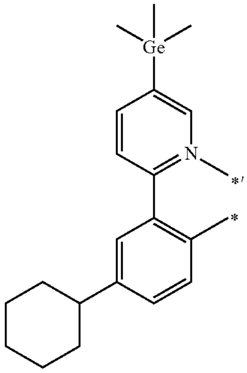
A253
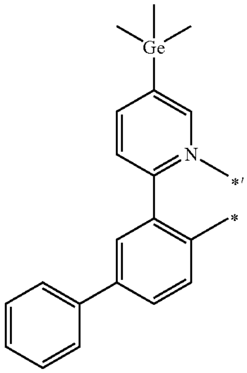
A254
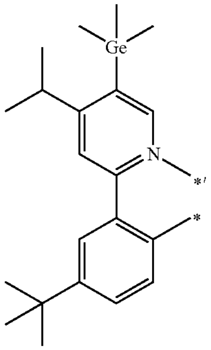

-continued
A255
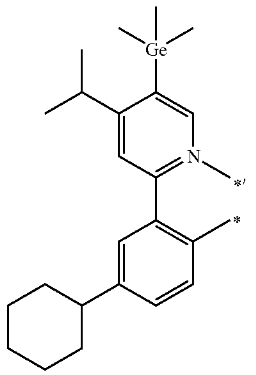
A256
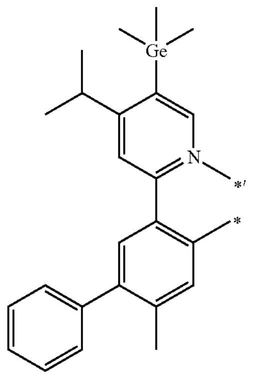
A257
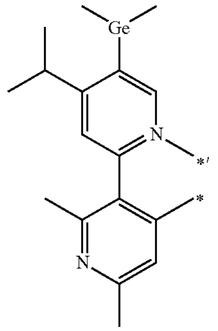
A258
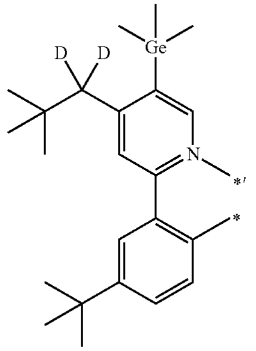
-continued
A259
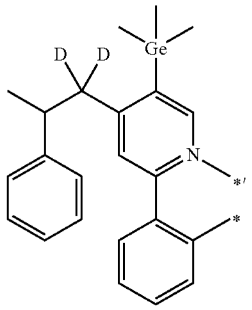
A260
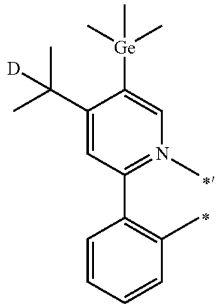
A261
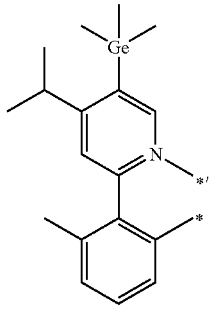
A262
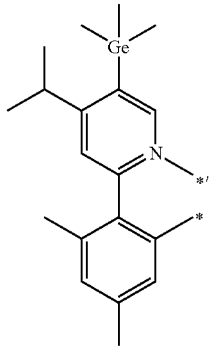
A263
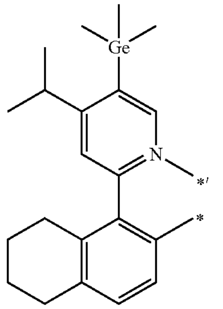

-continued
A264
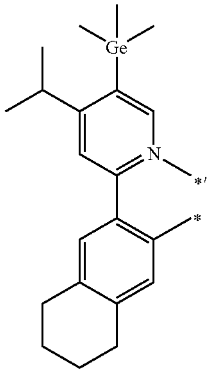
A265
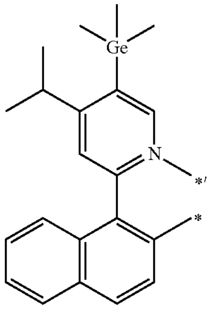
A266
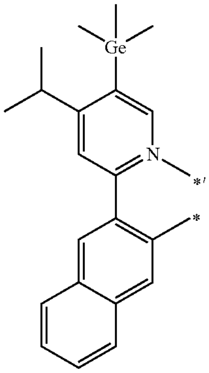
A267
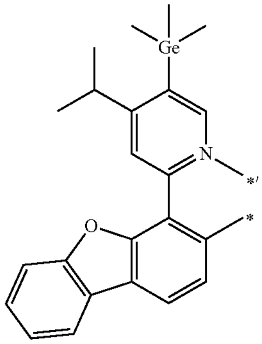
-continued
A268
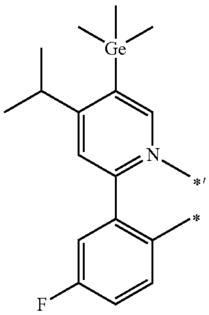
A269
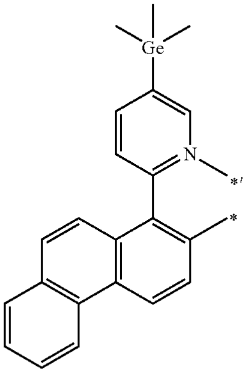
A270
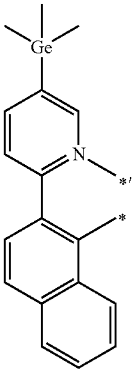
A271
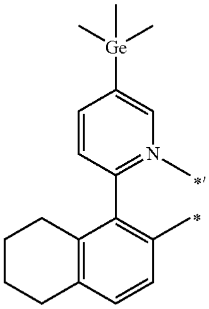

-continued
A272
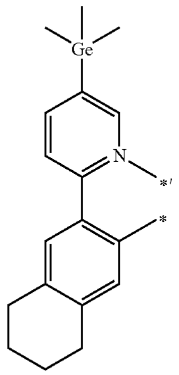
A273
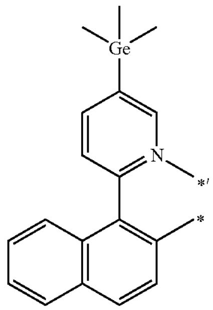
A274
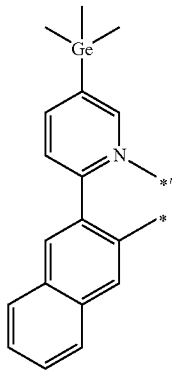
A275
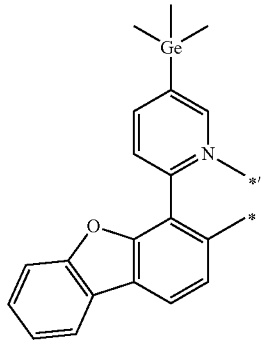
-continued
A276
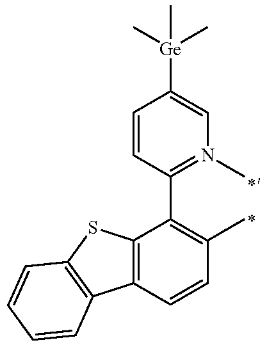
A277
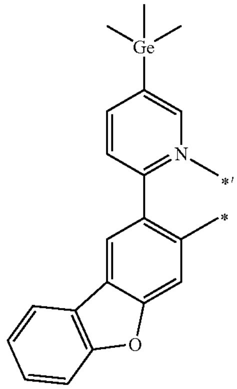
A278
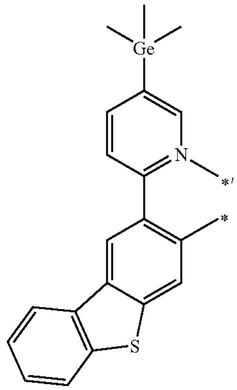
A279
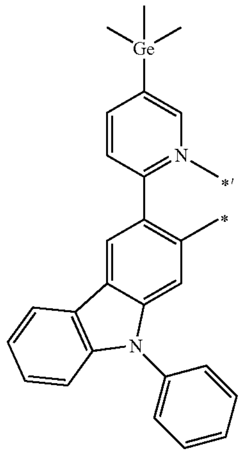

-continued
A280
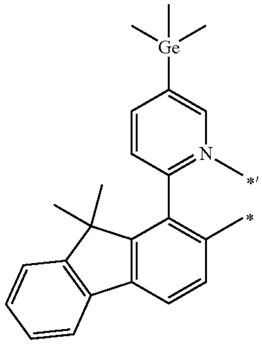
A281
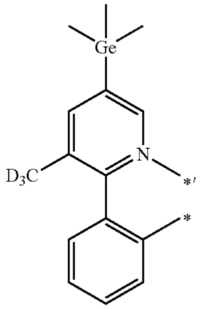
A282
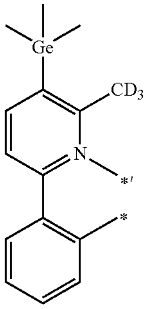
A283
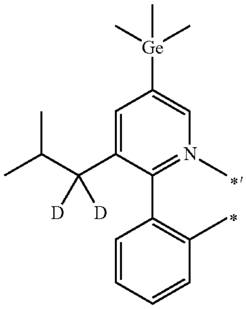
A284
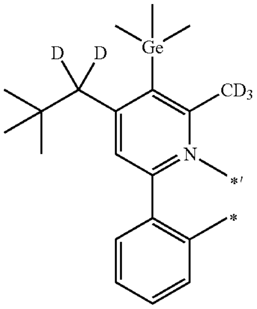
-continued
A285
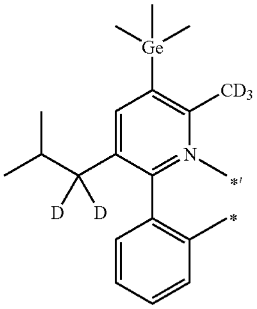
A286
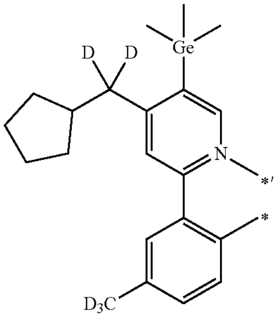
A287
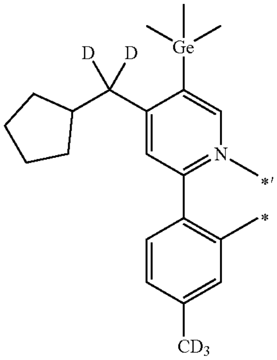
A288
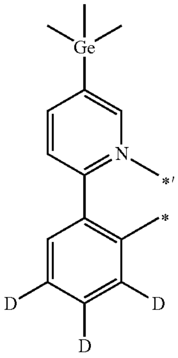

-continued
A289
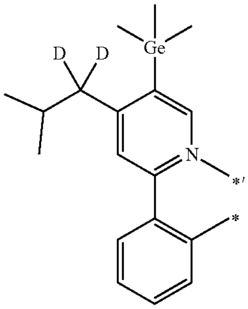
A290
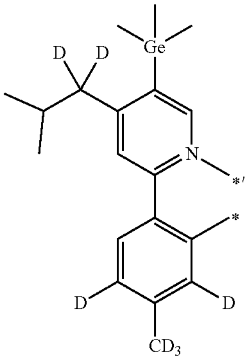
A291
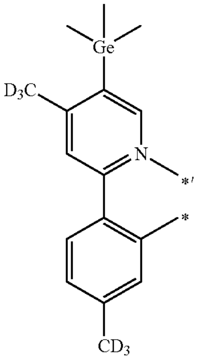
A292
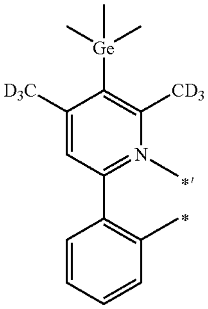
-continued
A293
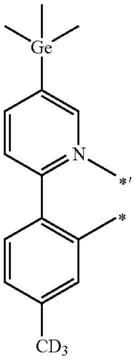
A294
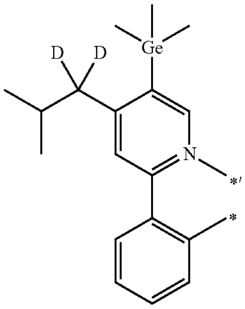
A295
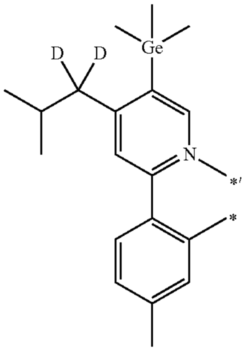
A296
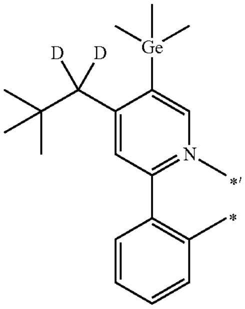

-continued
A297
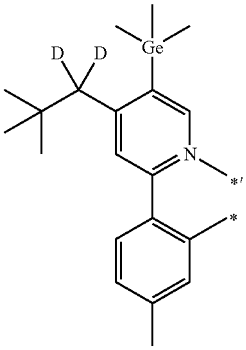
A298
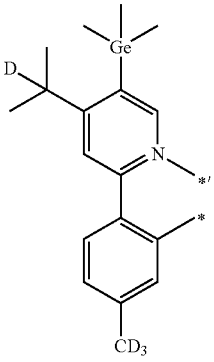
A299
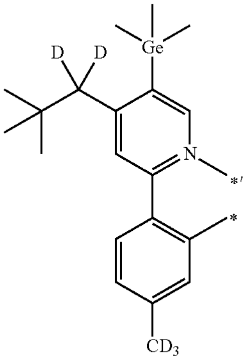
A300
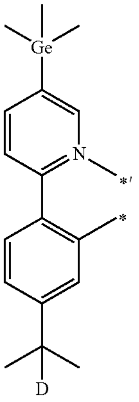
-continued
A301
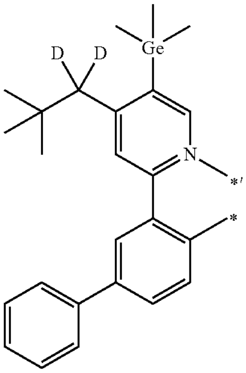
A302
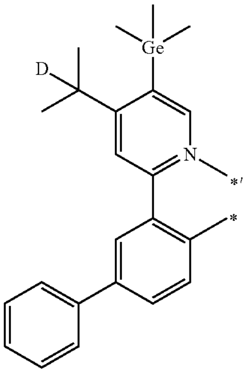
A303
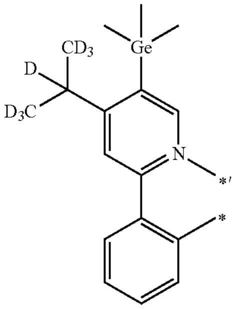
A304
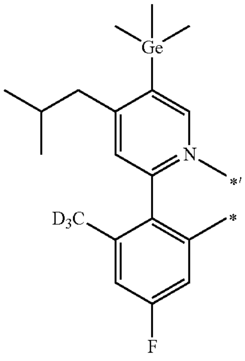

-continued
A305
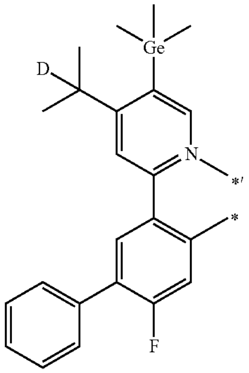
A306
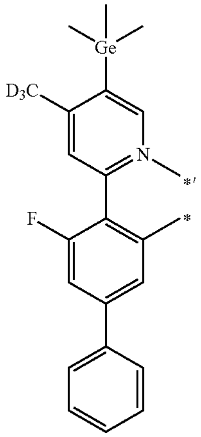
A307
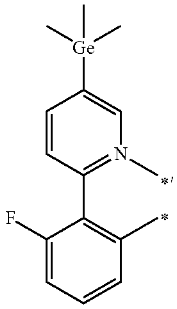
A308
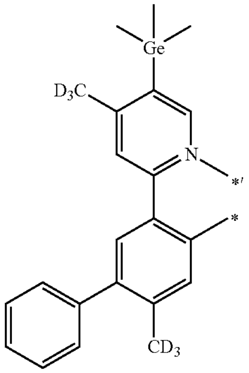
-continued
A309
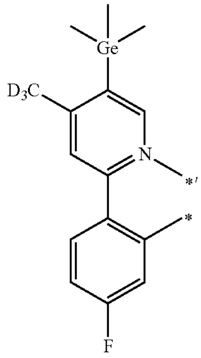
A310
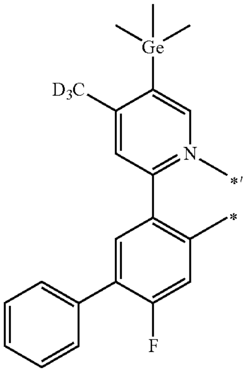
A311
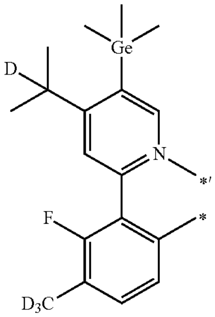
A312
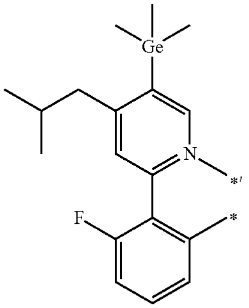

-continued
A313
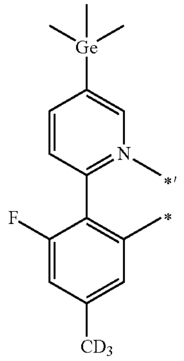
A314
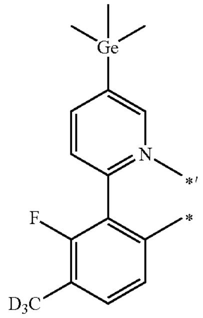
A315
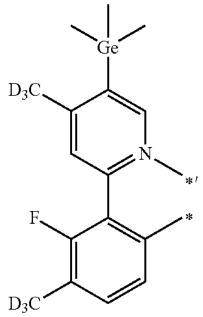
A316
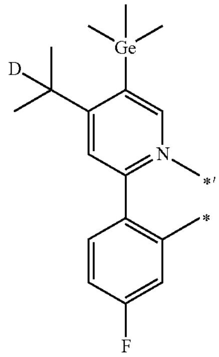
-continued
A317
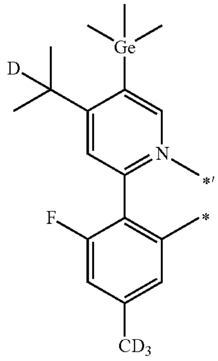
A318
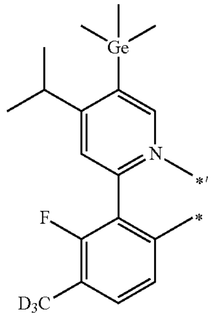
A319
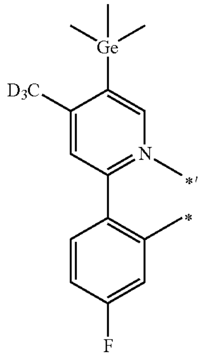
A320
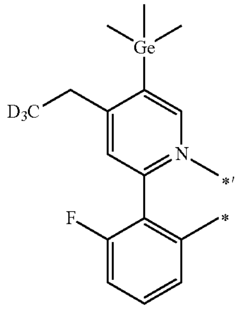

-continued
A321
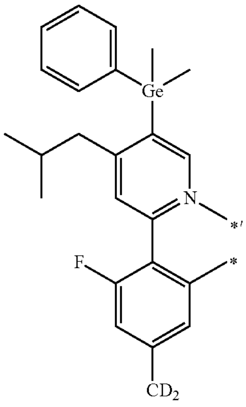
A322
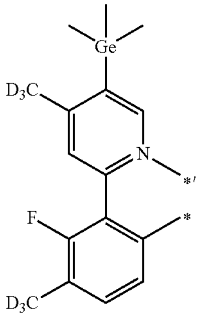
A323
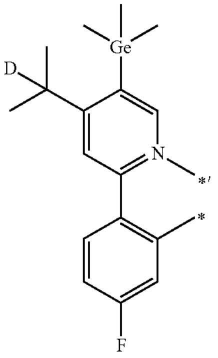
A324
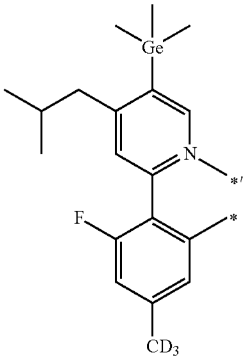
-continued
A325
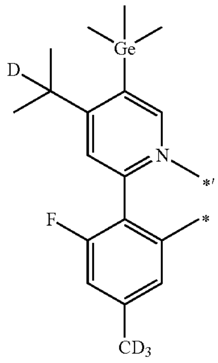
A326
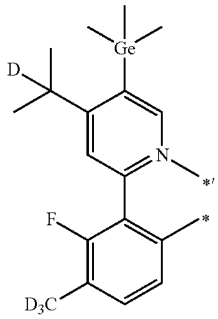
A327
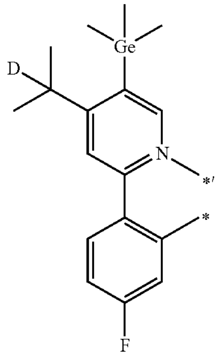
A328
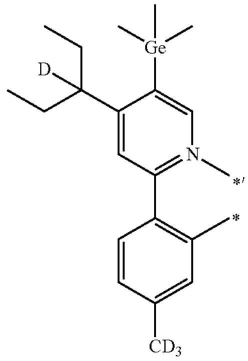

-continued
A329
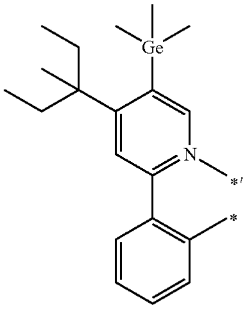
A330
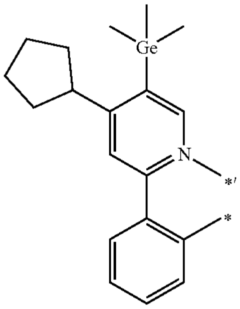
A331
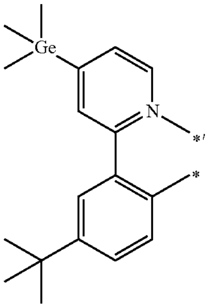
A332
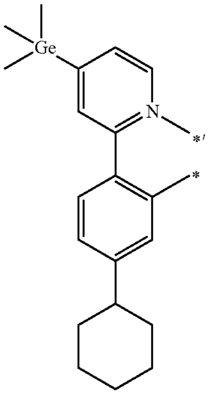
-continued
A333
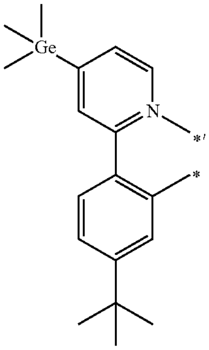
A334
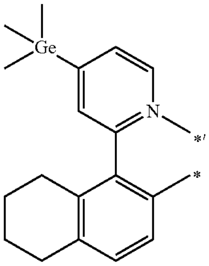
A335
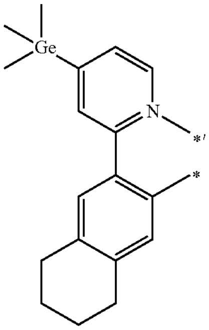
A336
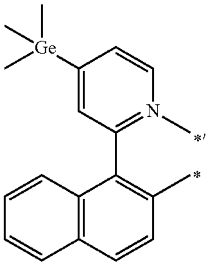
A337
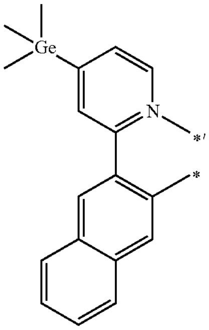

-continued
A338
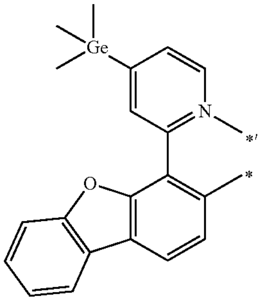
A339
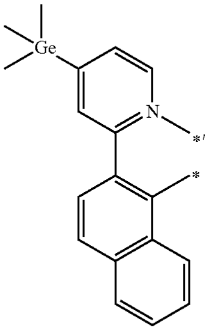
A340
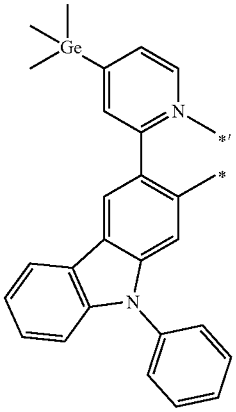
A341
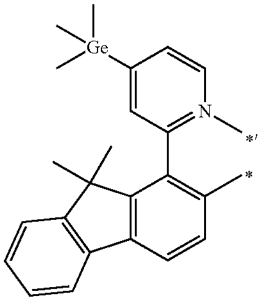
-continued
A342
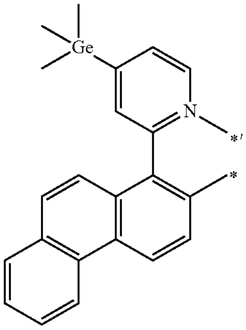
A343
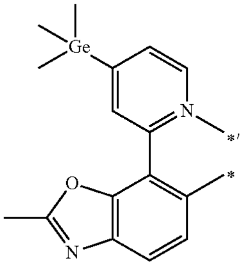
A344
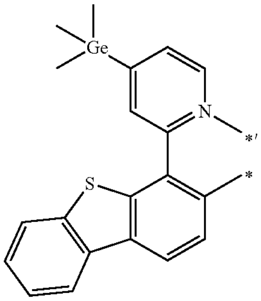
A345
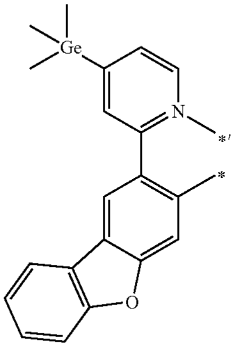
A346
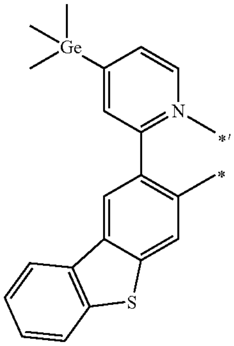

-continued
A347
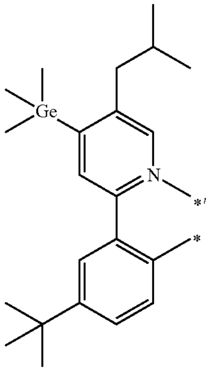
A348
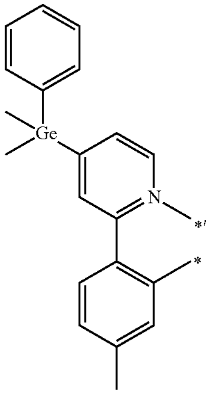
A349
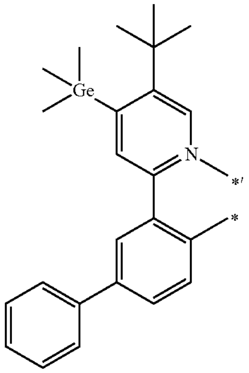
A350
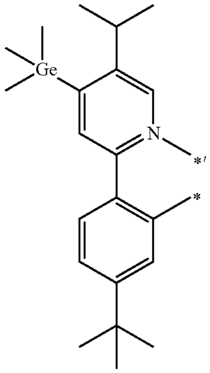
-continued
A351
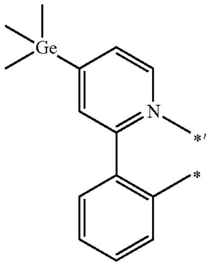
A352
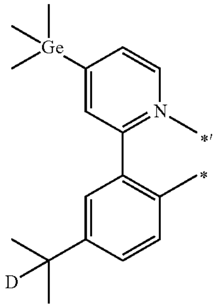
A353
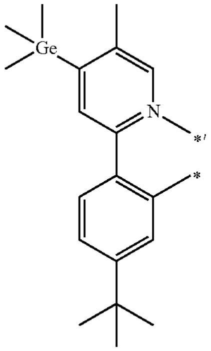
A354
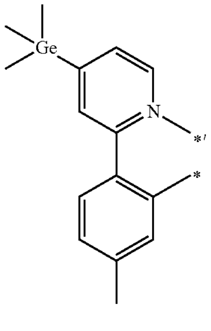
A355
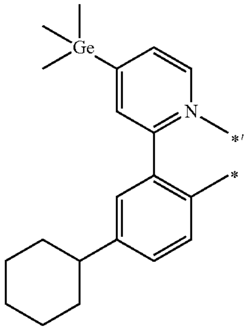

-continued
A356
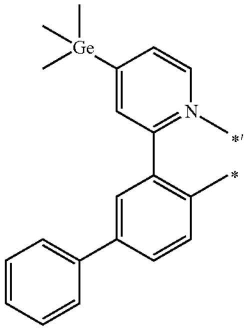
A357
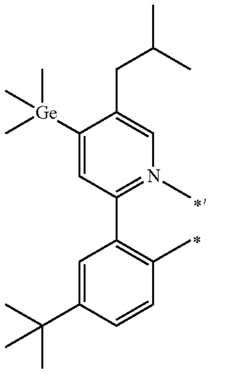
A358
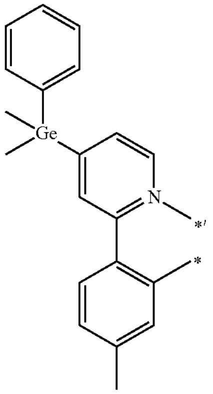
A359
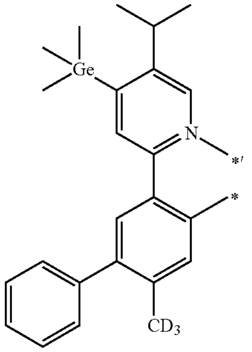
-continued
A360
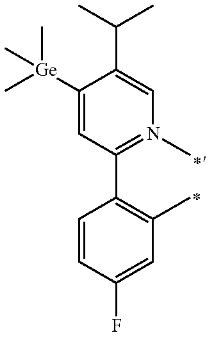
A361
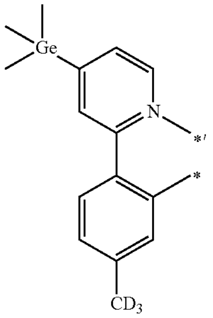
A362
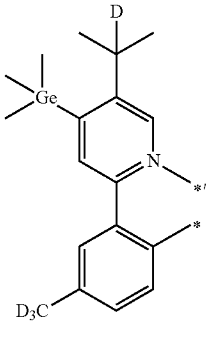
A363
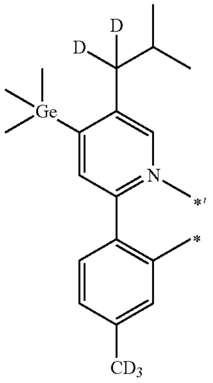

-continued
A364
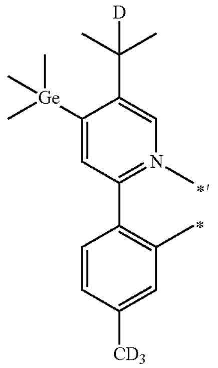
A365
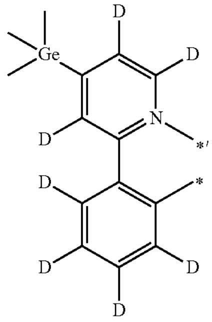
A366
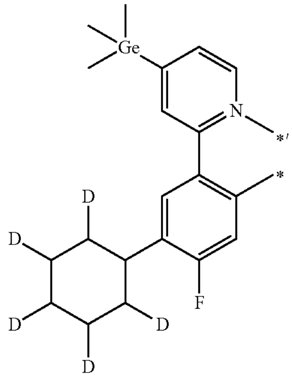
A367
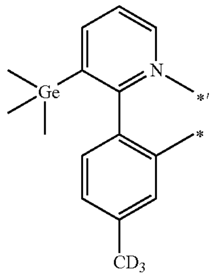
-continued
A368
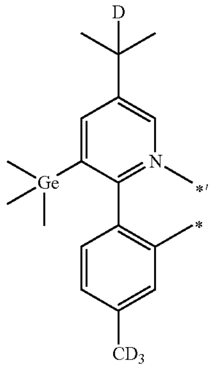
A369
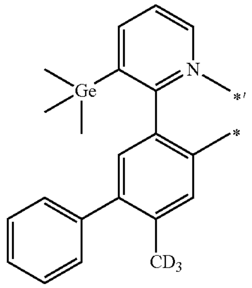
A370
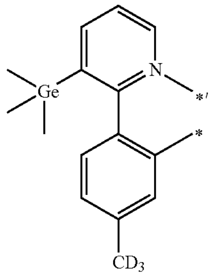
A371
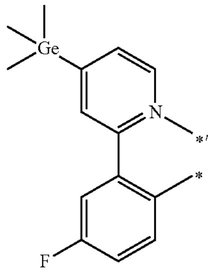
A372
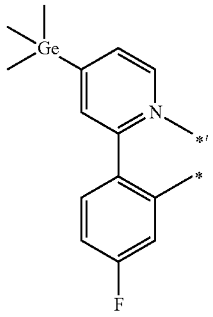

-continued
A373
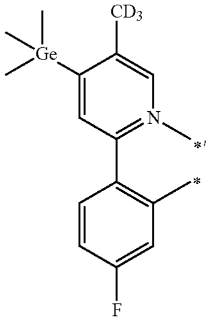
A374
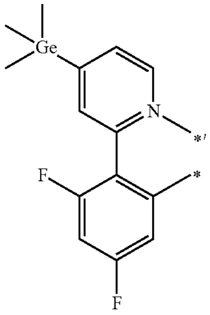
A375
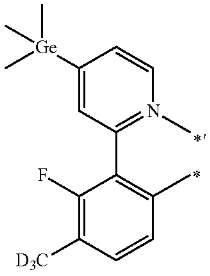
A376
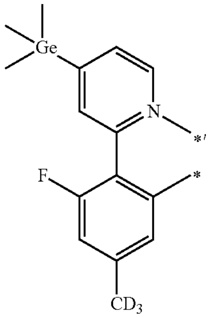
A377
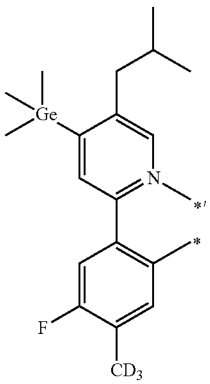
-continued
A378
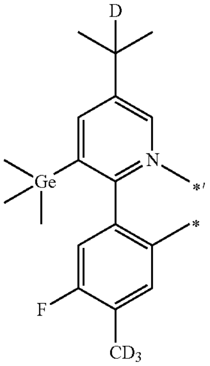
A379
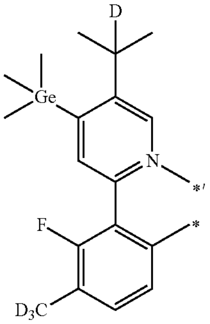
A380
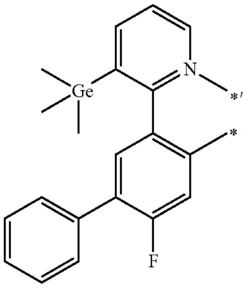
In one or more embodiments, $L_{12}$ and $L_{13}$ in Formula 1, $L_{22}$ and $L_{23}$ in Formula 2, a ligand represented by Formula 1-2, and a ligand represented by Formula 2-2 may each independently be represented by one of B1 to B1542:
B1
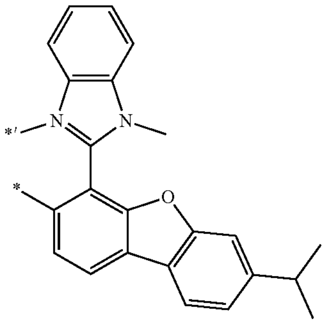

-continued
B2
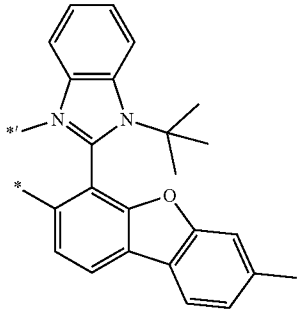
B3
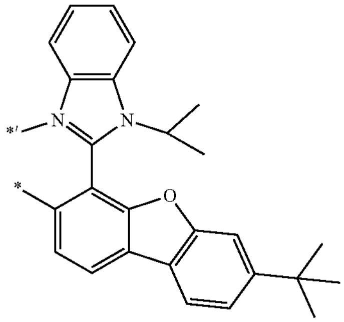
B4
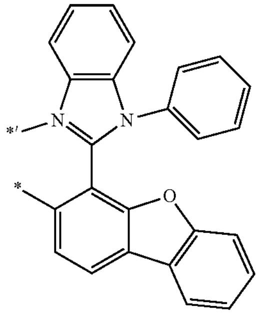
B5
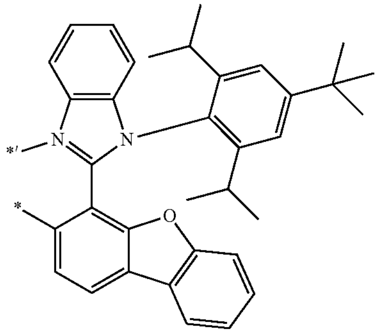
B6
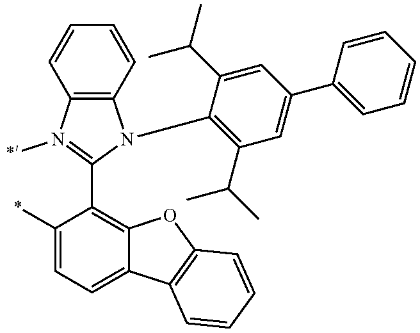
-continued
B7
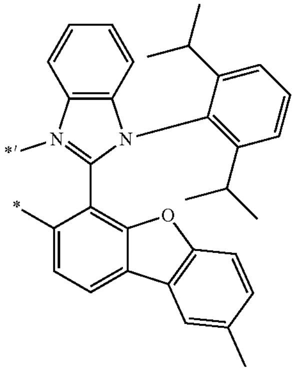
B8
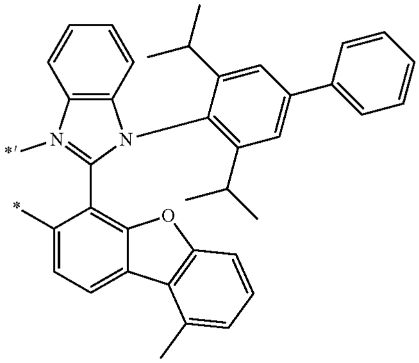
B9
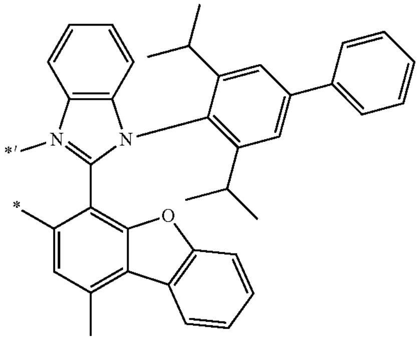
B10
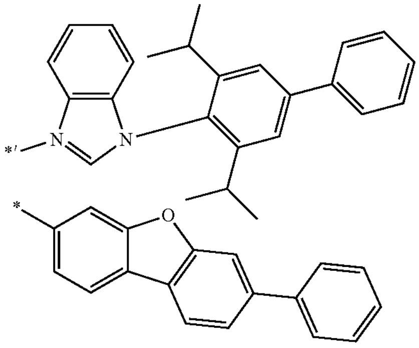

-continued
B11
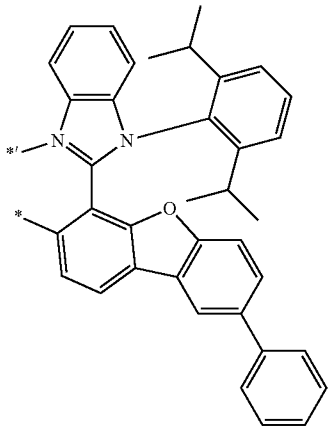
B12
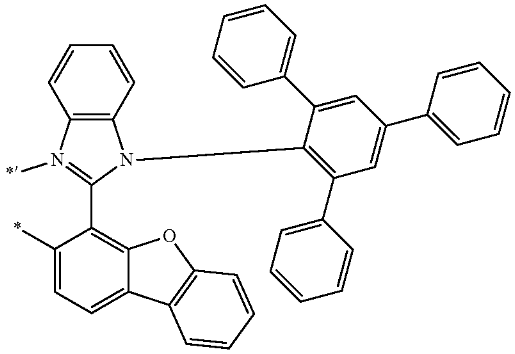
B13
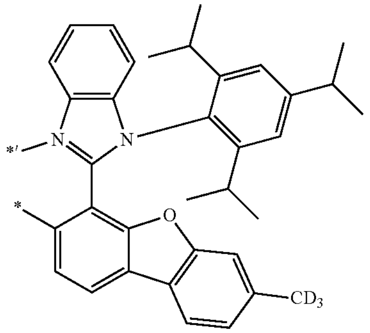
B14
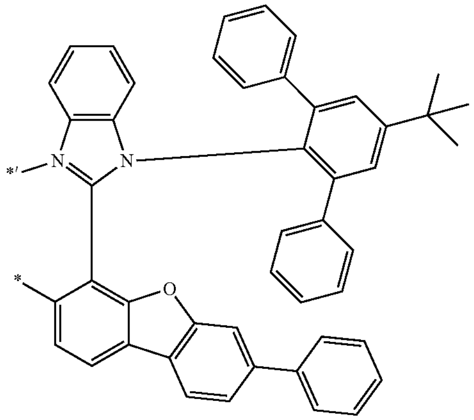
-continued
B15
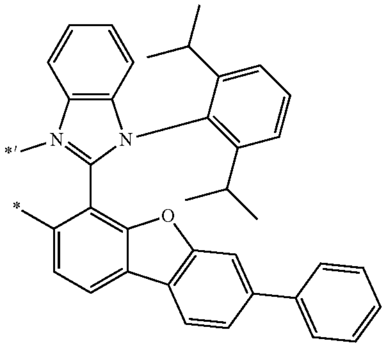
B16
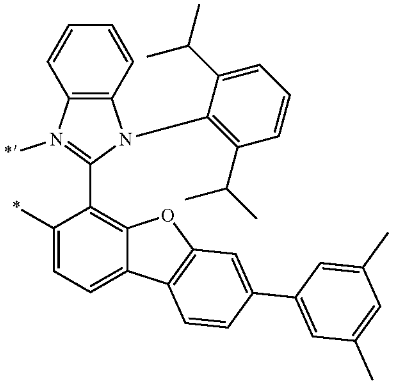
B17
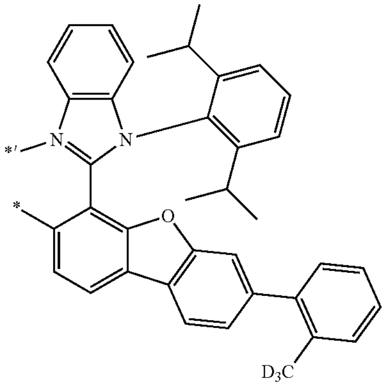
B18
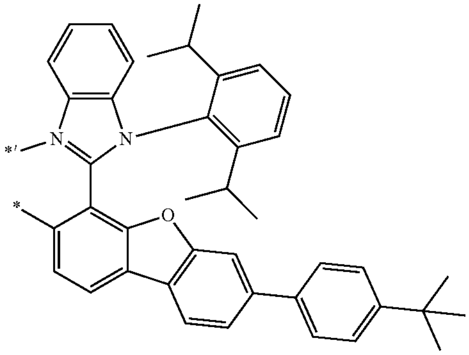

-continued
B19
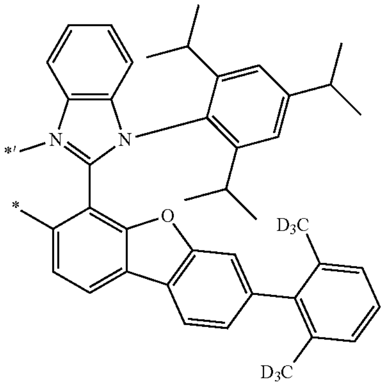
B20
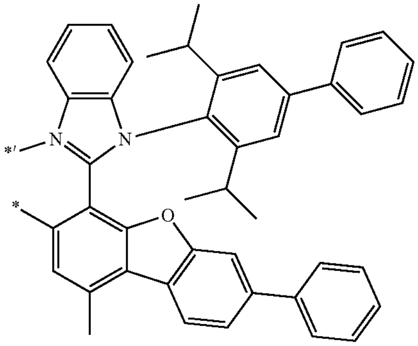
B21
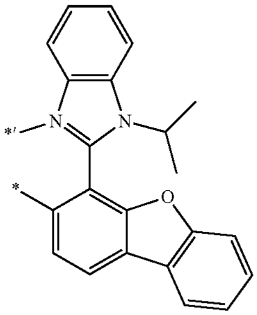
B22
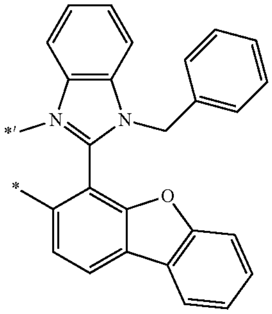
-continued
B23
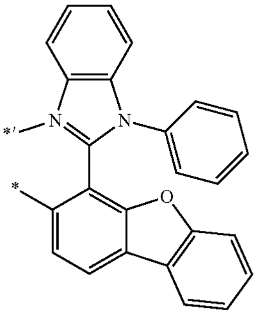
B24
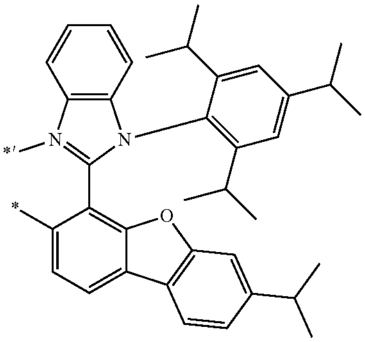
B25
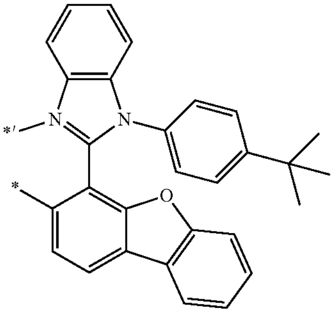
B26
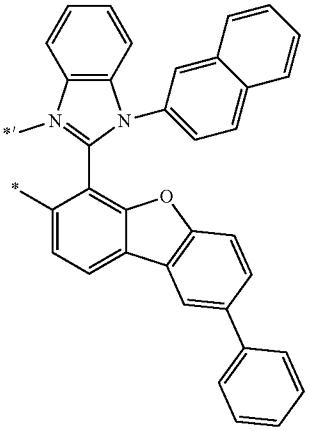

-continued
B27
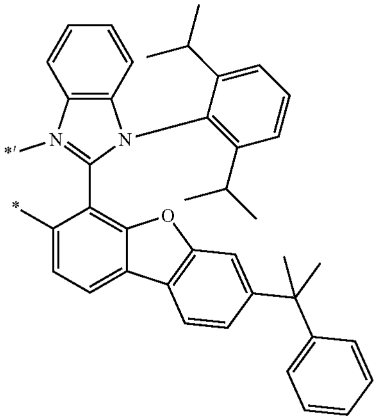
B28
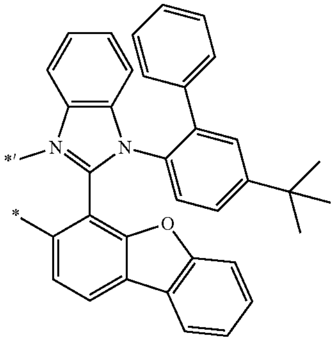
B29
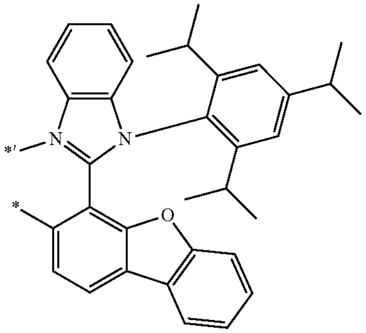
B30
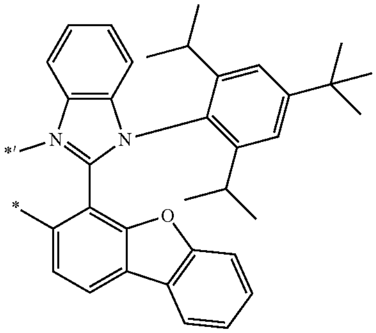
-continued
B31
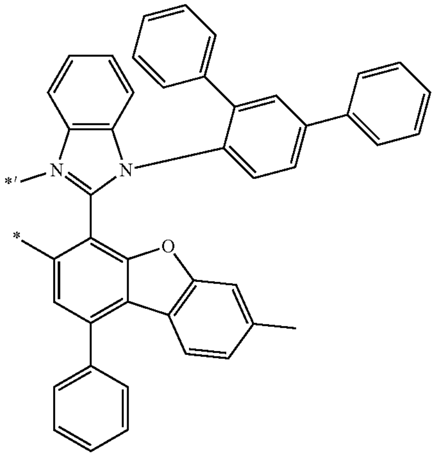
B32
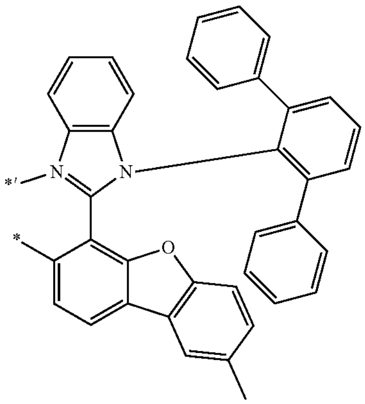
B33
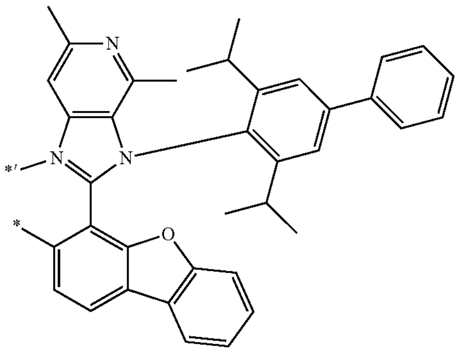

-continued
B34
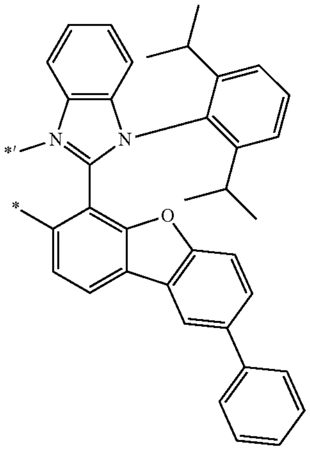
B35
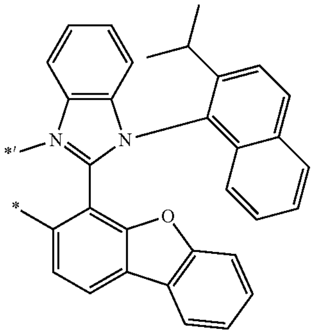
B36
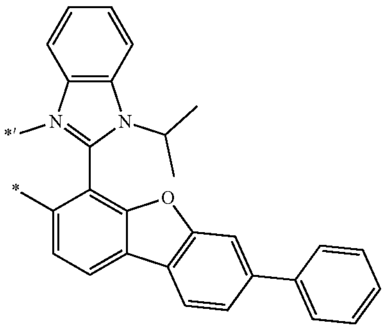
B37
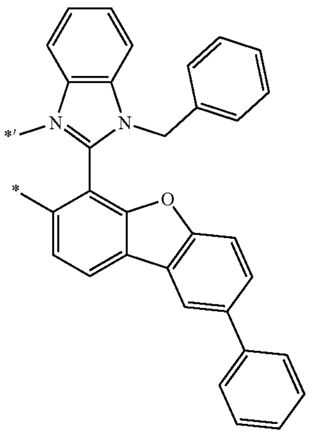
-continued
B38
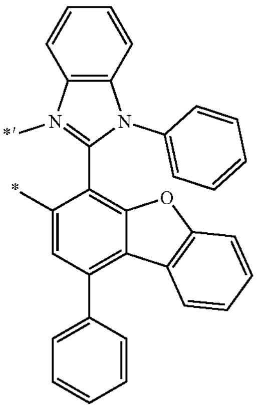
B39
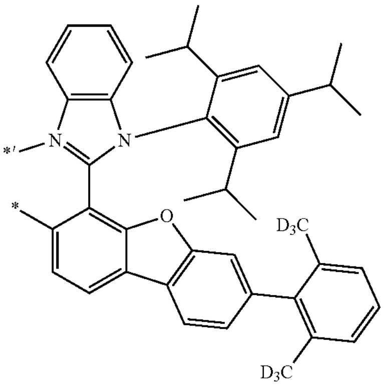
B40
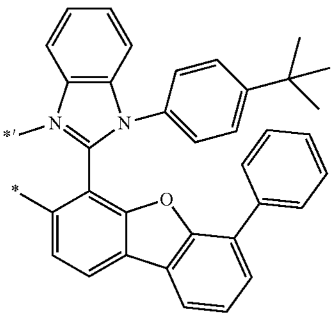
B41
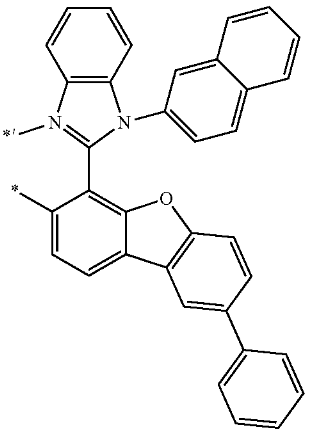

-continued
B42
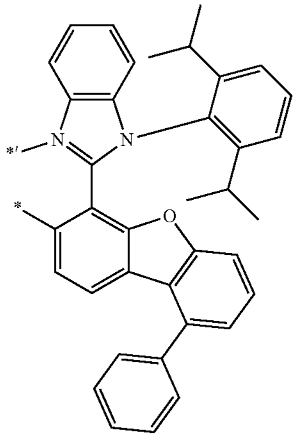
B43
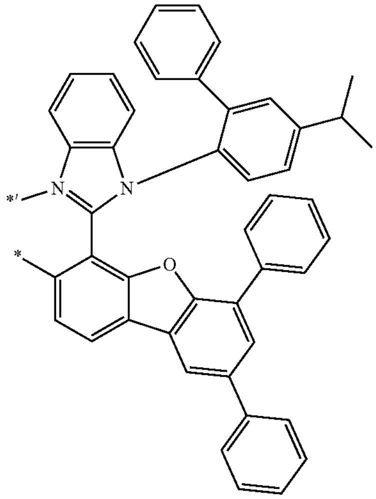
B44
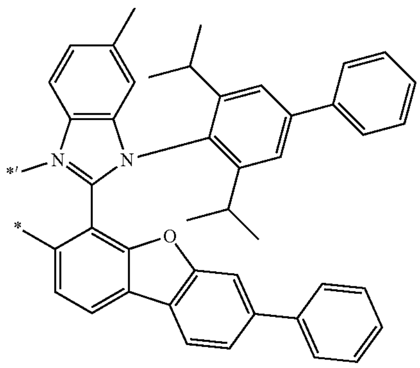
-continued
B45
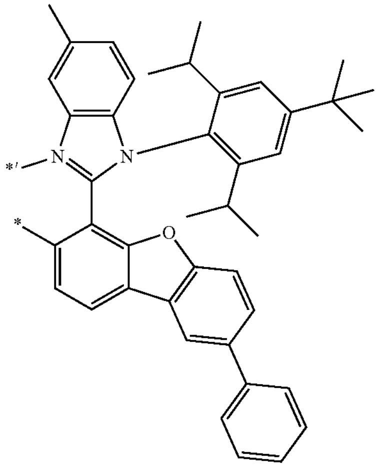
B46
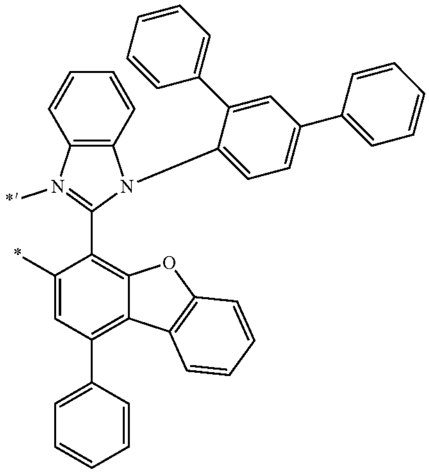
B47
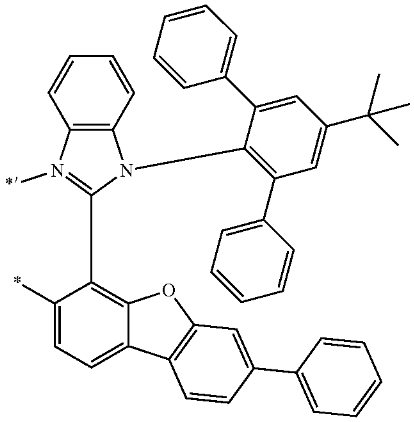

-continued
B48
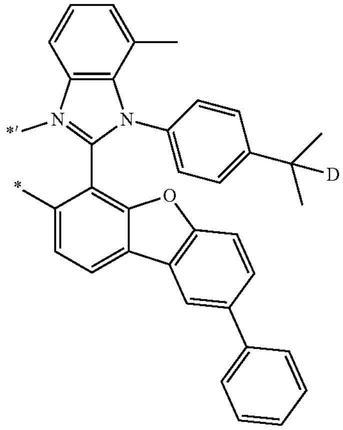
B49
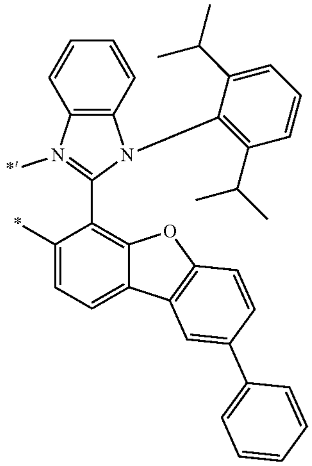
B50
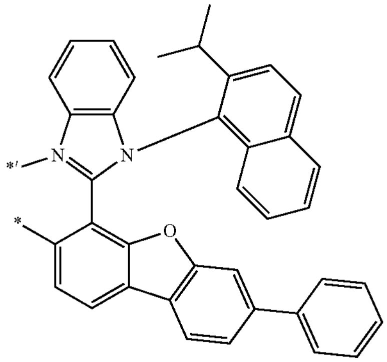
B51
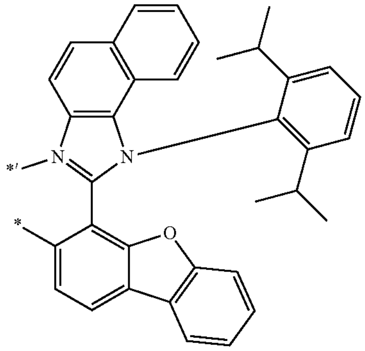
-continued
B52
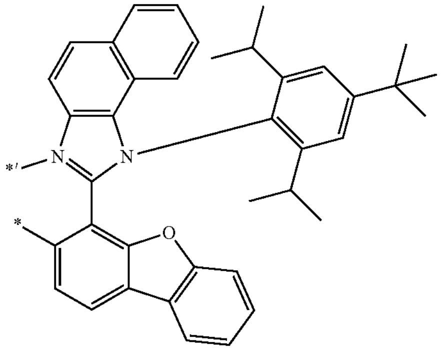
B53
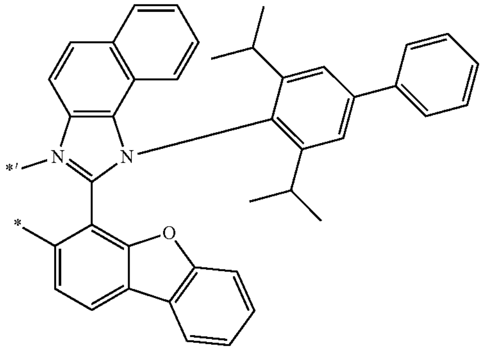
B54
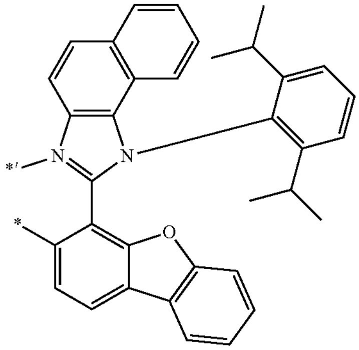
B55
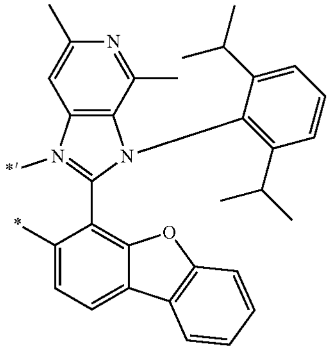

-continued
B56
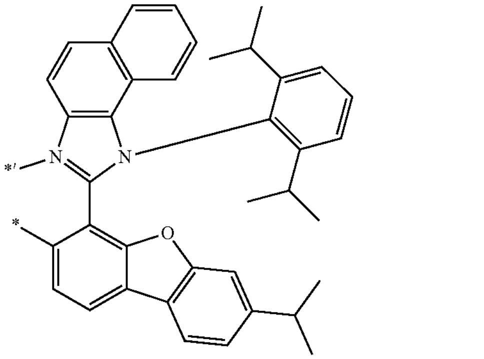
B57
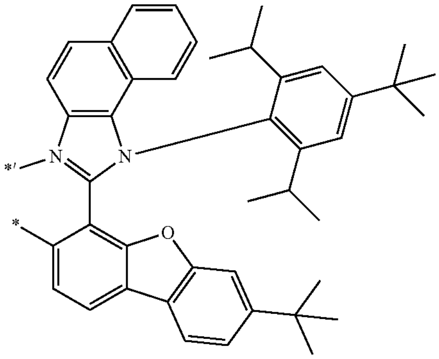
B58
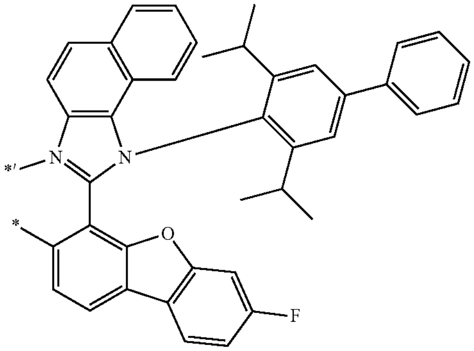
B59
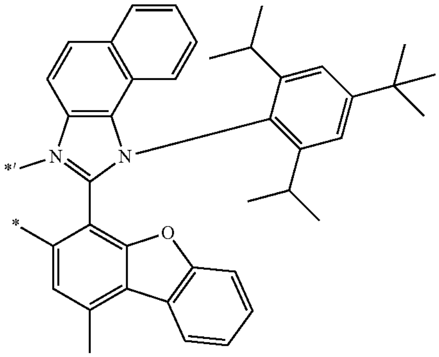
-continued
B60
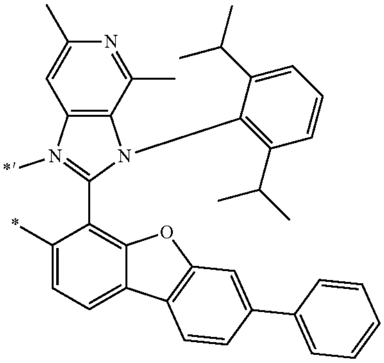
B61
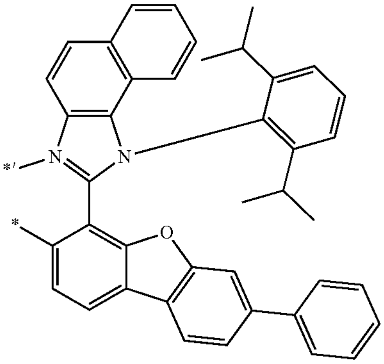
B62
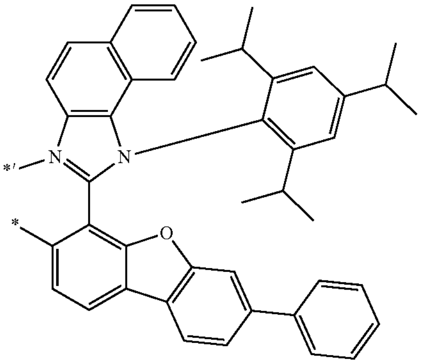
B63
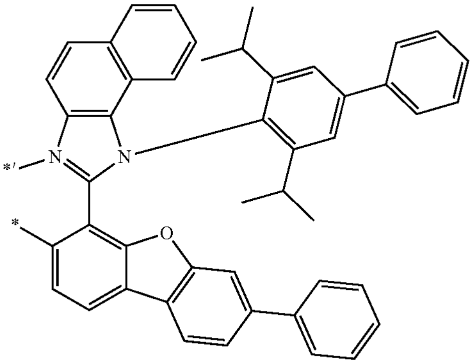

-continued
B64
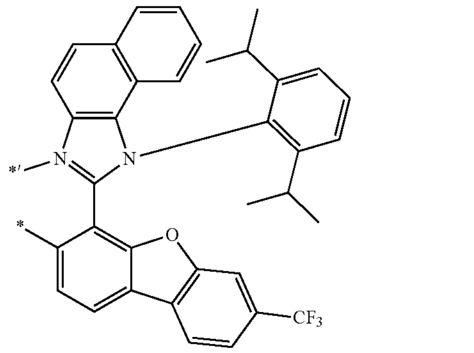
B65
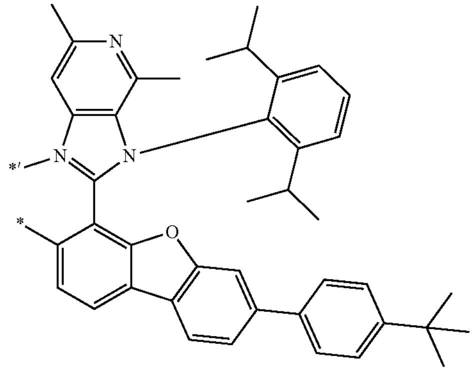
B66
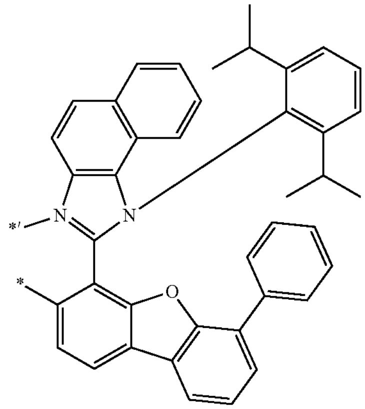
B67
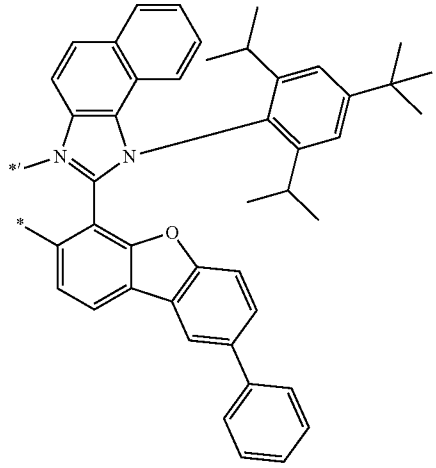
-continued
B68
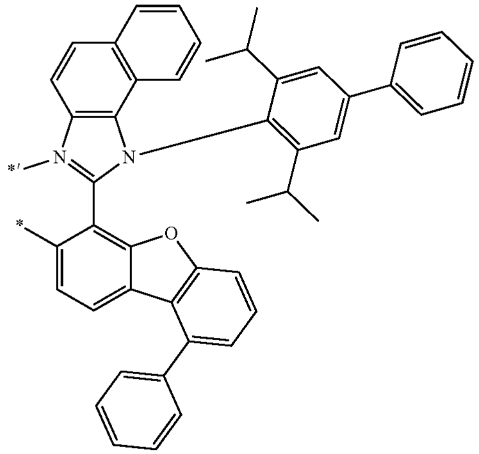
B69
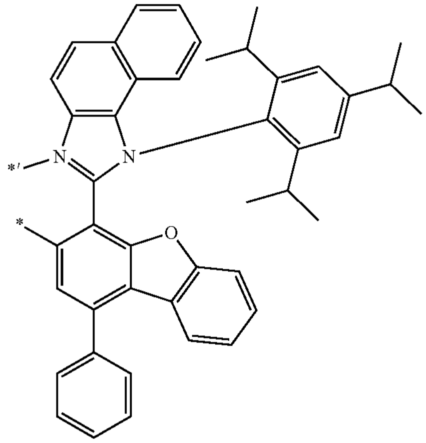
B70
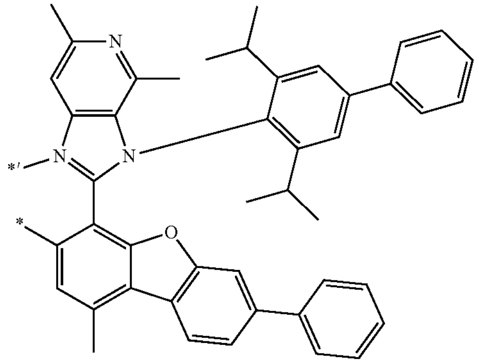
B71
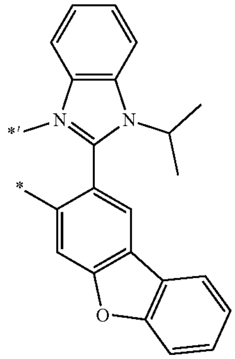

B72
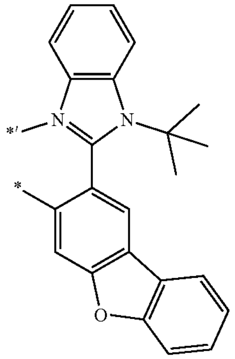
B73
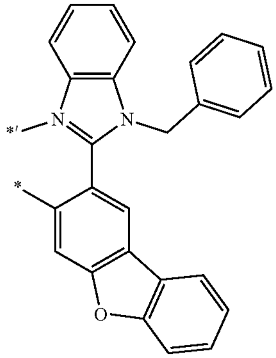
B74
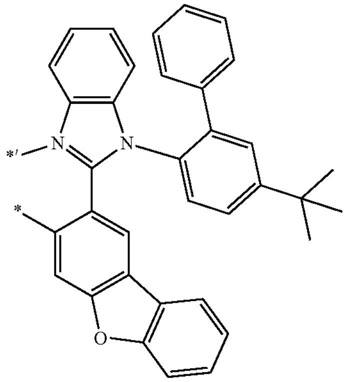
B75
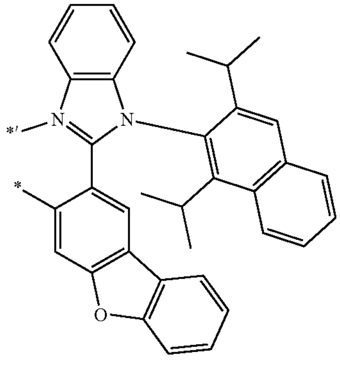
B76
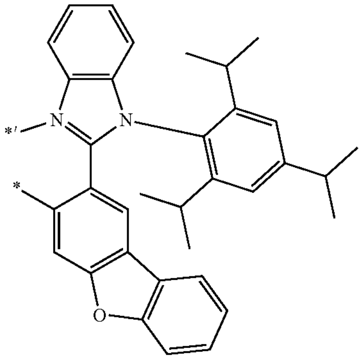
B77
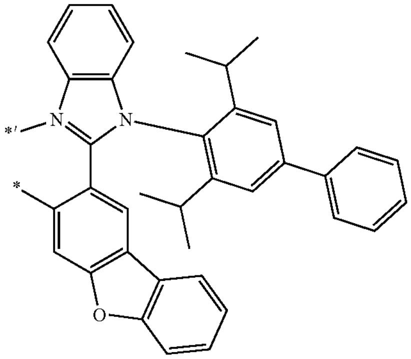
B78
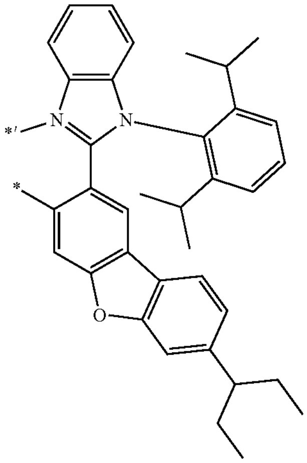

B79
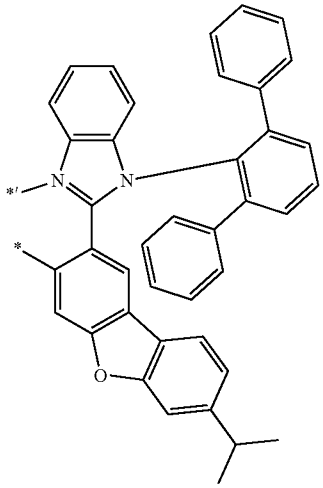
B80
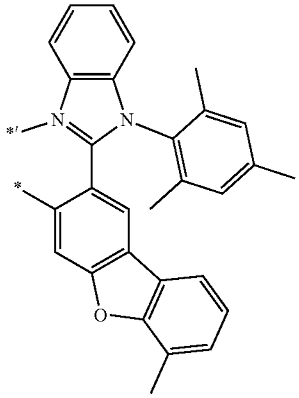
B81
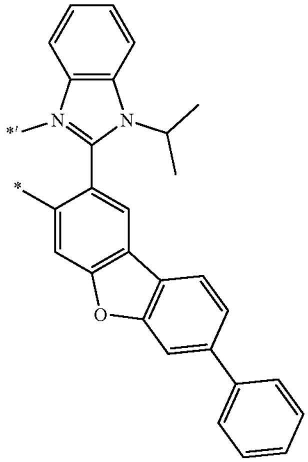
B82
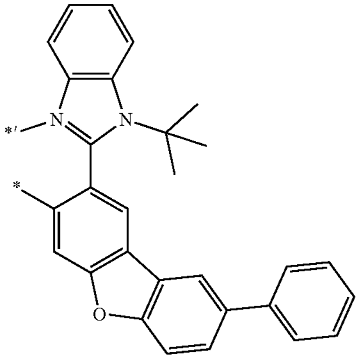
B83
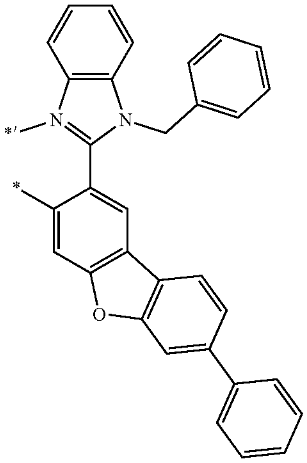
B84
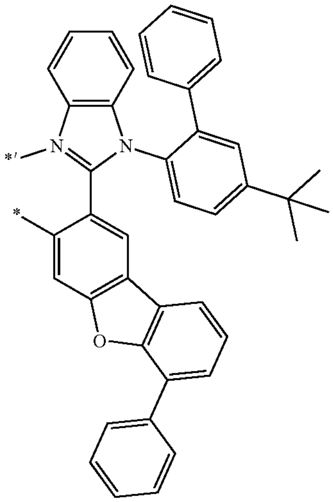

-continued
B85
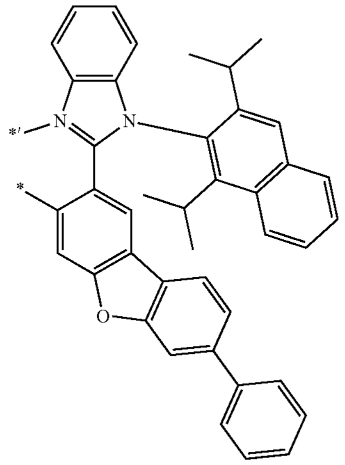
B86
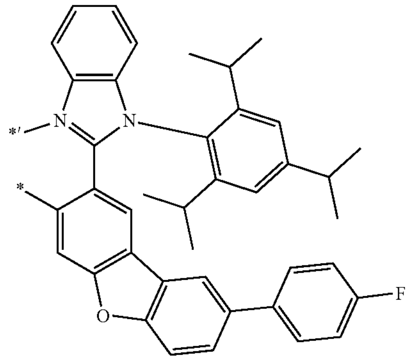
B87
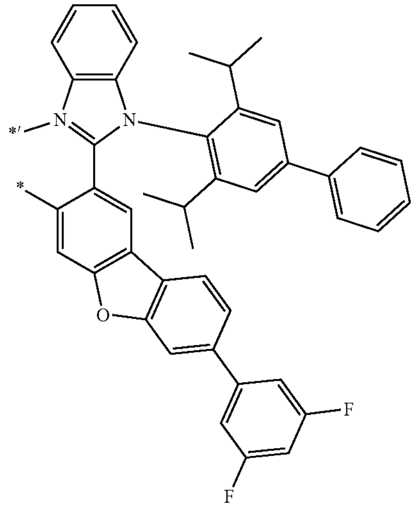
-continued
B88
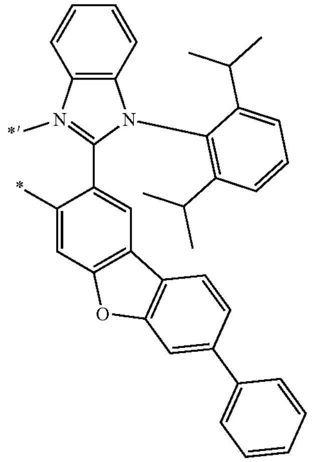
B89
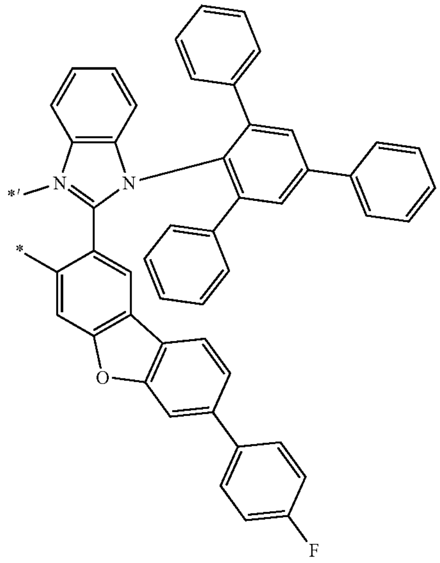
B90
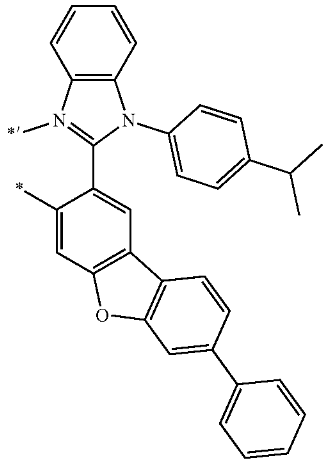

-continued
B91
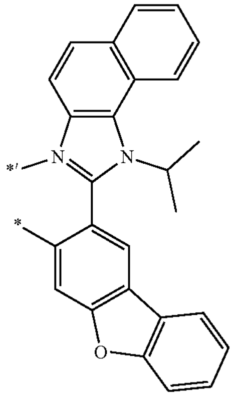
B92
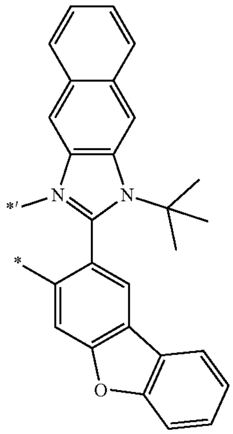
B93
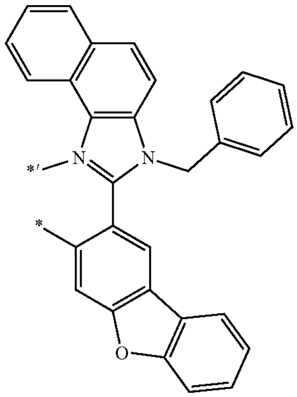
B94
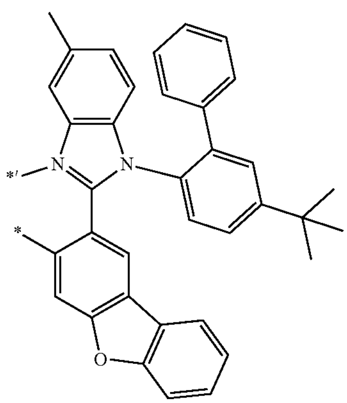
-continued
B95
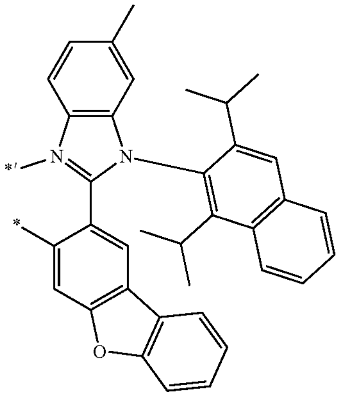
B96
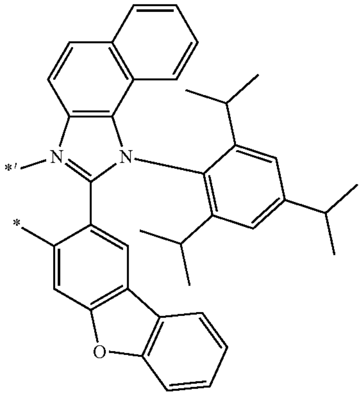
B97
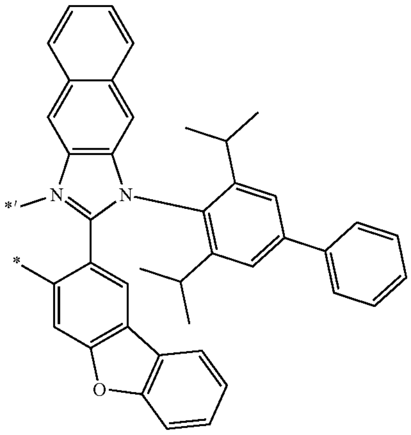

B98
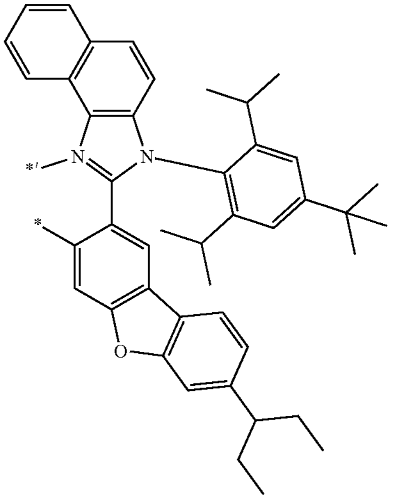
B99
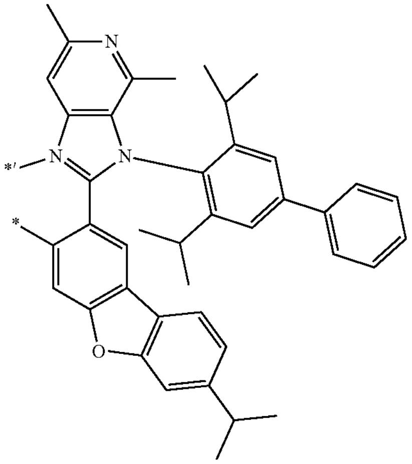
B100
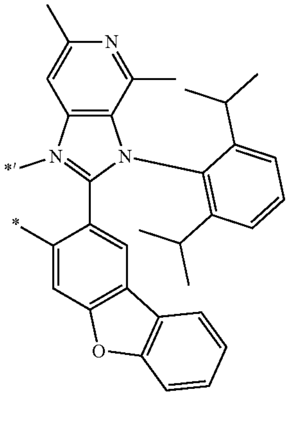
B101
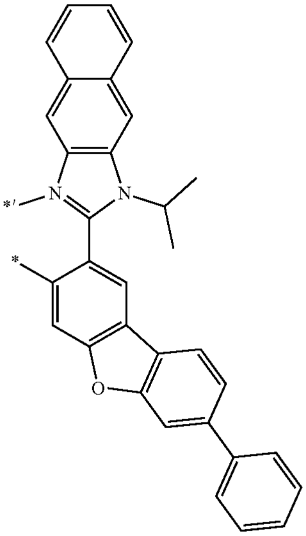
B102
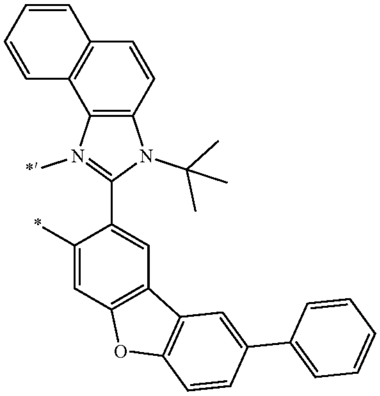
B103
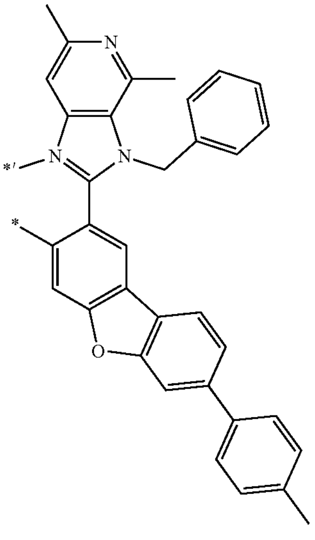

-continued
B104
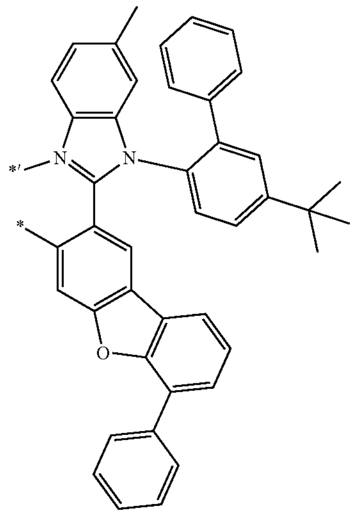
B105
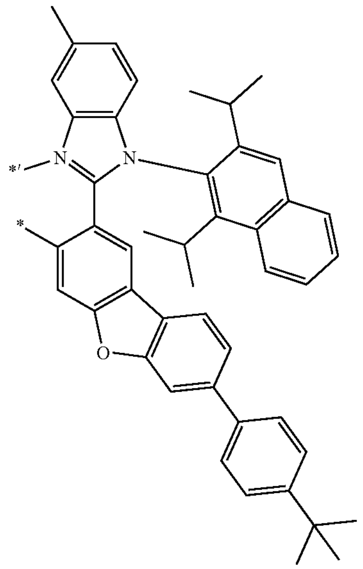
B106
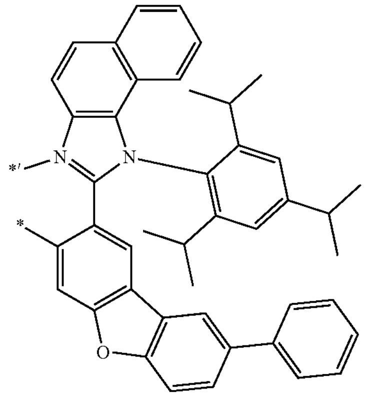
-continued
B107
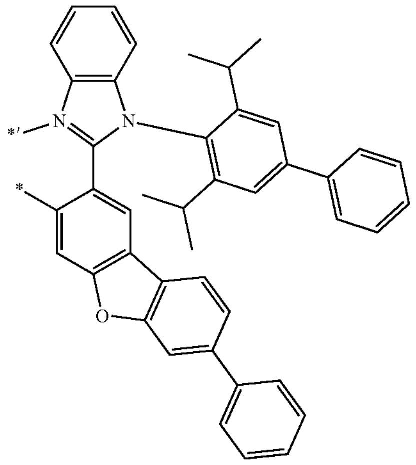
B108
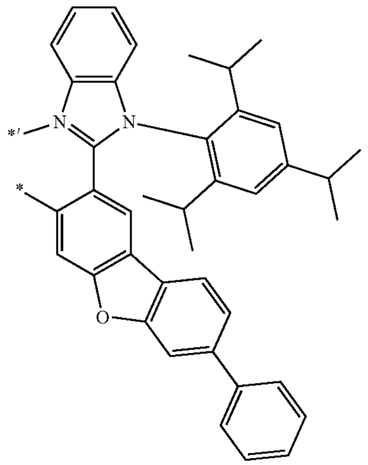
B109
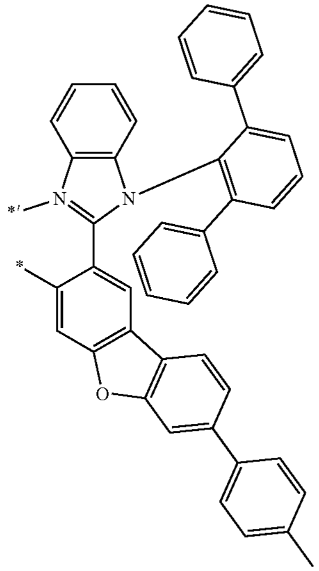

-continued
B110
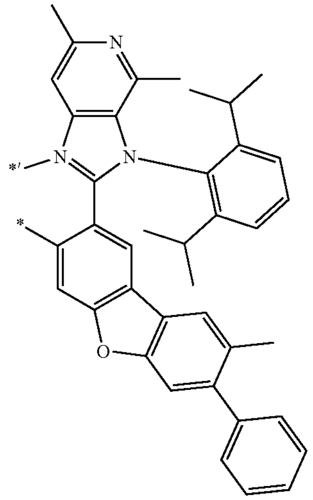
B111
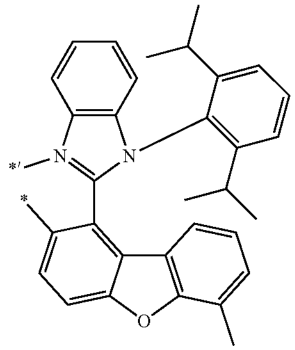
B112
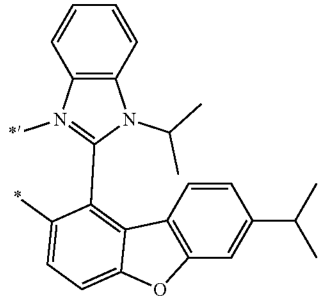
B113
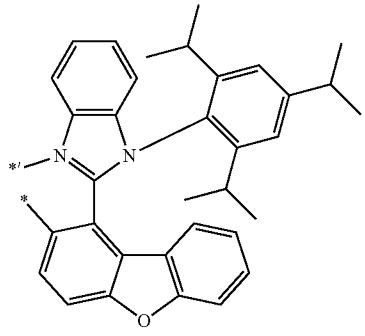
-continued
B114
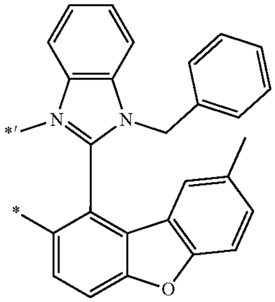
B115
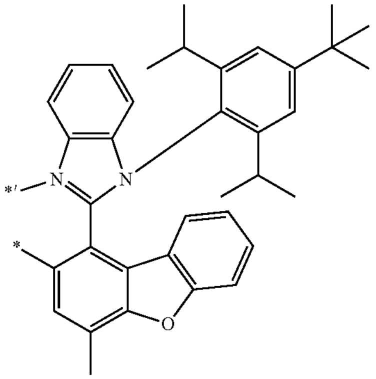
B116
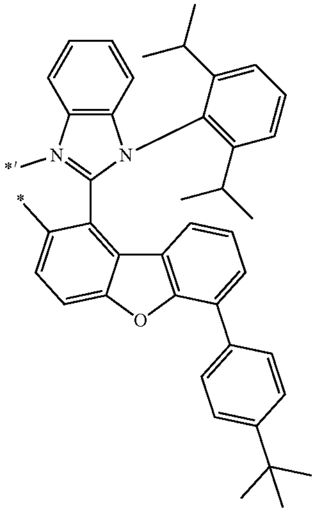
B117
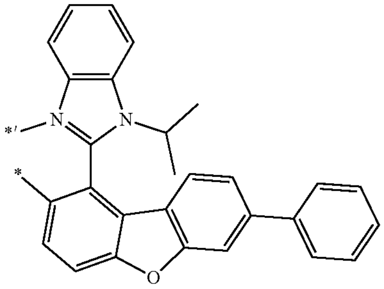

-continued
B118
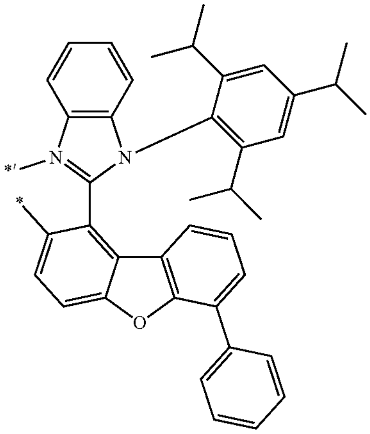
B119
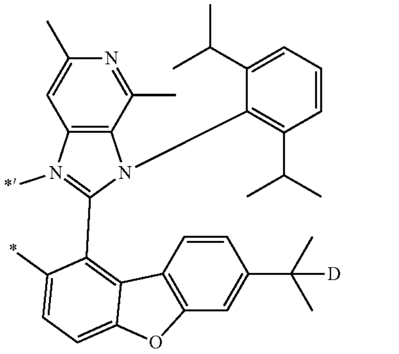
B120
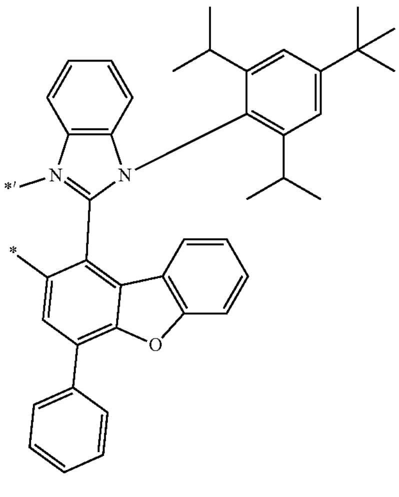
B121
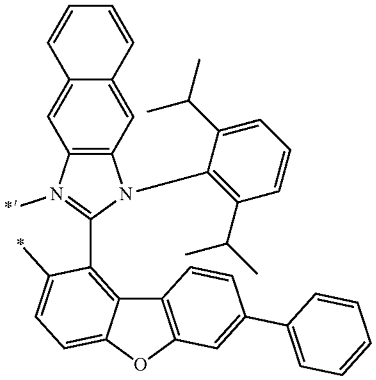
B122
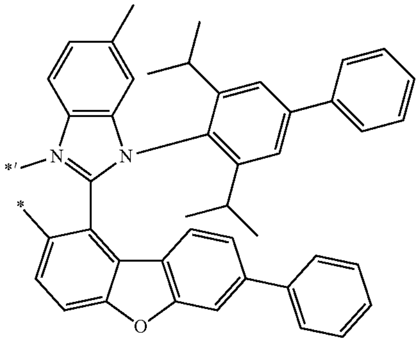
B123
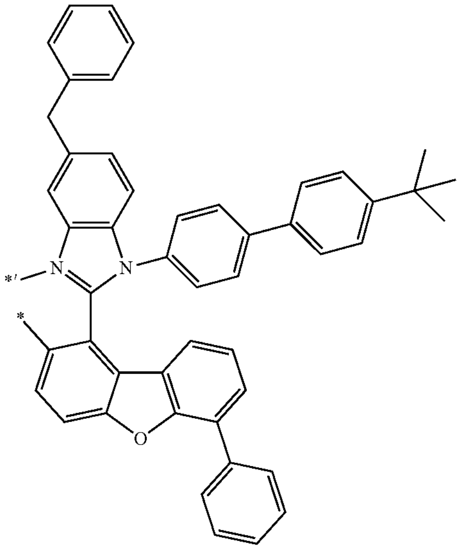
B124
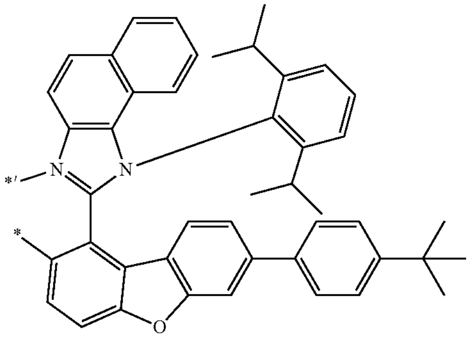

-continued
B125
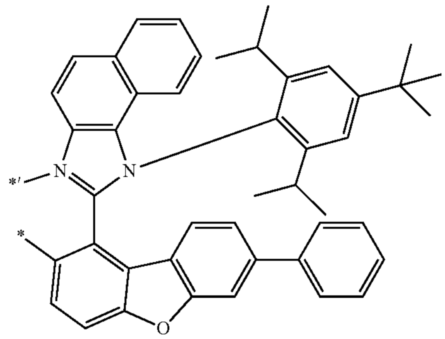
B126
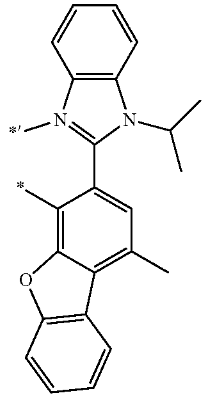
B127
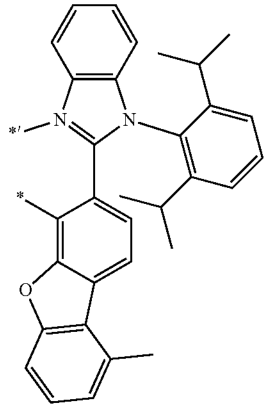
B128
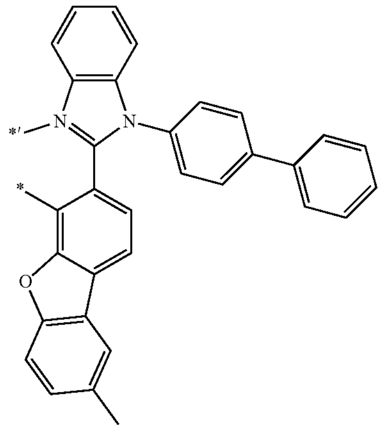
-continued
B129
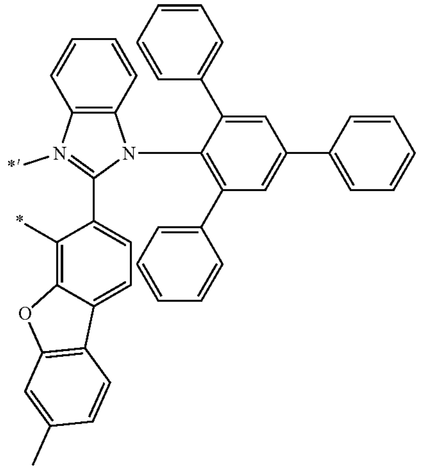
B130
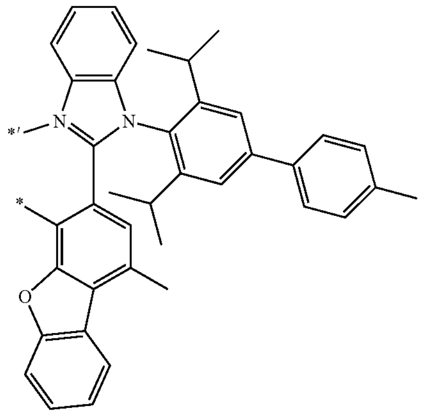
B131
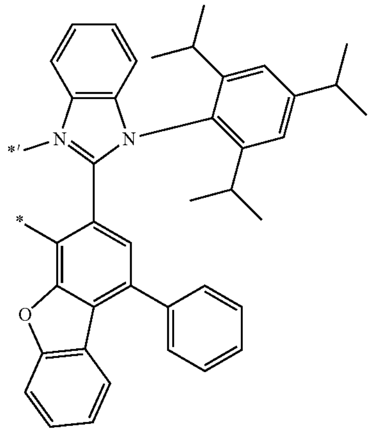

B132
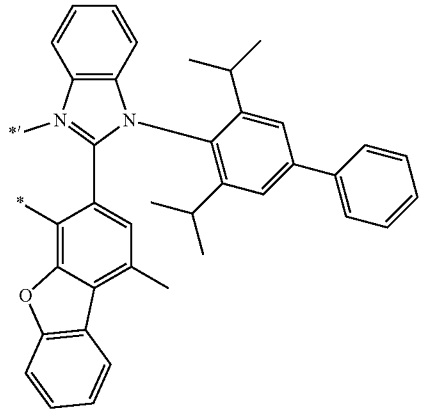
B133
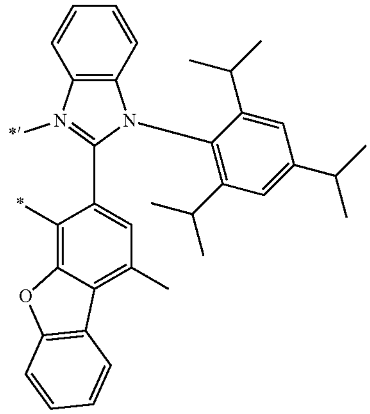
B134
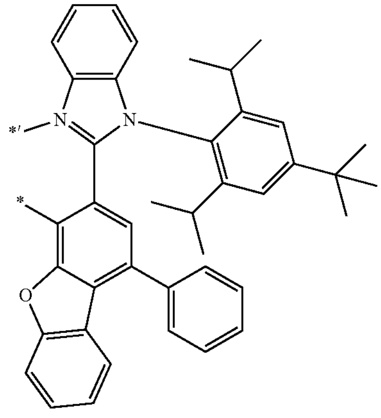
B135
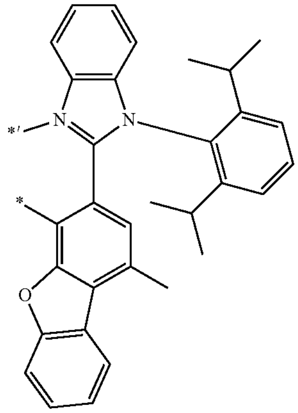
B136
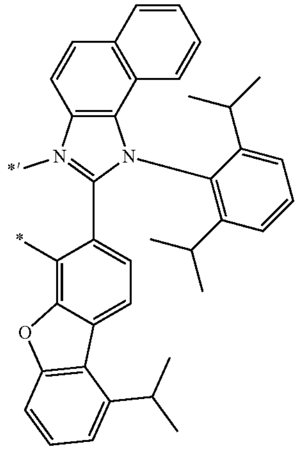
B137
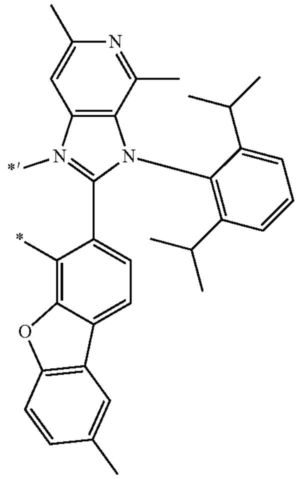

-continued
B138
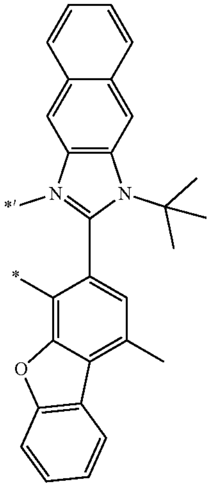
B139
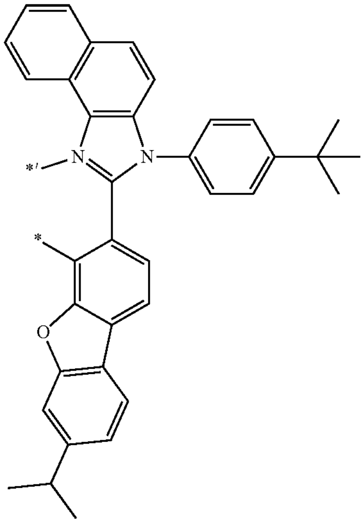
B140
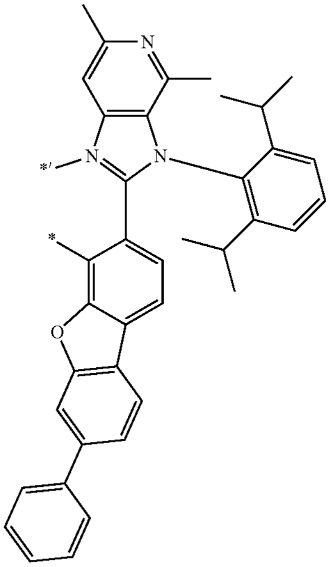
-continued
B141
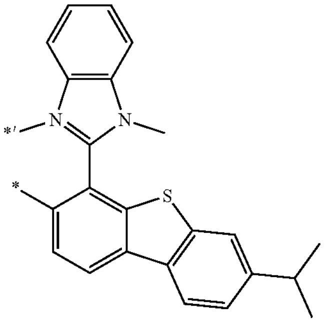
B142
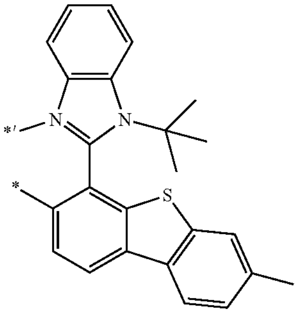
B143
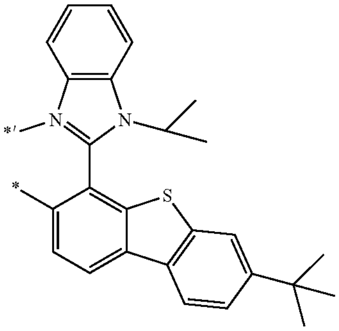
B144
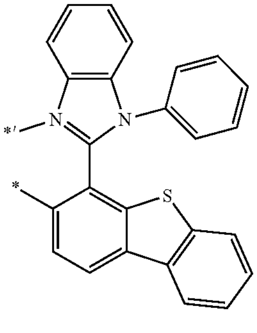
B145
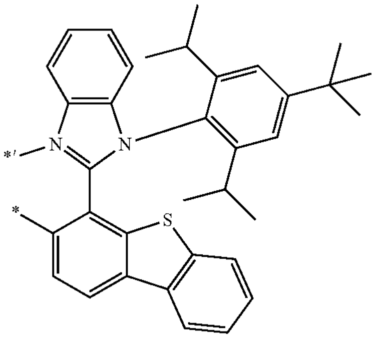

B146
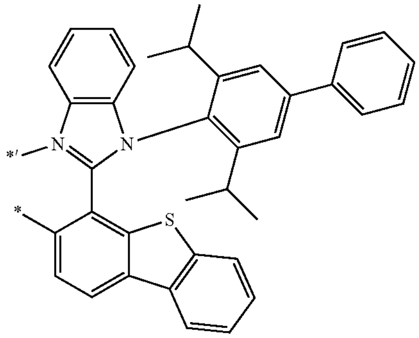
B147
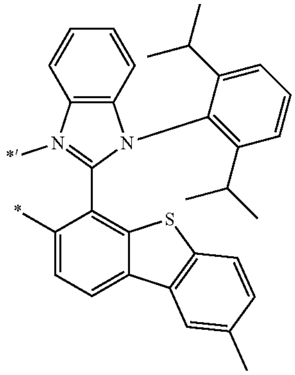
B148
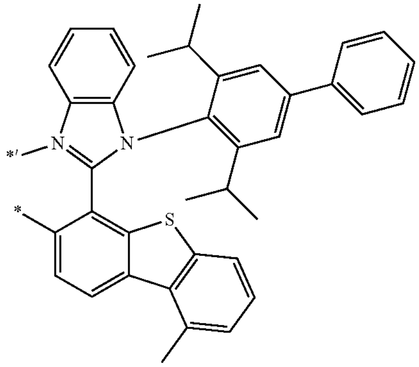
B149
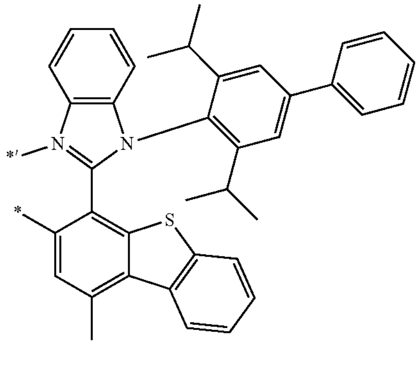
B150
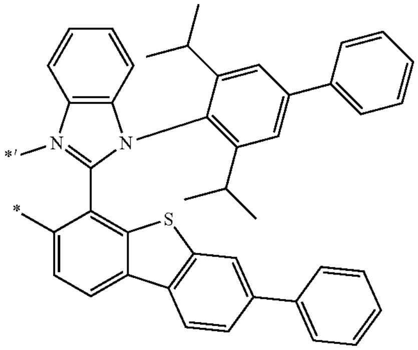
B151
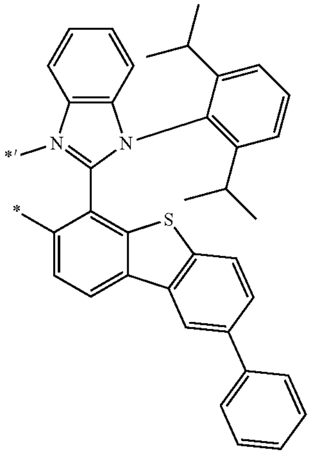
B152
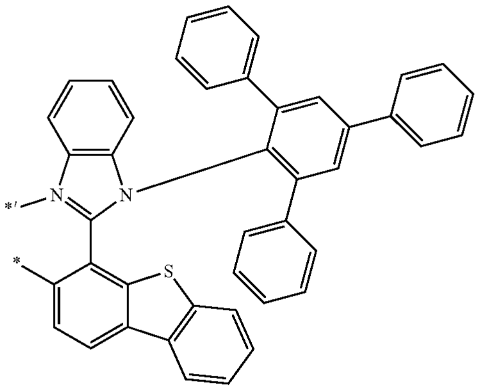
B153
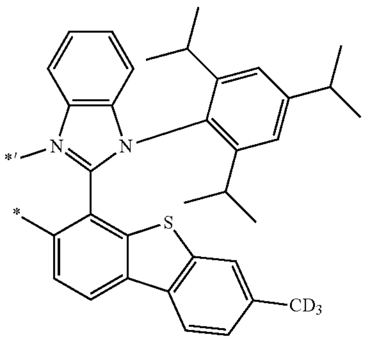

B154
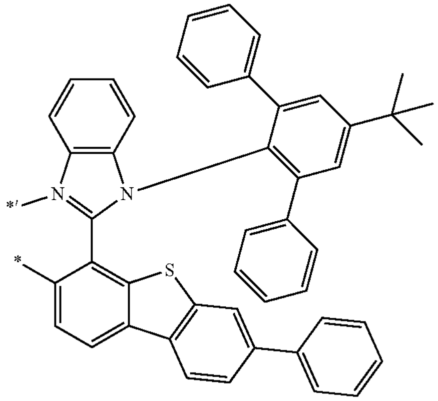
B155
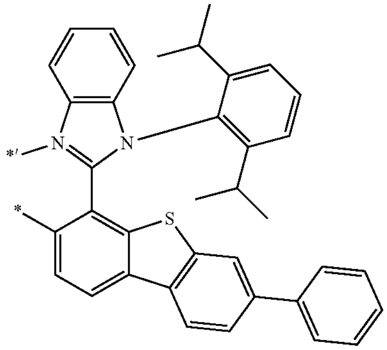
B156
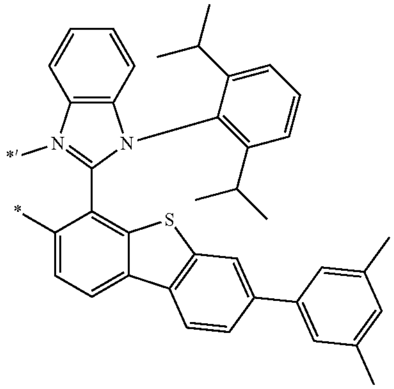
B157
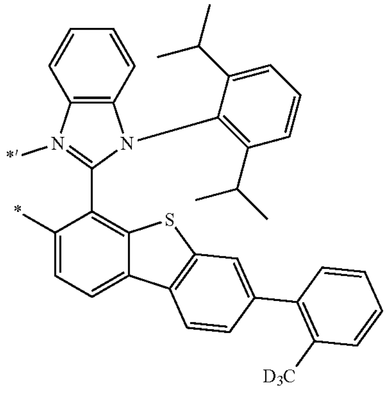
B158
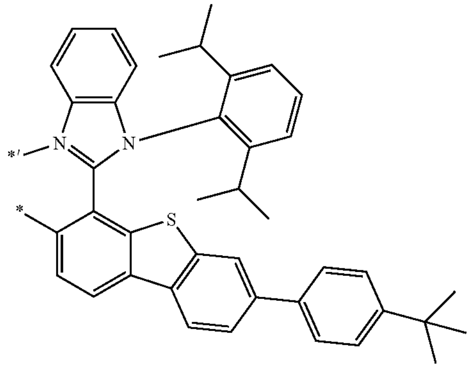
B159
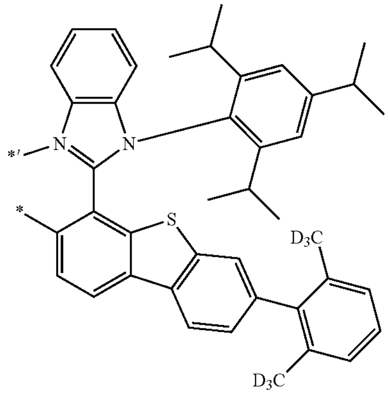
B160
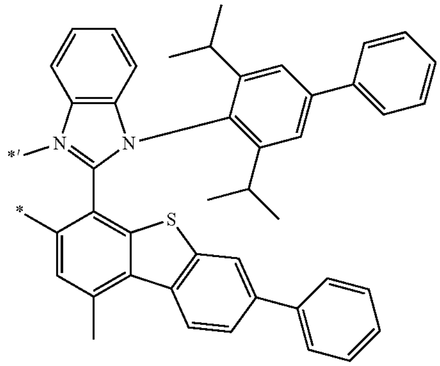
B161
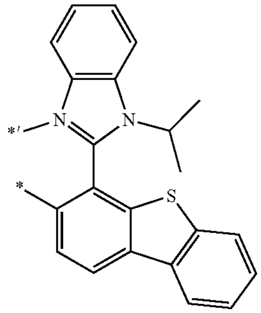

B162
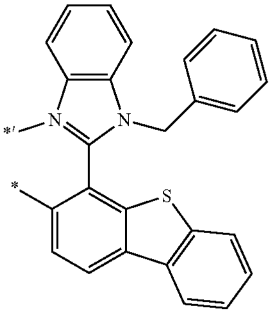
B163
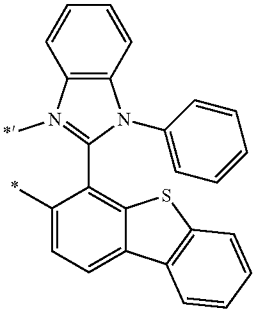
B164
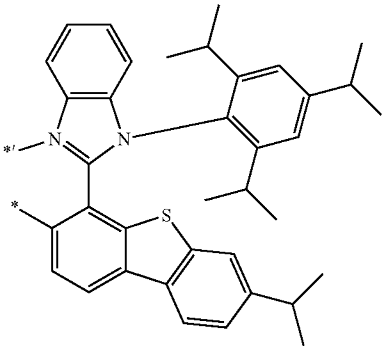
B165
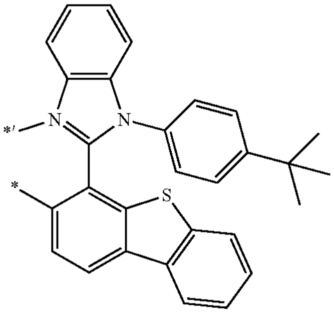
B166
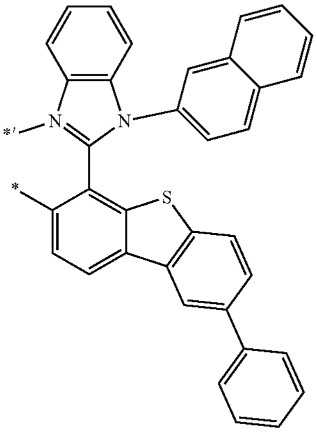
B167
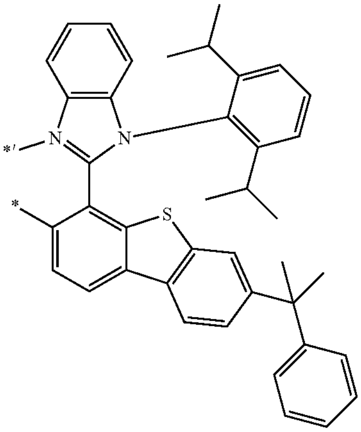
B168
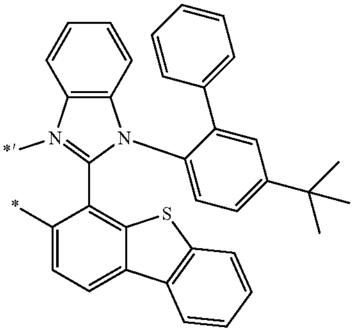
B169
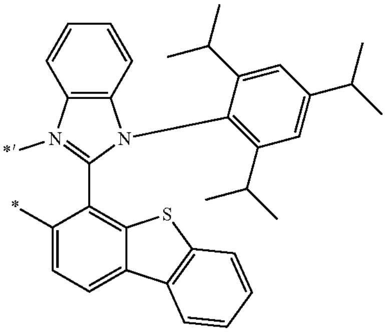

-continued
B170
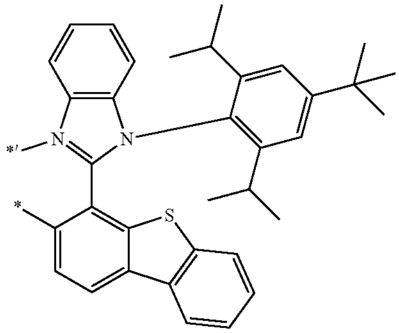
B171
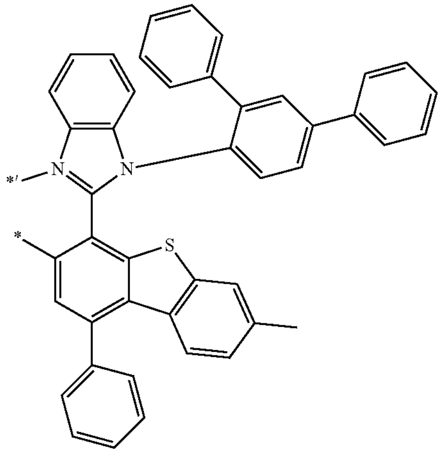
B172
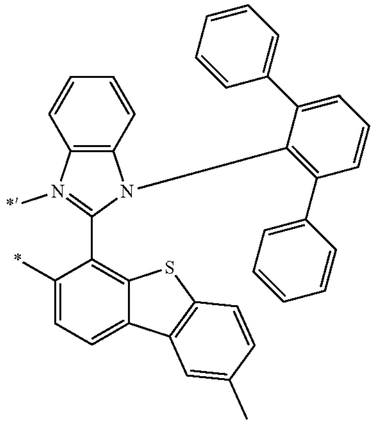
B173
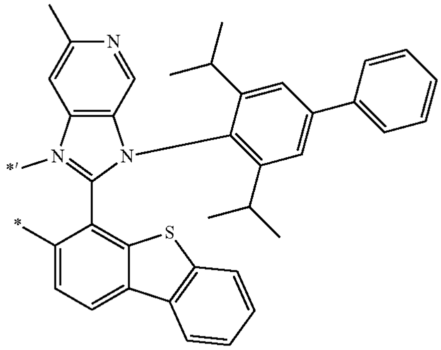
-continued
B174
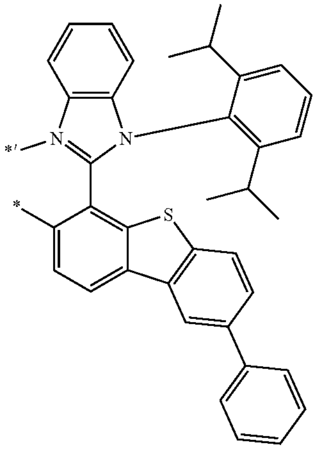
B175
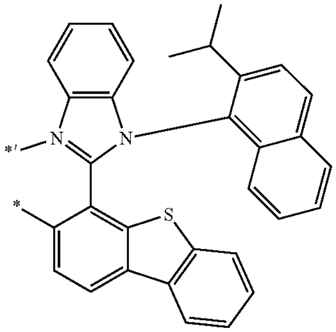
B176
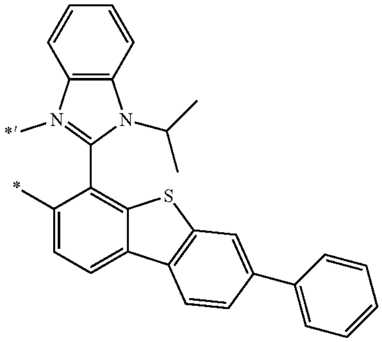
B177
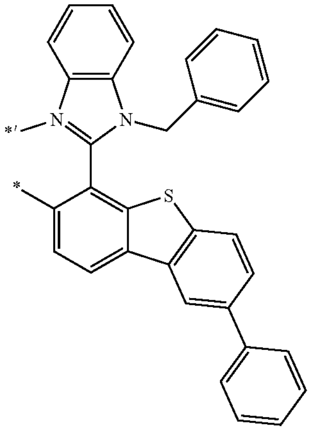

-continued
B178
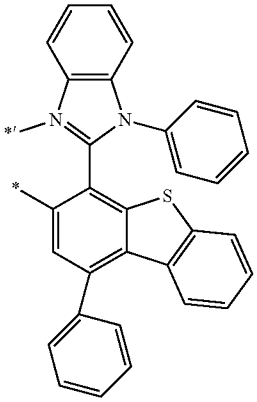
B179
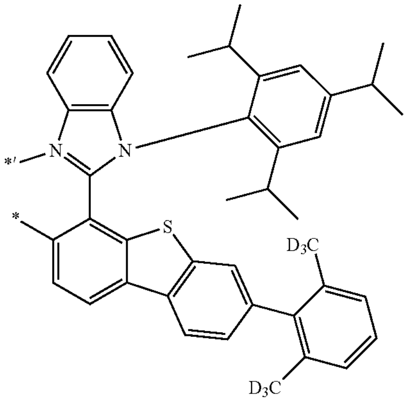
B180
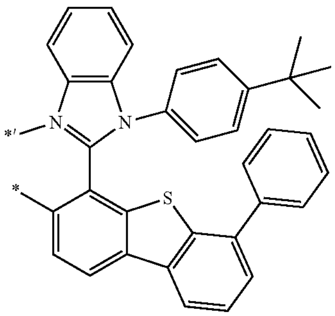
B181
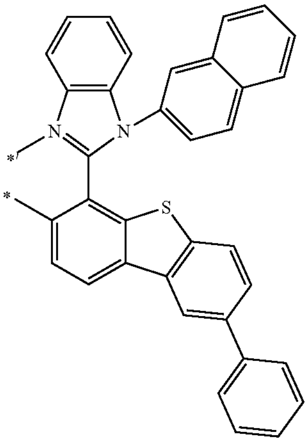
B182
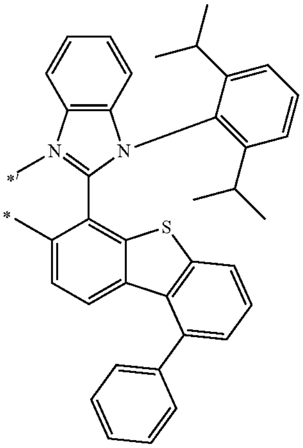
B183
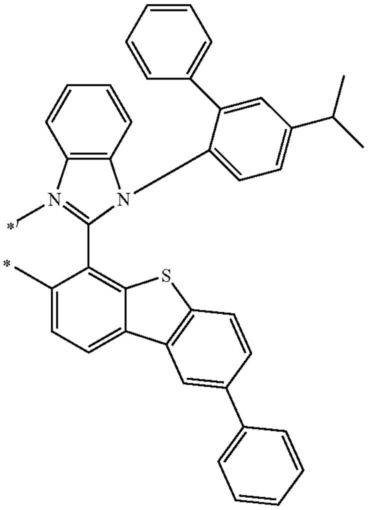

-continued
B184
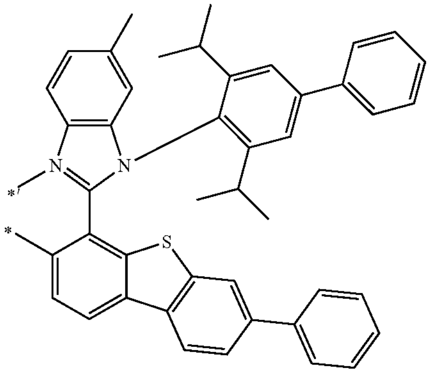
B185
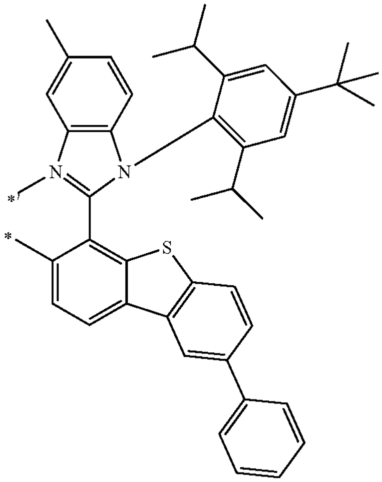
B186
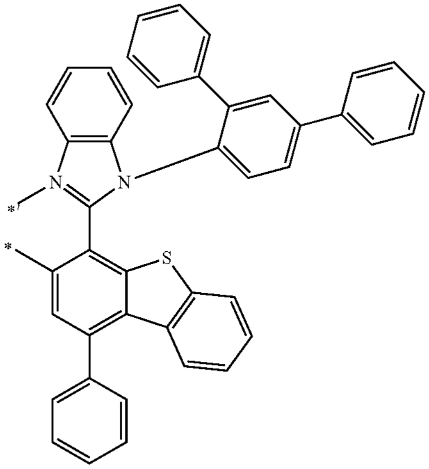
-continued
B187
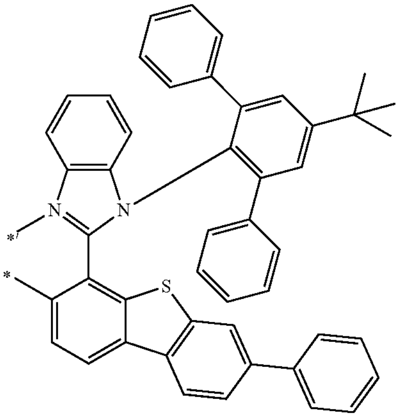
B188
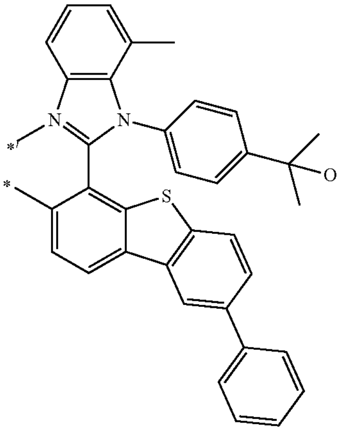
B189
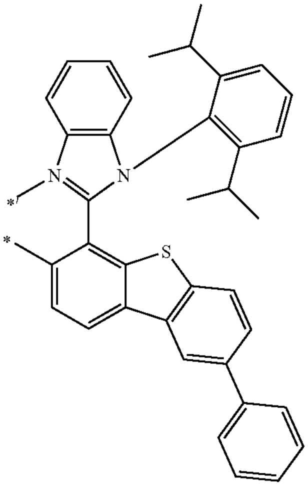

-continued
B190
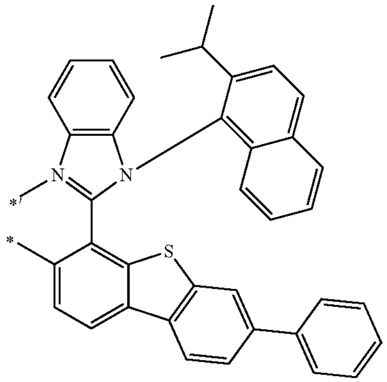
B191
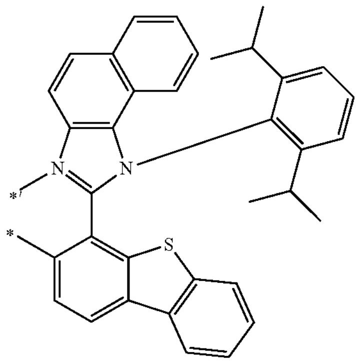
B192
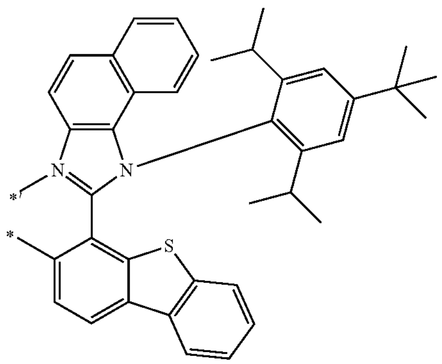
B193
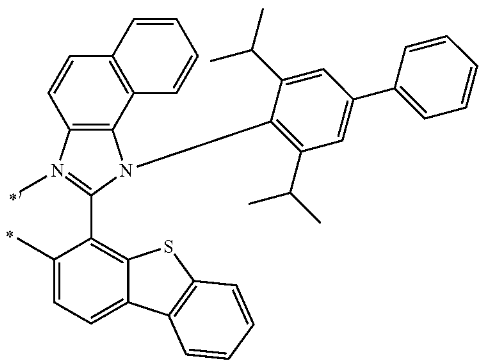
-continued
B194
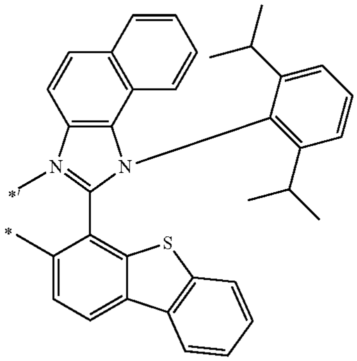
B195
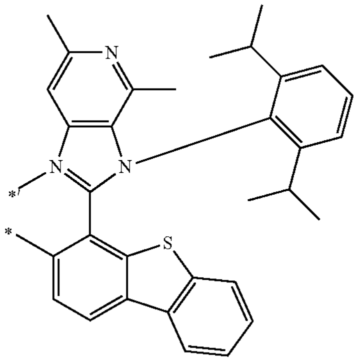
B196
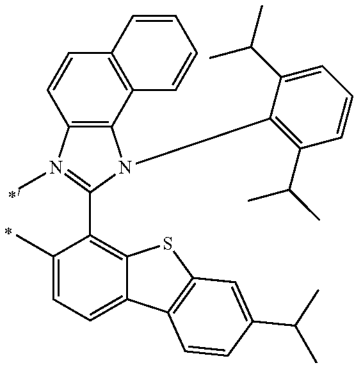
B197
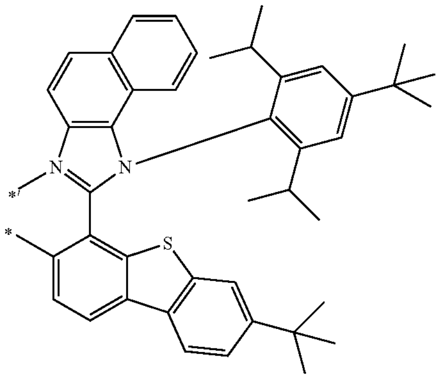

-continued
B198
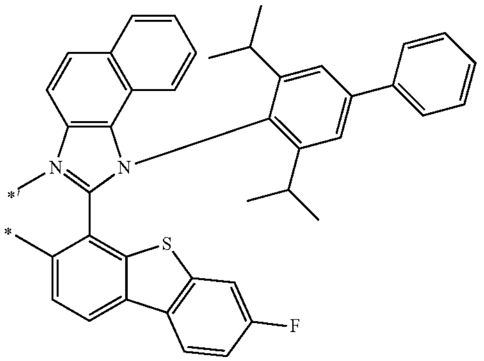
B199
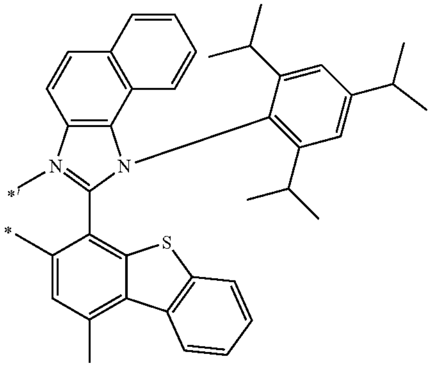
B200
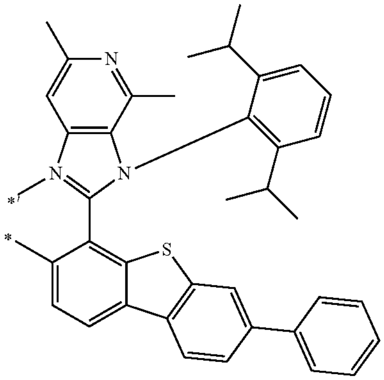
B201
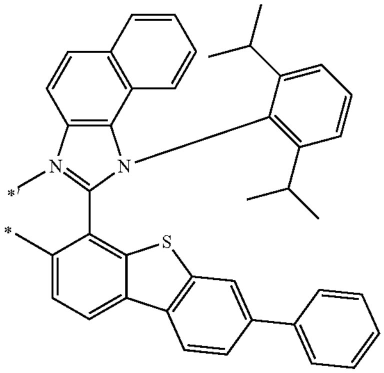
-continued
B202
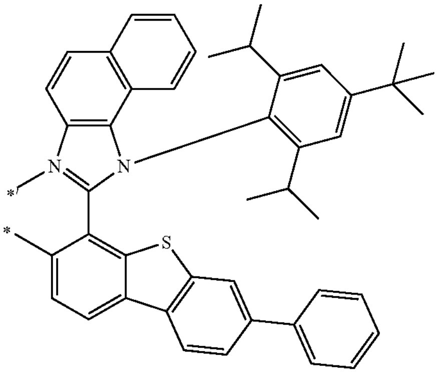
B203
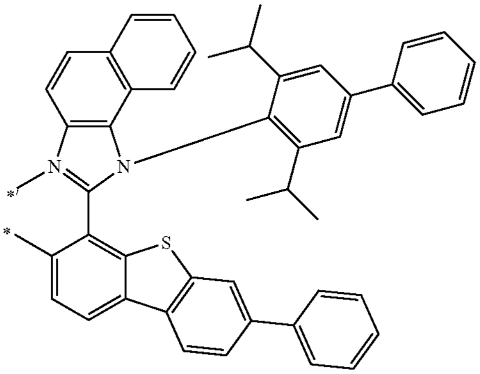
B204
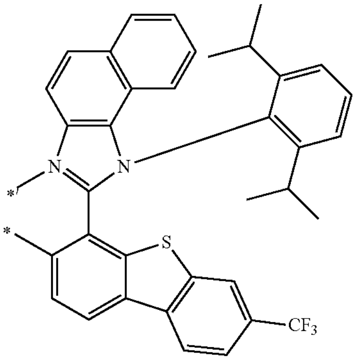
B205
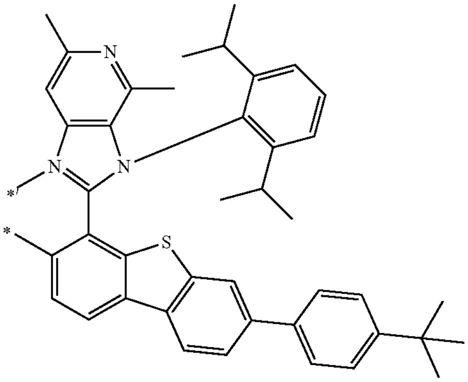

-continued
B206
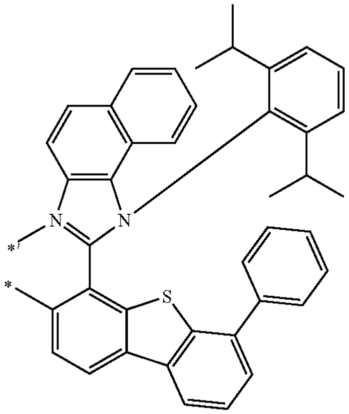
B207
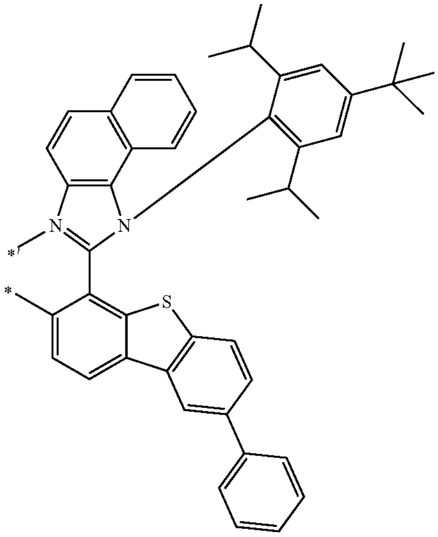
B208
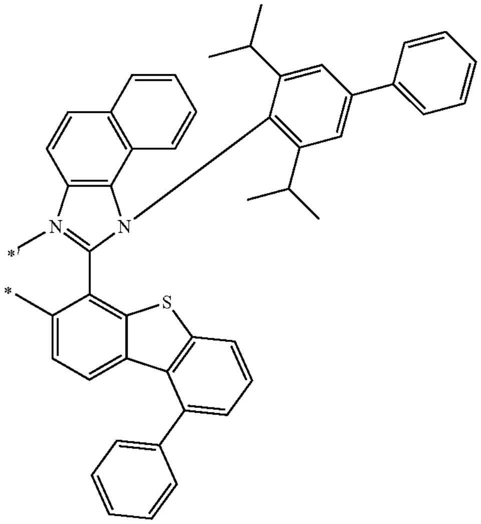
-continued
B209
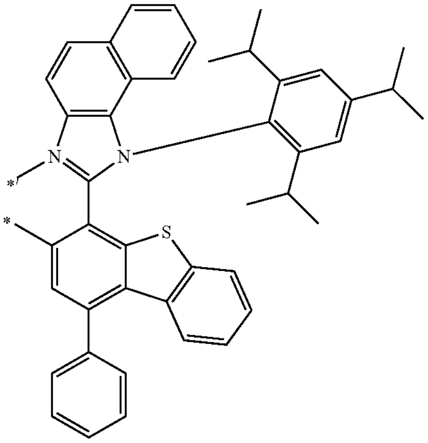
B210
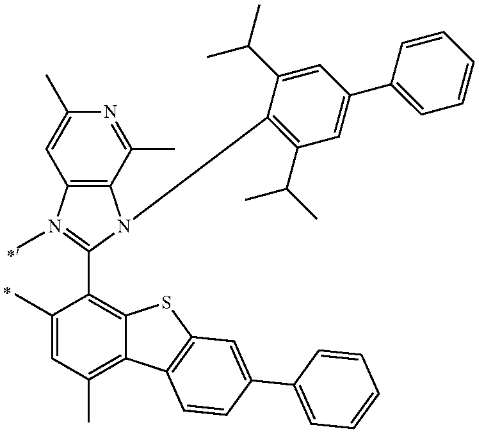
B211
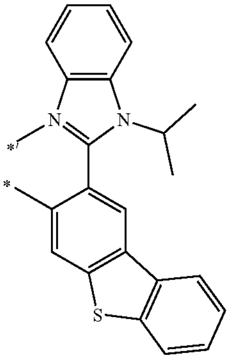
B212
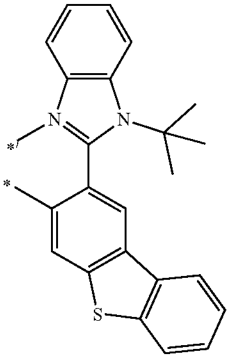

-continued
B213
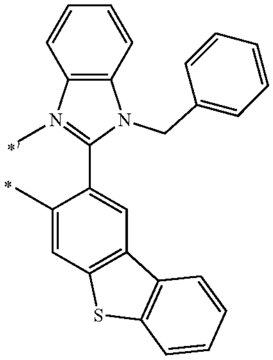
B214
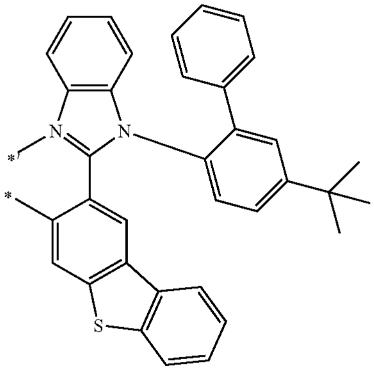
B215
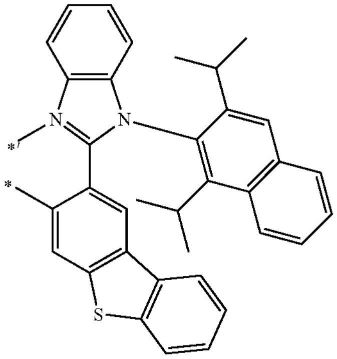
B216
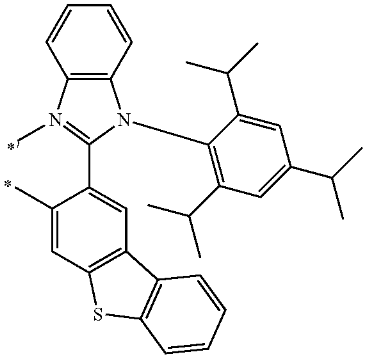
-continued
B217
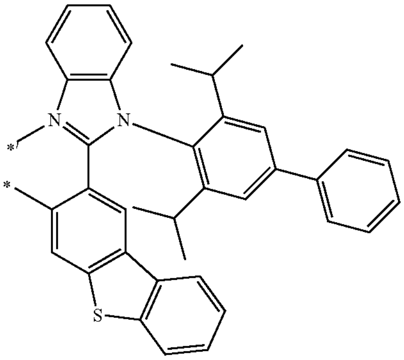
B218
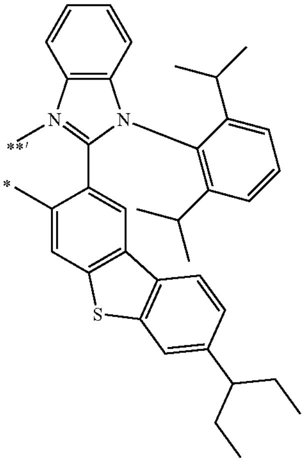
B219
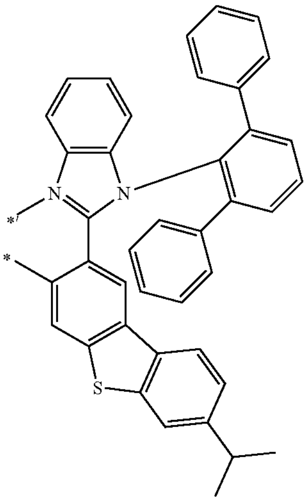

-continued
B220
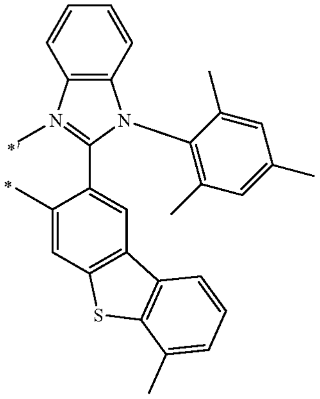
B221
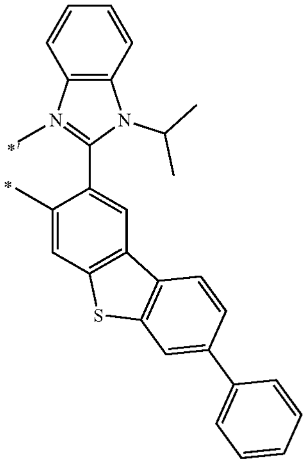
B222
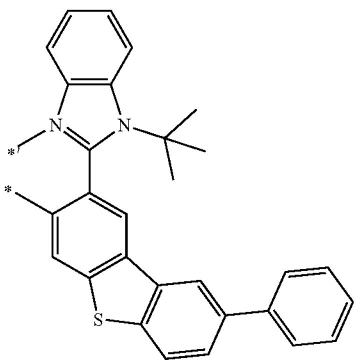
-continued
B223
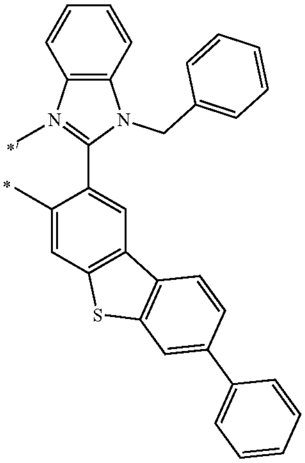
B224
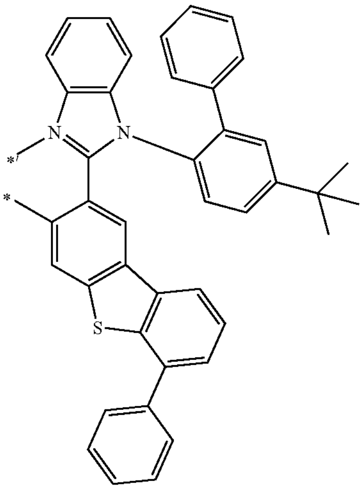
B225
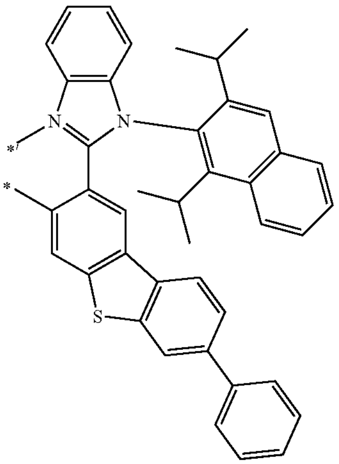

B226
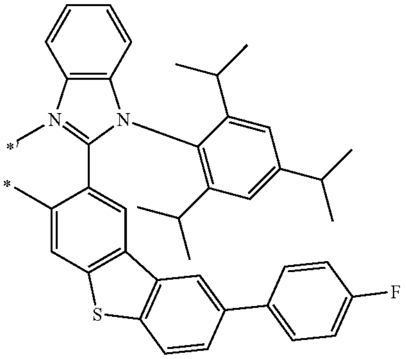
B227
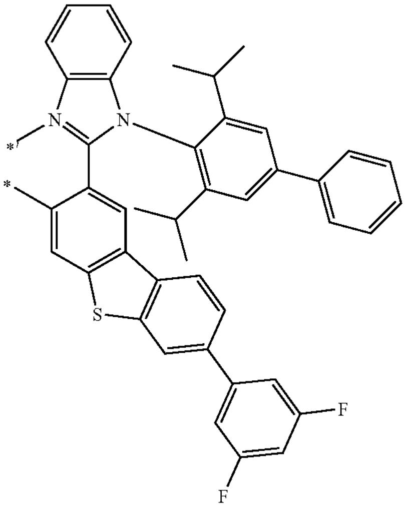
B228
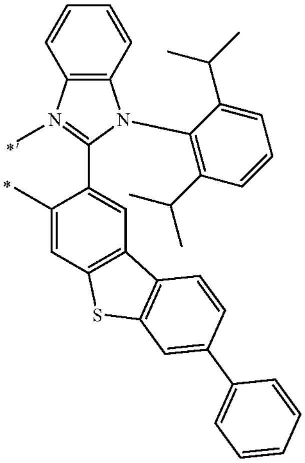
B229
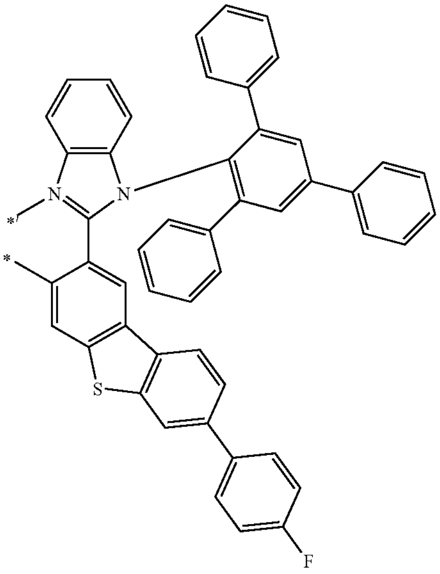
B230
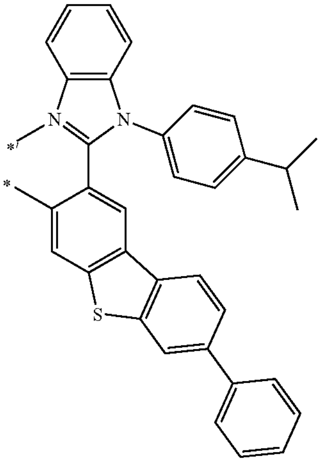
B231
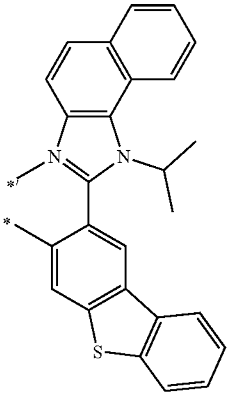

-continued
B232
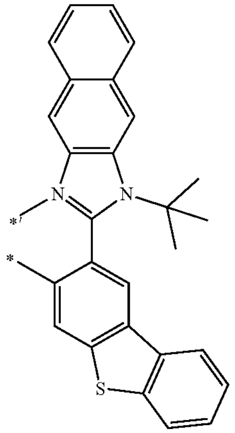
B233
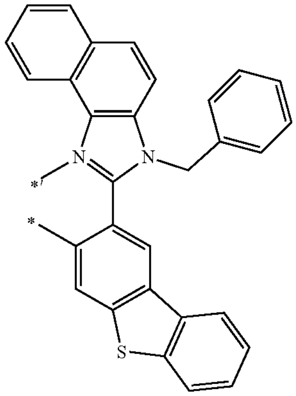
B234
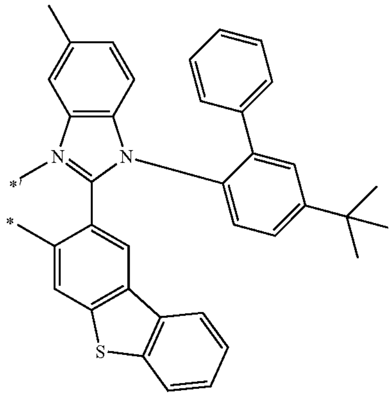
B235
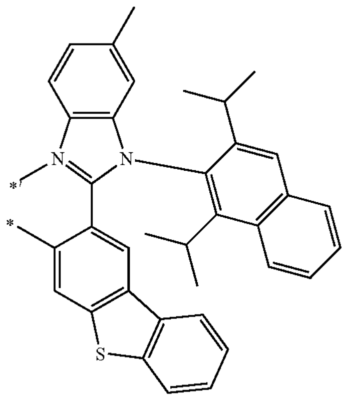
-continued
B236
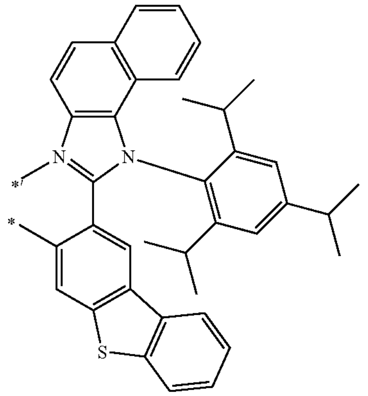
B237
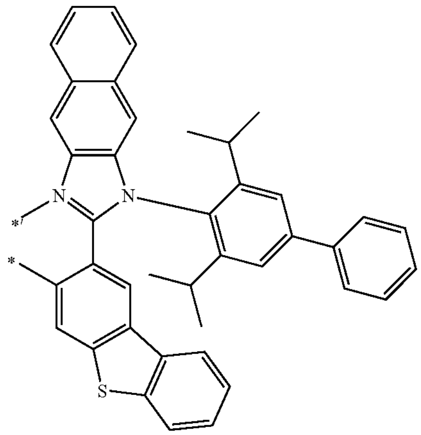
B238
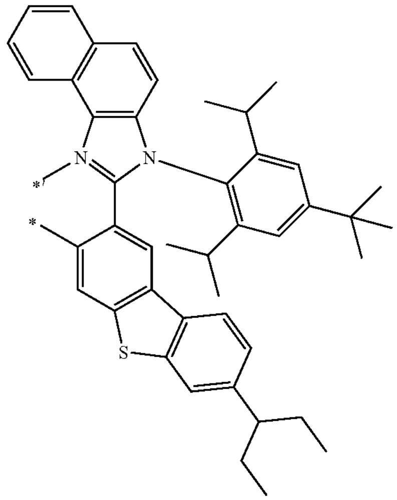

-continued
B239
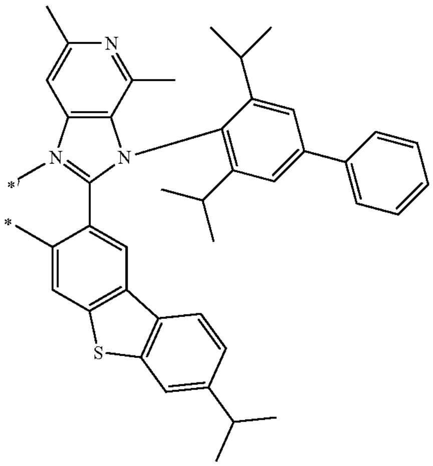
B240
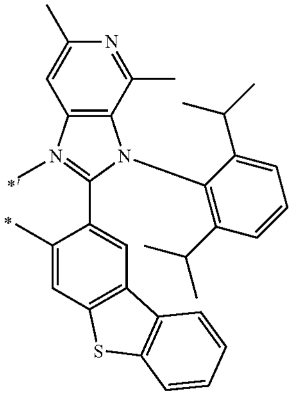
B241
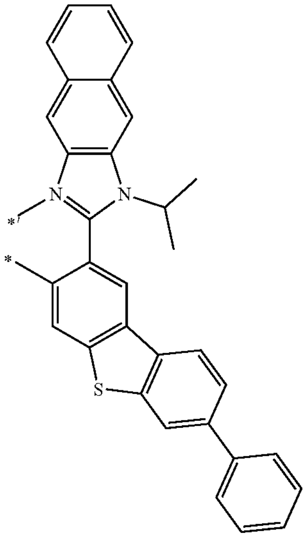
-continued
B242
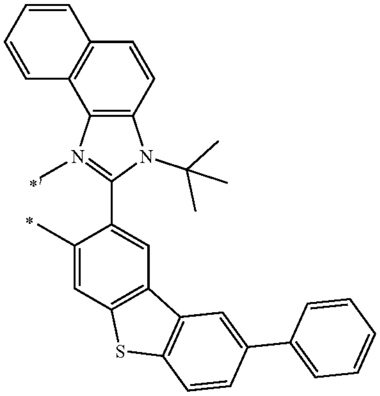
B243
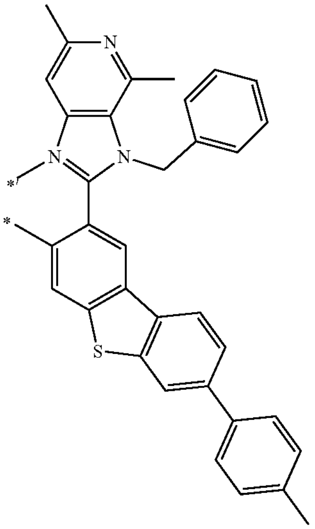
B244
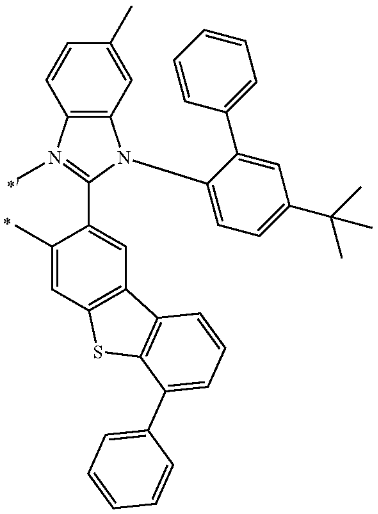

B245
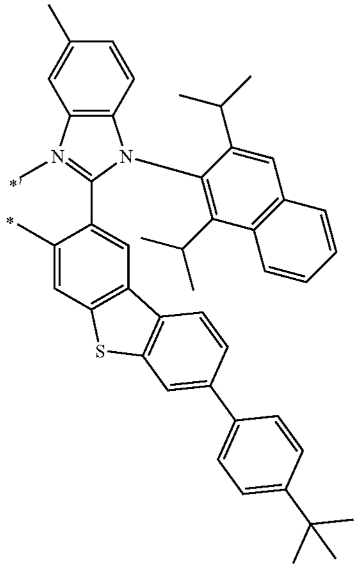
B246
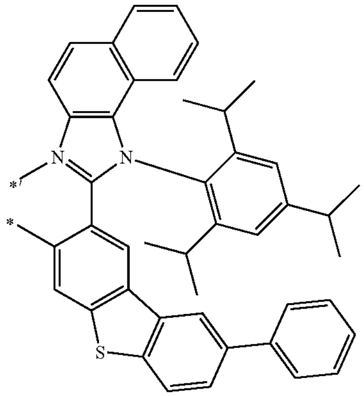
B147
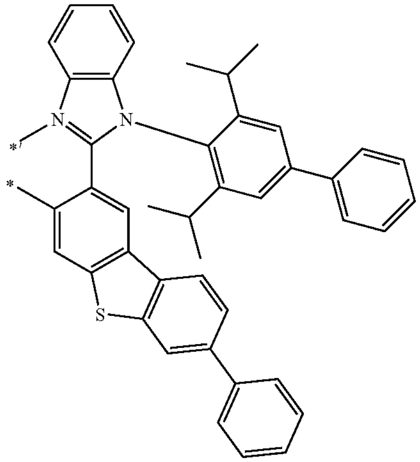
B248
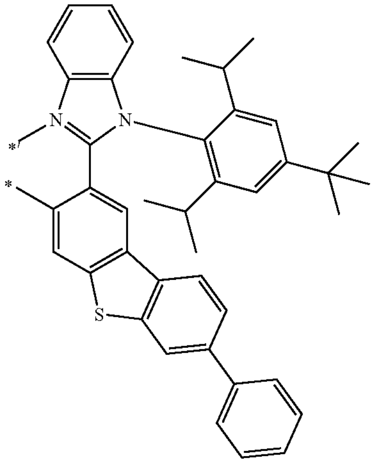
B249
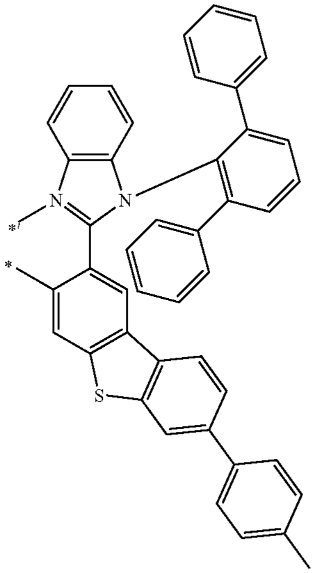
B250
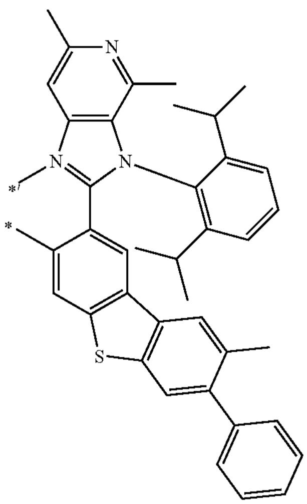

-continued
B251
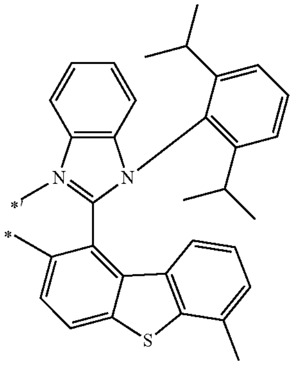
B252
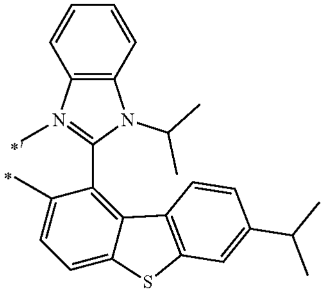
B253
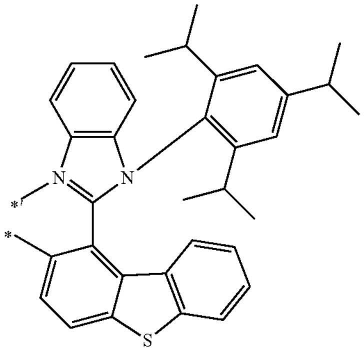
B254
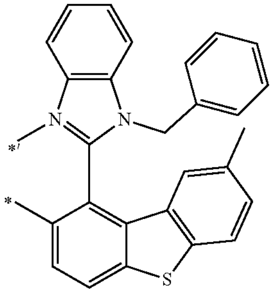
-continued
B255
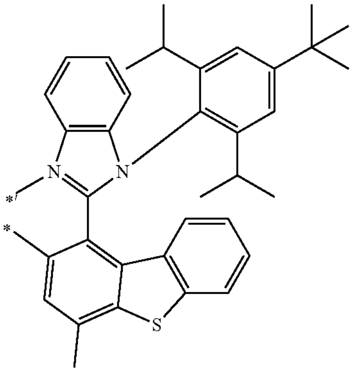
B256
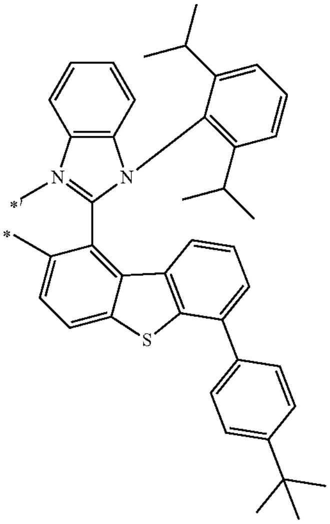
B257
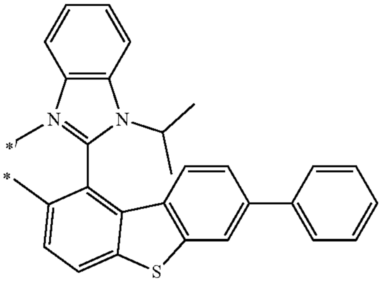
B258
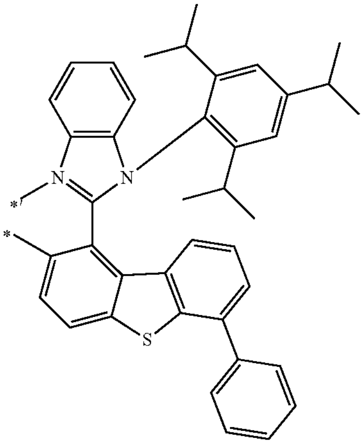

-continued
B259
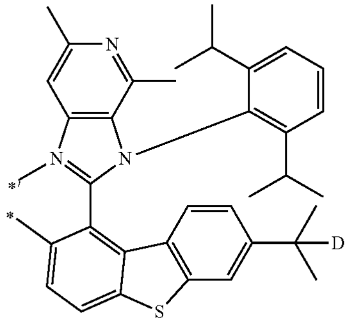
B260
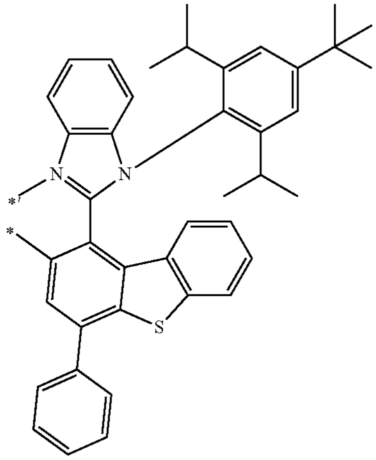
B261
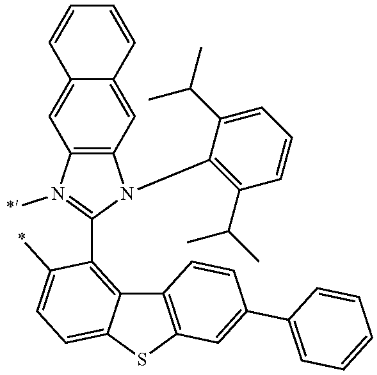
B262
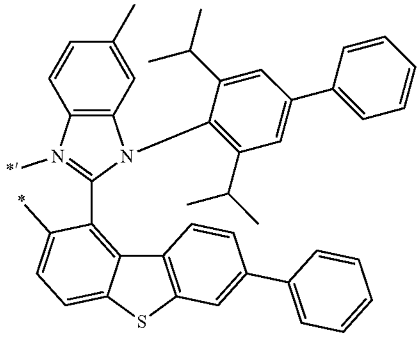
-continued
B263
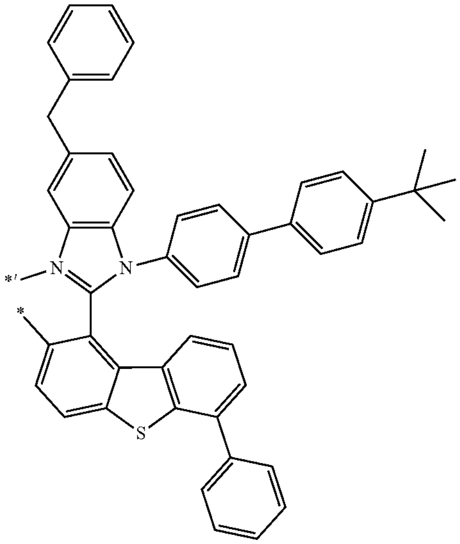
B264
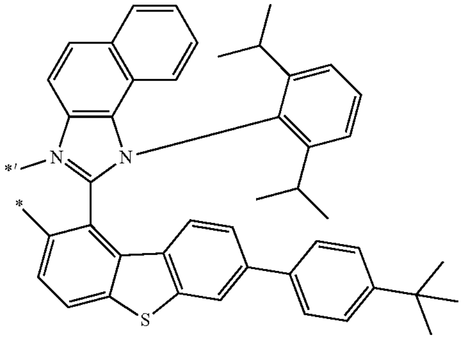
B265
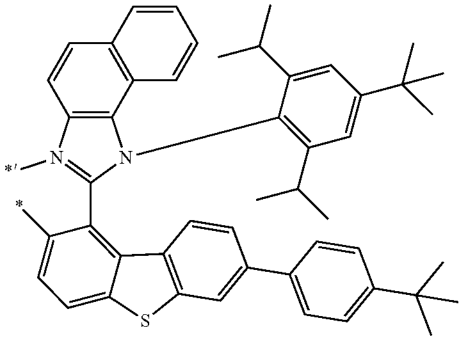
B266
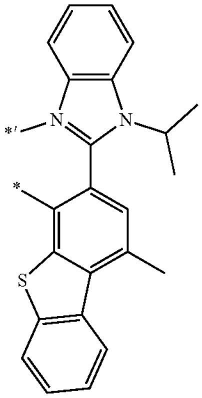

-continued
B267
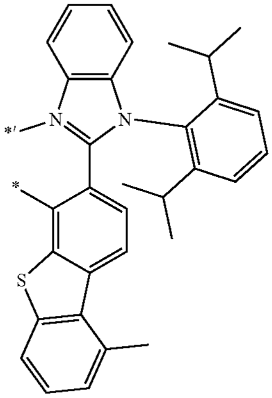
B268
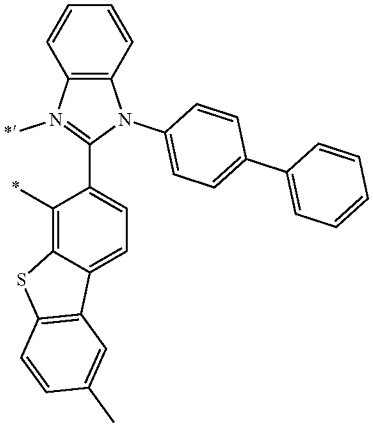
B269
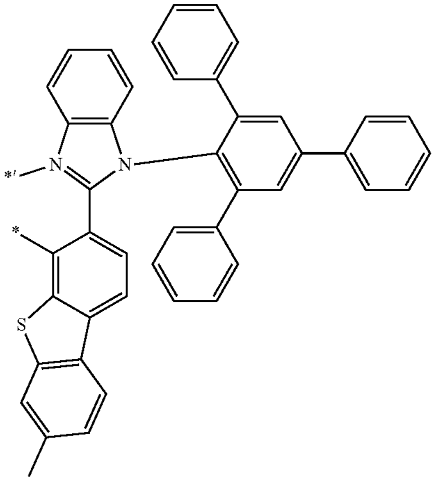
-continued
B270
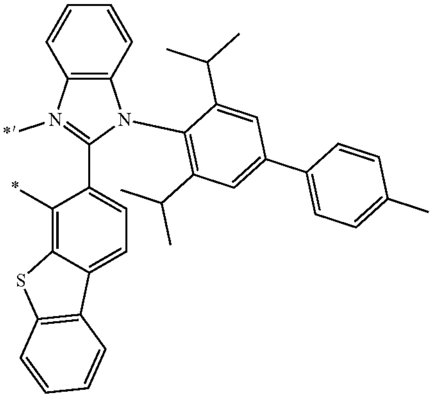
B271
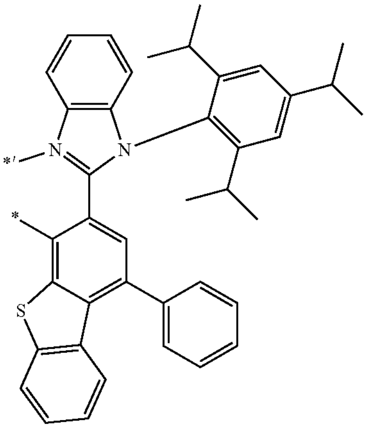
B272
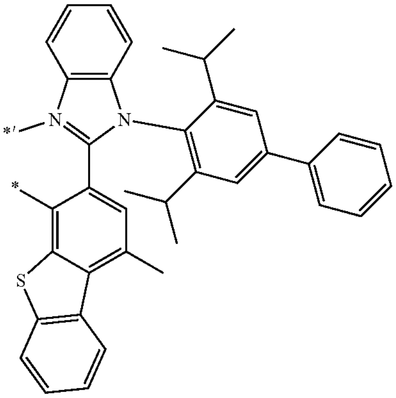
B273
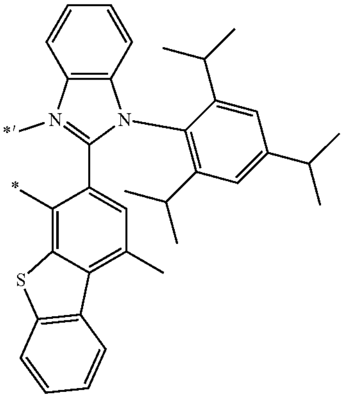

-continued
B274
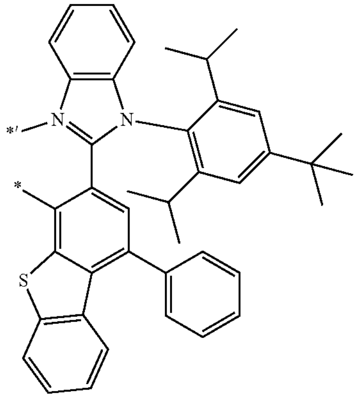
B275
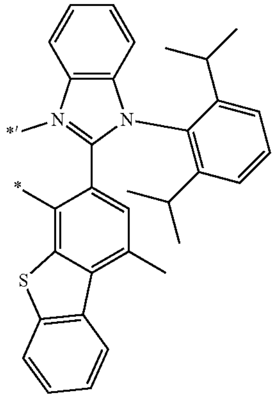
B276
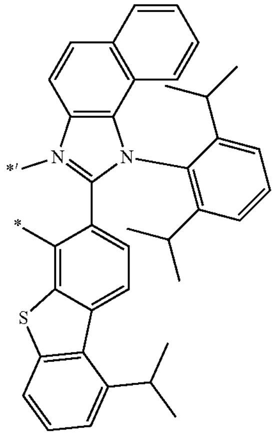
-continued
B277
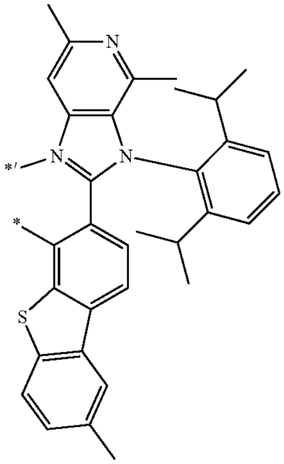
B278
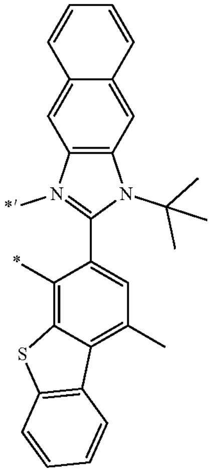
B279
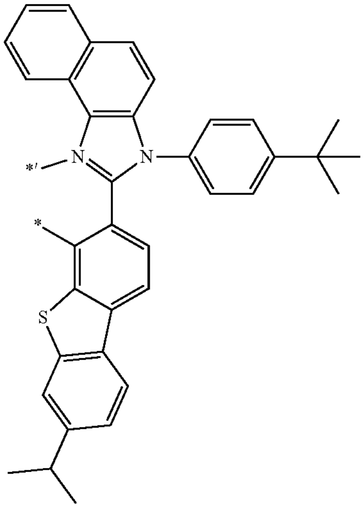

-continued
B280
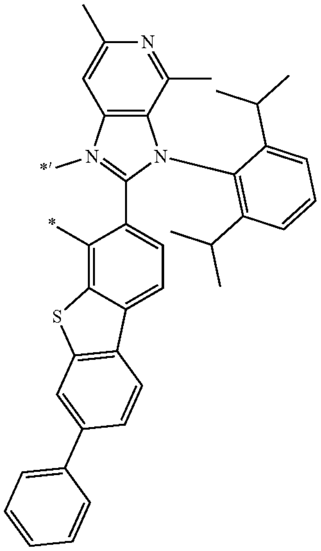
B281
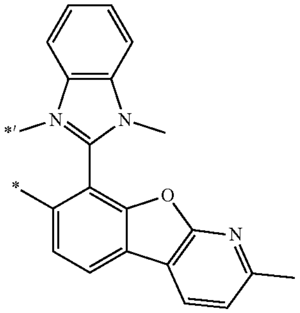
B282
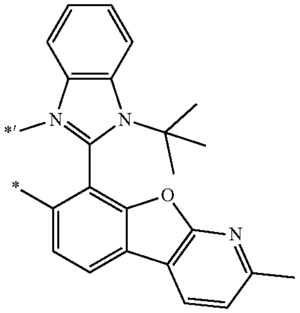
B283
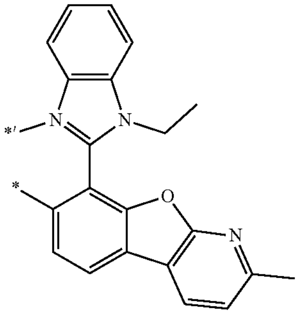
-continued
B284
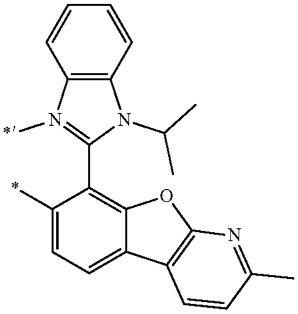
B285
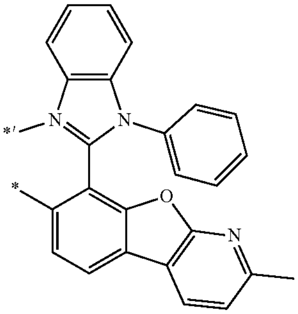
B286
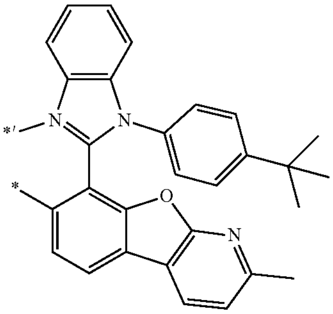
B287
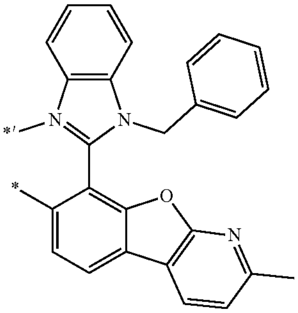
B288
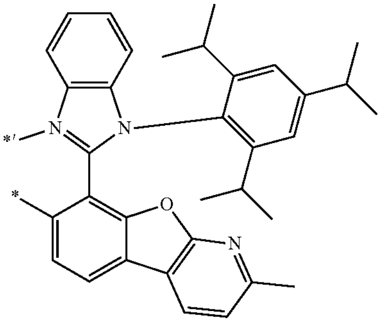

-continued
B289
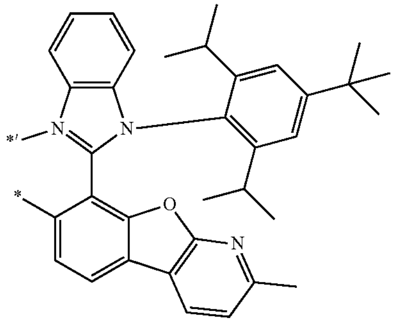
B290
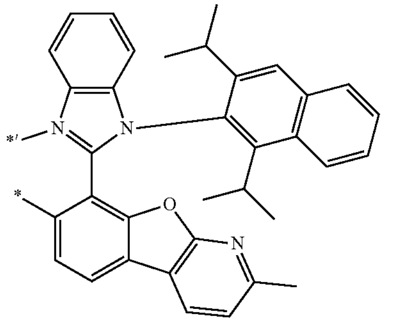
B291
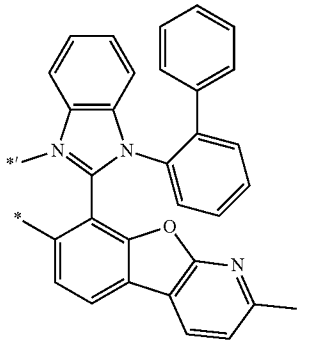
B292
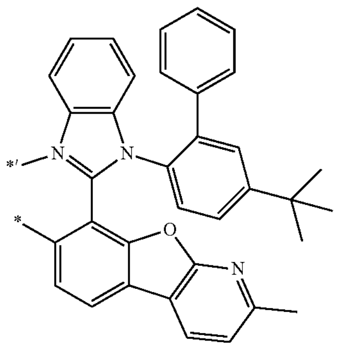
-continued
B293
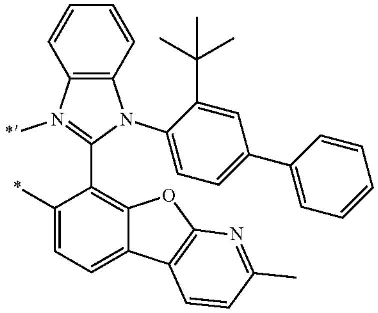
B294
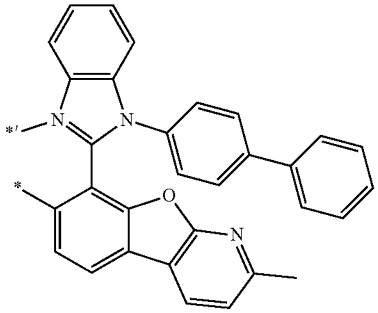
B295
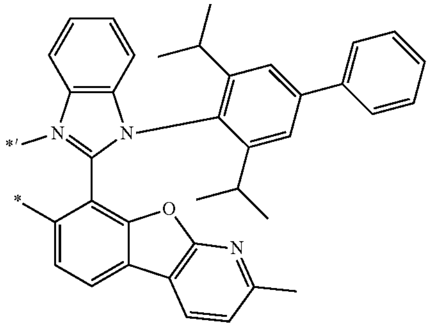
B296
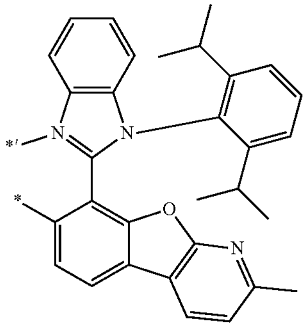

-continued
B297
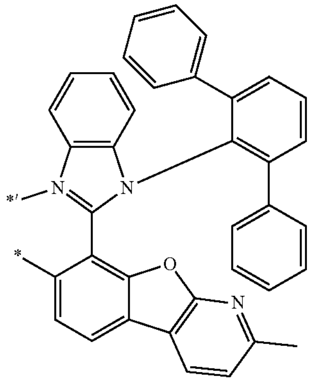
B298
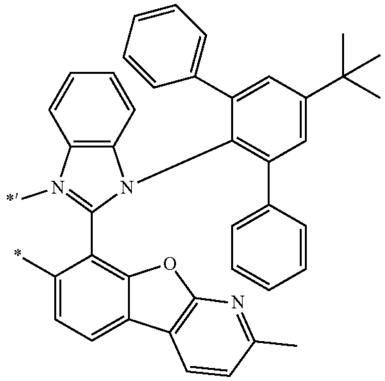
B299
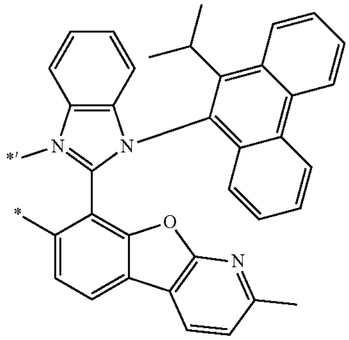
B300
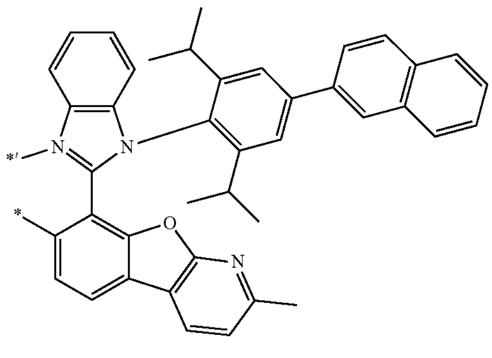
-continued
B301
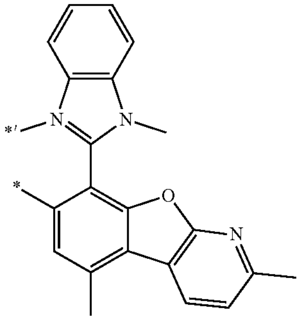
B302
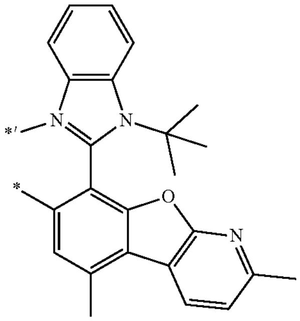
B303
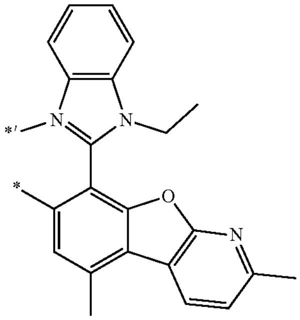
B304
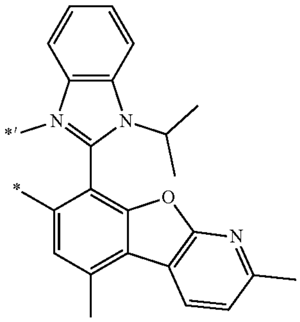
B305
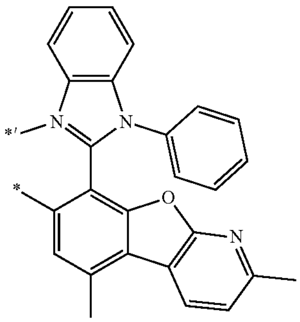

-continued
B306
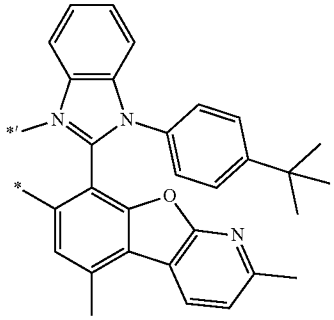
B307
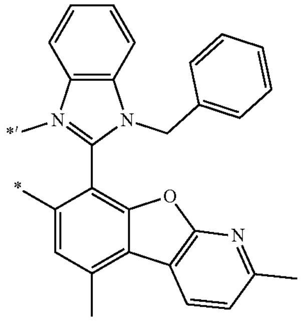
B308
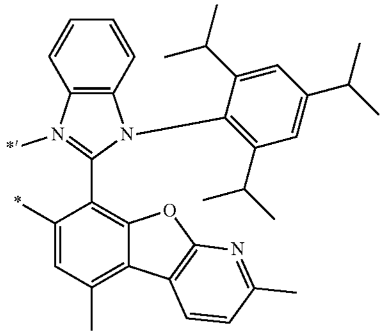
B309
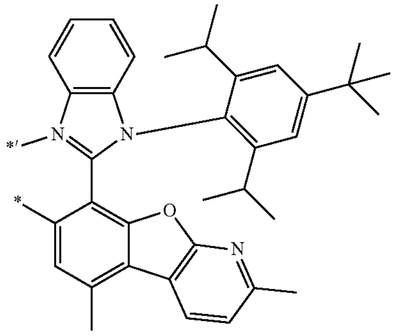
-continued
B310
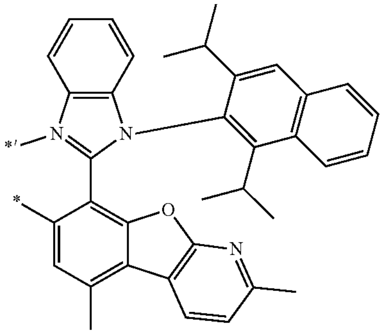
B311
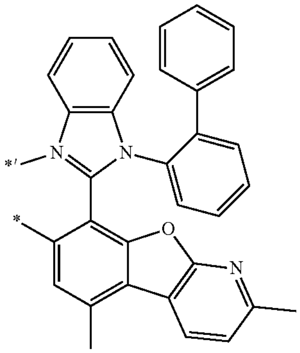
B312
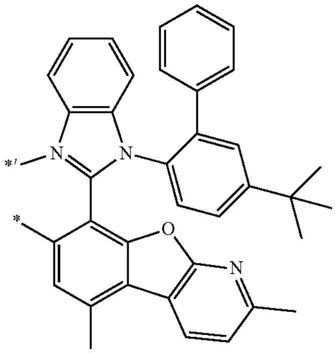
B313
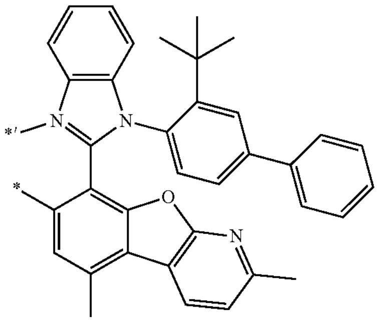

-continued
B314
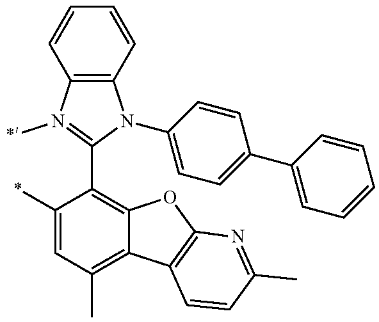
B315
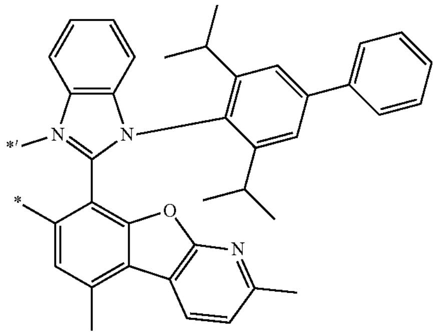
B316
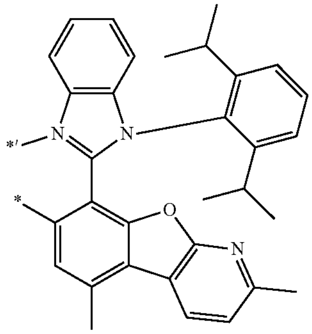
B317
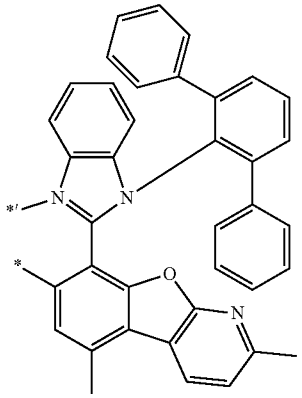
-continued
B318
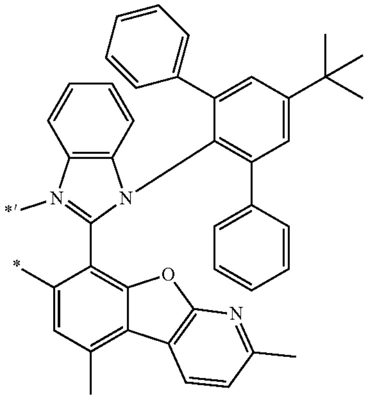
B319
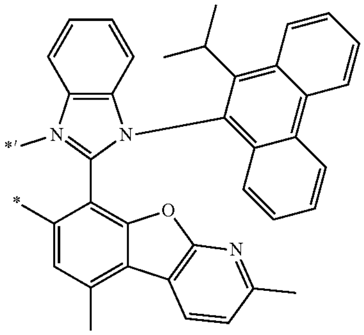
B320
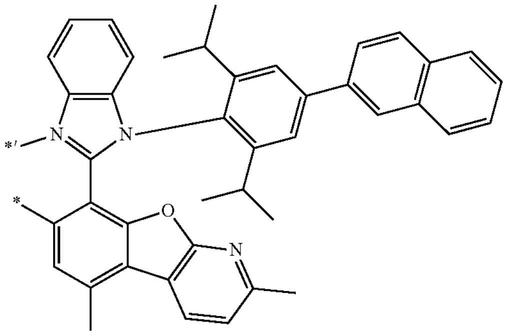
B321
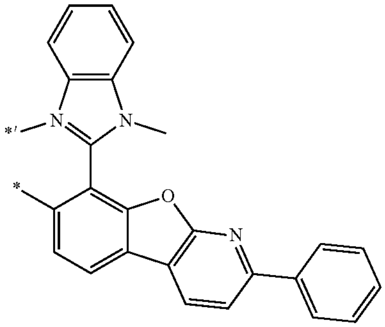

-continued
B322
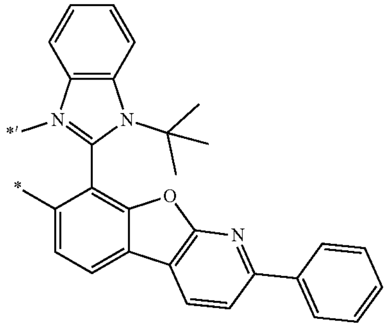
B323
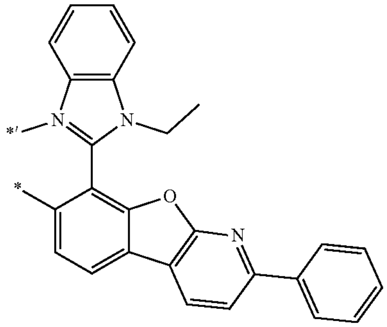
B324
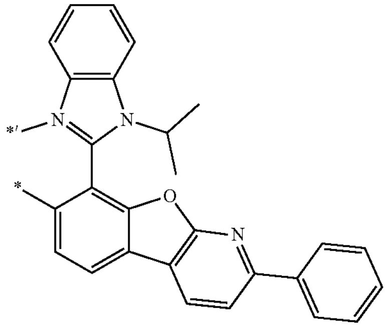
B325
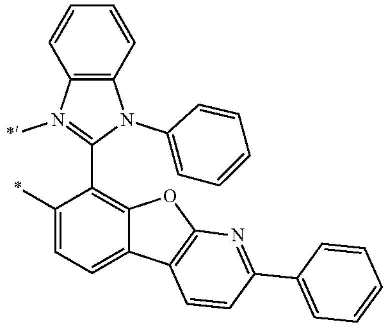
-continued
B326
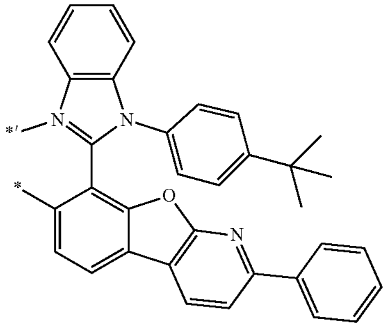
B327
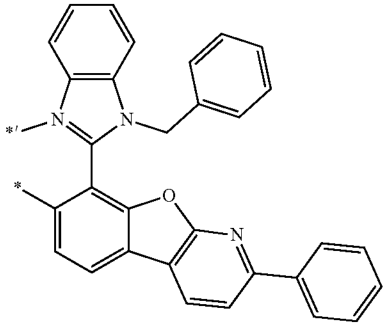
B328
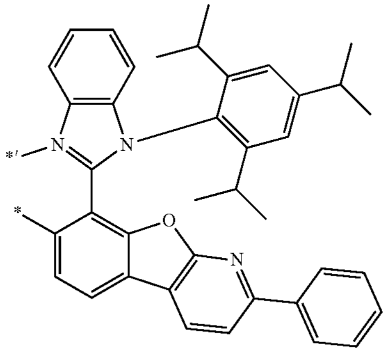
B329
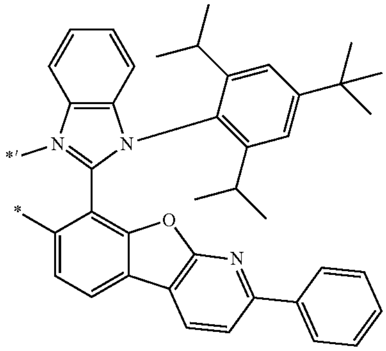

-continued
B330
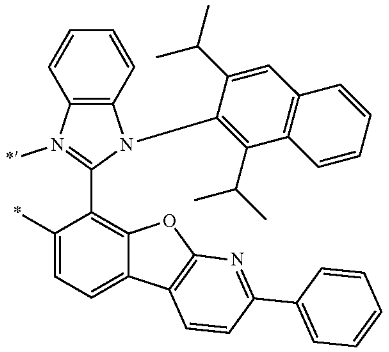
B331
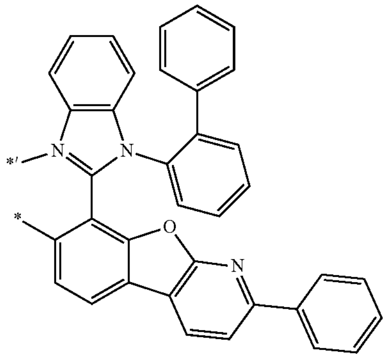
B332
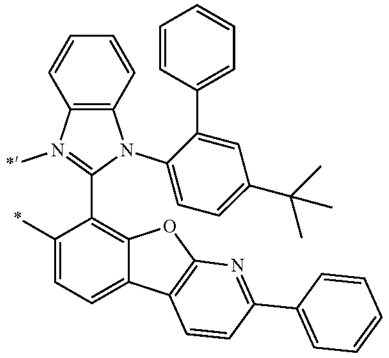
B333
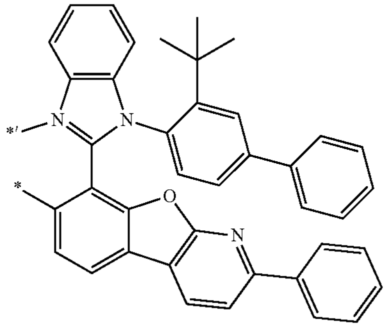
-continued
B334
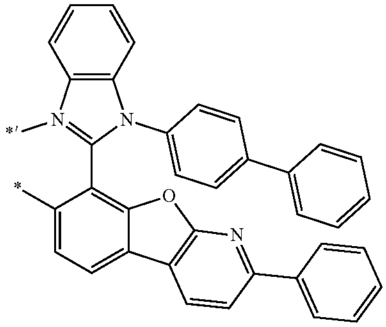
B335
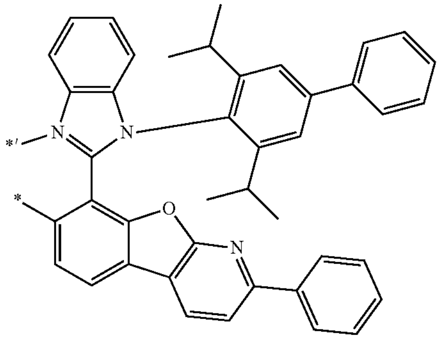
B336
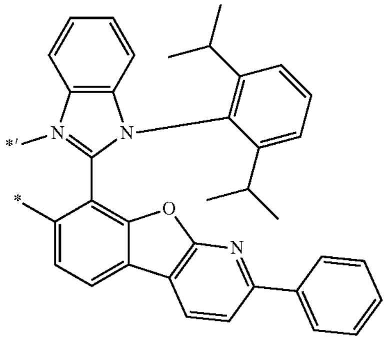
B337
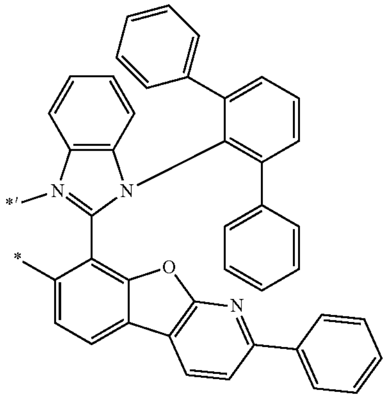

-continued
B338
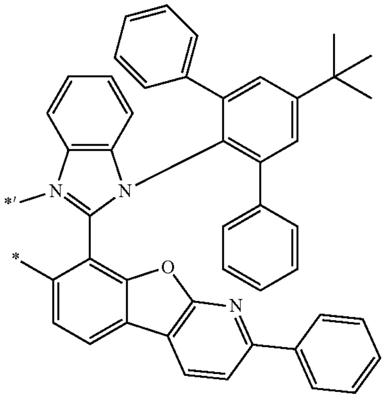
B339
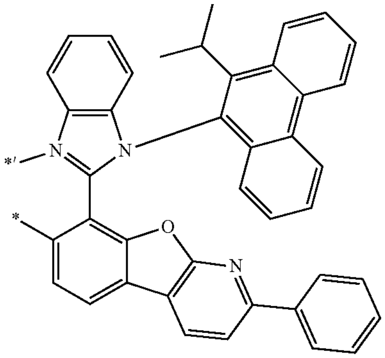
B340
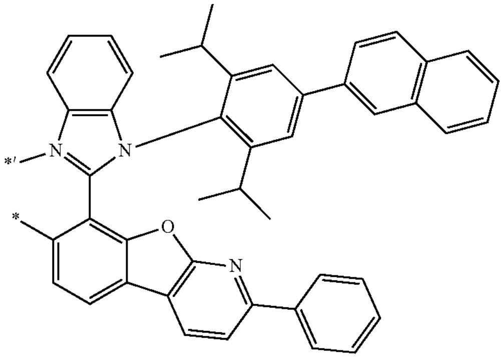
B341
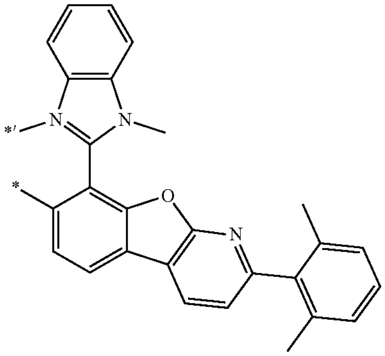
-continued
B342
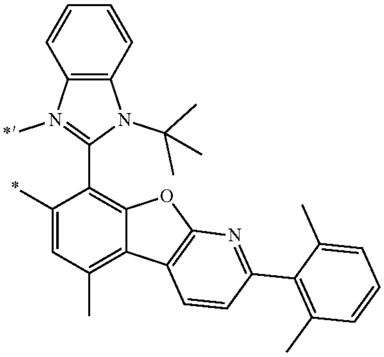
B343
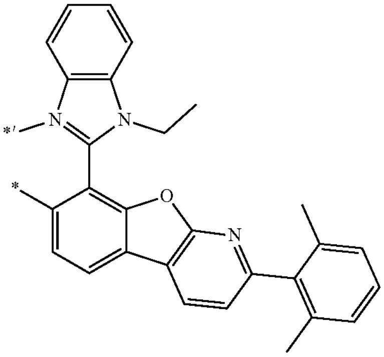
B344
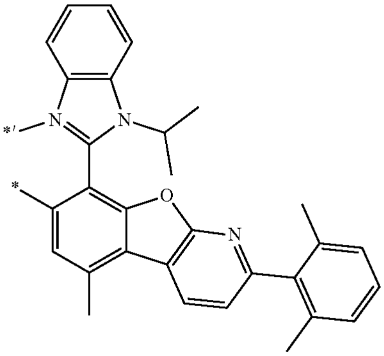
B345
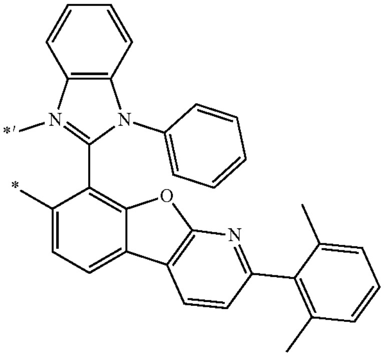

B346
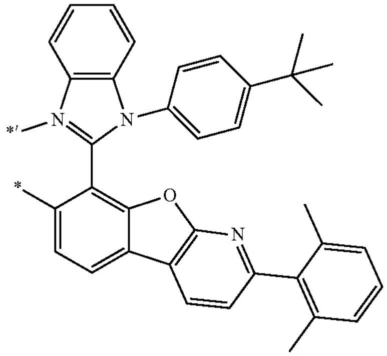
B347
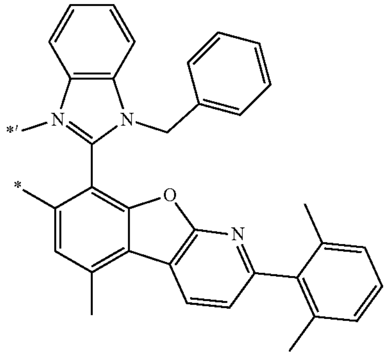
B348
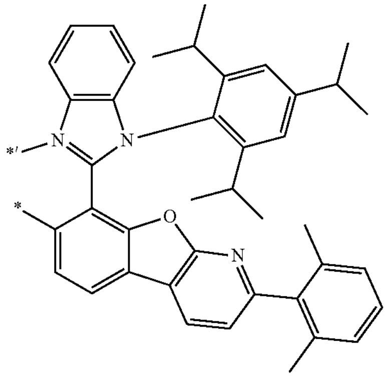
B349
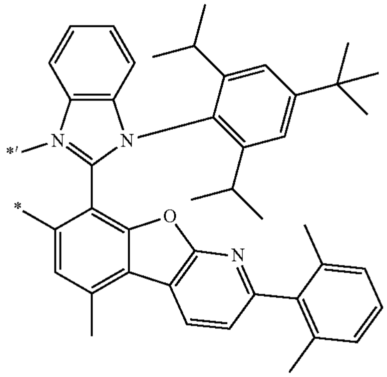
B350
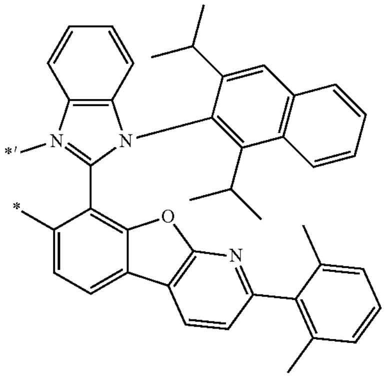
B351
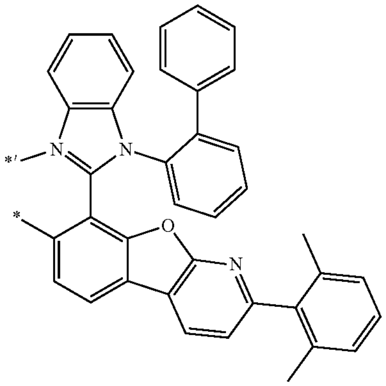
B352
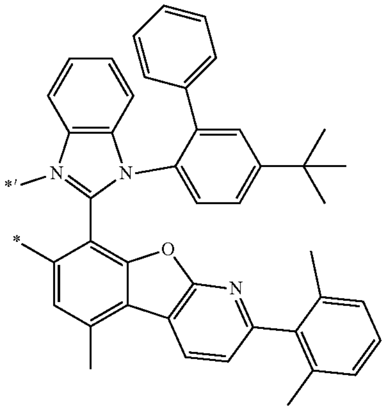
B353
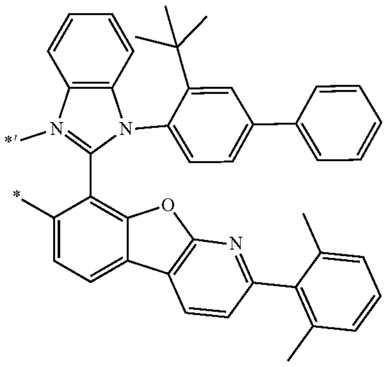

-continued
B354
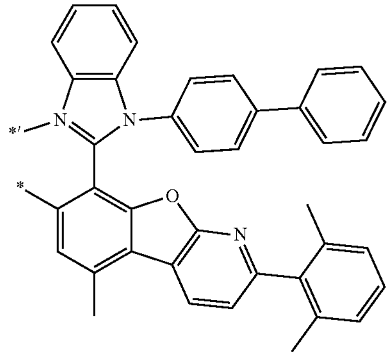
B355
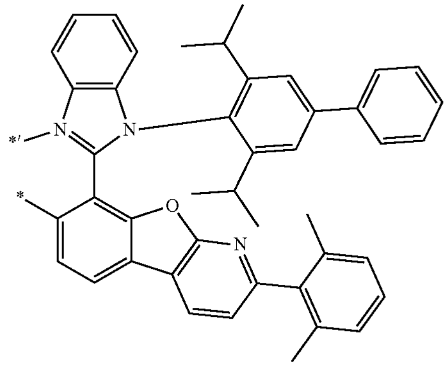
B356
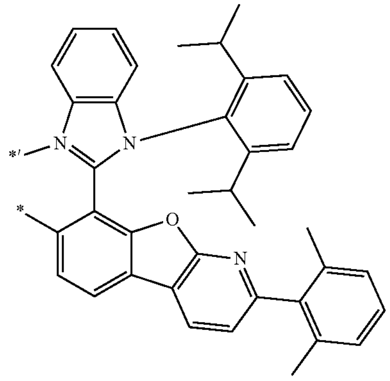
B357
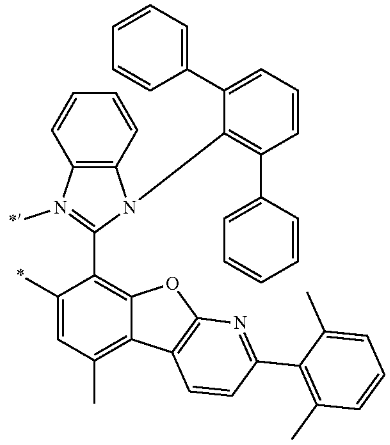
-continued
B358
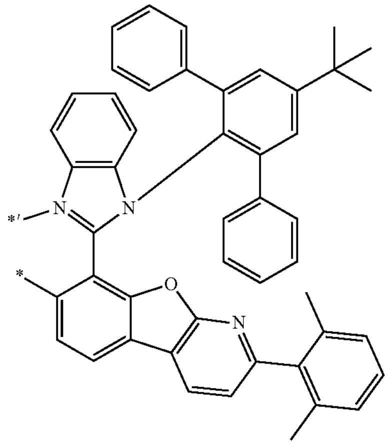
B359
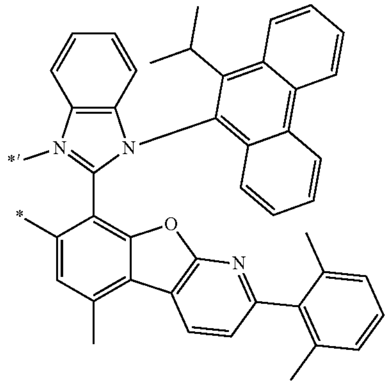
B360
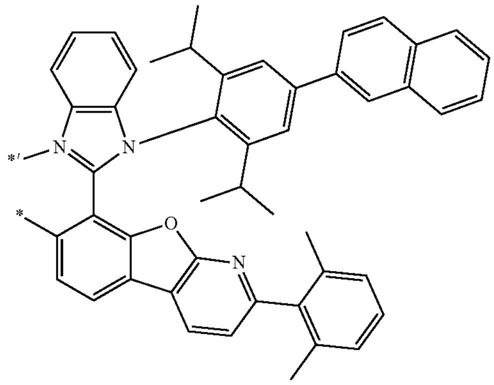
B361
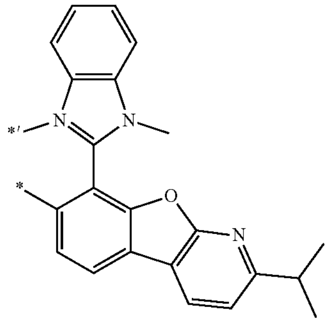

-continued
B362
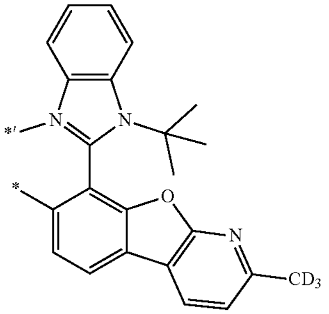
B363
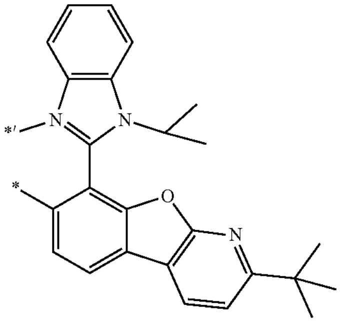
B364
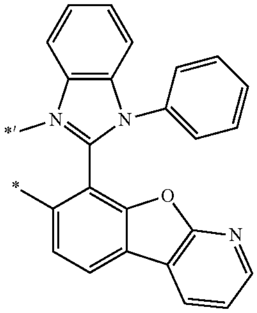
B365
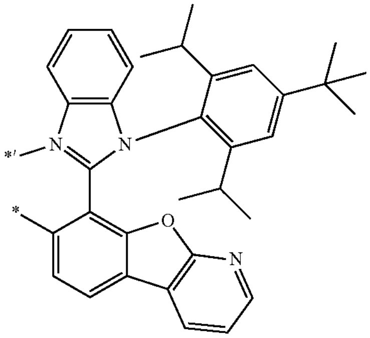
B366
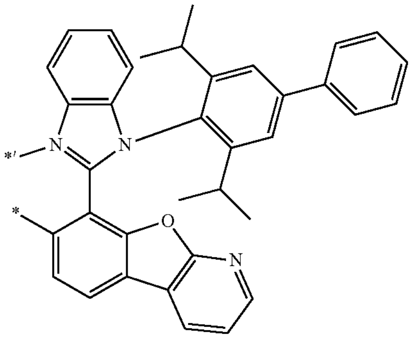
-continued
B367
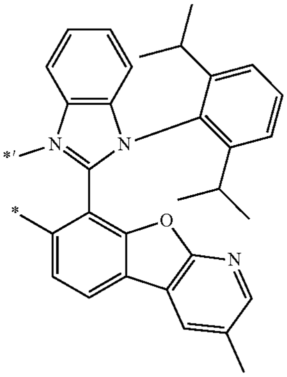
B368
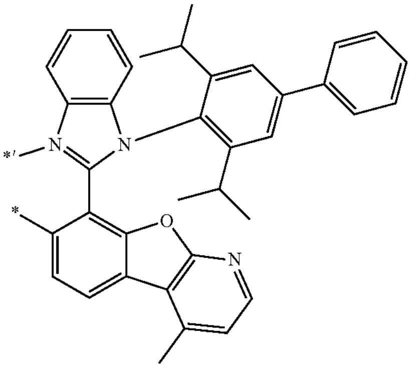
B369
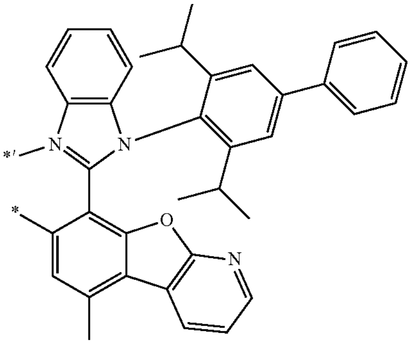
B370
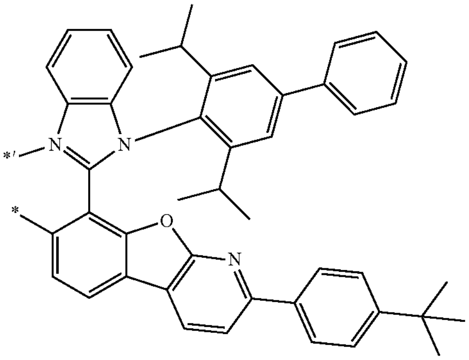

-continued
B371
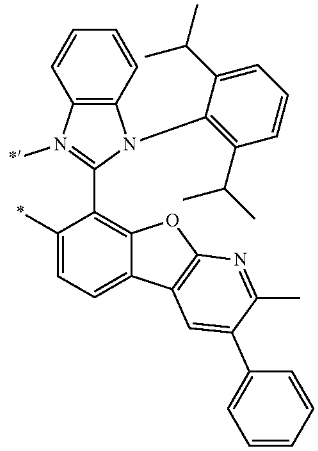
B372
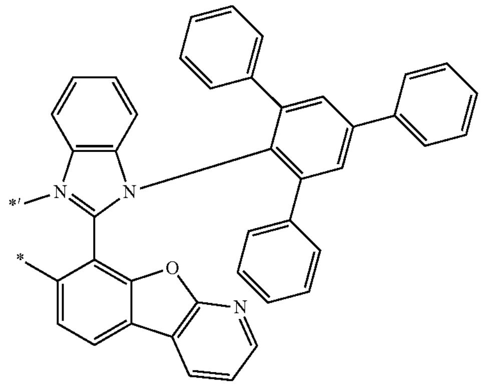
B373
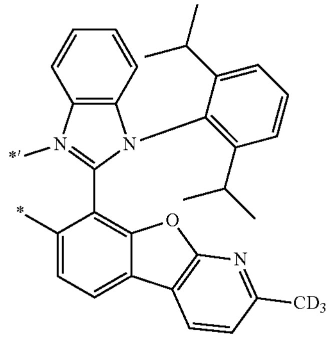
B374
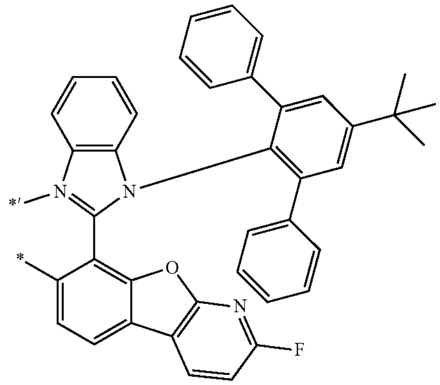
-continued
B375
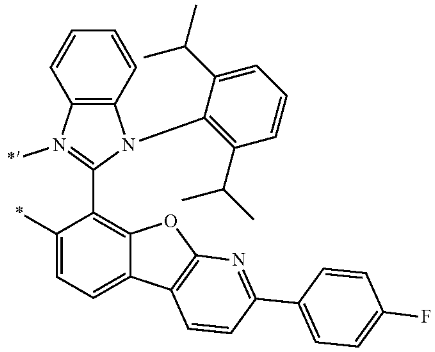
B376
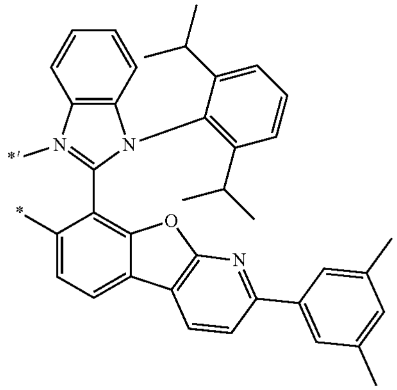
B377
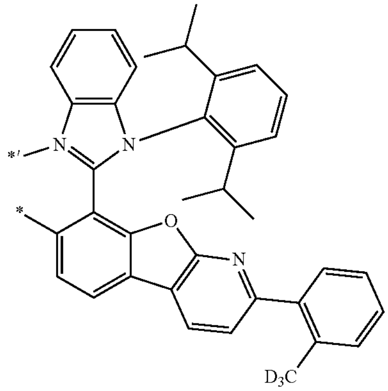
B378
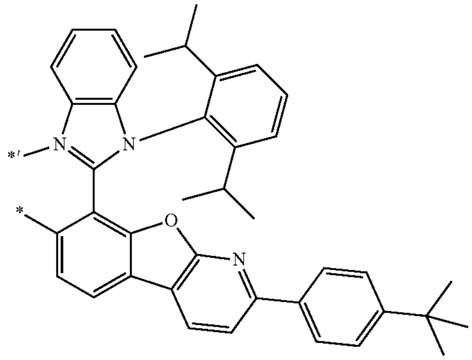

-continued
B379
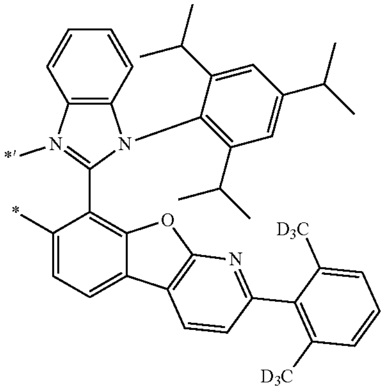
B380
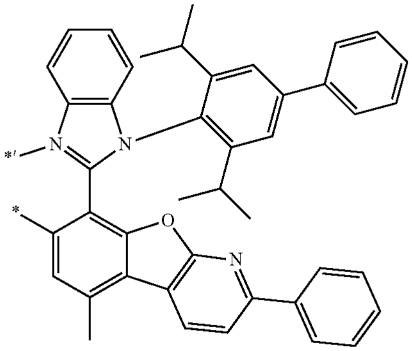
B381
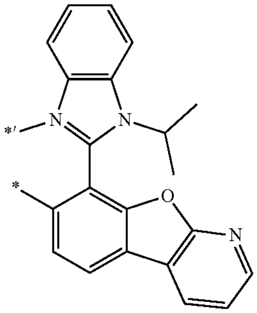
B382
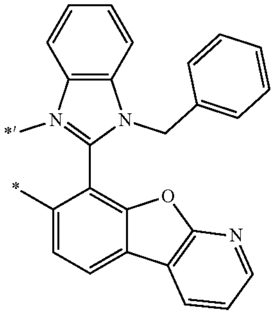
-continued
B383
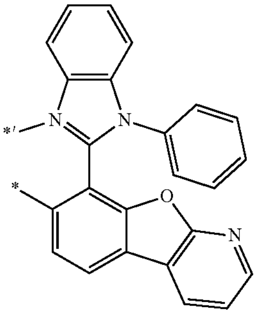
B384
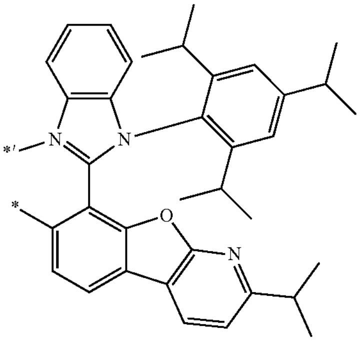
B385
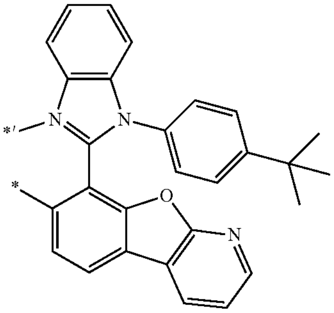
B386
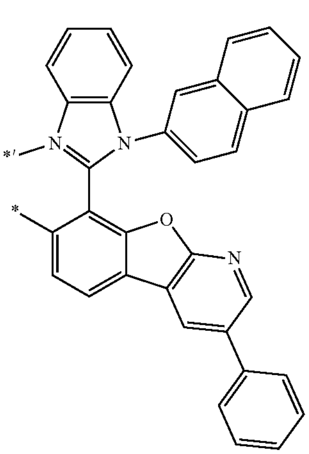

-continued
B387
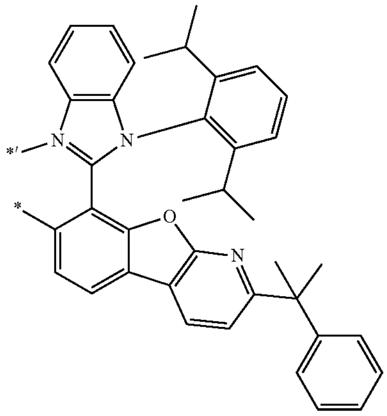
B388
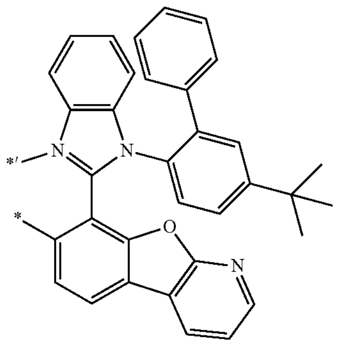
B389
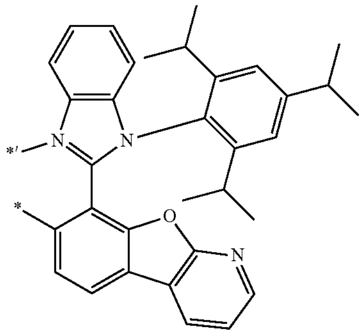
B390
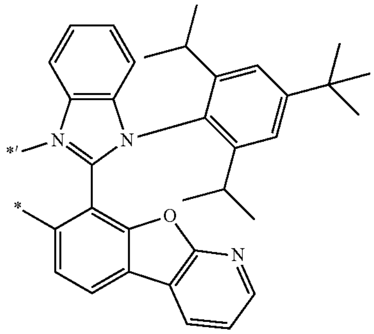
-continued
B391
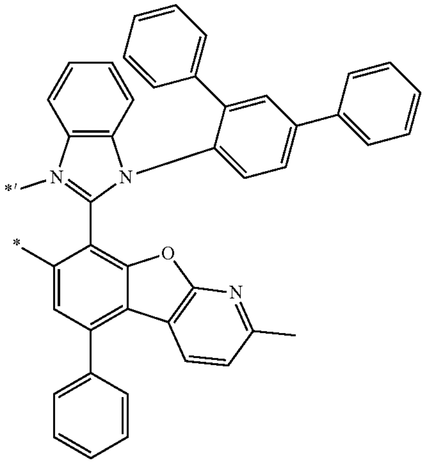
B392
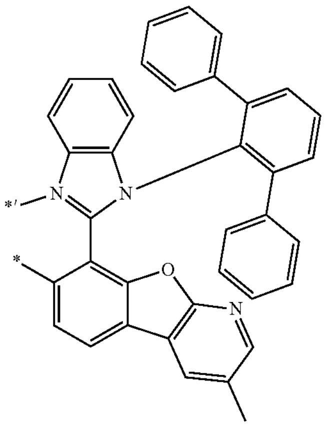
B393
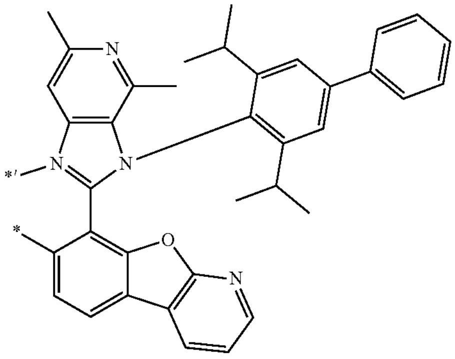

-continued
B394
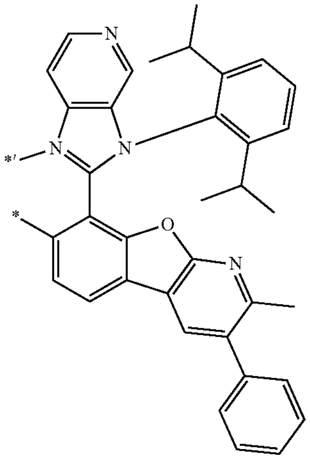
B395
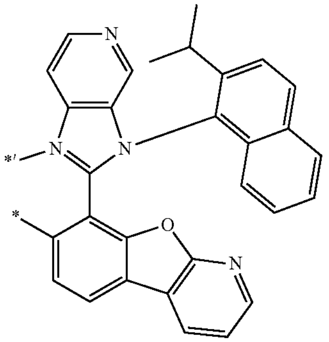
B396
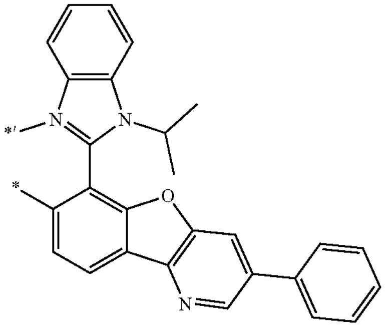
B397
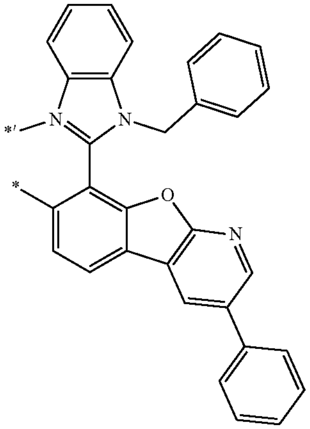
-continued
B398
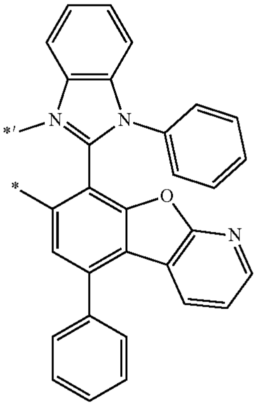
B399
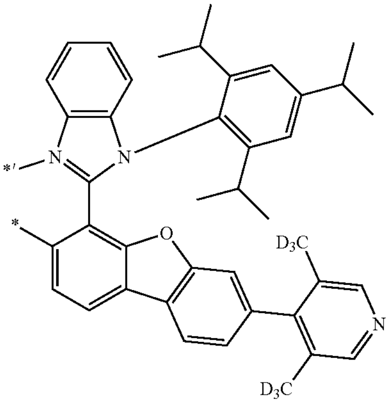
B400
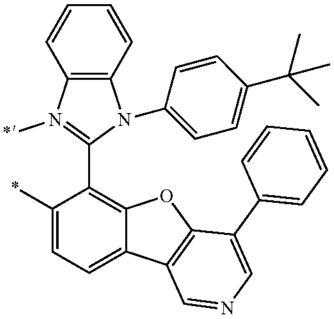
B401
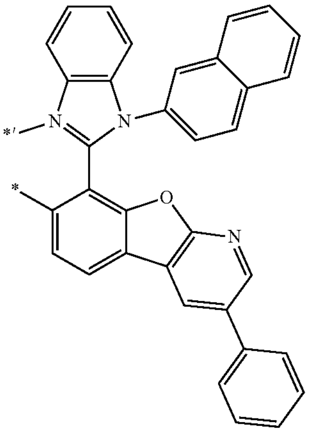

-continued
B402
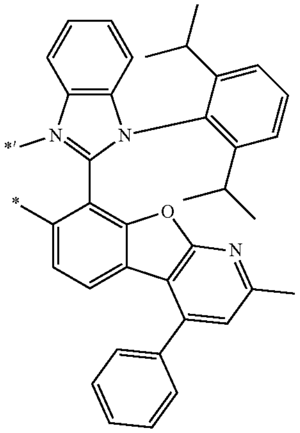
B403
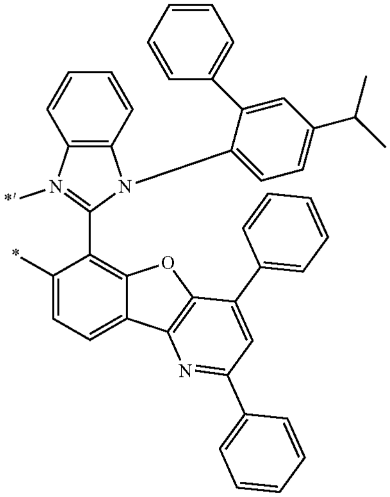
B404
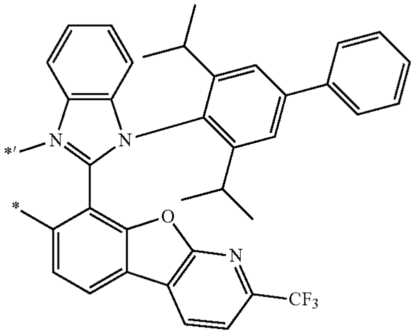
-continued
B405
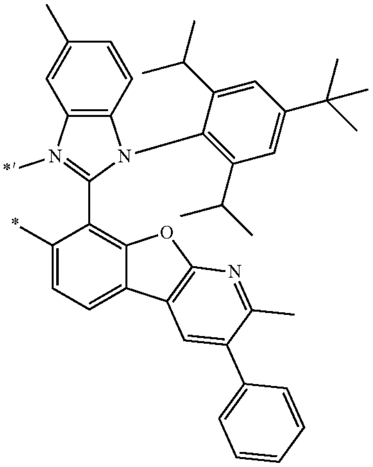
B406
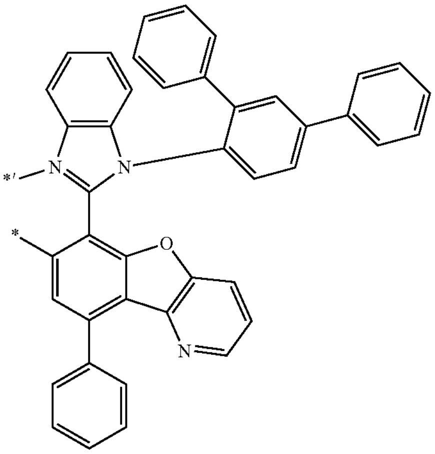
B407
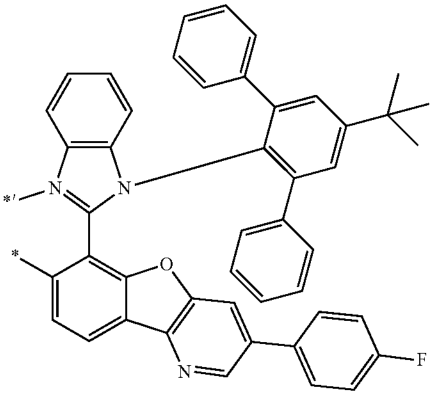

-continued
B408
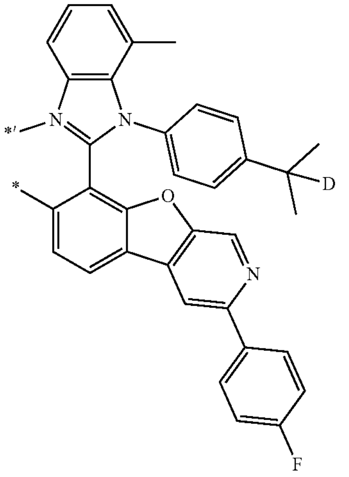
B409
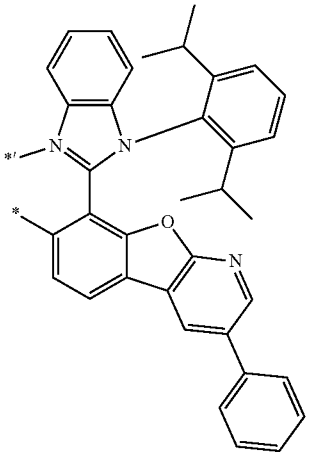
B410
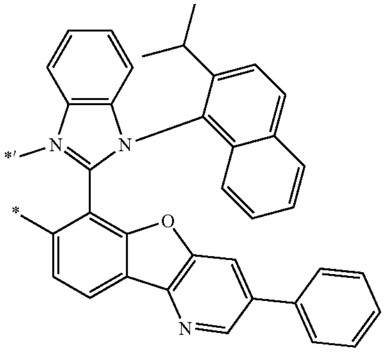
B411
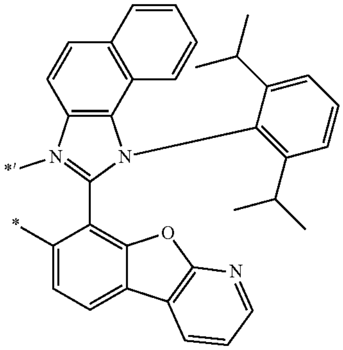
-continued
B412
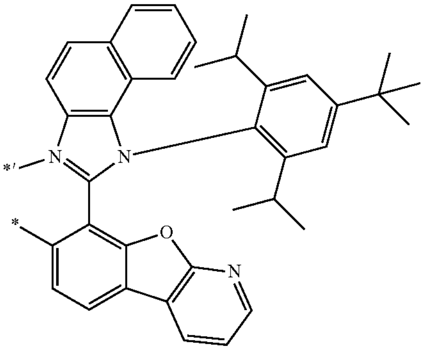
B413
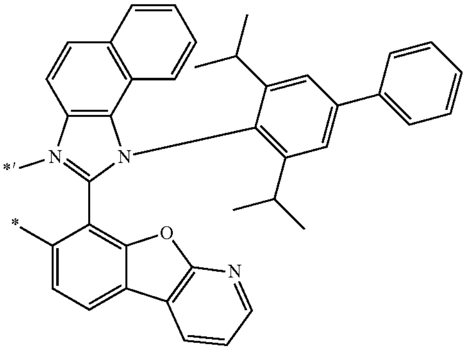
B414
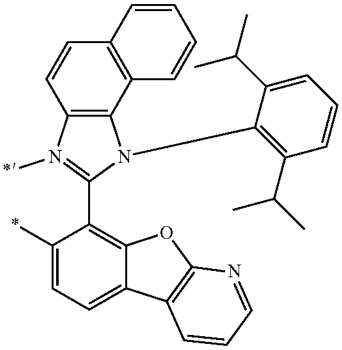
B415
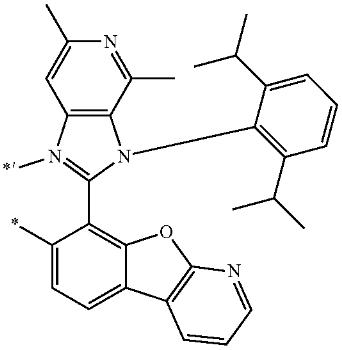

-continued
B416
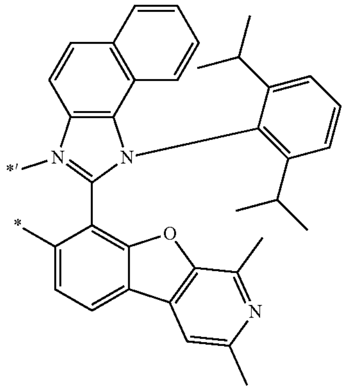
B417
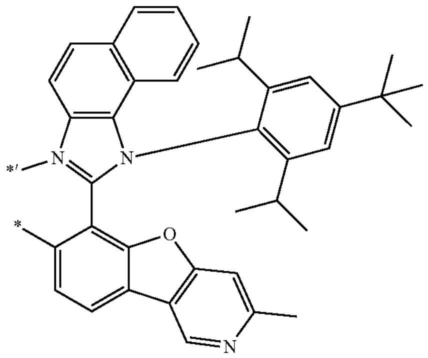
B418
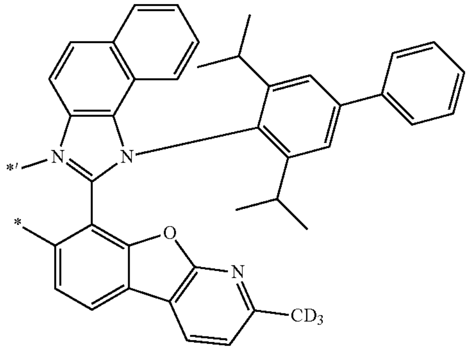
B419
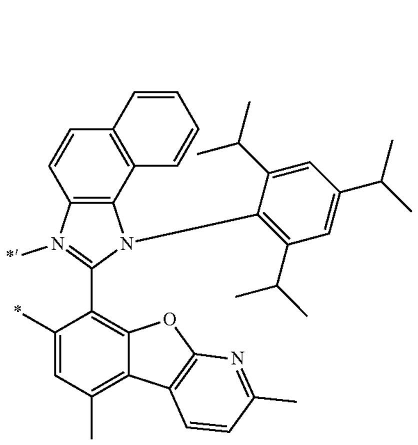
-continued
B420
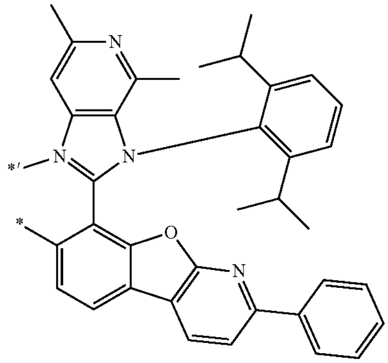
B421
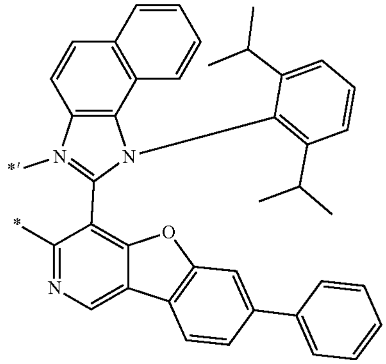
B422
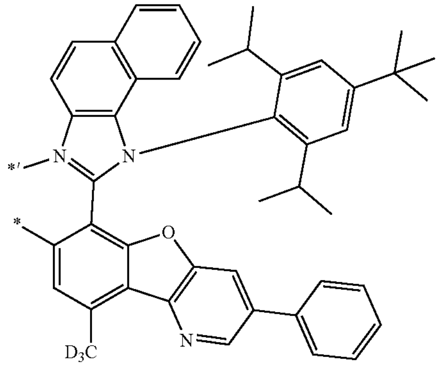
B423
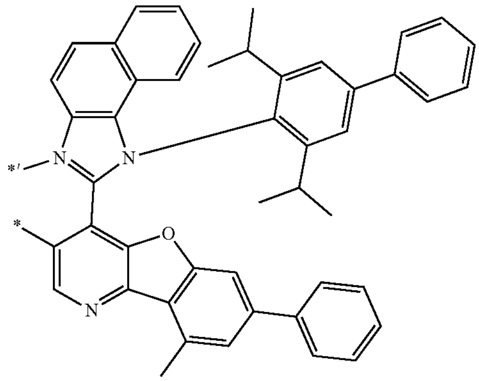

-continued
B424
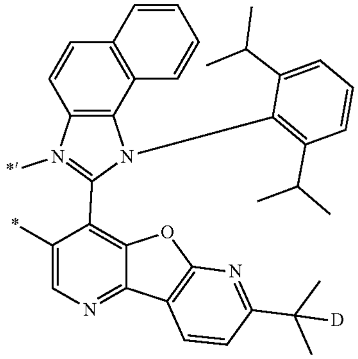
B425
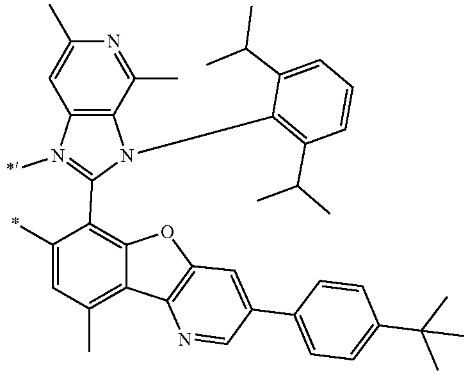
B426
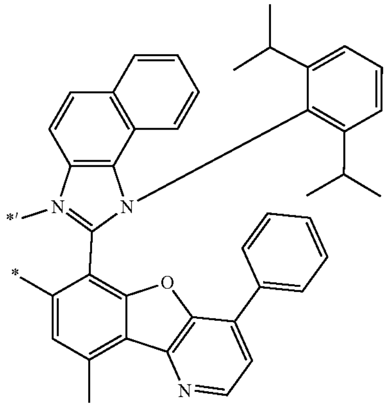
B427
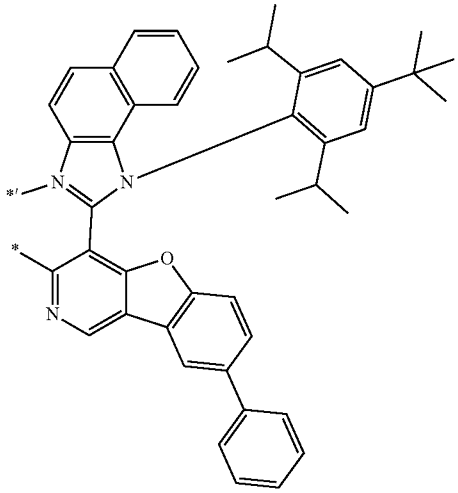
-continued
B428
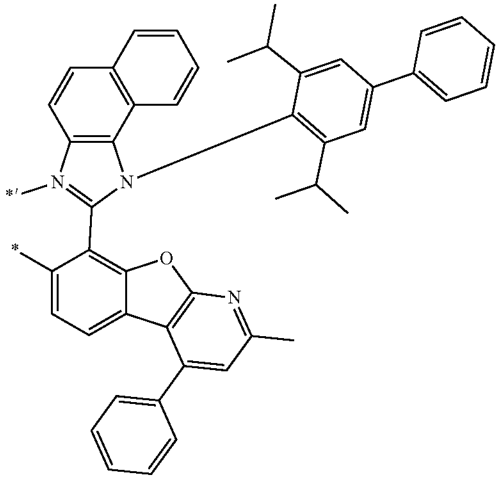
B429
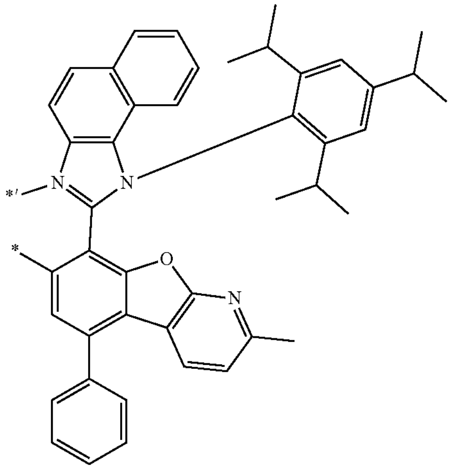
B430
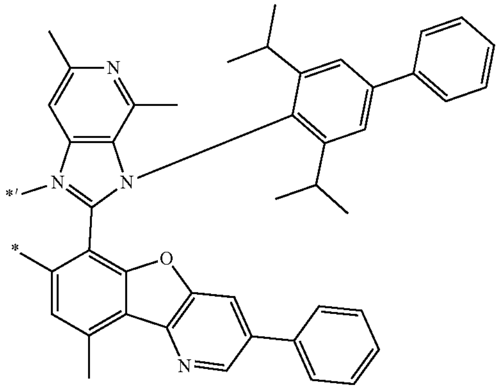

B431
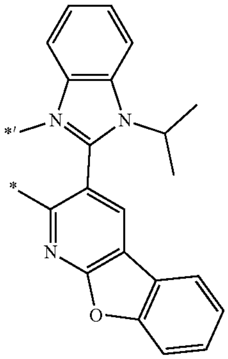
B432
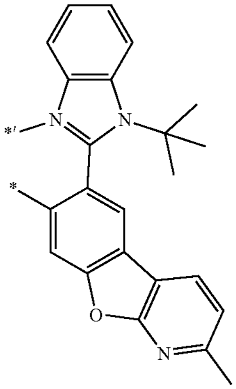
B433
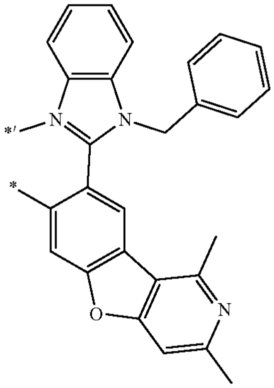
B434
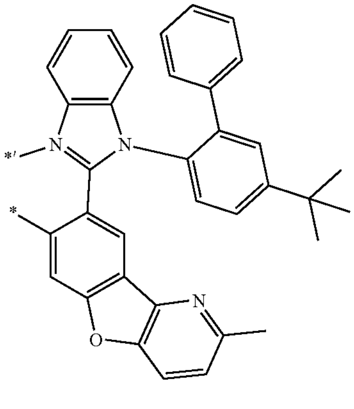
B435
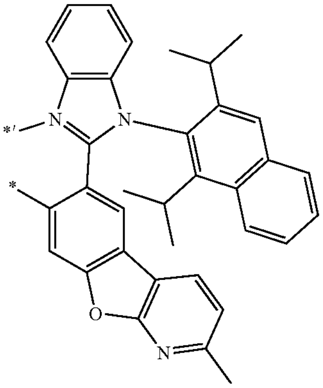
B436
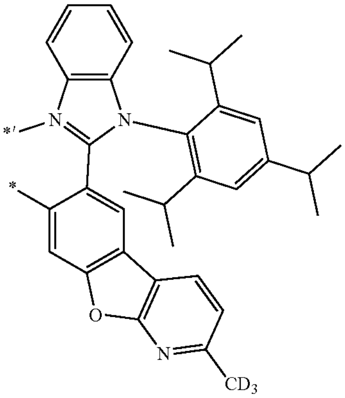
B437
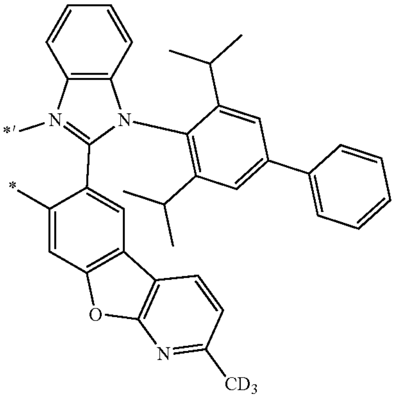
B438
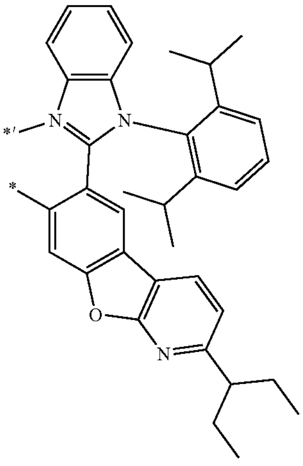

-continued
B439
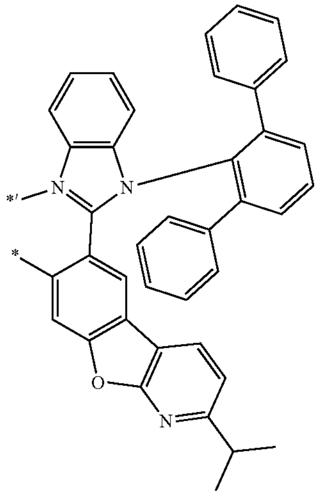
B440
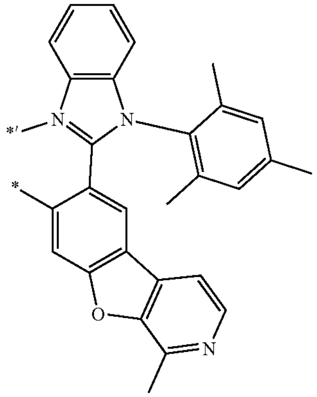
B441
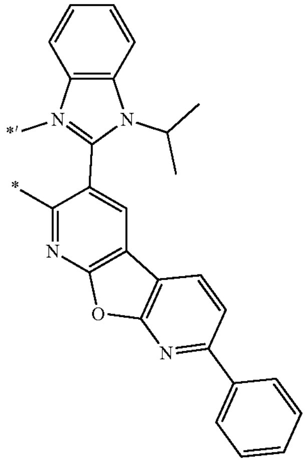
-continued
B442
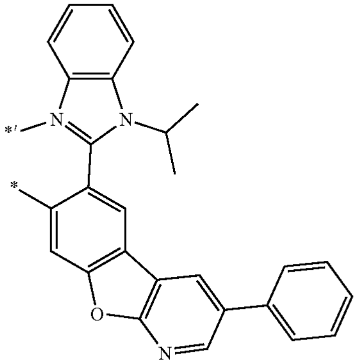
B443
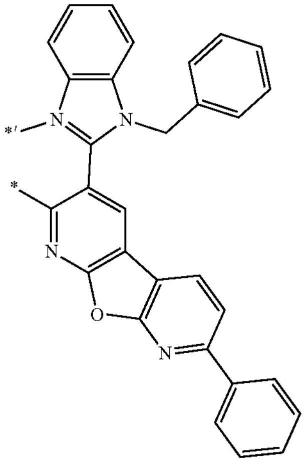
B444
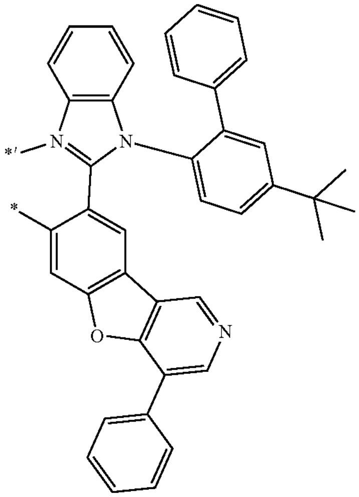

-continued
B445
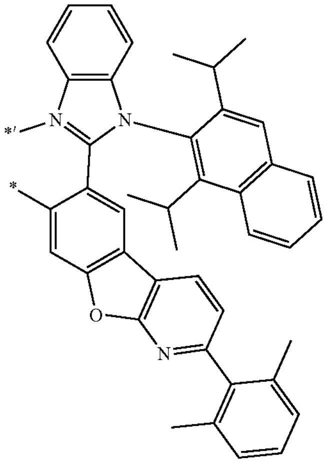
B446
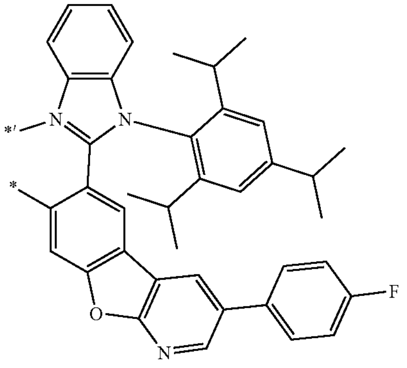
B447
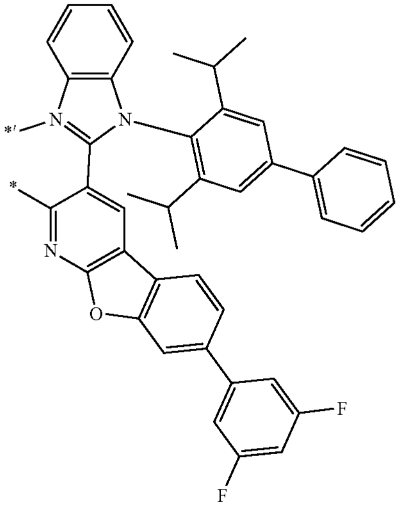
-continued
B448
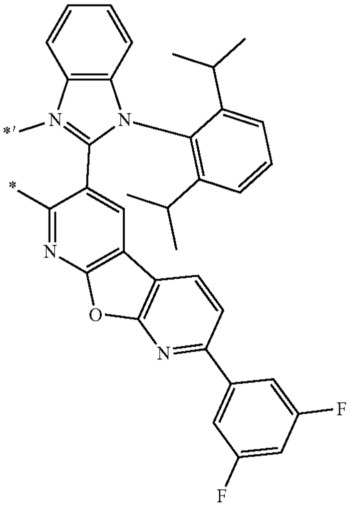
B449
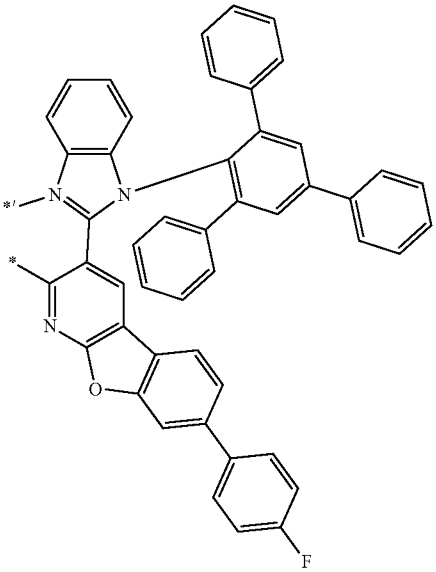
B450
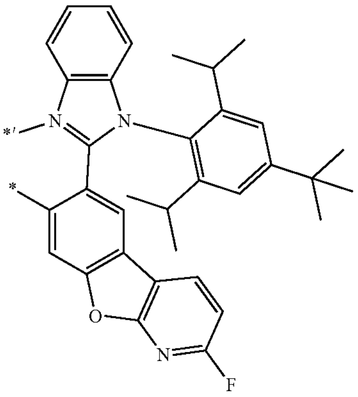

-continued
B451
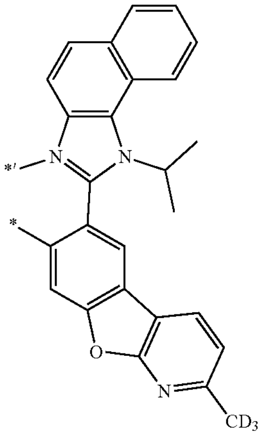
B452
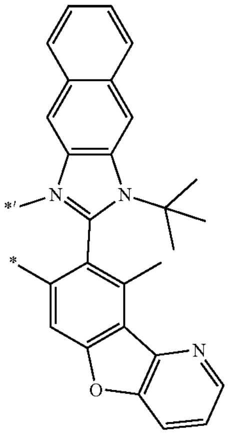
B453
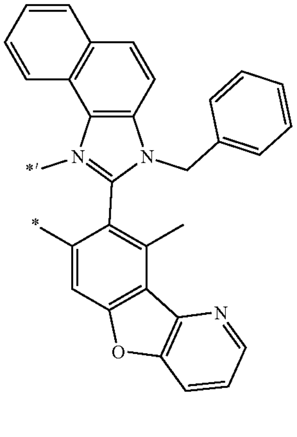
-continued
B454
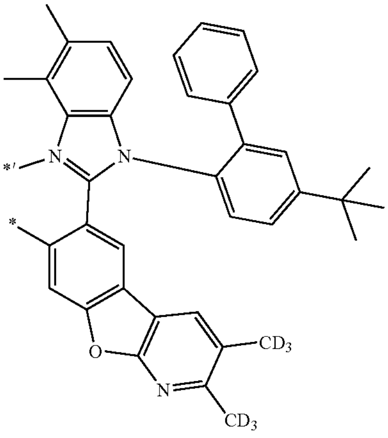
B455
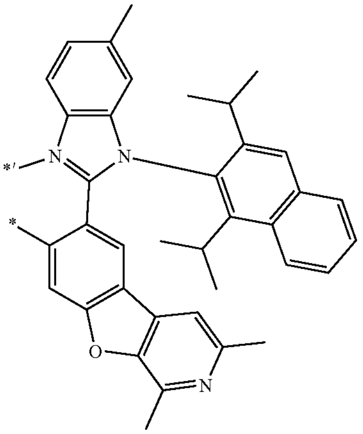
B456
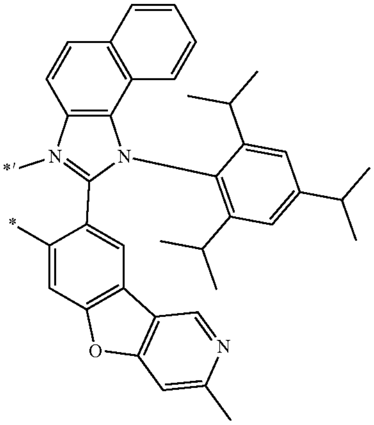

-continued
B457
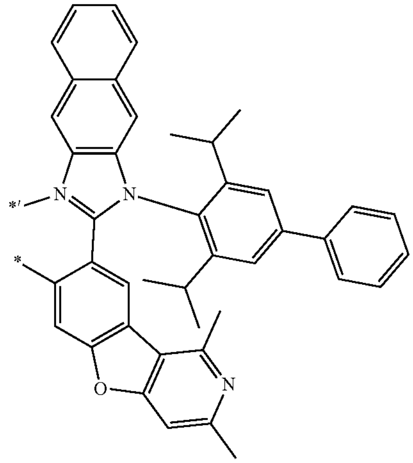
B458
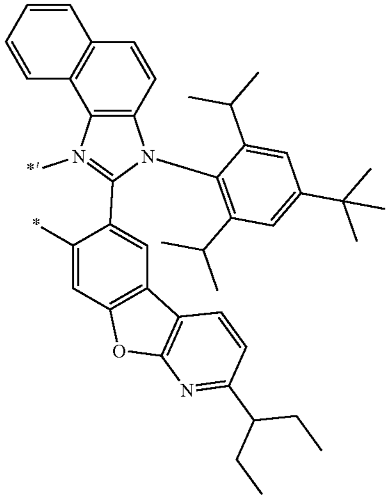
B459
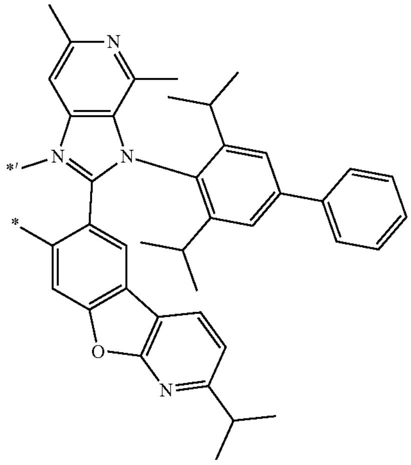
-continued
B460
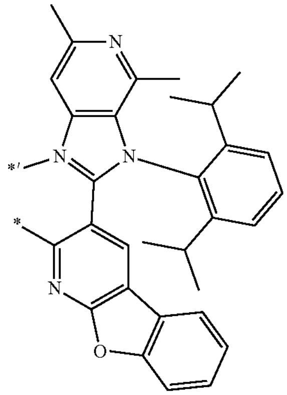
B461
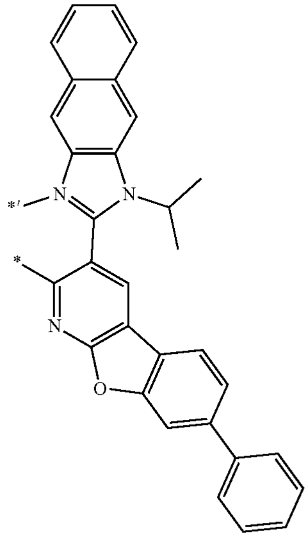
B462
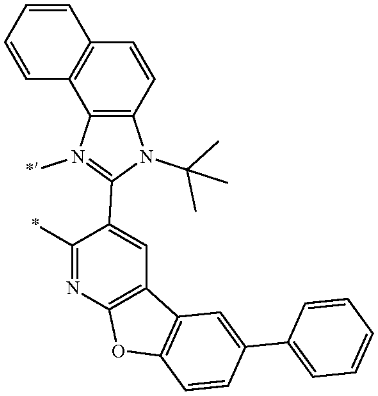

-continued
B463
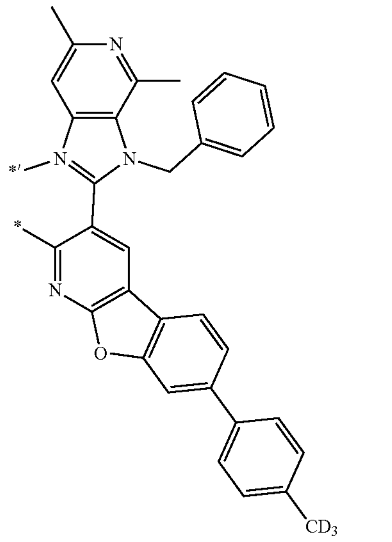
B464
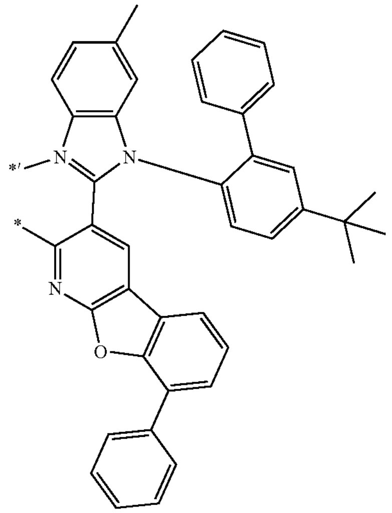
B465
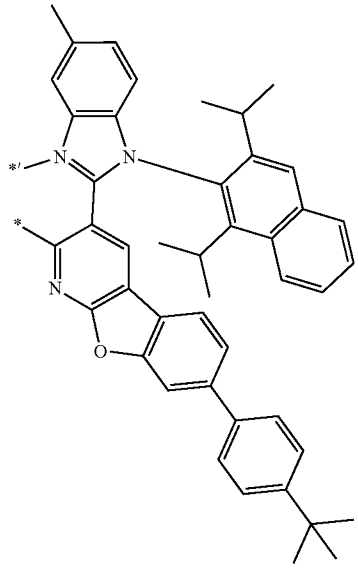
-continued
B466
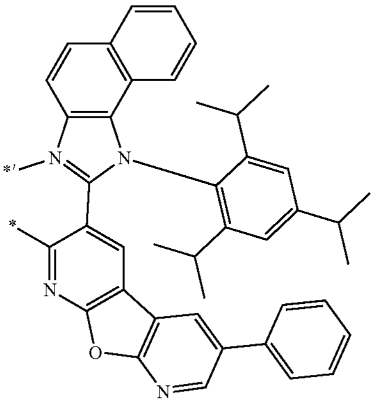
B467
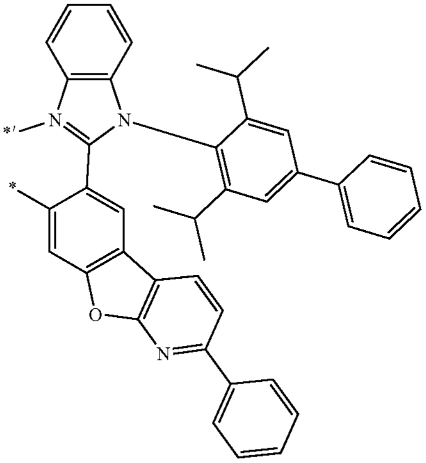
B468
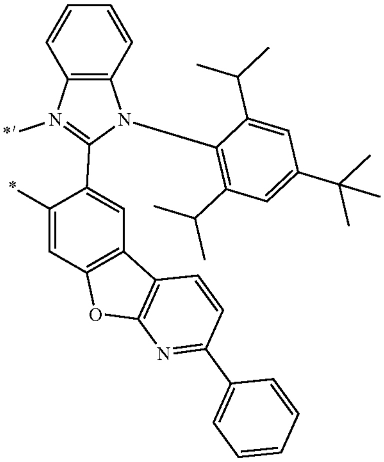

-continued
B469
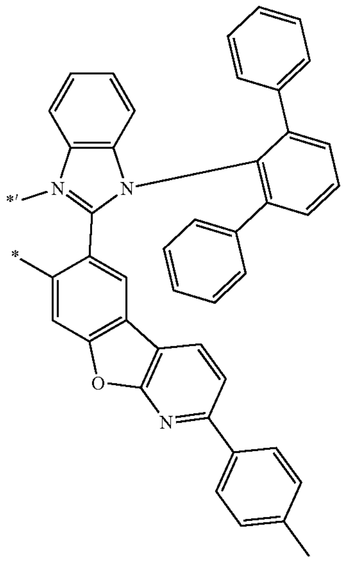
B470
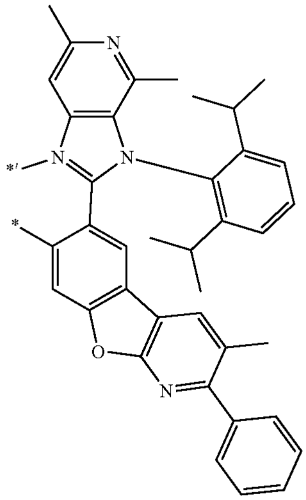
B471
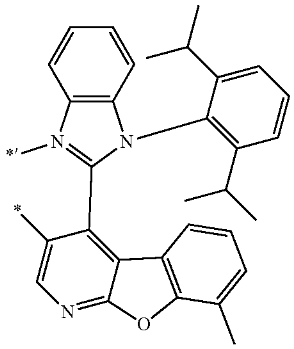
-continued
B472
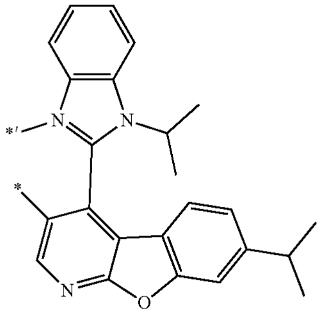
B473
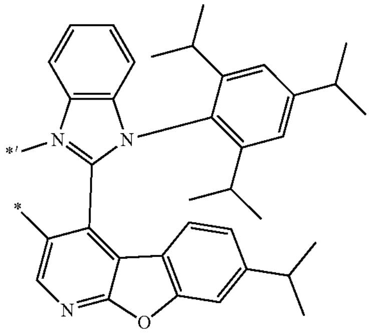
B474
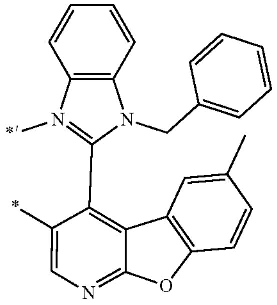
B475
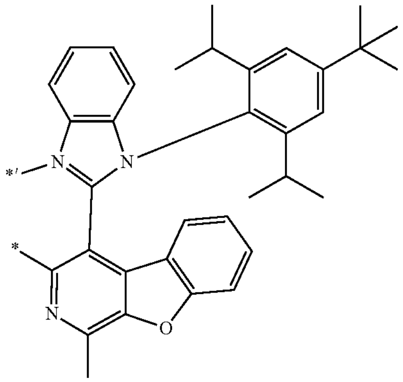

-continued
B476
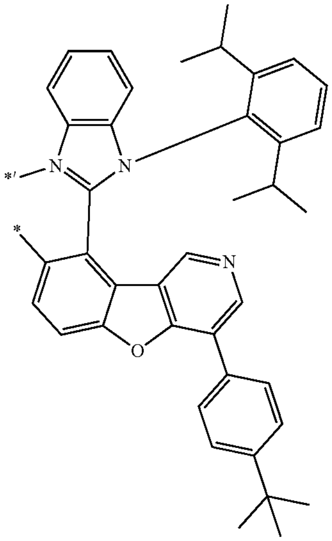
B477
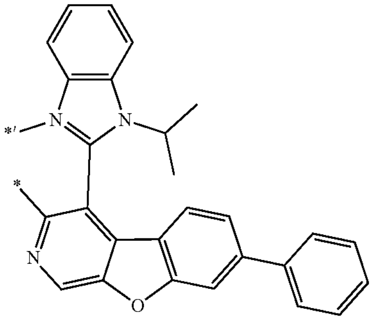
B478
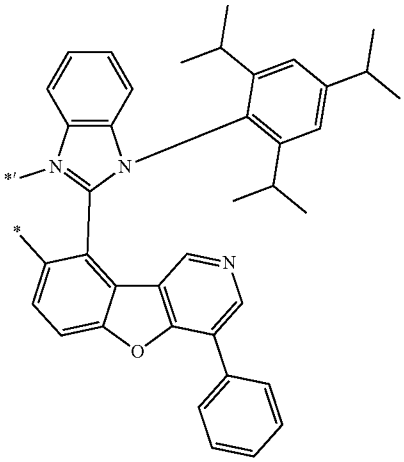
-continued
B479
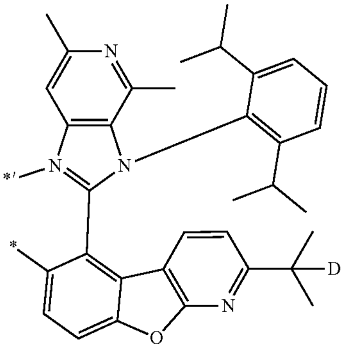
B480
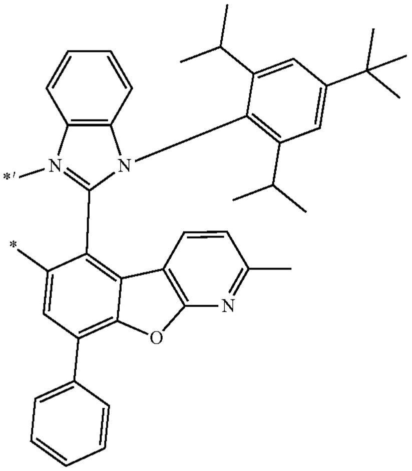
B481
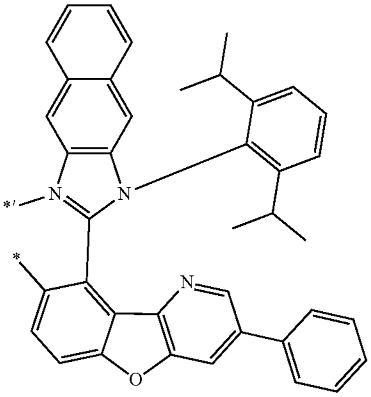
B482
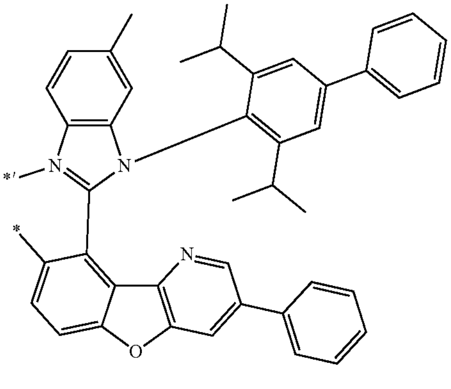

B483
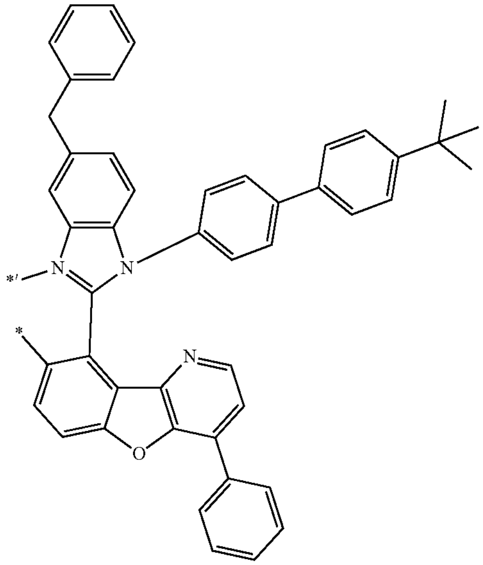
B484
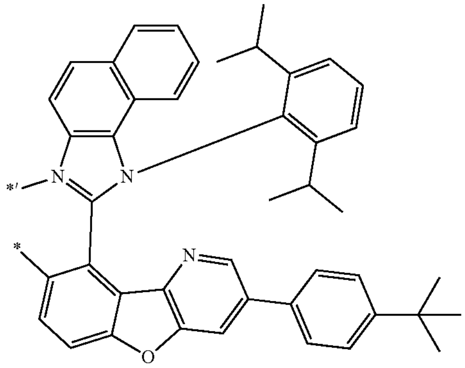
B485
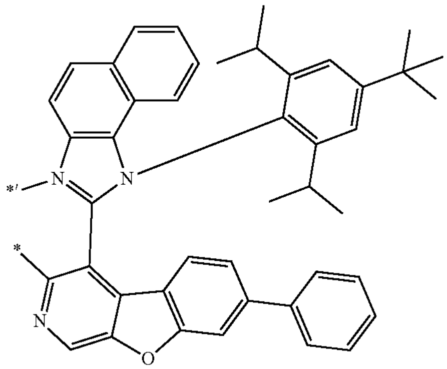
B486
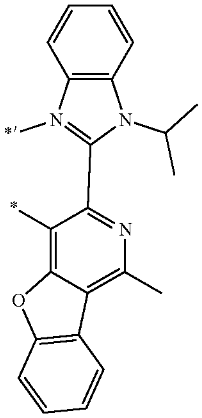
B487
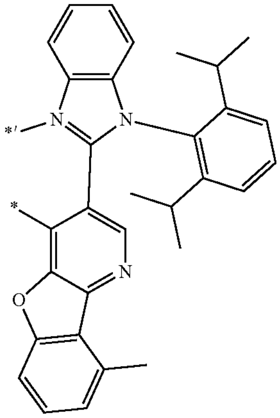
B488
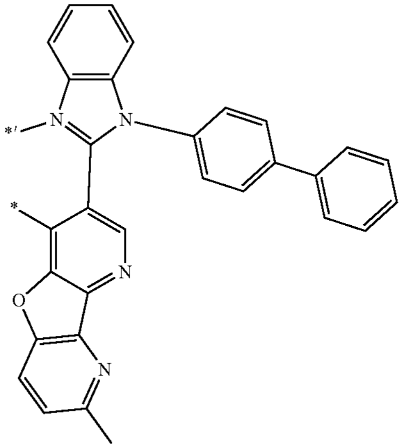

-continued
B489
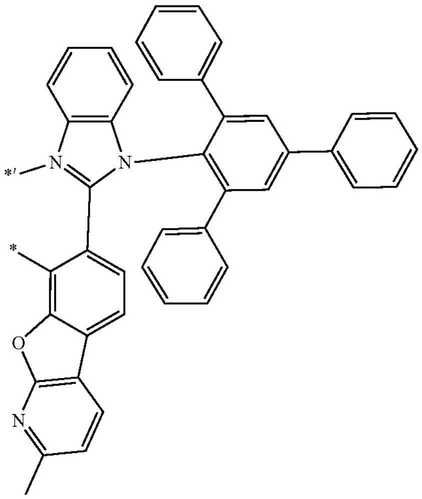
B490
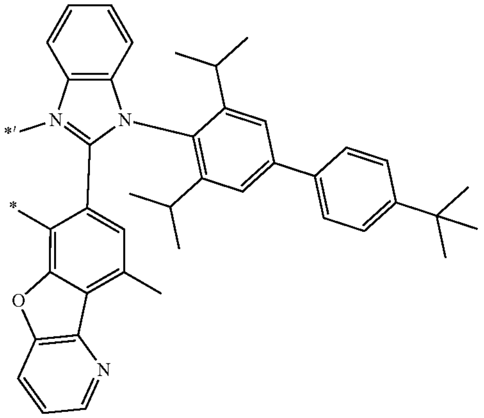
B491
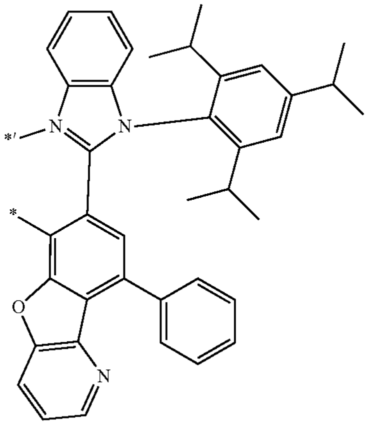
-continued
B492
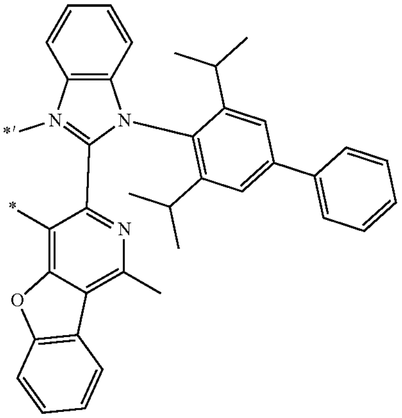
B493
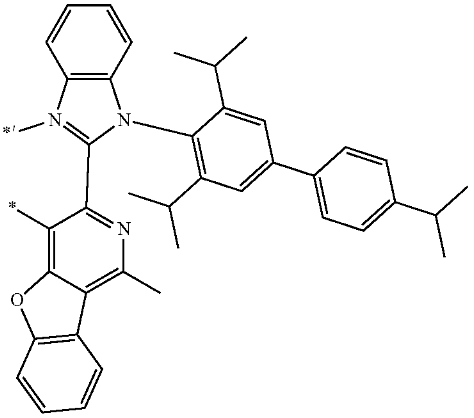
B494
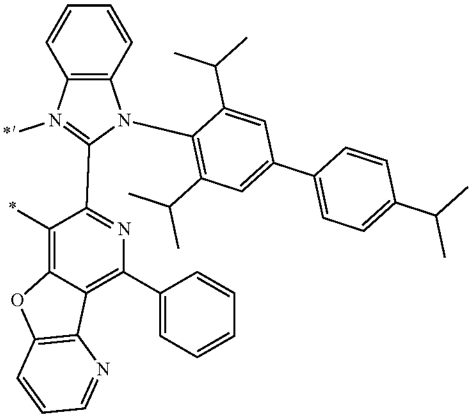

-continued
B495
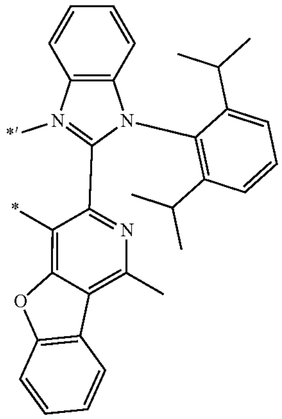
B496
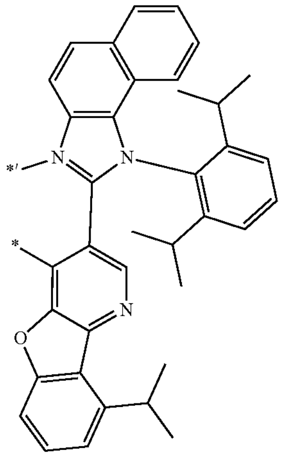
B497
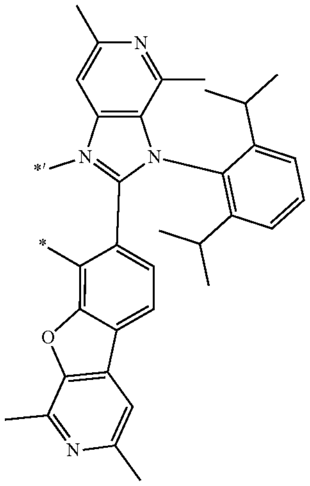
-continued
B498
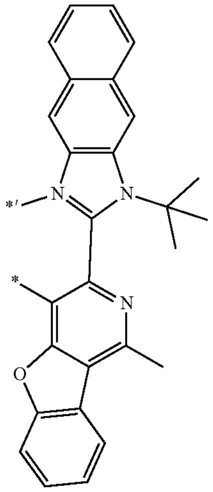
B499
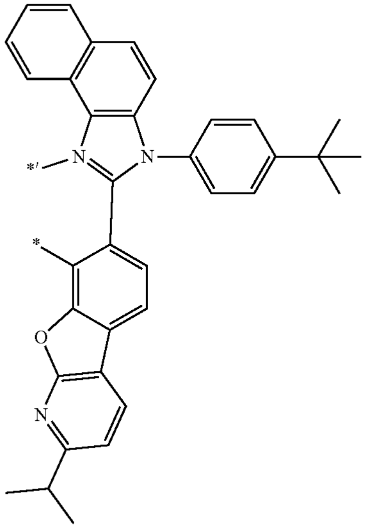
B500
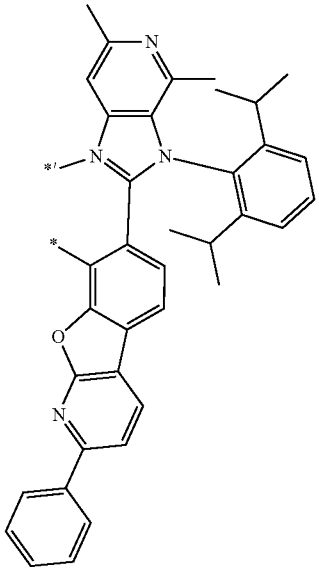

B501
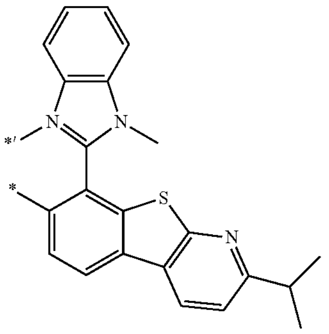
B502
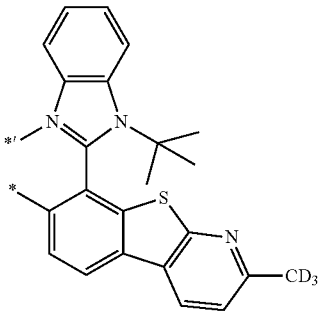
B503
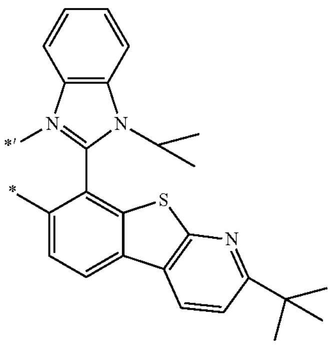
B504
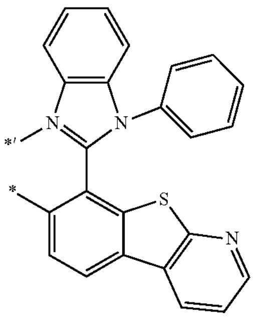
-continued
B505
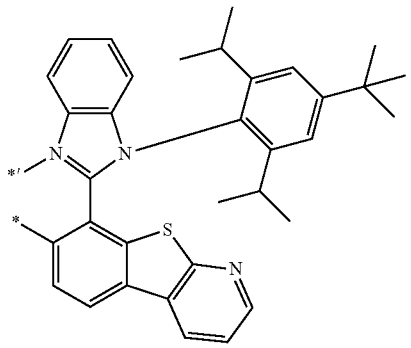
B506
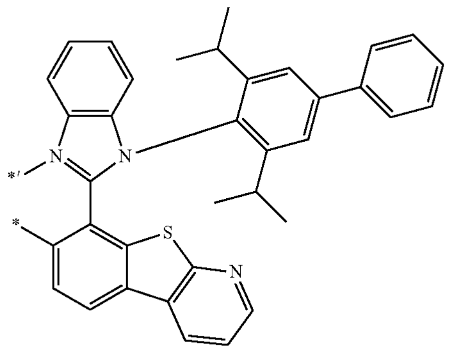
B507
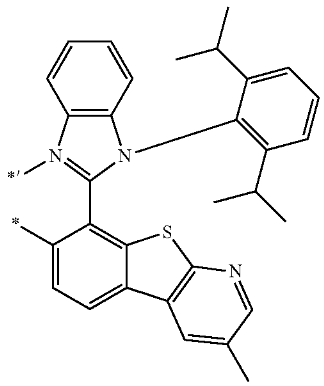
B508
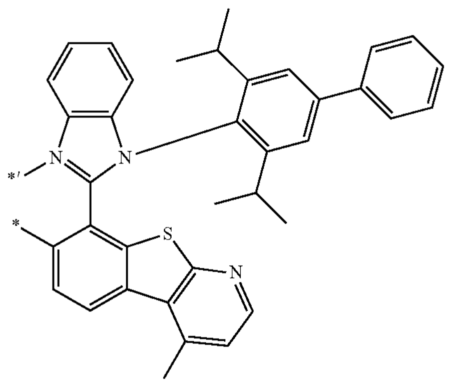

B509
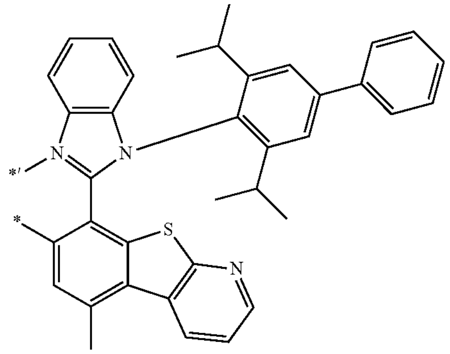
B510
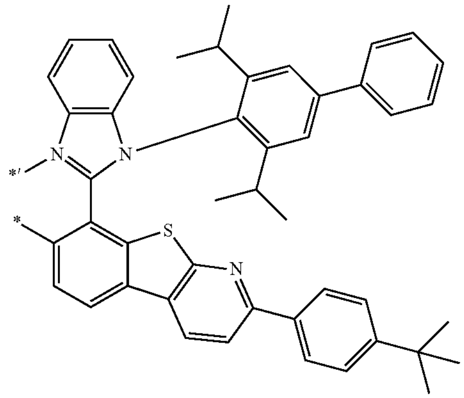
B511
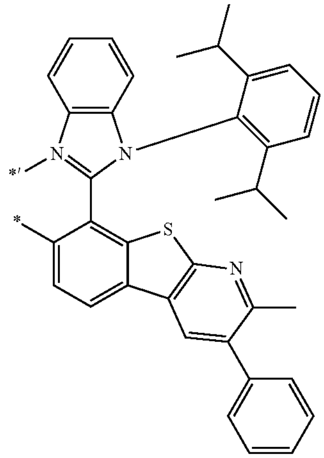
B512
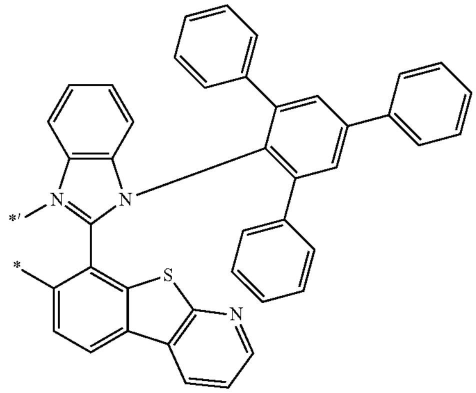
B513
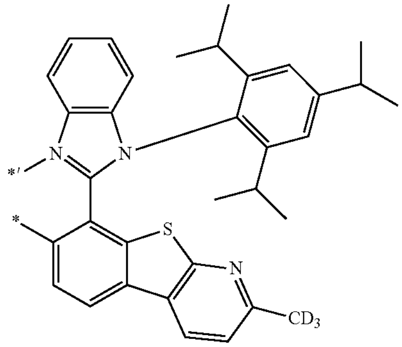
B514
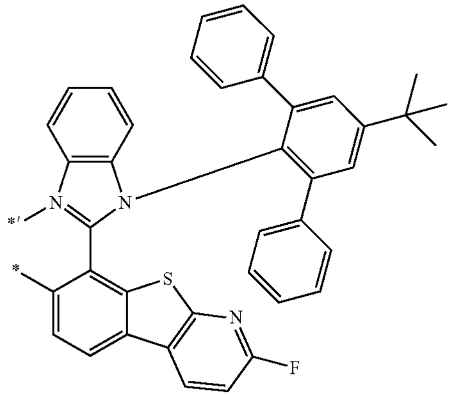
B515
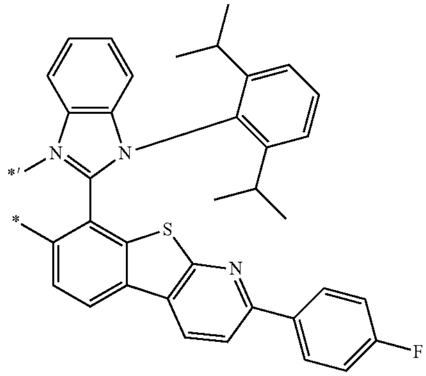
B516
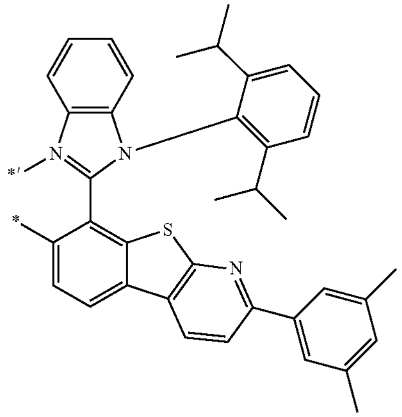

-continued
B517
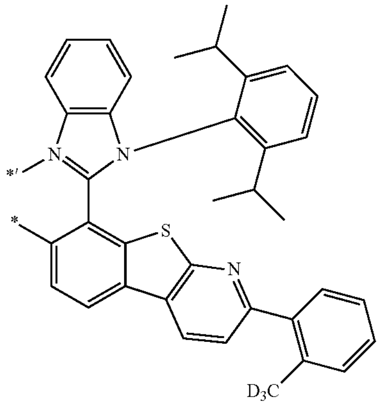
B518
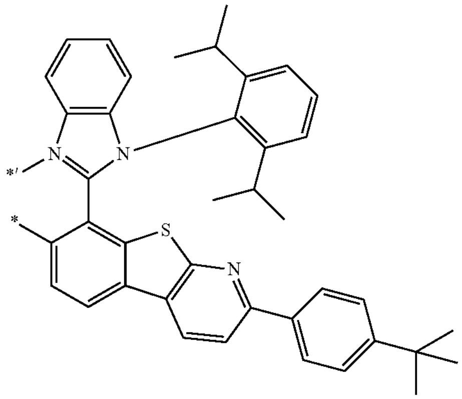
B519
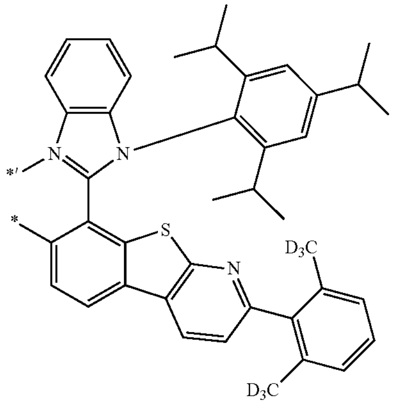
B520
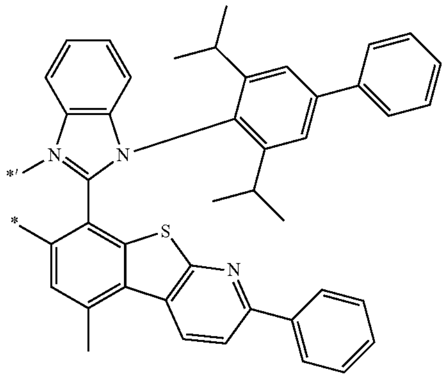
-continued
B521
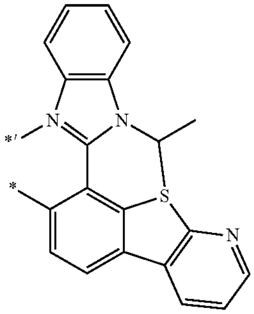
B522
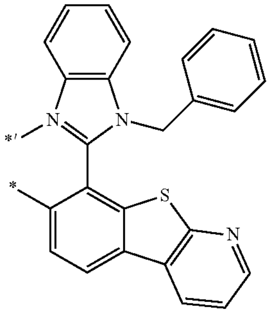
B523
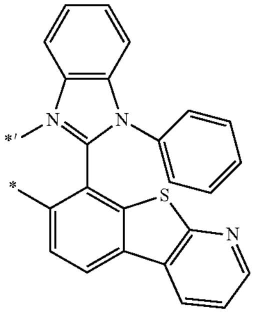
B524
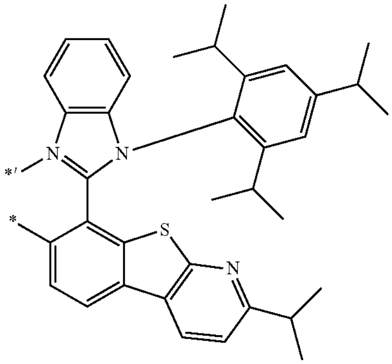
B525
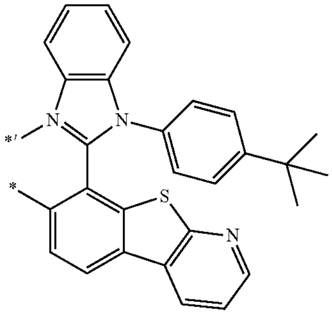

-continued
B526
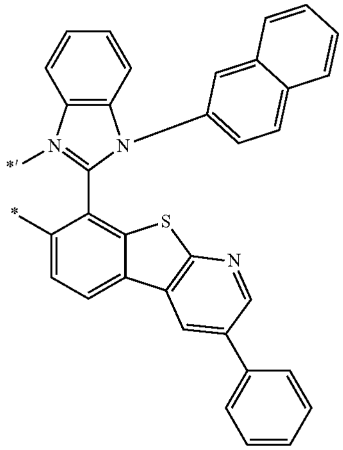
B527
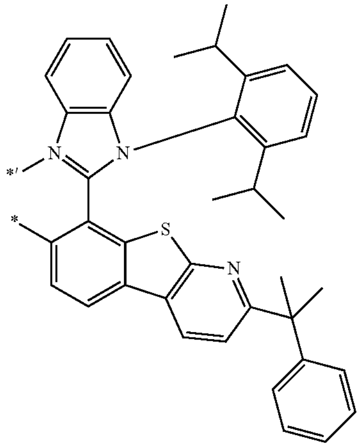
B528
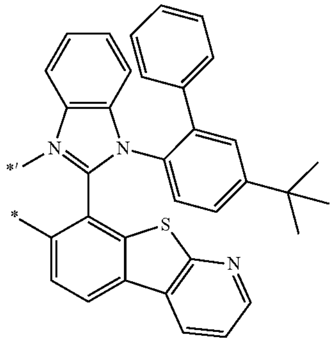
B529
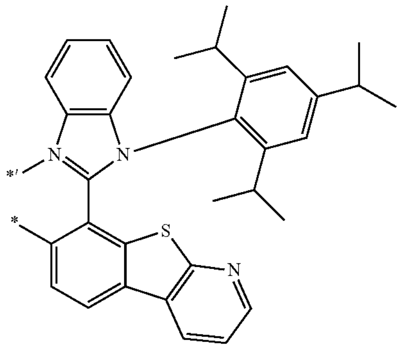
-continued
B530
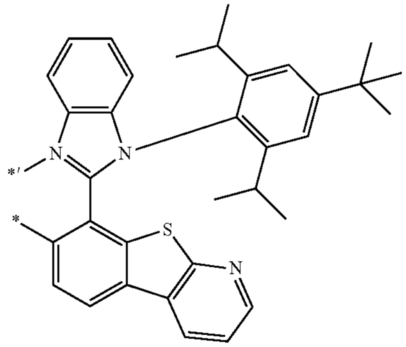
B531
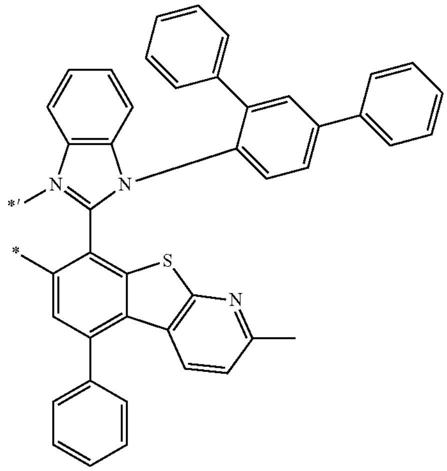
B532
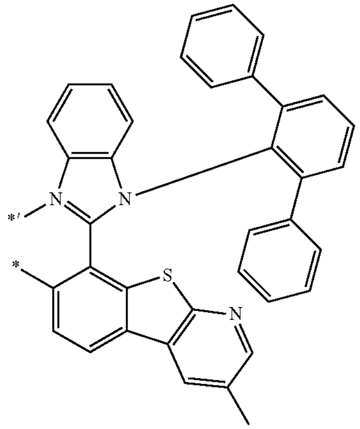
B533
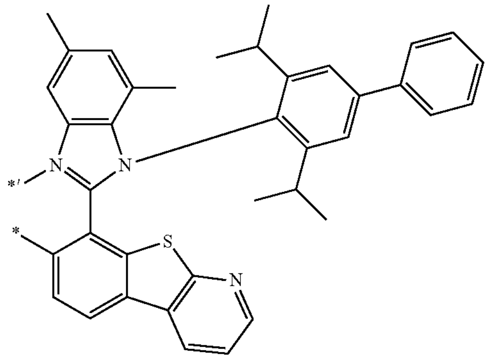

-continued
B534
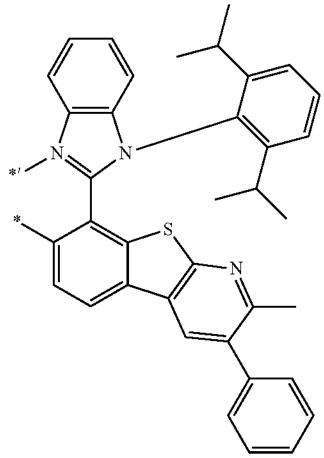
B535
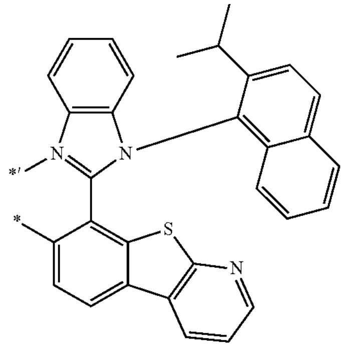
B536
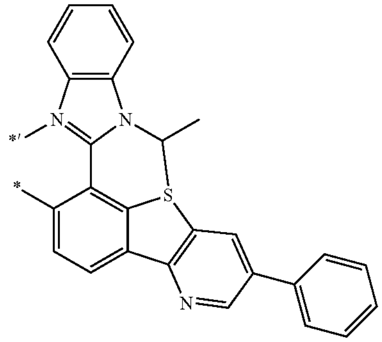
B537
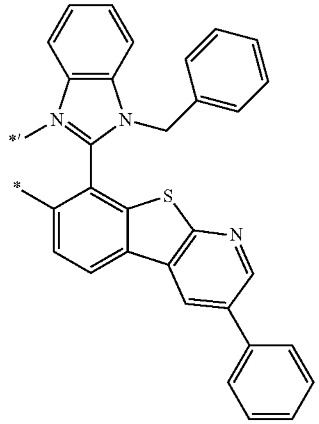
-continued
B538
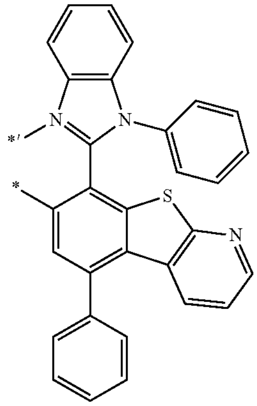
B539
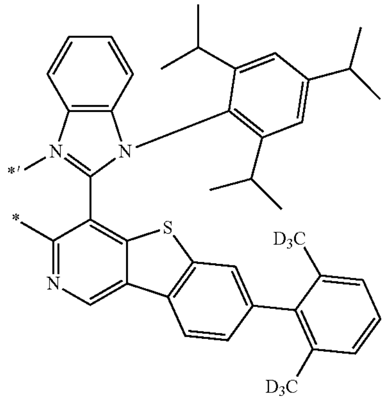
B540
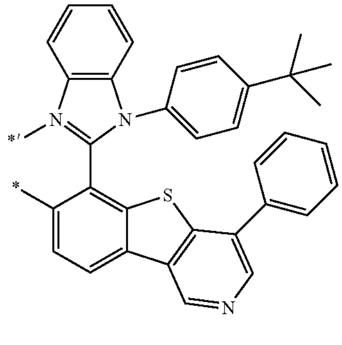
B541
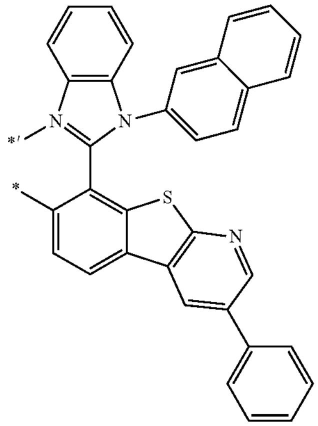

-continued
B542
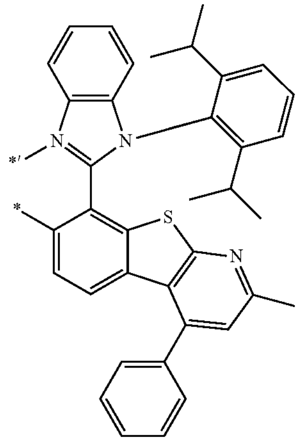
B543
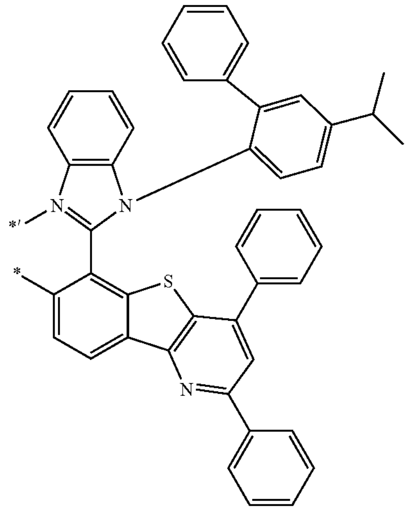
B544
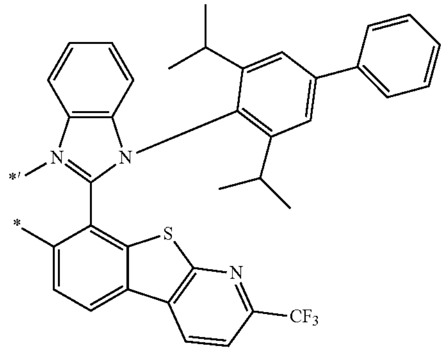
-continued
B545
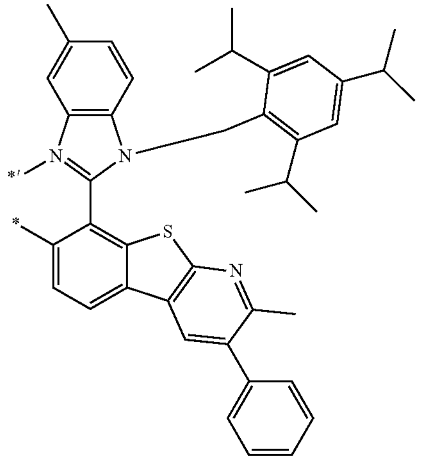
B546
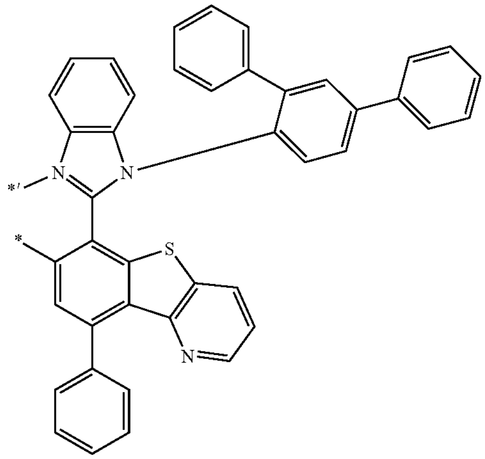
B547
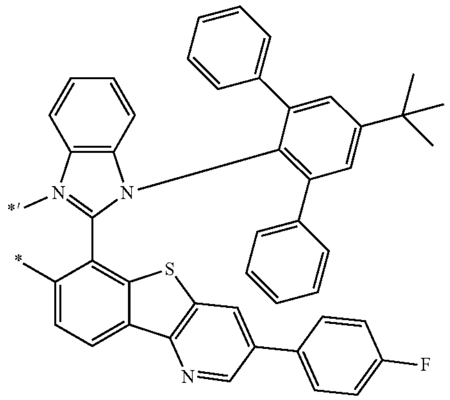

-continued
B548
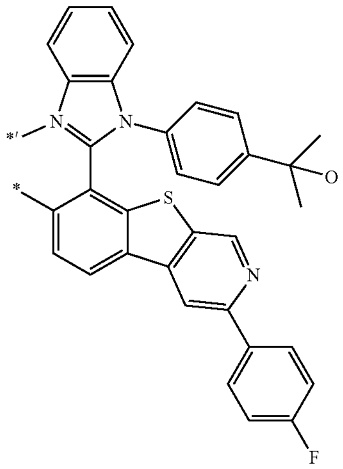
B549
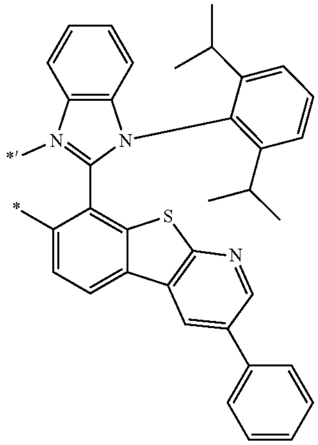
B550
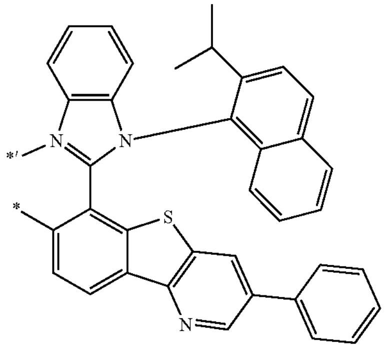
B551
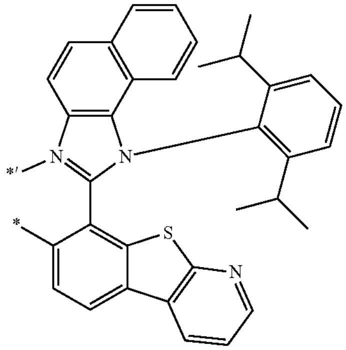
-continued
B552
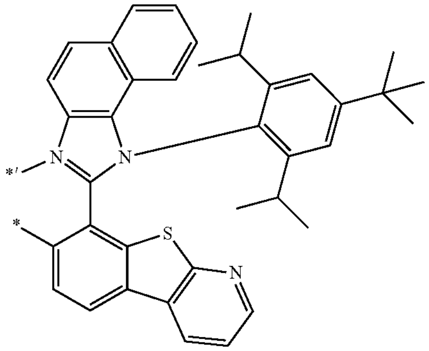
B553
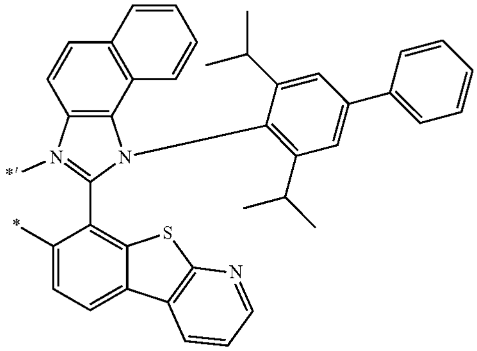
B554
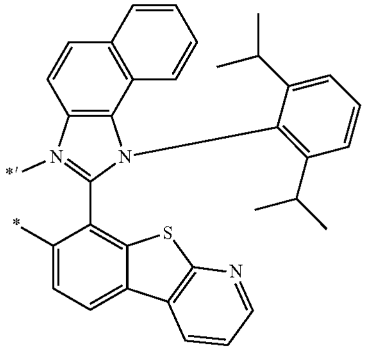
B555
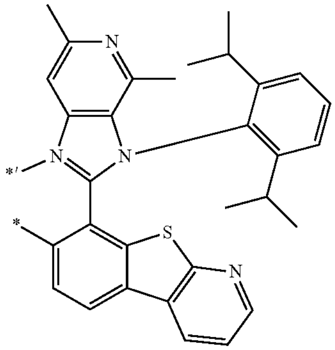

B556
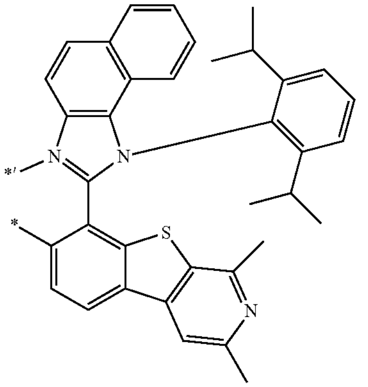
B557
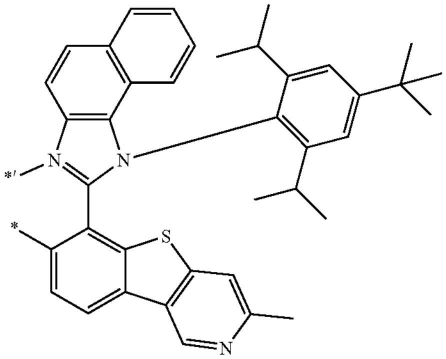
B558
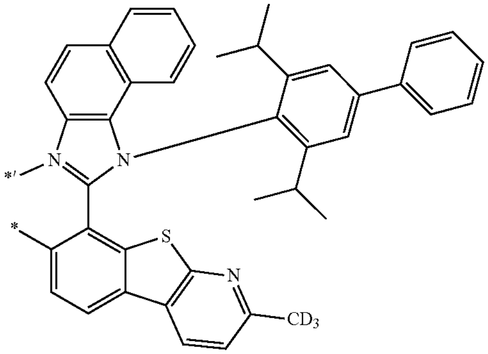
B559
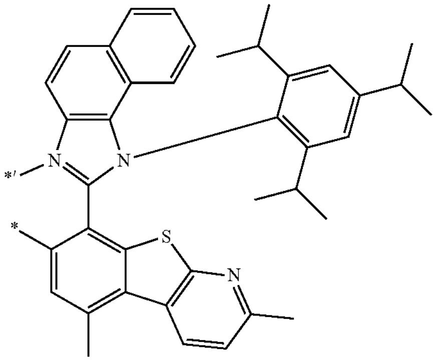
B560
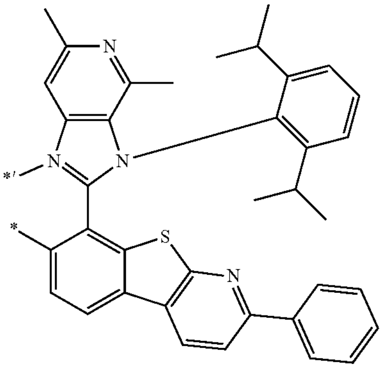
B561
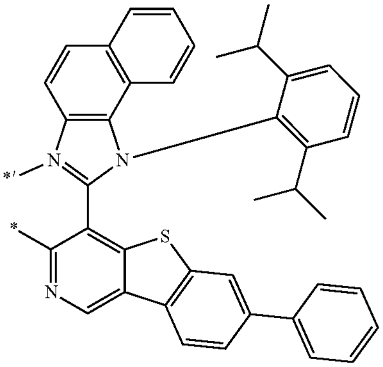
B562
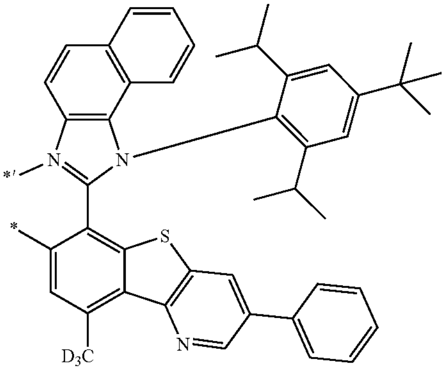
B563
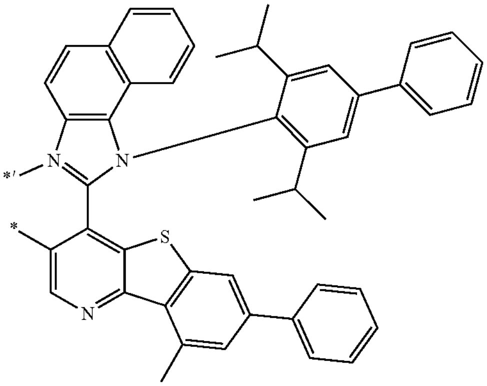

B564
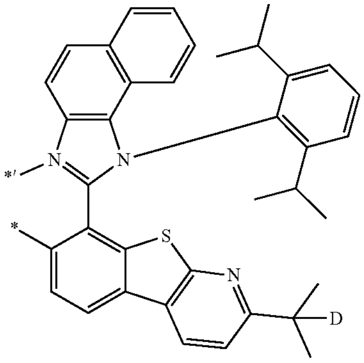
B565
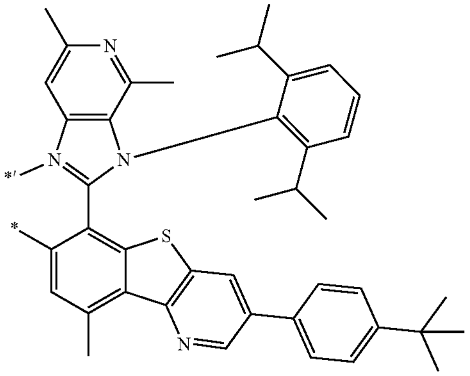
B566
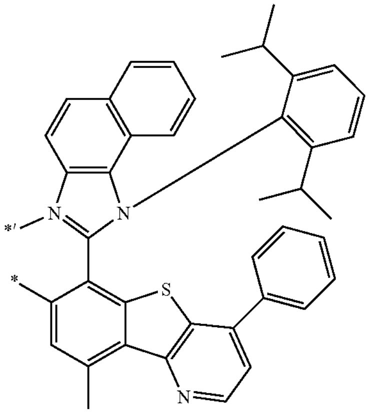
B567
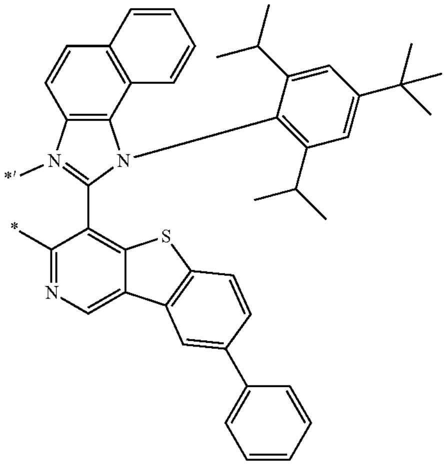
B568
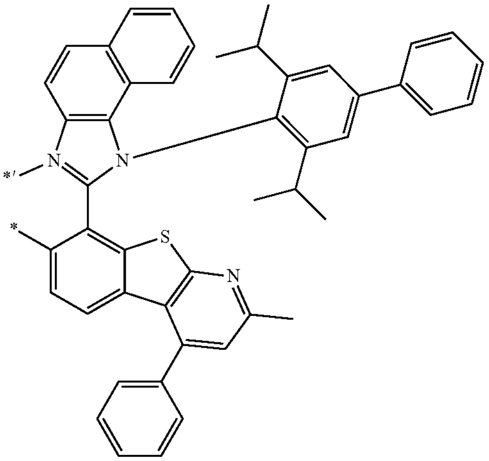
B569
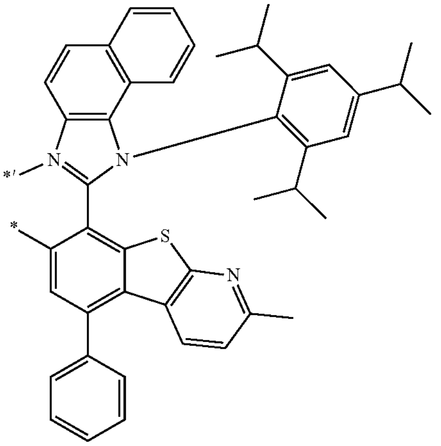
B570
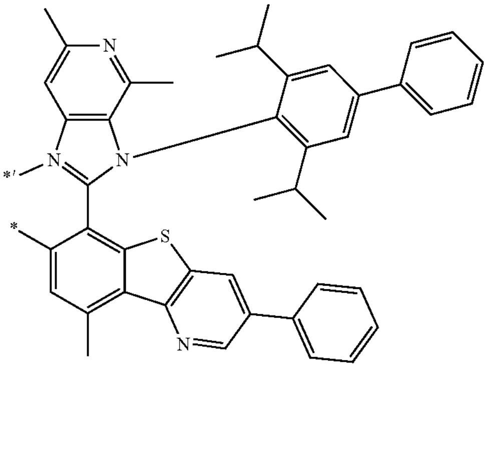

-continued
B571
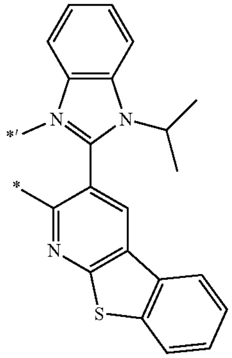
B572
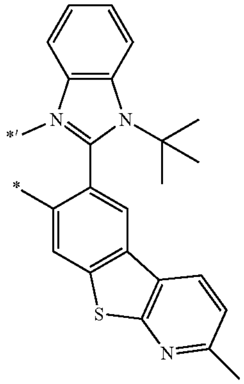
B573
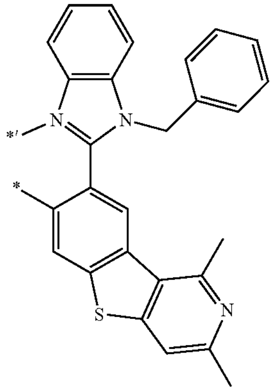
B574
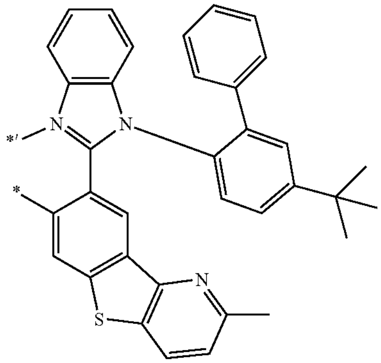
-continued
B575
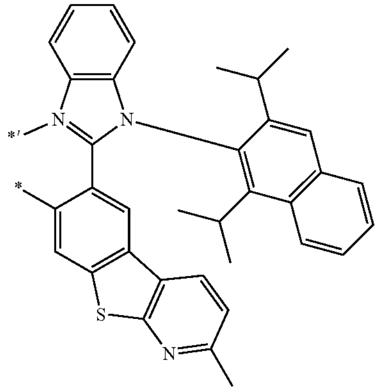
B576
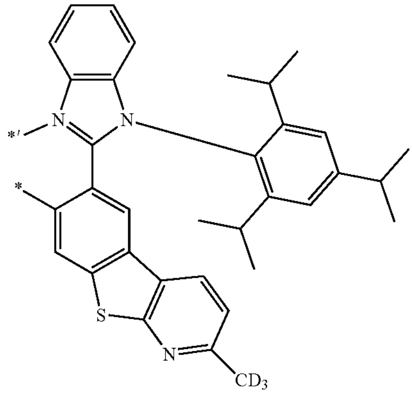
B577
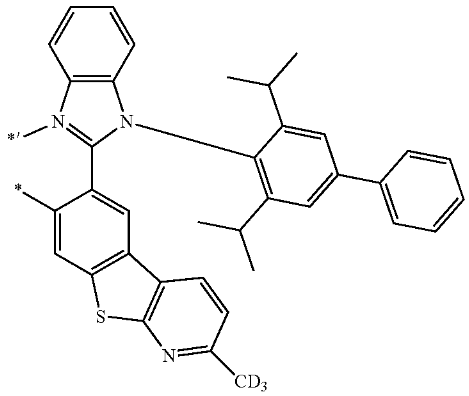
B578
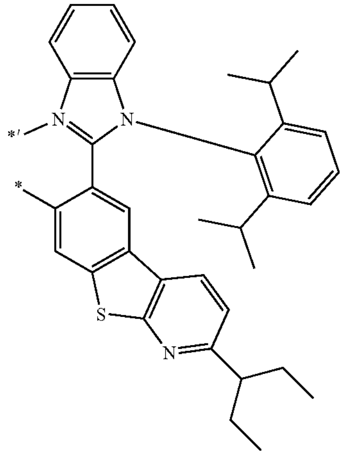

-continued
B579
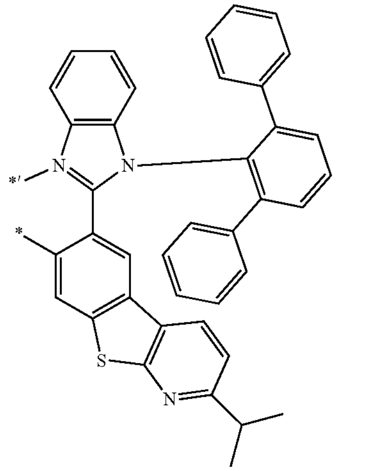
B580
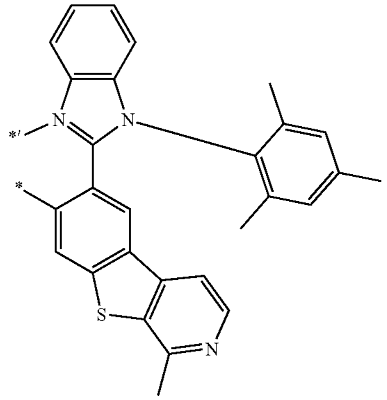
B581
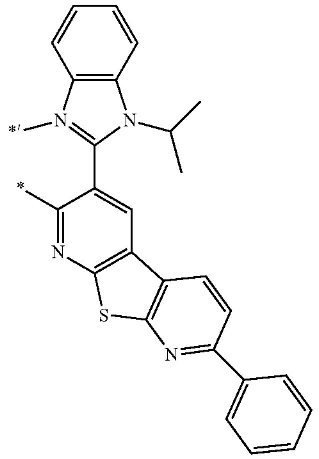
-continued
B582
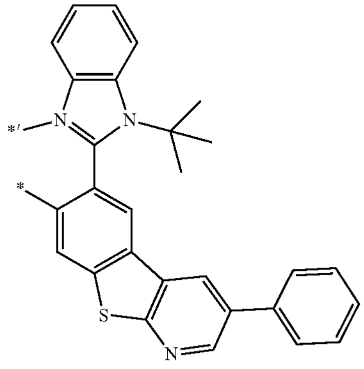
B583
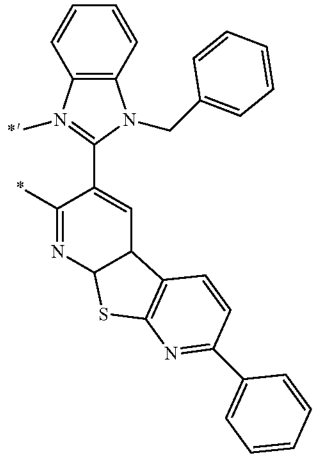
B584
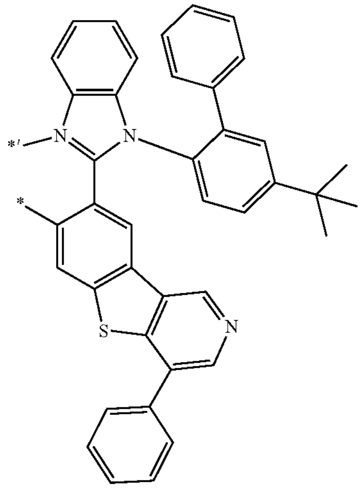

-continued
B585
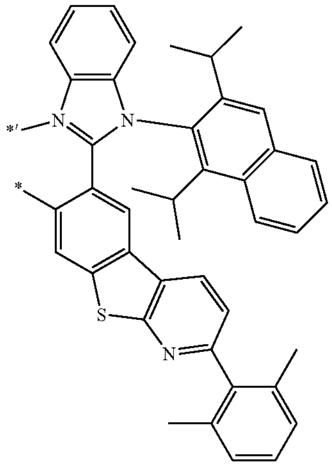
B586
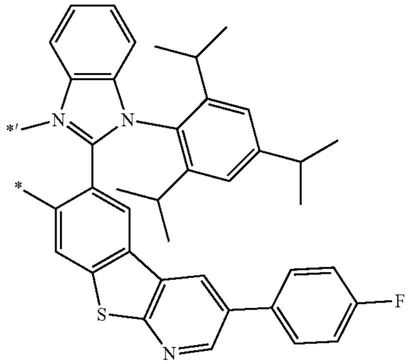
B587
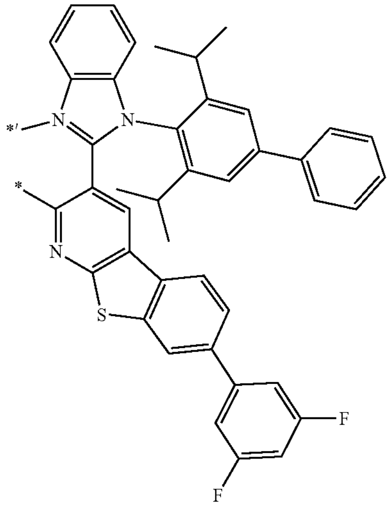
-continued
B588
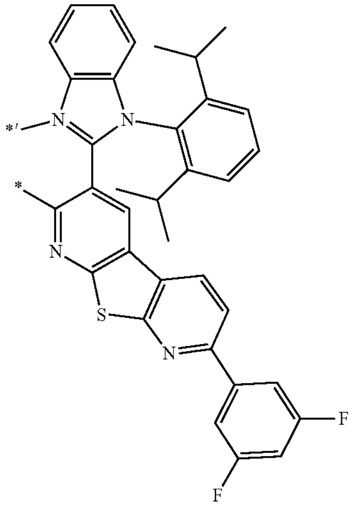
B589
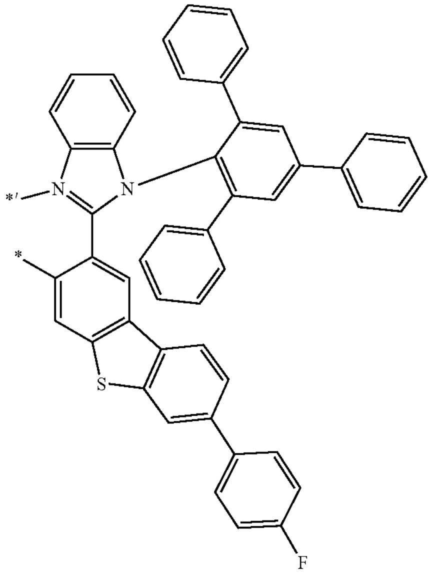
B590
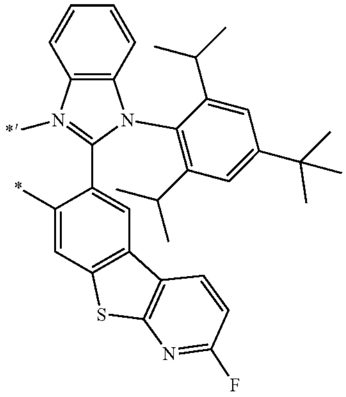

-continued
B591
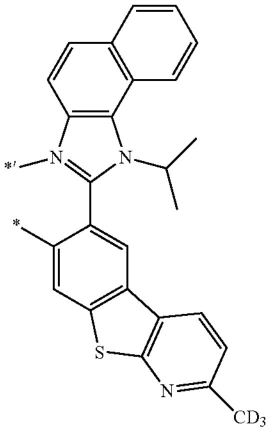
B592
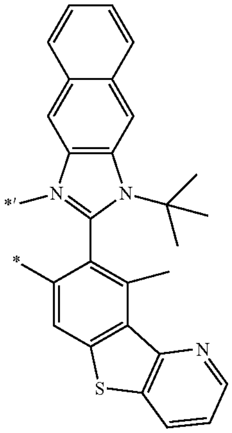
B593
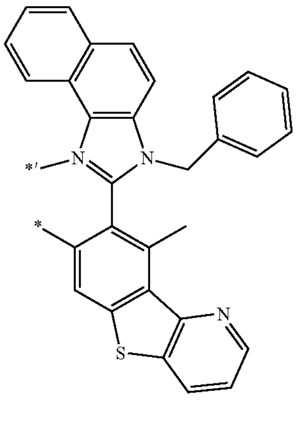
-continued
B594
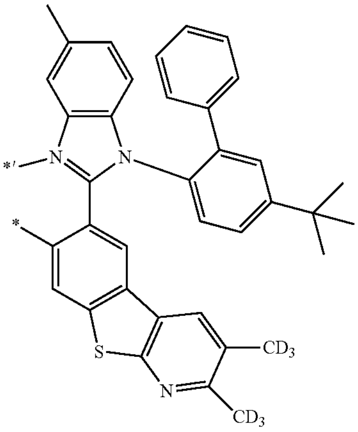
B595
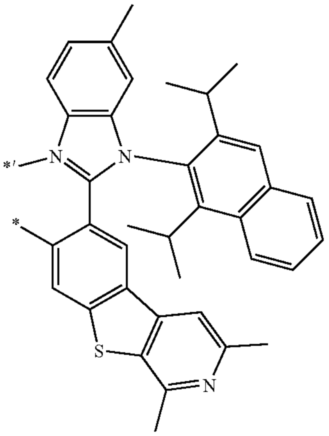
B596
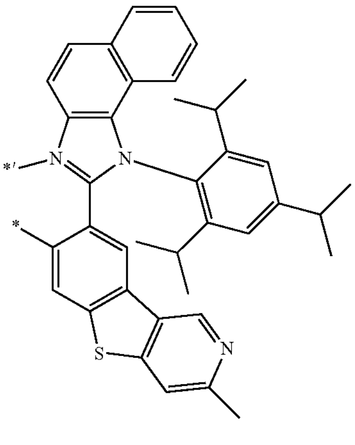

-continued
B597
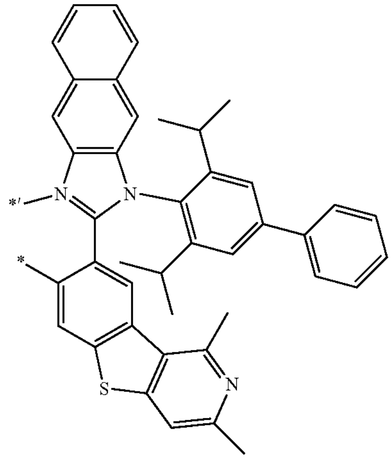
B598
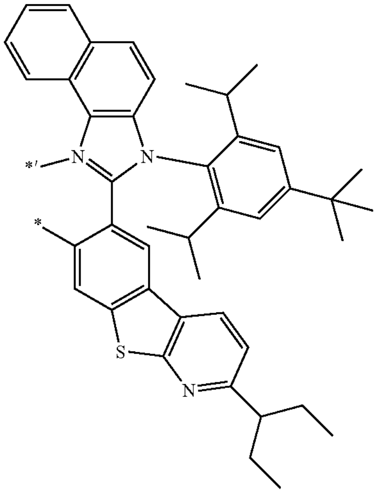
B599
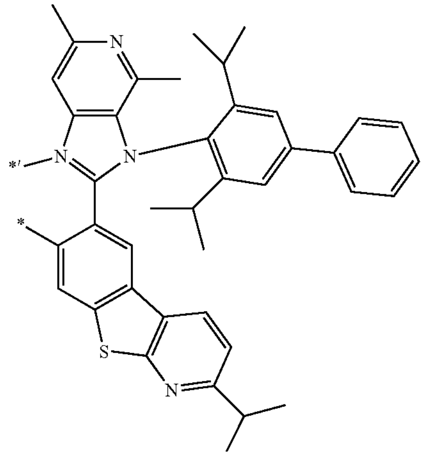
-continued
B600
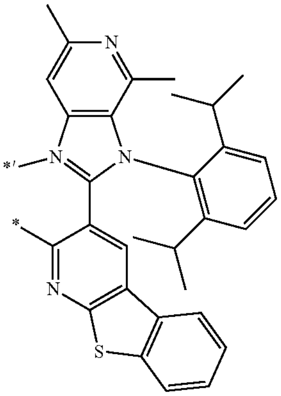
B601
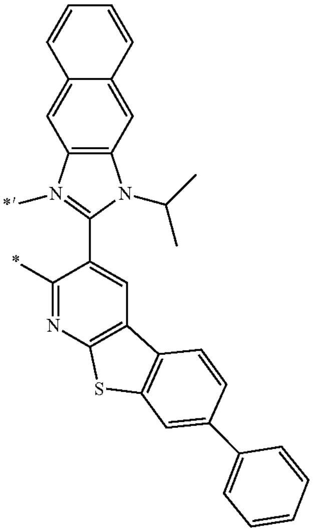
B602
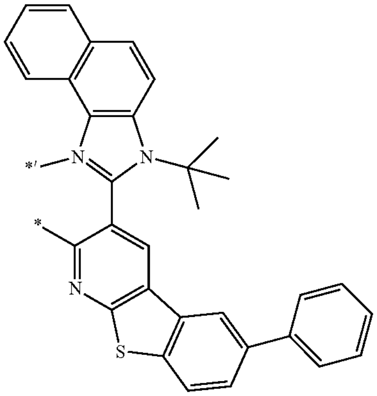

-continued
B603
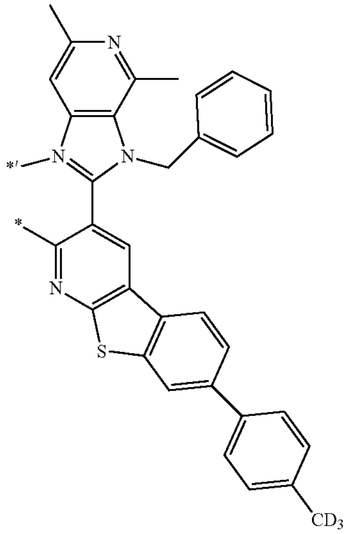
B604
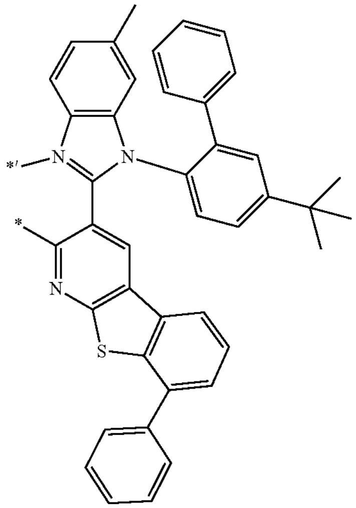
B605
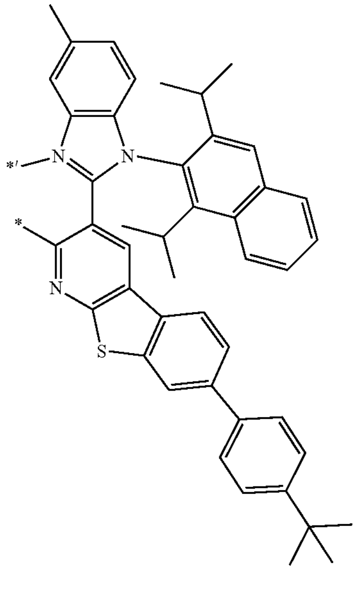
-continued
B606
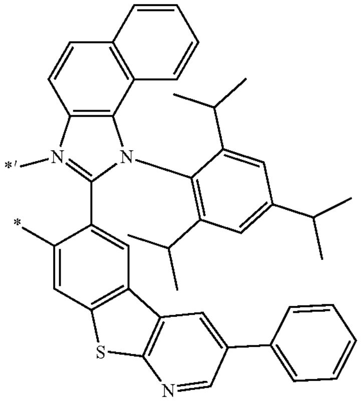
B607
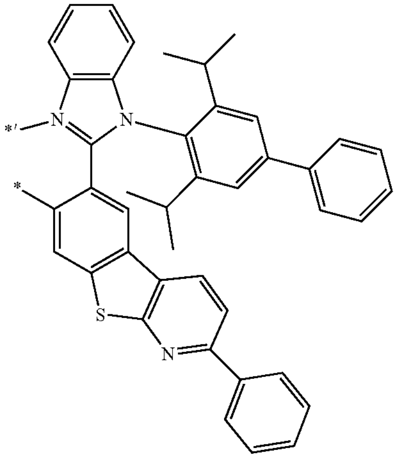
B608
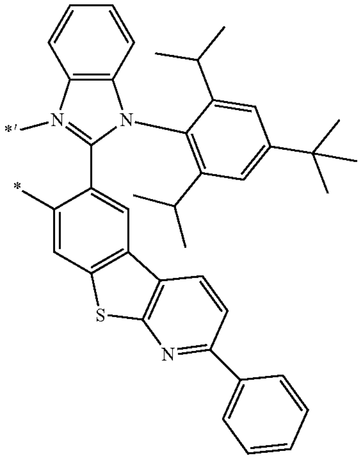

-continued
B609
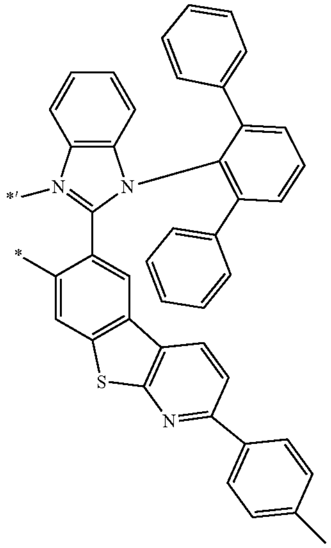
B610
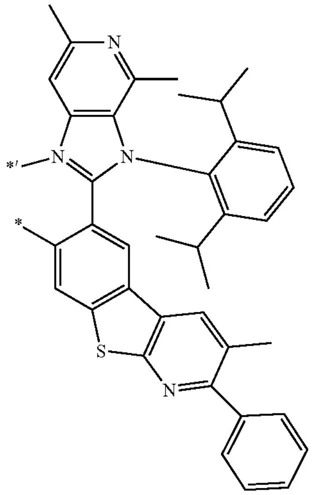
B611
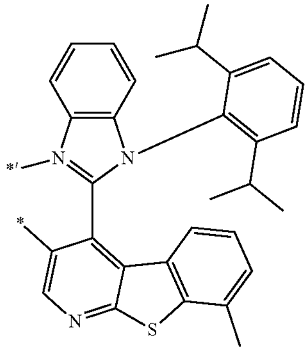
-continued
B612
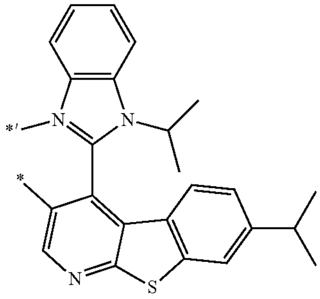
B613
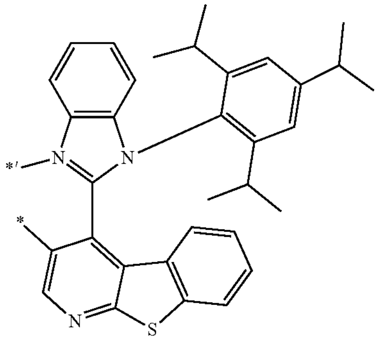
B614
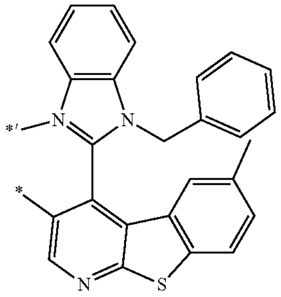
B615
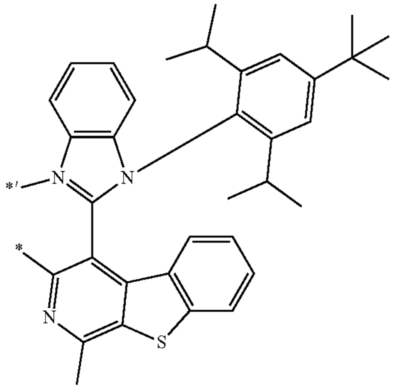

-continued
B616
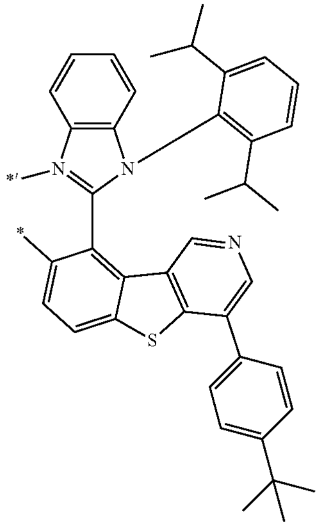
B617
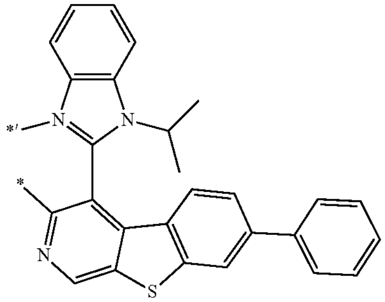
B618
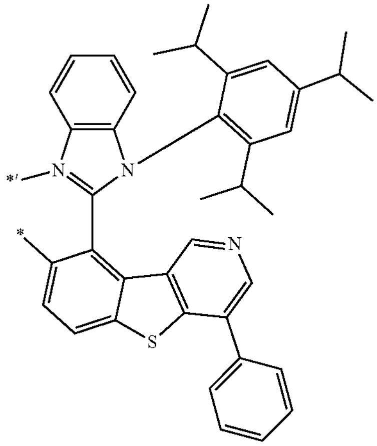
B619
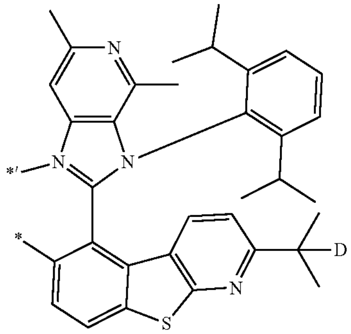
-continued
B620
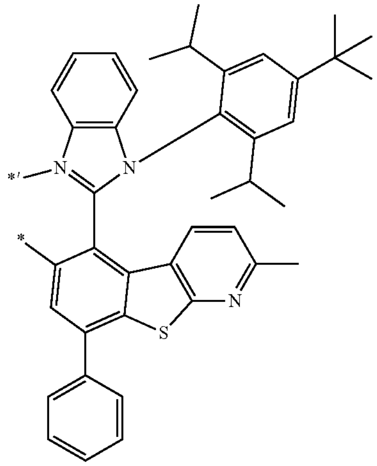
B621
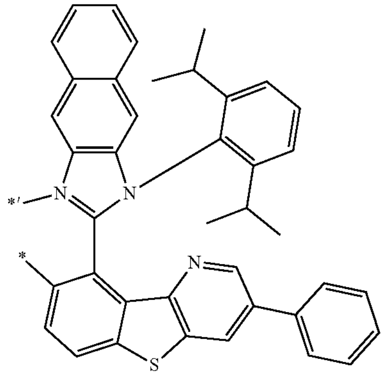
B622
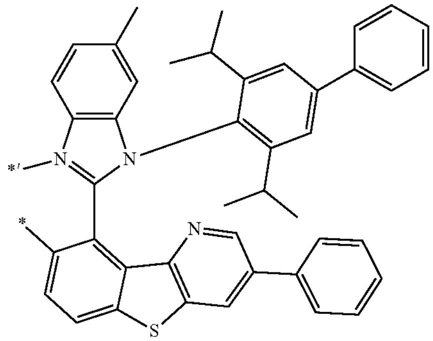

-continued
B623
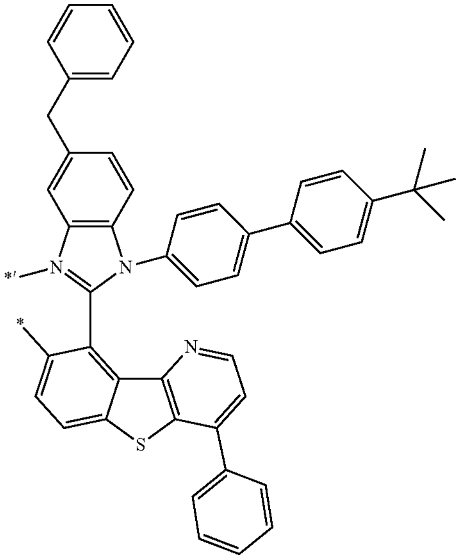
B624
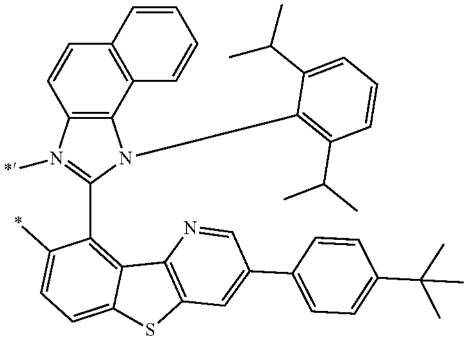
B625
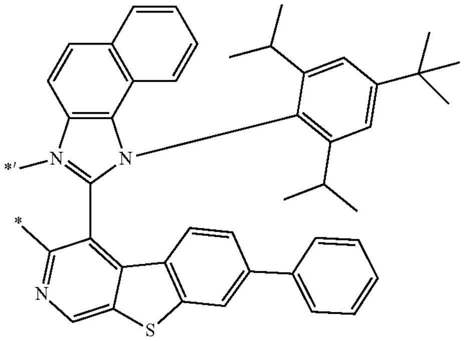
-continued
B626
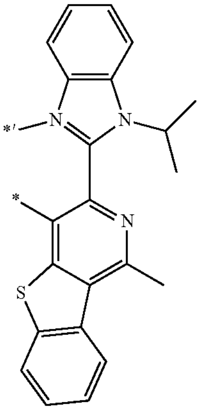
B627
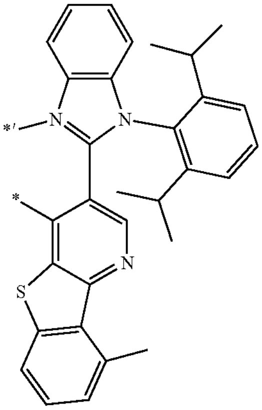
B628
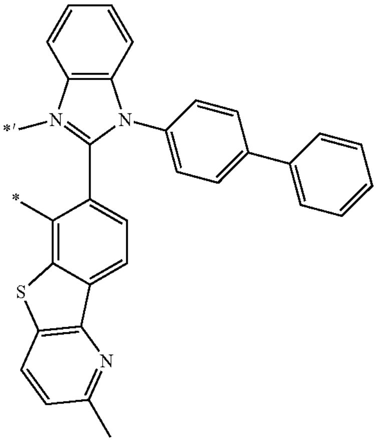

-continued
B629
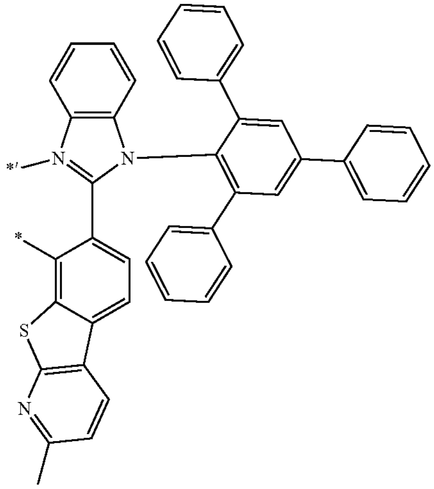
B630
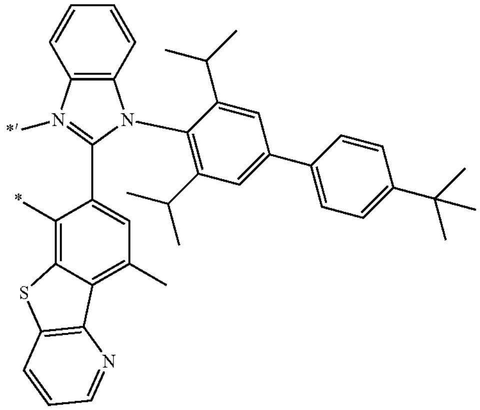
B631
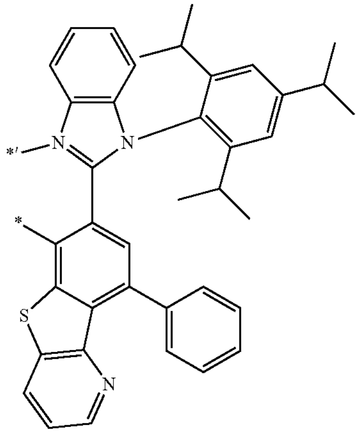
-continued
B632
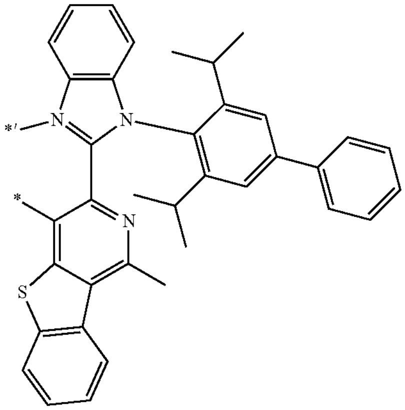
B633
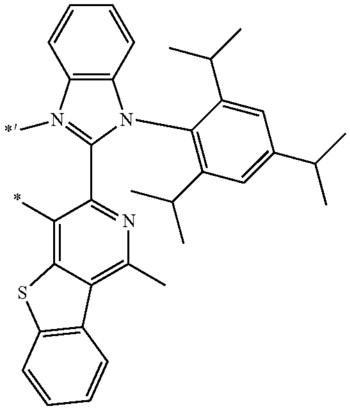
B634
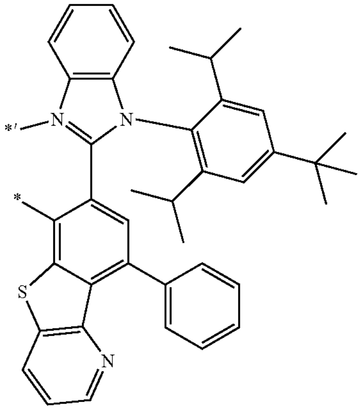
B635
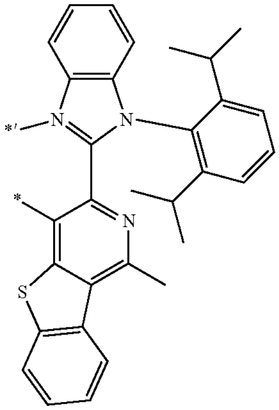

-continued
B636
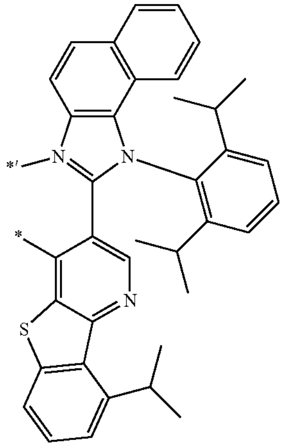
B637
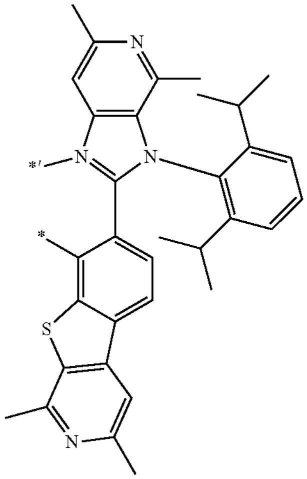
B638
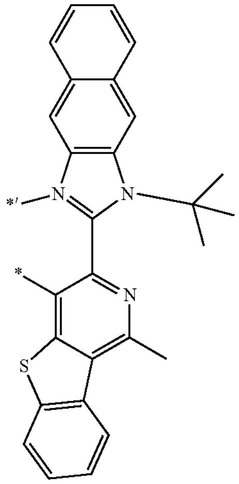
-continued
B639
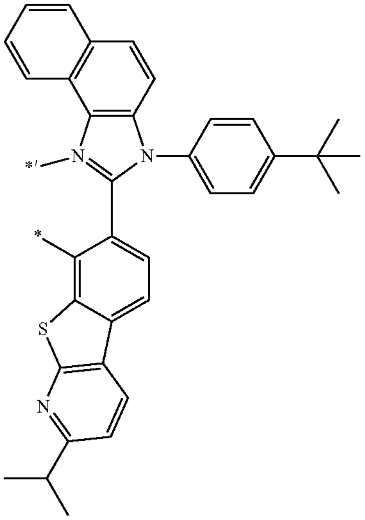
B640
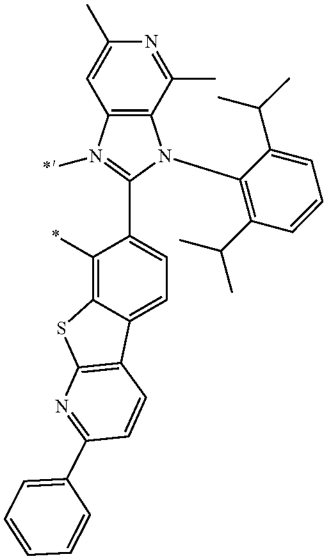
B641
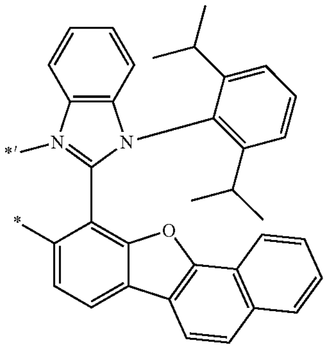

-continued
B642
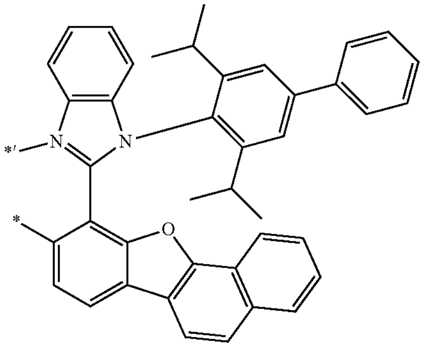
B643
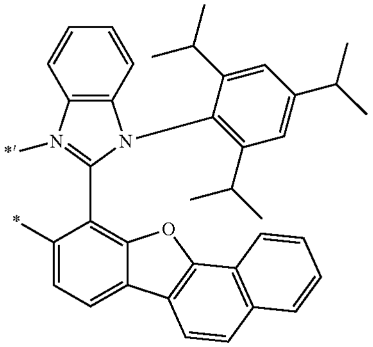
B644
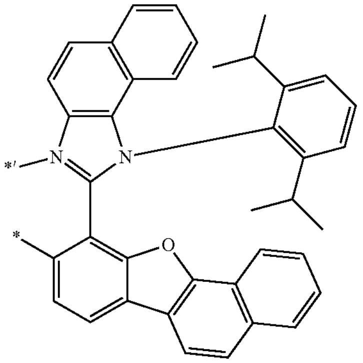
B645
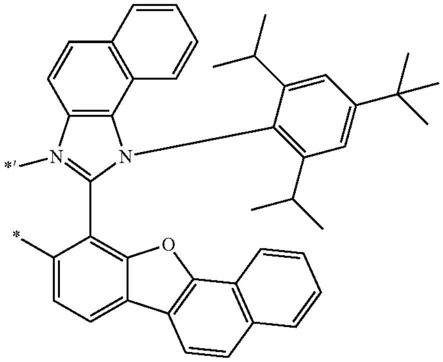
-continued
B646
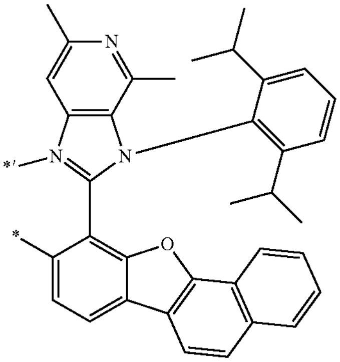
B647
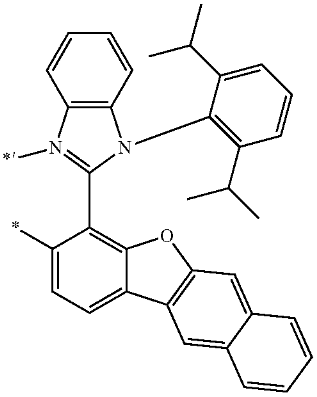
B648
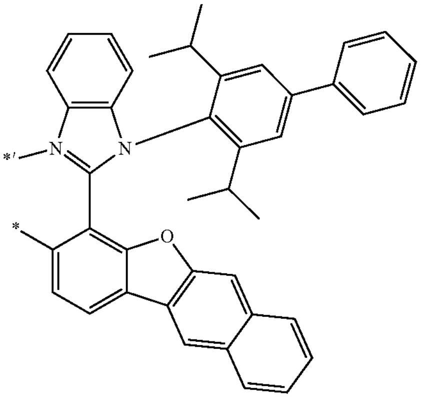
B649
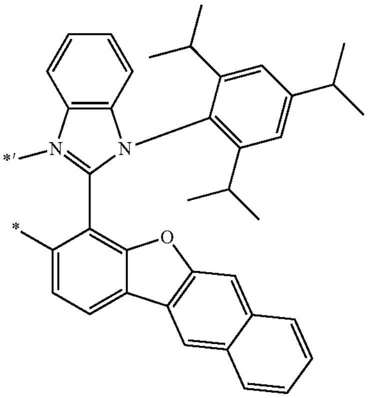

-continued
B650
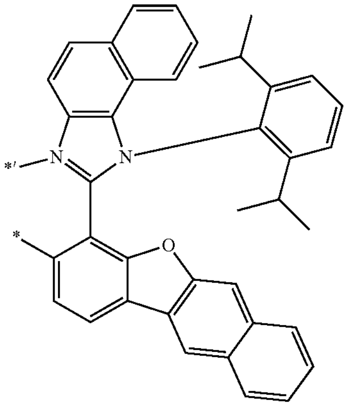
B651
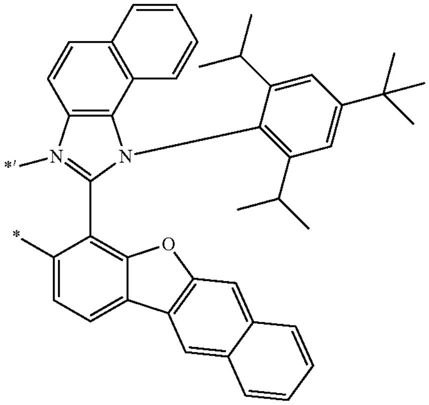
B652
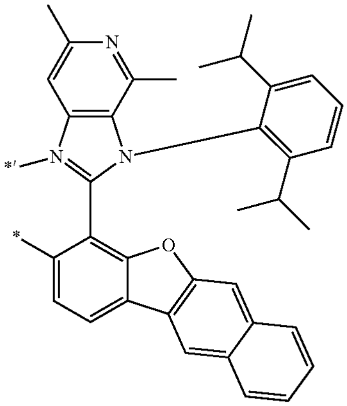
B653
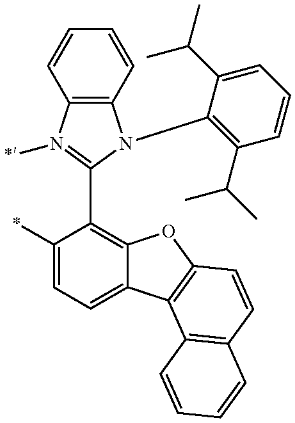
-continued
B654
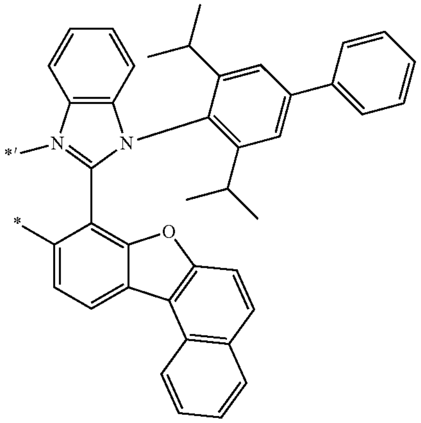
B655
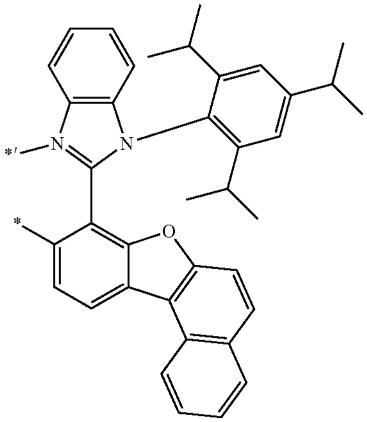
B656
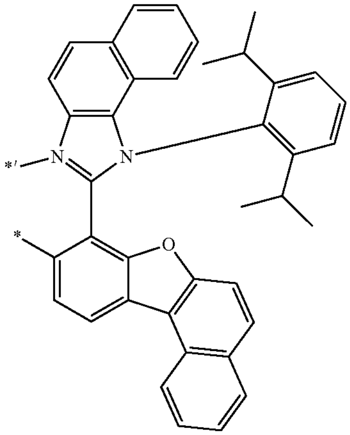

-continued
B657
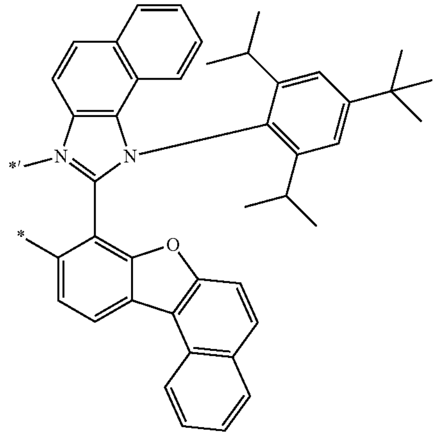
B658
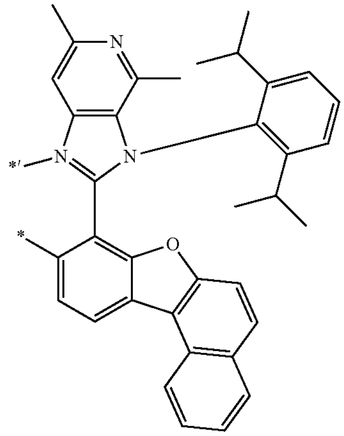
B659
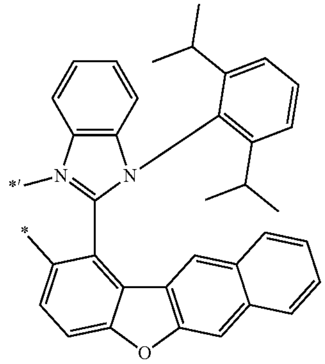
B660
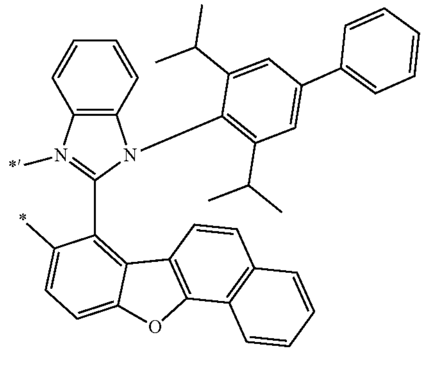
B661
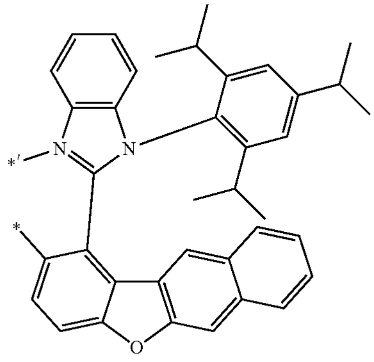
B662
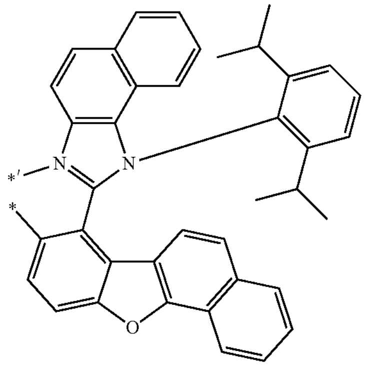
B663
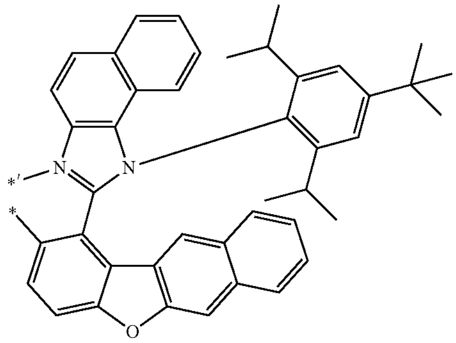
B664
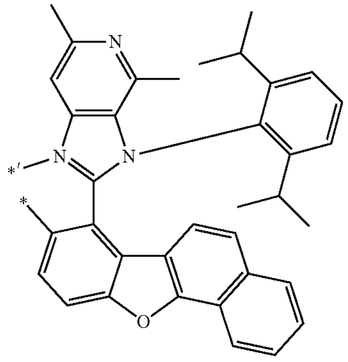

-continued
B665
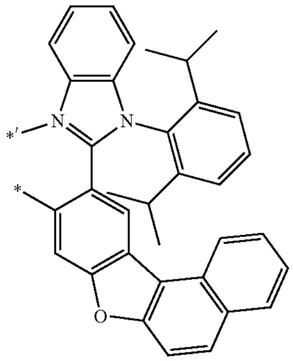
B666
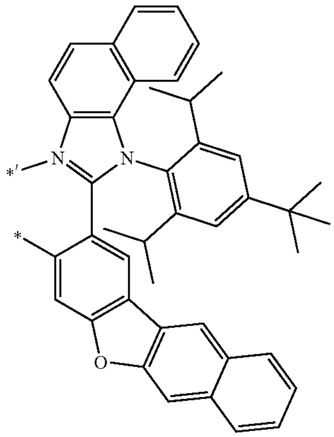
B667
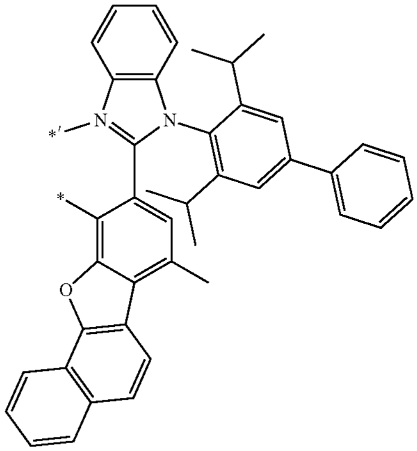
-continued
B668
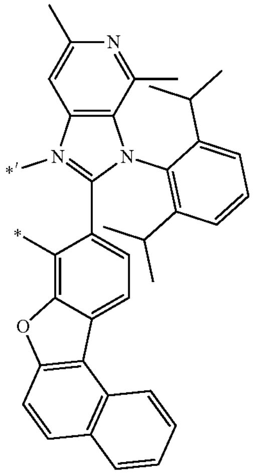
B669
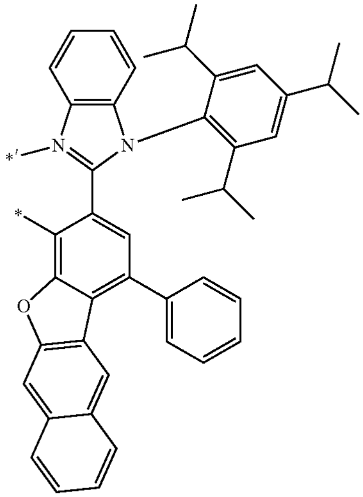
B670
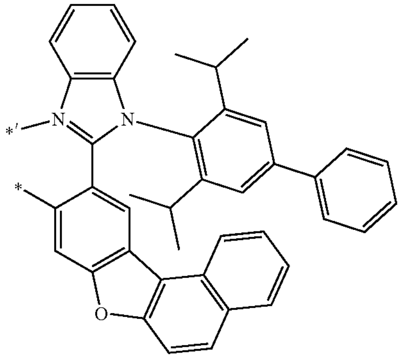

-continued
B671
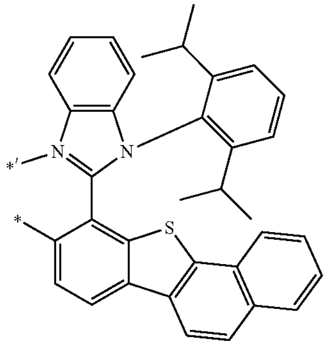
B672
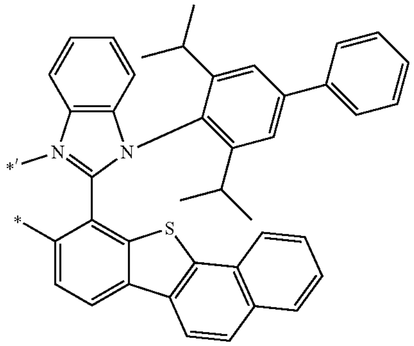
B673
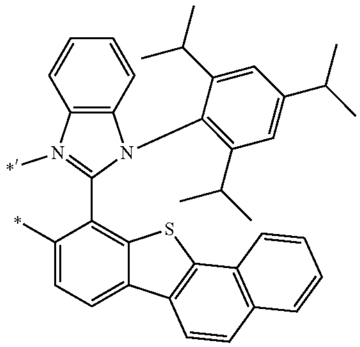
B674
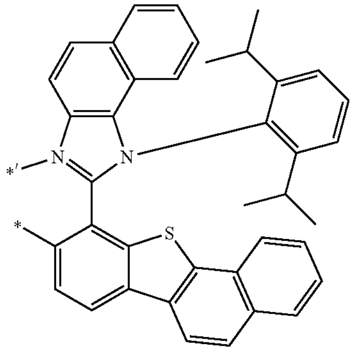
-continued
B675
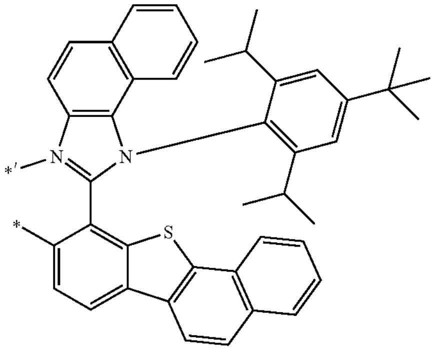
B676
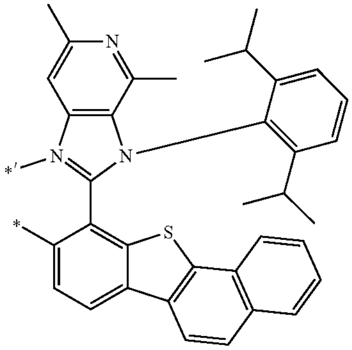
B677
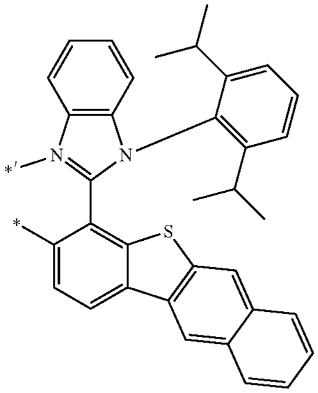
B678
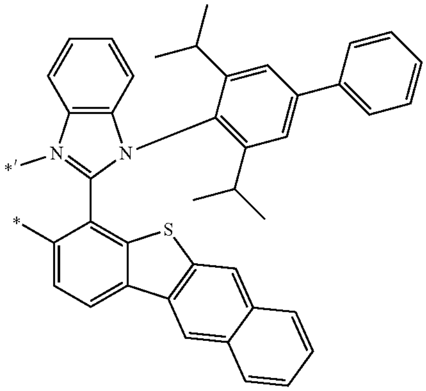

-continued
B679
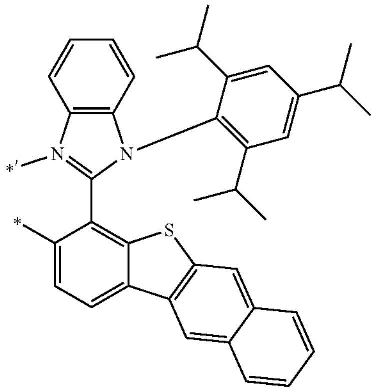
B680
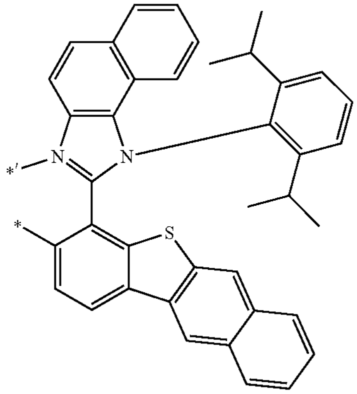
B681
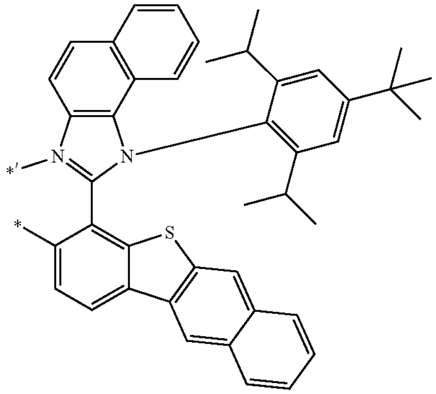
B682
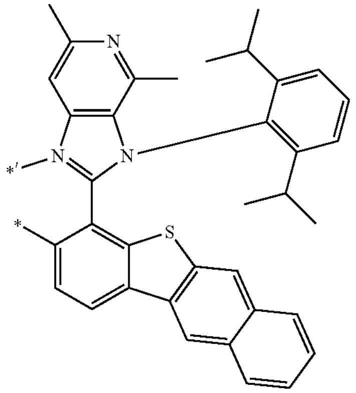
-continued
B683
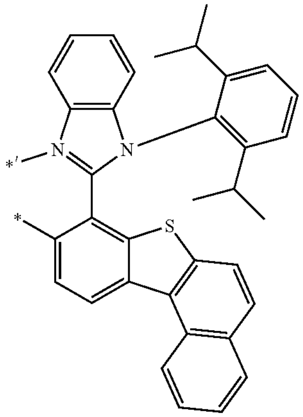
B684
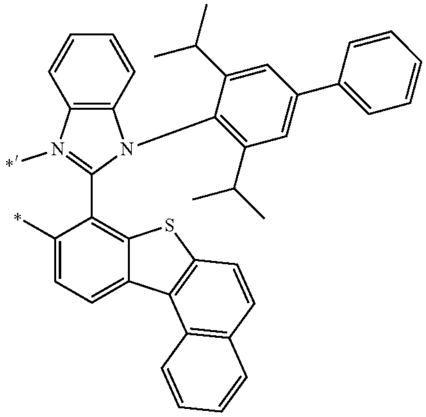
B685
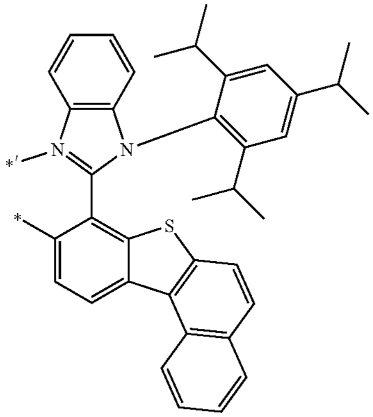

-continued
B686
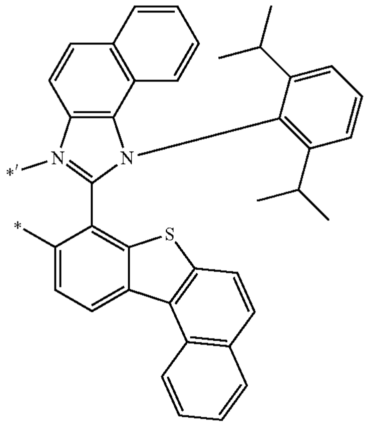
B687
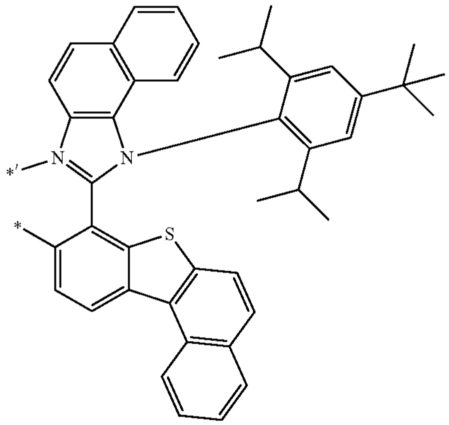
B688
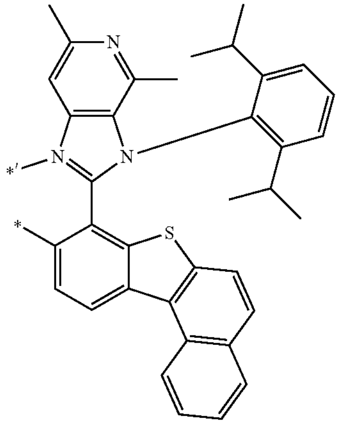
B689
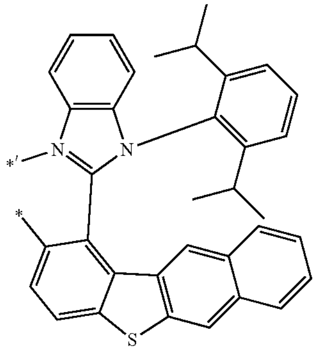
-continued
B690
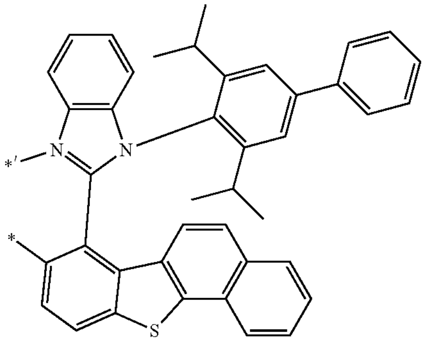
B691
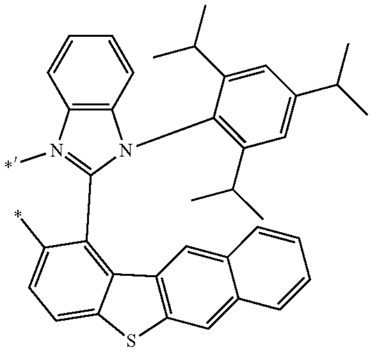
B692
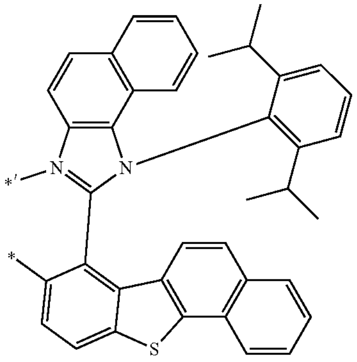
B693
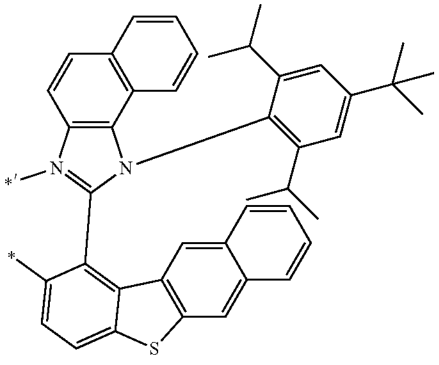

-continued
B694
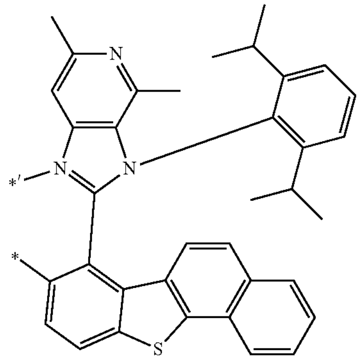
B695
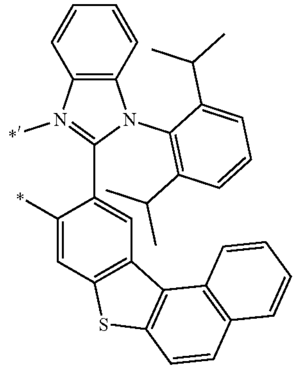
B696
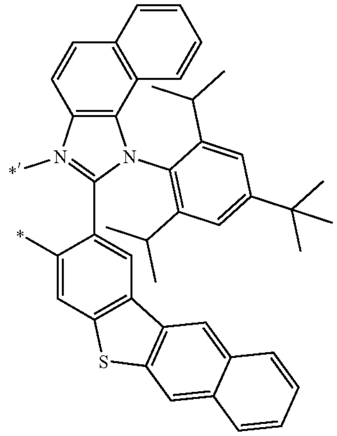
B697
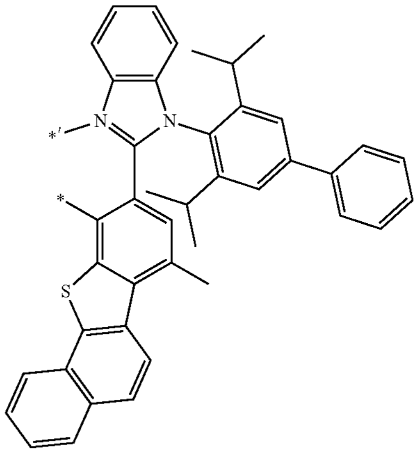
-continued
B698
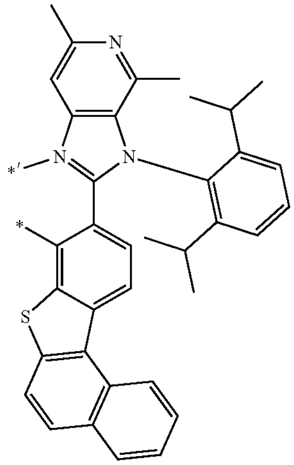
B699
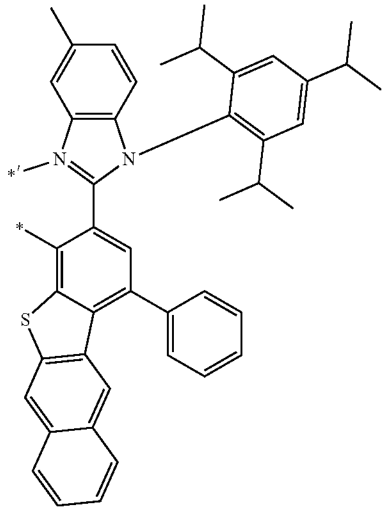
B700
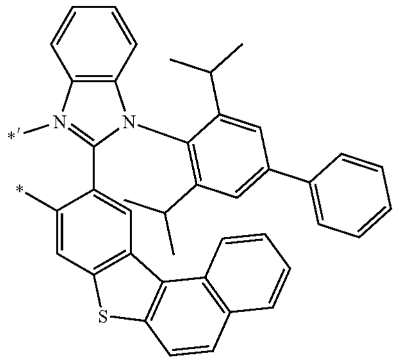

-continued
B701
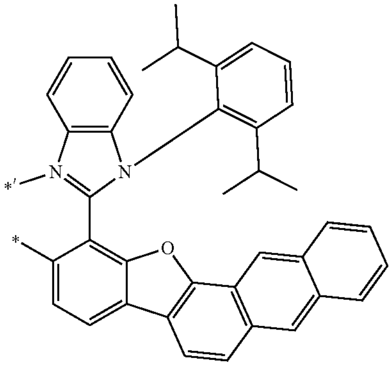
B702
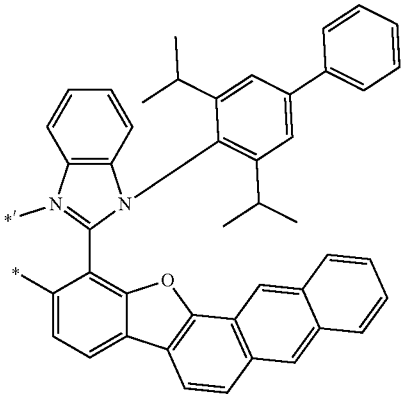
B703
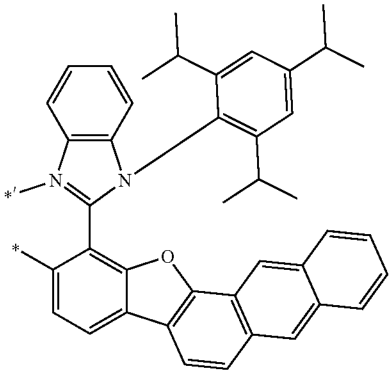
B704
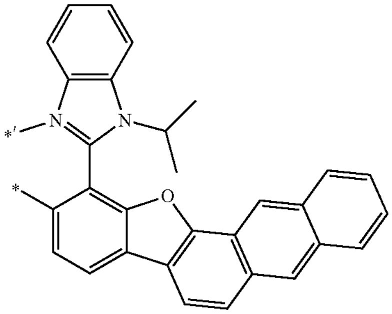
-continued
B705
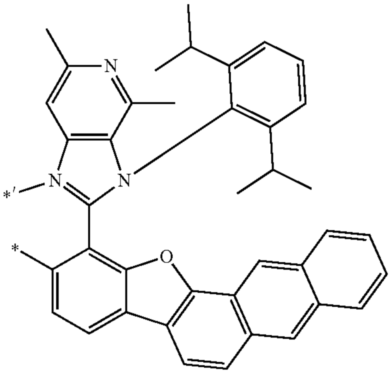
B706
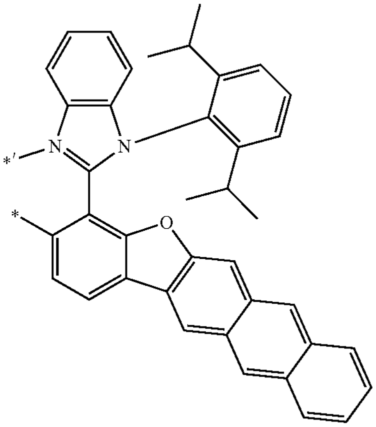
B707
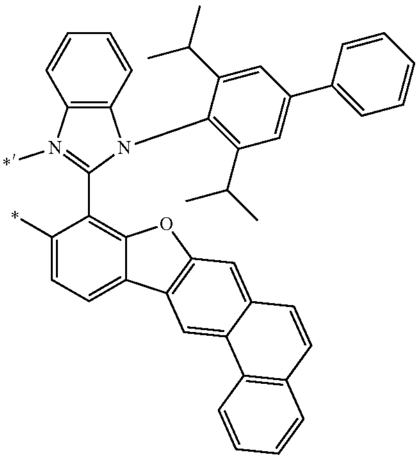

-continued
B708
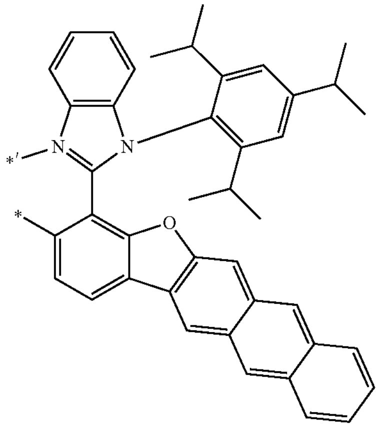
B709
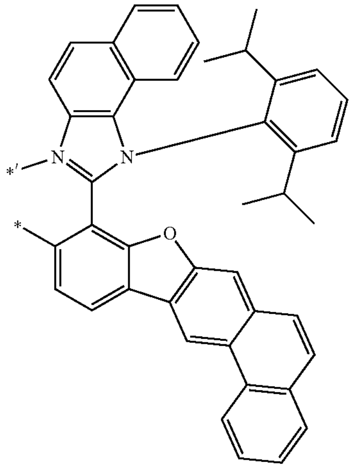
B710
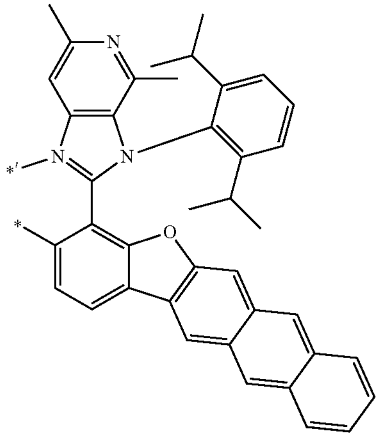
-continued
B711
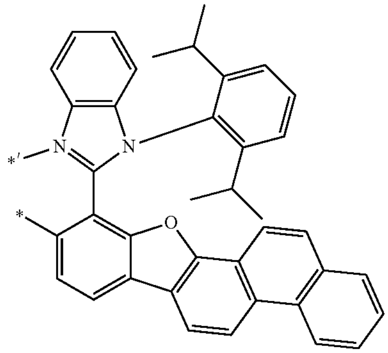
B712
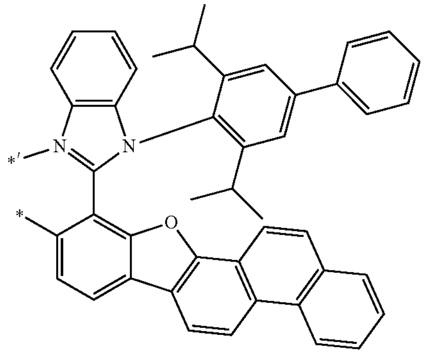
B713
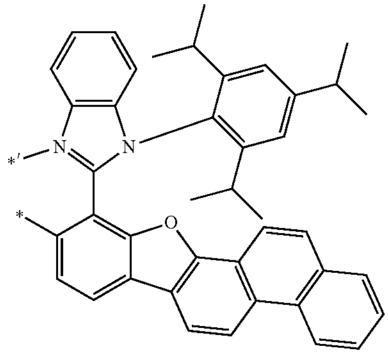
B714
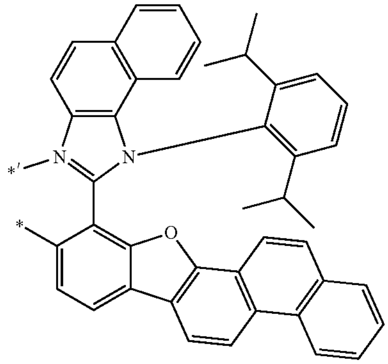

-continued
B715
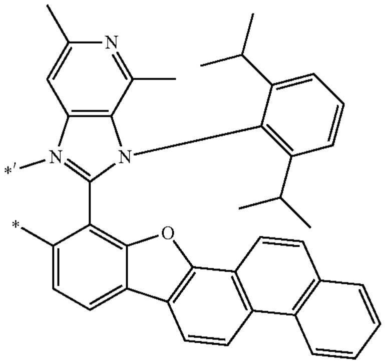
B716
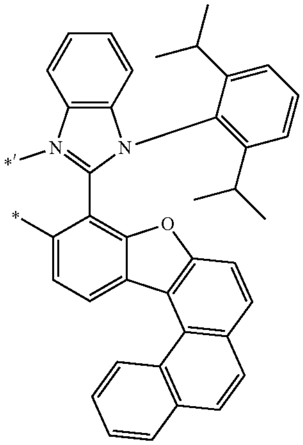
B717
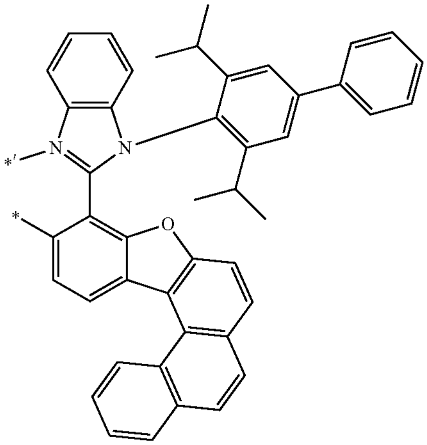
-continued
B718
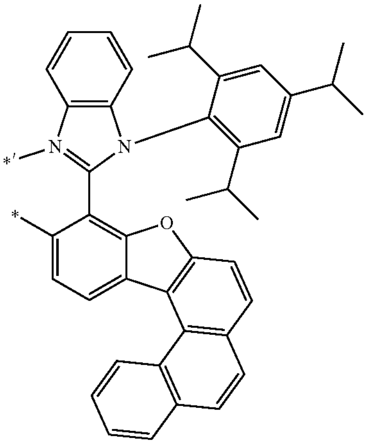
B719
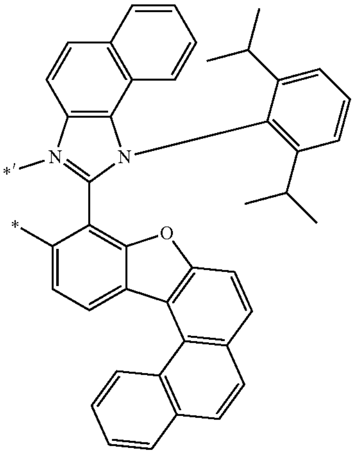
B720
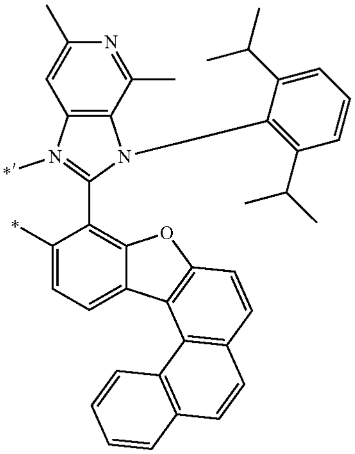

-continued
B721
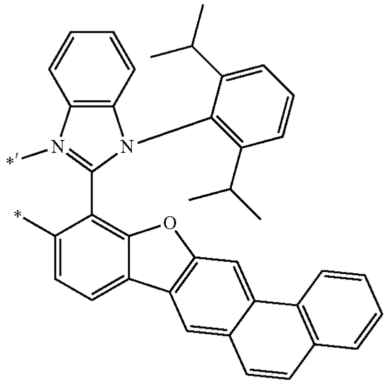
B722
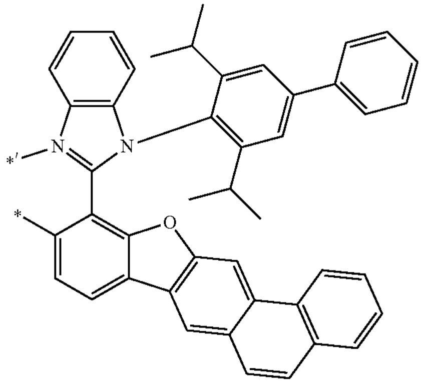
B723
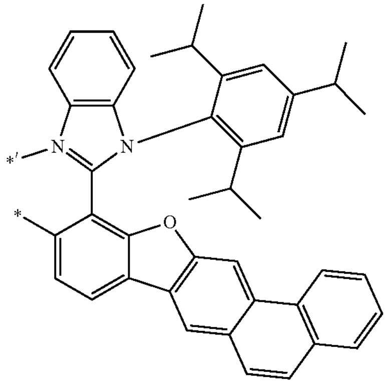
B724
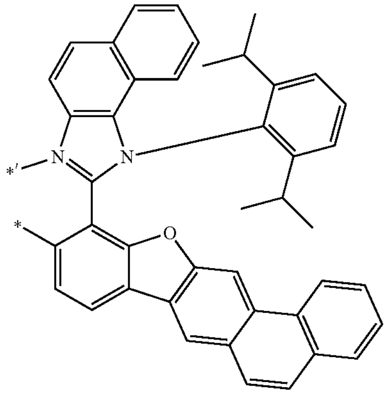
-continued
B725
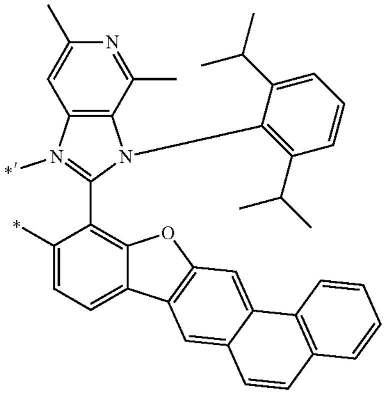
B726
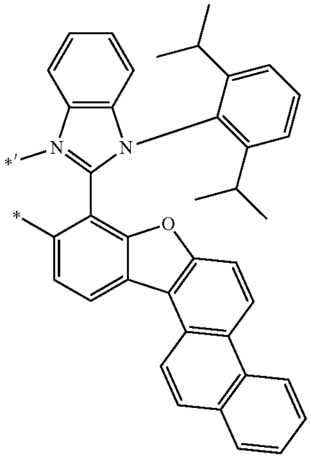
B727
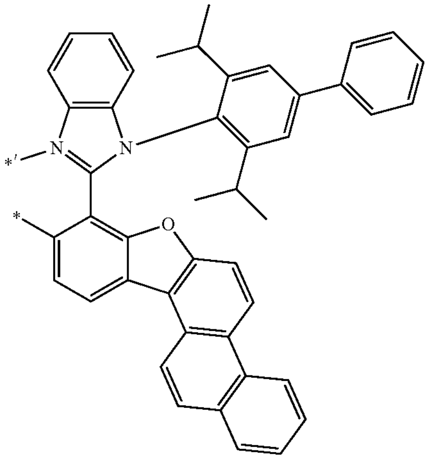

-continued
B728
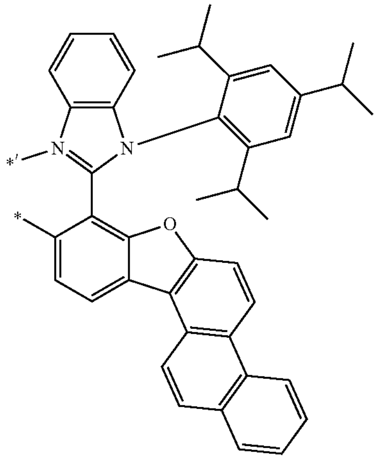
B729
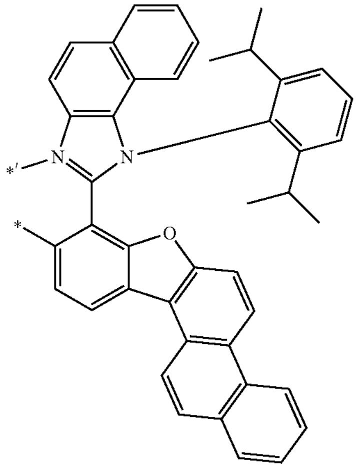
B730
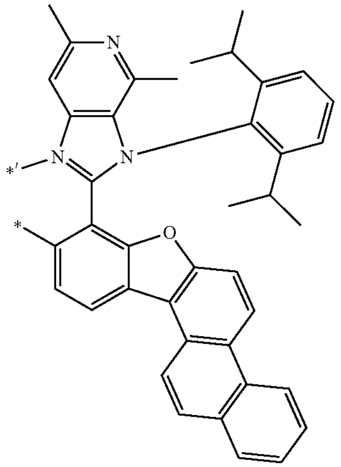
-continued
B731
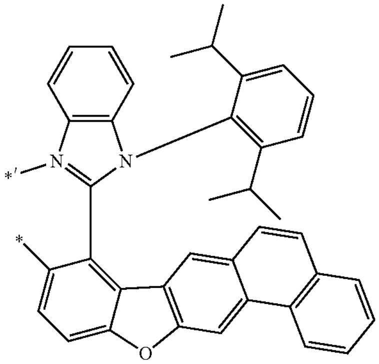
B732
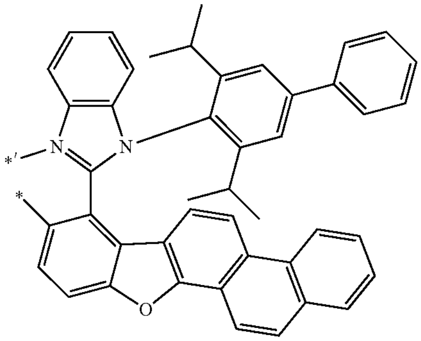
B733
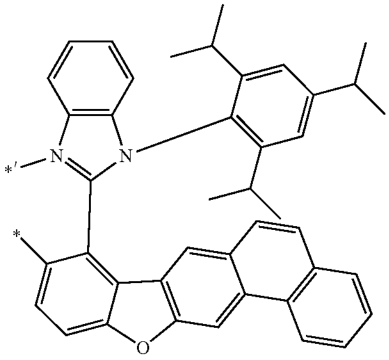
B734
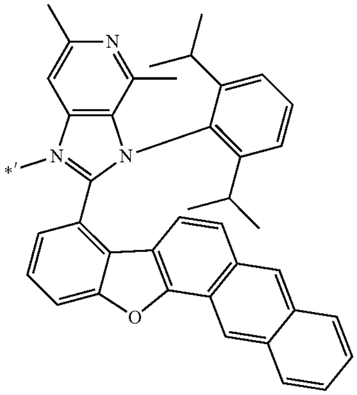

-continued
B735
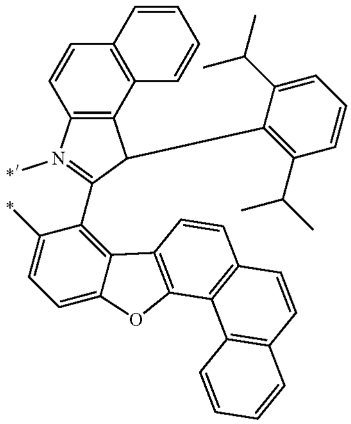
B736
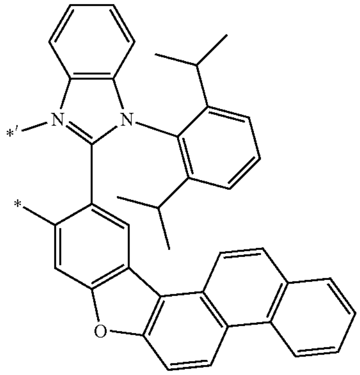
B737
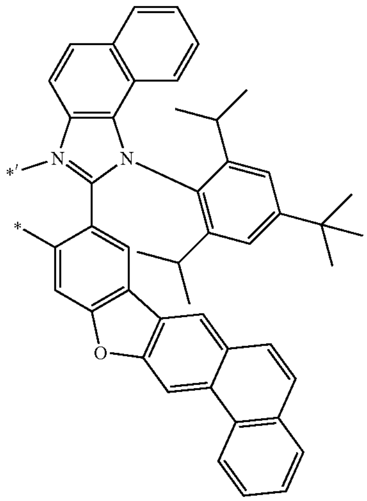
-continued
B738
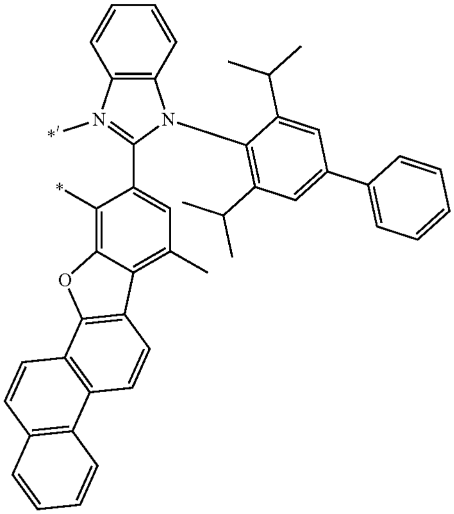
B739
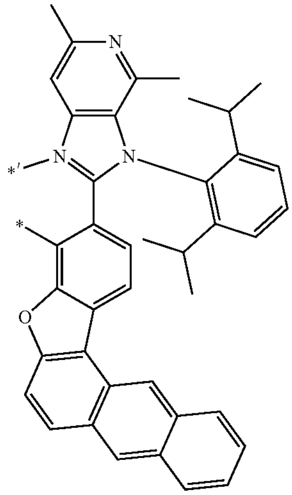
B740
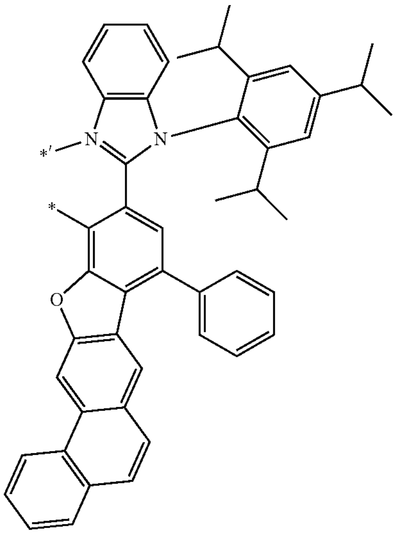

B741
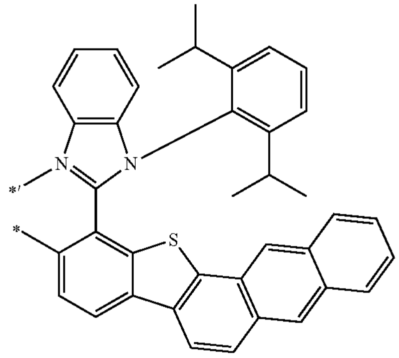
B742
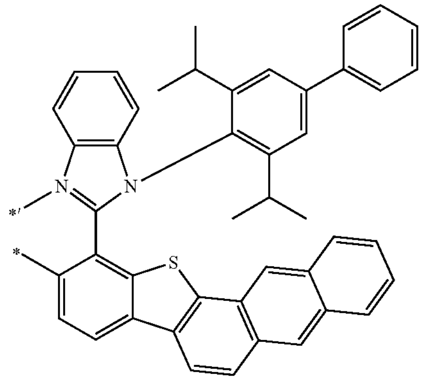
B743
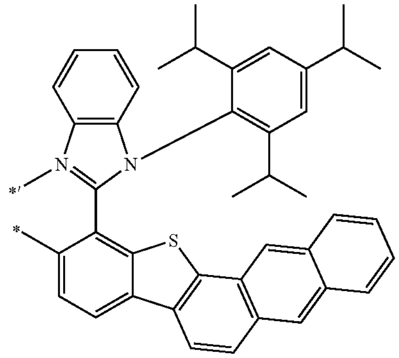
B744
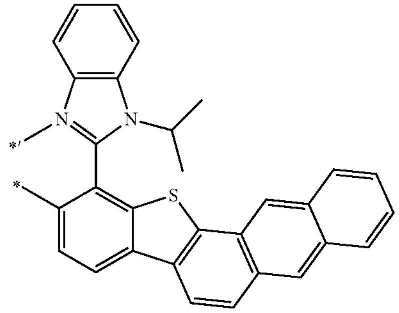
-continued
B745
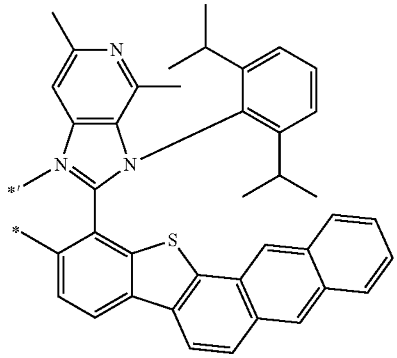
B746
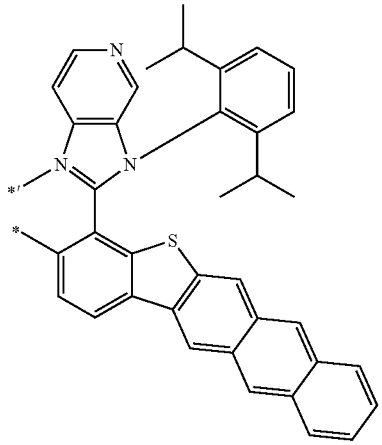
B747
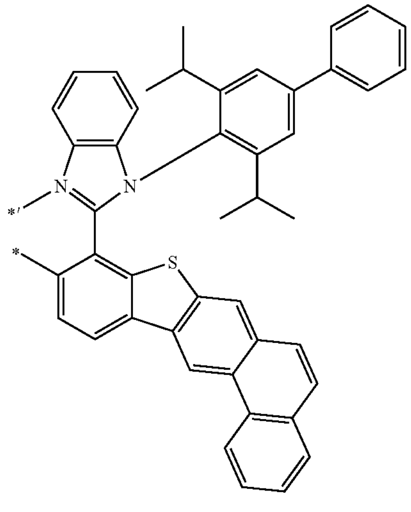

-continued
B748
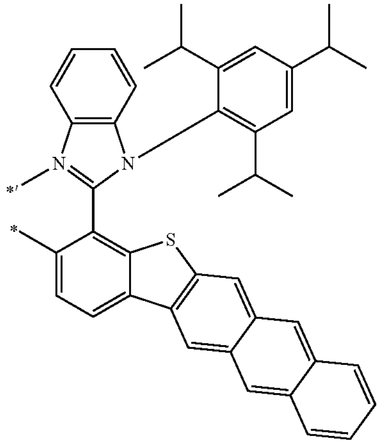
B749
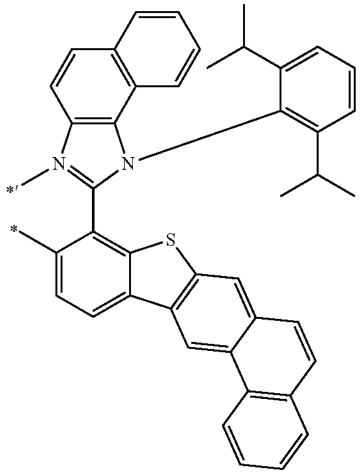
B750
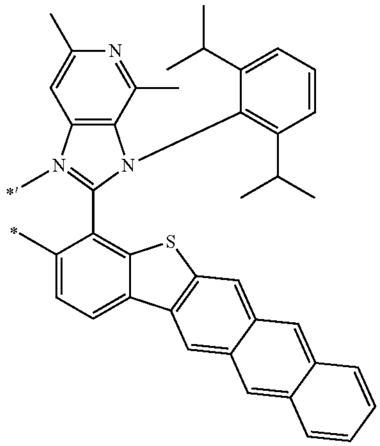
-continued
B751
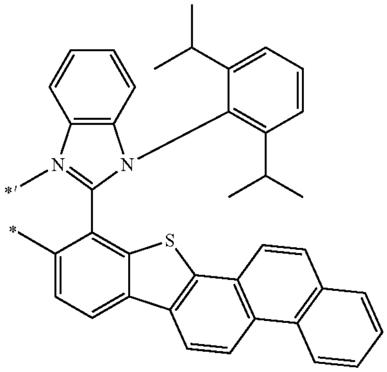
B752
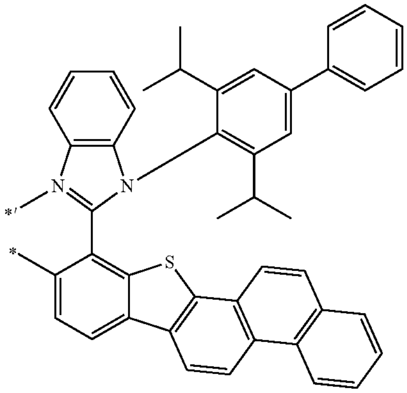
B753
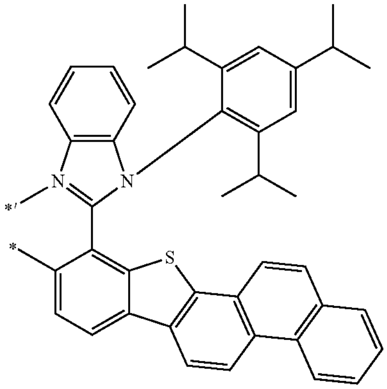
B754
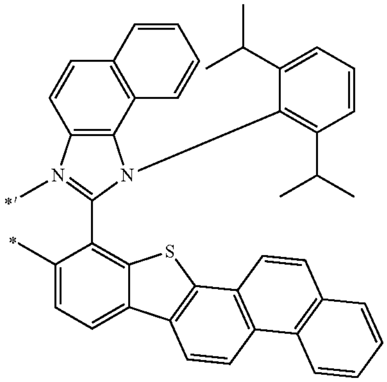

-continued
B755
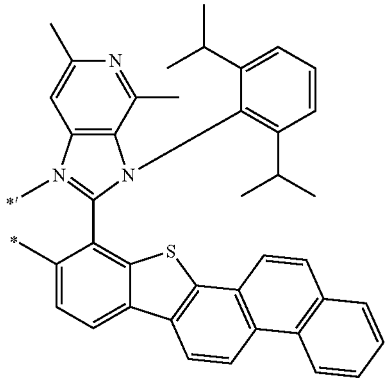
B756
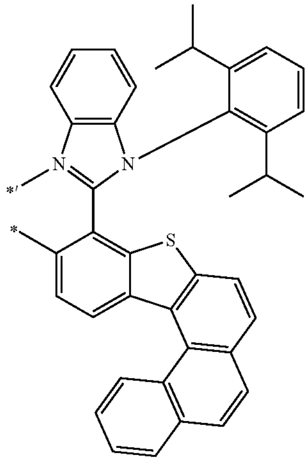
B757
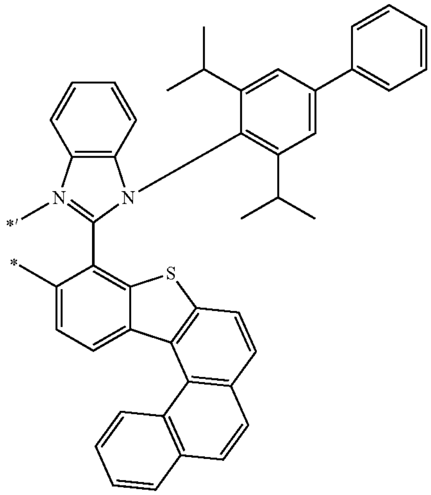
-continued
B758
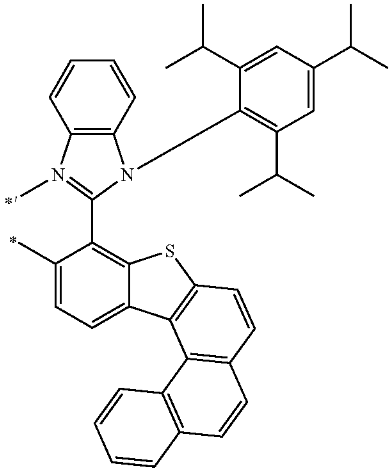
B759
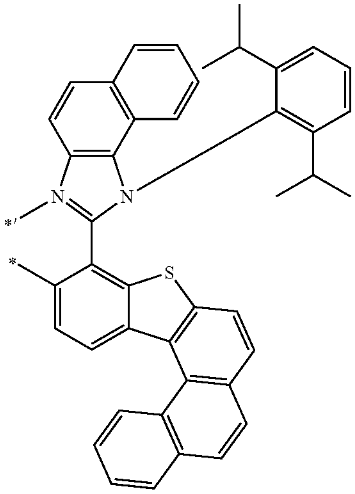
B760
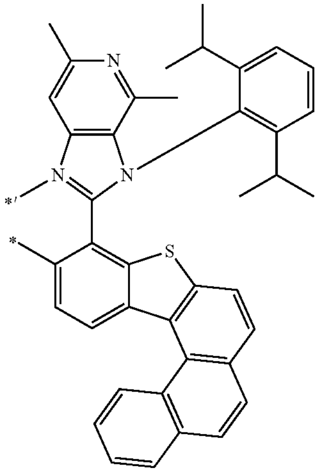

-continued
B761
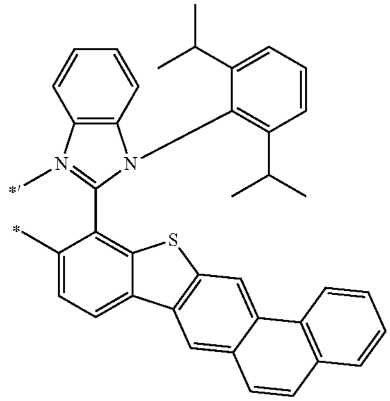
B762
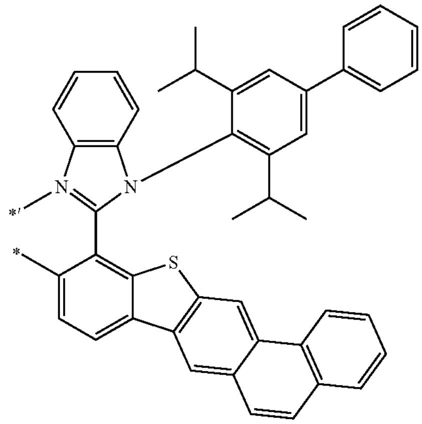
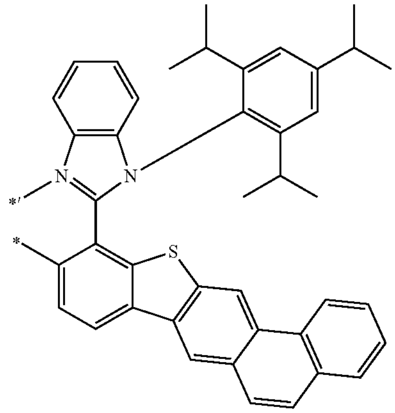
B763
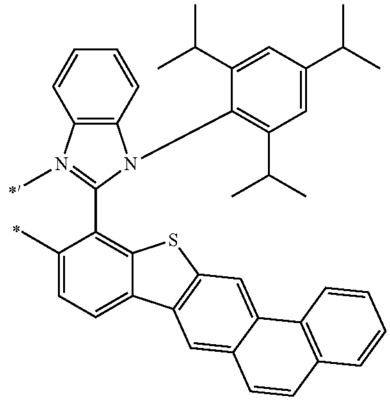
-continued
B764
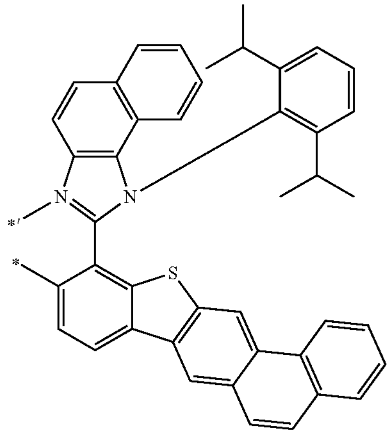
B765
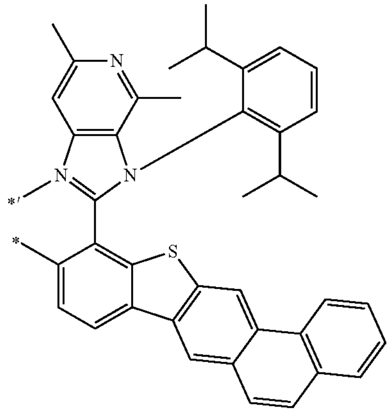
B766
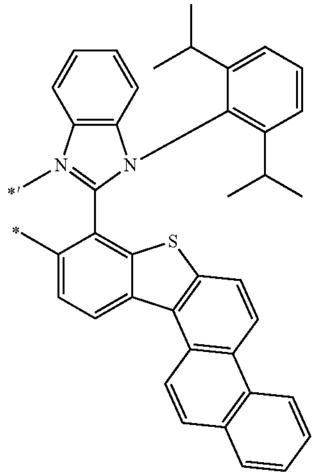

-continued
B767
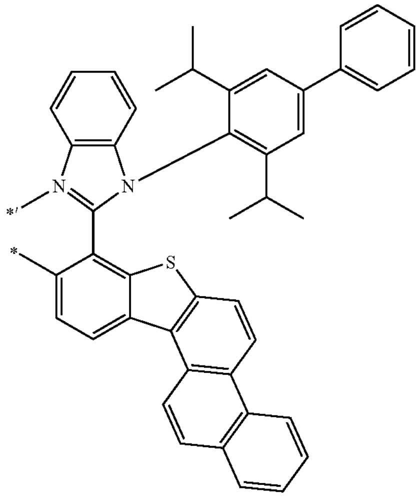
B768
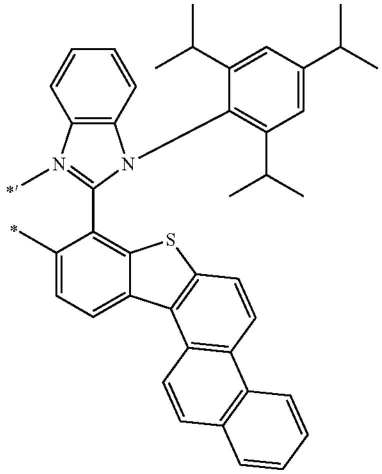
B768
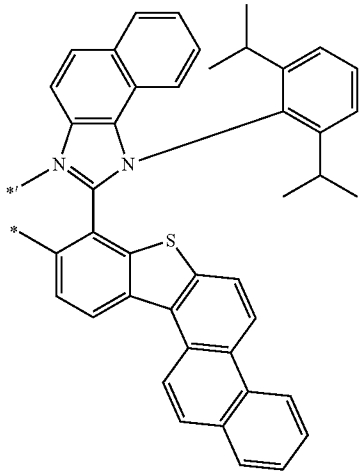
-continued
B770
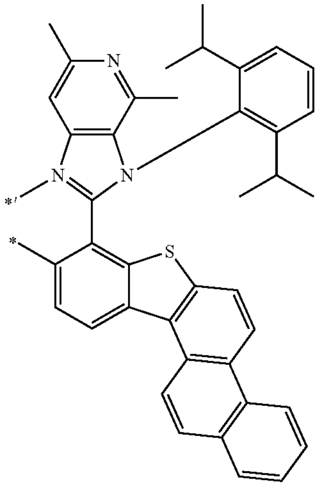
B771
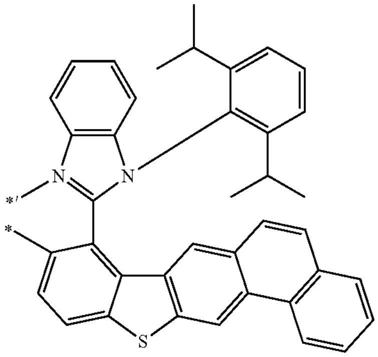
B772
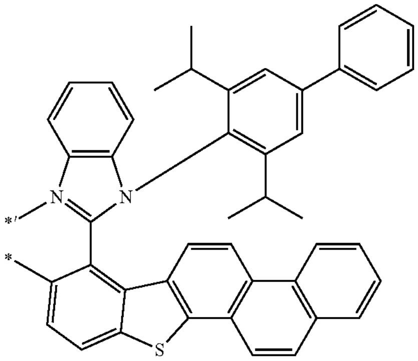
B773
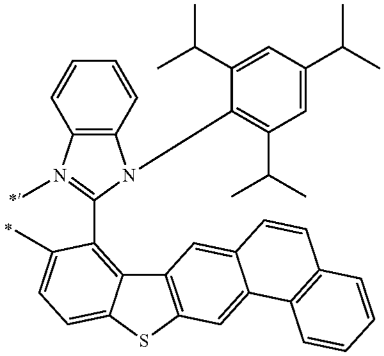

-continued
B774
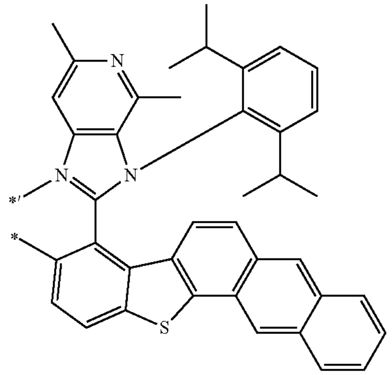
B775
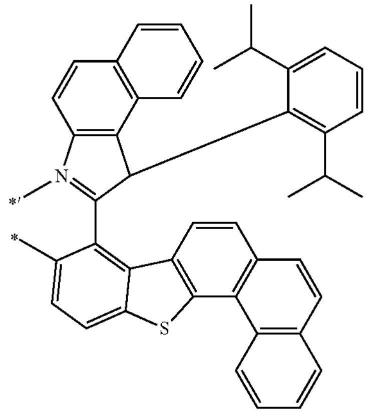
B776
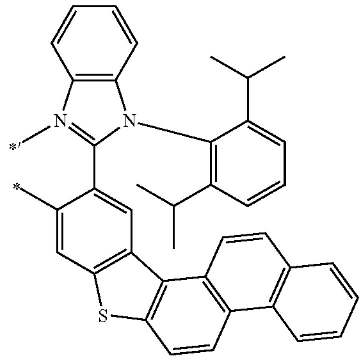
B777
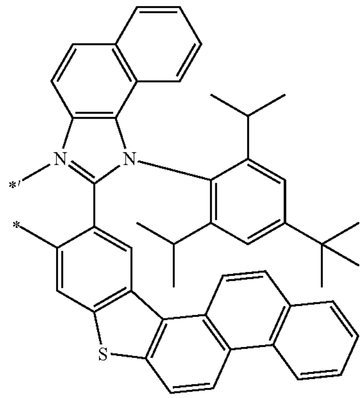
-continued
B778
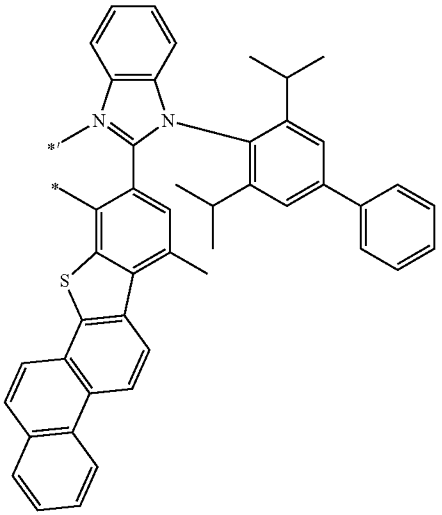
B779
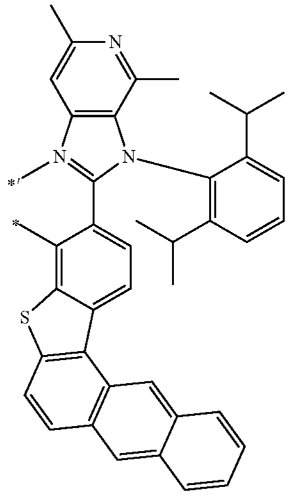
B780
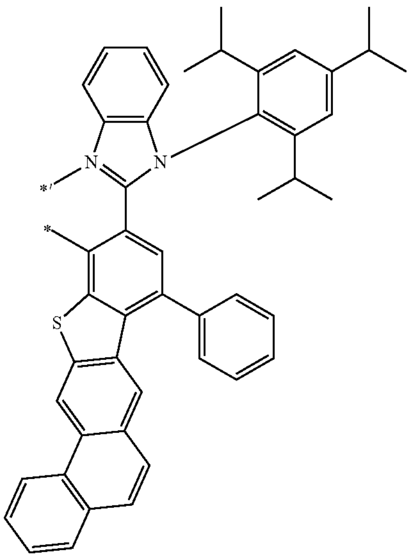

B781
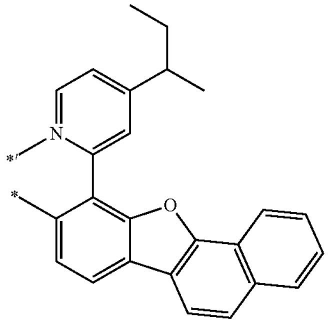
B782
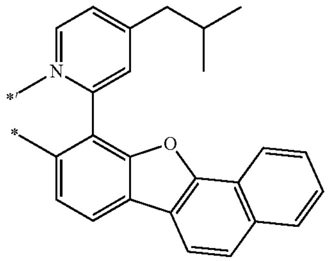
B783
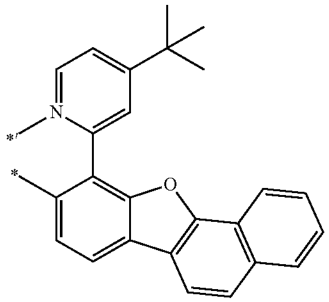
B784
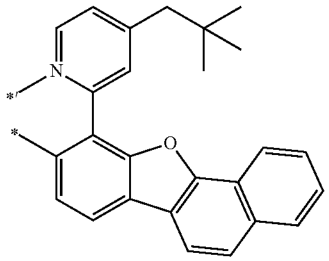
B785
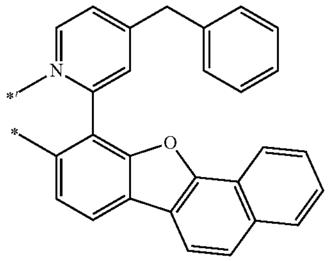
B786
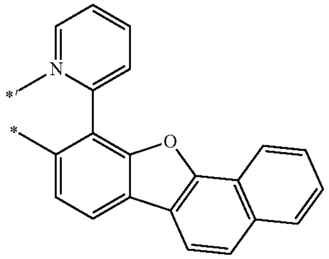
B787
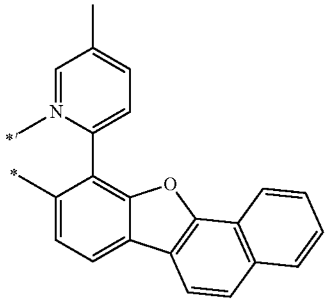
B788
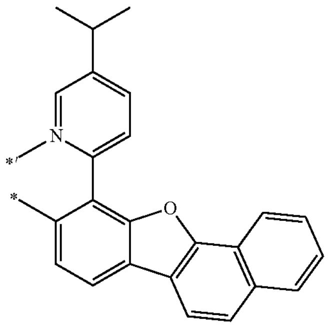
B789
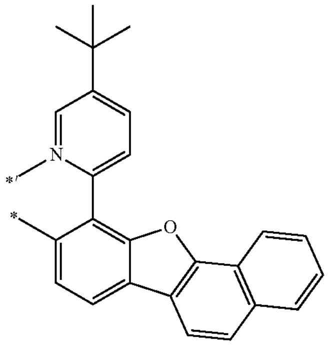
B790
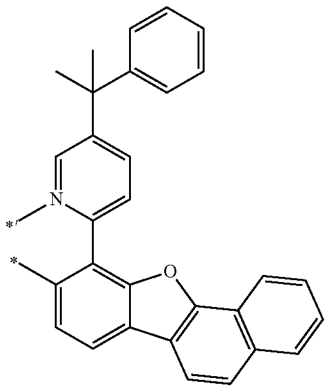

-continued
B791
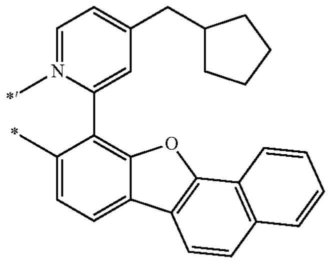
B792
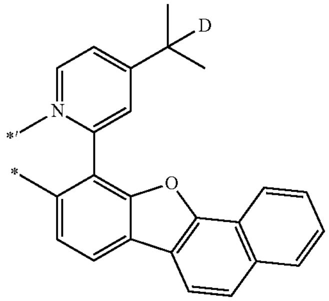
B793
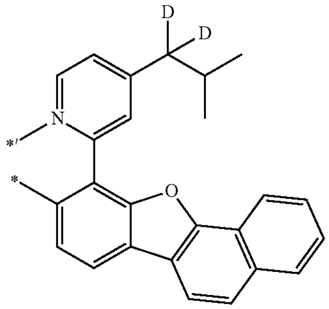
B794
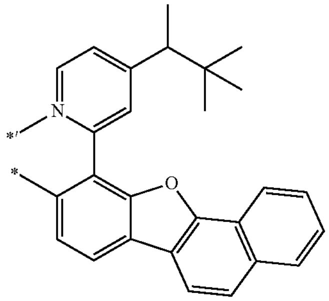
B795
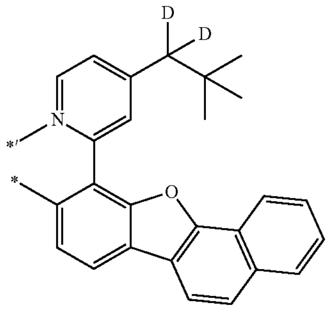
-continued
B796
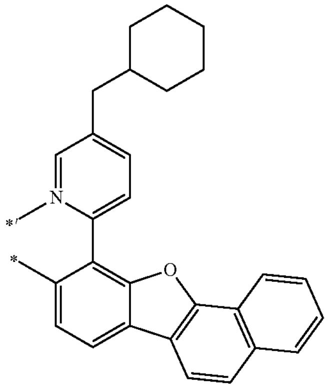
B797
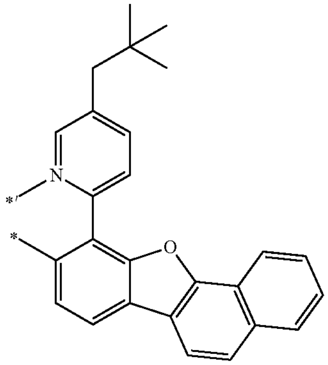
B798
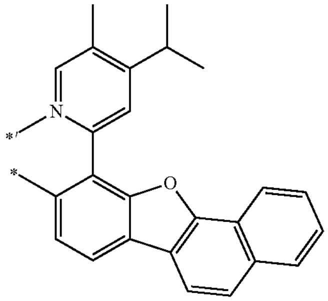
B799
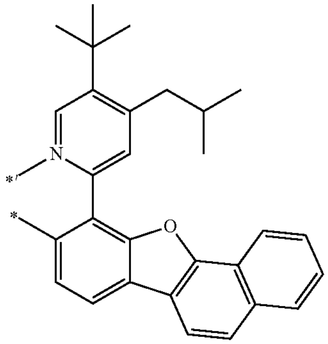

B800
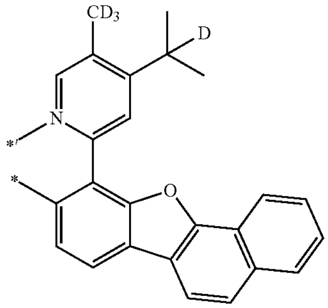
B801
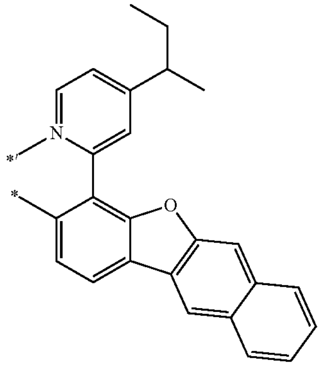
B802
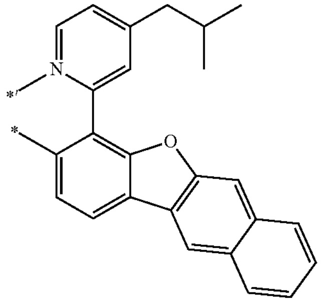
B803
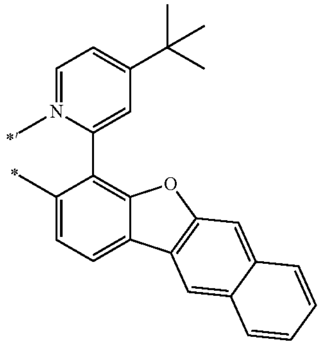
B804
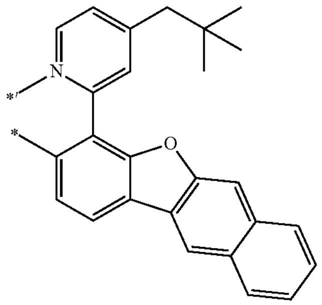
B805
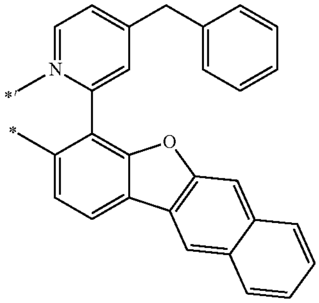
B806
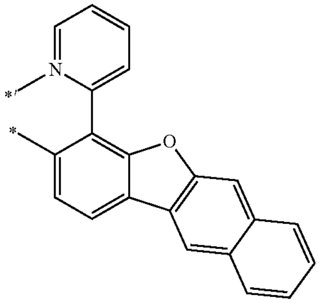
B807
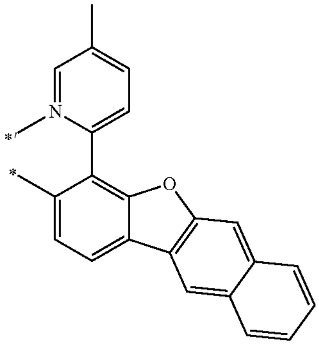
B808
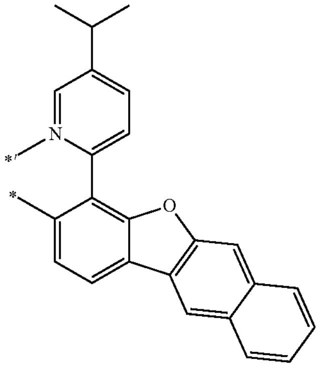

-continued
B809
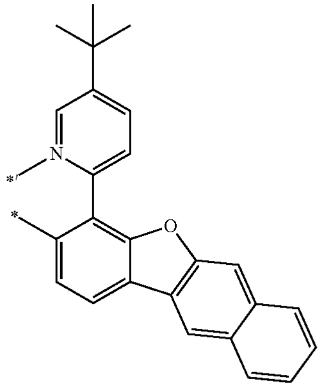
B810
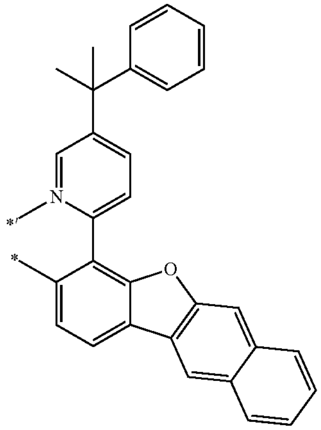
B811
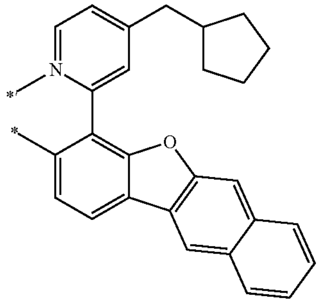
B812
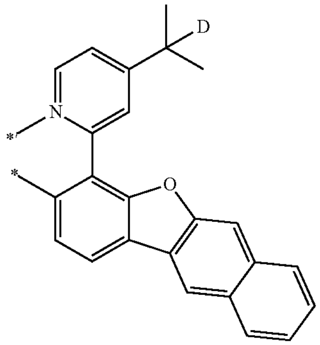
-continued
B813
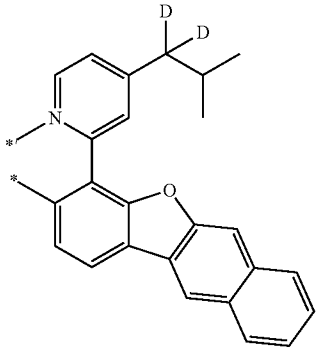
B814
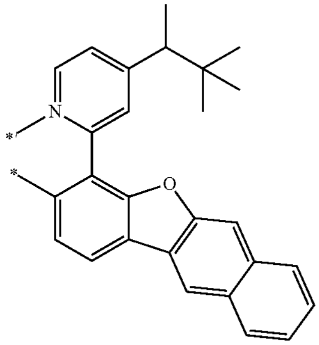
B815
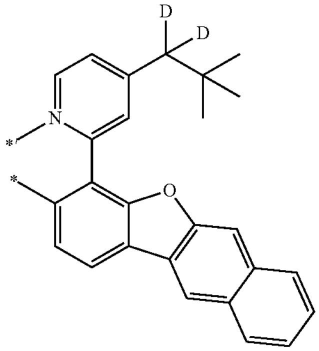
B816
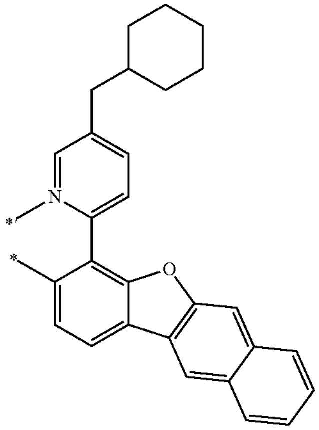

-continued
B817
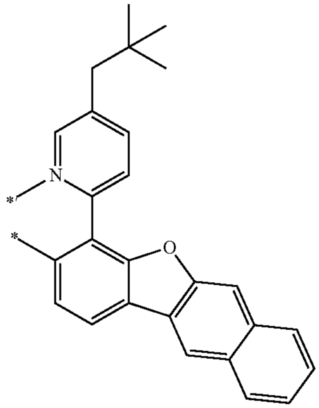
B818
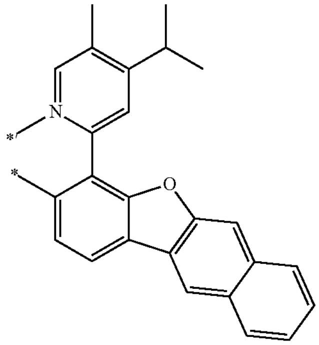
B819
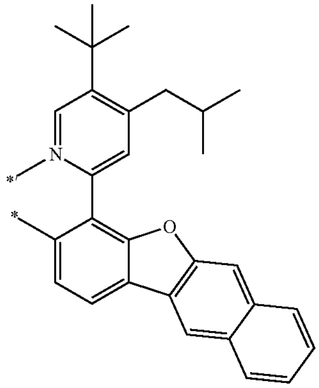
B820
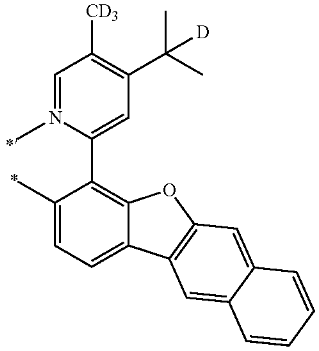
B821
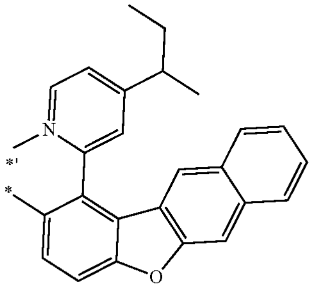
B822
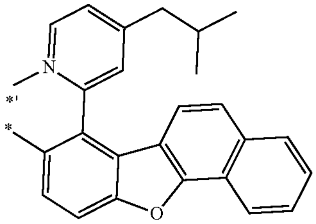
B823
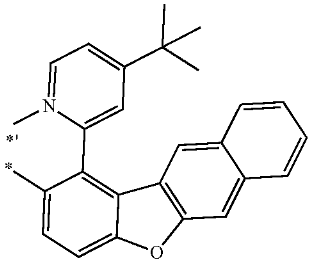
B824
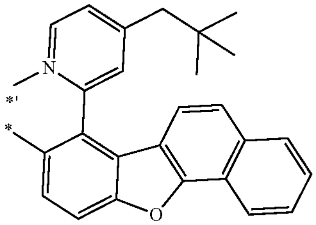
B825
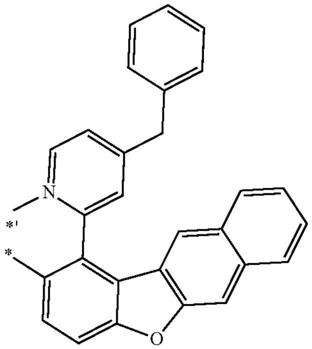
B826
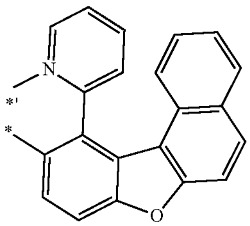

-continued
B827
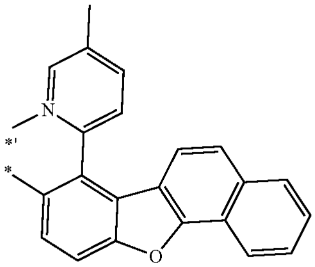
B828
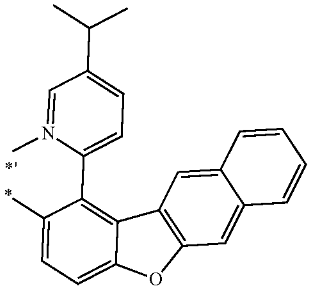
B829
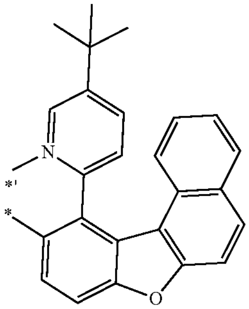
B830
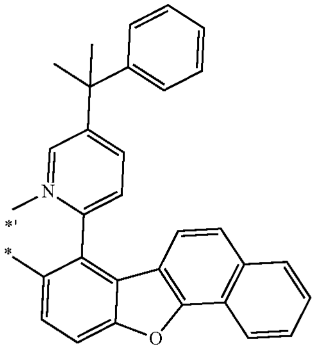
B831
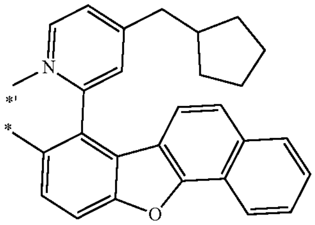
-continued
B832
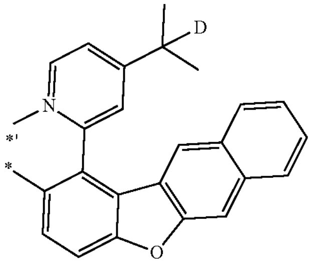
B833
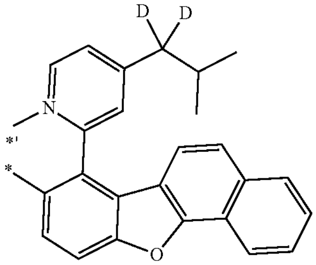
B834
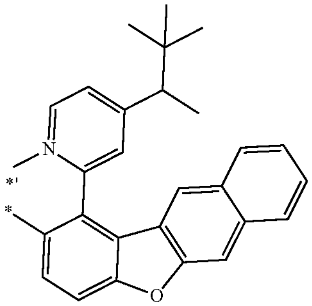
B835
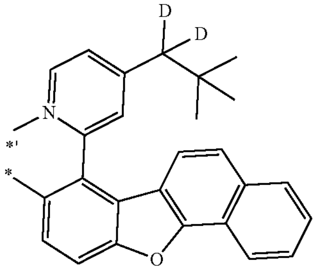
B836
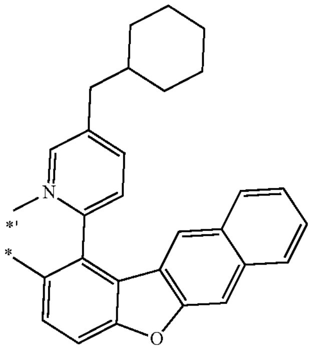

-continued
B837
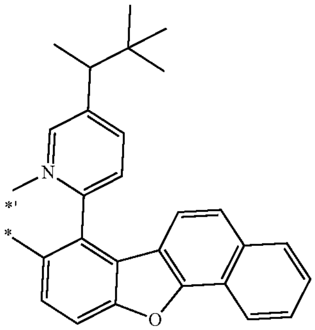
B838
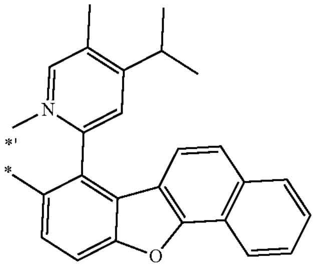
B839
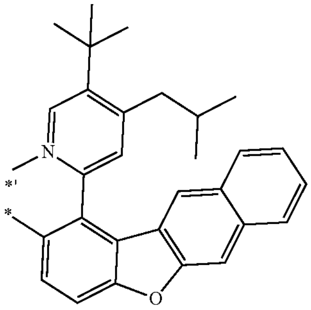
B840
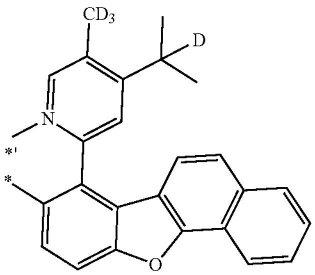
B841
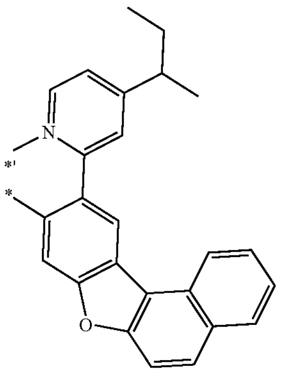
-continued
B842
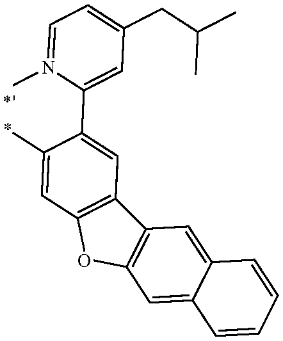
B843
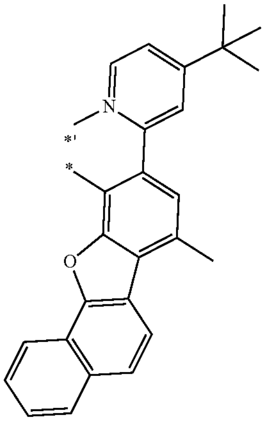
B844
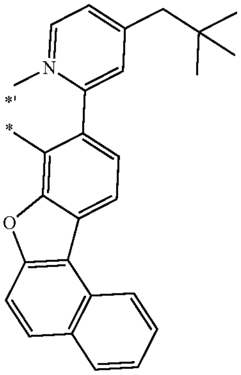
B845
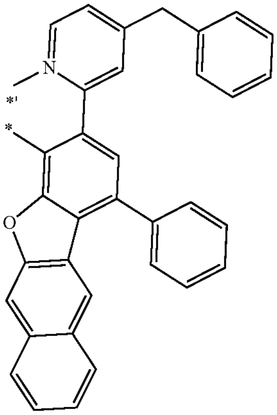

-continued
B846
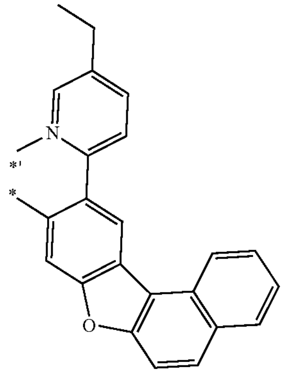
B847
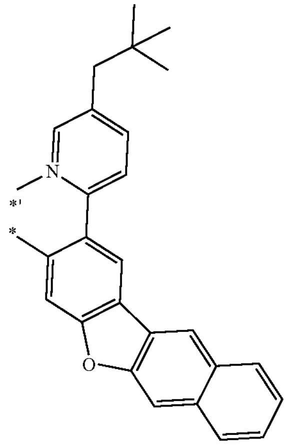
B848
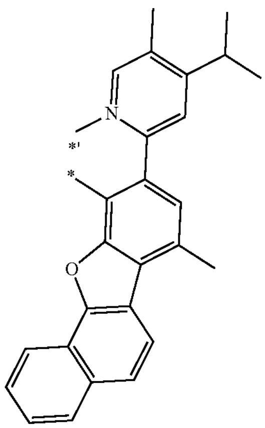
-continued
B849
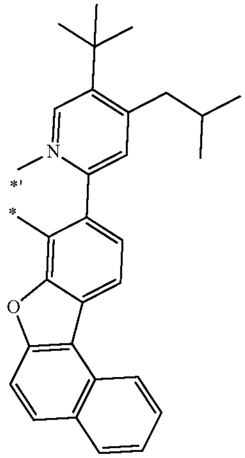
B850
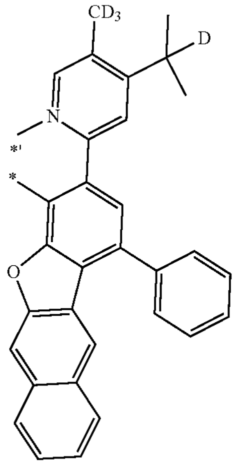
B851
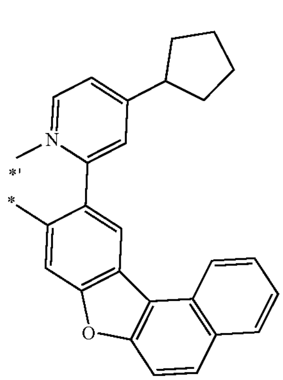

-continued
B852
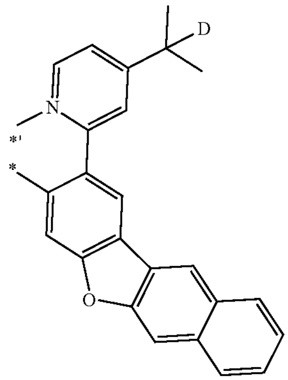
B853
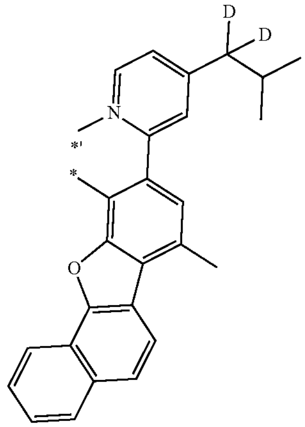
B854
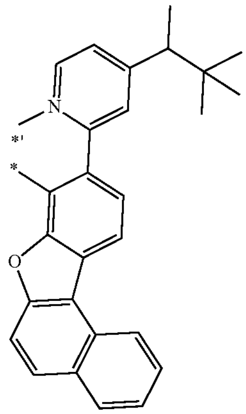
-continued
B855
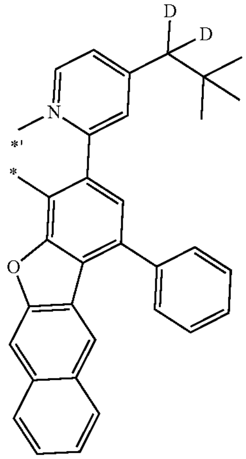
B856
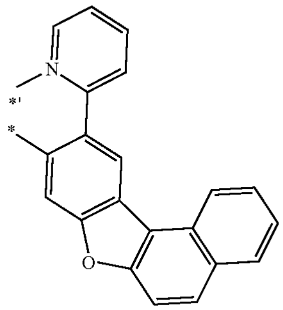
B857
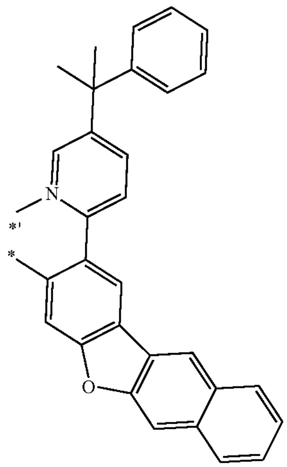

-continued
B858
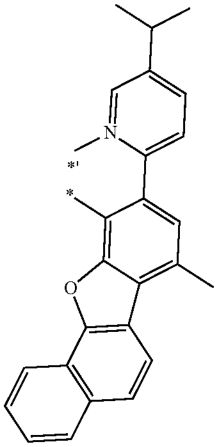
B859
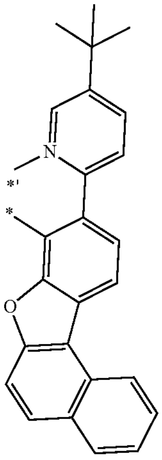
B860
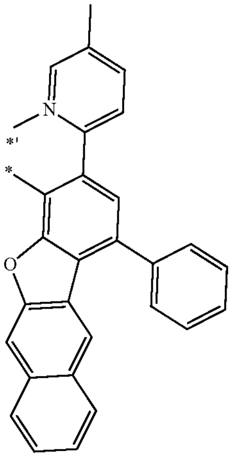
-continued
B861
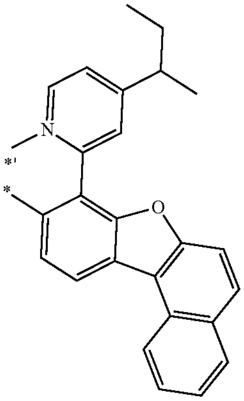
B862
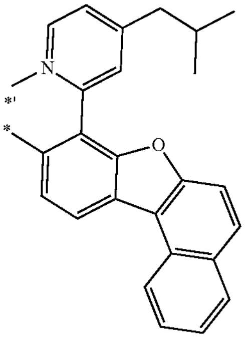
B863
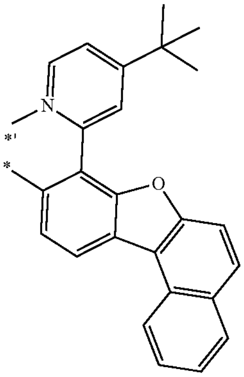
B864
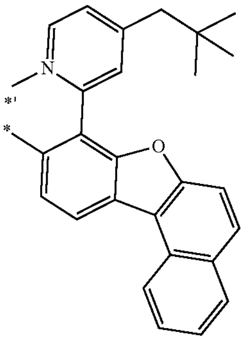

-continued
B865
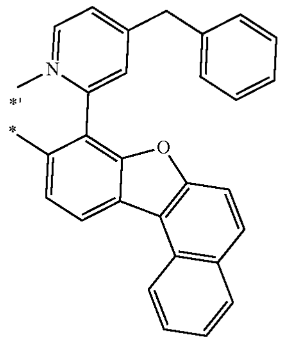
B866
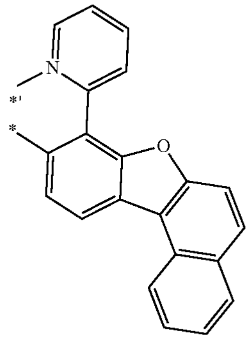
B867
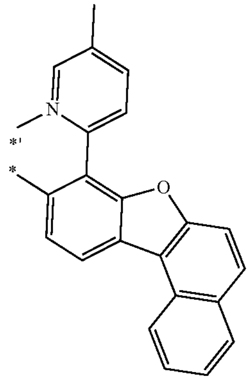
B868
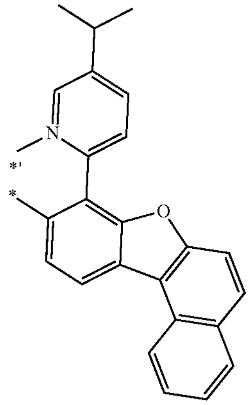
-continued
B869
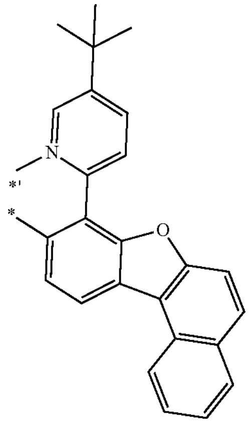
B870
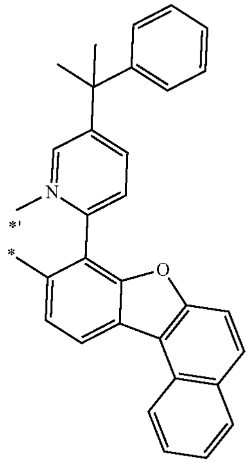
B871
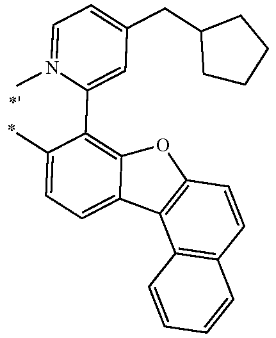
B872
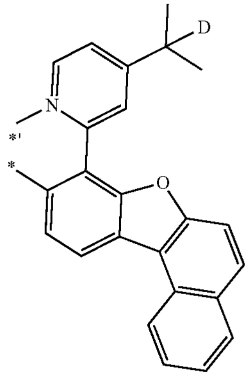

-continued
B873
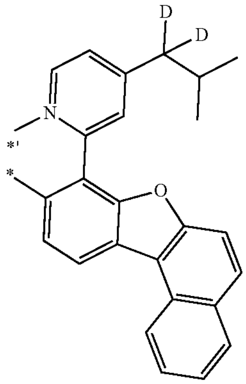
B874
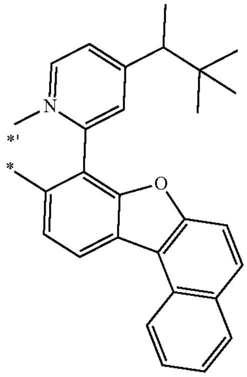
B875
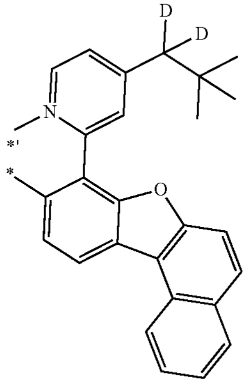
B876
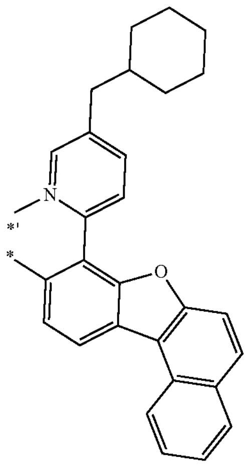
-continued
B877
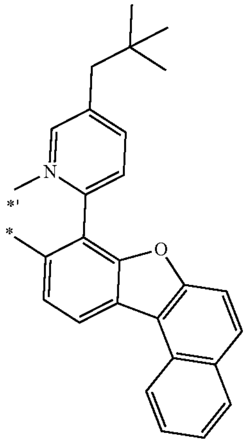
B878
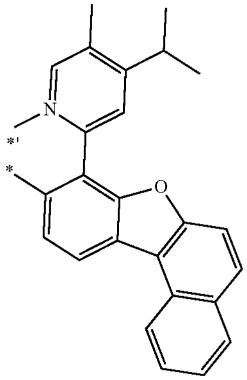
B879
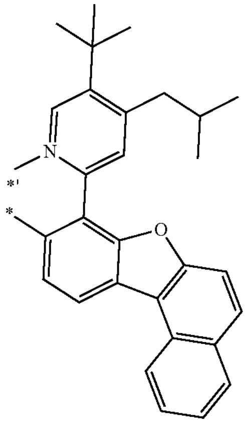
B880
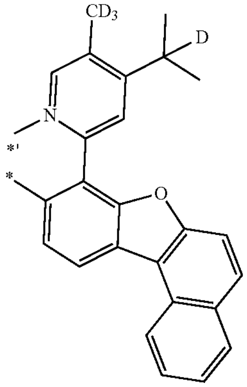

-continued
B881
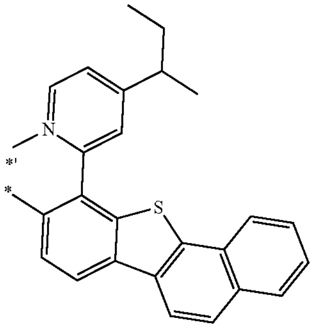
B882
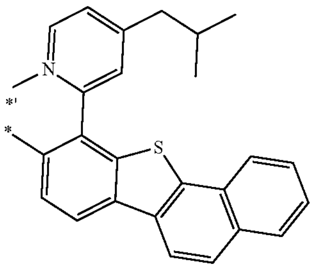
B883
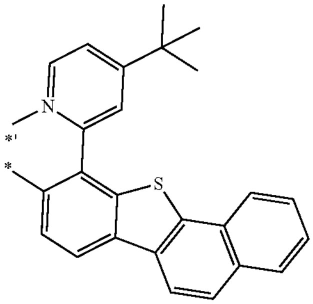
B884
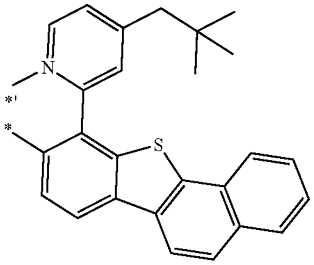
B885
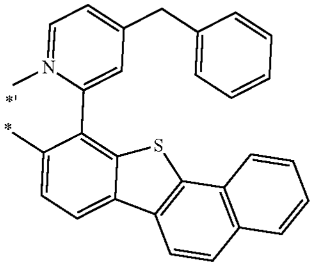
-continued
B886
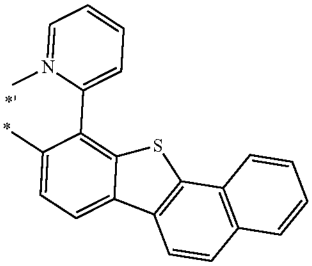
B887
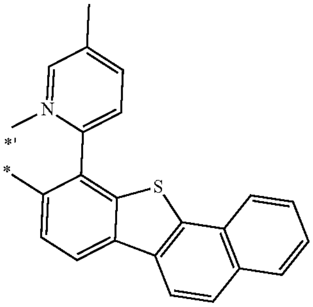
B888
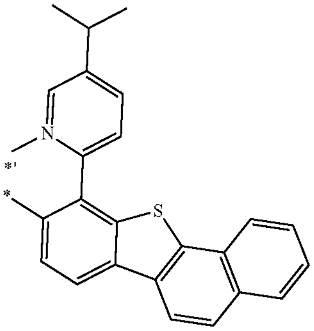
B889
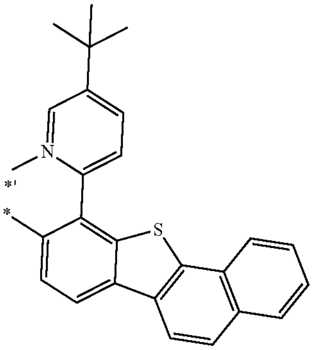

-continued
B890
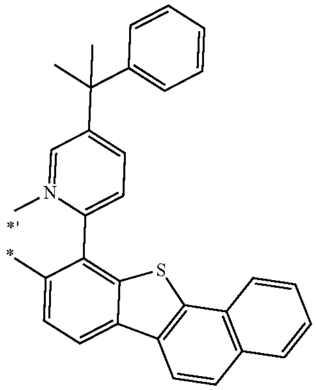
B891
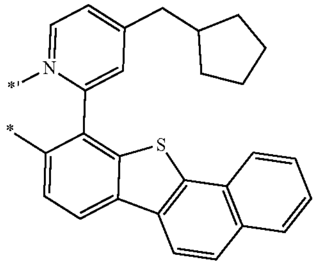
B892
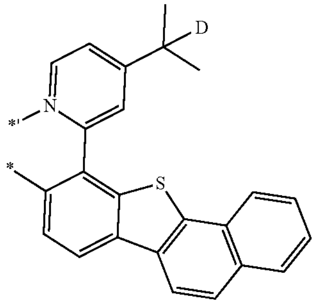
B893
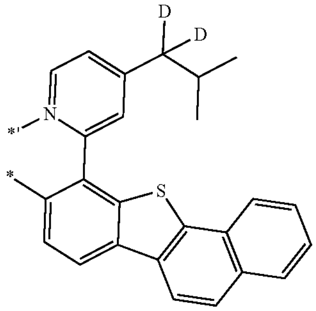
B894
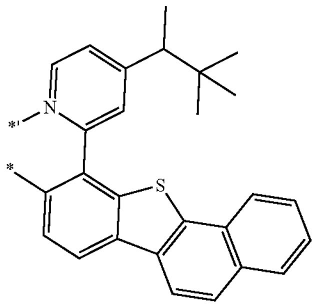
-continued
B895
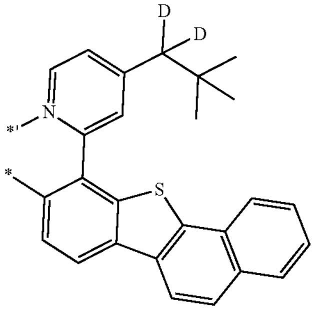
B896
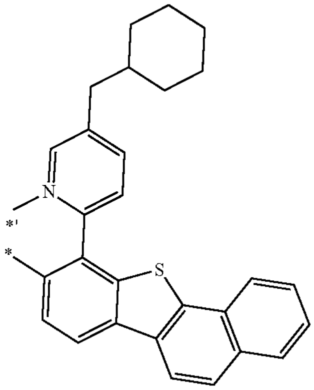
B897
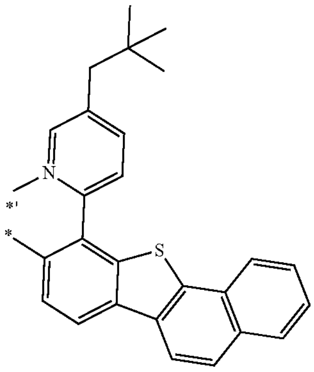
B898
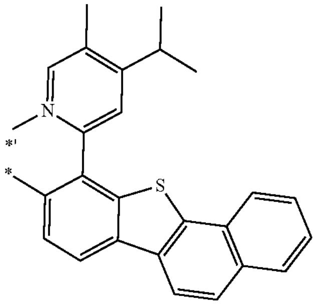

-continued
B899
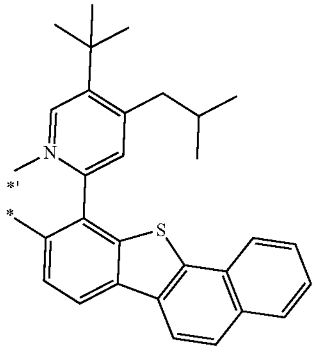
B900
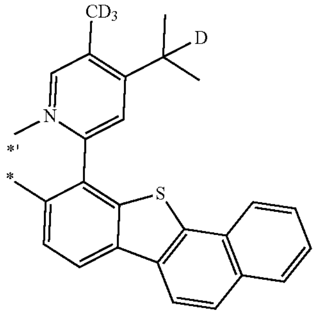
B901
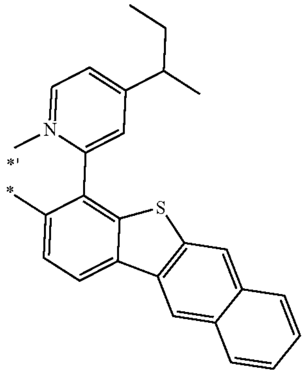
B902
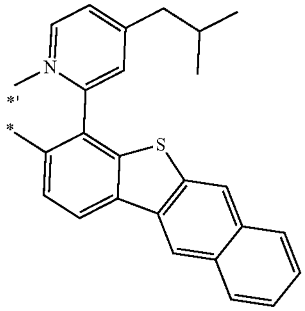
-continued
B903
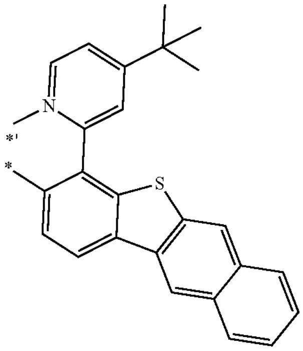
B904
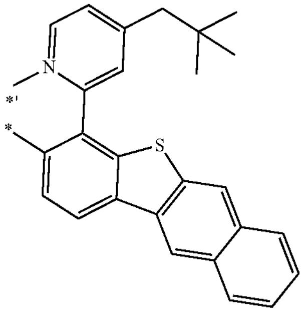
B905
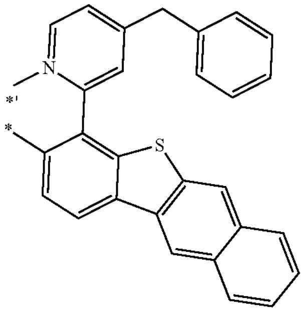
B906
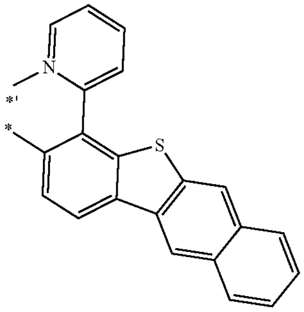

-continued
B907
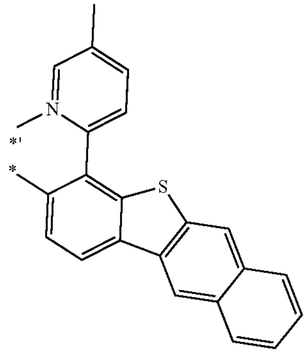
B908
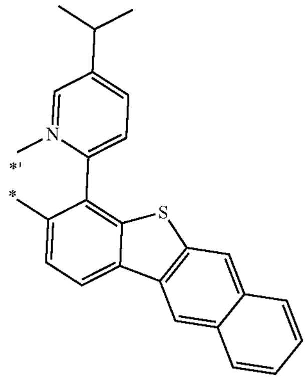
B909
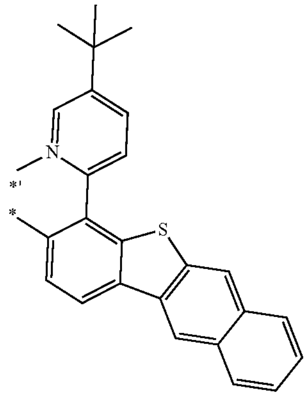
B910
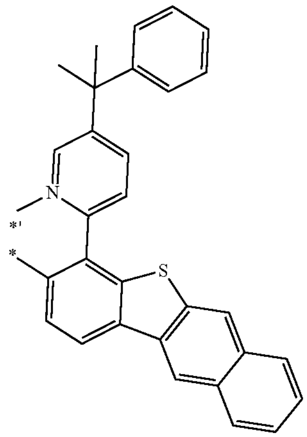
-continued
B911
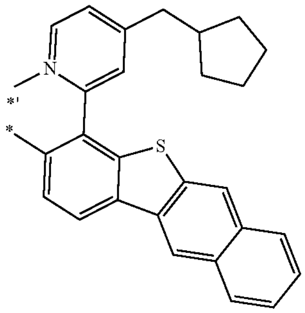
B912
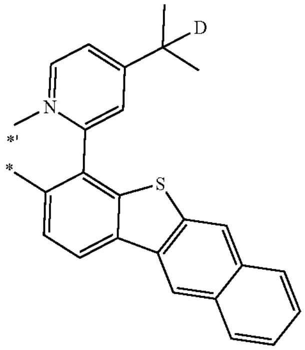
B913
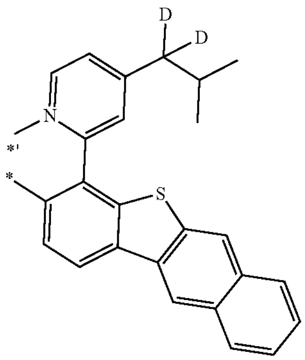
B914
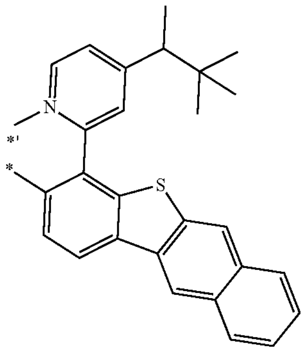

-continued
B915
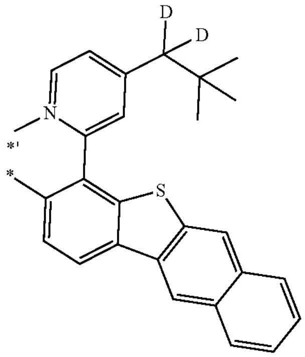
B916
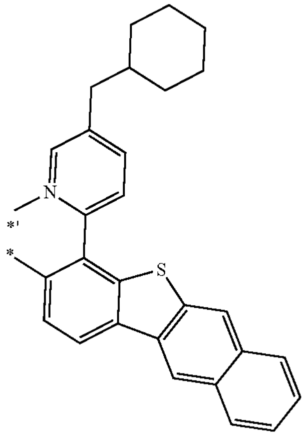
B917
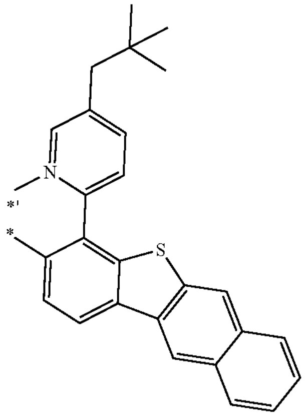
B918
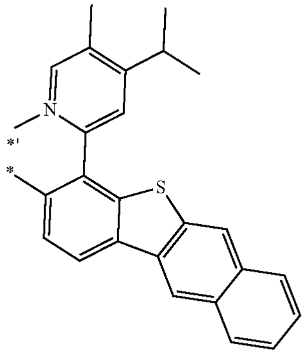
-continued
B919
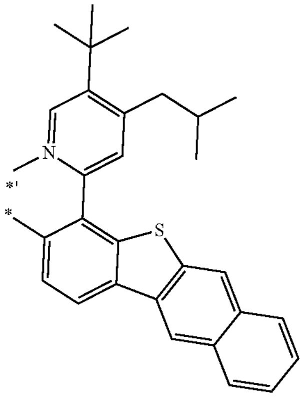
B920
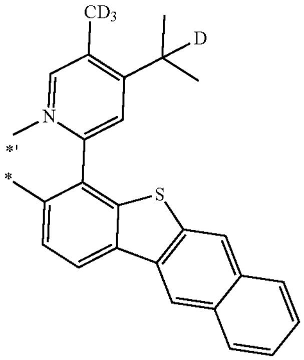
B921
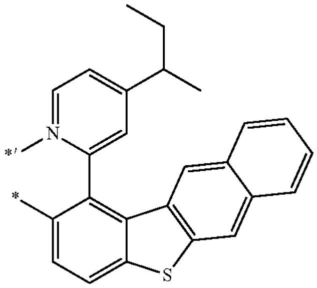
B922
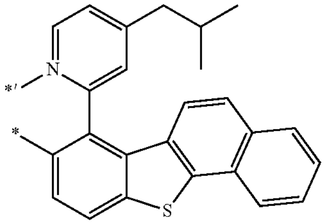
B923
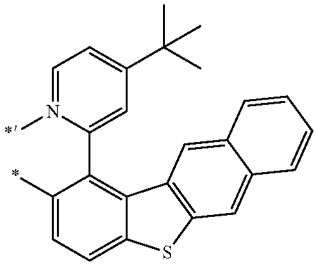

-continued
B924
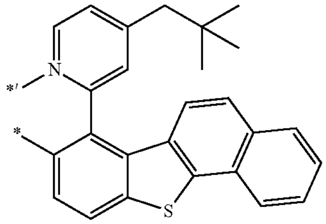
B925
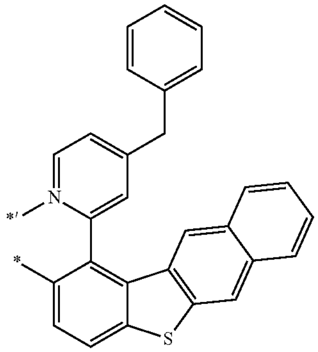
B926
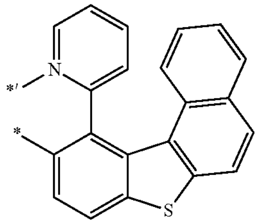
B927
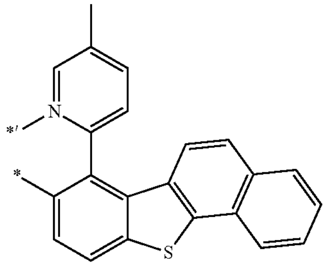
B928
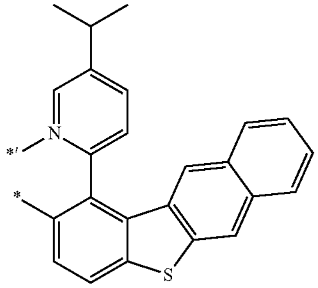
-continued
B929
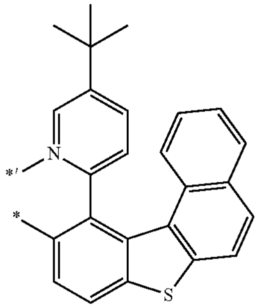
B930
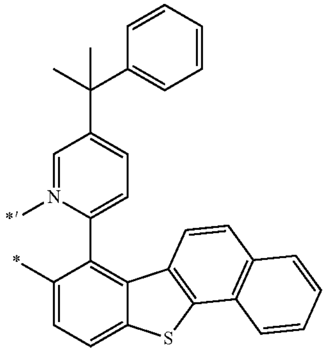
B931
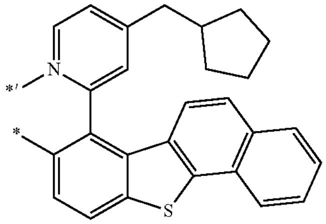
B932
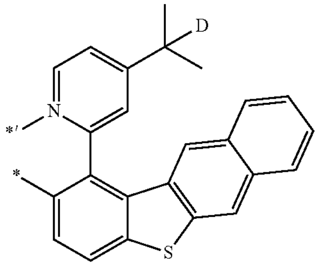
B933
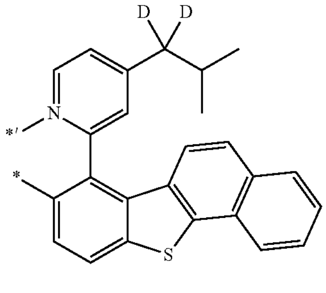

-continued
B934
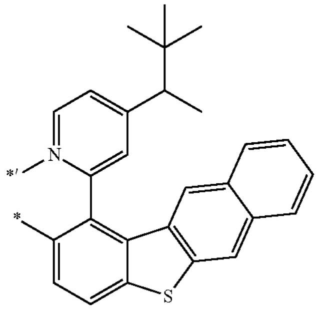
B935
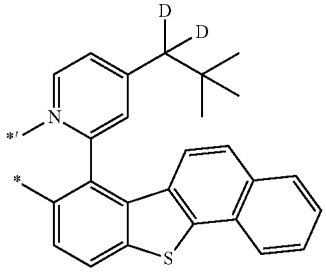
B936
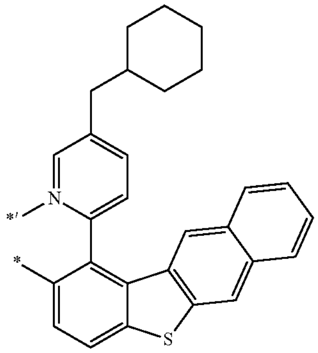
B937
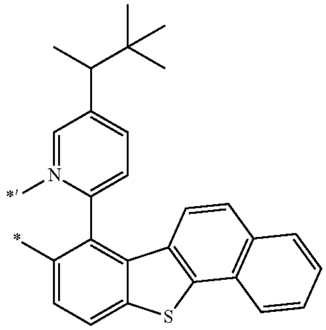
B938
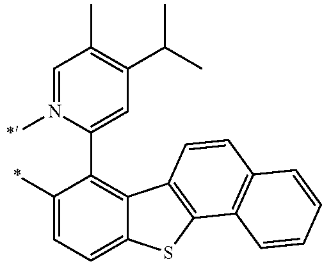
-continued
B939
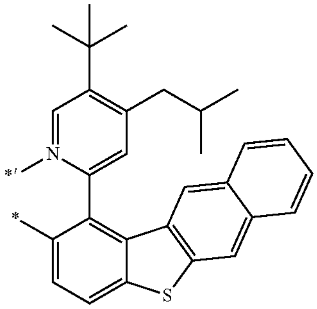
B940
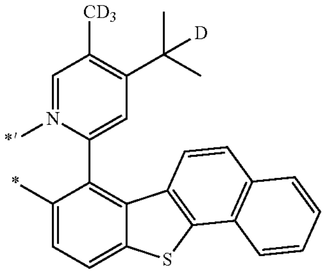
B941
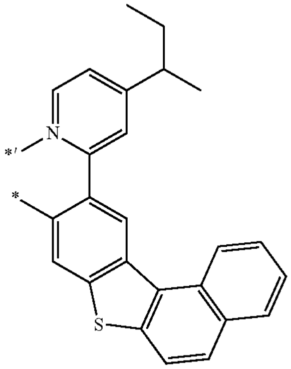
B942
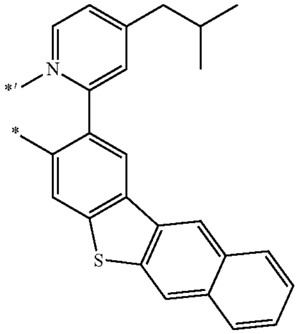

-continued
B943
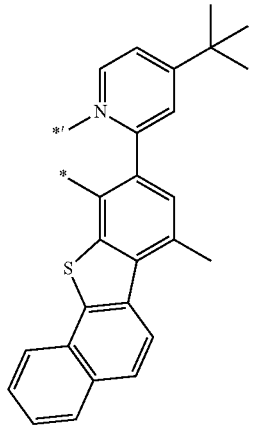
B944
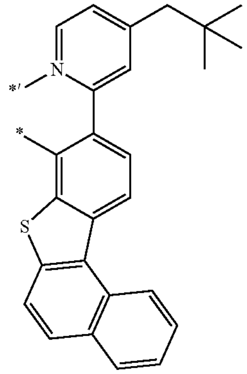
B945
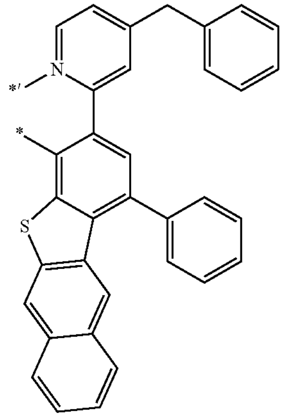
B946
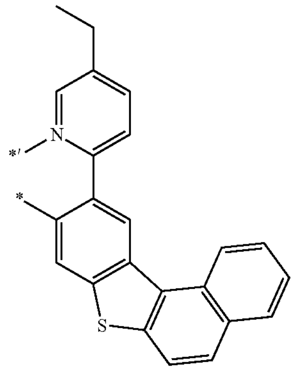
-continued
B947
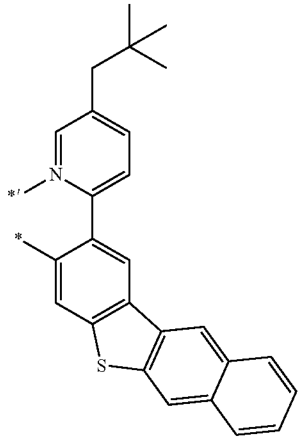
B948
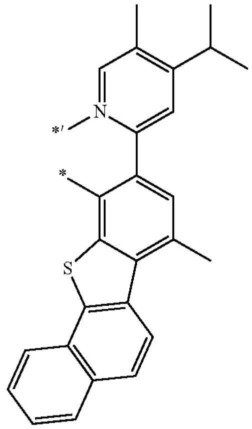
B949
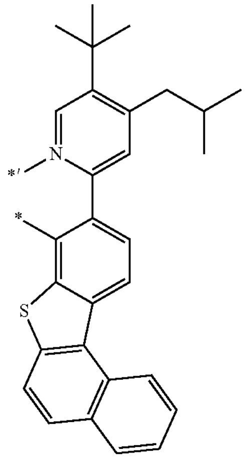

-continued
B950
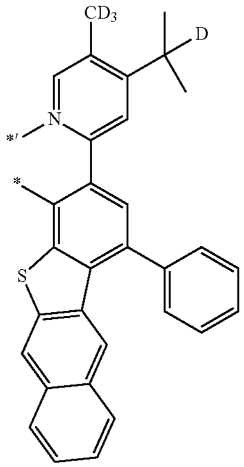
B951
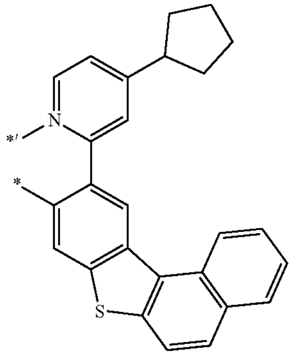
B952
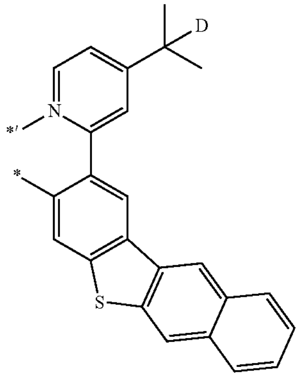
B953
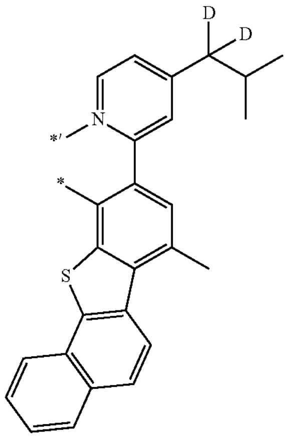
-continued
B954
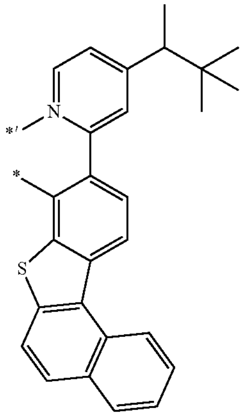
B955
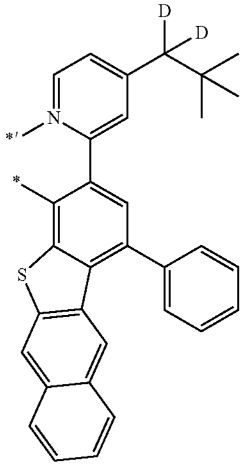
B956
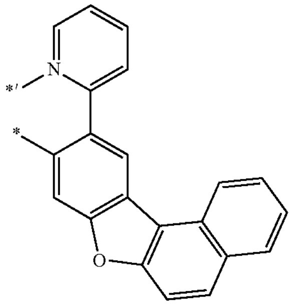
B957
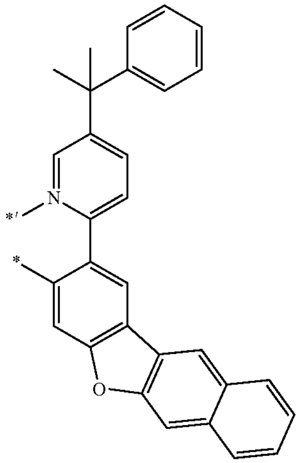

-continued
B958
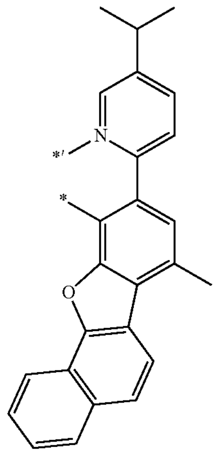
B959
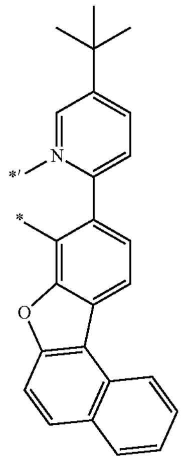
B960
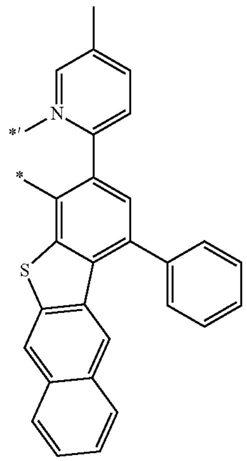
-continued
B961
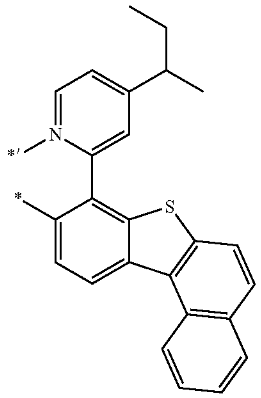
B962
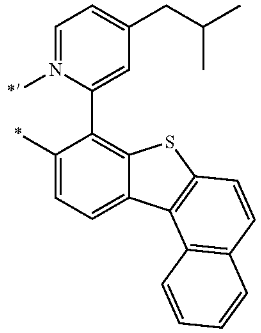
B963
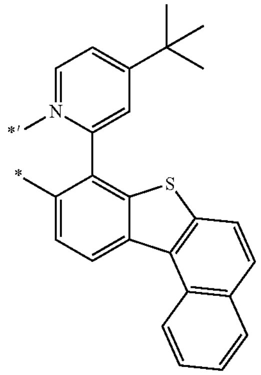
B964
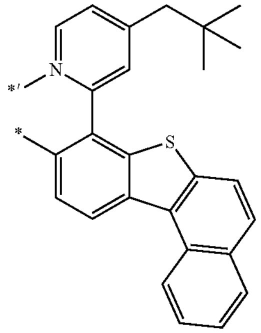

B965
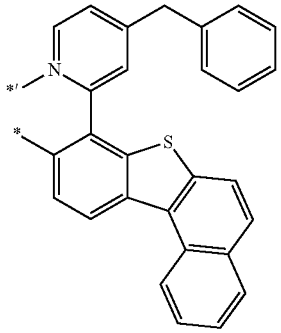
B966
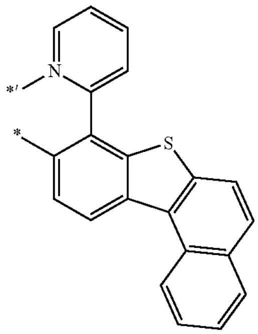
B967
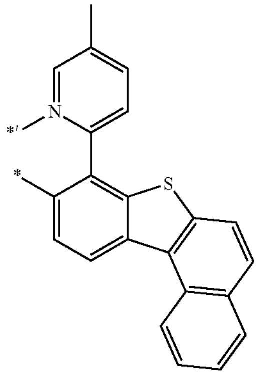
B968
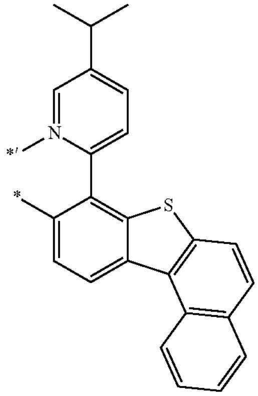
B969
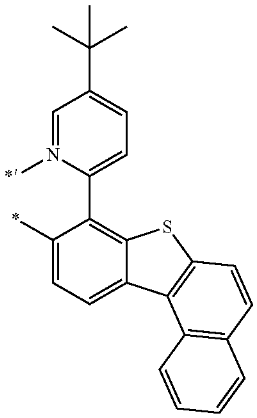
B970
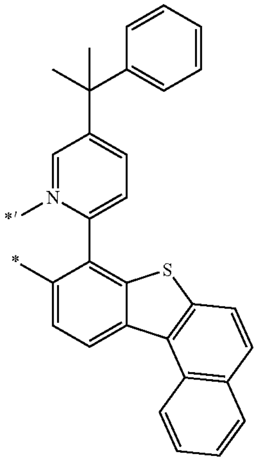
B971
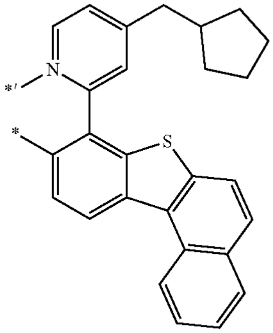
B972
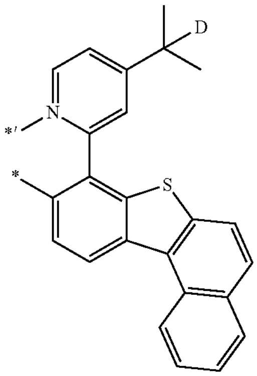

-continued
B973
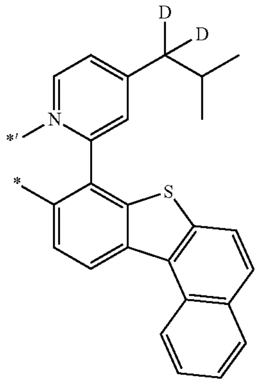
B974
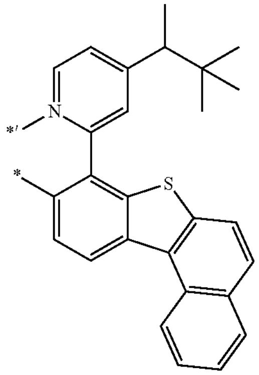
B975
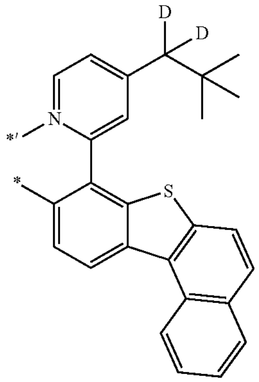
B976
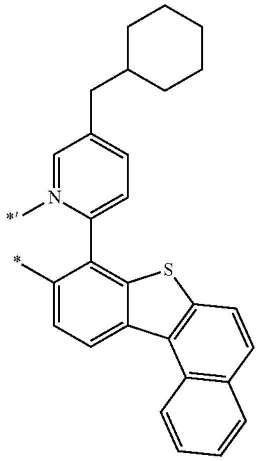
-continued
B977
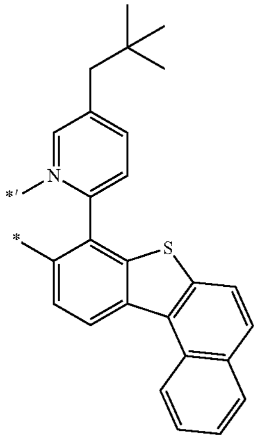
B978
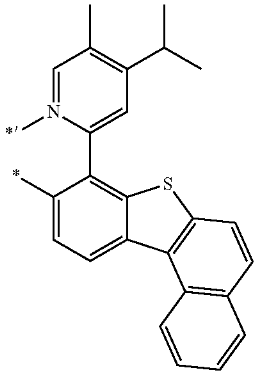
B979
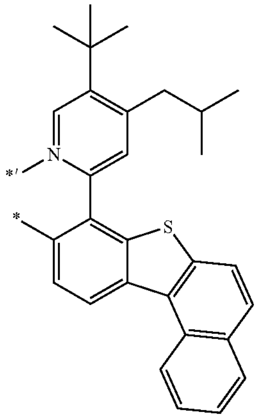
B980
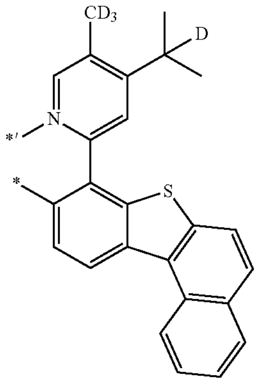

-continued
B981
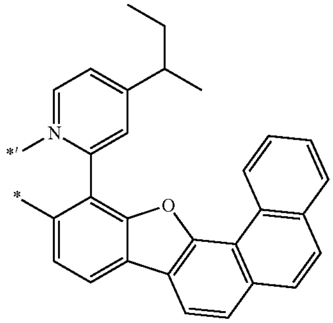
B982
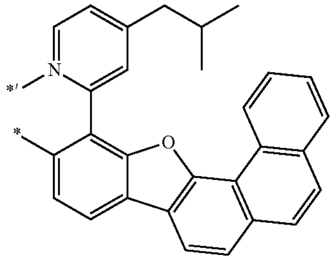
B983
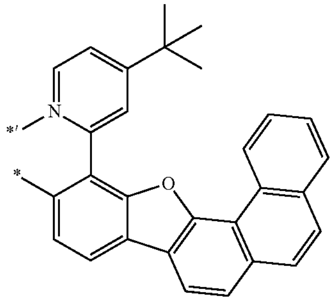
B984
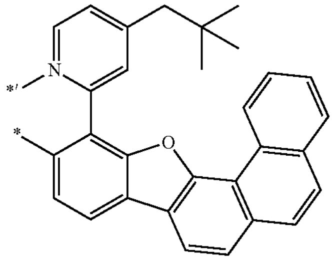
B985
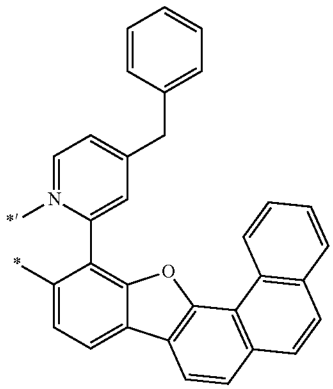
-continued
B986
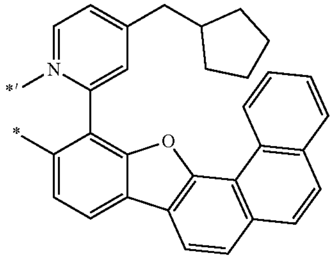
B987
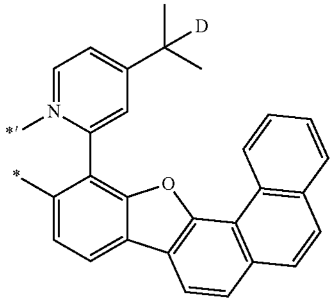
B988
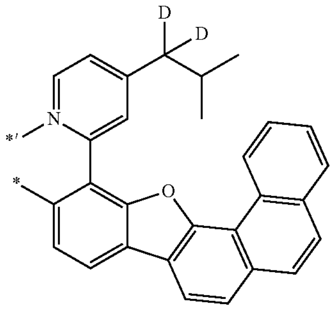
B989
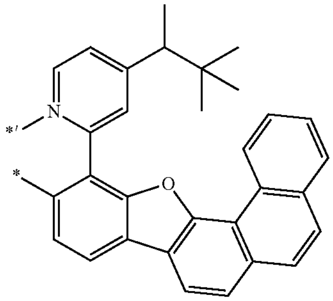
B990
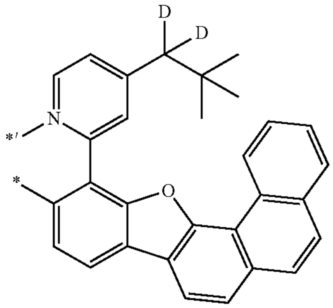

-continued
B991
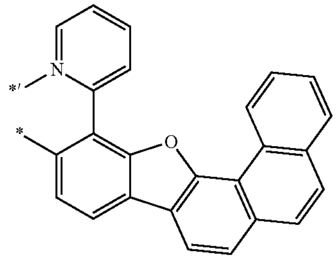
B992
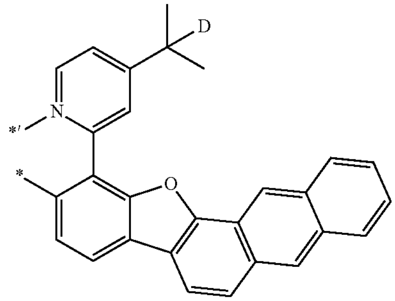
B993
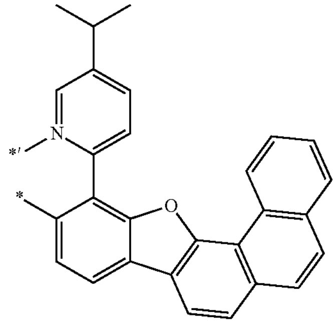
B994
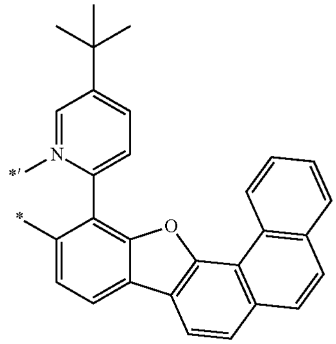
B995
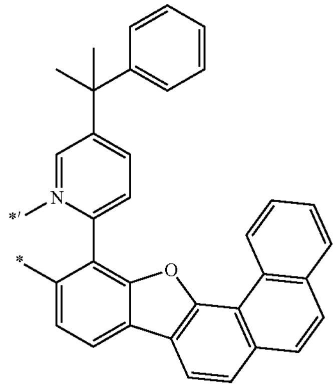
-continued
B996
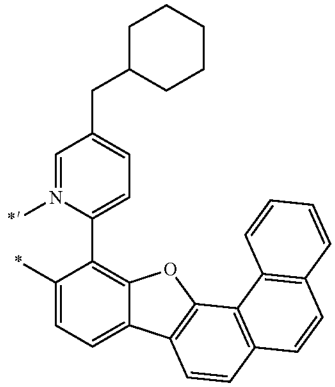
B997
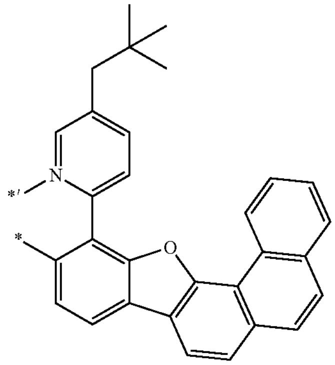
B998
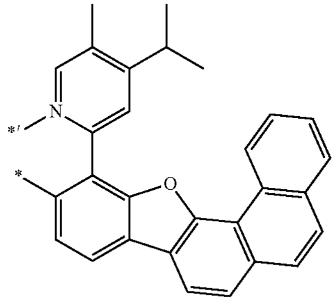
B999
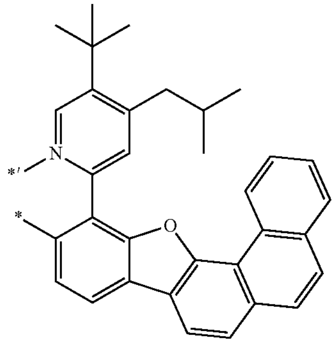

-continued
B1000
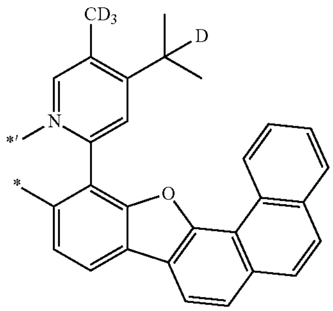
B1001
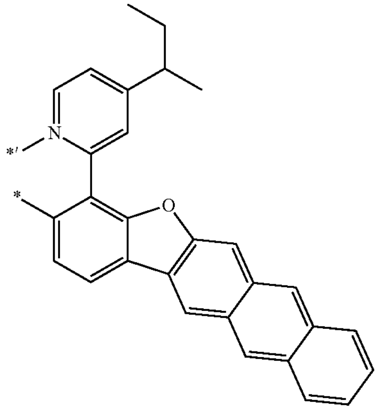
B1002
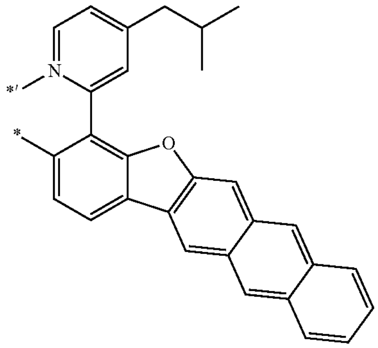
B1003
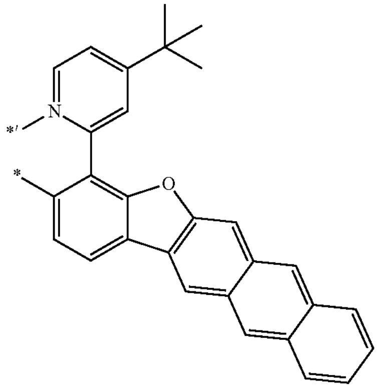
-continued
B1004
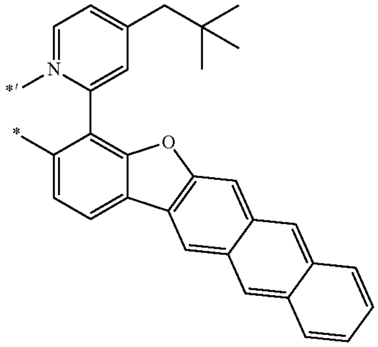
B1005
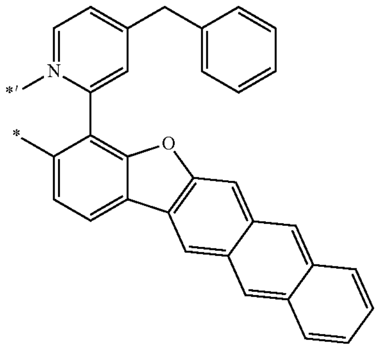
B1006
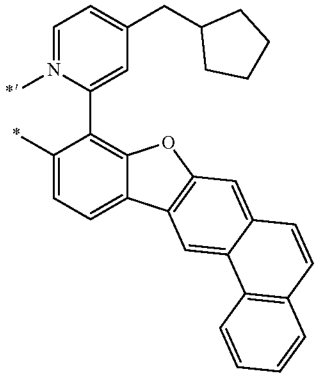
B1007
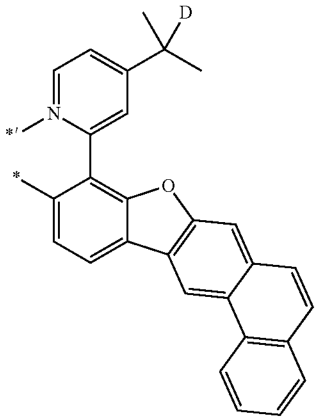

B1008
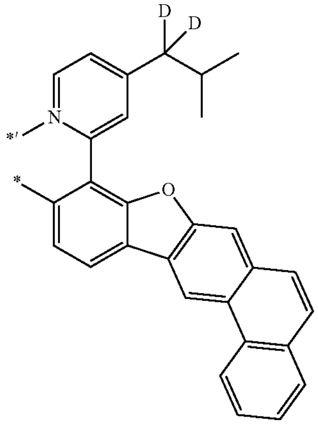
B1009
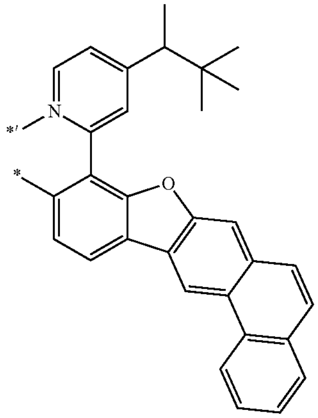
B1010
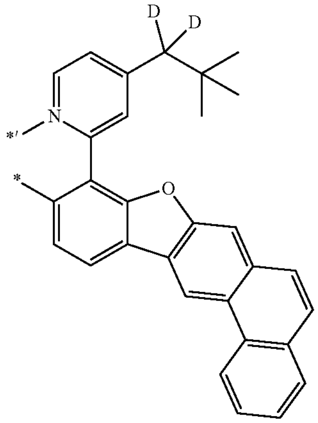
B1011
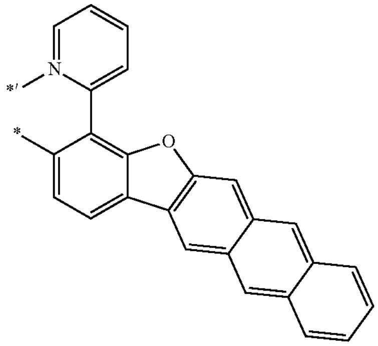
B1012
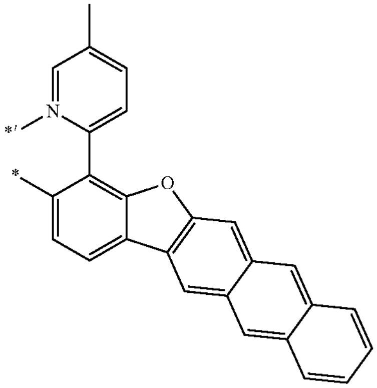
B1013
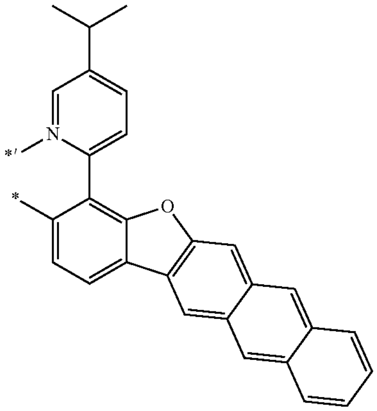
B1014
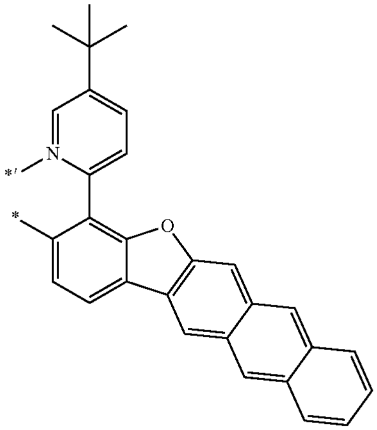

-continued
B1014
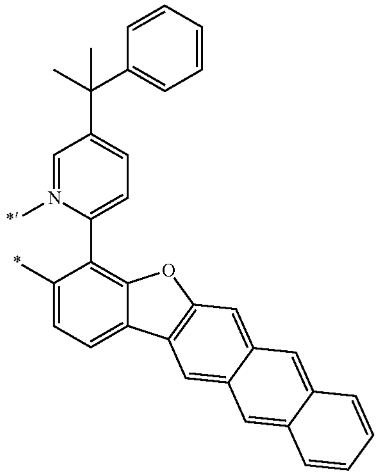
B1016
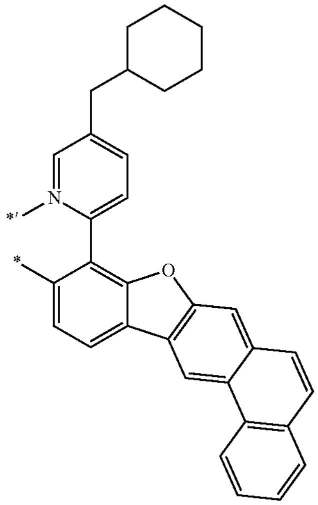
B1017
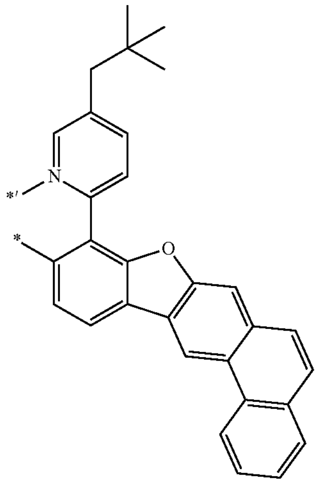
-continued
B1018
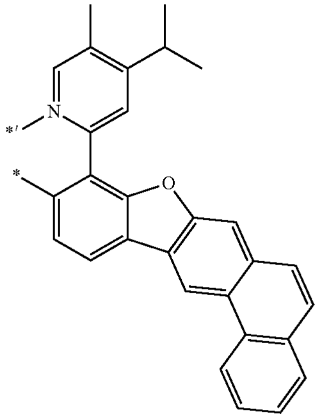
B1019
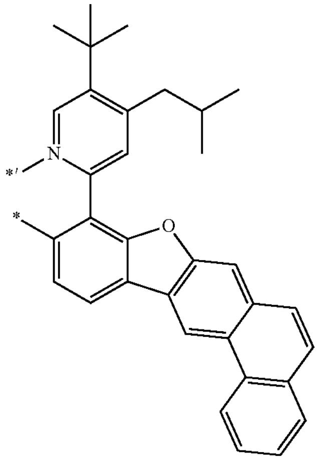
B1020
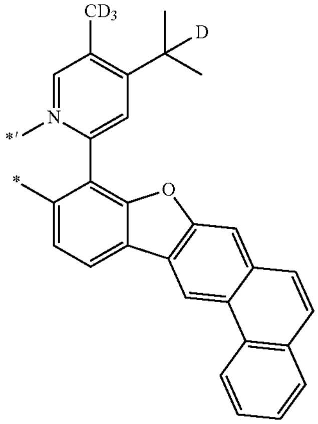
B1021
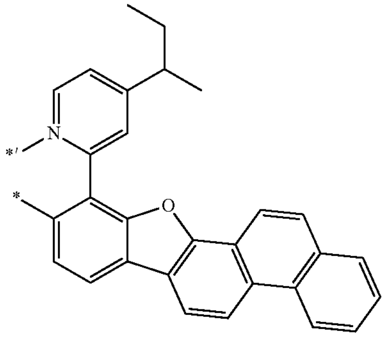

-continued
B1022
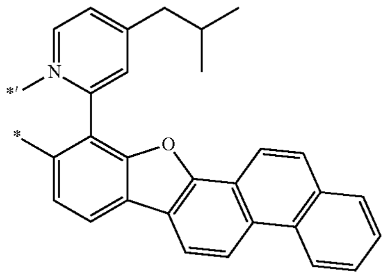
B1023
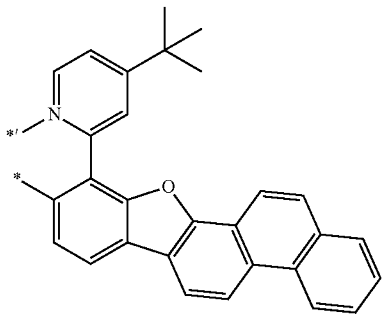
B1024
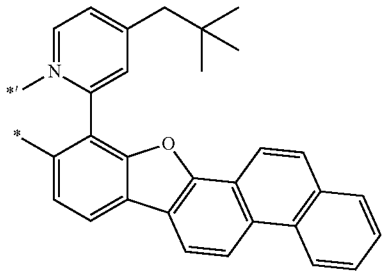
B1025
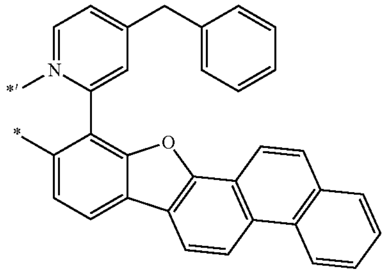
B1026
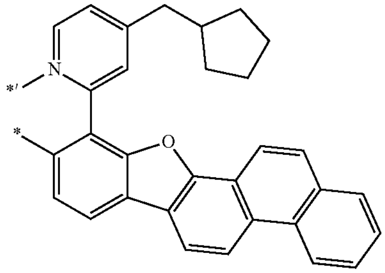
-continued
B1027
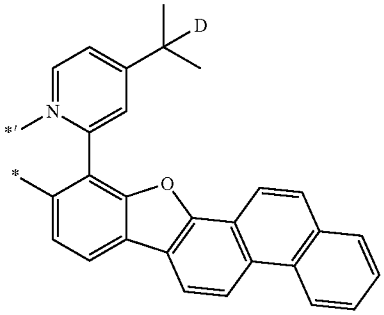
B1027
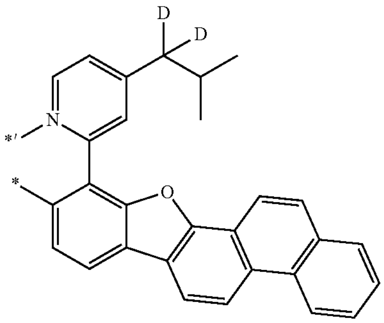
B1029
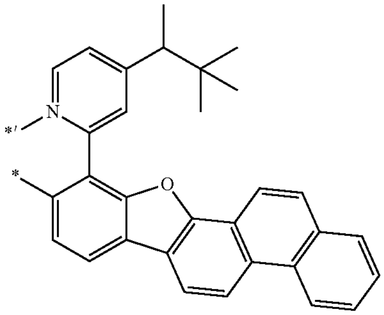
B1030
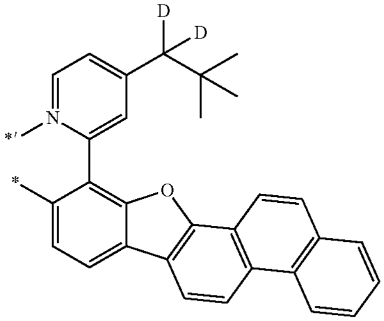
B1031
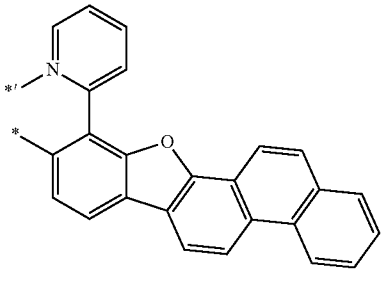

-continued
B1032
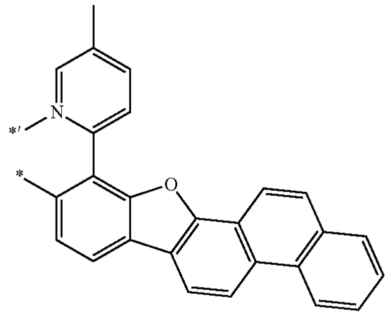
B1033
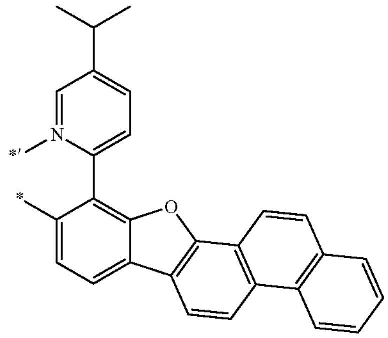
B1034
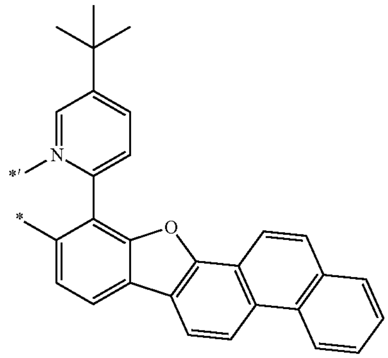
B1035
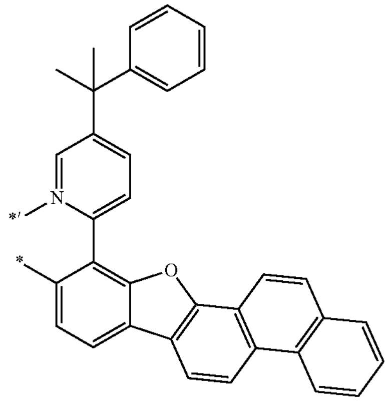
-continued
B1036
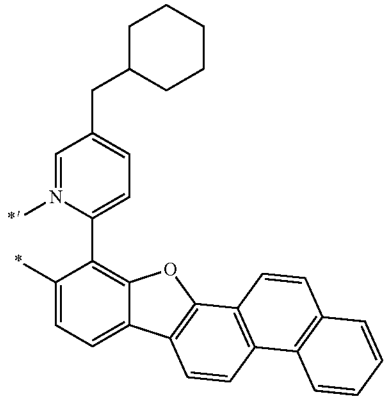
B1037
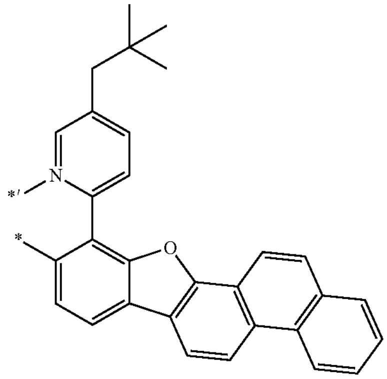
B1038
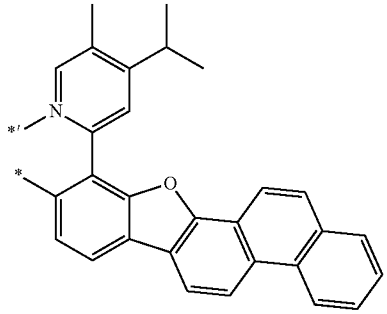
B1039
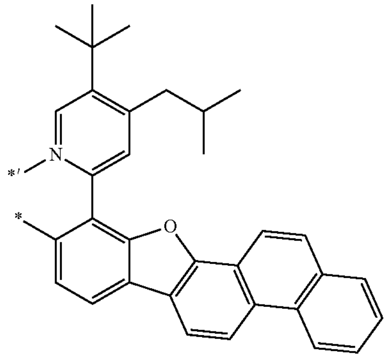

-continued
B1040
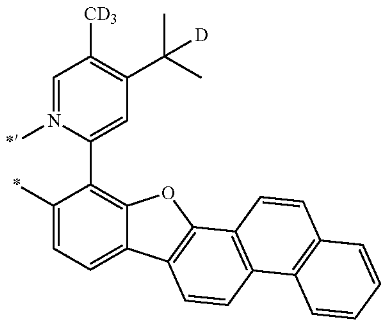
B1041
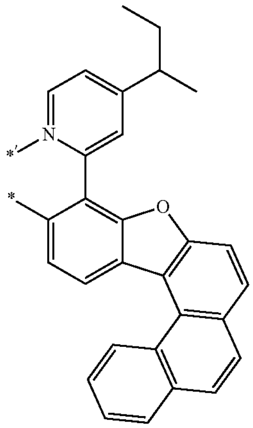
B1042
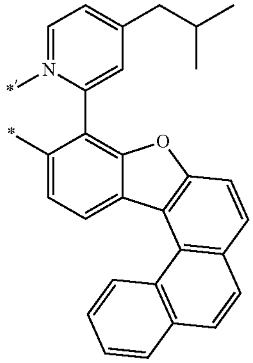
B1043
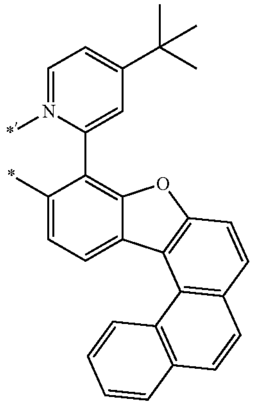
-continued
B1044
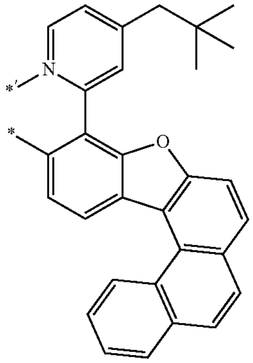
B1045
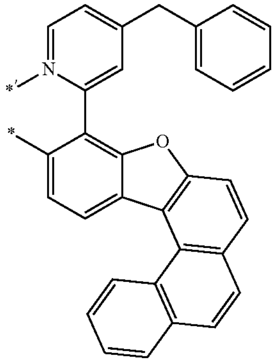
B1046
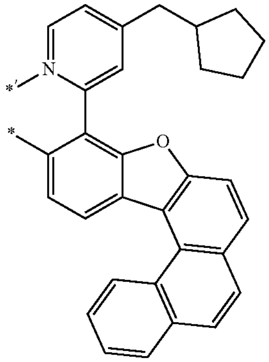
B1047
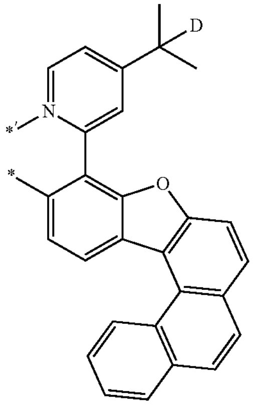

-continued
B1048
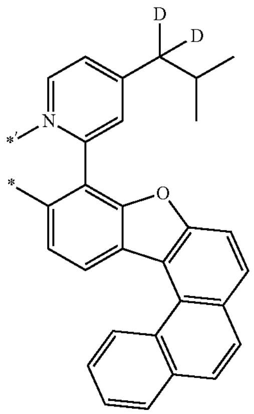
B1049
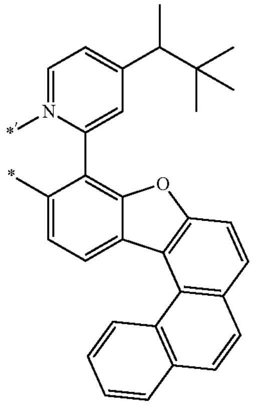
B1050
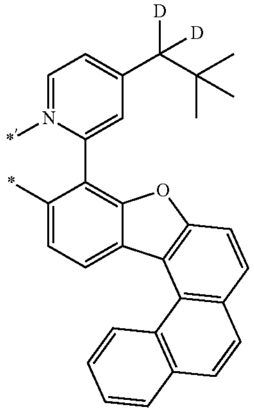
B1051
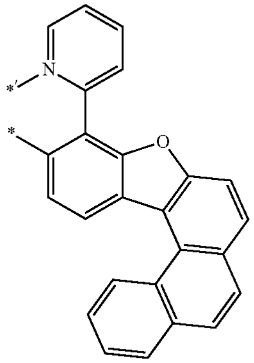
-continued
B1052
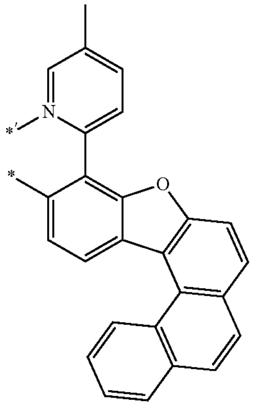
B1053
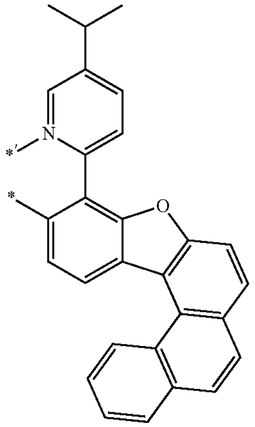
B1054
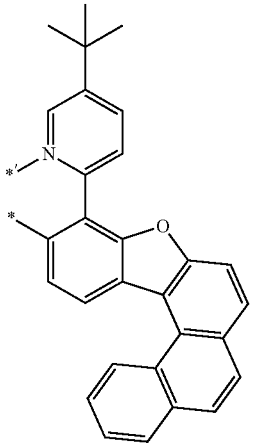

-continued
B1055
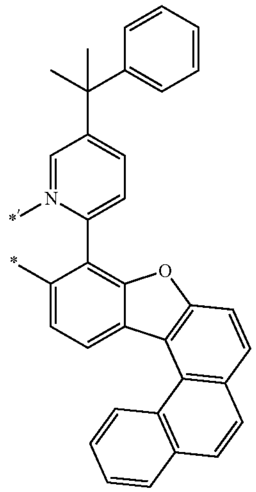
B1056
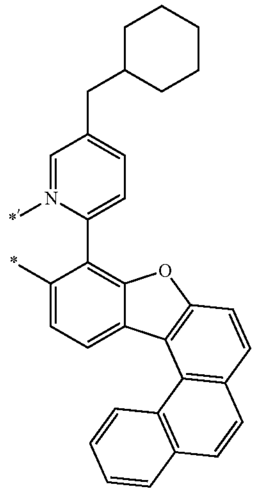
B1057
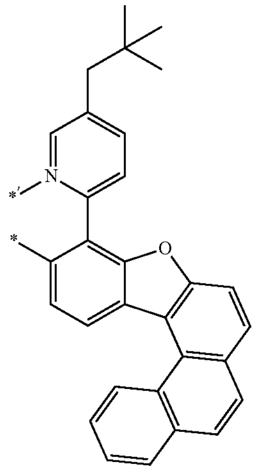
-continued
B1058
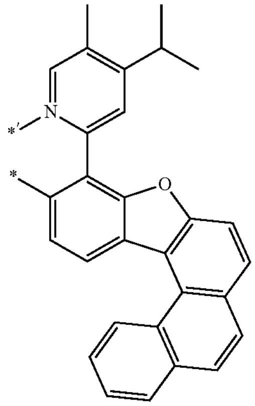
B1059
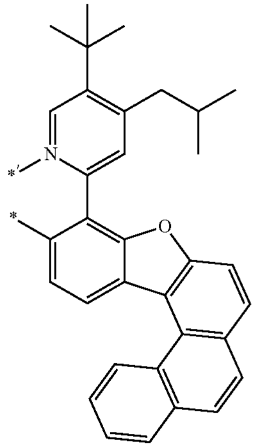
B1060
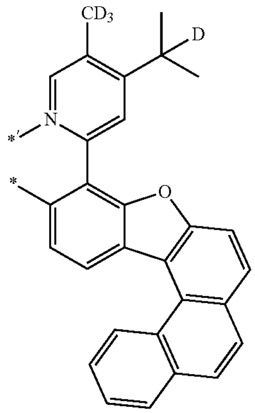
B1061
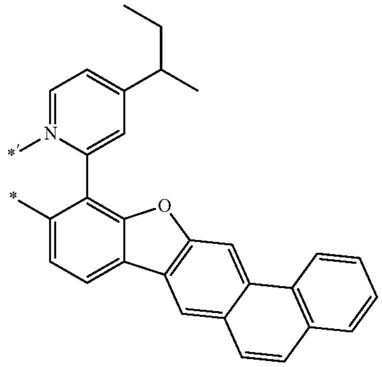

B1062
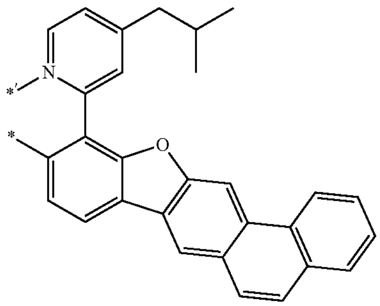
B1063
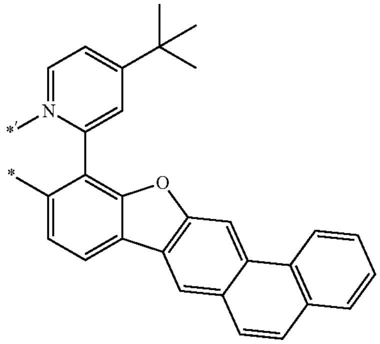
B1064
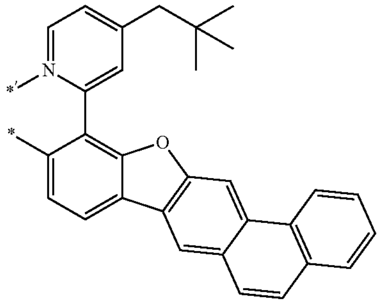
B1065
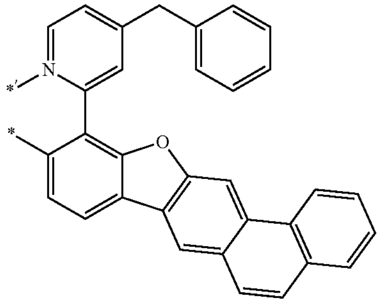
B1066
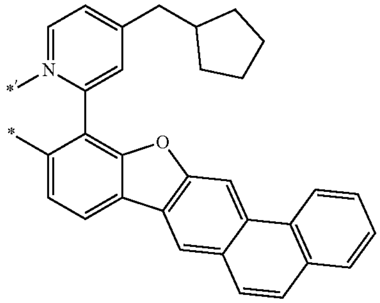
B1067
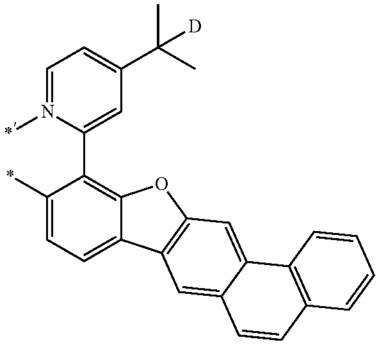
B1068
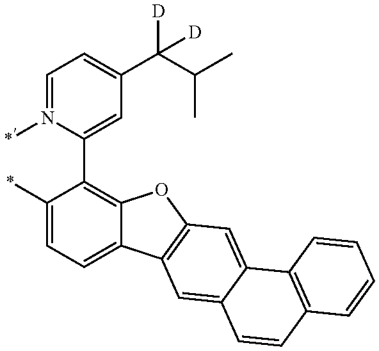
B1069
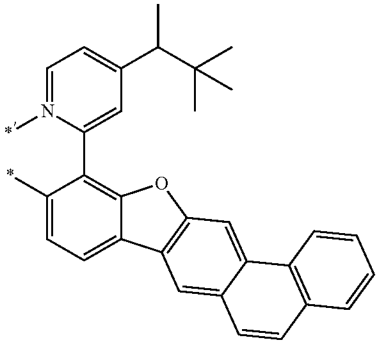
B1070
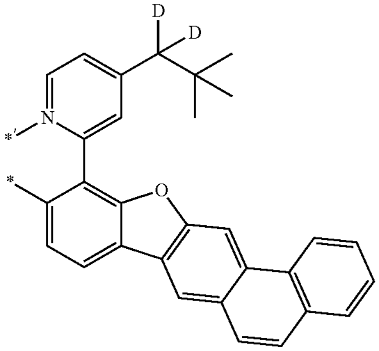

-continued
B1071
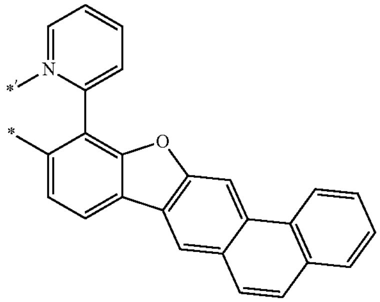
B1072
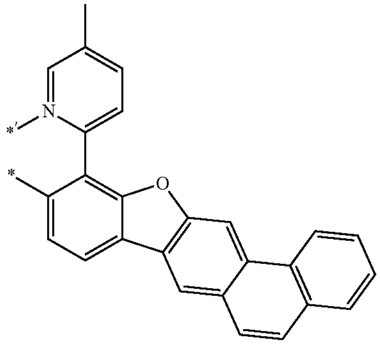
B1073
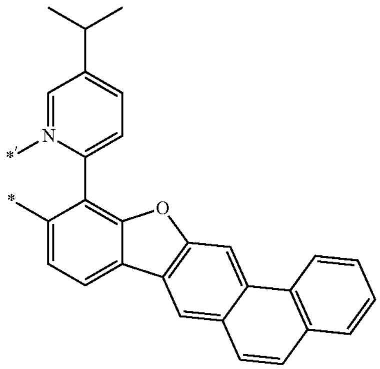
B1074
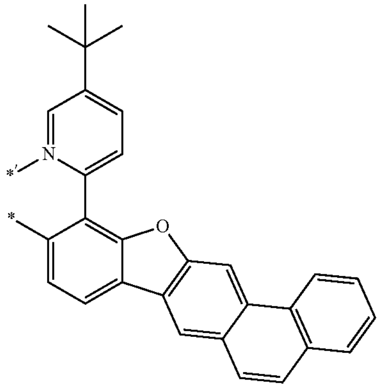
-continued
B1075
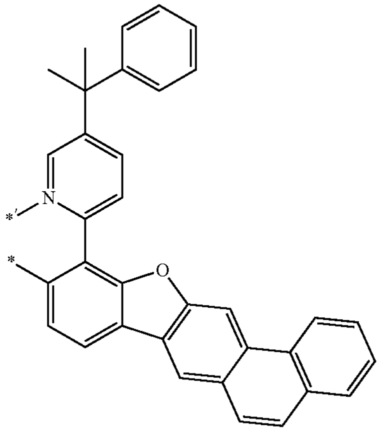
B1076
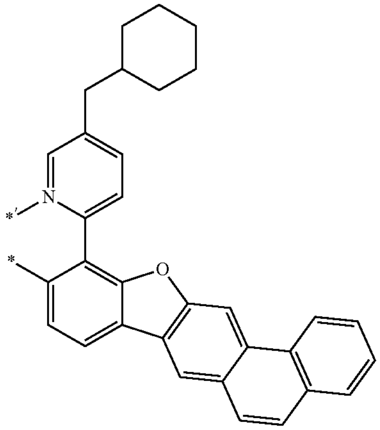
B1077
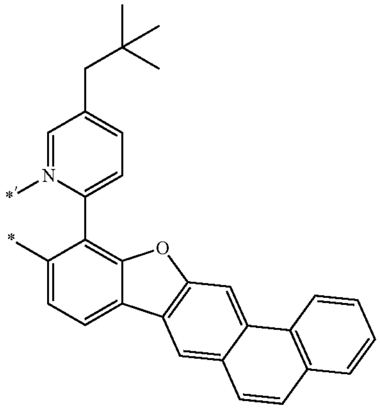
B1078
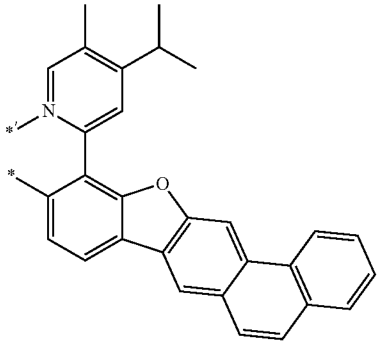

-continued
B1079
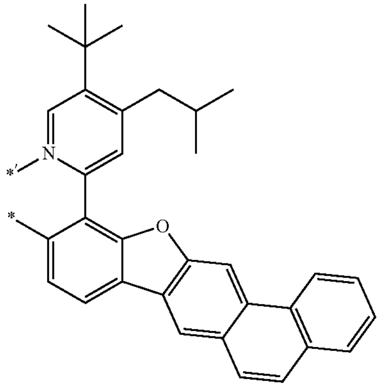
B1080
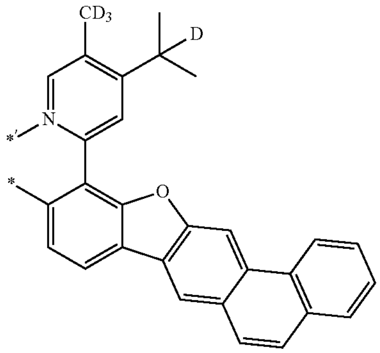
B1081
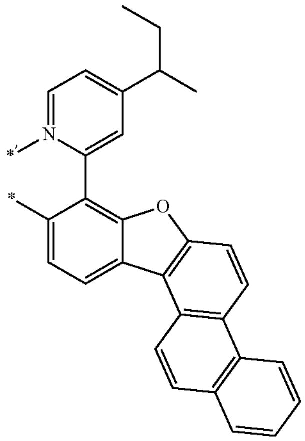
B1082
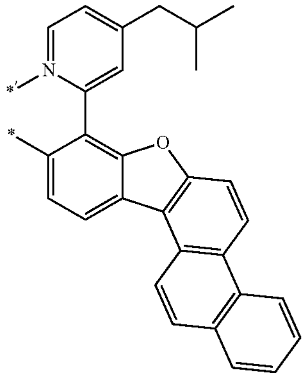
-continued
B1083
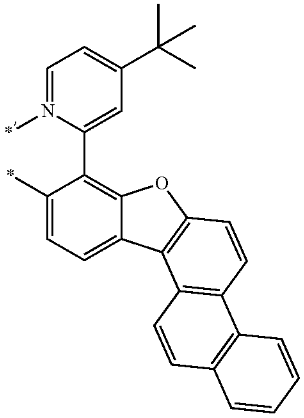
B1084
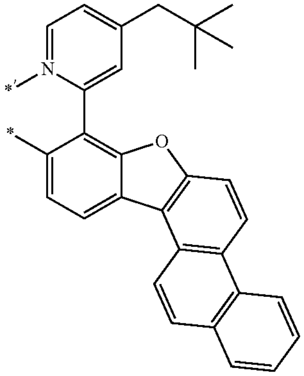
B1085
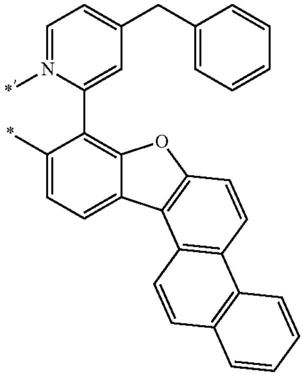
B1086
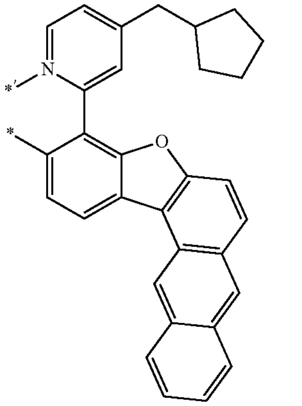

-continued
B1087
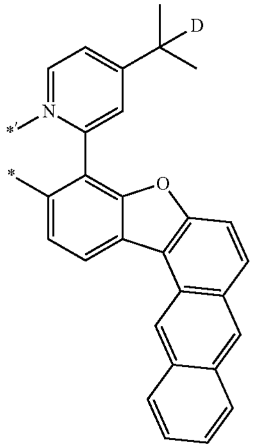
B1088
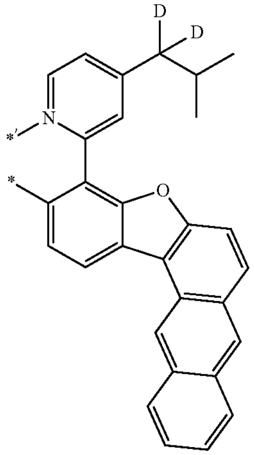
B1089
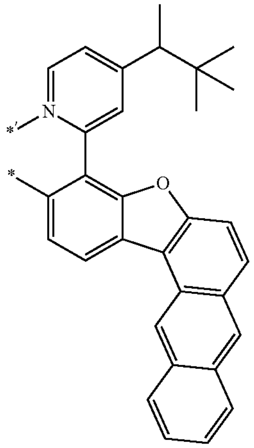
-continued
B1090
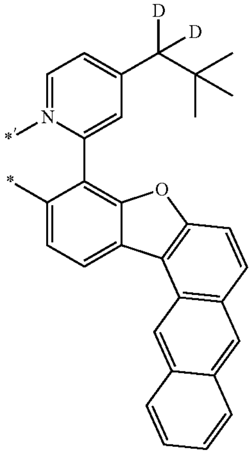
B1091
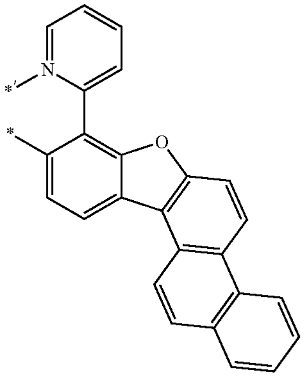
B1092
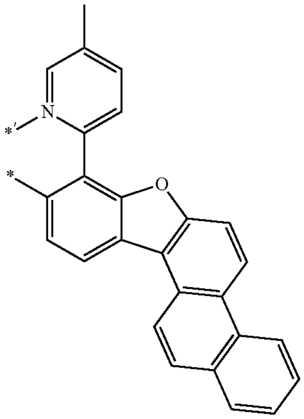

-continued
B1093
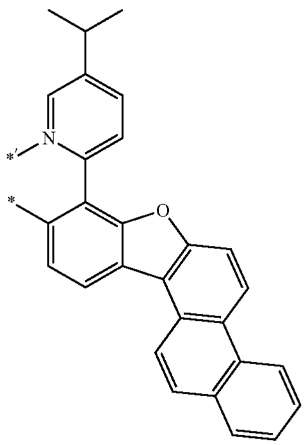
B1094
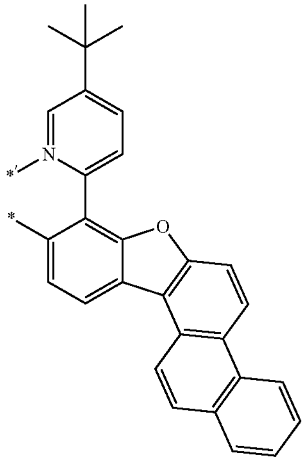
B1095
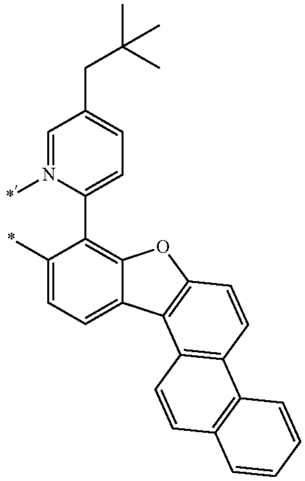
-continued
B1096
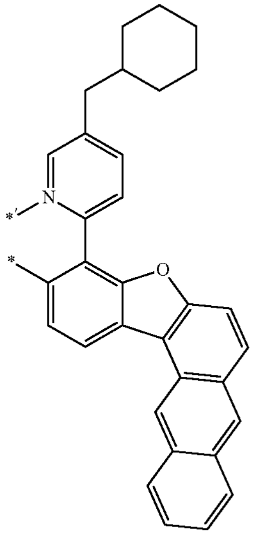
B1097
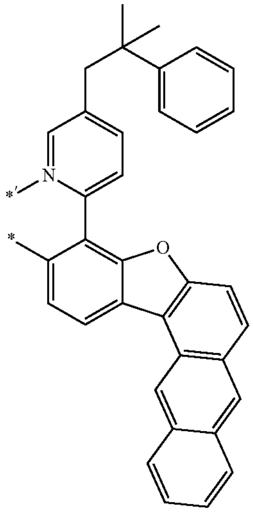
B1098
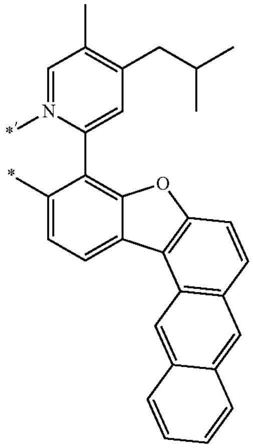

-continued
B1099
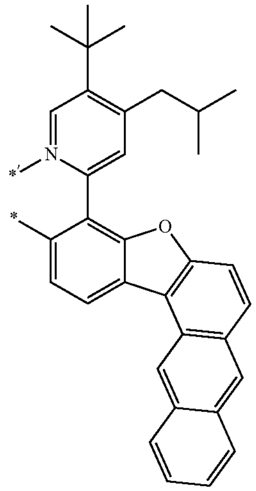
B1100
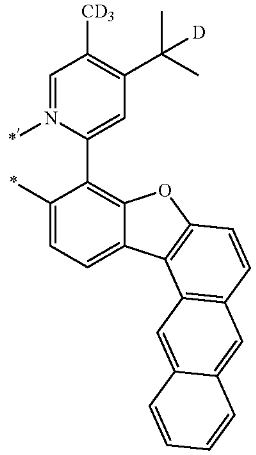
B1101
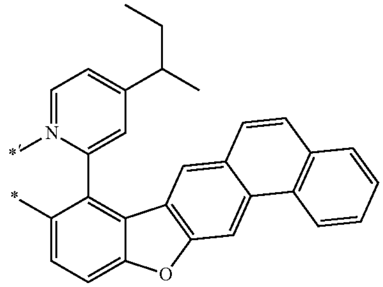
B1102
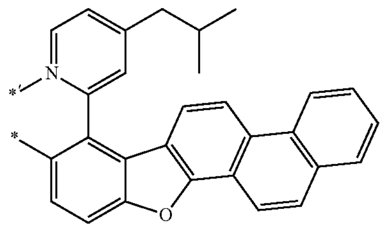
-continued
B1103
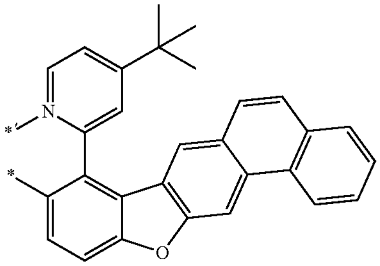
B1104
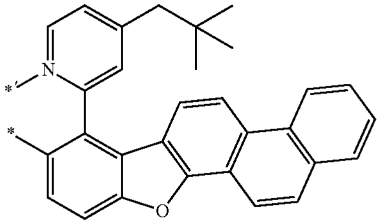
B1150
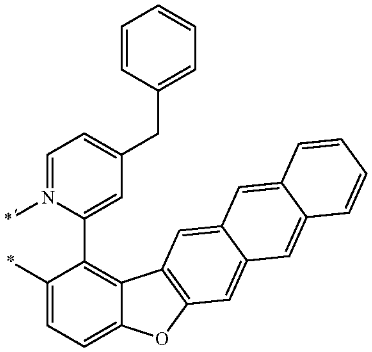
B1106
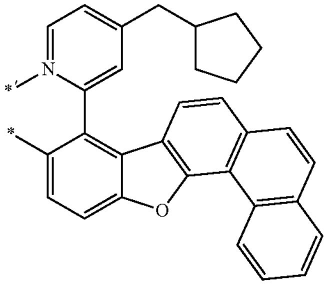
B1107
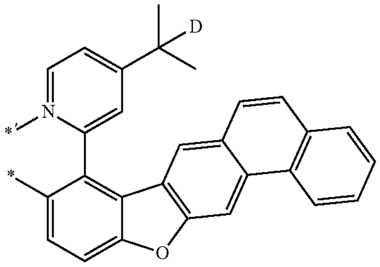

-continued
B1108
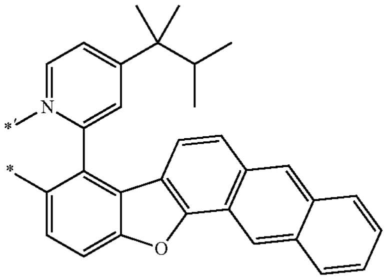
B1109
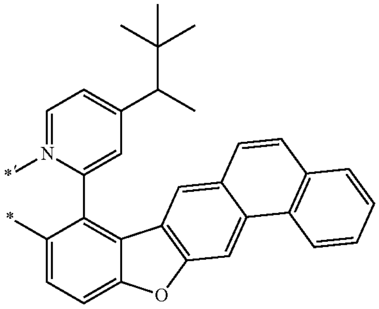
B1110
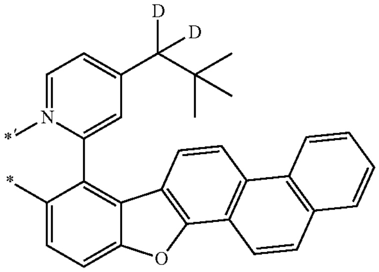
B1111
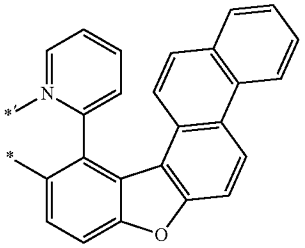
B1112
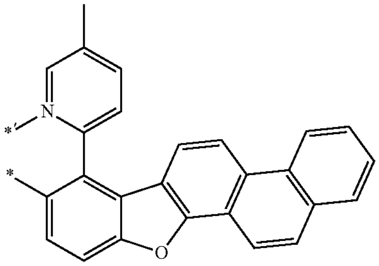
-continued
B1113
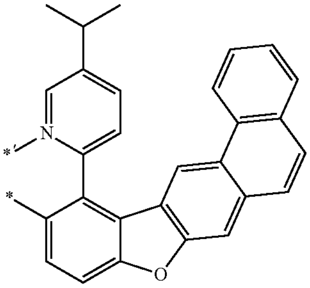
B1114
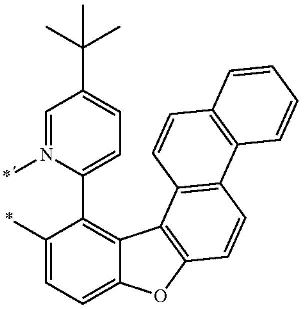
B1115
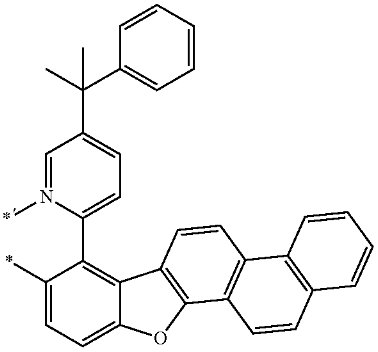
B1116
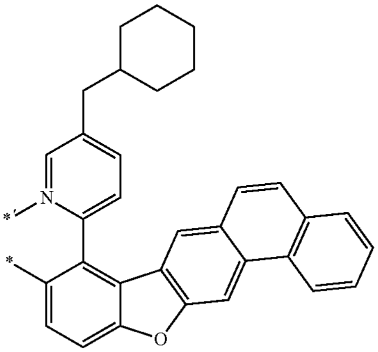
B1117
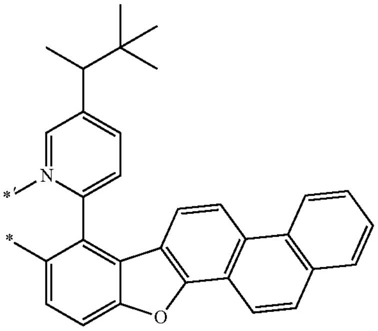

-continued
B1118
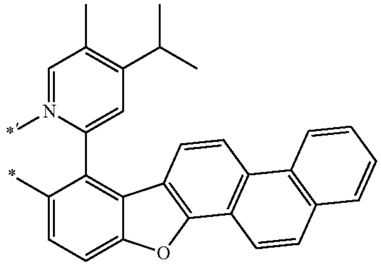
B1119
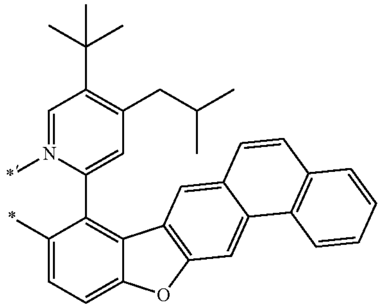
B1120
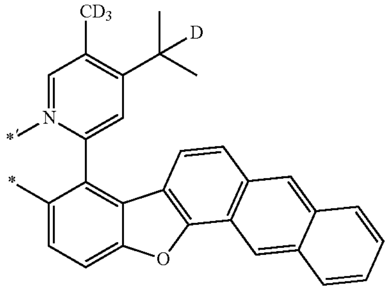
B1121
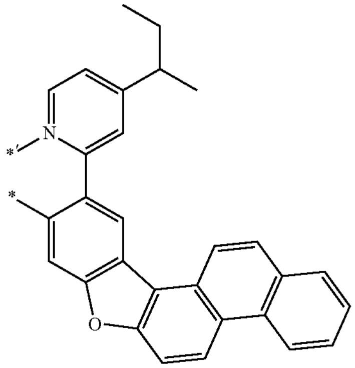
B1122
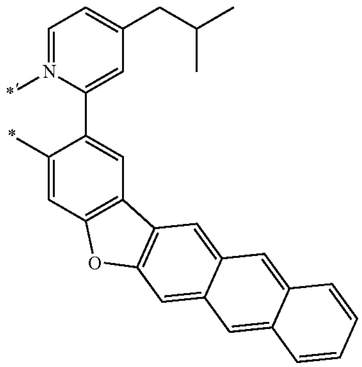
-continued
B1123
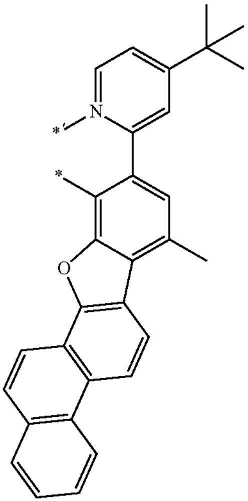
B1124
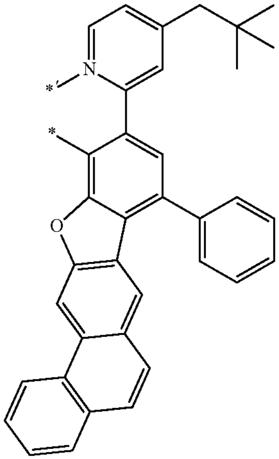
B1125
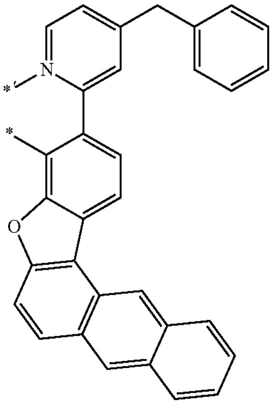

-continued
B1126
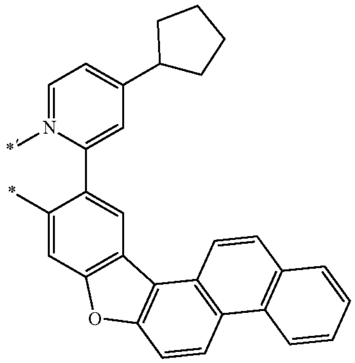
B1127
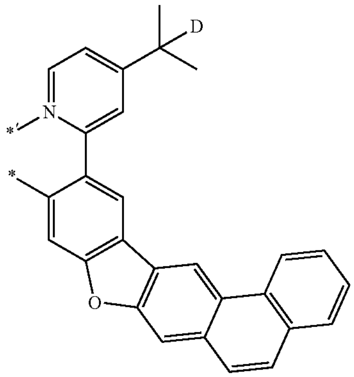
B1128
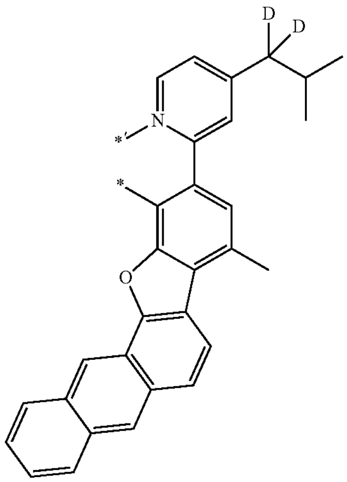
-continued
B1129
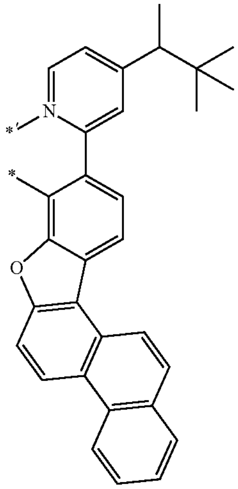
B1130
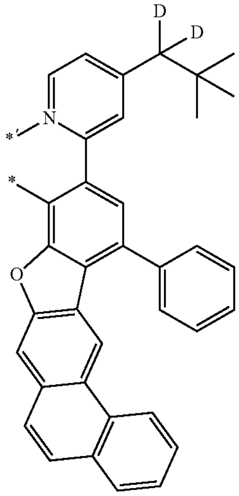
B1131
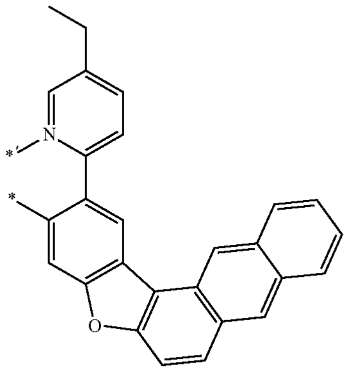

-continued
B1132
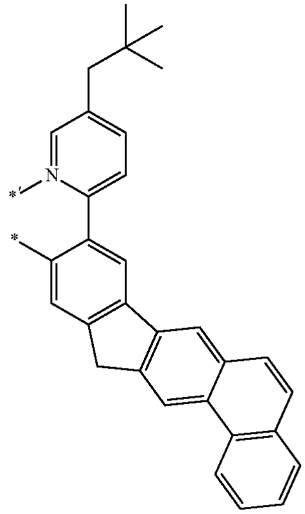
B1133
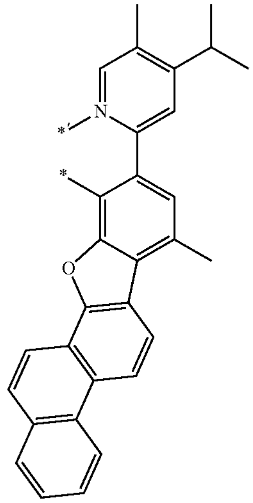
B1134
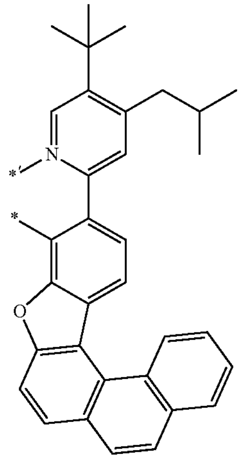
-continued
B1135
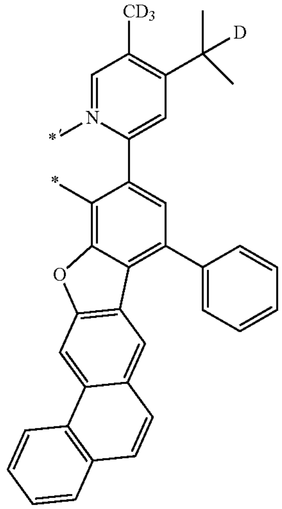
B1136
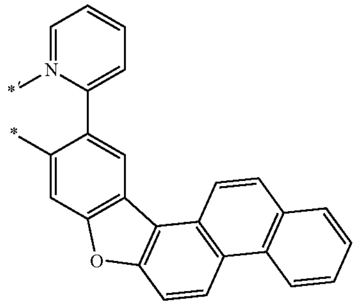
B1137
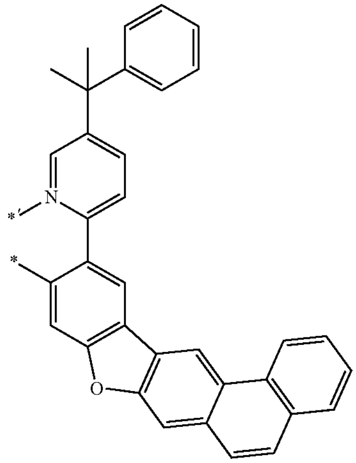

-continued
B1138
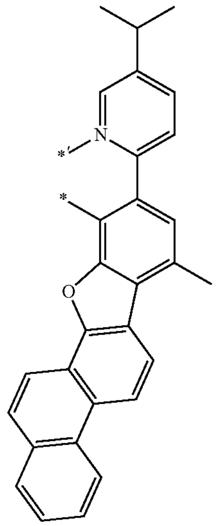
B1139
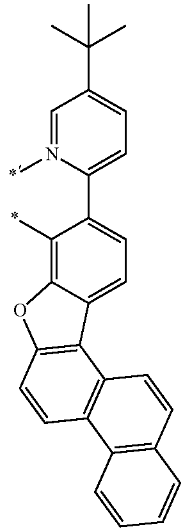
B1140
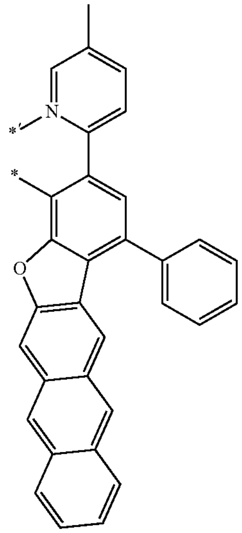
-continued
B1141
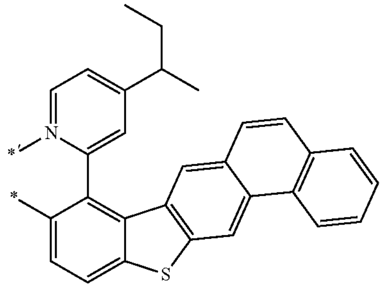
B1142
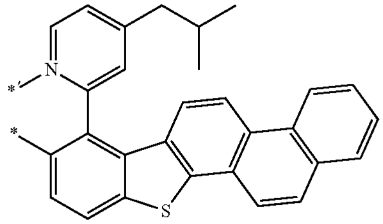
B1143
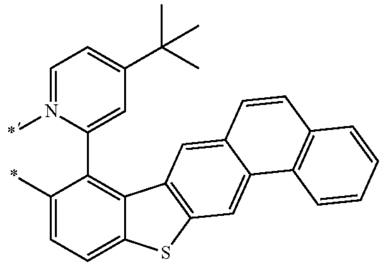
B1144
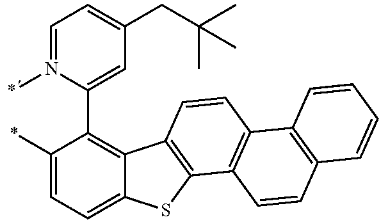
B1145
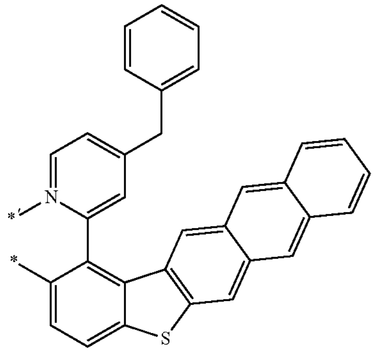

-continued
B1146
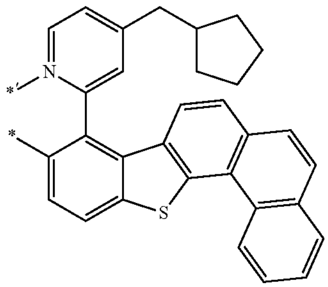
B1147
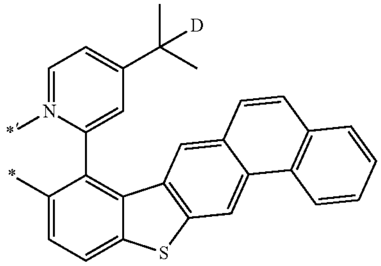
B1148
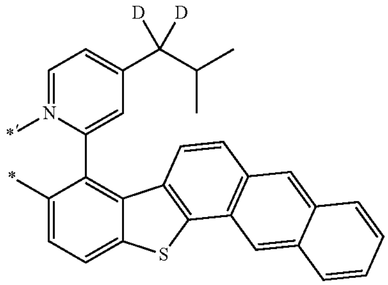
B1149
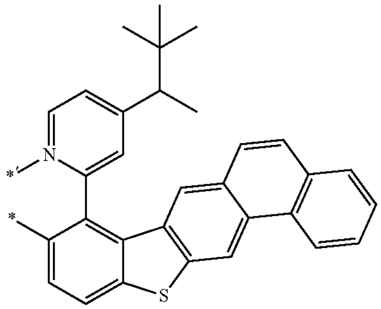
B1150
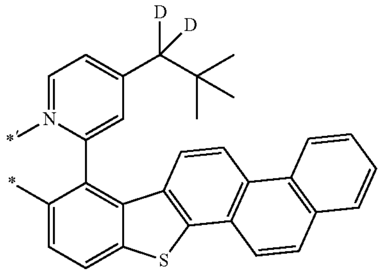
-continued
B1151
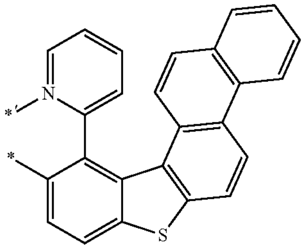
B1152
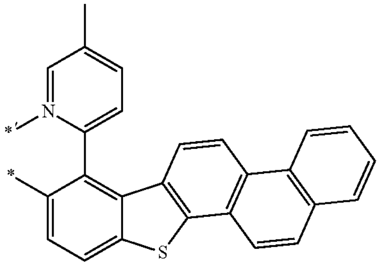
B1153
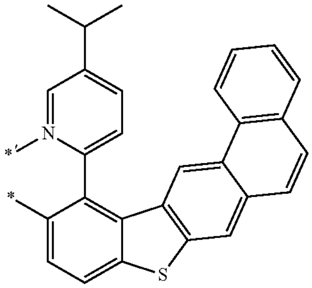
B1154
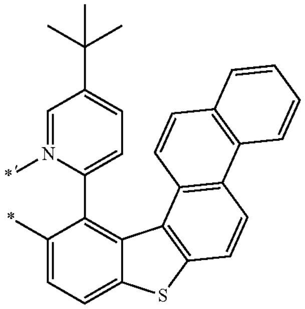
B1155
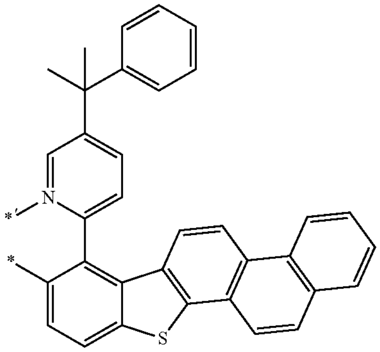

-continued
B1156
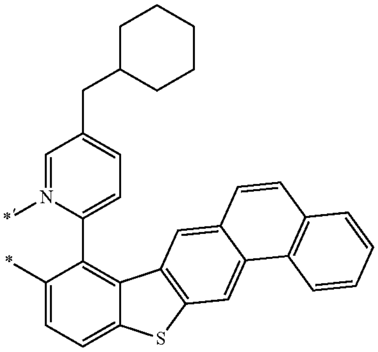
B1157
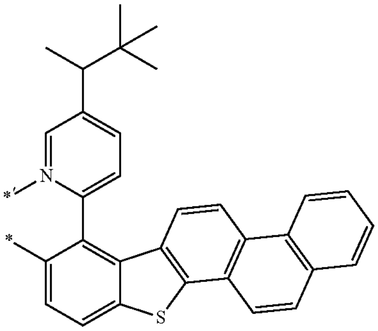
B1158
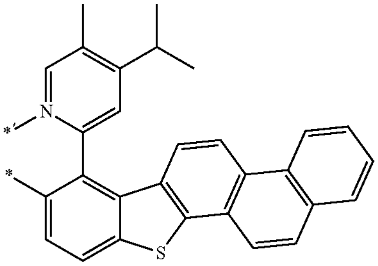
B1159
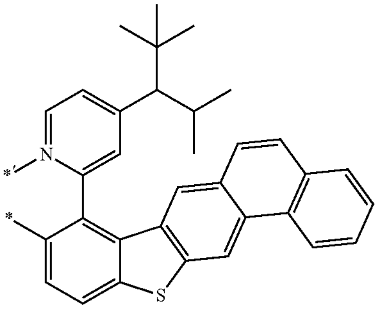
B1160
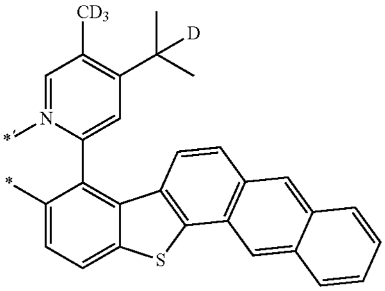
B1161
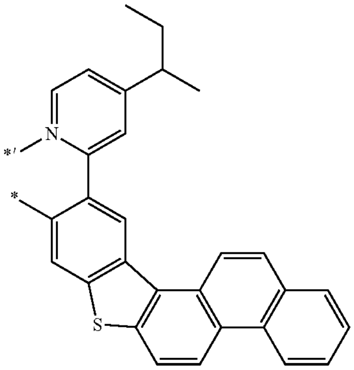
B1162
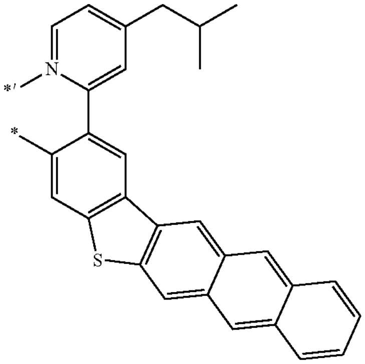
B1163
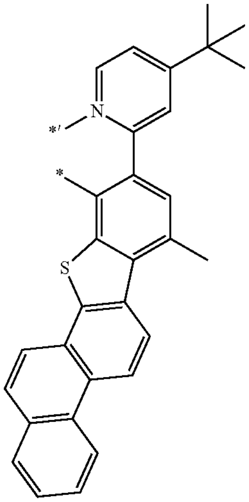

-continued
B1164
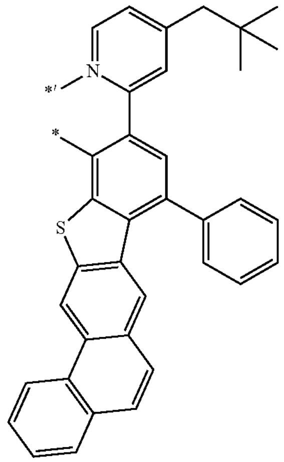
B1165
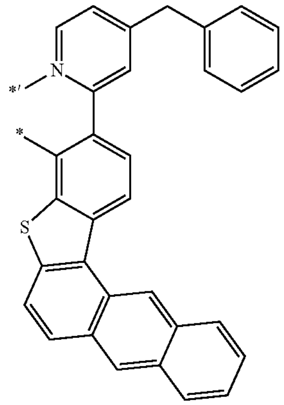
B1166
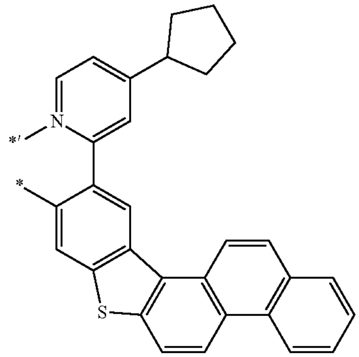
B1167
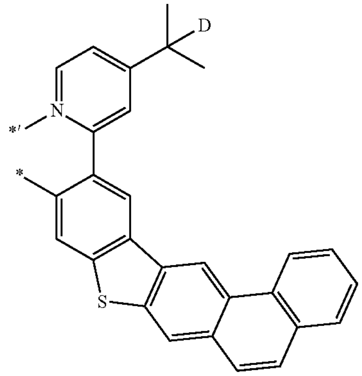
-continued
B1168
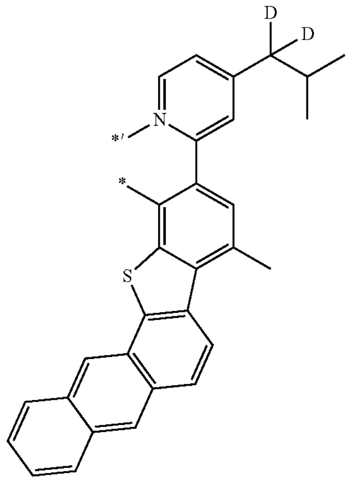
B1169
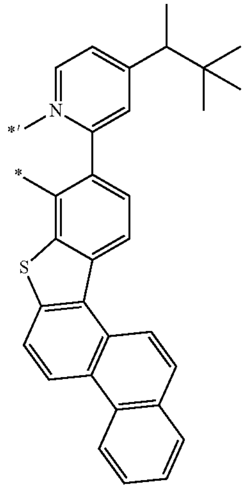
B1170
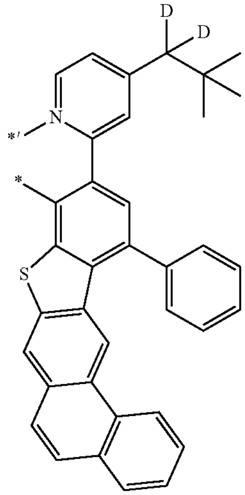

-continued
B1171
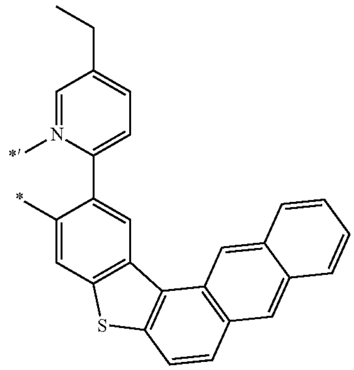
B1172
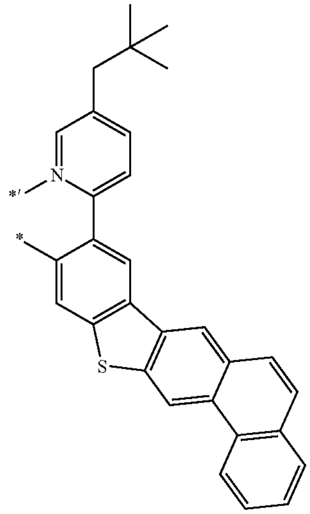
B1173
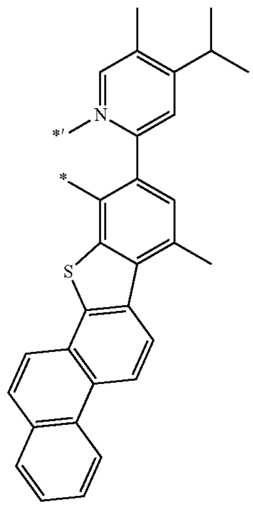
-continued
B1174
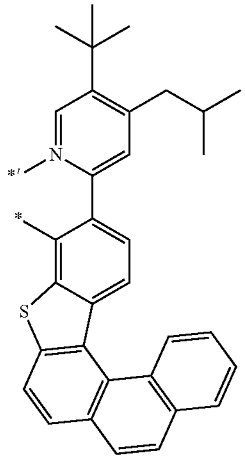
B1175
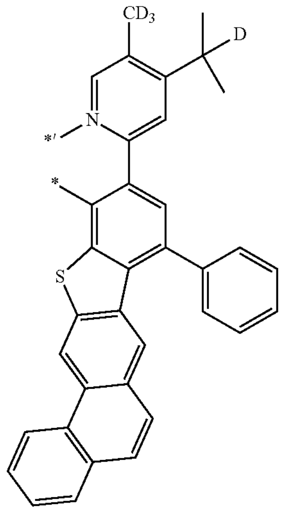
B1176
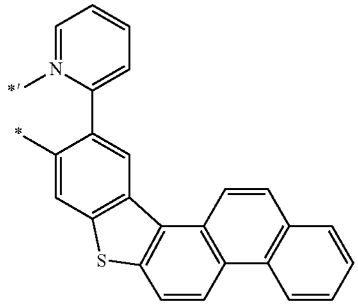

-continued
B1177
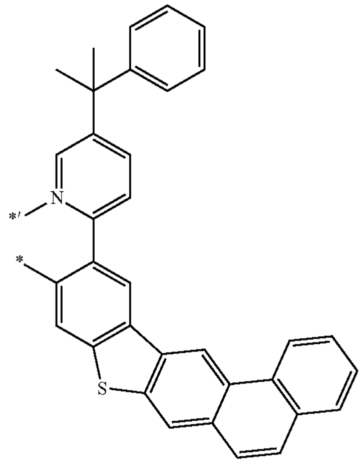
B1178
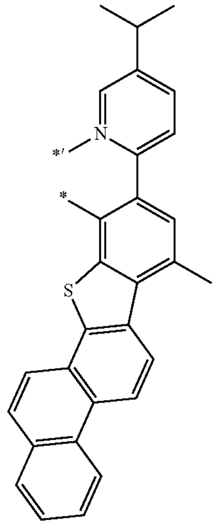
B1179
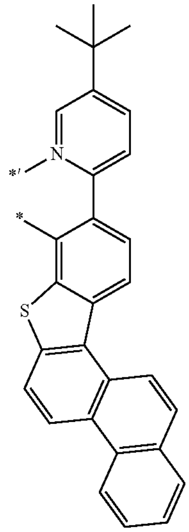
-continued
B1180
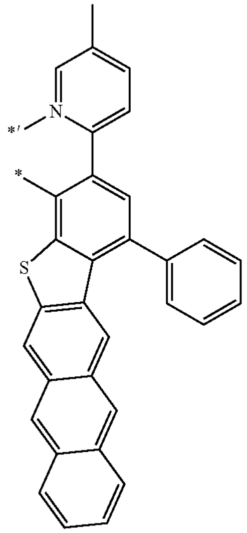
B1181
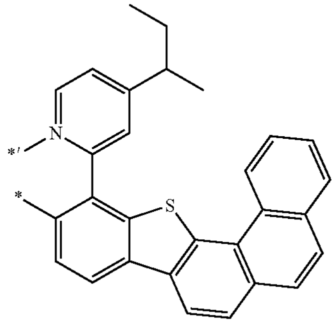
B1182
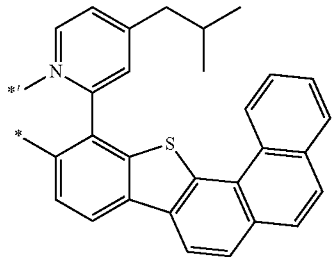
B1183
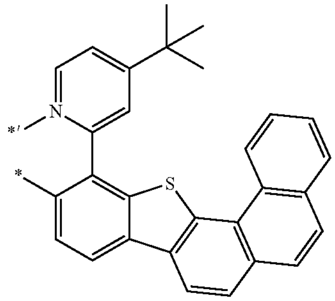

-continued
B1184
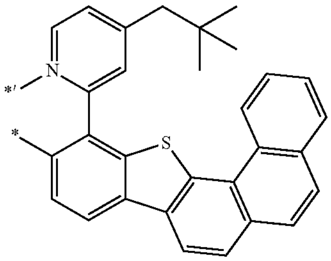
B1185
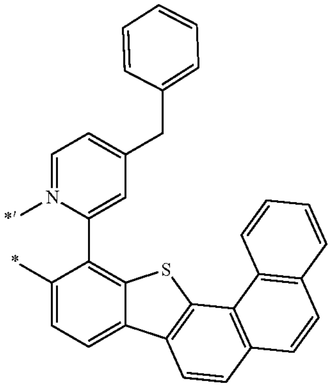
B1186
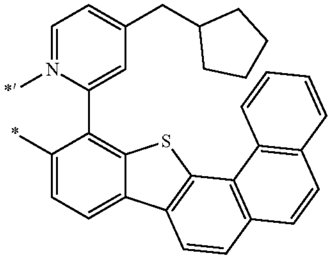
B1187
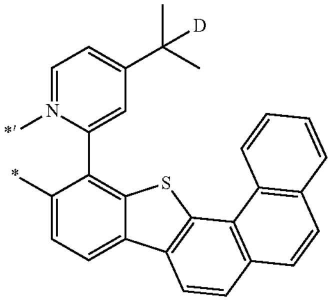
B1188
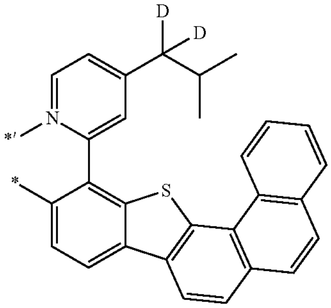
-continued
B1189
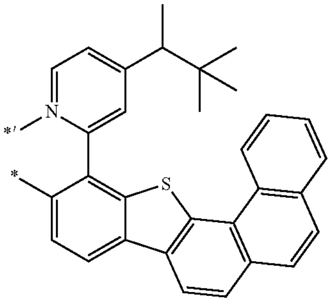
B1190
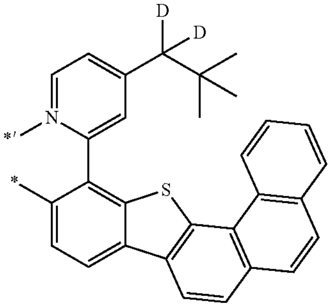
B1191
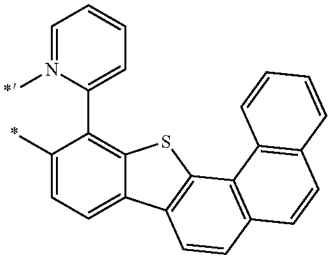
B1192
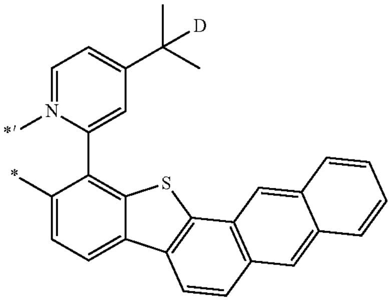
B1193
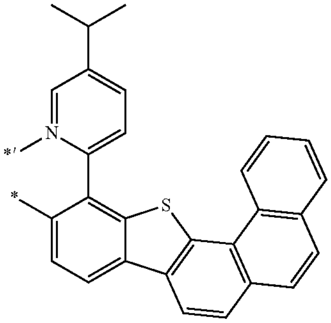

-continued
B1194
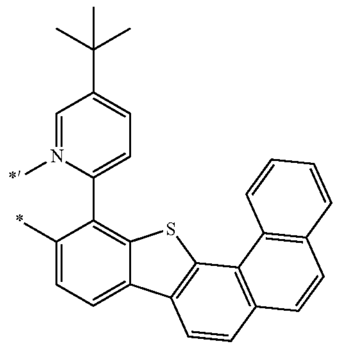
B1195
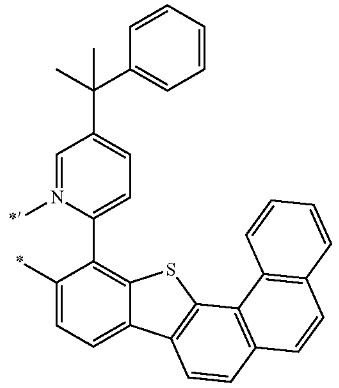
B1196
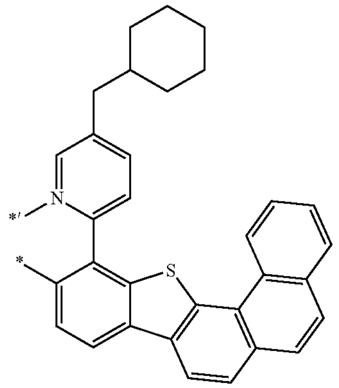
B1197
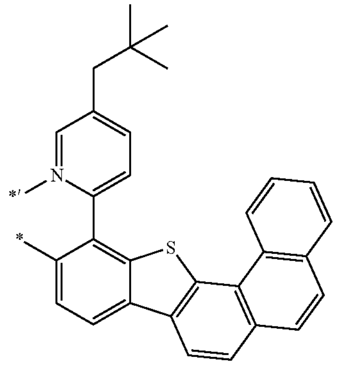
-continued
B1198
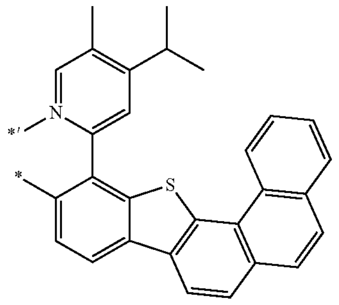
B1199
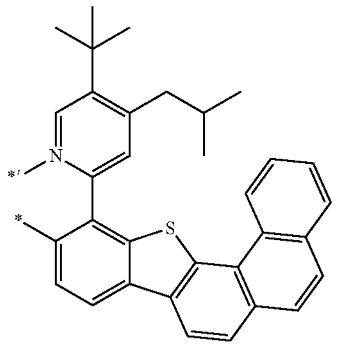
B1200
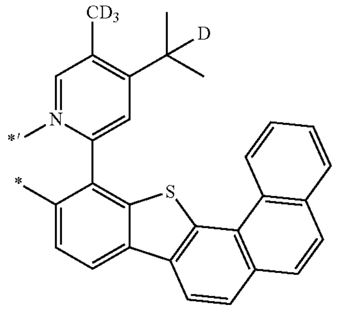
B1201
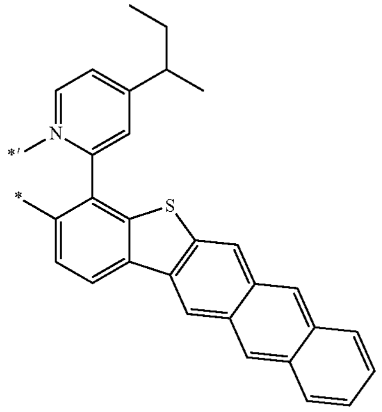

-continued
B1202
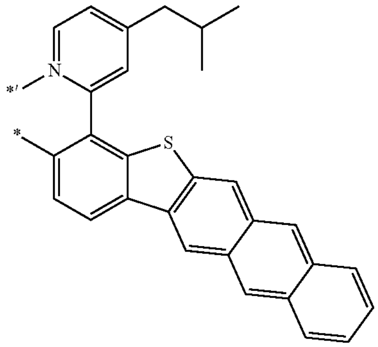
B1203
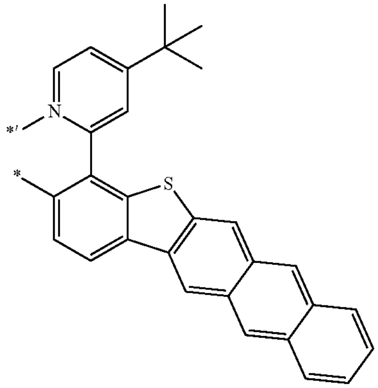
B1204
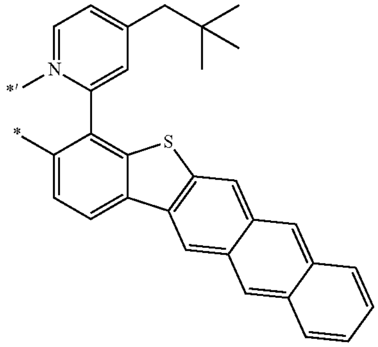
B1205
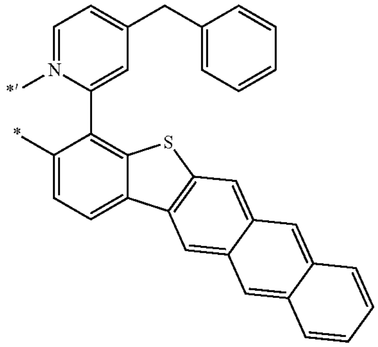
-continued
B1206
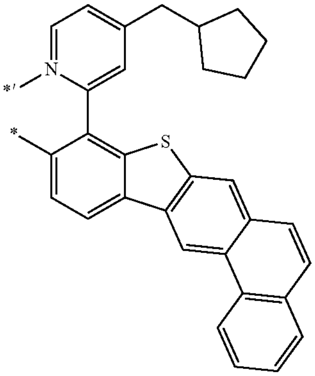
B1207
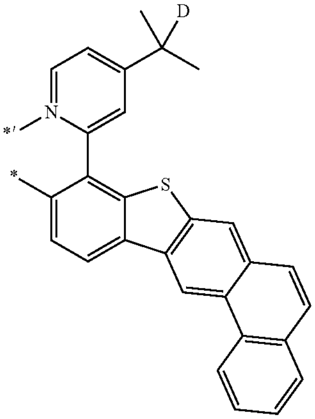
B1208
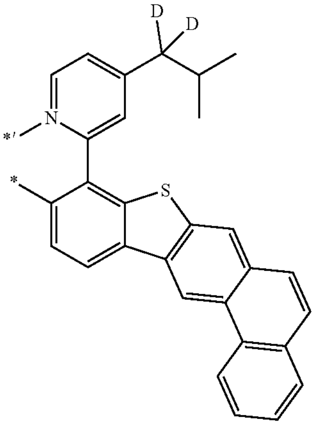
B1209
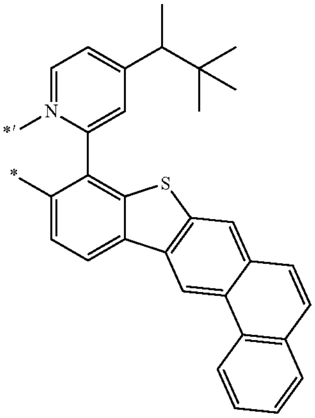

-continued
B1210
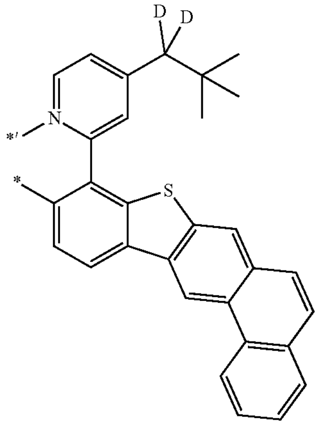
B1211
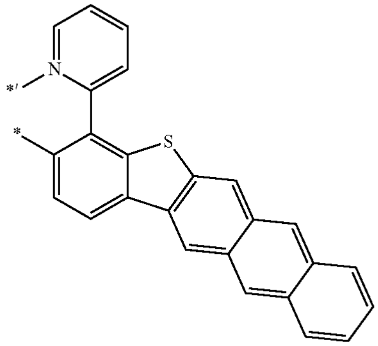
B1212
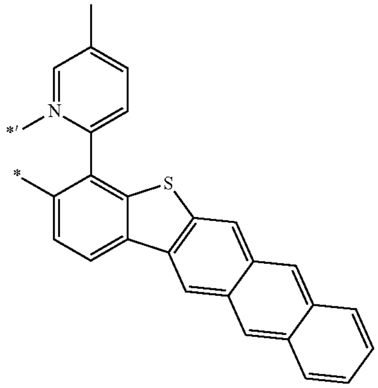
B1213
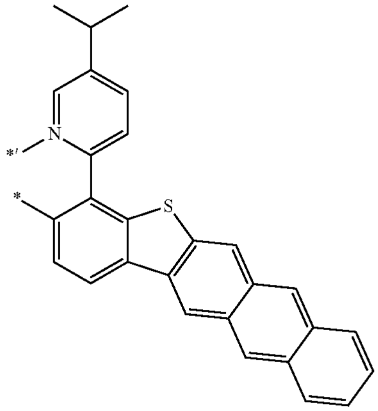
-continued
B1214
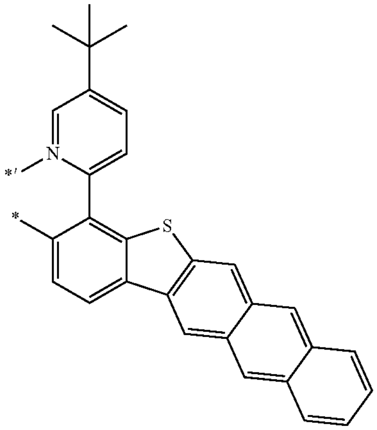
B1214
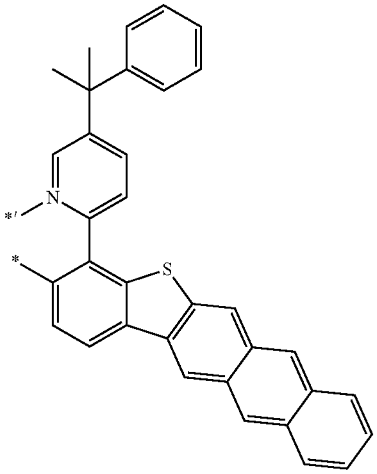
B1216
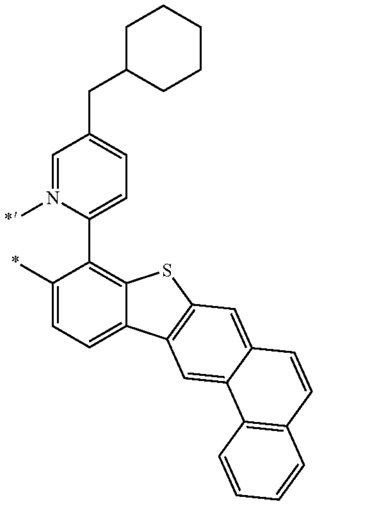

-continued
B1217
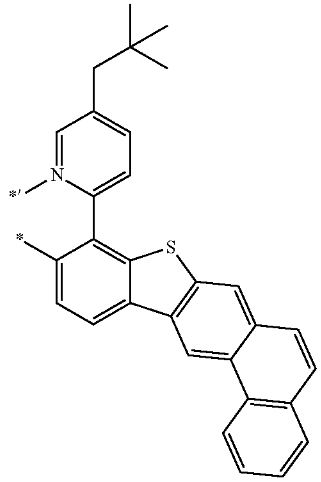
B1218
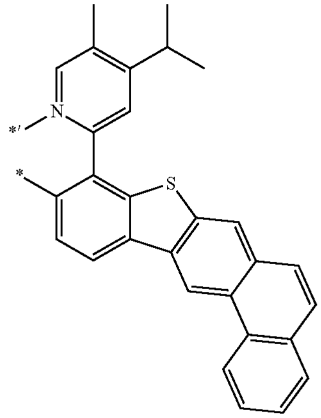
B1219
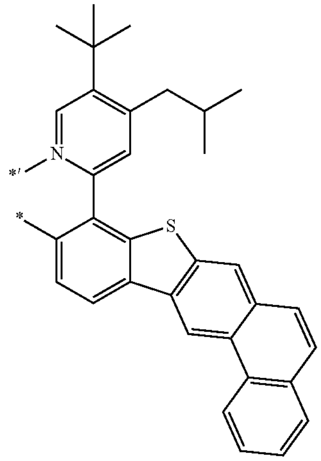
-continued
B1220
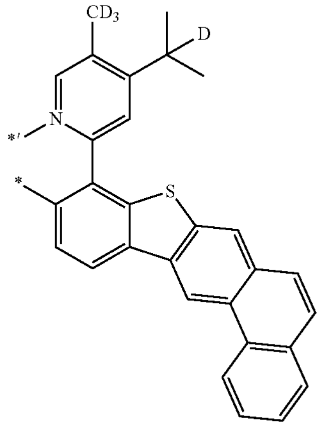
B1221
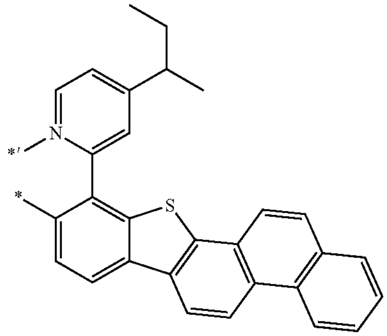
B1222
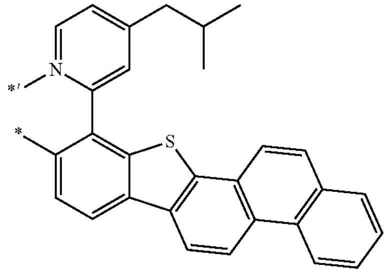
B1223
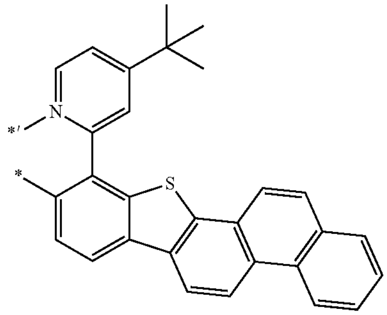
B1224
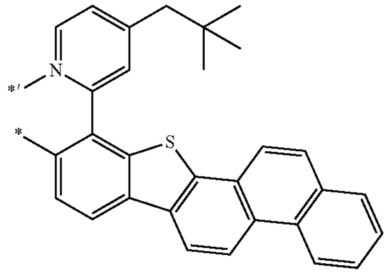

-continued
B1225
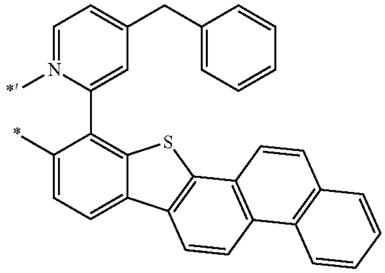
B1226
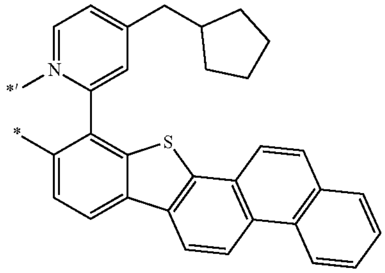
B1227
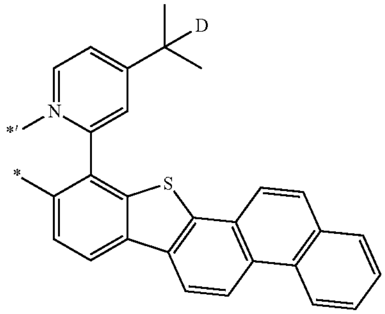
B1228
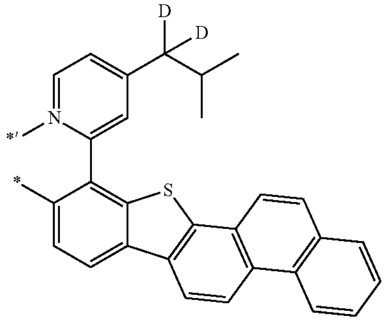
B1229
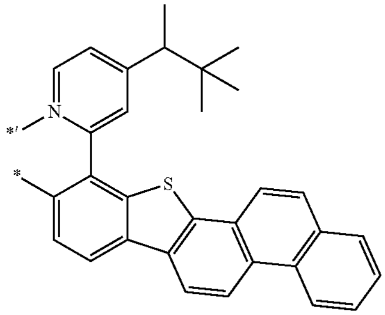
-continued
B1230
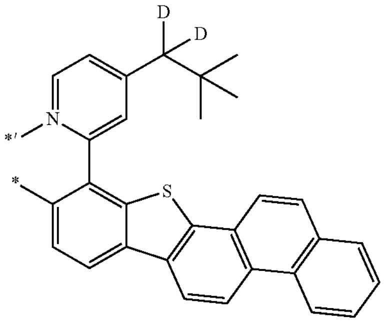
B1231
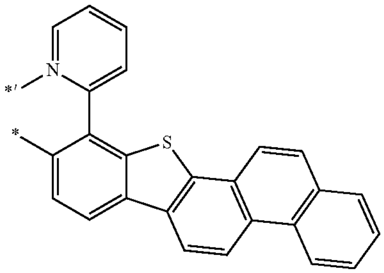
B1232
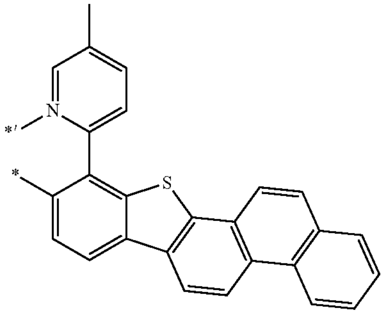
B1233
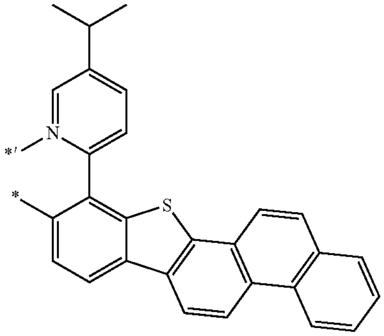
B1234
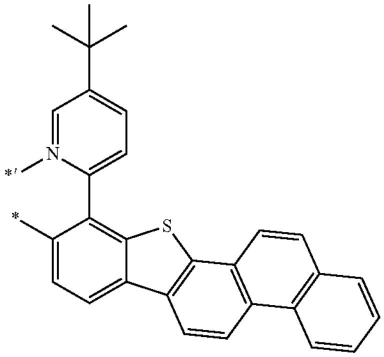

-continued
B1235
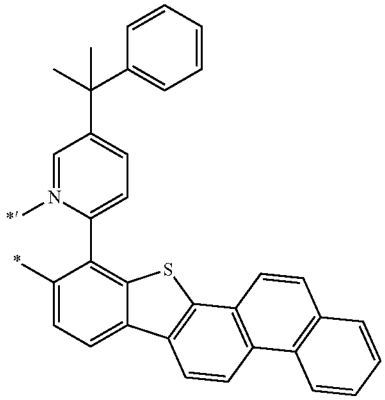
B1236
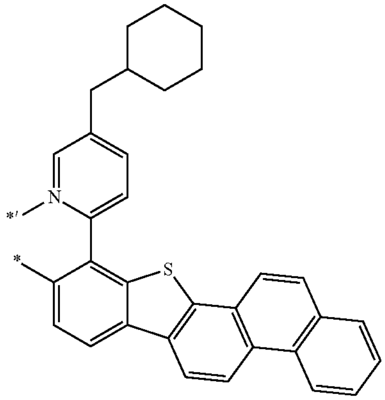
B1237
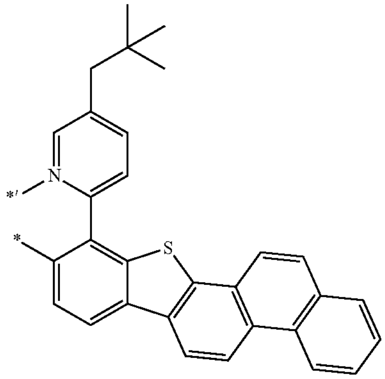
B1238
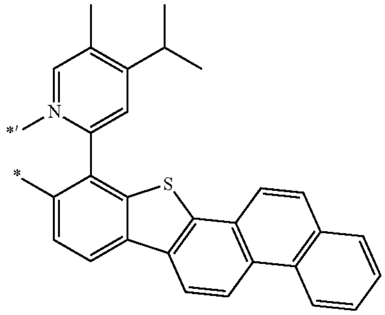
-continued
B1239
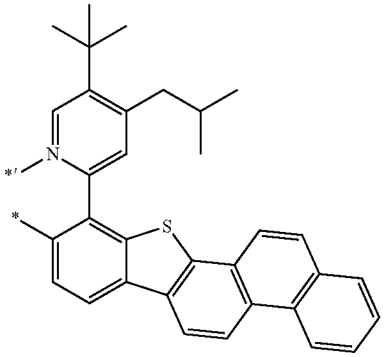
B1240
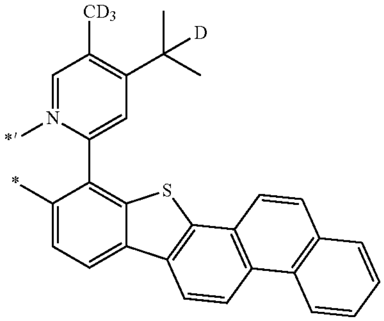
B1241
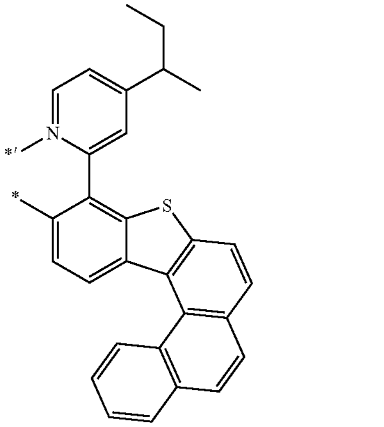
B1242
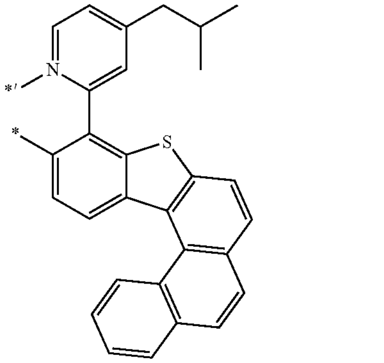

-continued
B1243
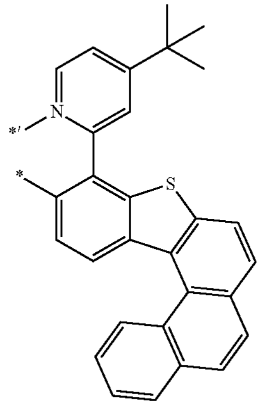
B1244
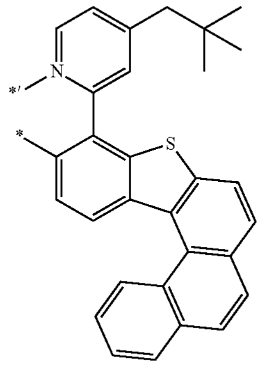
B1245
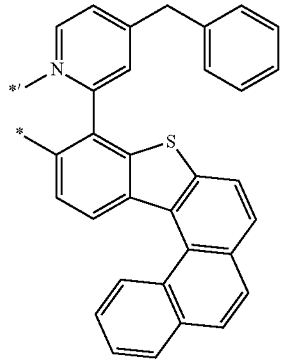
B1246
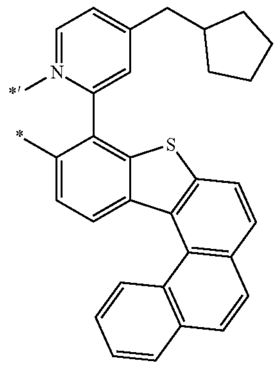
-continued
B1247
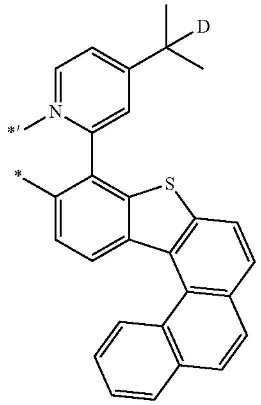
B1248
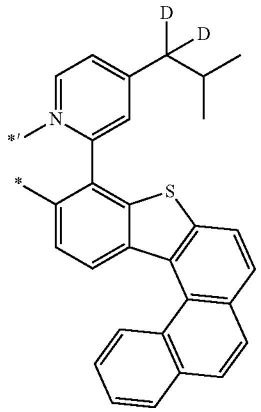
B1249
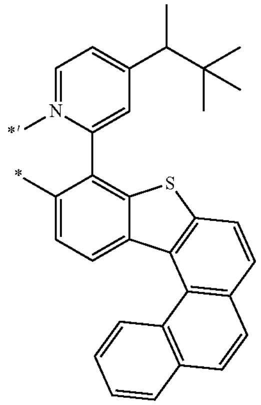
B1250
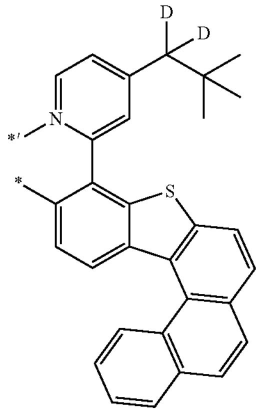

-continued
B1251
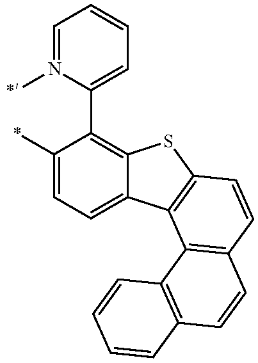
B1252
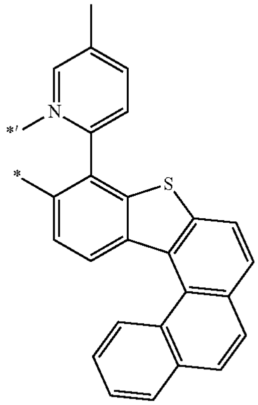
B1253
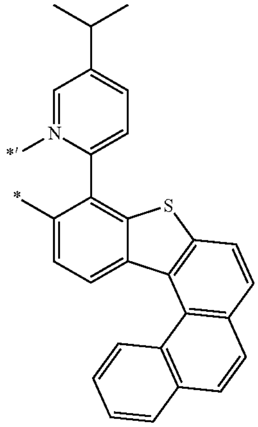
B1254
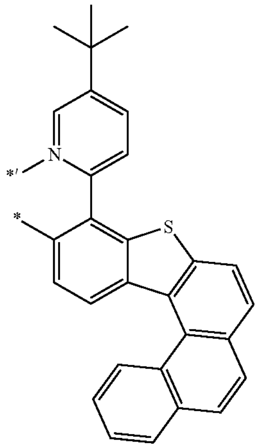
-continued
B1255
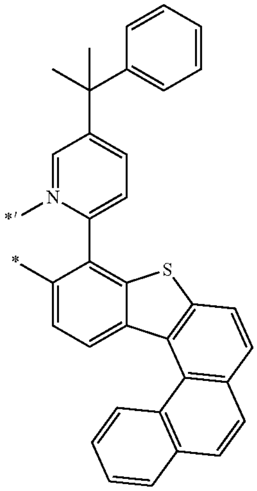
B1256
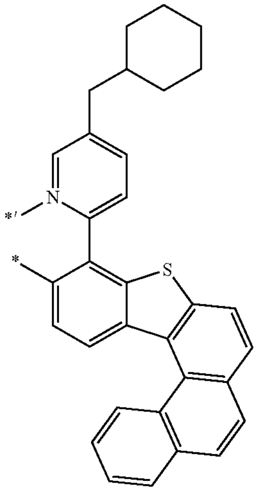
B1257
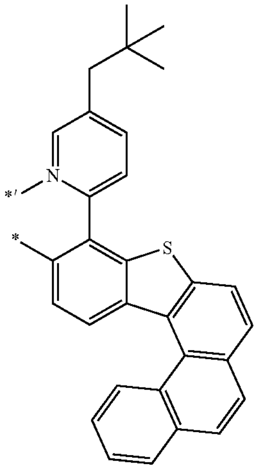

-continued
B1258
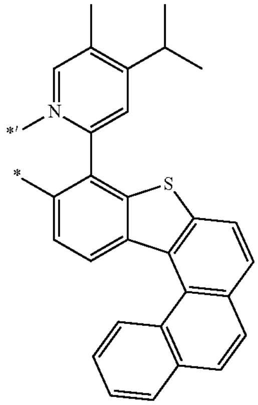
B1259
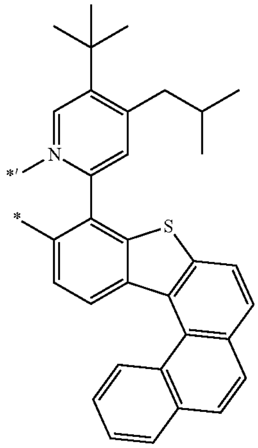
B1260
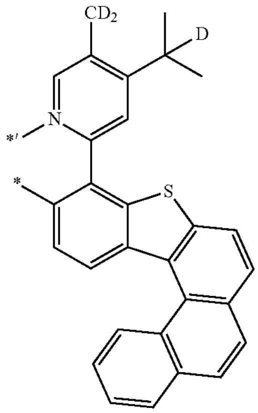
B1261
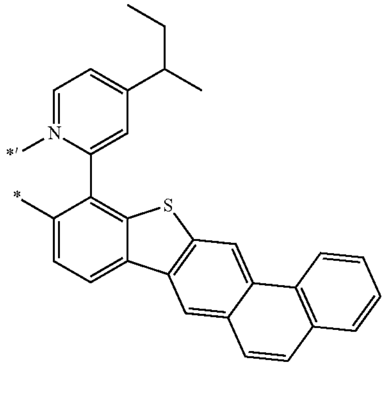
-continued
B1262
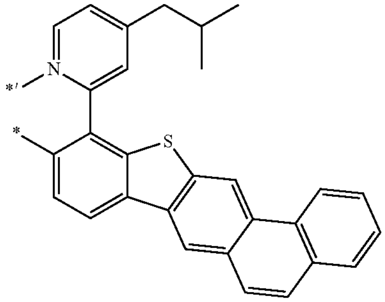
B1263
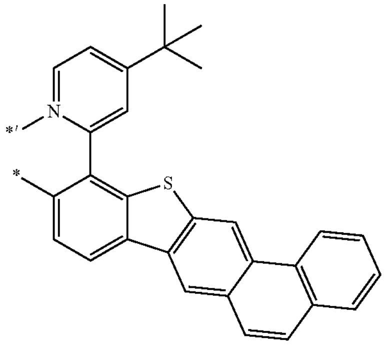
B1264
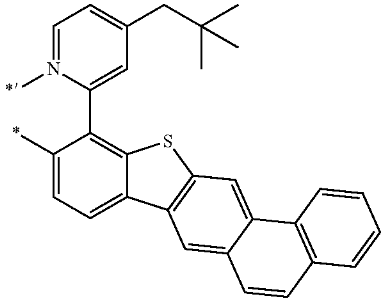
B1265
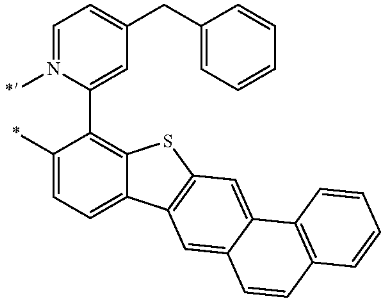
B1266
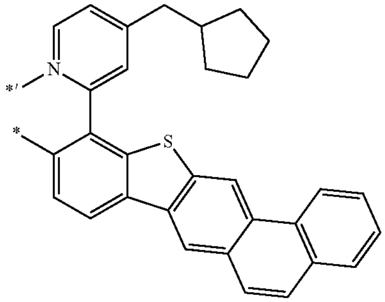

-continued
B1267
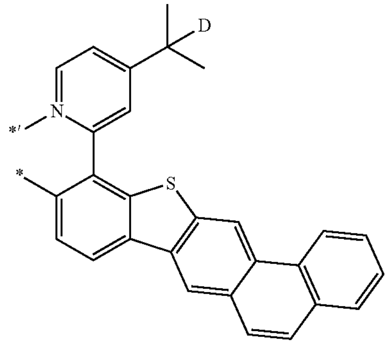
B1268
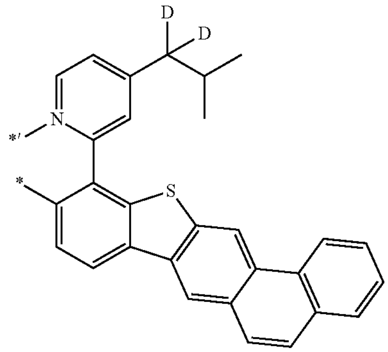
B1269
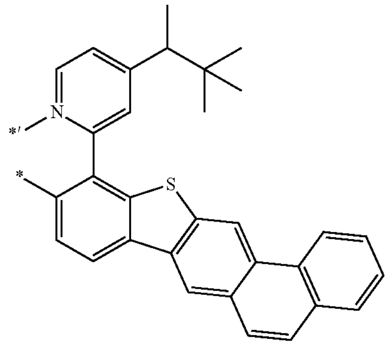
B1270
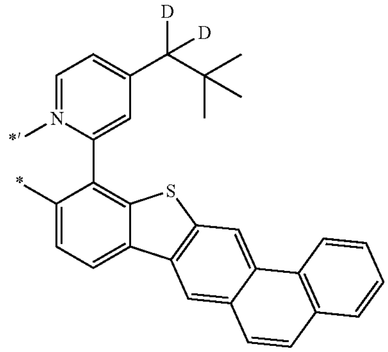
-continued
B1271
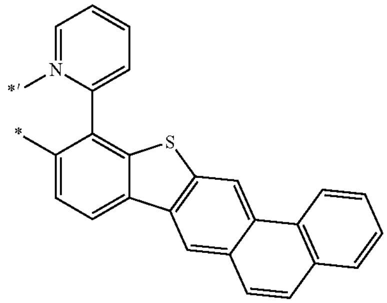
B1272
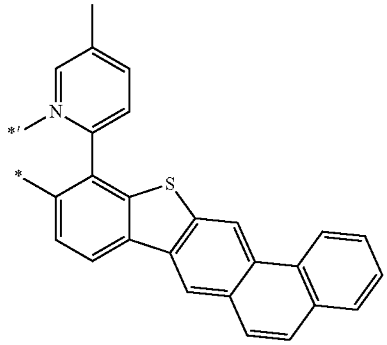
B1273
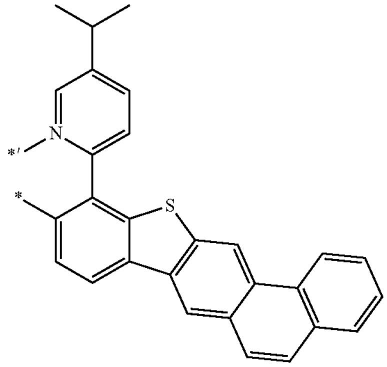
B1274
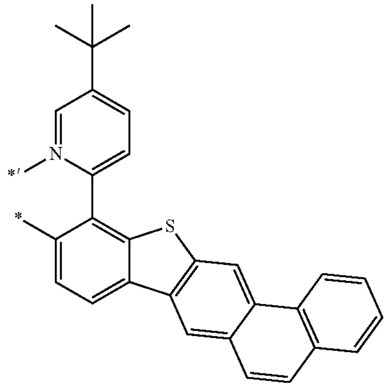

-continued
B1275
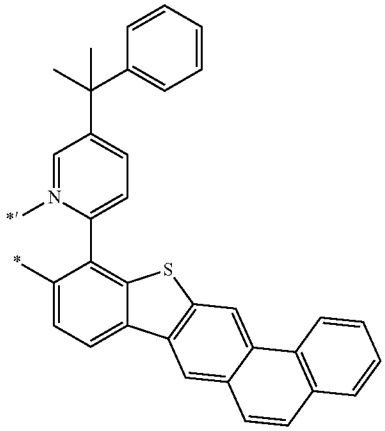
B1276
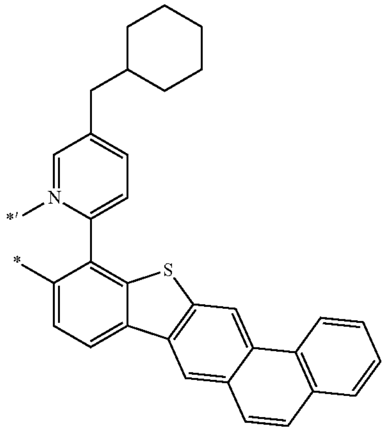
B1277
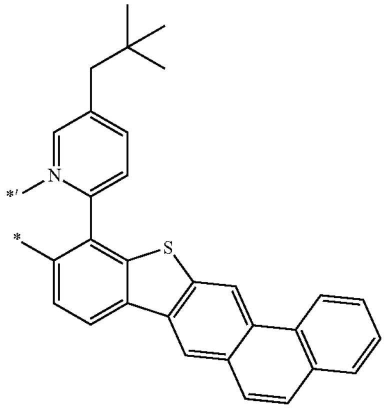
B1278
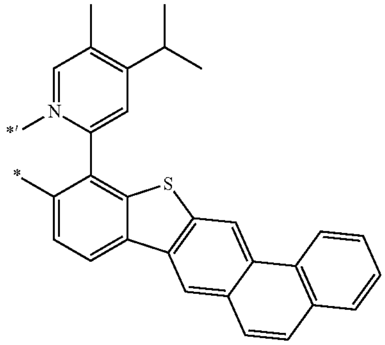
-continued
B1279
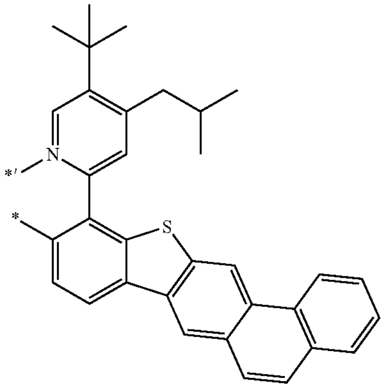
B1280
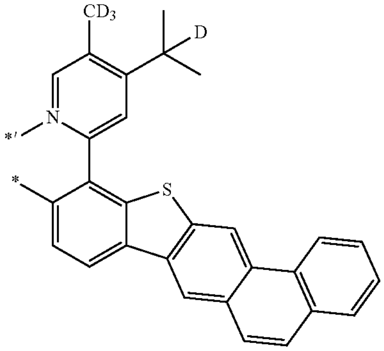
B1281
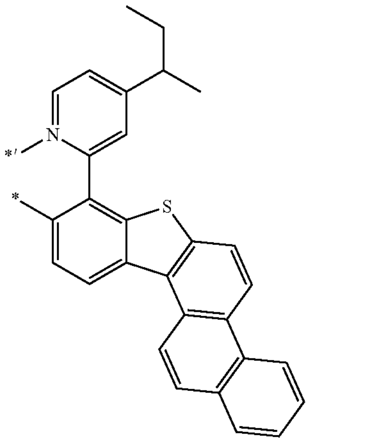
B1282
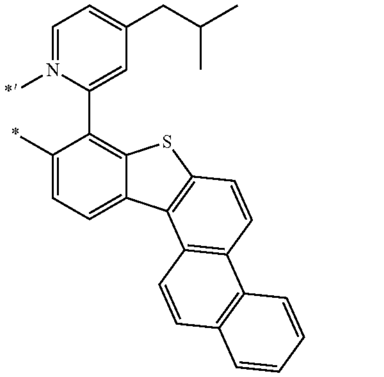

-continued
B1283
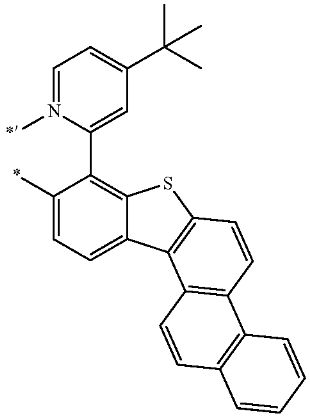
B1284
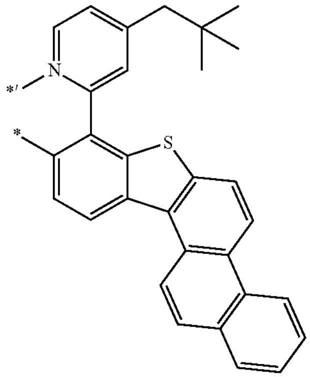
B1285
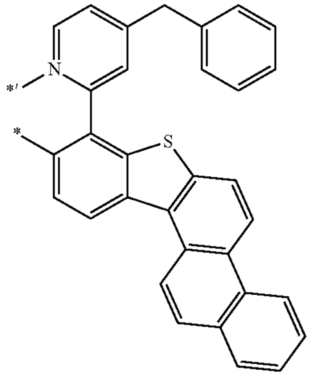
B1286
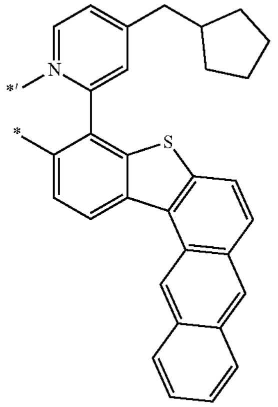
-continued
B1287
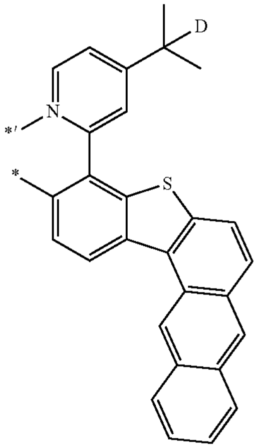
B1288
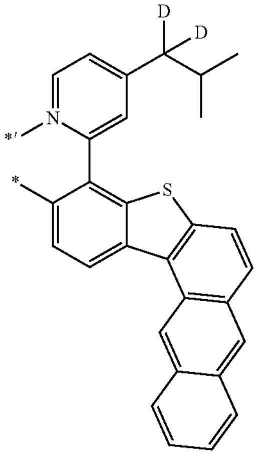
B1289
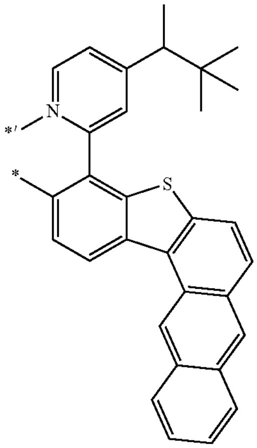

-continued
B1290
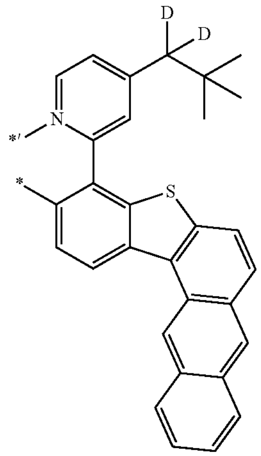
B1291
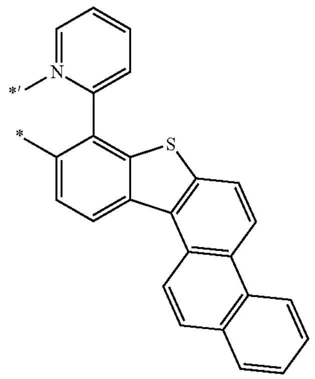
B1292
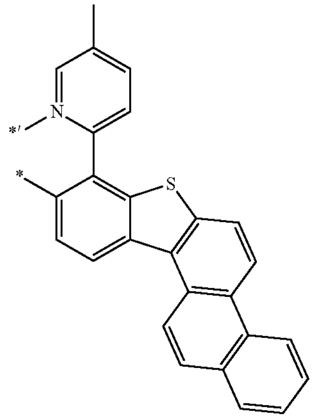
-continued
B1293
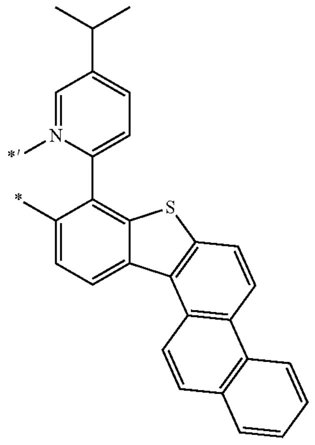
B1294
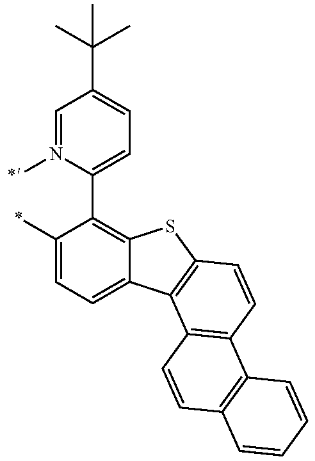
B1295
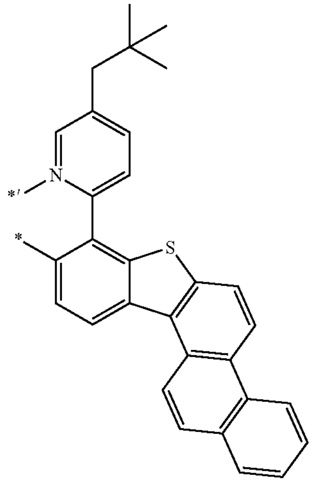

-continued
B1296
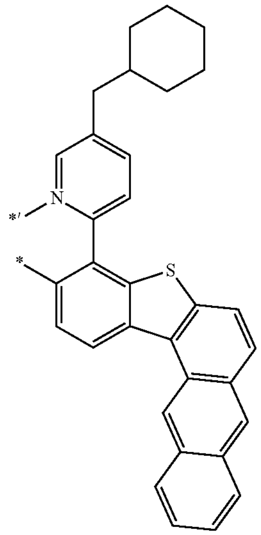
B1297
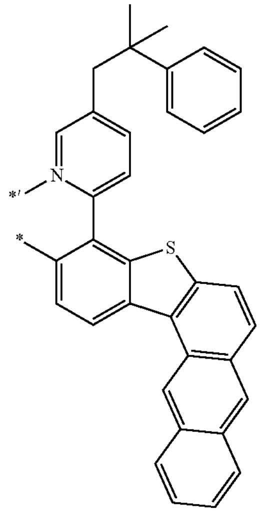
B1298
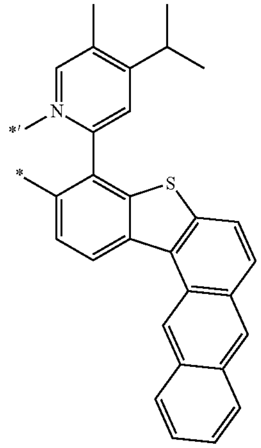
-continued
B1299
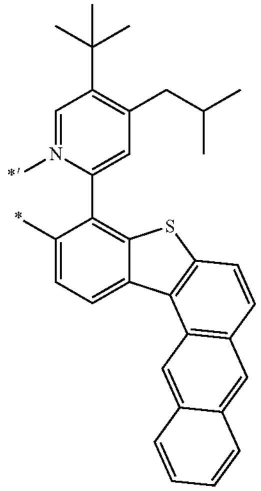
B1300
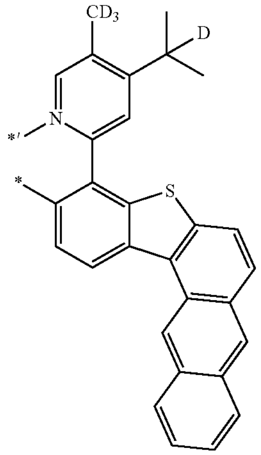
B1301
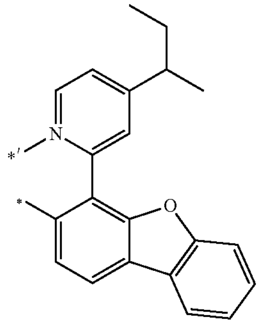
B1302
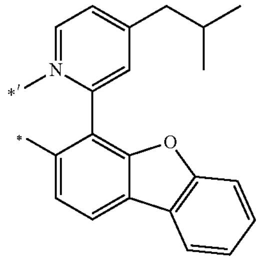

-continued
B1303
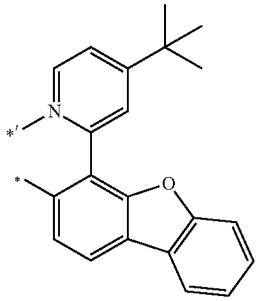
B1304
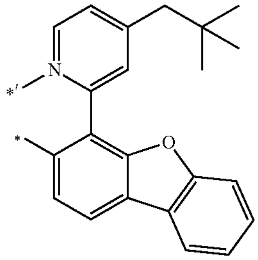
B1305
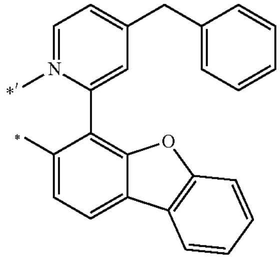
B1306
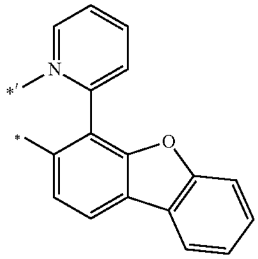
B1307
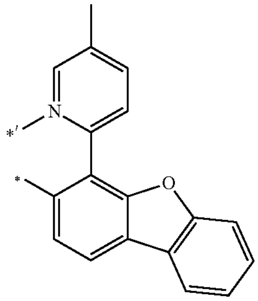
-continued
B1308
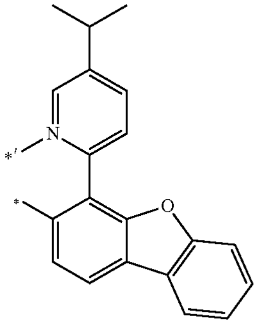
B1309
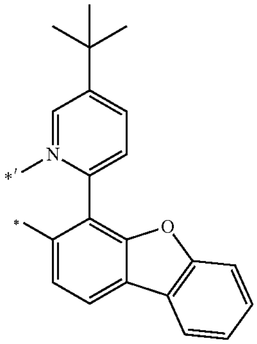
B1310
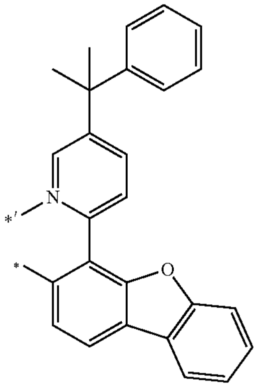
B1311
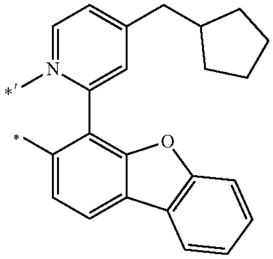
B1312
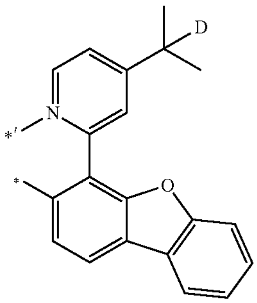

-continued
B1313
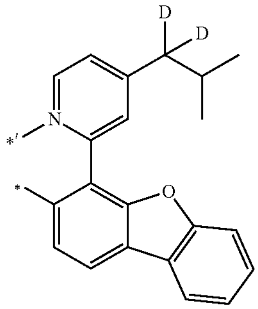
B1314
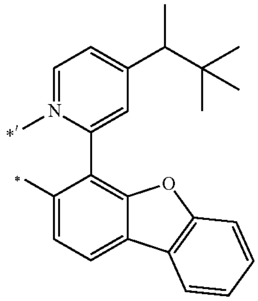
B1315
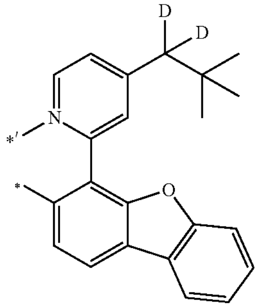
B1316
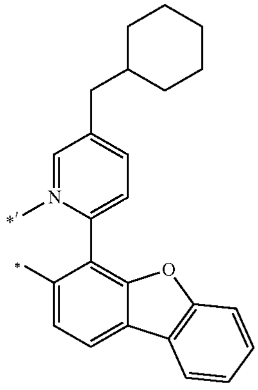
-continued
B1317
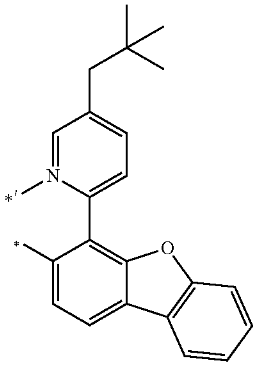
B1318
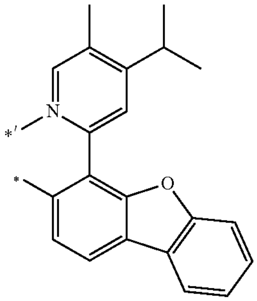
B1319
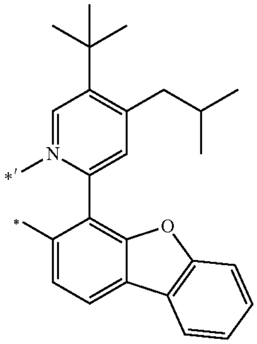
B1320
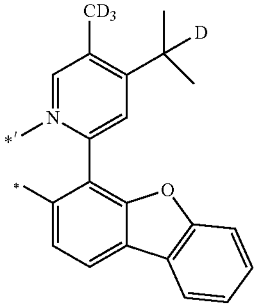

-continued
B1321
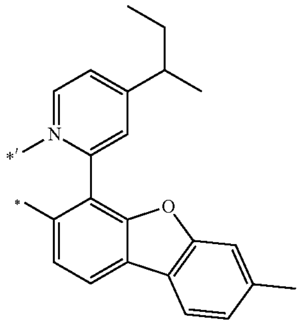
B1322
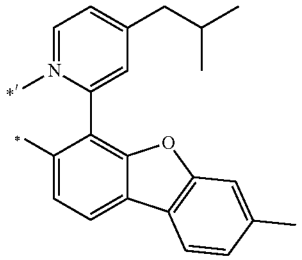
B1323
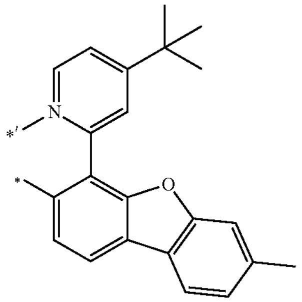
B1324
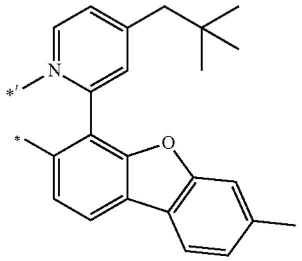
B1325
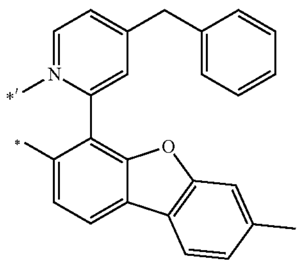
-continued
B1326
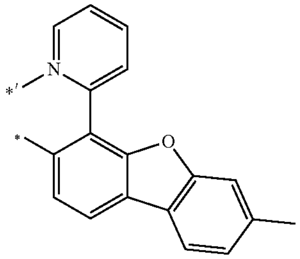
B1327
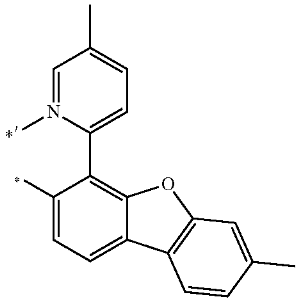
B1328
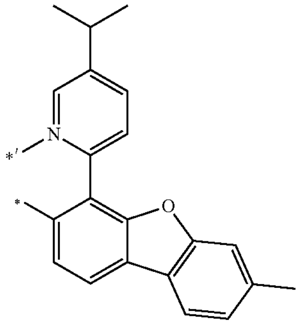
B1329
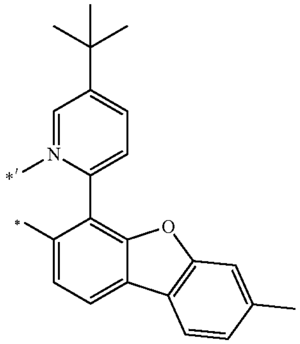
B1330
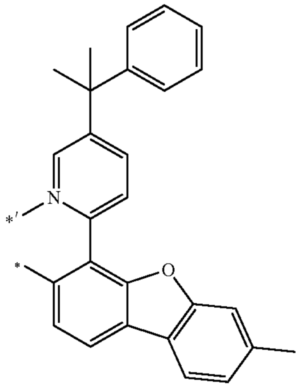

-continued
B1331
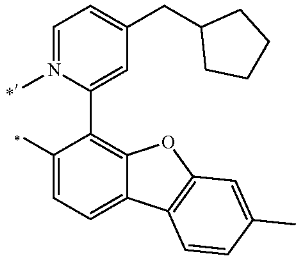
B1332
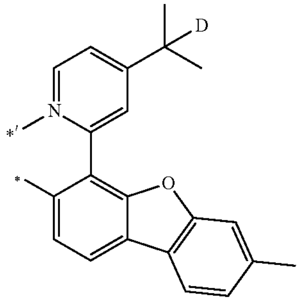
B1333
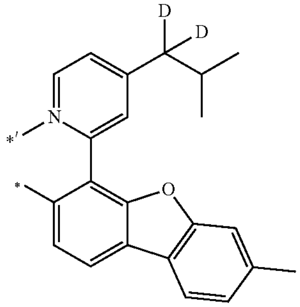
B1334
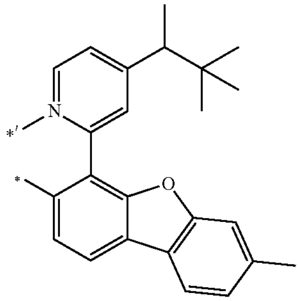
B1335
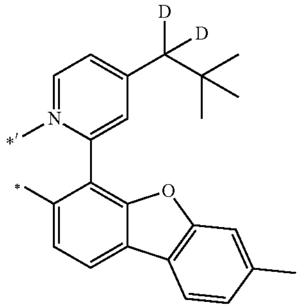
-continued
B1336
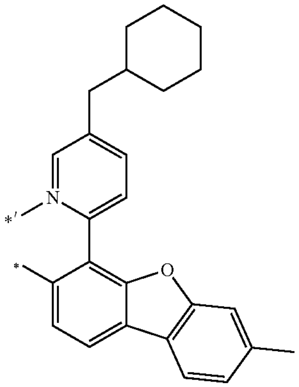
B1337
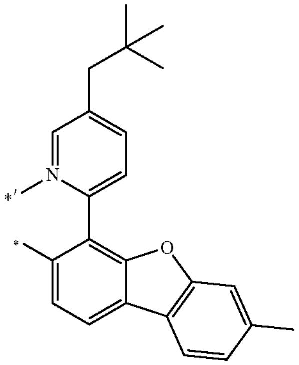
B1338
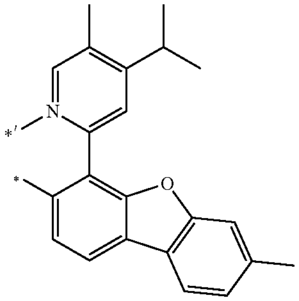
B1339
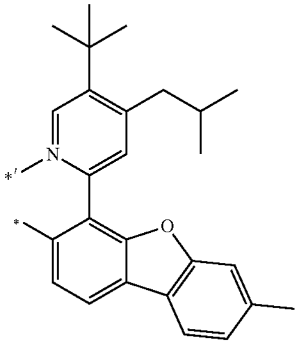

-continued
B1340
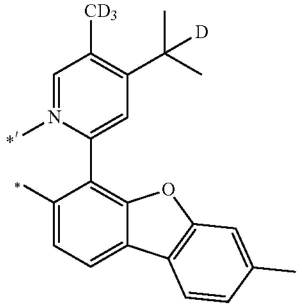
B1341
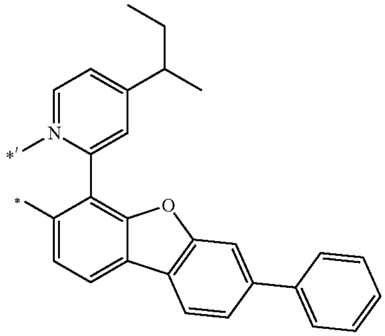
B1342
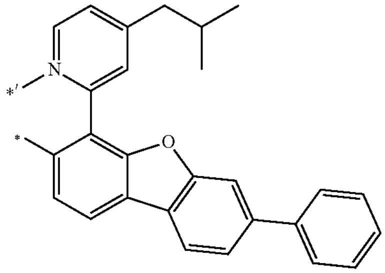
B1343
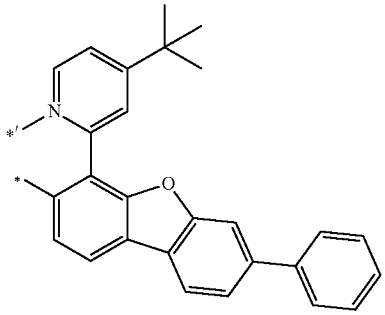
B1344
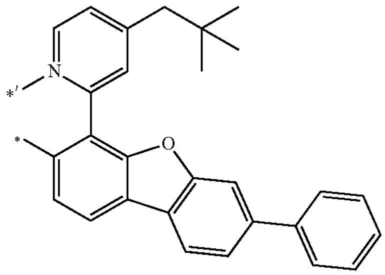
-continued
B1345
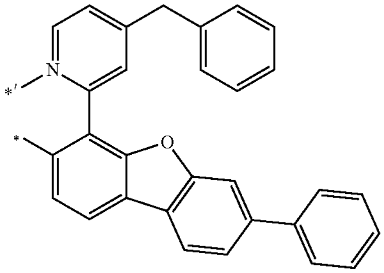
B1346
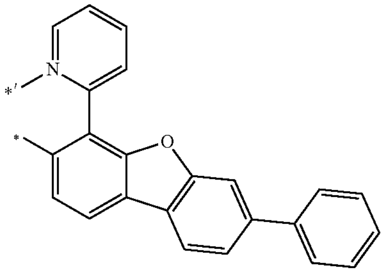
B1347
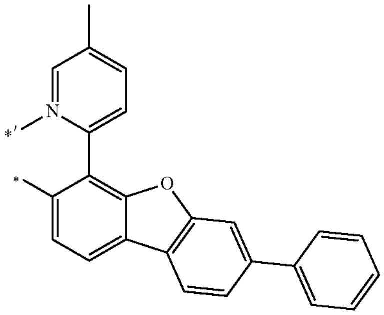
B1348
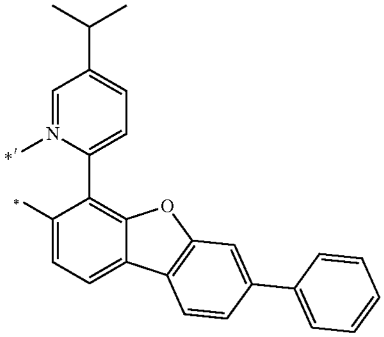
B1349
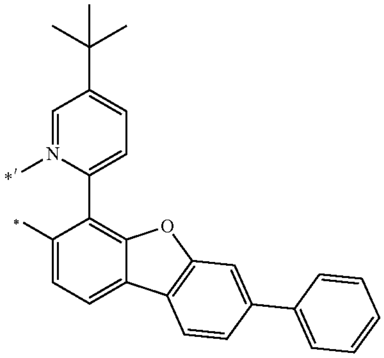

-continued
B1350
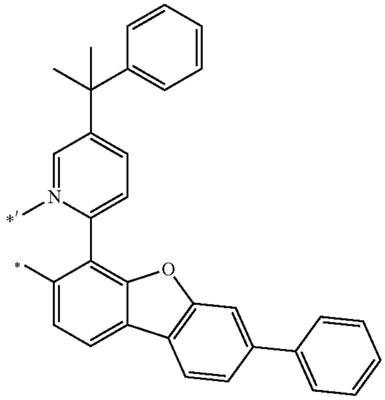
B1351
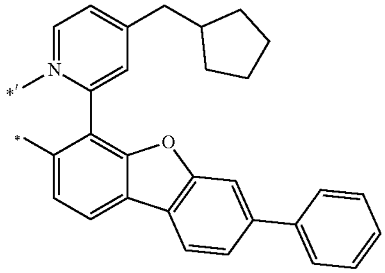
B1352
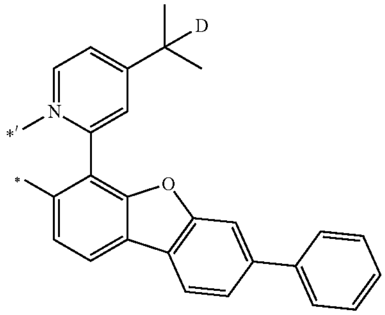
B1353
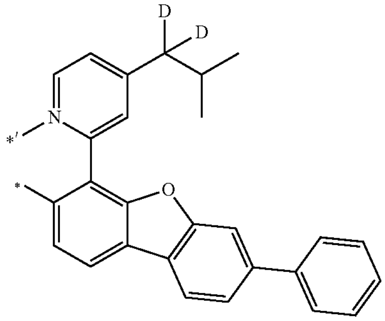
B1354
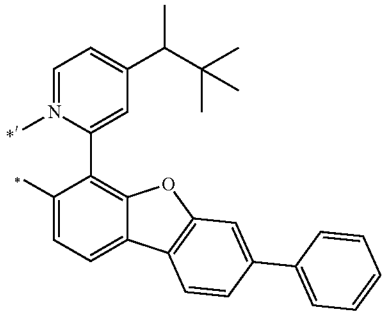
-continued
B1355
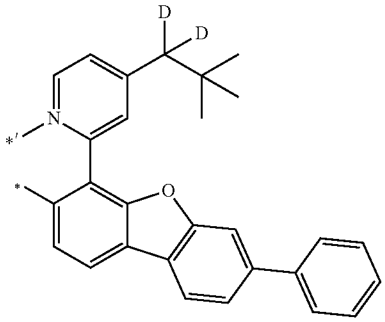
B1356
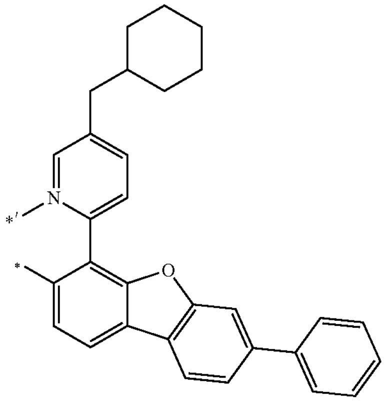
B1357
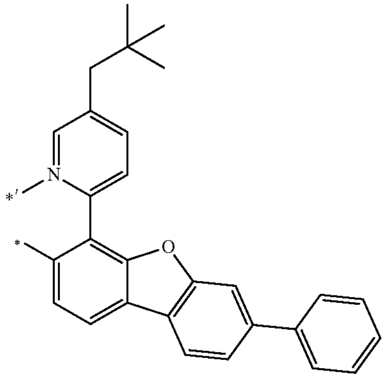
B1358
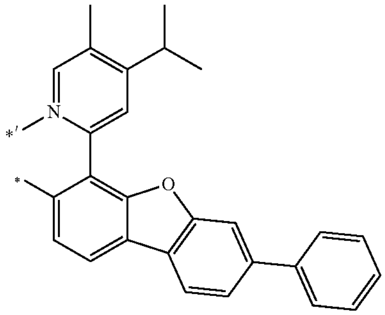

-continued
B1359
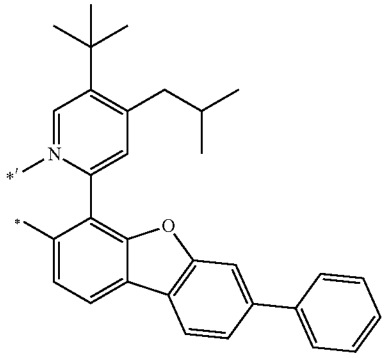
B1360
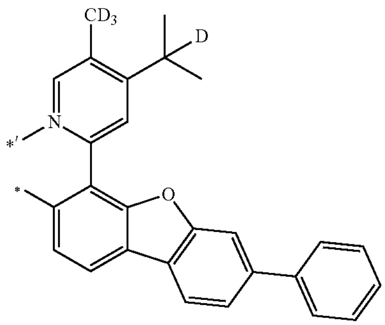
B1361
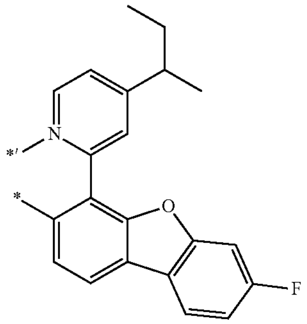
B1362
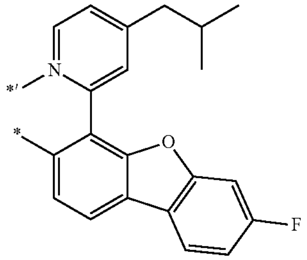
-continued
B1363
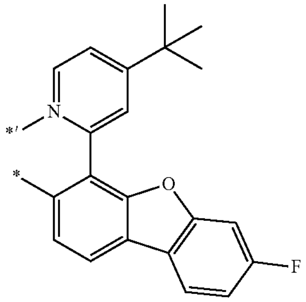
B1364
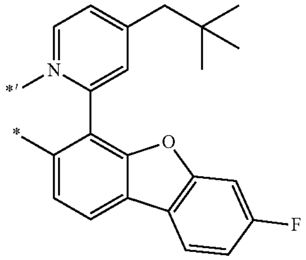
B1365
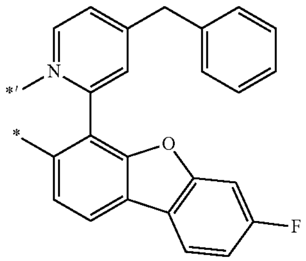
B1366
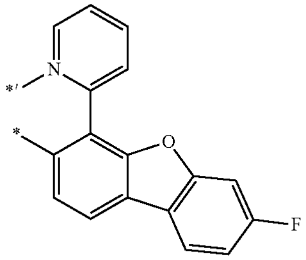
B1367
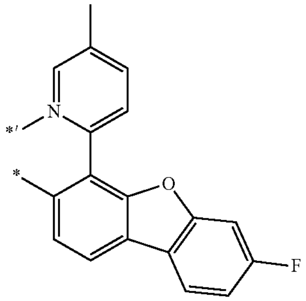

B1368
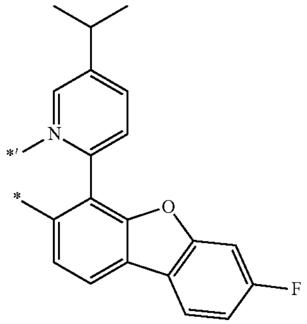
B1369
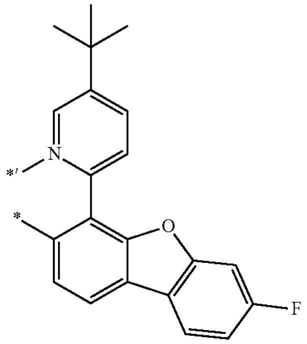
B1370
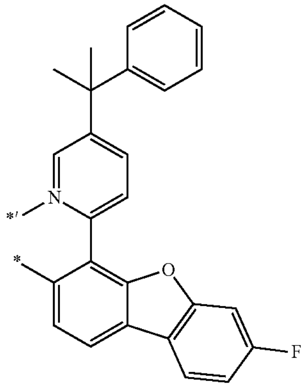
B1371
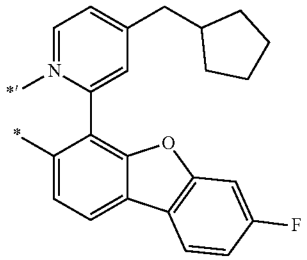
B1372
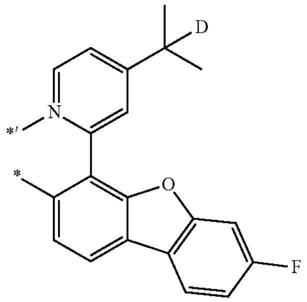
1373
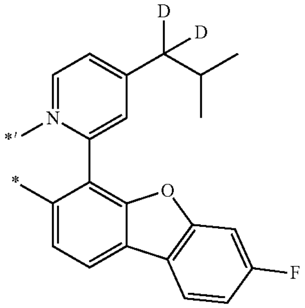
1374
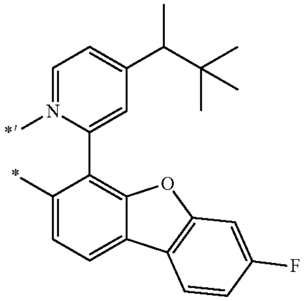
1375
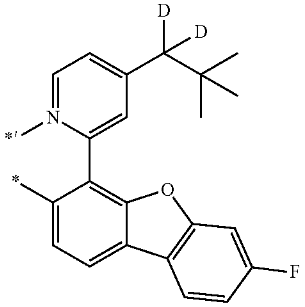
1376
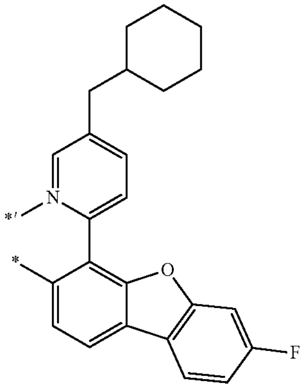

B1377
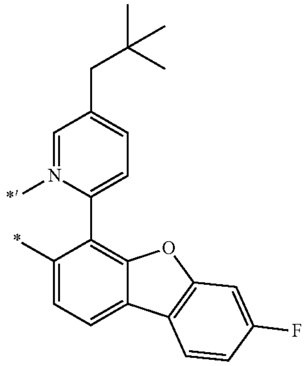
B1378
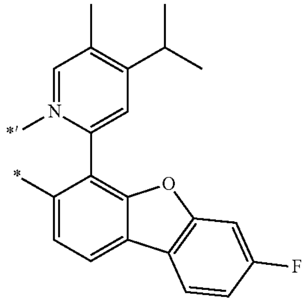
B1379
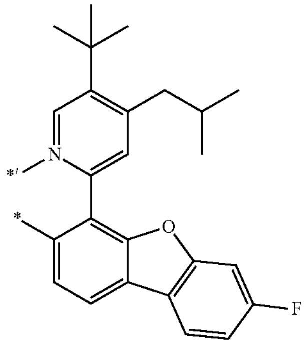
B1380
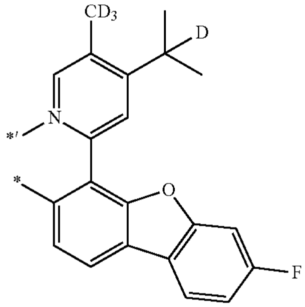
B1381
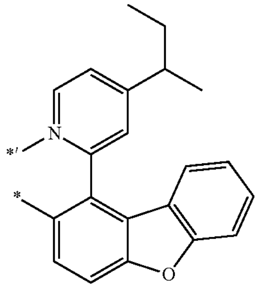
B1382
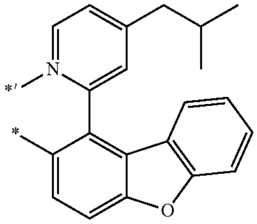
B1383
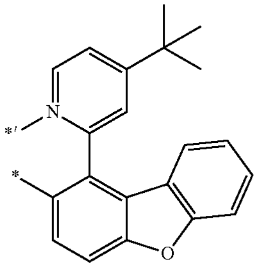
B1384
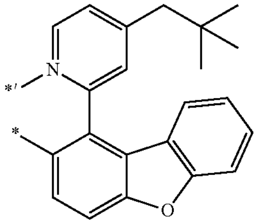
B1385
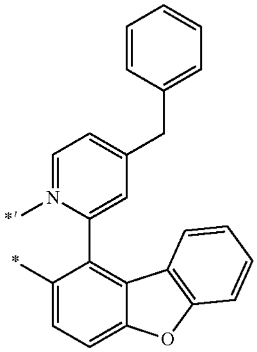
B1386
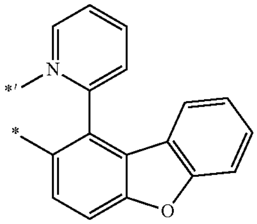
B1387
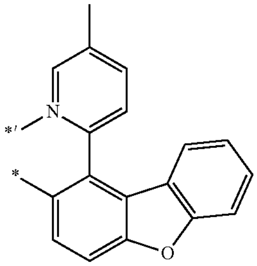

B1388
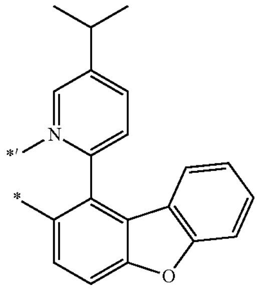
B1389
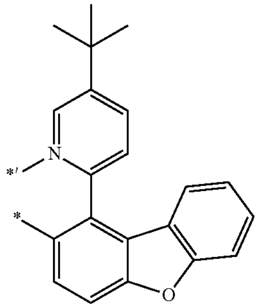
B1390
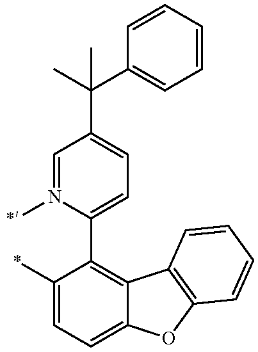
B1391
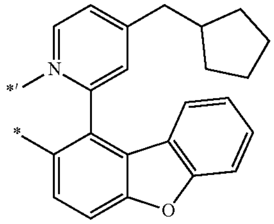
B1392
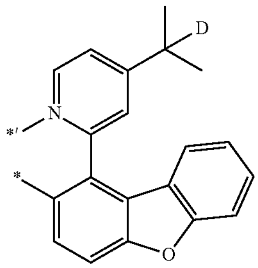
B1393
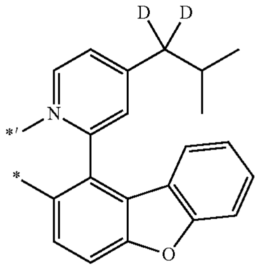
B1394
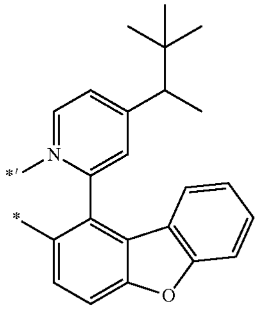
B1395
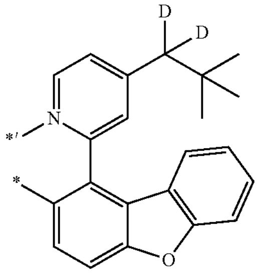
B1396
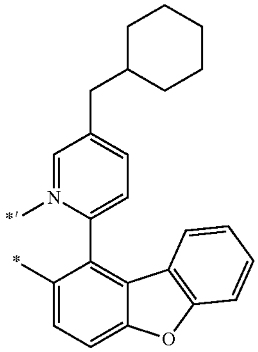
B1397
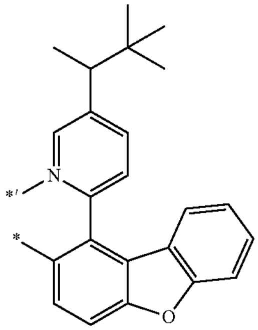

B1398
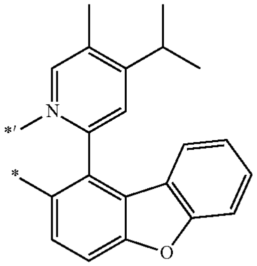
B1399
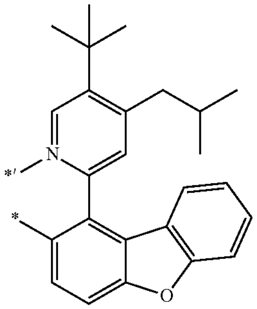
B1400
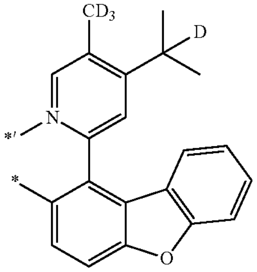
B1401
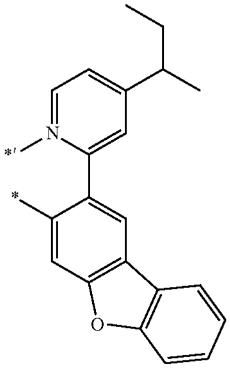
B1402
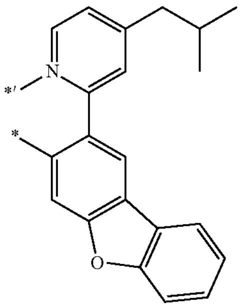
B1403
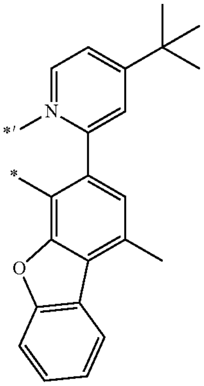
B1404
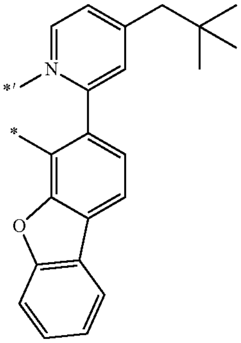
B1405
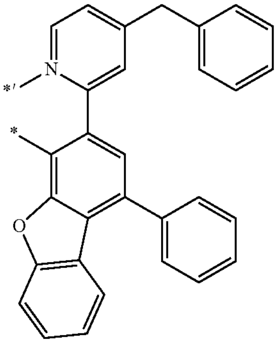
B1406
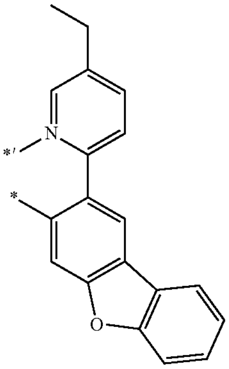

-continued
B1407
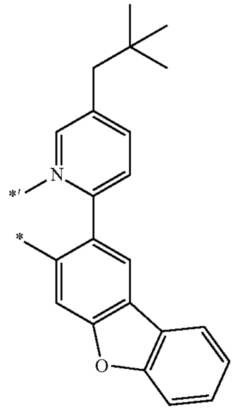
B1408
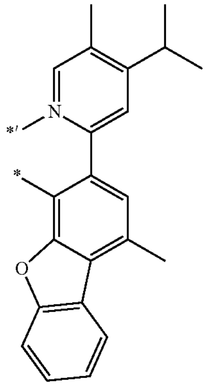
B1409
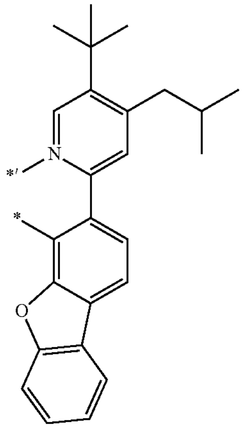
B1410
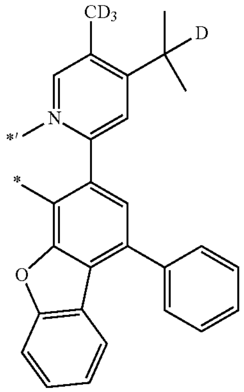
-continued
B1411
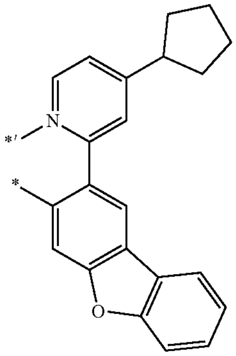
B1412
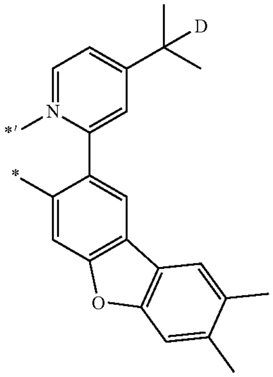
B1413
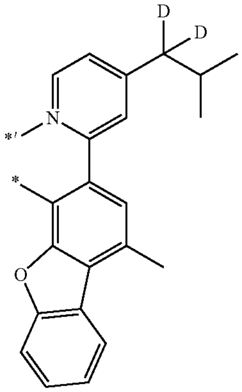
B1414
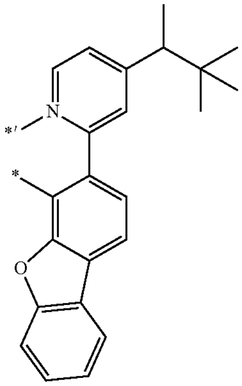

-continued
B1415
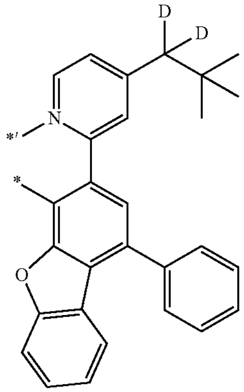
B1416
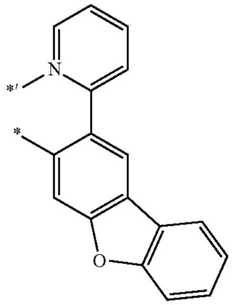
B1417
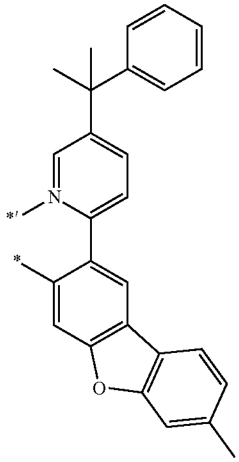
B1418
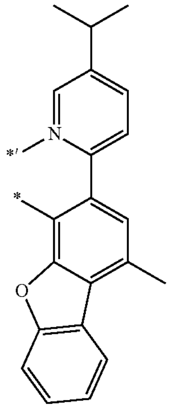
-continued
B1419
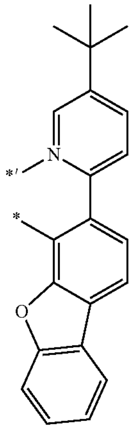
B1420
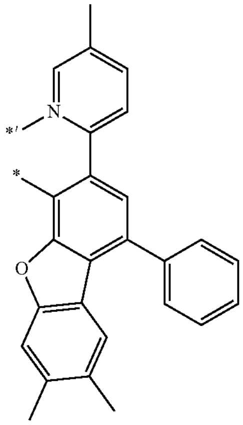
B1421
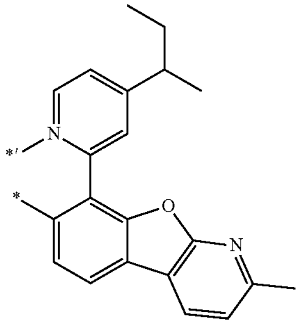
B1422
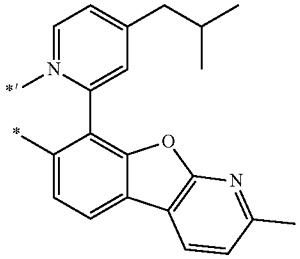

-continued
B1423
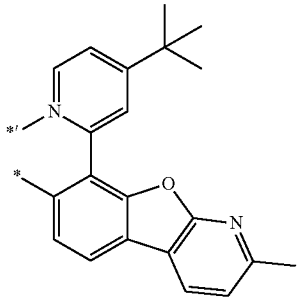
B1424
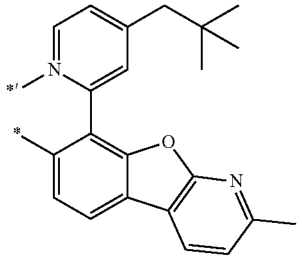
B1425
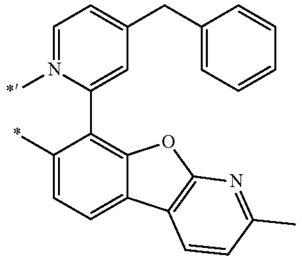
B1426
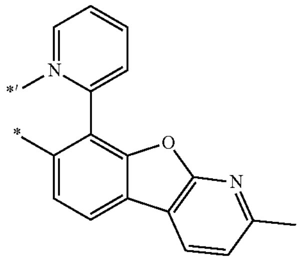
B1427
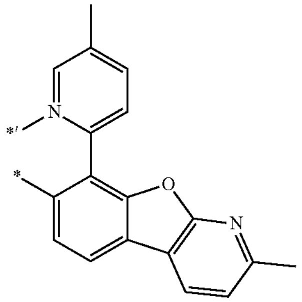
-continued
B1428
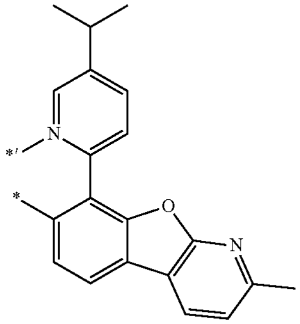
B1429
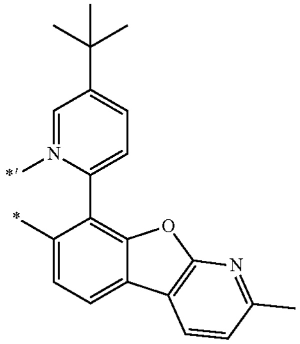
B1430
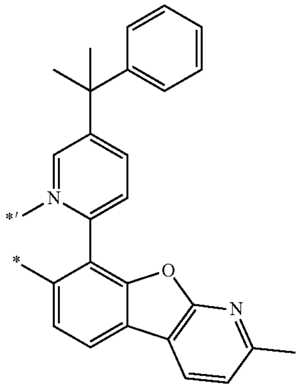
B1431
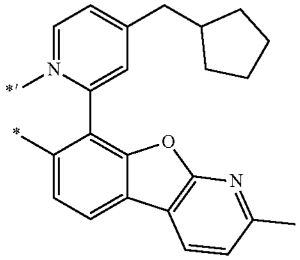
B1432
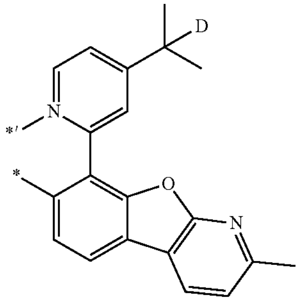

-continued
B1433
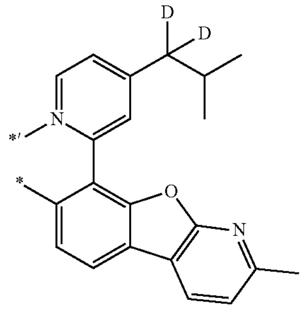
B1434
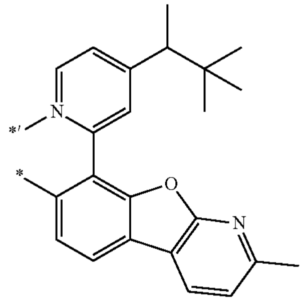
B1435
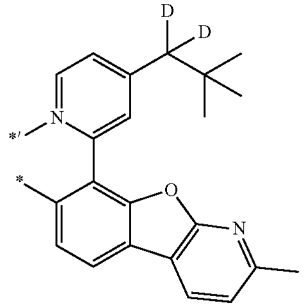
B1436
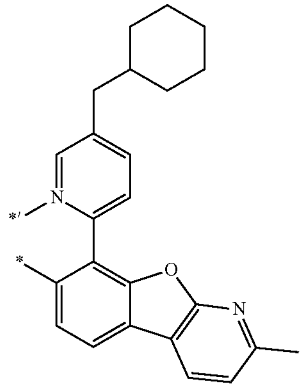
-continued
B1437
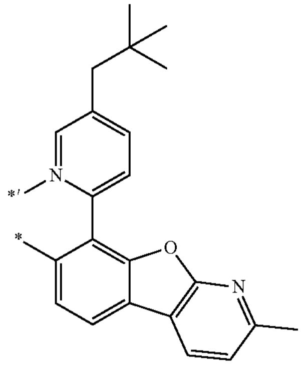
B1438
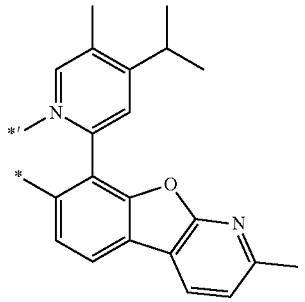
B1439
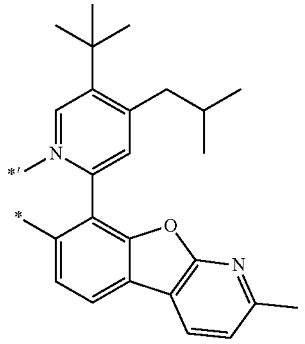
B1440
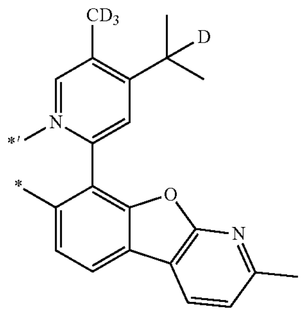

B1441
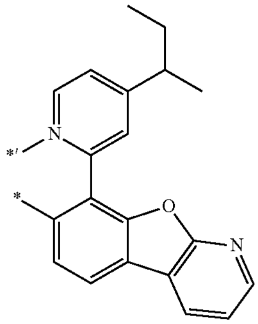
B1442
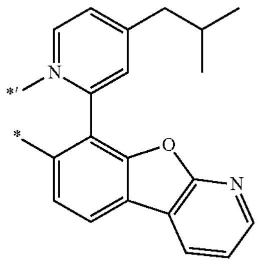
B1443
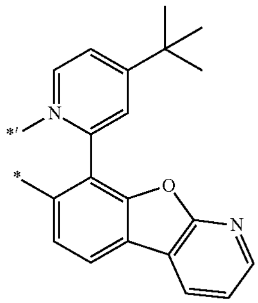
B1444
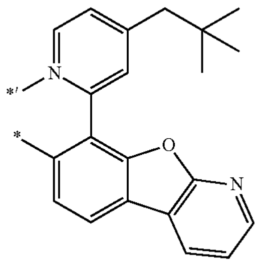
B1445
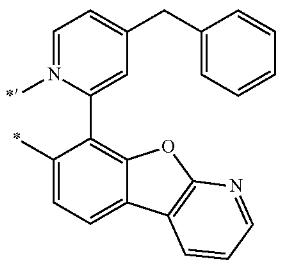
-continued
B1446
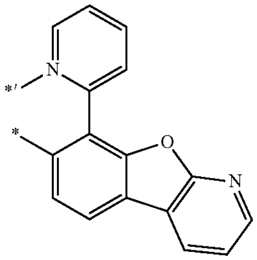
B1447
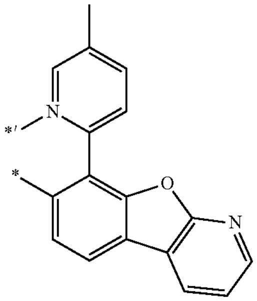
B1448
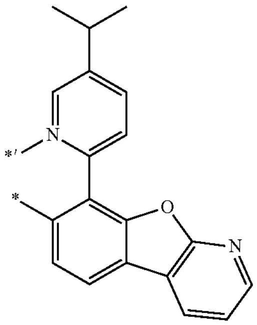
B1449
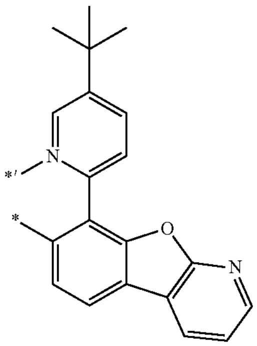
B1450
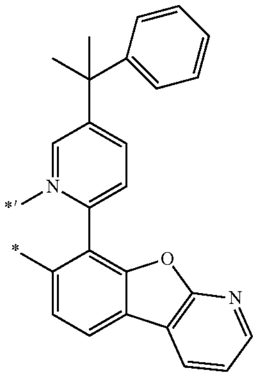

-continued
B1451
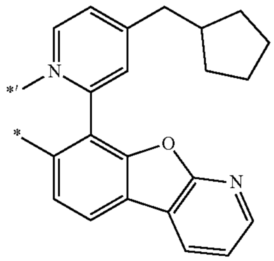
B1452
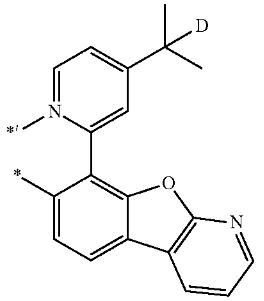
B1453
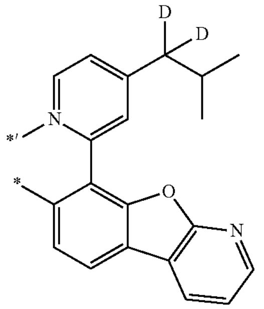
B1454
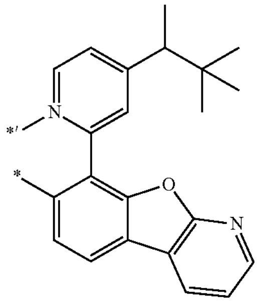
B1455
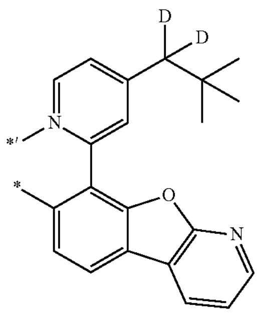
-continued
B1456
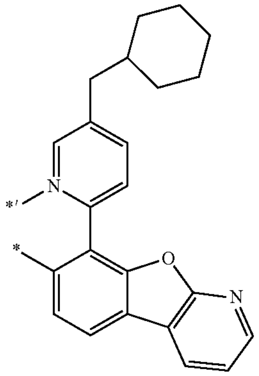
B1457
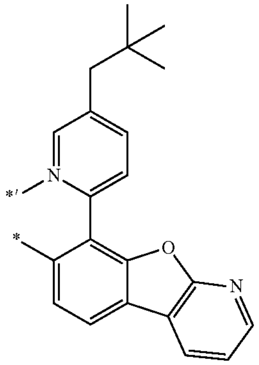
B1458
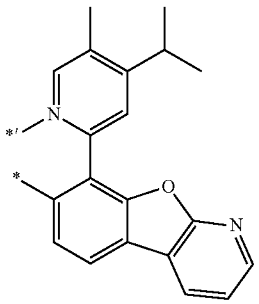
B1459
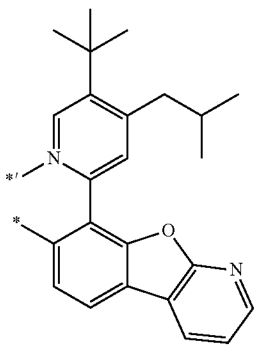

-continued
B1460
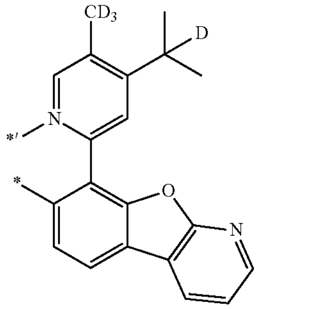
B1461
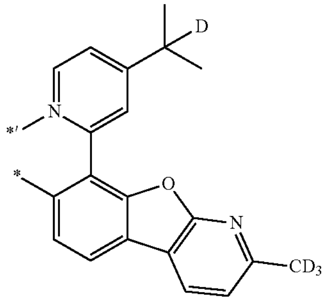
B1462
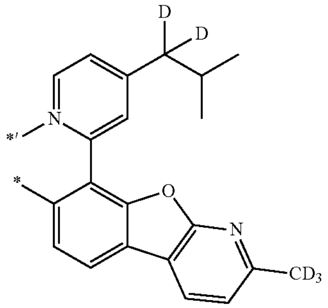
B1463
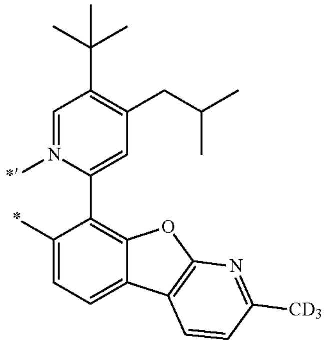
B1464
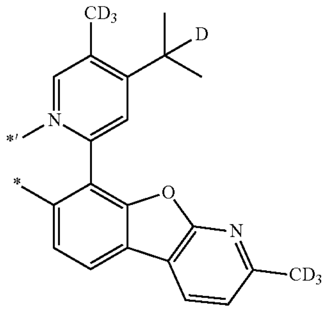
-continued
B1645
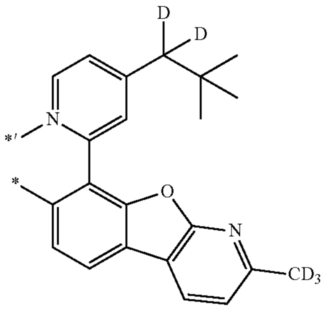
B1466
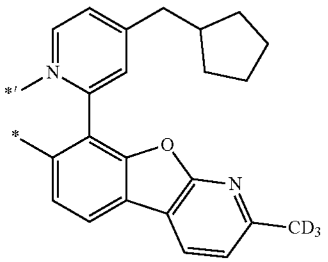
B1467
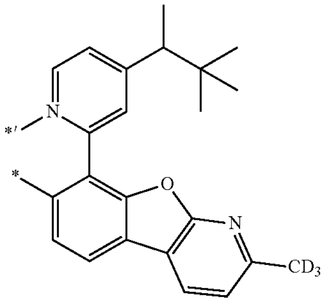
B1468
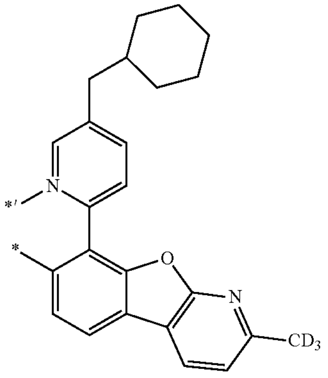
B1469
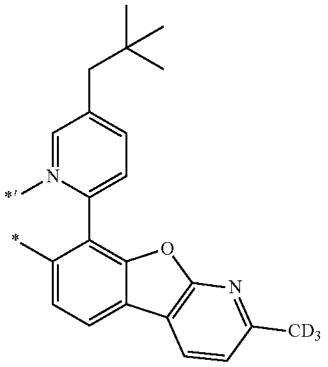

-continued
B1470
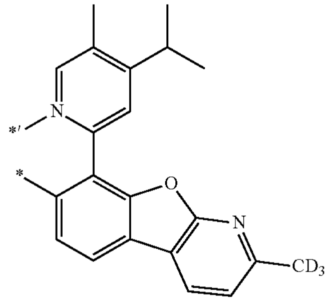
B1471
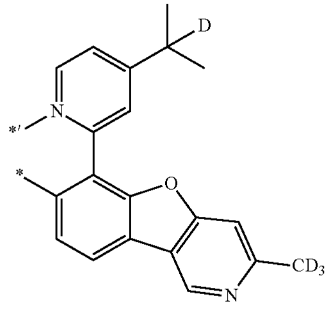
B1472
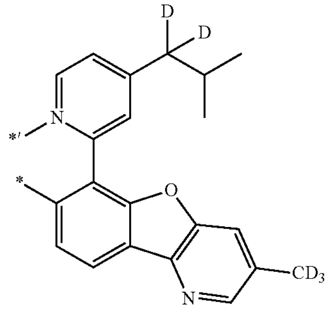
B1473
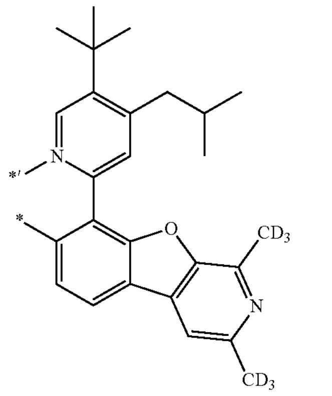
B1474
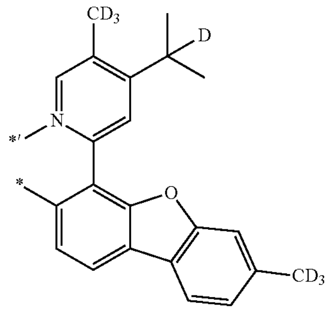
-continued
B1475
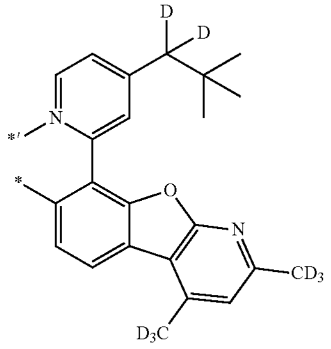
B1476
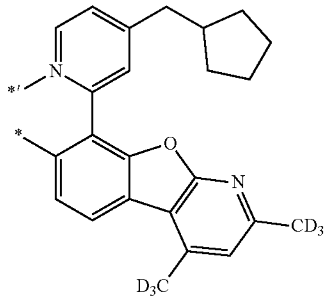
B1477
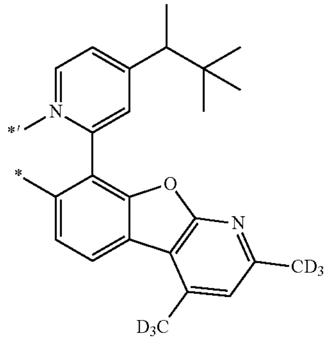
B1478
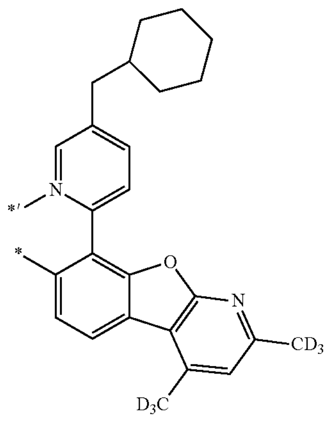

-continued
B1479
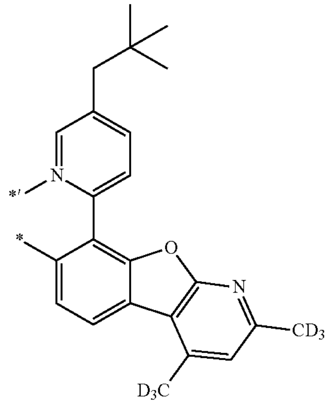
B1480
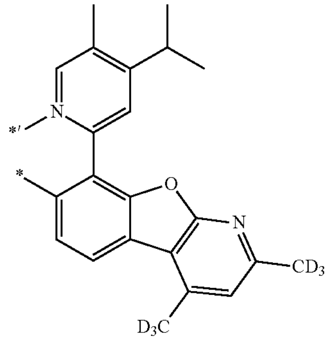
B1481
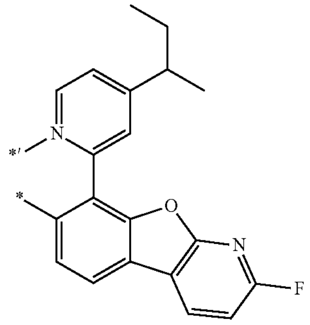
B1482
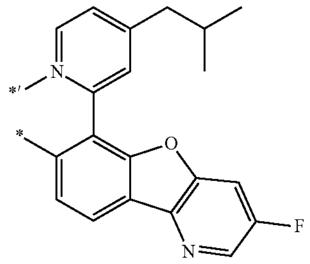
-continued
B1483
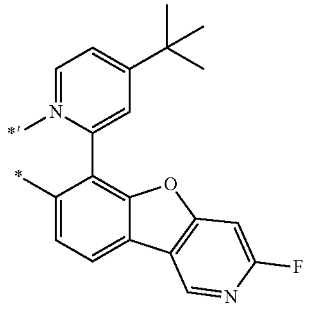
B1484
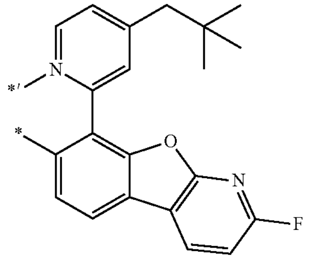
B1485
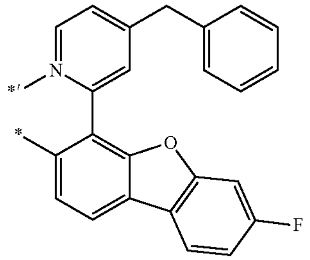
B1486
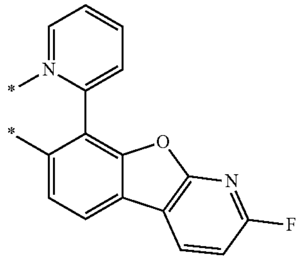
B1487
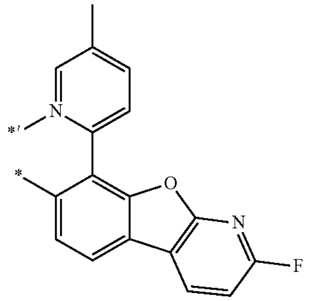

-continued
B1488
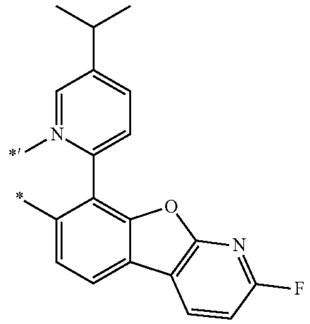
B1489
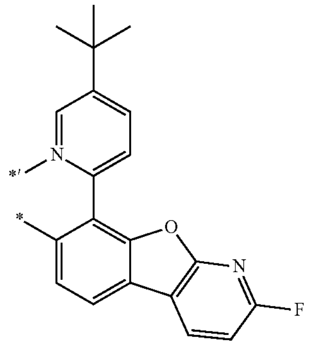
B1490
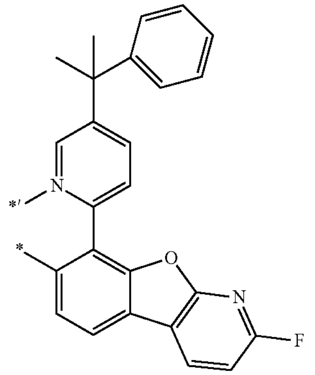
B1491
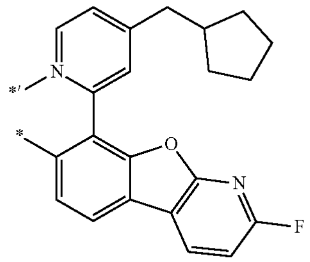
B1492
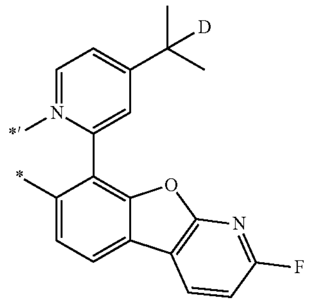
-continued
B1493
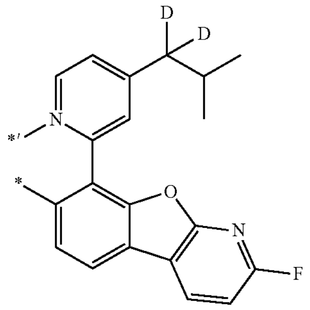
B1494
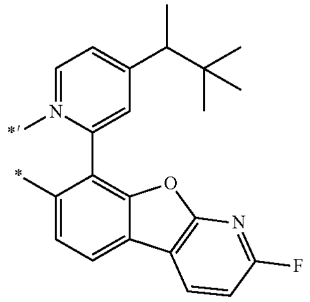
B1495
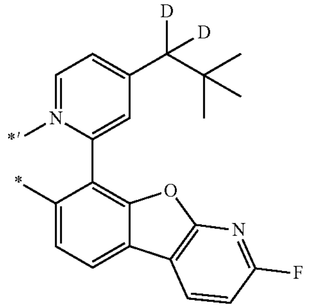
B1496
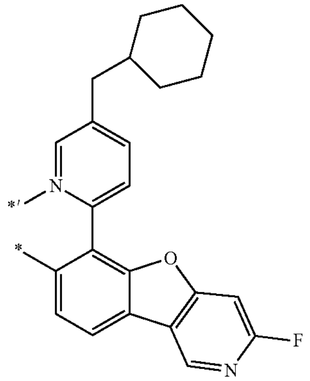

-continued
B1497
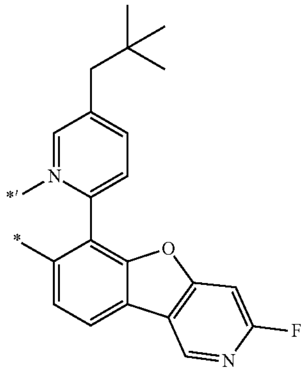
B1498
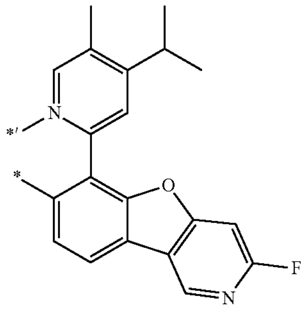
B1499
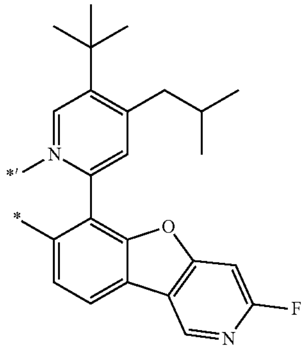
B1500
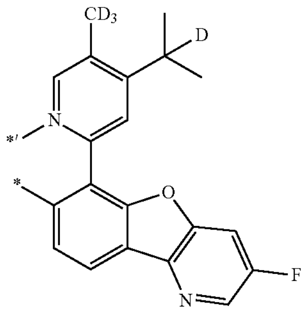
B1501
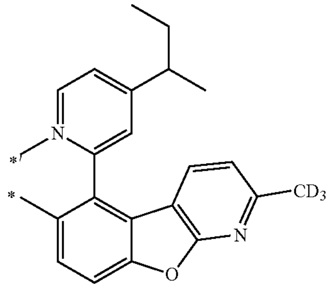
B1502
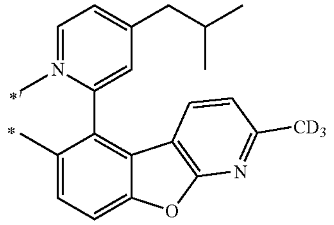
B1503
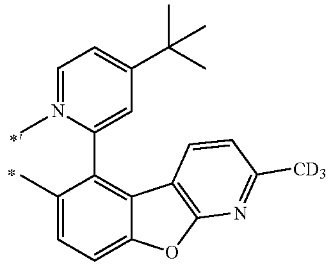
B1504
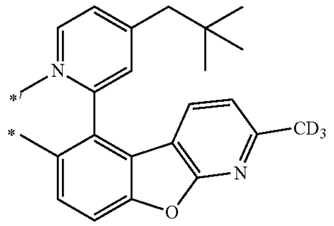
B1505
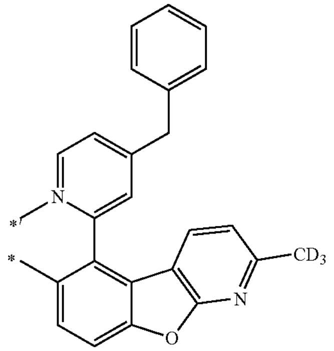
B1506
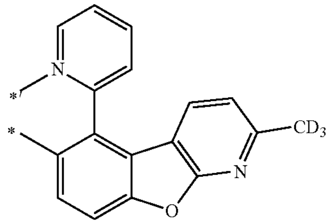

-continued
B1507
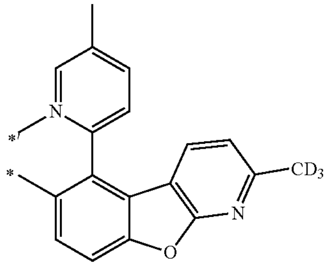
B1508
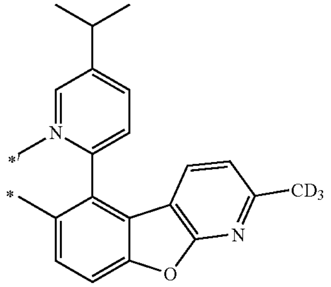
B1509
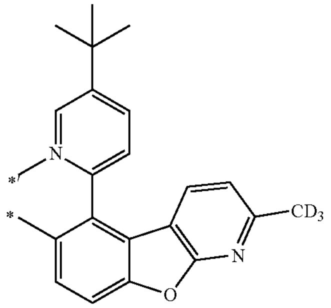
B1510
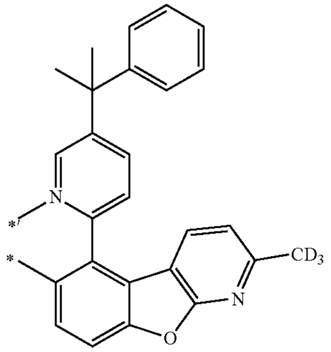
B1511
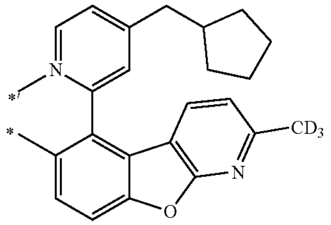
-continued
B1512
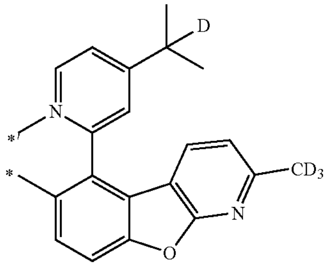
B1513
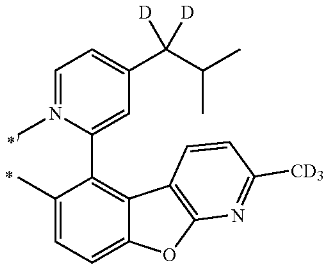
B1514
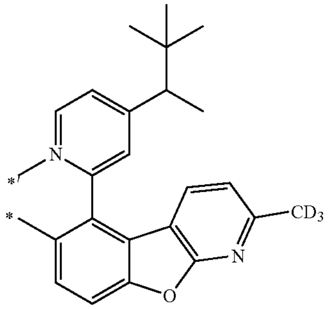
B1515
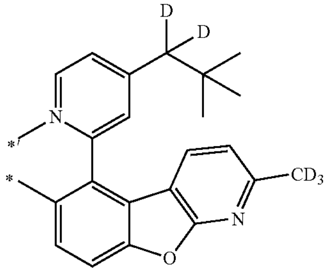
B1516
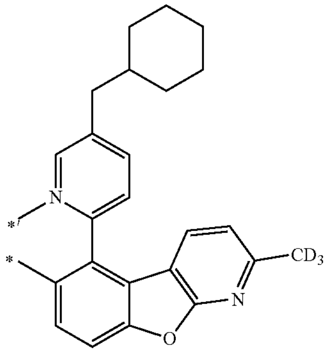

-continued
B1517
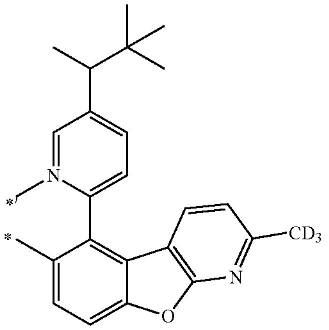
B1518
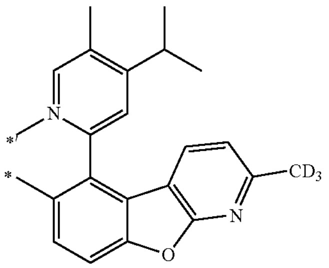
B1519
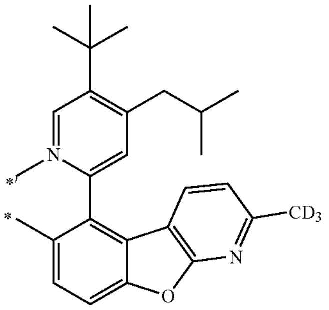
B1520
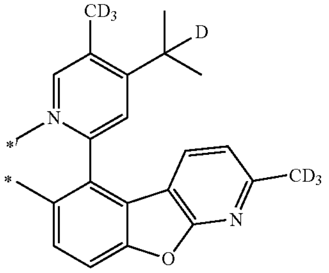
B1521
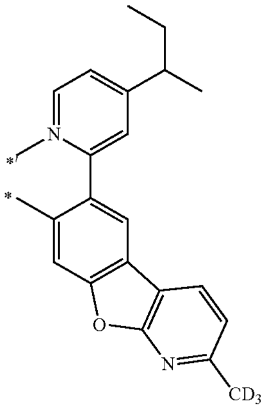
-continued
B1522
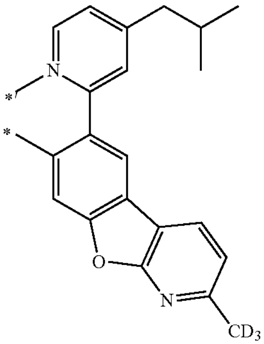
B1523
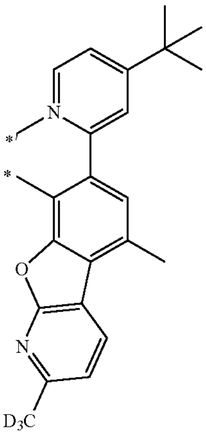
B1524
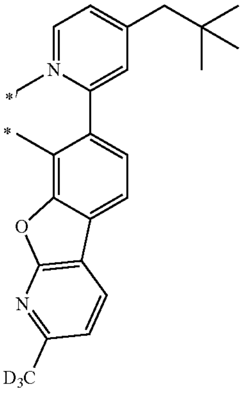
B1525
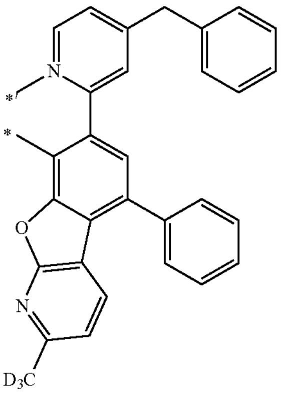

-continued
B1526
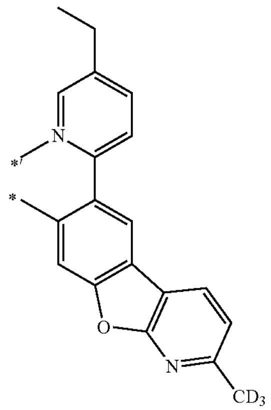
B1527
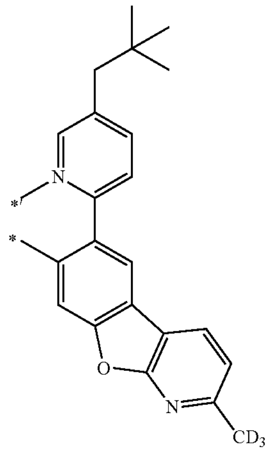
B1528
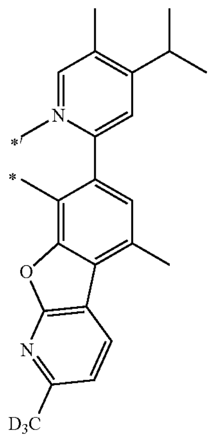
-continued
B1529
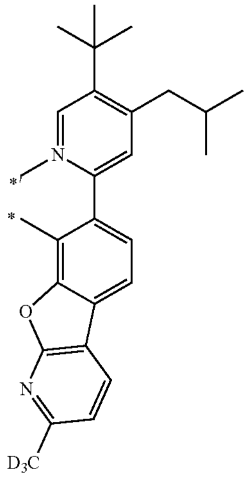
B1530
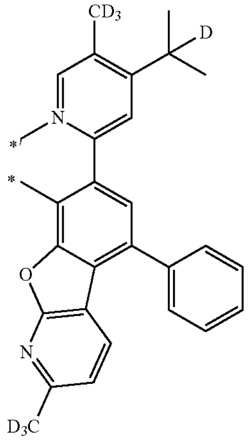
B1531
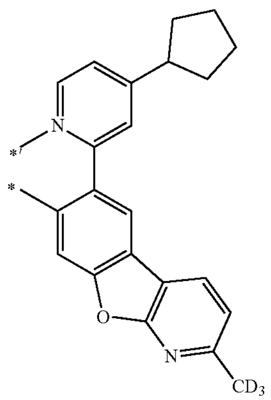

-continued
B1532
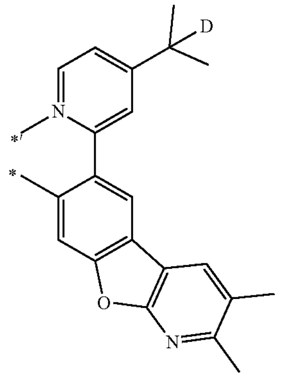
B1533
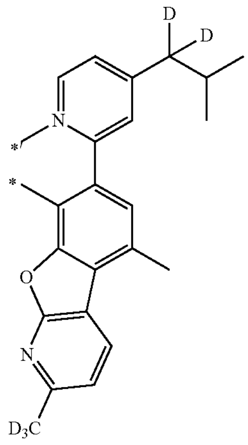
B1534
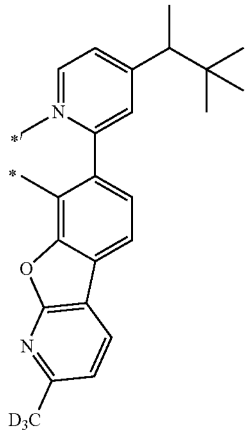
-continued
B1535
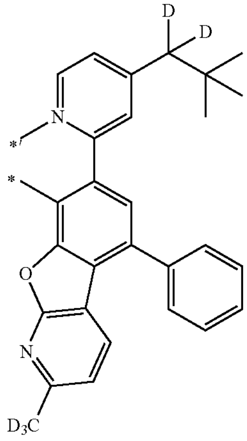
B1536
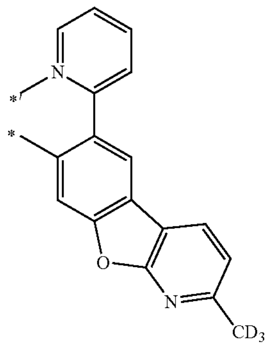
B1537
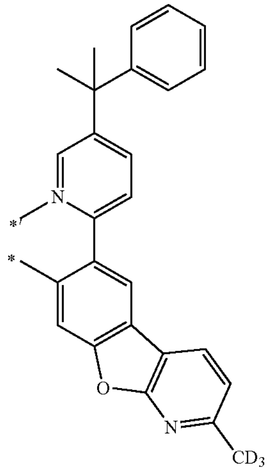

-continued

B1538

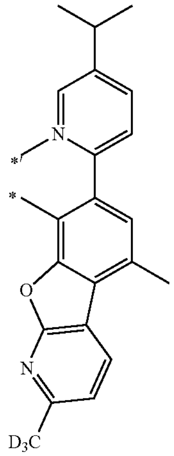

B1539

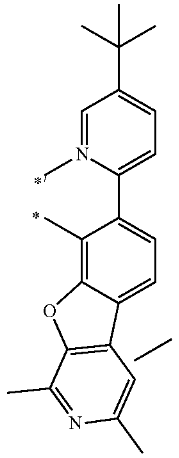

B1540

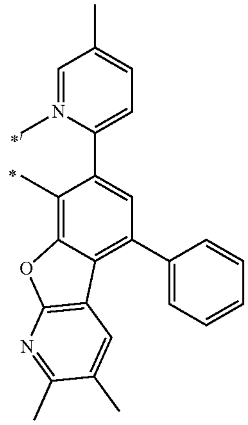

B1541

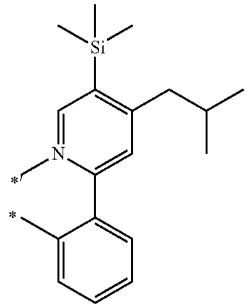

-continued

B1542

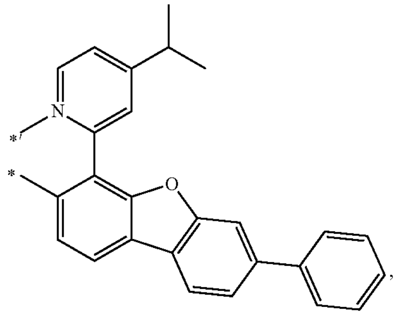

wherein * and *' each indicate a binding site to iridium.

In one or more embodiments, $L_{12}$ and $L_{13}$ in Formula 1 and a ligand represented by Formula 1-2 may each independently be selected from B to B780.

In one or more embodiments, $L_{22}$ and $L_{23}$ in Formula 2 and a ligand represented by Formula 2-2 may each independently be selected from B781 to B1542.

In one or more embodiments, the first compound and the second compound may each be one of compounds described in Tables 1 to 11 below.

TABLE 1

| [Group 1] $Ir(L_1)_2(L_2)$/ [Group 2] $Ir(L_1)(L_2)_2$ | | |
|---|---|---|
| Compound | $L_1$ | $L_2$ |
| x-1 | Ax | B1 |
| x-2 | Ax | B2 |
| x-3 | Ax | B3 |
| x-4 | Ax | B4 |
| x-5 | Ax | B5 |
| x-6 | Ax | B6 |
| x-7 | Ax | B7 |
| x-8 | Ax | B8 |
| x-9 | Ax | B9 |
| x-10 | Ax | B10 |
| x-11 | Ax | B11 |
| x-12 | Ax | B12 |
| x-13 | Ax | B13 |
| x-14 | Ax | B14 |
| x-15 | Ax | B15 |
| x-16 | Ax | B16 |
| x-17 | Ax | B17 |
| x-18 | Ax | B18 |
| x-19 | Ax | B19 |
| x-20 | Ax | B20 |
| x-21 | Ax | B21 |
| x-22 | Ax | B22 |
| x-23 | Ax | B23 |
| x-24 | Ax | B24 |
| x-25 | Ax | B25 |
| x-26 | Ax | B26 |
| x-27 | Ax | B27 |
| x-28 | Ax | B28 |
| x-29 | Ax | B29 |
| x-30 | Ax | B30 |
| x-31 | Ax | B31 |
| x-32 | Ax | B32 |
| x-33 | Ax | B33 |
| x-34 | Ax | B34 |
| x-35 | Ax | B35 |
| x-36 | Ax | B36 |
| x-37 | Ax | B37 |
| x-38 | Ax | B38 |
| x-39 | Ax | B39 |
| x-40 | Ax | B40 |
| x-41 | Ax | B41 |
| x-42 | Ax | B42 |
| x-43 | Ax | B43 |

TABLE 1-continued

| [Group 1] $Ir(L_1)_2(L_2)$/ [Group 2] $Ir(L_1)(L_2)_2$ | | |
|---|---|---|
| Compound | $L_1$ | $L_2$ |
| x-44 | Ax | B44 |
| x-45 | Ax | B45 |
| x-46 | Ax | B46 |
| x-47 | Ax | B47 |
| x-48 | Ax | B48 |
| x-49 | Ax | B49 |
| x-50 | Ax | B50 |
| x-51 | Ax | B51 |
| x-52 | Ax | B52 |
| x-53 | Ax | B53 |
| x-54 | Ax | B54 |
| x-55 | Ax | B55 |
| x-56 | Ax | B56 |
| x-57 | Ax | B57 |
| x-58 | Ax | B58 |
| x-59 | Ax | B59 |
| x-60 | Ax | B60 |
| x-61 | Ax | B61 |
| x-62 | Ax | B62 |
| x-63 | Ax | B63 |
| x-64 | Ax | B64 |
| x-65 | Ax | B65 |
| x-66 | Ax | B66 |
| x-67 | Ax | B67 |
| x-68 | Ax | B68 |
| x-69 | Ax | B69 |
| x-70 | Ax | B70 |
| x-71 | Ax | B71 |
| x-72 | Ax | B72 |
| x-73 | Ax | B73 |
| x-74 | Ax | B74 |
| x-75 | Ax | B75 |
| x-76 | Ax | B76 |
| x-77 | Ax | B77 |
| x-78 | Ax | B78 |
| x-79 | Ax | B79 |
| x-80 | Ax | B80 |
| x-81 | Ax | B81 |
| x-82 | Ax | B82 |
| x-83 | Ax | B83 |
| x-84 | Ax | B84 |
| x-85 | Ax | B85 |
| x-86 | Ax | B86 |
| x-87 | Ax | B87 |
| x-88 | Ax | B88 |
| x-89 | Ax | B89 |
| x-90 | Ax | B90 |
| x-91 | Ax | B91 |
| x-92 | Ax | B92 |
| x-93 | Ax | B93 |
| x-94 | Ax | B94 |
| x-95 | Ax | B95 |
| x-96 | Ax | B96 |
| x-97 | Ax | B97 |
| x-98 | Ax | B98 |
| x-99 | Ax | B99 |
| x-100 | Ax | B100 |
| x-101 | Ax | B101 |
| x-102 | Ax | B102 |
| x-103 | Ax | B103 |
| x-104 | Ax | B104 |
| x-105 | Ax | B105 |
| x-106 | Ax | B106 |
| x-107 | Ax | B107 |
| x-108 | Ax | B108 |
| x-109 | Ax | B109 |
| x-110 | Ax | B110 |
| x-111 | Ax | B111 |
| x-112 | Ax | B112 |
| x-113 | Ax | B113 |
| x-114 | Ax | B114 |
| x-115 | Ax | B115 |
| x-116 | Ax | B116 |
| x-117 | Ax | B117 |
| x-118 | Ax | B118 |

TABLE 1-continued

| [Group 1] $Ir(L_1)_2(L_2)$/ [Group 2] $Ir(L_1)(L_2)_2$ | | |
|---|---|---|
| Compound | $L_1$ | $L_2$ |
| x-119 | Ax | B119 |
| x-120 | Ax | B120 |
| x-121 | Ax | B121 |
| x-122 | Ax | B122 |
| x-123 | Ax | B123 |
| x-124 | Ax | B124 |
| x-125 | Ax | B125 |
| x-126 | Ax | B126 |
| x-127 | Ax | B127 |
| x-128 | Ax | B128 |
| x-129 | Ax | B129 |
| x-130 | Ax | B130 |
| x-131 | Ax | B131 |
| x-132 | Ax | B132 |
| x-133 | Ax | B133 |
| x-134 | Ax | B134 |
| x-135 | Ax | B135 |
| x-136 | Ax | B136 |
| x-137 | Ax | B137 |
| x-138 | Ax | B138 |
| x-139 | Ax | B139 |
| x-140 | Ax | B140 |
| x-141 | Ax | B141 |
| x-142 | Ax | B142 |
| x-143 | Ax | B143 |
| x-144 | Ax | B144 |
| x-145 | Ax | B145 |
| x-146 | Ax | B146 |
| x-147 | Ax | B147 |
| x-148 | Ax | B148 |
| x-149 | Ax | B149 |
| x-150 | Ax | B150 |

TABLE 2

| [Group 1] $Ir(L_1)_2(L_2)$/ [Group 2] $Ir(L_1)(L_2)_2$ | | |
|---|---|---|
| Compound | $L_1$ | $L_2$ |
| x-151 | Ax | B151 |
| x-152 | Ax | B152 |
| x-153 | Ax | B153 |
| x-154 | Ax | B154 |
| x-155 | Ax | B155 |
| x-156 | Ax | B156 |
| x-157 | Ax | B157 |
| x-158 | Ax | B158 |
| x-159 | Ax | B159 |
| x-160 | Ax | B160 |
| x-161 | Ax | B161 |
| x-162 | Ax | B162 |
| x-163 | Ax | B163 |
| x-164 | Ax | B164 |
| x-165 | Ax | B165 |
| x-166 | Ax | B166 |
| x-167 | Ax | B167 |
| x-168 | Ax | B168 |
| x-169 | Ax | B169 |
| x-170 | Ax | B170 |
| x-171 | Ax | B171 |
| x-172 | Ax | B172 |
| x-173 | Ax | B173 |
| x-174 | Ax | B174 |
| x-175 | Ax | B175 |
| x-176 | Ax | B176 |
| x-177 | Ax | B177 |
| x-178 | Ax | B178 |
| x-179 | Ax | B179 |
| x-180 | Ax | B180 |
| x-181 | Ax | B181 |
| x-182 | Ax | B182 |

TABLE 2-continued

| [Group 1] $Ir(L_1)_2(L_2)$/ [Group 2] $Ir(L_1)(L_2)_2$ | | |
|---|---|---|
| Compound | $L_1$ | $L_2$ |
| x-183 | Ax | B183 |
| x-184 | Ax | B184 |
| x-185 | Ax | B185 |
| x-186 | Ax | B186 |
| x-187 | Ax | B187 |
| x-188 | Ax | B188 |
| x-189 | Ax | B189 |
| x-190 | Ax | B190 |
| x-191 | Ax | B191 |
| x-192 | Ax | B192 |
| x-193 | Ax | B193 |
| x-194 | Ax | B194 |
| x-195 | Ax | B195 |
| x-196 | Ax | B196 |
| x-197 | Ax | B197 |
| x-198 | Ax | B198 |
| x-199 | Ax | B199 |
| x-200 | Ax | B200 |
| x-201 | Ax | B201 |
| x-202 | Ax | B202 |
| x-203 | Ax | B203 |
| x-204 | Ax | B204 |
| x-205 | Ax | B205 |
| x-206 | Ax | B206 |
| x-207 | Ax | B207 |
| x-208 | Ax | B208 |
| x-209 | Ax | B209 |
| x-210 | Ax | B210 |
| x-211 | Ax | B211 |
| x-212 | Ax | B212 |
| x-213 | Ax | B213 |
| x-214 | Ax | B214 |
| x-215 | Ax | B215 |
| x-216 | Ax | B216 |
| x-217 | Ax | B217 |
| x-218 | Ax | B218 |
| x-219 | Ax | B219 |
| x-220 | Ax | B220 |
| x-221 | Ax | B221 |
| x-222 | Ax | B222 |
| x-223 | Ax | B223 |
| x-224 | Ax | B224 |
| x-225 | Ax | B225 |
| x-226 | Ax | B226 |
| x-227 | Ax | B227 |
| x-228 | Ax | B228 |
| x-229 | Ax | B229 |
| x-230 | Ax | B230 |
| x-231 | Ax | B231 |
| x-232 | Ax | B232 |
| x-233 | Ax | B233 |
| x-234 | Ax | B234 |
| x-235 | Ax | B235 |
| x-236 | Ax | B236 |
| x-237 | Ax | B237 |
| x-238 | Ax | B238 |
| x-239 | Ax | B239 |
| x-240 | Ax | B240 |
| x-241 | Ax | B241 |
| x-242 | Ax | B242 |
| x-243 | Ax | B243 |
| x-244 | Ax | B244 |
| x-245 | Ax | B245 |
| x-246 | Ax | B246 |
| x-247 | Ax | B247 |
| x-248 | Ax | B248 |
| x-249 | Ax | B249 |
| x-250 | Ax | B250 |
| x-251 | Ax | B251 |
| x-252 | Ax | B252 |
| x-253 | Ax | B253 |
| x-254 | Ax | B254 |
| x-255 | Ax | B255 |
| x-256 | Ax | B256 |
| x-257 | Ax | B257 |

TABLE 2-continued

| [Group 1] $Ir(L_1)_2(L_2)$/ [Group 2] $Ir(L_1)(L_2)_2$ | | |
|---|---|---|
| Compound | $L_1$ | $L_2$ |
| x-258 | Ax | B258 |
| x-259 | Ax | B259 |
| x-260 | Ax | B260 |
| x-261 | Ax | B261 |
| x-262 | Ax | B262 |
| x-263 | Ax | B263 |
| x-264 | Ax | B264 |
| x-265 | Ax | B265 |
| x-266 | Ax | B266 |
| x-267 | Ax | B267 |
| x-268 | Ax | B268 |
| x-269 | Ax | B269 |
| x-270 | Ax | B270 |
| x-271 | Ax | B271 |
| x-272 | Ax | B272 |
| x-273 | Ax | B273 |
| x-274 | Ax | B274 |
| x-275 | Ax | B275 |
| x-276 | Ax | B276 |
| x-277 | Ax | B277 |
| x-278 | Ax | B278 |
| x-279 | Ax | B279 |
| x-280 | Ax | B280 |
| x-281 | Ax | B281 |
| x-282 | Ax | B282 |
| x-283 | Ax | B283 |
| x-284 | Ax | B284 |
| x-285 | Ax | B285 |
| x-286 | Ax | B286 |
| x-287 | Ax | B287 |
| x-288 | Ax | B288 |
| x-289 | Ax | B289 |
| x-290 | Ax | B290 |
| x-291 | Ax | B291 |
| x-292 | Ax | B292 |
| x-293 | Ax | B293 |
| x-294 | Ax | B294 |
| x-295 | Ax | B295 |
| x-296 | Ax | B296 |
| x-297 | Ax | B297 |
| x-298 | Ax | B298 |
| x-299 | Ax | B299 |
| x-300 | Ax | B300 |

TABLE 3

| [Group 1] $Ir(L_1)_2(L_2)$/ [Group 2] $Ir(L_1)(L_2)_2$ | | |
|---|---|---|
| Compound | $L_1$ | $L_2$ |
| x-301 | Ax | B301 |
| x-302 | Ax | B302 |
| x-303 | Ax | B303 |
| x-304 | Ax | B304 |
| x-305 | Ax | B305 |
| x-306 | Ax | B306 |
| x-307 | Ax | B307 |
| x-308 | Ax | B308 |
| x-309 | Ax | B309 |
| x-310 | Ax | B310 |
| x-311 | Ax | B311 |
| x-312 | Ax | B312 |
| x-313 | Ax | B313 |
| x-314 | Ax | B314 |
| x-315 | Ax | B315 |
| x-316 | Ax | B316 |
| x-317 | Ax | B317 |
| x-318 | Ax | B318 |
| x-319 | Ax | B319 |
| x-320 | Ax | B320 |
| x-321 | Ax | B321 |
| x-322 | Ax | B322 |

TABLE 3-continued

| Compound | [Group 1] $Ir(L_1)_2(L_2)$/ [Group 2] $Ir(L_1)(L_2)_2$ $L_1$ | $L_2$ |
|---|---|---|
| x-323 | Ax | B323 |
| x-324 | Ax | B324 |
| x-325 | Ax | B325 |
| x-326 | Ax | B326 |
| x-327 | Ax | B327 |
| x-328 | Ax | B328 |
| x-329 | Ax | B329 |
| x-330 | Ax | B330 |
| x-331 | Ax | B331 |
| x-332 | Ax | B332 |
| x-333 | Ax | B333 |
| x-334 | Ax | B334 |
| x-335 | Ax | B335 |
| x-336 | Ax | B336 |
| x-337 | Ax | B337 |
| x-338 | Ax | B338 |
| x-339 | Ax | B339 |
| x-340 | Ax | B340 |
| x-341 | Ax | B341 |
| x-342 | Ax | B342 |
| x-343 | Ax | B343 |
| x-344 | Ax | B344 |
| x-345 | Ax | B345 |
| x-346 | Ax | B346 |
| x-347 | Ax | B347 |
| x-348 | Ax | B348 |
| x-349 | Ax | B349 |
| x-350 | Ax | B350 |
| x-351 | Ax | B351 |
| x-352 | Ax | B352 |
| x-353 | Ax | B353 |
| x-354 | Ax | B354 |
| x-355 | Ax | B355 |
| x-356 | Ax | B356 |
| x-357 | Ax | B357 |
| x-358 | Ax | B358 |
| x-359 | Ax | B359 |
| x-360 | Ax | B360 |
| x-361 | Ax | B361 |
| x-362 | Ax | B362 |
| x-363 | Ax | B363 |
| x-364 | Ax | B364 |
| x-365 | Ax | B365 |
| x-366 | Ax | B366 |
| x-367 | Ax | B367 |
| x-368 | Ax | B368 |
| x-369 | Ax | B369 |
| x-370 | Ax | B370 |
| x-371 | Ax | B371 |
| x-372 | Ax | B372 |
| x-373 | Ax | B373 |
| x-374 | Ax | B374 |
| x-375 | Ax | B375 |
| x-376 | Ax | B376 |
| x-377 | Ax | B377 |
| x-378 | Ax | B378 |
| x-379 | Ax | B379 |
| x-380 | Ax | B380 |
| x-381 | Ax | B381 |
| x-382 | Ax | B382 |
| x-383 | Ax | B383 |
| x-384 | Ax | B384 |
| x-385 | Ax | B385 |
| x-386 | Ax | B386 |
| x-387 | Ax | B387 |
| x-388 | Ax | B388 |
| x-389 | Ax | B389 |
| x-390 | Ax | B390 |
| x-391 | Ax | B391 |
| x-392 | Ax | B392 |
| x-393 | Ax | B393 |
| x-394 | Ax | B394 |
| x-395 | Ax | B395 |
| x-396 | Ax | B396 |
| x-397 | Ax | B397 |
| x-398 | Ax | B398 |

TABLE 3-continued

| Compound | [Group 1] $Ir(L_1)_2(L_2)$/ [Group 2] $Ir(L_1)(L_2)_2$ $L_1$ | $L_2$ |
|---|---|---|
| x-399 | Ax | B399 |
| x-400 | Ax | B400 |
| x-401 | Ax | B401 |
| x-402 | Ax | B402 |
| x-403 | Ax | B403 |
| x-404 | Ax | B404 |
| x-405 | Ax | B405 |
| x-406 | Ax | B406 |
| x-407 | Ax | B407 |
| x-408 | Ax | B408 |
| x-409 | Ax | B409 |
| x-410 | Ax | B410 |
| x-411 | Ax | B411 |
| x-412 | Ax | B412 |
| x-413 | Ax | B413 |
| x-414 | Ax | B414 |
| x-415 | Ax | B415 |
| x-416 | Ax | B416 |
| x-417 | Ax | B417 |
| x-418 | Ax | B418 |
| x-419 | Ax | B419 |
| x-420 | Ax | B420 |
| x-421 | Ax | B421 |
| x-422 | Ax | B422 |
| x-423 | Ax | B423 |
| x-424 | Ax | B424 |
| x-425 | Ax | B425 |
| x-426 | Ax | B426 |
| x-427 | Ax | B427 |
| x-428 | Ax | B428 |
| x-429 | Ax | B429 |
| x-430 | Ax | B430 |
| x-431 | Ax | B431 |
| x-432 | Ax | B432 |
| x-433 | Ax | B433 |
| x-434 | Ax | B434 |
| x-435 | Ax | B435 |
| x-436 | Ax | B436 |
| x-437 | Ax | B437 |
| x-438 | Ax | B438 |
| x-439 | Ax | B439 |
| x-440 | Ax | B440 |
| x-441 | Ax | B441 |
| x-442 | Ax | B442 |
| x-443 | Ax | B443 |
| x-444 | Ax | B444 |
| x-445 | Ax | B445 |
| x-446 | Ax | B446 |
| x-447 | Ax | B447 |
| x-448 | Ax | B448 |
| x-449 | Ax | B449 |
| x-450 | Ax | B450 |

TABLE 4

| Compound | [Group 1] $Ir(L_1)_2(L_2)$/ [Group 2] $Ir(L_1)(L_2)_2$ $L_1$ | $L_2$ |
|---|---|---|
| x-451 | Ax | B451 |
| x-452 | Ax | B452 |
| x-453 | Ax | B453 |
| x-454 | Ax | B454 |
| x-455 | Ax | B455 |
| x-456 | Ax | B456 |
| x-457 | Ax | B457 |
| x-458 | Ax | B458 |
| x-459 | Ax | B459 |
| x-460 | Ax | B460 |
| x-461 | Ax | B461 |
| x-462 | Ax | B462 |
| x-463 | Ax | B463 |

TABLE 4-continued

| [Group 1] $Ir(L_1)_2(L_2)$/ [Group 2] $Ir(L_1)(L_2)_2$ | | |
|---|---|---|
| Compound | $L_1$ | $L_2$ |
| x-464 | Ax | B464 |
| x-465 | Ax | B465 |
| x-466 | Ax | B466 |
| x-467 | Ax | B467 |
| x-468 | Ax | B468 |
| x-469 | Ax | B469 |
| x-470 | Ax | B470 |
| x-471 | Ax | B471 |
| x-472 | Ax | B472 |
| x-473 | Ax | B473 |
| x-474 | Ax | B474 |
| x-475 | Ax | B475 |
| x-476 | Ax | B476 |
| x-477 | Ax | B477 |
| x-478 | Ax | B478 |
| x-479 | Ax | B479 |
| x-480 | Ax | B480 |
| x-481 | Ax | B481 |
| x-482 | Ax | B482 |
| x-483 | Ax | B483 |
| x-484 | Ax | B484 |
| x-485 | Ax | B485 |
| x-486 | Ax | B486 |
| x-487 | Ax | B487 |
| x-488 | Ax | B488 |
| x-489 | Ax | B489 |
| x-490 | Ax | B490 |
| x-491 | Ax | B491 |
| x-492 | Ax | B492 |
| x-493 | Ax | B493 |
| x-494 | Ax | B494 |
| x-495 | Ax | B495 |
| x-496 | Ax | B496 |
| x-497 | Ax | B497 |
| x-498 | Ax | B498 |
| x-499 | Ax | B499 |
| x-500 | Ax | B500 |
| x-501 | Ax | B501 |
| x-502 | Ax | B502 |
| x-503 | Ax | B503 |
| x-504 | Ax | B504 |
| x-505 | Ax | B505 |
| x-506 | Ax | B506 |
| x-507 | Ax | B507 |
| x-508 | Ax | B508 |
| x-509 | Ax | B509 |
| x-510 | Ax | B510 |
| x-511 | Ax | B511 |
| x-512 | Ax | B512 |
| x-513 | Ax | B513 |
| x-514 | Ax | B514 |
| x-515 | Ax | B515 |
| x-516 | Ax | B516 |
| x-517 | Ax | B517 |
| x-518 | Ax | B518 |
| x-519 | Ax | B519 |
| x-520 | Ax | B520 |
| x-521 | Ax | B521 |
| x-522 | Ax | B522 |
| x-523 | Ax | B523 |
| x-524 | Ax | B524 |
| x-525 | Ax | B525 |
| x-526 | Ax | B526 |
| x-527 | Ax | B527 |
| x-528 | Ax | B528 |
| x-529 | Ax | B529 |
| x-530 | Ax | B530 |
| x-531 | Ax | B531 |
| x-532 | Ax | B532 |
| x-533 | Ax | B533 |
| x-534 | Ax | B534 |
| x-535 | Ax | B535 |
| x-536 | Ax | B536 |
| x-537 | Ax | B537 |
| x-538 | Ax | B538 |

TABLE 4-continued

| [Group 1] $Ir(L_1)_2(L_2)$/ [Group 2] $Ir(L_1)(L_2)_2$ | | |
|---|---|---|
| Compound | $L_1$ | $L_2$ |
| x-539 | Ax | B539 |
| x-540 | Ax | B540 |
| x-541 | Ax | B541 |
| x-542 | Ax | B542 |
| x-543 | Ax | B543 |
| x-544 | Ax | B544 |
| x-545 | Ax | B545 |
| x-546 | Ax | B546 |
| x-547 | Ax | B547 |
| x-548 | Ax | B548 |
| x-549 | Ax | B549 |
| x-550 | Ax | B550 |
| x-551 | Ax | B551 |
| x-552 | Ax | B552 |
| x-553 | Ax | B553 |
| x-554 | Ax | B554 |
| x-555 | Ax | B555 |
| x-556 | Ax | B556 |
| x-557 | Ax | B557 |
| x-558 | Ax | B558 |
| x-559 | Ax | B559 |
| x-560 | Ax | B560 |
| x-561 | Ax | B561 |
| x-562 | Ax | B562 |
| x-563 | Ax | B563 |
| x-564 | Ax | B564 |
| x-565 | Ax | B565 |
| x-566 | Ax | B566 |
| x-567 | Ax | B567 |
| x-568 | Ax | B568 |
| x-569 | Ax | B569 |
| x-570 | Ax | B570 |
| x-571 | Ax | B571 |
| x-572 | Ax | B572 |
| x-573 | Ax | B573 |
| x-574 | Ax | B574 |
| x-575 | Ax | B575 |
| x-576 | Ax | B576 |
| x-577 | Ax | B577 |
| x-578 | Ax | B578 |
| x-579 | Ax | B579 |
| x-580 | Ax | B580 |
| x-581 | Ax | B581 |
| x-582 | Ax | B582 |
| x-583 | Ax | B583 |
| x-584 | Ax | B584 |
| x-585 | Ax | B585 |
| x-586 | Ax | B586 |
| x-587 | Ax | B587 |
| x-588 | Ax | B588 |
| x-589 | Ax | B589 |
| x-590 | Ax | B590 |
| x-591 | Ax | B591 |
| x-592 | Ax | B592 |
| x-593 | Ax | B593 |
| x-594 | Ax | B594 |
| x-595 | Ax | B595 |
| x-596 | Ax | B596 |
| x-597 | Ax | B597 |
| x-598 | Ax | B598 |
| x-599 | Ax | B599 |
| x-600 | Ax | B600 |

TABLE 5

| [Group 1] $Ir(L_1)_2(L_2)$/ [Group 2] $Ir(L_1)(L_2)_2$ | | |
|---|---|---|
| Compound | $L_1$ | $L_2$ |
| x-601 | Ax | B601 |
| x-602 | Ax | B602 |

TABLE 5-continued

| [Group 1] $Ir(L_1)_2(L_2)$/ [Group 2] $Ir(L_1)(L_2)_2$ | | |
|---|---|---|
| Compound | $L_1$ | $L_2$ |
| x-603 | Ax | B603 |
| x-604 | Ax | B604 |
| x-605 | Ax | B605 |
| x-606 | Ax | B606 |
| x-607 | Ax | B607 |
| x-608 | Ax | B608 |
| x-609 | Ax | B609 |
| x-610 | Ax | B610 |
| x-611 | Ax | B611 |
| x-612 | Ax | B612 |
| x-613 | Ax | B613 |
| x-614 | Ax | B614 |
| x-615 | Ax | B615 |
| x-616 | Ax | B616 |
| x-617 | Ax | B617 |
| x-618 | Ax | B618 |
| x-619 | Ax | B619 |
| x-620 | Ax | B620 |
| x-621 | Ax | B621 |
| x-622 | Ax | B622 |
| x-623 | Ax | B623 |
| x-624 | Ax | B624 |
| x-625 | Ax | B625 |
| x-626 | Ax | B626 |
| x-627 | Ax | B627 |
| x-628 | Ax | B628 |
| x-629 | Ax | B629 |
| x-630 | Ax | B630 |
| x-631 | Ax | B631 |
| x-632 | Ax | B632 |
| x-633 | Ax | B633 |
| x-634 | Ax | B634 |
| x-635 | Ax | B635 |
| x-636 | Ax | B636 |
| x-637 | Ax | B637 |
| x-638 | Ax | B638 |
| x-639 | Ax | B639 |
| x-640 | Ax | B640 |
| x-641 | Ax | B641 |
| x-642 | Ax | B642 |
| x-643 | Ax | B643 |
| x-644 | Ax | B644 |
| x-645 | Ax | B645 |
| x-646 | Ax | B646 |
| x-647 | Ax | B647 |
| x-648 | Ax | B648 |
| x-649 | Ax | B649 |
| x-650 | Ax | B650 |
| x-651 | Ax | B651 |
| x-652 | Ax | B652 |
| x-653 | Ax | B653 |
| x-654 | Ax | B654 |
| x-655 | Ax | B655 |
| x-656 | Ax | B656 |
| x-657 | Ax | B657 |
| x-658 | Ax | B658 |
| x-659 | Ax | B659 |
| x-660 | Ax | B660 |
| x-661 | Ax | B661 |
| x-662 | Ax | B662 |
| x-663 | Ax | B663 |
| x-664 | Ax | B664 |
| x-665 | Ax | B665 |
| x-666 | Ax | B666 |
| x-667 | Ax | B667 |
| x-668 | Ax | B668 |
| x-669 | Ax | B669 |
| x-670 | Ax | B670 |
| x-671 | Ax | B671 |
| x-672 | Ax | B672 |
| x-673 | Ax | B673 |
| x-674 | Ax | B674 |
| x-675 | Ax | B675 |
| x-676 | Ax | B676 |
| x-677 | Ax | B677 |

TABLE 5-continued

| [Group 1] $Ir(L_1)_2(L_2)$/ [Group 2] $Ir(L_1)(L_2)_2$ | | |
|---|---|---|
| Compound | $L_1$ | $L_2$ |
| x-678 | Ax | B678 |
| x-679 | Ax | B679 |
| x-680 | Ax | B680 |
| x-681 | Ax | B681 |
| x-682 | Ax | B682 |
| x-683 | Ax | B683 |
| x-684 | Ax | B684 |
| x-685 | Ax | B685 |
| x-686 | Ax | B686 |
| x-687 | Ax | B687 |
| x-688 | Ax | B688 |
| x-689 | Ax | B689 |
| x-690 | Ax | B690 |
| x-691 | Ax | B691 |
| x-692 | Ax | B692 |
| x-693 | Ax | B693 |
| x-694 | Ax | B694 |
| x-695 | Ax | B695 |
| x-696 | Ax | B696 |
| x-697 | Ax | B697 |
| x-698 | Ax | B698 |
| x-699 | Ax | B699 |
| x-700 | Ax | B700 |
| x-701 | Ax | B701 |
| x-702 | Ax | B702 |
| x-703 | Ax | B703 |
| x-704 | Ax | B704 |
| x-705 | Ax | B705 |
| x-706 | Ax | B706 |
| x-707 | Ax | B707 |
| x-708 | Ax | B708 |
| x-709 | Ax | B709 |
| x-710 | Ax | B710 |
| x-711 | Ax | B711 |
| x-712 | Ax | B712 |
| x-713 | Ax | B713 |
| x-714 | Ax | B714 |
| x-715 | Ax | B715 |
| x-716 | Ax | B716 |
| x-717 | Ax | B717 |
| x-718 | Ax | B718 |
| x-719 | Ax | B719 |
| x-720 | Ax | B720 |
| x-721 | Ax | B721 |
| x-722 | Ax | B722 |
| x-723 | Ax | B723 |
| x-724 | Ax | B724 |
| x-725 | Ax | B725 |
| x-726 | Ax | B726 |
| x-727 | Ax | B727 |
| x-728 | Ax | B728 |
| x-729 | Ax | B729 |
| x-730 | Ax | B730 |
| x-731 | Ax | B731 |
| x-732 | Ax | B732 |
| x-733 | Ax | B733 |
| x-734 | Ax | B734 |
| x-735 | Ax | B735 |
| x-736 | Ax | B736 |
| x-737 | Ax | B737 |
| x-738 | Ax | B738 |
| x-739 | Ax | B739 |
| x-740 | Ax | B740 |
| x-741 | Ax | B741 |
| x-742 | Ax | B742 |
| x-743 | Ax | B743 |
| x-744 | Ax | B744 |
| x-745 | Ax | B745 |
| x-746 | Ax | B746 |
| x-747 | Ax | B747 |
| x-748 | Ax | B748 |
| x-749 | Ax | B749 |
| x-750 | Ax | B750 |

TABLE 6

| [Group 1] $Ir(L_1)_2(L_2)$/ [Group 2] $Ir(L_1)(L_2)_2$ | | |
|---|---|---|
| Compound | $L_1$ | $L_2$ |
| x-751 | Ax | B751 |
| x-752 | Ax | B752 |
| x-753 | Ax | B753 |
| x-754 | Ax | B754 |
| x-755 | Ax | B755 |
| x-756 | Ax | B756 |
| x-757 | Ax | B757 |
| x-758 | Ax | B758 |
| x-759 | Ax | B759 |
| x-760 | Ax | B760 |
| x-761 | Ax | B761 |
| x-762 | Ax | B762 |
| x-763 | Ax | B763 |
| x-764 | Ax | B764 |
| x-765 | Ax | B765 |
| x-766 | Ax | B766 |
| x-767 | Ax | B767 |
| x-768 | Ax | B768 |
| x-769 | Ax | B769 |
| x-770 | Ax | B770 |
| x-771 | Ax | B771 |
| x-772 | Ax | B772 |
| x-773 | Ax | B773 |
| x-774 | Ax | B774 |
| x-775 | Ax | B775 |
| x-776 | Ax | B776 |
| x-777 | Ax | B777 |
| x-778 | Ax | B778 |
| x-779 | Ax | B779 |
| x-780 | Ax | B780 |
| x-781 | Ax | B781 |
| x-782 | Ax | B782 |
| x-783 | Ax | B783 |
| x-784 | Ax | B784 |
| x-785 | Ax | B785 |
| x-786 | Ax | B786 |
| x-787 | Ax | B787 |
| x-788 | Ax | B788 |
| x-789 | Ax | B789 |
| x-790 | Ax | B790 |
| x-791 | Ax | B791 |
| x-792 | Ax | B792 |
| x-793 | Ax | B793 |
| x-794 | Ax | B794 |
| x-795 | Ax | B795 |
| x-796 | Ax | B796 |
| x-797 | Ax | B797 |
| x-798 | Ax | B798 |
| x-799 | Ax | B799 |
| x-801 | Ax | B801 |
| x-802 | Ax | B802 |
| x-803 | Ax | B803 |
| x-804 | Ax | B804 |
| x-805 | Ax | B805 |
| x-806 | Ax | B806 |
| x-807 | Ax | B807 |
| x-808 | Ax | B808 |
| x-809 | Ax | B809 |
| x-810 | Ax | B810 |
| x-811 | Ax | B811 |
| x-812 | Ax | B812 |
| x-813 | Ax | B813 |
| x-814 | Ax | B814 |
| x-815 | Ax | B815 |
| x-816 | Ax | B816 |
| x-817 | Ax | B817 |
| x-818 | Ax | B818 |
| x-819 | Ax | B819 |
| x-820 | Ax | B820 |
| x-821 | Ax | B821 |
| x-822 | Ax | B822 |
| x-823 | Ax | B823 |
| x-824 | Ax | B824 |
| x-825 | Ax | B825 |
| x-826 | Ax | B826 |

TABLE 6-continued

| [Group 1] $Ir(L_1)_2(L_2)$/ [Group 2] $Ir(L_1)(L_2)_2$ | | |
|---|---|---|
| Compound | $L_1$ | $L_2$ |
| x-827 | Ax | B827 |
| x-828 | Ax | B828 |
| x-829 | Ax | B829 |
| x-830 | Ax | B830 |
| x-831 | Ax | B831 |
| x-832 | Ax | B832 |
| x-833 | Ax | B833 |
| x-834 | Ax | B834 |
| x-835 | Ax | B835 |
| x-836 | Ax | B836 |
| x-837 | Ax | B837 |
| x-838 | Ax | B838 |
| x-839 | Ax | B839 |
| x-840 | Ax | B840 |
| x-841 | Ax | B841 |
| x-842 | Ax | B842 |
| x-843 | Ax | B843 |
| x-844 | Ax | B844 |
| x-845 | Ax | B845 |
| x-846 | Ax | B846 |
| x-847 | Ax | B847 |
| x-848 | Ax | B848 |
| x-849 | Ax | B849 |
| x-850 | Ax | B850 |
| x-851 | Ax | B851 |
| x-852 | Ax | B852 |
| x-853 | Ax | B853 |
| x-854 | Ax | B854 |
| x-855 | Ax | B855 |
| x-856 | Ax | B856 |
| x-857 | Ax | B857 |
| x-858 | Ax | B858 |
| x-859 | Ax | B859 |
| x-860 | Ax | B860 |
| x-861 | Ax | B861 |
| x-862 | Ax | B862 |
| x-863 | Ax | B863 |
| x-864 | Ax | B864 |
| x-865 | Ax | B865 |
| x-866 | Ax | B866 |
| x-867 | Ax | B867 |
| x-868 | Ax | B868 |
| x-869 | Ax | B869 |
| x-870 | Ax | B870 |
| x-871 | Ax | B871 |
| x-872 | Ax | B872 |
| x-873 | Ax | B873 |
| x-874 | Ax | B874 |
| x-875 | Ax | B875 |
| x-876 | Ax | B876 |
| x-877 | Ax | B877 |
| x-878 | Ax | B878 |
| x-879 | Ax | B879 |
| x-880 | Ax | B880 |
| x-881 | Ax | B881 |
| x-882 | Ax | B882 |
| x-883 | Ax | B883 |
| x-884 | Ax | B884 |
| x-885 | Ax | B885 |
| x-886 | Ax | B886 |
| x-887 | Ax | B887 |
| x-888 | Ax | B888 |
| x-889 | Ax | B889 |
| x-890 | Ax | B890 |
| x-891 | Ax | B891 |
| x-892 | Ax | B892 |
| x-893 | Ax | B893 |
| x-894 | Ax | B894 |
| x-895 | Ax | B895 |
| x-896 | Ax | B896 |
| x-897 | Ax | B897 |
| x-898 | Ax | B898 |
| x-899 | Ax | B899 |
| x-900 | Ax | B900 |

TABLE 7

| [Group 1] $Ir(L_1)_2(L_2)$/ [Group 2] $Ir(L_1)(L_2)_2$ | | |
|---|---|---|
| Compound | $L_1$ | $L_2$ |
| x-901 | Ax | B901 |
| x-902 | Ax | B902 |
| x-903 | Ax | B903 |
| x-904 | Ax | B904 |
| x-905 | Ax | B905 |
| x-906 | Ax | B906 |
| x-907 | Ax | B907 |
| x-908 | Ax | B908 |
| x-909 | Ax | B909 |
| x-910 | Ax | B910 |
| x-911 | Ax | B911 |
| x-912 | Ax | B912 |
| x-913 | Ax | B913 |
| x-914 | Ax | B914 |
| x-915 | Ax | B915 |
| x-916 | Ax | B916 |
| x-917 | Ax | B917 |
| x-918 | Ax | B918 |
| x-919 | Ax | B919 |
| x-920 | Ax | B920 |
| x-921 | Ax | B921 |
| x-922 | Ax | B922 |
| x-923 | Ax | B923 |
| x-924 | Ax | B924 |
| x-925 | Ax | B925 |
| x-926 | Ax | B926 |
| x-927 | Ax | B927 |
| x-928 | Ax | B928 |
| x-929 | Ax | B929 |
| x-930 | Ax | B930 |
| x-931 | Ax | B931 |
| x-932 | Ax | B932 |
| x-933 | Ax | B933 |
| x-934 | Ax | B934 |
| x-935 | Ax | B935 |
| x-936 | Ax | B936 |
| x-937 | Ax | B937 |
| x-938 | Ax | B938 |
| x-939 | Ax | B939 |
| x-940 | Ax | B940 |
| x-941 | Ax | B941 |
| x-942 | Ax | B942 |
| x-943 | Ax | B943 |
| x-944 | Ax | B944 |
| x-945 | Ax | B945 |
| x-946 | Ax | B946 |
| x-947 | Ax | B947 |
| x-948 | Ax | B948 |
| x-949 | Ax | B949 |
| x-950 | Ax | B950 |
| x-951 | Ax | B951 |
| x-952 | Ax | B952 |
| x-953 | Ax | B953 |
| x-954 | Ax | B954 |
| x-955 | Ax | B955 |
| x-956 | Ax | B956 |
| x-957 | Ax | B957 |
| x-958 | Ax | B958 |
| x-959 | Ax | B959 |
| x-960 | Ax | B960 |
| x-961 | Ax | B961 |
| x-962 | Ax | B962 |
| x-963 | Ax | B963 |
| x-964 | Ax | B964 |
| x-965 | Ax | B965 |
| x-966 | Ax | B966 |
| x-967 | Ax | B967 |
| x-968 | Ax | B968 |
| x-969 | Ax | B969 |
| x-970 | Ax | B970 |
| x-971 | Ax | B971 |
| x-972 | Ax | B972 |
| x-973 | Ax | B973 |
| x-974 | Ax | B974 |
| x-975 | Ax | B975 |

TABLE 7-continued

| [Group 1] $Ir(L_1)_2(L_2)$/ [Group 2] $Ir(L_1)(L_2)_2$ | | |
|---|---|---|
| Compound | $L_1$ | $L_2$ |
| x-976 | Ax | B976 |
| x-977 | Ax | B977 |
| x-978 | Ax | B978 |
| x-979 | Ax | B979 |
| x-980 | Ax | B980 |
| x-981 | Ax | B981 |
| x-982 | Ax | B982 |
| x-983 | Ax | B983 |
| x-984 | Ax | B984 |
| x-985 | Ax | B985 |
| x-986 | Ax | B986 |
| x-987 | Ax | B987 |
| x-988 | Ax | B988 |
| x-989 | Ax | B989 |
| x-990 | Ax | B990 |
| x-991 | Ax | B991 |
| x-992 | Ax | B992 |
| x-993 | Ax | B993 |
| x-994 | Ax | B994 |
| x-995 | Ax | B995 |
| x-996 | Ax | B996 |
| x-997 | Ax | B997 |
| x-998 | Ax | B998 |
| x-999 | Ax | B999 |
| x-1001 | Ax | B1001 |
| x-1002 | Ax | B1002 |
| x-1003 | Ax | B1003 |
| x-1004 | Ax | B1004 |
| x-1005 | Ax | B1005 |
| x-1006 | Ax | B1006 |
| x-1007 | Ax | B1007 |
| x-1008 | Ax | B1008 |
| x-1009 | Ax | B1009 |
| x-1010 | Ax | B1010 |
| x-1011 | Ax | B1011 |
| x-1012 | Ax | B1012 |
| x-1013 | Ax | B1013 |
| x-1014 | Ax | B1014 |
| x-1015 | Ax | B1015 |
| x-1016 | Ax | B1016 |
| x-1017 | Ax | B1017 |
| x-1018 | Ax | B1018 |
| x-1019 | Ax | B1019 |
| x-1020 | Ax | B1020 |
| x-1021 | Ax | B1021 |
| x-1022 | Ax | B1022 |
| x-1023 | Ax | B1023 |
| x-1024 | Ax | B1024 |
| x-1025 | Ax | B1025 |
| x-1026 | Ax | B1026 |
| x-1027 | Ax | B1027 |
| x-1028 | Ax | B1028 |
| x-1029 | Ax | B1029 |
| x-1030 | Ax | B1030 |
| x-1031 | Ax | B1031 |
| x-1032 | Ax | B1032 |
| x-1033 | Ax | B1033 |
| x-1034 | Ax | B1034 |
| x-1035 | Ax | B1035 |
| x-1036 | Ax | B1036 |
| x-1037 | Ax | B1037 |
| x-1038 | Ax | B1038 |
| x-1039 | Ax | B1039 |
| x-1040 | Ax | B1040 |
| x-1041 | Ax | B1041 |
| x-1042 | Ax | B1042 |
| x-1043 | Ax | B1043 |
| x-1044 | Ax | B1044 |
| x-1045 | Ax | B1045 |
| x-1046 | Ax | B1046 |
| x-1047 | Ax | B1047 |
| x-1048 | Ax | B1048 |
| x-1049 | Ax | B1049 |
| x-1050 | Ax | B1050 |

TABLE 8

| [Group 1] $Ir(L_1)_2(L_2)$/ [Group 2] $Ir(L_1)(L_2)_2$ | | |
|---|---|---|
| Compound | $L_1$ | $L_2$ |
| x-1051 | Ax | B1051 |
| x-1052 | Ax | B1052 |
| x-1053 | Ax | B1053 |
| x-1054 | Ax | B1054 |
| x-1055 | Ax | B1055 |
| x-1056 | Ax | B1056 |
| x-1057 | Ax | B1057 |
| x-1058 | Ax | B1058 |
| x-1059 | Ax | B1059 |
| x-1060 | Ax | B1060 |
| x-1061 | Ax | B1061 |
| x-1062 | Ax | B1062 |
| x-1063 | Ax | B1063 |
| x-1064 | Ax | B1064 |
| x-1065 | Ax | B1065 |
| x-1066 | Ax | B1066 |
| x-1067 | Ax | B1067 |
| x-1068 | Ax | B1068 |
| x-1069 | Ax | B1069 |
| x-1070 | Ax | B1070 |
| x-1071 | Ax | B1071 |
| x-1072 | Ax | B1072 |
| x-1073 | Ax | B1073 |
| x-1074 | Ax | B1074 |
| x-1075 | Ax | B1075 |
| x-1076 | Ax | B1076 |
| x-1077 | Ax | B1077 |
| x-1078 | Ax | B1078 |
| x-1079 | Ax | B1079 |
| x-1080 | Ax | B1080 |
| x-1081 | Ax | B1081 |
| x-1082 | Ax | B1082 |
| x-1083 | Ax | B1083 |
| x-1084 | Ax | B1084 |
| x-1085 | Ax | B1085 |
| x-1086 | Ax | B1086 |
| x-1087 | Ax | B1087 |
| x-1088 | Ax | B1088 |
| x-1089 | Ax | B1089 |
| x-1090 | Ax | B1090 |
| x-1091 | Ax | B1091 |
| x-1092 | Ax | B1092 |
| x-1093 | Ax | B1093 |
| x-1094 | Ax | B1094 |
| x-1095 | Ax | B1095 |
| x-1096 | Ax | B1096 |
| x-1097 | Ax | B1097 |
| x-1098 | Ax | B1098 |
| x-1099 | Ax | B1099 |
| x-1100 | Ax | B1100 |
| x-1101 | Ax | B1101 |
| x-1102 | Ax | B1102 |
| x-1103 | Ax | B1103 |
| x-1104 | Ax | B1104 |
| x-1105 | Ax | B1105 |
| x-1106 | Ax | B1106 |
| x-1107 | Ax | B1107 |
| x-1108 | Ax | B1108 |
| x-1109 | Ax | B1109 |
| x-1110 | Ax | B1110 |
| x-1111 | Ax | B1111 |
| x-1112 | Ax | B1112 |
| x-1113 | Ax | B1113 |
| x-1114 | Ax | B1114 |
| x-1115 | Ax | B1115 |
| x-1116 | Ax | B1116 |
| x-1117 | Ax | B1117 |
| x-1118 | Ax | B1118 |
| x-1119 | Ax | B1119 |
| x-1120 | Ax | B1120 |
| x-1121 | Ax | B1121 |
| x-1122 | Ax | B1122 |
| x-1123 | Ax | B1123 |
| x-1124 | Ax | B1124 |
| x-1125 | Ax | B1125 |

TABLE 8-continued

| [Group 1] $Ir(L_1)_2(L_2)$/ [Group 2] $Ir(L_1)(L_2)_2$ | | |
|---|---|---|
| Compound | $L_1$ | $L_2$ |
| x-1126 | Ax | B1126 |
| x-1127 | Ax | B1127 |
| x-1128 | Ax | B1128 |
| x-1129 | Ax | B1129 |
| x-1130 | Ax | B1130 |
| x-1131 | Ax | B1131 |
| x-1132 | Ax | B1132 |
| x-1133 | Ax | B1133 |
| x-1134 | Ax | B1134 |
| x-1135 | Ax | B1135 |
| x-1136 | Ax | B1136 |
| x-1137 | Ax | B1137 |
| x-1138 | Ax | B1138 |
| x-1139 | Ax | B1139 |
| x-1140 | Ax | B1140 |
| x-1141 | Ax | B1141 |
| x-1142 | Ax | B1142 |
| x-1143 | Ax | B1143 |
| x-1144 | Ax | B1144 |
| x-1145 | Ax | B1145 |
| x-1146 | Ax | B1146 |
| x-1147 | Ax | B1147 |
| x-1148 | Ax | B1148 |
| x-1149 | Ax | B1149 |
| x-1150 | Ax | B1150 |
| x-1151 | Ax | B1151 |
| x-1152 | Ax | B1152 |
| x-1153 | Ax | B1153 |
| x-1154 | Ax | B1154 |
| x-1155 | Ax | B1155 |
| x-1156 | Ax | B1156 |
| x-1157 | Ax | B1157 |
| x-1158 | Ax | B1158 |
| x-1159 | Ax | B1159 |
| x-1160 | Ax | B1160 |
| x-1161 | Ax | B1161 |
| x-1162 | Ax | B1162 |
| x-1163 | Ax | B1163 |
| x-1164 | Ax | B1164 |
| x-1165 | Ax | B1165 |
| x-1166 | Ax | B1166 |
| x-1167 | Ax | B1167 |
| x-1168 | Ax | B1168 |
| x-1169 | Ax | B1169 |
| x-1170 | Ax | B1170 |
| x-1171 | Ax | B1171 |
| x-1172 | Ax | B1172 |
| x-1173 | Ax | B1173 |
| x-1174 | Ax | B1174 |
| x-1175 | Ax | B1175 |
| x-1776 | Ax | B1176 |
| x-1177 | Ax | B1177 |
| x-1178 | Ax | B1178 |
| x-1179 | Ax | B1179 |
| x-1180 | Ax | B1180 |
| x-1181 | Ax | B1181 |
| x-1182 | Ax | B1182 |
| x-1183 | Ax | B1183 |
| x-1184 | Ax | B1184 |
| x-1185 | Ax | B1185 |
| x-1186 | Ax | B1186 |
| x-1187 | Ax | B1187 |
| x-1188 | Ax | B1188 |
| x-1189 | Ax | B1189 |
| x-1190 | Ax | B1190 |
| x-1191 | Ax | B1191 |
| x-1192 | Ax | B1192 |
| x-1193 | Ax | B1193 |
| x-1194 | Ax | B1194 |
| x-1195 | Ax | B1195 |
| x-1196 | Ax | B1196 |
| x-1197 | Ax | B1197 |
| x-1198 | Ax | B1198 |

TABLE 8-continued

| [Group 1] $Ir(L_1)_2(L_2)$/ [Group 2] $Ir(L_1)(L_2)_2$ | | |
|---|---|---|
| Compound | $L_1$ | $L_2$ |
| x-1199 | Ax | B1199 |
| x-1200 | Ax | B1200 |

TABLE 9

| [Group 1] $Ir(L_1)_2(L_2)$/ [Group 2] $Ir(L_1)(L_2)_2$ | | |
|---|---|---|
| Compound | $L_1$ | $L_2$ |
| x-1201 | Ax | B1201 |
| x-1202 | Ax | B1202 |
| x-1203 | Ax | B1203 |
| x-1204 | Ax | B1204 |
| x-1205 | Ax | B1205 |
| x-1206 | Ax | B1206 |
| x-1207 | Ax | B1207 |
| x-1208 | Ax | B1208 |
| x-1209 | Ax | B1209 |
| x-1210 | Ax | B1210 |
| x-1211 | Ax | B1211 |
| x-1212 | Ax | B1212 |
| x-1213 | Ax | B1213 |
| x-1214 | Ax | B1214 |
| x-1215 | Ax | B1215 |
| x-1216 | Ax | B1216 |
| x-1217 | Ax | B1217 |
| x-1218 | Ax | B1218 |
| x-1219 | Ax | B1219 |
| x-1220 | Ax | B1220 |
| x-1221 | Ax | B1221 |
| x-1222 | Ax | B1222 |
| x-1223 | Ax | B1223 |
| x-1224 | Ax | B1224 |
| x-1225 | Ax | B1225 |
| x-1226 | Ax | B1226 |
| x-1227 | Ax | B1227 |
| x-1228 | Ax | B1228 |
| x-1229 | Ax | B1229 |
| x-1230 | Ax | B1230 |
| x-1231 | Ax | B1231 |
| x-1232 | Ax | B1232 |
| x-1233 | Ax | B1233 |
| x-1234 | Ax | B1234 |
| x-1235 | Ax | B1235 |
| x-1236 | Ax | B1236 |
| x-1237 | Ax | B1237 |
| x-1238 | Ax | B1238 |
| x-1239 | Ax | B1239 |
| x-1240 | Ax | B1240 |
| x-1241 | Ax | B1241 |
| x-1242 | Ax | B1242 |
| x-1243 | Ax | B1243 |
| x-1244 | Ax | B1244 |
| x-1245 | Ax | B1245 |
| x-1246 | Ax | B1246 |
| x-1247 | Ax | B1247 |
| x-1248 | Ax | B1248 |
| x-1249 | Ax | B1249 |
| x-1250 | Ax | B1250 |
| x-1251 | Ax | B1251 |
| x-1252 | Ax | B1252 |
| x-1253 | Ax | B1253 |
| x-1254 | Ax | B1254 |
| x-1255 | Ax | B1255 |
| x-1256 | Ax | B1256 |
| x-1257 | Ax | B1257 |
| x-1258 | Ax | B1258 |
| x-1259 | Ax | B1259 |
| x-1260 | Ax | B1260 |
| x-1261 | Ax | B1261 |
| x-1262 | Ax | B1262 |

TABLE 9-continued

| [Group 1] $Ir(L_1)_2(L_2)$/ [Group 2] $Ir(L_1)(L_2)_2$ | | |
|---|---|---|
| Compound | $L_1$ | $L_2$ |
| x-1263 | Ax | B1263 |
| x-1264 | Ax | B1264 |
| x-1265 | Ax | B1265 |
| x-1266 | Ax | B1266 |
| x-1267 | Ax | B1267 |
| x-1268 | Ax | B1268 |
| x-1269 | Ax | B1269 |
| x-1270 | Ax | B1270 |
| x-1271 | Ax | B1271 |
| x-1272 | Ax | B1272 |
| x-1273 | Ax | B1273 |
| x-1274 | Ax | B1274 |
| x-1275 | Ax | B1275 |
| x-1276 | Ax | B1276 |
| x-1277 | Ax | B1277 |
| x-1278 | Ax | B1278 |
| x-1279 | Ax | B1279 |
| x-1280 | Ax | B1280 |
| x-1281 | Ax | B1281 |
| x-1282 | Ax | B1282 |
| x-1283 | Ax | B1283 |
| x-1284 | Ax | B1284 |
| x-1285 | Ax | B1285 |
| x-1286 | Ax | B1286 |
| x-1287 | Ax | B1287 |
| x-1288 | Ax | B1288 |
| x-1289 | Ax | B1289 |
| x-1290 | Ax | B1290 |
| x-1291 | Ax | B1291 |
| x-1292 | Ax | B1292 |
| x-1293 | Ax | B1293 |
| x-1294 | Ax | B1294 |
| x-1295 | Ax | B1295 |
| x-1296 | Ax | B1296 |
| x-1297 | Ax | B1297 |
| x-1298 | Ax | B1298 |
| x-1299 | Ax | B1299 |
| x-1300 | Ax | B1300 |
| x-1301 | Ax | B1301 |
| x-1302 | Ax | B1302 |
| x-1303 | Ax | B1303 |
| x-1304 | Ax | B1304 |
| x-1305 | Ax | B1305 |
| x-1306 | Ax | B1306 |
| x-1307 | Ax | B1307 |
| x-1308 | Ax | B1308 |
| x-1309 | Ax | B1309 |
| x-1310 | Ax | B1310 |
| x-1311 | Ax | B1311 |
| x-1312 | Ax | B1312 |
| x-1313 | Ax | B1313 |
| x-1314 | Ax | B1314 |
| x-1315 | Ax | B1315 |
| x-1316 | Ax | B1316 |
| x-1317 | Ax | B1317 |
| x-1318 | Ax | B1318 |
| x-1319 | Ax | B1319 |
| x-1320 | Ax | B1320 |
| x-1321 | Ax | B1321 |
| x-1322 | Ax | B1322 |
| x-1323 | Ax | B1323 |
| x-1324 | Ax | B1324 |
| x-1325 | Ax | B1325 |
| x-1326 | Ax | B1326 |
| x-1327 | Ax | B1327 |
| x-1328 | Ax | B1328 |
| x-1329 | Ax | B1329 |
| x-1330 | Ax | B1330 |
| x-1331 | Ax | B1331 |
| x-1332 | Ax | B1332 |
| x-1333 | Ax | B1333 |
| x-1334 | Ax | B1334 |
| x-1335 | Ax | B1335 |
| x-1336 | Ax | B1336 |
| x-1337 | Ax | B1337 |

TABLE 9-continued

| [Group 1] $Ir(L_1)_2(L_2)$/ [Group 2] $Ir(L_1)(L_2)_2$ | | |
|---|---|---|
| Compound | $L_1$ | $L_2$ |
| x-1338 | Ax | B1338 |
| x-1339 | Ax | B1339 |
| x-1340 | Ax | B1340 |
| x-1341 | Ax | B1341 |
| x-1342 | Ax | B1342 |
| x-1343 | Ax | B1343 |
| x-1344 | Ax | B1344 |
| x-1345 | Ax | B1345 |
| x-1346 | Ax | B1346 |
| x-1347 | Ax | B1347 |
| x-1348 | Ax | B1348 |
| x-1349 | Ax | B1349 |
| x-1350 | Ax | B1350 |

TABLE 10

| [Group 1] $Ir(L_1)_2(L_2)$/ [Group 2] $Ir(L_1)(L_2)_2$ | | |
|---|---|---|
| Compound | $L_1$ | $L_2$ |
| x-1351 | Ax | B1351 |
| x-1352 | Ax | B1352 |
| x-1353 | Ax | B1353 |
| x-1354 | Ax | B1354 |
| x-1355 | Ax | B1355 |
| x-1356 | Ax | B1356 |
| x-1357 | Ax | B1357 |
| x-1358 | Ax | B1358 |
| x-1359 | Ax | B1359 |
| x-1360 | Ax | B1360 |
| x-1361 | Ax | B1361 |
| x-1362 | Ax | B1362 |
| x-1363 | Ax | B1363 |
| x-1364 | Ax | B1364 |
| x-1365 | Ax | B1365 |
| x-1366 | Ax | B1366 |
| x-1367 | Ax | B1367 |
| x-1368 | Ax | B1368 |
| x-1369 | Ax | B1369 |
| x-1370 | Ax | B1370 |
| x-1371 | Ax | B1371 |
| x-1372 | Ax | B1372 |
| x-1373 | Ax | B1373 |
| x-1374 | Ax | B1374 |
| x-1375 | Ax | B1375 |
| x-1376 | Ax | B1376 |
| x-1377 | Ax | B1377 |
| x-1378 | Ax | B1378 |
| x-1379 | Ax | B1379 |
| x-1380 | Ax | B1380 |
| x-1381 | Ax | B1381 |
| x-1382 | Ax | B1382 |
| x-1383 | Ax | B1383 |
| x-1384 | Ax | B1384 |
| x-1385 | Ax | B1385 |
| x-1386 | Ax | B1386 |
| x-1387 | Ax | B1387 |
| x-1388 | Ax | B1388 |
| x-1389 | Ax | B1389 |
| x-1390 | Ax | B1390 |
| x-1391 | Ax | B1391 |
| x-1392 | Ax | B1392 |
| x-1393 | Ax | B1393 |
| x-1394 | Ax | B1394 |
| x-1395 | Ax | B1395 |
| x-1396 | Ax | B1396 |
| x-1397 | Ax | B1397 |
| x-1398 | Ax | B1398 |
| x-1399 | Ax | B1399 |
| x-1400 | Ax | B1400 |
| x-1401 | Ax | B1401 |
| x-1402 | Ax | B1402 |

TABLE 10-continued

| [Group 1] $Ir(L_1)_2(L_2)$/ [Group 2] $Ir(L_1)(L_2)_2$ | | |
|---|---|---|
| Compound | $L_1$ | $L_2$ |
| x-1403 | Ax | B1403 |
| x-1404 | Ax | B1404 |
| x-1405 | Ax | B1405 |
| x-1406 | Ax | B1406 |
| x-1407 | Ax | B1407 |
| x-1408 | Ax | B1408 |
| x-1409 | Ax | B1409 |
| x-1410 | Ax | B1410 |
| x-1411 | Ax | B1411 |
| x-1412 | Ax | B1412 |
| x-1413 | Ax | B1413 |
| x-1414 | Ax | B1414 |
| x-1415 | Ax | B1415 |
| x-1416 | Ax | B1416 |
| x-1417 | Ax | B1417 |
| x-1418 | Ax | B1418 |
| x-1419 | Ax | B1419 |
| x-1420 | Ax | B1420 |
| x-1421 | Ax | B1421 |
| x-1422 | Ax | B1422 |
| x-1423 | Ax | B1423 |
| x-1424 | Ax | B1424 |
| x-1425 | Ax | B1425 |
| x-1426 | Ax | B1426 |
| x-1427 | Ax | B1427 |
| x-1428 | Ax | B1428 |
| x-1429 | Ax | B1429 |
| x-1430 | Ax | B1430 |
| x-1431 | Ax | B1431 |
| x-1432 | Ax | B1432 |
| x-1433 | Ax | B1433 |
| x-1434 | Ax | B1434 |
| x-1435 | Ax | B1435 |
| x-1436 | Ax | B1436 |
| x-1437 | Ax | B1437 |
| x-1438 | Ax | B1438 |
| x-1439 | Ax | B1439 |
| x-1440 | Ax | B1440 |
| x-1441 | Ax | B1441 |
| x-1442 | Ax | B1442 |
| x-1443 | Ax | B1443 |
| x-1444 | Ax | B1444 |
| x-1445 | Ax | B1445 |
| x-1446 | Ax | B1446 |
| x-1447 | Ax | B1447 |
| x-1448 | Ax | B1448 |
| x-1449 | Ax | B1449 |
| x-1450 | Ax | B1450 |
| x-1451 | Ax | B1451 |
| x-1452 | Ax | B1452 |
| x-1453 | Ax | B1453 |
| x-1454 | Ax | B1454 |
| x-1455 | Ax | B1455 |
| x-1456 | Ax | B1456 |
| x-1457 | Ax | B1457 |
| x-1458 | Ax | B1458 |
| x-1459 | Ax | B1459 |
| x-1460 | Ax | B1460 |
| x-1461 | Ax | B1461 |
| x-1462 | Ax | B1462 |
| x-1463 | Ax | B1463 |
| x-1464 | Ax | B1464 |
| x-1465 | Ax | B1465 |
| x-1466 | Ax | B1466 |
| x-1467 | Ax | B1467 |
| x-1468 | Ax | B1468 |
| x-1469 | Ax | B1469 |
| x-1470 | Ax | B1470 |
| x-1471 | Ax | B1471 |
| x-1472 | Ax | B1472 |
| x-1473 | Ax | B1473 |
| x-1474 | Ax | B1474 |
| x-1475 | Ax | B1475 |
| x-1476 | Ax | B1476 |
| x-1477 | Ax | B1477 |

TABLE 10-continued

| [Group 1] $Ir(L_1)_2(L_2)$/ [Group 2] $Ir(L_1)(L_2)_2$ | | |
|---|---|---|
| Compound | $L_1$ | $L_2$ |
| x-1478 | Ax | B1478 |
| x-1479 | Ax | B1479 |
| x-1480 | Ax | B1480 |
| x-1481 | Ax | B1481 |
| x-1482 | Ax | B1482 |
| x-1483 | Ax | B1483 |
| x-1484 | Ax | B1484 |
| x-1485 | Ax | B1485 |
| x-1486 | Ax | B1486 |
| x-1487 | Ax | B1487 |
| x-1488 | Ax | B1488 |
| x-1489 | Ax | B1489 |
| x-1490 | Ax | B1490 |
| x-1491 | Ax | B1491 |
| x-1492 | Ax | B1492 |
| x-1493 | Ax | B1493 |
| x-1494 | Ax | B1494 |
| x-1495 | Ax | B1495 |
| x-1496 | Ax | B1496 |
| x-1497 | Ax | B1497 |
| x-1498 | Ax | B1498 |
| x-1499 | Ax | B1499 |
| x-1500 | Ax | B1500 |

TABLE 11

| Group 1] $Ir(L_1)_2(L_2)$/ [Group 2] $Ir(L_1)(L_2)_2$ | | |
|---|---|---|
| Compound | $L_1$ | $L_2$ |
| x-1501 | Ax | B1501 |
| x-1502 | Ax | B1502 |
| x-1503 | Ax | B1503 |
| x-1504 | Ax | B1504 |
| x-1505 | Ax | B1505 |
| x-1506 | Ax | B1506 |
| x-1507 | Ax | B1507 |
| x-1508 | Ax | B1508 |
| x-1509 | Ax | B1509 |
| x-1510 | Ax | B1510 |
| x-1511 | Ax | B1511 |
| x-1512 | Ax | B1512 |
| x-1513 | Ax | B1513 |
| x-1514 | Ax | B1514 |
| x-1515 | Ax | B1515 |
| x-1516 | Ax | B1516 |
| x-1517 | Ax | B1517 |
| x-1518 | Ax | B1518 |
| x-1519 | Ax | B1519 |
| x-1520 | Ax | B1520 |
| x-1521 | Ax | B1521 |
| x-1522 | Ax | B1522 |
| x-1523 | Ax | B1523 |
| x-1524 | Ax | B1524 |
| x-1525 | Ax | B1525 |
| x-1526 | Ax | B1526 |
| x-1527 | Ax | B1527 |
| x-1528 | Ax | B1528 |
| x-1529 | Ax | B1529 |
| x-1530 | Ax | B1530 |
| x-1531 | Ax | B1531 |
| x-1532 | Ax | B1532 |
| x-1533 | Ax | B1533 |
| x-1534 | Ax | B1534 |
| x-1535 | Ax | B1535 |
| x-1536 | Ax | B1536 |
| x-1537 | Ax | B1537 |
| x-1538 | Ax | B1538 |
| x-1539 | Ax | B1539 |

TABLE 11-continued

| Group 1] $Ir(L_1)_2(L_2)$/ [Group 2] $Ir(L_1)(L_2)_2$ | | |
|---|---|---|
| Compound | $L_1$ | $L_2$ |
| x-1540 | Ax | B1540 |
| x-1541 | Ax | B1541 |
| x-1542 | Ax | B1542 |

Among the compounds in Tables 1 to 11, a compound of Group 1 is represented by $Ir(L_1)_2(L_2)$, and $L_1$ and $L_2$ among compounds represented by $Ir(L_1)_2(L_2)$ of Group 1 are as described in Tables 1 to 11.

Among the compounds in Tables 1 to 11, a compound of Group 2 is represented by $Ir(L_1)(L_2)_2$, and $L_1$ and $L_2$ among compounds represented by $Ir(L_1)(L_2)_2$ of Group 2 are as described in Tables 1 to 11.

x in Tables 1 to 11 is an integer from 1 to 380. Ax, i.e., A1 to A380, is as described above.

For example, in Tables 1 to 11,

1) Compound 93-10 (i.e., x=93) of Group 1 is a compound represented by $Ir(L_1)_2(L_2)$ in which $L_1$ is A93 and $L_2$ is B10, and may be represented by Compound 1 below, 2) Compound 298-58 (i.e., x=298) of Group 1 is a compound represented by $Ir(L_1)_2(L_2)$ in which $L_1$ is A298 and $L_2$ is B58, and may be represented by Compound 2 below, 3) Compound 260-373 (i.e., x=260) of Group 1 is a compound represented by $Ir(L_1)_2(L_2)$ in which $L_1$ is A260 and $L_2$ is B373, and may be represented by Compound 3 below, 4) Compound 198-1465 (i.e., x=198) of Group 1 is a compound represented by $Ir(L_1)_2(L_2)$ in which $L_1$ is A198 and $L_2$ is B1465, and may be represented by Compound 4, 5) Compound 1-1541 (i.e., x=1) of Group 1 is a compound represented by $Ir(L_1)_2(L_2)$ in which $L_1$ is A1 and $L_2$ is B1541, and may be represented Compound 5, 6) Compound 260-1542 (i.e., x=260) of Group 1 is a compound represented by $Ir(L_1)_2(L_2)$ in which $L_1$ is A260 and $L_2$ is B1542, and may be represented by Compound 6, 7) Compound 201-1070 (i.e., x=201) of Group 1 is a compound represented by $Ir(L_1)_2(L_2)$ in which $L_1$ is A201 and $L_2$ is B1070, and may be represented by Compound 7, 8) Compound 202-721 (i.e., x=202) of Group 1 is a compound represented by $Ir(L_1)_2(L_2)$ in which $L_1$ is A202 and $L_2$ is B721, and may be represented by Compound 8, and 9) Compound 93-10 (i.e., x=93) of Group 2 is a compound represented by $Ir(L_1)(L_2)_2$ in which $L_1$ is A93 and $L_2$ is B10, and may be represented by Compound 9:

-continued
Compound 1
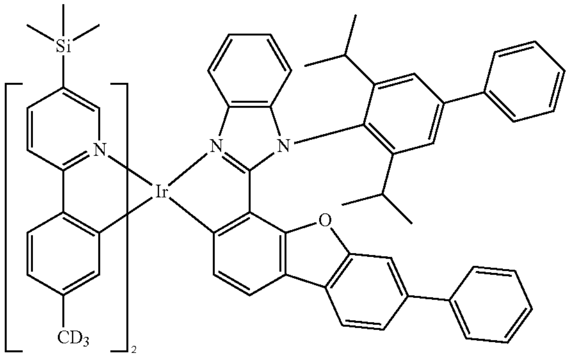
(Compound 93-10 of [Group 1])
Compound 2
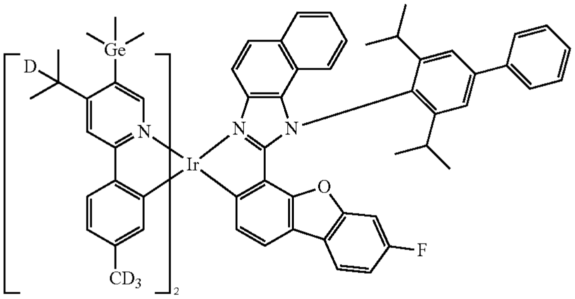
(Compound 298-58 of [Group 1])
Compound 3
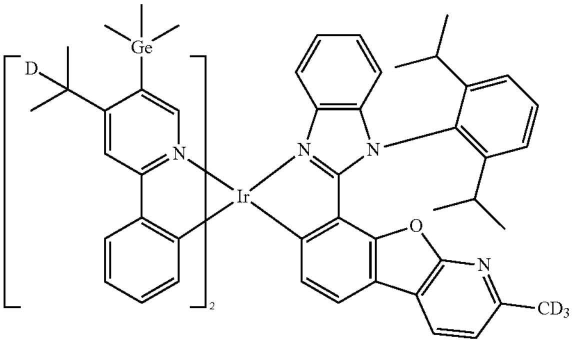
(Compound 260-373 of [Group 1])
Compound 4
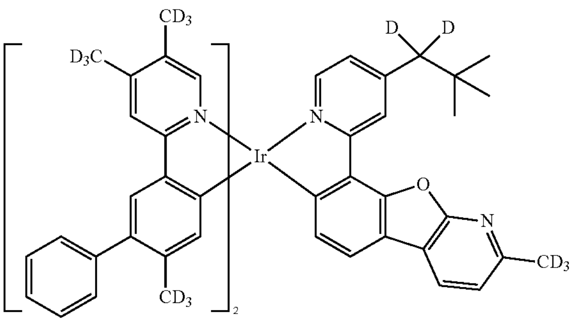
(Compound 198-1465 of [Group 1])
Compound 5
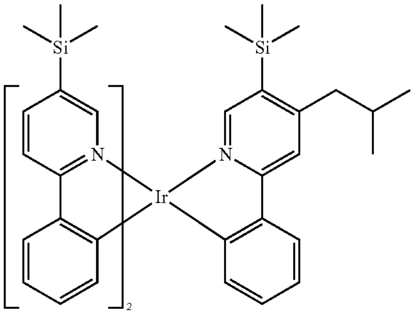
(Compound 1-1541 of [Group 1])
Compound 6
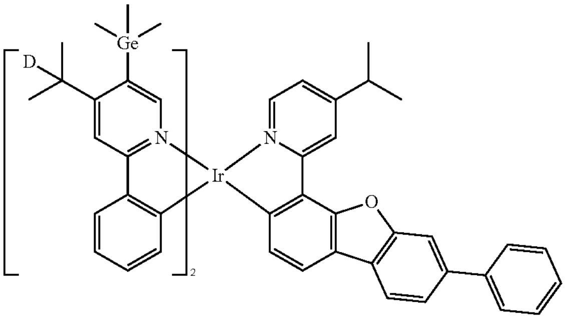
(Compound 260-1542 of [Group 1])
Compound 7
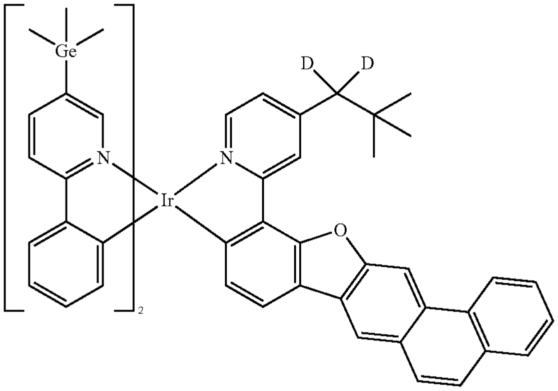
(Compound 201-1070 of [Group 1])
Compound 8
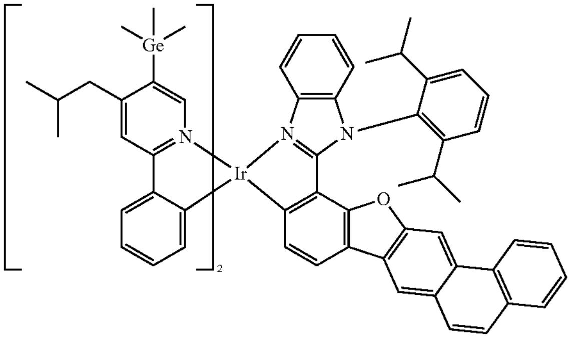
(Compound 202-721 of [Group 1])

-continued

Compound 9

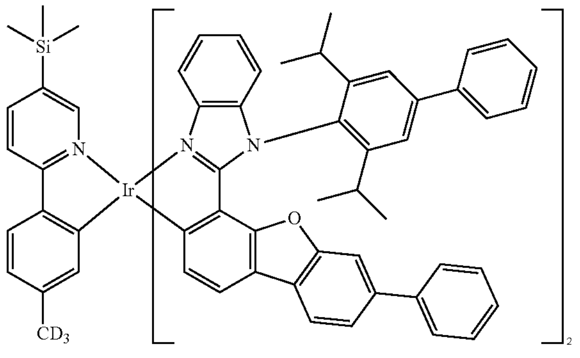

(Compound 93-10 of [Group 2])

The remaining compounds in Tables 1 to 11 may also be recognized in the same manner as described above.

A composition including the first compound represented by Formula 1 and the second compound represented by Formula 2 as described above may emit light (for example, light having an emission peak wavelength in a range of about 480 nm to about 580 nm, or about 510 nm to about 570 nm, such as green light, yellow-green light, or yellow light) having excellent luminescence efficiency and excellent lifespan. Thus, a layer including the composition, a light-emitting device including the composition, and an electronic apparatus including the light-emitting device may be provided.

According to another aspect, a layer including the composition including the first compound and the second compound as described above may be provided.

In one or more embodiments, the layer may emit light having an emission peak wavelength in a range of about 480 nm to about 580 nm, for example, about 510 nm to about 570 nm.

In one or more embodiments, the layer may emit green light, yellow-green light, or yellow light.

In one or more embodiments, the layer may emit light having an emission peak wavelength in a range of about 510 nm to about 540 nm.

In one or more embodiments, the layer may emit light having an emission peak wavelength in a range of about 540 nm to about 570 nm.

A weight ratio of the first compound to the second compound included in the layer may be about 90:10 to about 10:90, about 80:20 to about 20:80, about 70:30 to about 30:70, or about 60:40 to about 40:60.

In one or more embodiments, a weight ratio of the first compound to second compound may be about 50:50, that is, about 1:1.

The layer may be formed i) by a co-deposition of the first compound and the second compound, or ii) by using a first mixture including the first compound and the second compound.

In one or more embodiments, the layer may include a host and a dopant, the host may not include a transition metal, and the dopant may include the composition including the first compound and the second compound. The layer may be formed i) by a co-deposition of the host and the dopant, or ii) by using a second mixture including the host and the dopant.

A weight of the host in the layer may be greater than a weight of the dopant.

In one or more embodiments, a weight ratio of the host to the dopant in the layer may be about 99:1 to about 55:45, or about 97:3 to about 60:40, or about 95:5 to about 70:30.

The host in the layer may include a hole transport compound, an electron transport compound, a bipolar compound, or a combination thereof.

According to another aspect, provided is a light-emitting device including: a first electrode; a second electrode; and an organic layer located between the first electrode and the second electrode and including an emission layer, wherein the organic layer includes the composition including the first compound and the second compound as described above.

The light-emitting device includes the composition including the first compound and the second compound as described above, and thus, may have excellent driving voltage, excellent external quantum efficiency, and excellent lifespan characteristics. Also, the light-emitting device may have an excellent side luminance ratio.

In one or more embodiments, the emission layer in the organic layer of the light-emitting device may include the composition including the first compound and the second compound.

In one or more embodiments, the emission layer may include a host and a dopant, the host may not include a transition metal, and the dopant may include the composition.

The host in the emission layer may include a hole transport compound, an electron transport compound, a bipolar compound, or a combination thereof.

In one or more embodiments, the host may include a hole transport compound and an electron transport compound, and the hole transport compound and the electron transport compound may be different from each other.

The emission layer may be formed by a co-deposition of the host and the dopant, or may be formed by using a second mixture including the host and the dopant.

The emission layer may emit third light having a third spectrum, and λP(EML) is an emission peak wavelength (in nm) of the third spectrum. In one or more embodiments, the λP(EML) may be evaluated from electroluminescence spectrum of the light-emitting device.

Fourth light having a fourth spectrum may be extracted to the outside of the light-emitting device (i.e., the organic light-emitting device) through the first electrode and/or the second electrode of the light-emitting device, and λP(OLED) is an emission peak wavelength (nm) of the fourth spectrum. In one or more embodiments, the λP(OLED) may be evaluated from electroluminescence spectrum of the light-emitting device.

In one or more embodiments, the λP(EML) and the λP(OLED) may each independently be about 480 nm to about 580 nm, for example, about 510 nm to about 570 nm.

In one or more embodiments, the λP(EML) and the λP(OLED) may each independently be about 510 nm to about 540 nm.

In one or more embodiments, the λP(EML) and the λP(OLED) may each independently be about 540 nm to about 570 nm.

In one or more embodiments, the third light and the fourth light may each be green light, yellow-green light, or yellow light.

In one or more embodiments, the third light and the fourth light may not be white light.

In one or more embodiments, the third spectrum may include i) a main emission peak having the λP(EML), and may not include ii) an additional emission peak having an emission peak wavelength of (λP(EML)+about 50 nm) or greater or (λP(EML)−about 50 nm) or less.

In one or more embodiments, the third spectrum may include i) a main emission peak having the λP(EML), and may not include ii) an additional emission peak having an emission peak wavelength of red light and/or blue light region.

In one or more embodiments, the fourth spectrum may include i) a main emission peak having the λP(OLED), and may not include ii) an additional emission peak having an emission peak wavelength of (λP(OLED)+about 50 nm) or greater or (λP(OLED)−about 50 nm) or less.

In one or more embodiments, the fourth spectrum may include i) a main emission peak having the λP(OLED), and may not include ii) an additional emission peak having an emission peak wavelength of red light and/or blue light region.

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the light-emitting device, the first electrode may be an anode, and the second electrode may be a cathode, the organic layer may further include a hole transport region located between the first electrode and the emission layer and an electron transport region located between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers between the first electrode and the second electrode of the light-emitting device.

The "organic layer" may include, in addition to an organic compound, an organometallic complex including metal.

The FIGURE is a schematic cross-sectional view of a light-emitting device 10 according to one or more embodiments described herein. Hereinafter, the structure and manufacturing method of the light-emitting device 10 according to one or more embodiments will be described with reference to FIGURE. The light-emitting device 10 has a structure in which a first electrode 11, an organic layer 15, and a second electrode 19 are sequentially stacked.

A substrate may be additionally located under the first electrode 11 or above the second electrode 19. For use as the substrate, any substrate that is used in light-emitting devices of the related art may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (L-B) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100 °C to about 500 °C, a vacuum pressure of about $10^{-8}$ torr to about $10^{-3}$ torr, and a deposition rate of about 0.01 angstroms per second (Å/sec) to about 100 Å/sec.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80 °C to about 200 °C.

The conditions for forming the hole transport layer and the electron blocking layer may be similar to or the same as the conditions for forming the hole injection layer.

The hole transport region may include 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(naphthalen-1-yl)-N,N'-diphenylbenzidine (NPB), 3-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:

-continued
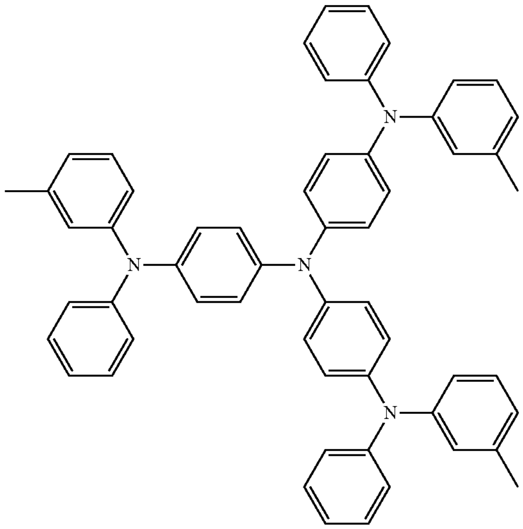
m-MTDATA
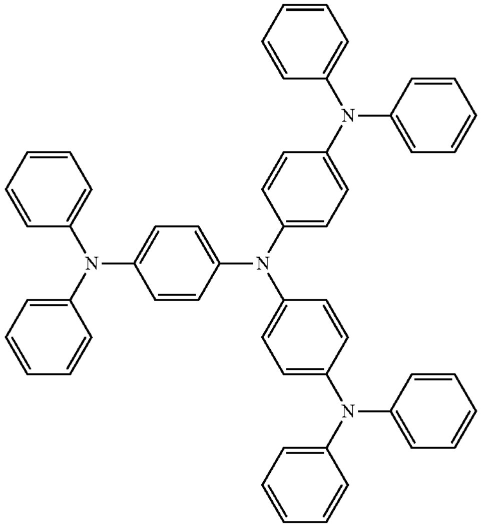
TDATA
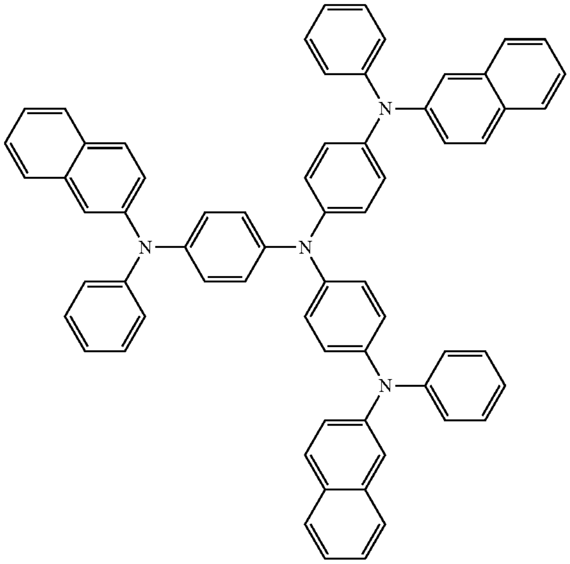
2-TNATA
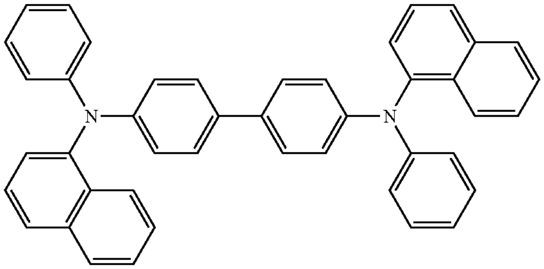
NPB
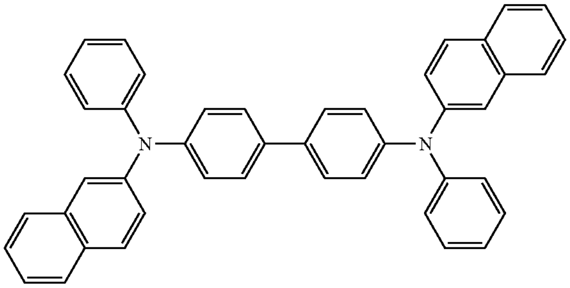
β-NPB
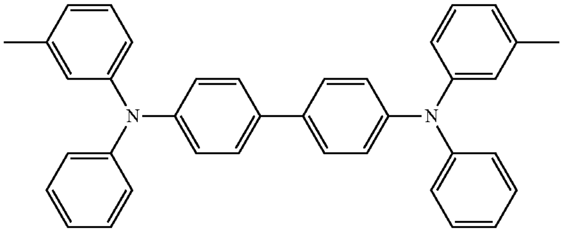
TPD
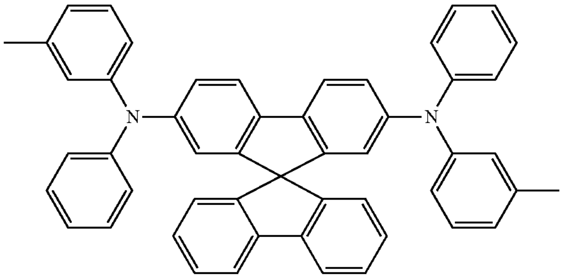
Spiro-TPD
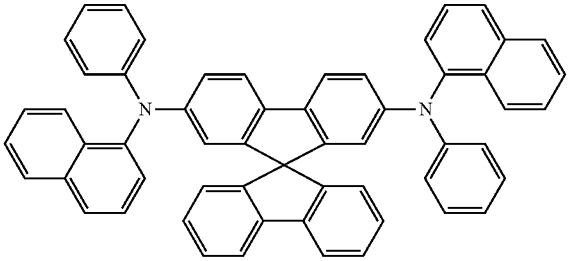
Spiro-NPB -continued

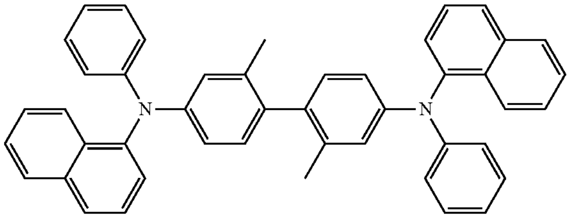

methylated NPB

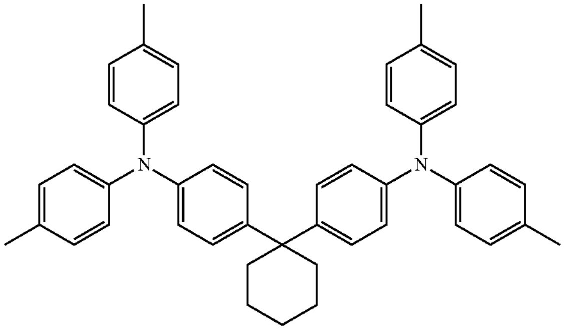

TAPC

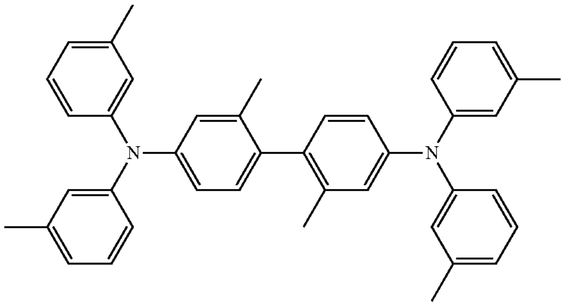

HMTPD

Formula 201

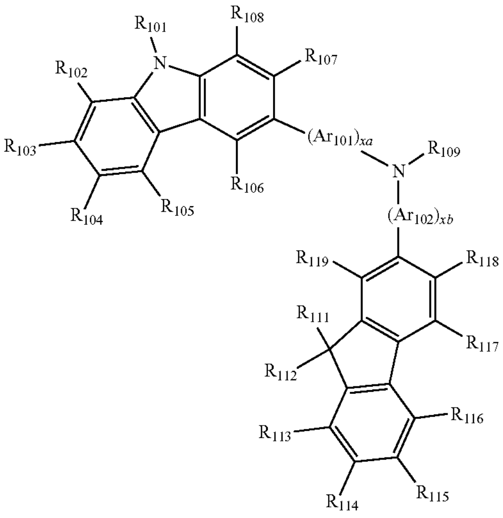

-continued

Formula 202

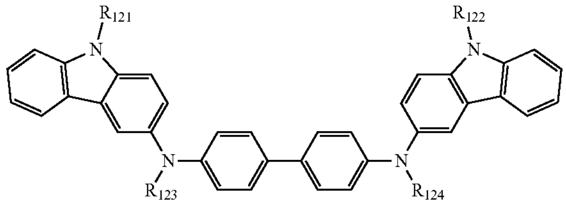

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, a hydroxyl group, a cyano group, a nitro group, an amino group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{10}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, a $C_1$-$C_{10}$ alkyl group (for example, a methyl group, an ethyl group, a propyl group, a butyl group, a pentyl group, a hexyl group), a $C_1$-$C_{10}$ alkoxy group (for example, a methoxy group, an ethoxy group, a propoxy group, a butoxy group, a pentoxy group), or a $C_1$-$C_{10}$ alkylthio group;

a $C_1$-$C_{10}$ alkyl group, a $C_1$-$C_{10}$ alkoxy group, or a $C_1$-$C_{10}$ alkylthio group, each unsubstituted or substituted with at least one of deuterium, —F, —Cl, —Br, —I, a hydroxyl group, a cyano group, a nitro group, an amino group, or a combination thereof; or a phenyl group, a naphthyl group, an anthracenyl group, a fluorenyl group, or a pyrenyl group, each unsubstituted or substituted with at least one of deuterium, —F, —Cl, —Br, —I, a hydroxyl group, a cyano group, a nitro group, an amino group, a $C_1$-$C_{10}$ alkyl group, a $C_1$-$C_{10}$ alkoxy group, a $C_1$-$C_{10}$ alkylthio group, or a combination thereof.

In Formula 201, $R_{109}$ may be a phenyl group, a naphthyl group, an anthracenyl group, or a pyridinyl group, each unsubstituted or substituted with at least one of deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one embodiment, the compound represented by Formula 201 may be represented by Formula 201A:

Formula 201A

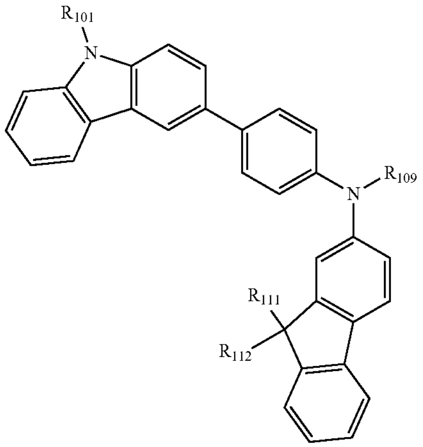

wherein $R_{101}$, $R_{111}$, $R_{112}$, and $R_{109}$ in Formula 201A are respectively as described above.

In one or more embodiments, the hole transport region may include one of Compounds HT1 to HT20 or a combination thereof:

HT1

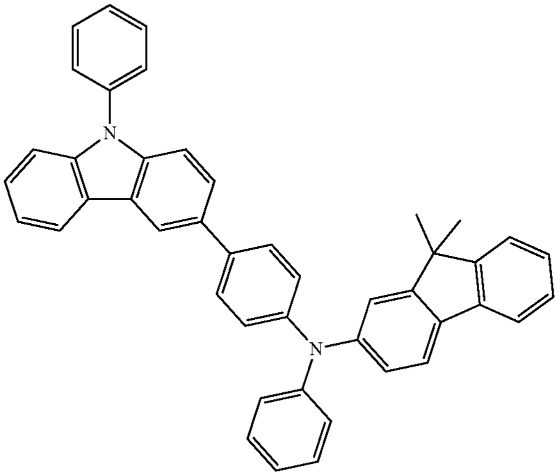

-continued

HT2

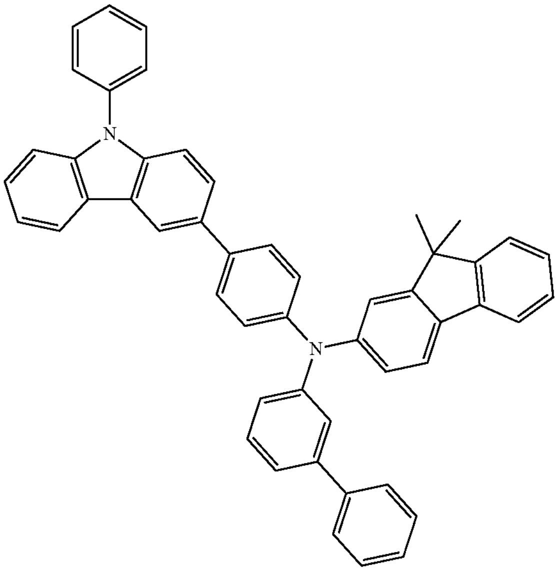

HT3

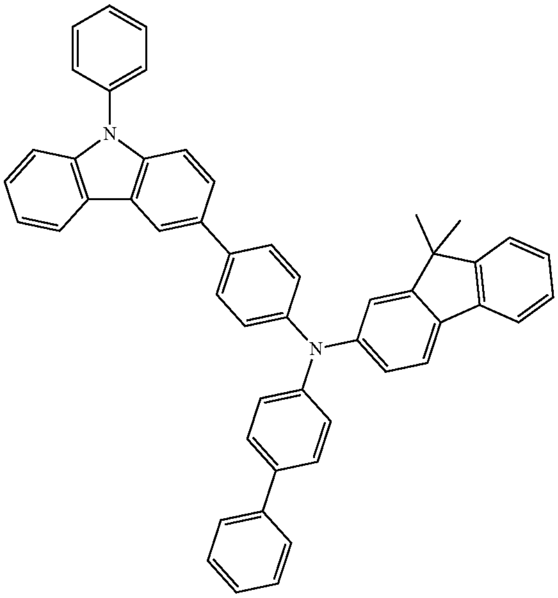

-continued
HT4
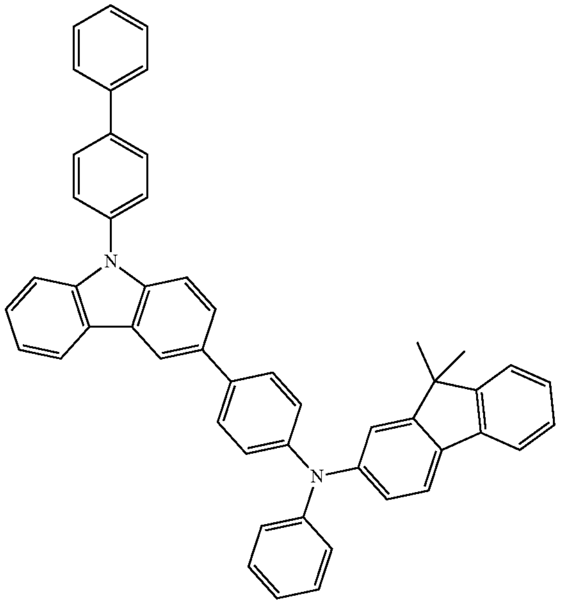
HT5
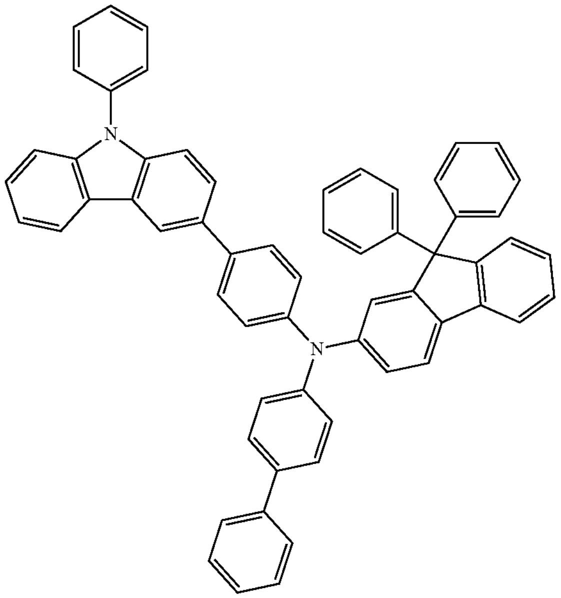
-continued
HT6
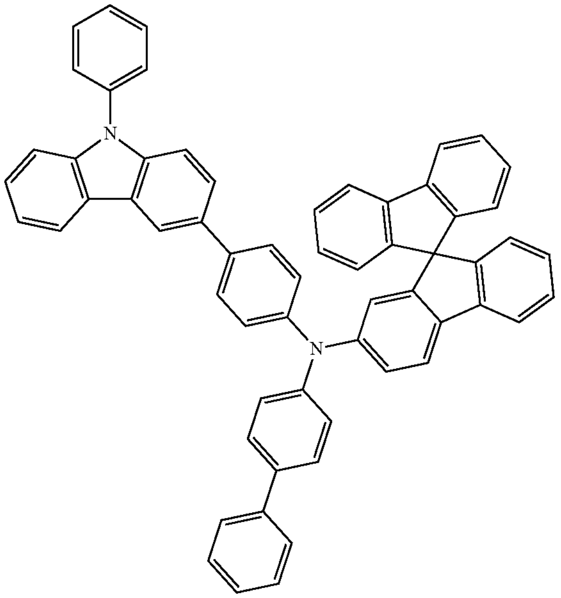
HT7
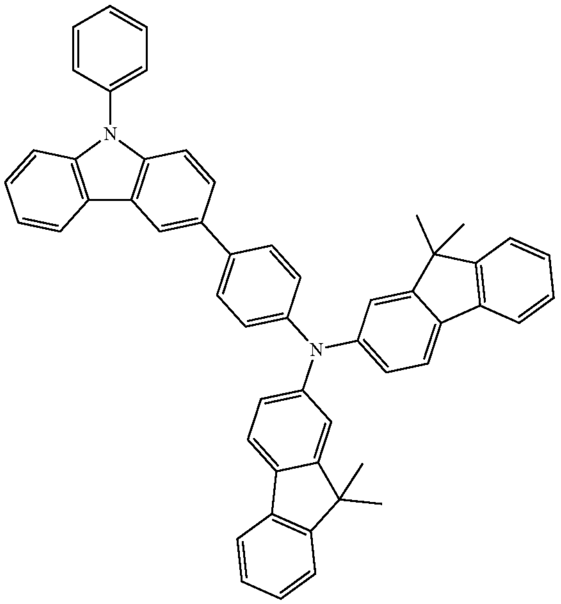

-continued
HT8
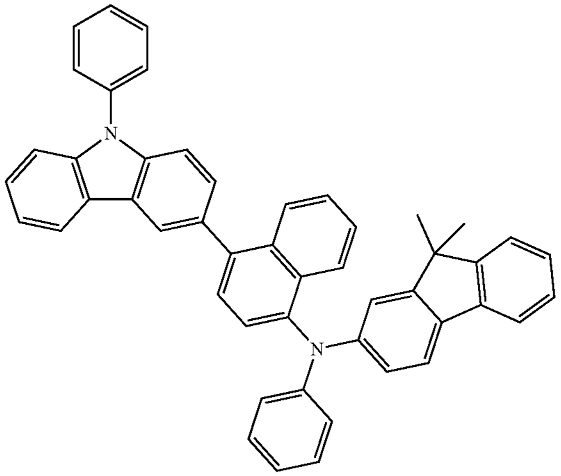
HT9
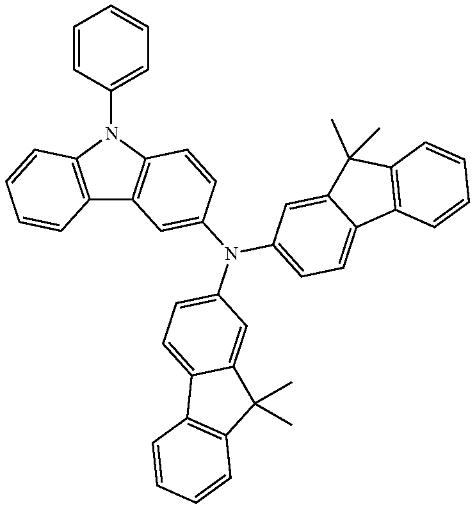
HT10
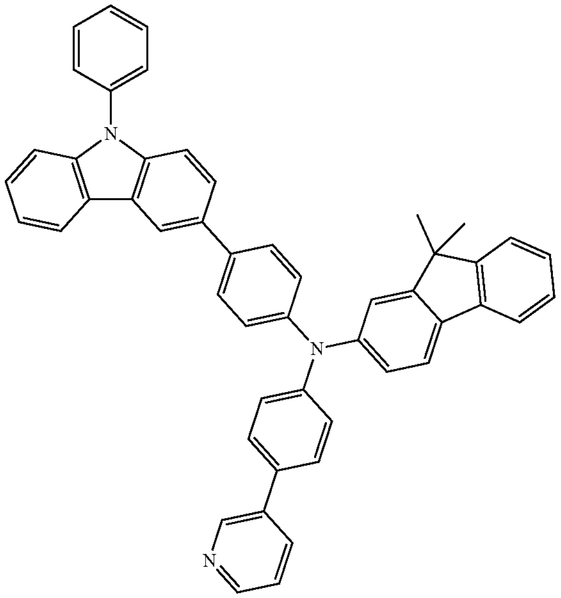
-continued
HT11
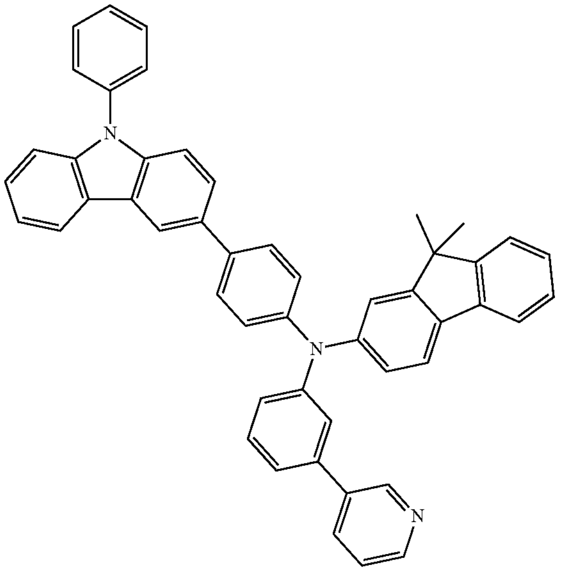
HT12
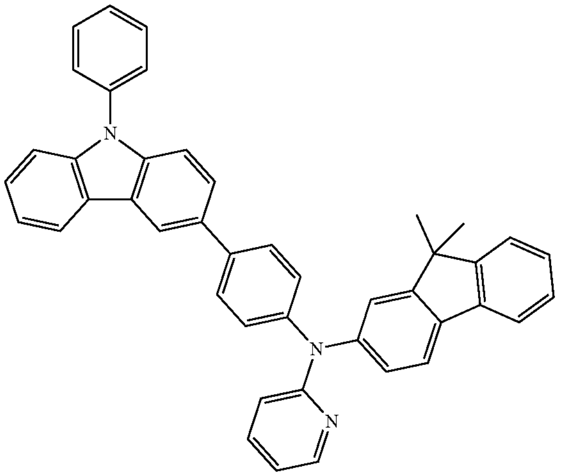
HT13
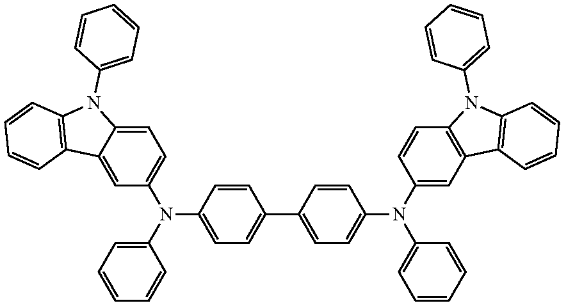

-continued

HT14

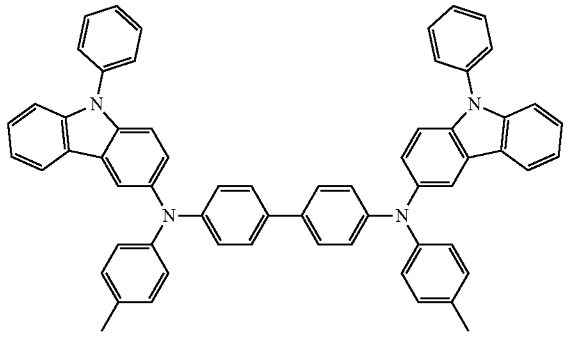

HT15

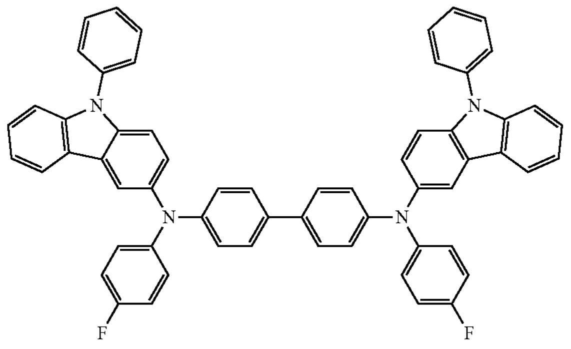

HT16

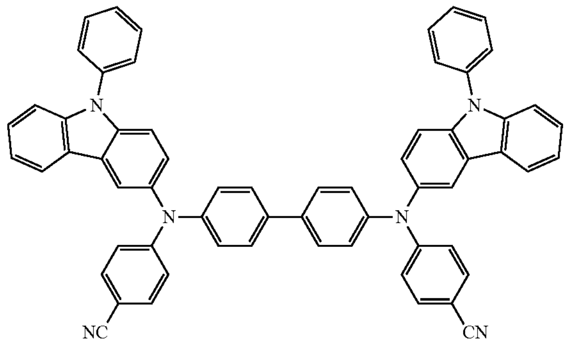

HT17

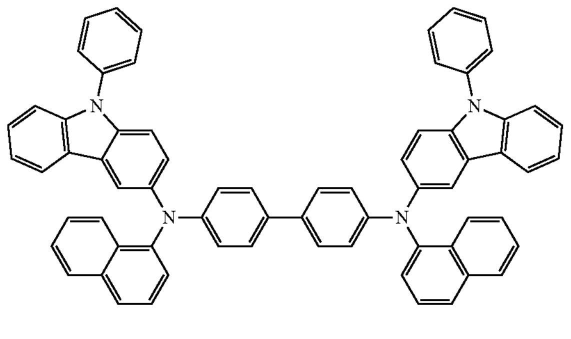

-continued

HT18

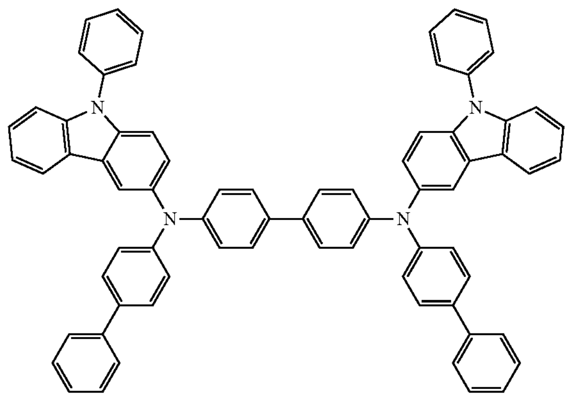

HT19

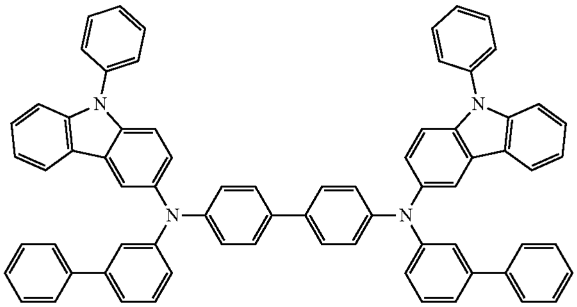

HT20

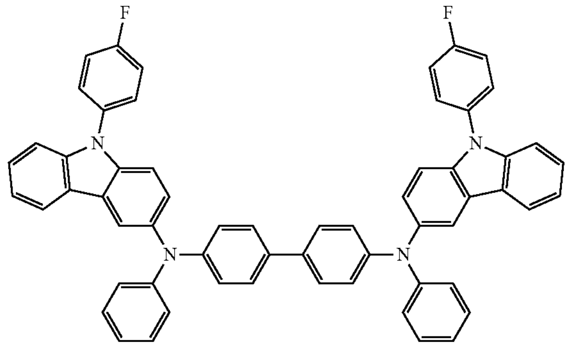

A thickness of the hole transport region may be in the range of about 100 angstroms (Å) to about 10,000 Å, for example, about 100 Å to about 1,000 Å. When the hole transport region includes a hole injection layer, a hole transport layer, an electron blocking layer, or a combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-type dopant. The p-type dopant may be a quinone derivative, a metal oxide, a cyano group-containing compound, or a combination thereof. For example, the p-type dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or a combination thereof.

HT-D1

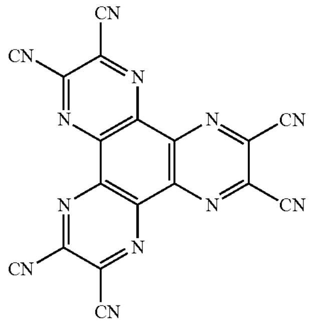

F4-TCNQ

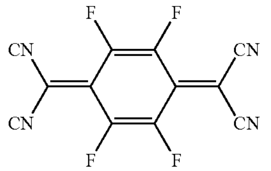

F6-TCNNQ

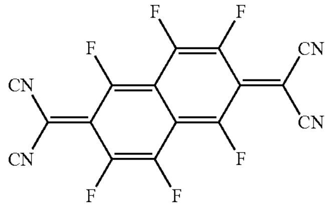

The hole transport region may further include a buffer layer.

Also, the buffer layer may compensate for an optical resonance distance according to a wavelength of light emitted from the emission layer, and thus, luminescence efficiency of a light-emitting device may be improved.

Meanwhile, when the hole transport region includes an electron blocking layer, a material for forming the electron blocking layer may include a material that is used in the hole transport region as described above, a host material described below, or a combination thereof. For example, when the hole transport region includes an electron blocking layer, mCP, Compound H-H1, or a combination thereof may be used as the material for forming the electron blocking layer.

Then, an emission layer may be formed on the hole transport region by vacuum deposition, spin coating, casting, L-B deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include the composition including the first compound represented by Formula 1 and the second compound represented by Formula 2 as described herein. In one or more embodiments, the emission layer may include a layer including the composition including the first compound represented by Formula 1 and the second compound represented by Formula 2 as described herein.

In one or more embodiments, the emission layer may include a host and a dopant, the host may not include a transition metal, and the dopant may include the composition including the first compound represented by Formula 1 and the second compound represented by Formula 2 as described herein.

The host may include 1,3,5-tri(1-phenyl-1H-benzo[d]imidazol-2-yl)benzene (TPBi), 3-tert-butyl-9,10-di(naphth-2-yl)anthracene (TBADN), 9,10-di(naphthalene-2-yl)anthracene (ADN, also referred to as "DNA"), 4,4'-bis(N-carbazolyl)-1,1'-biphenyl (CBP), 4,4'-bis(9-carbazolyl)-2,2'-dimethyl-biphenyl (CDBP), TCP, mCP, Compound H50, Compound H51, Compound H52, Compound H-H1, Compound H-H2, or a combination thereof:

TPBi

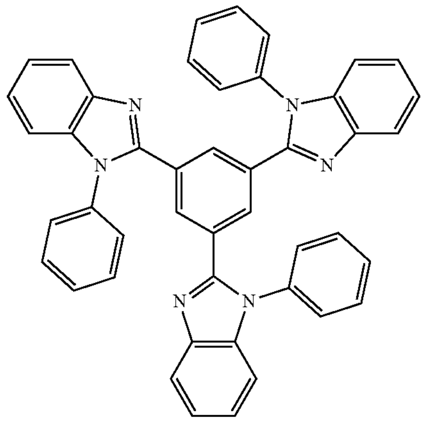

TBADN

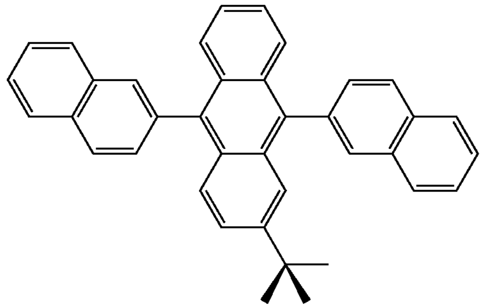

ADN

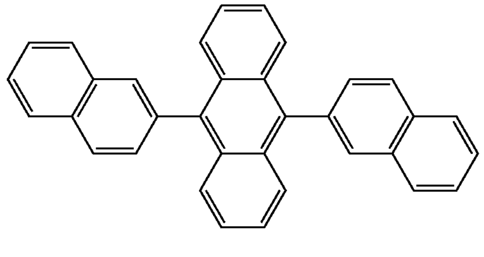

-continued

CBP

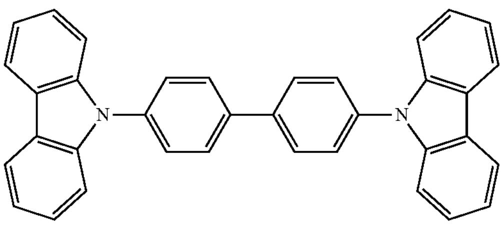

CDBP

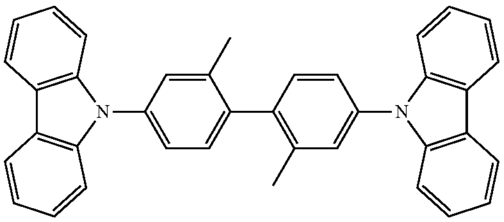

TCP

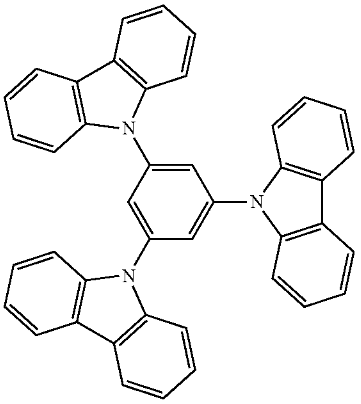

mCP

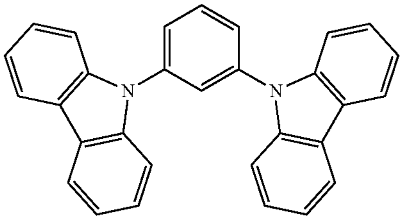

H50

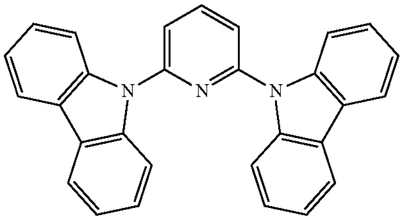

H51

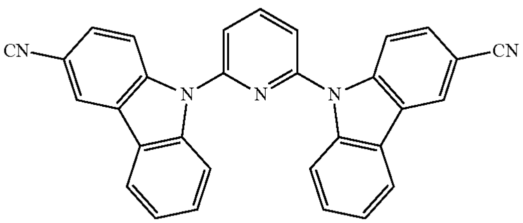

-continued

H52

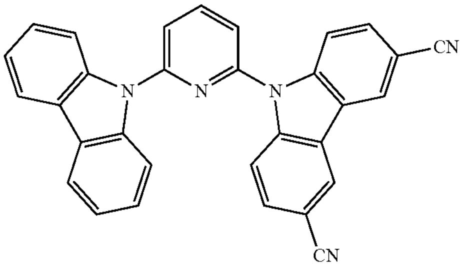

H-H1

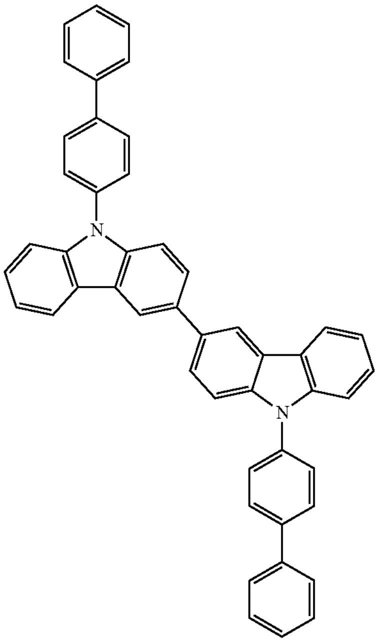

H-H2

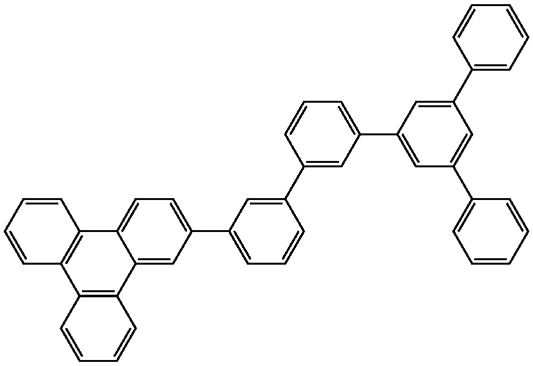

When the light-emitting device is a full-color light-emitting device, the emission layer may be patterned into a red emission layer, a green emission layer, and/or a blue emission layer.

A thickness of the emission layer may be in a range of about 100 Å to about 1,000 Å, for example, about 200 Å to about 600 Å. When the thickness of the emission layer is within the range, excellent light-emission characteristics may be obtained without a substantial increase in driving voltage.

An electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, 2,9-dimethyl-4,7-diphenyl-1,10-phenanthroline (BCP), 4,7-diphenyl-1,10-phenanthroline (Bphen), bis(2-methyl-8-quinolinolato-N1,O8)-(1,1'-biphenyl-4-olato)aluminum (Balq), or a combination thereof:

BCP

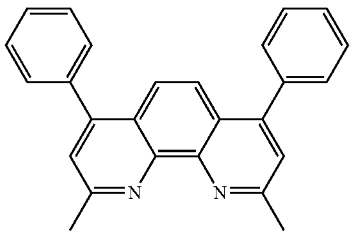

Bphen

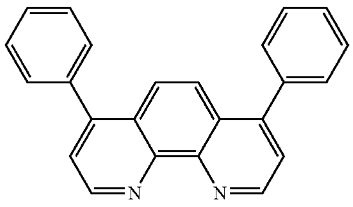

A thickness of the hole blocking layer may be in a range of about 20 Å to about 1,000 Å, for example, about 30 Å to about 600 Å. When the thickness of the hole blocking layer is within these ranges, excellent hole blocking characteristics may be obtained without a substantial increase in driving voltage.

The electron transport layer may include BCP, Bphen, TPBi, tris(8-hydroxyquinolinato)aluminum ($Alq_3$), Balq, 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof:

$Alq_3$

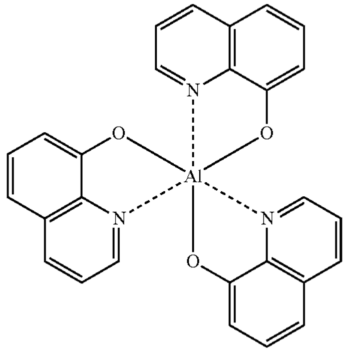

BAlq

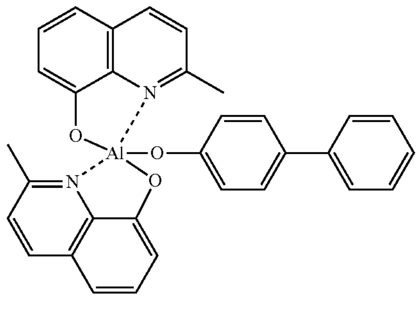

TAZ

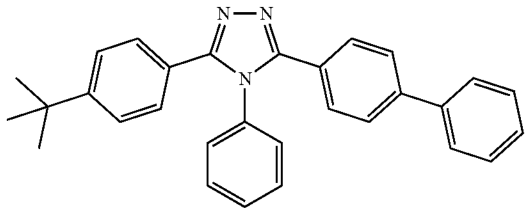

NTAZ

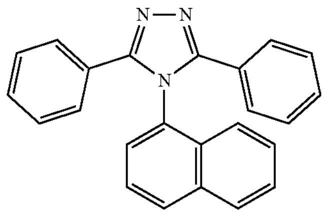

In one or more embodiments, the electron transport layer may include one or more of Compounds ET1 to ET25, or a combination thereof:

-continued
ET1
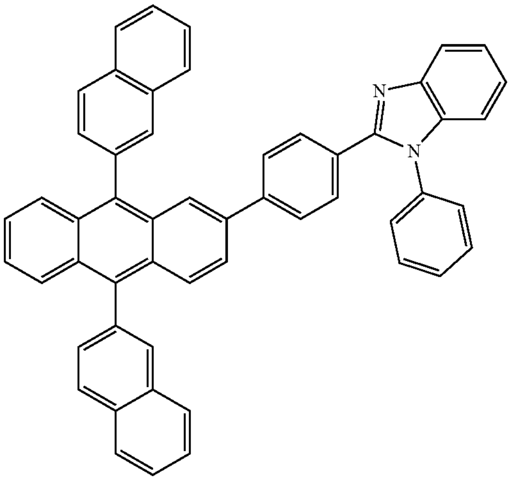
ET4
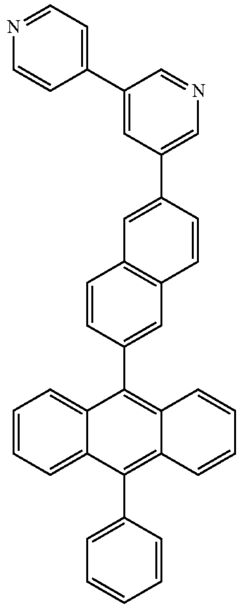
ET2
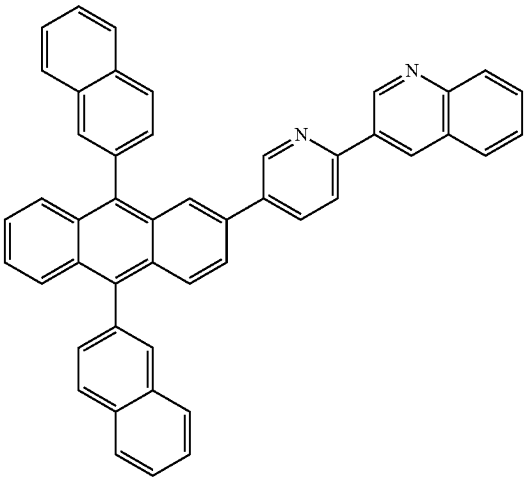
ET5
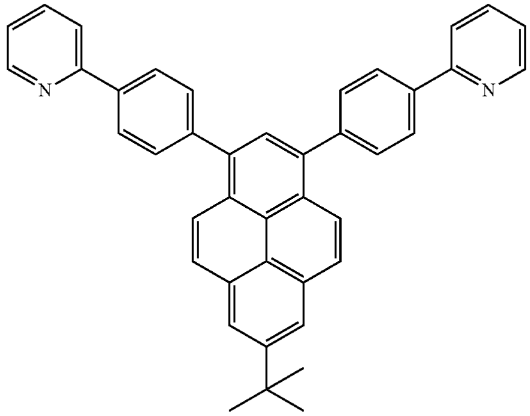
ET3
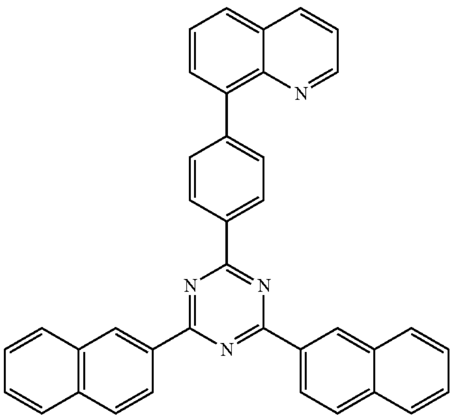
ET6
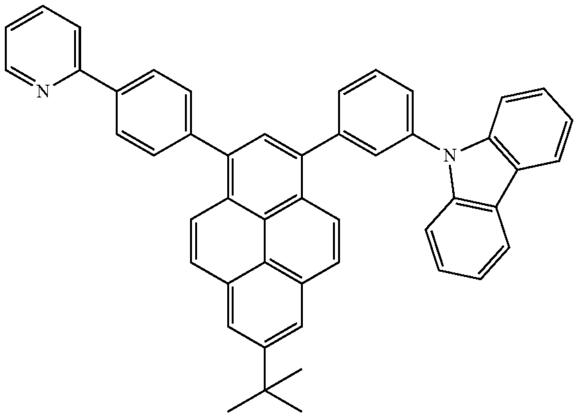

-continued
ET7
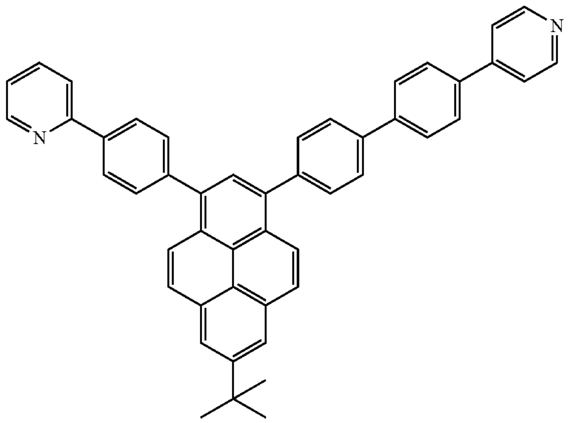
ET8
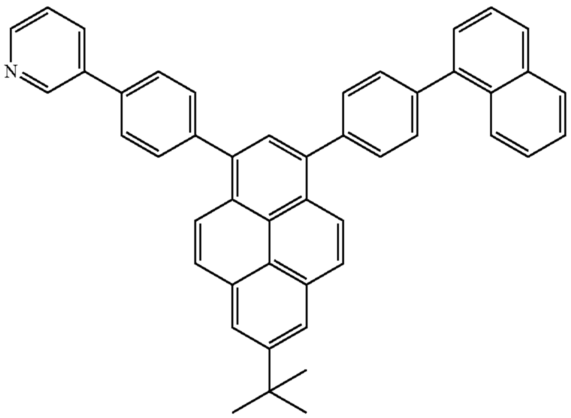
ET9
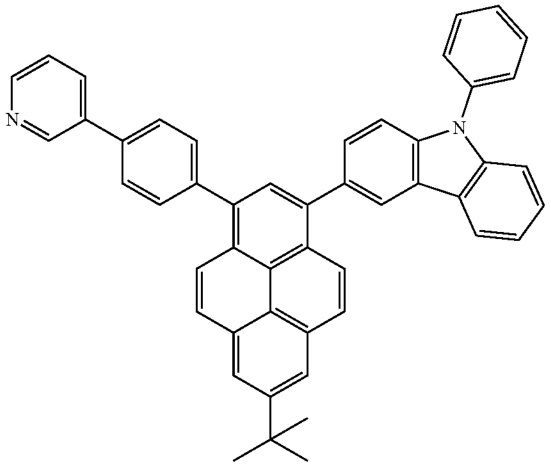
-continued
ET10
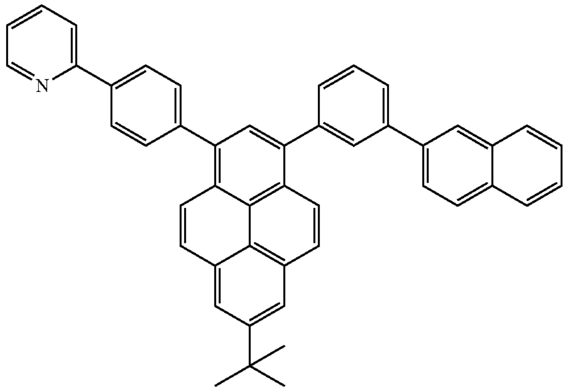
ET11
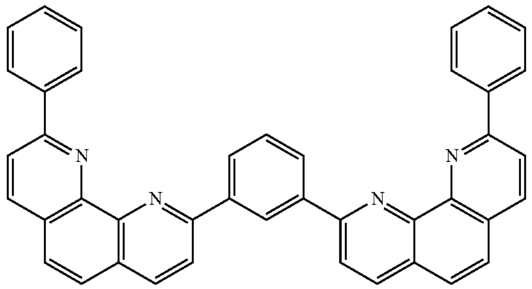
ET12
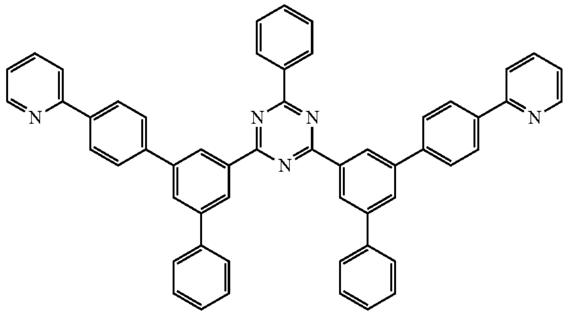
ET13
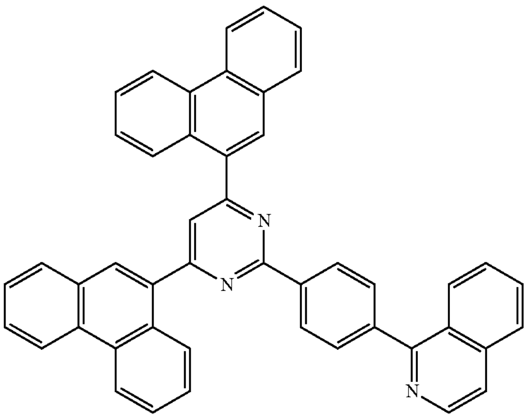

-continued
ET14
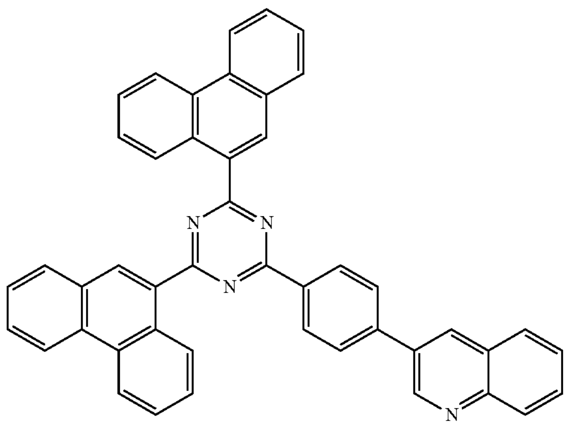
ET15
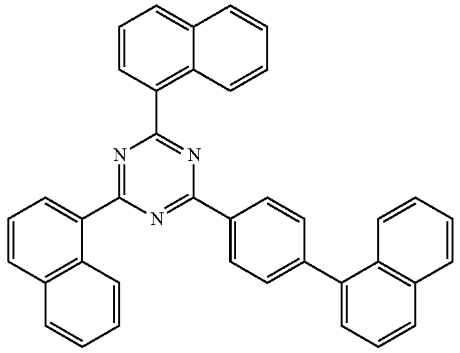
ET16
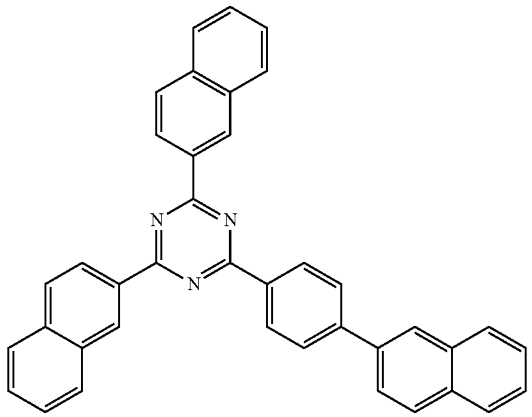
-continued
ET17
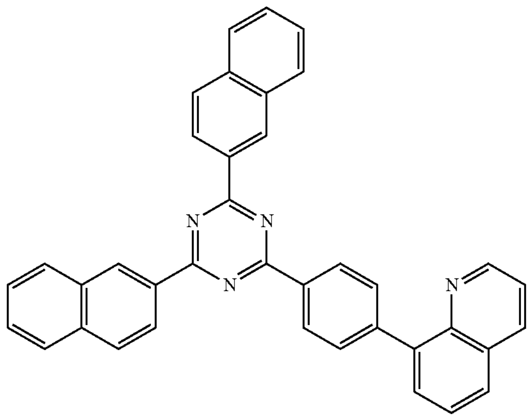
ET18
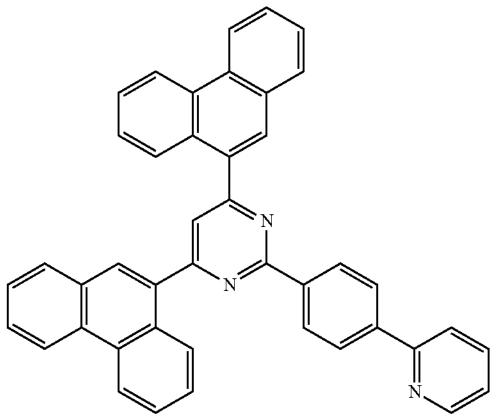
ET19
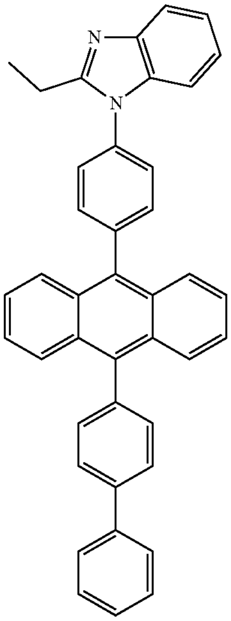

-continued
ET20
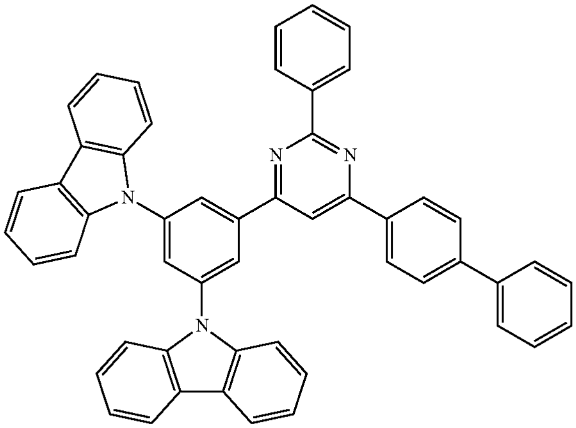
ET21
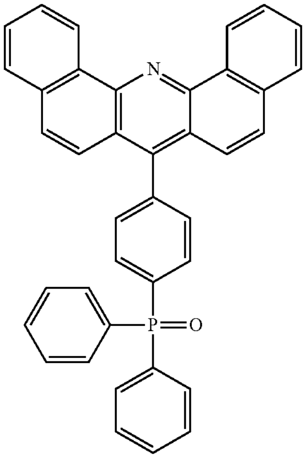
ET22
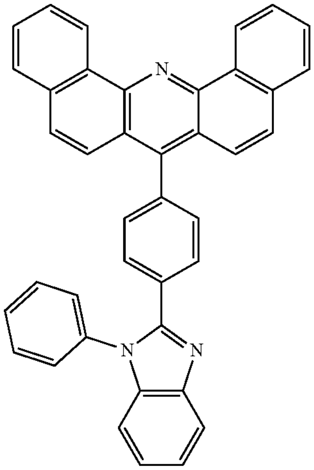
-continued
ET23
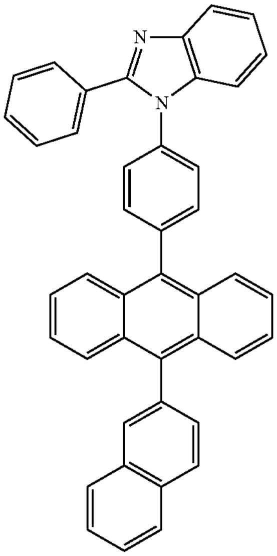
ET24
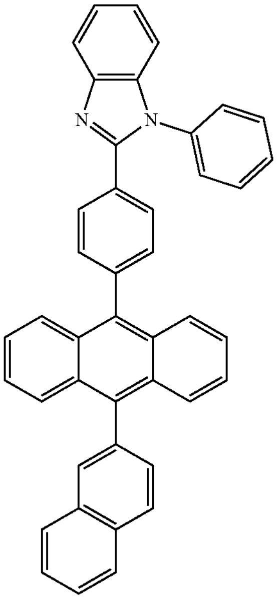
ET25
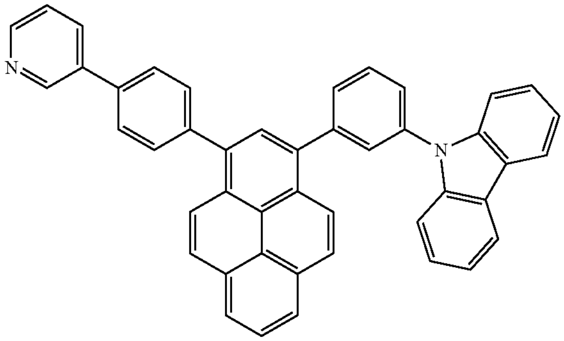
A thickness of the electron transport layer may be in the range of about 100 Å to about 1,000 Å, for example, about 150 Å to about 500 Å. When the thickness of the electron transport layer is within the range described above, the electron transport layer may have satisfactory electron transporting characteristics without a substantial increase in driving voltage.

The electron transport layer may include a metal-containing material in addition to the material as described above.

The metal-containing material may include a Li complex. The Li complex may include, for example, Compound ET-D1 or ET-D2:

ET-D1

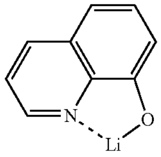

ET-D2

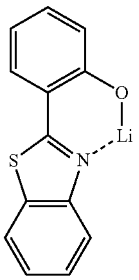

Also, the electron transport region may include an electron injection layer that promotes the flow of electrons from the second electrode 19 thereinto.

The electron injection layer may include LiF, NaCl, CsF, $Li_2O$, BaO, Compound ET-D1, Compound ET-D2, or a combination thereof.

A thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), silver (Ag), aluminum-lithium (Al—Li), calcium (Ca), magnesium-indium (Mg—In), magnesium-silver (Mg—Ag), or the like may be used as the material for forming the second electrode 19. In one or more embodiments, to manufacture a top-emission type light-emitting device, a transmissive electrode formed using ITO or IZO may be used as the second electrode 19.

In one or more embodiments, the composition, a layer including the composition, and an emission layer in a light-emitting device including the composition may not include a compound of [Group A] and mCP (1,3-bis(N-carbazolyl)benzene):

Group A

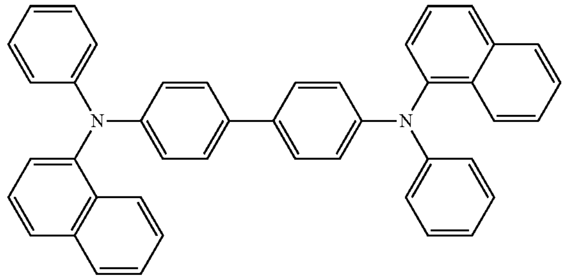

NPB

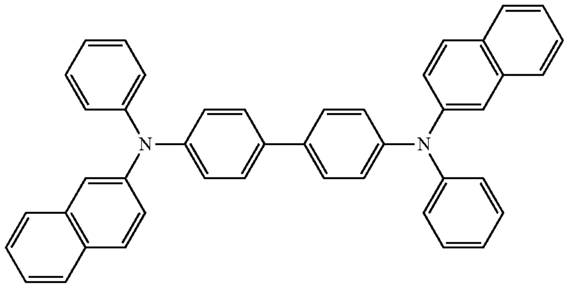

β-NPB

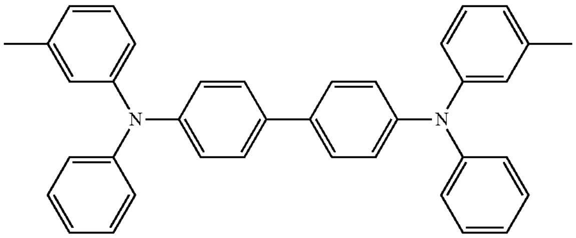

TPD

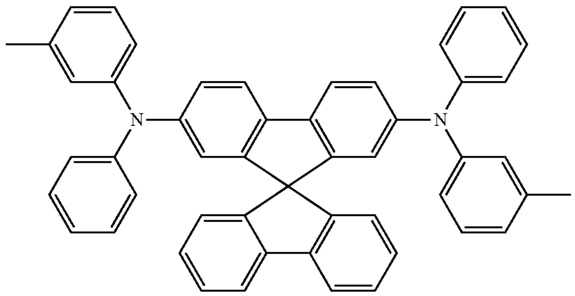

Spiro-TPD

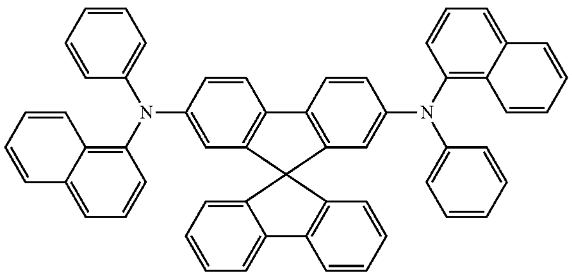

Spiro-NPB

-continued
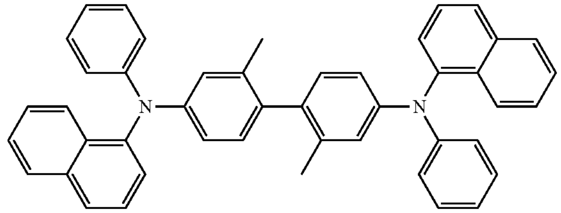
methylated NPB
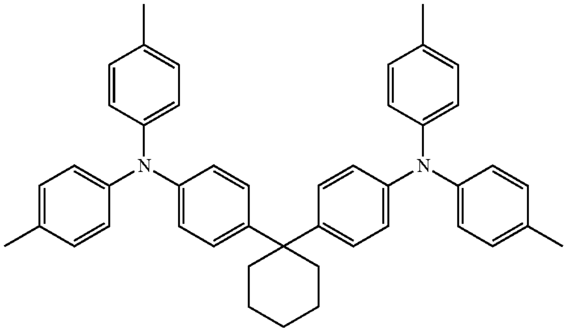
TAPC
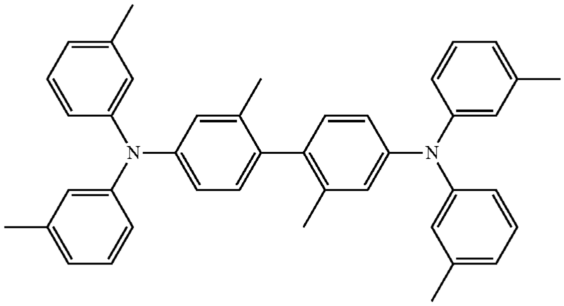
HMTPD
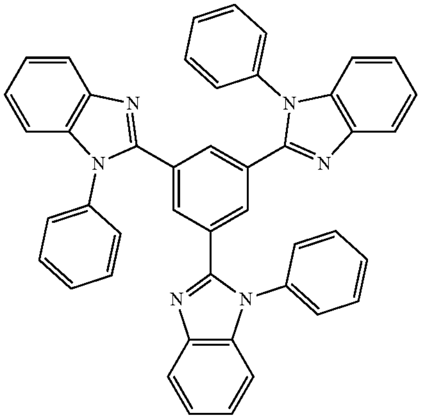
TPBi
-continued
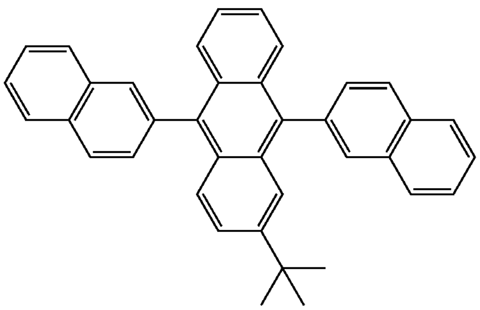
TBADN
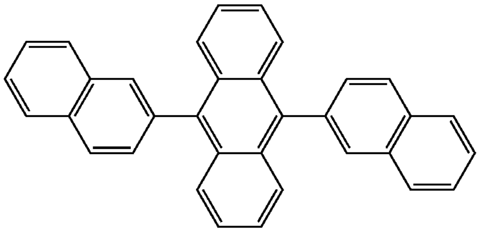
ADN
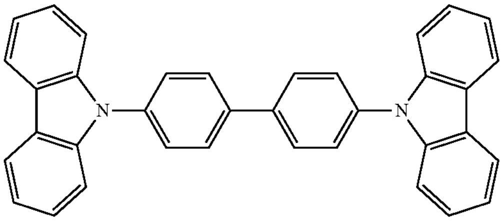
CBP
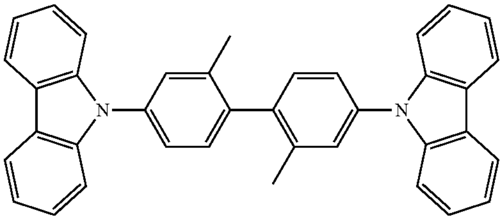
CDBP
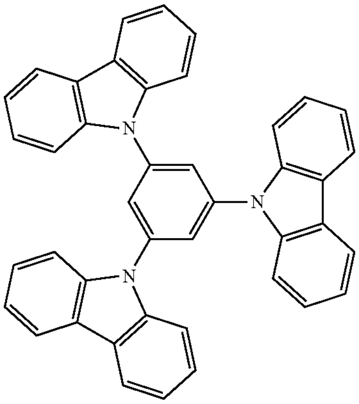
TCP -continued
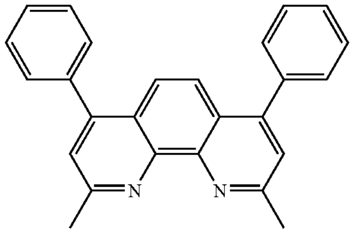
BCP
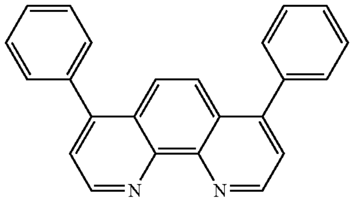
Bphen
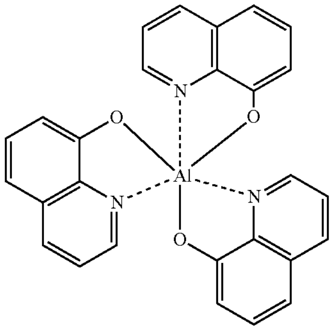
Alq3
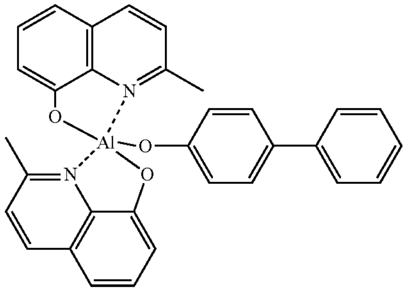
BAlq
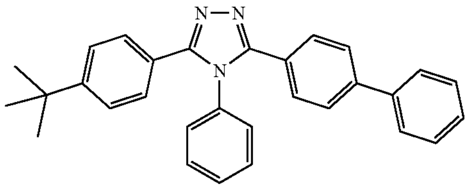
TAZ
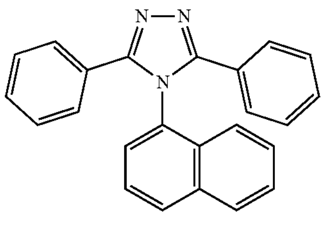
NTAZ
-continued
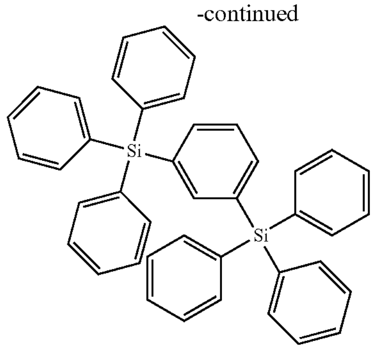
m-bis-(triphenylsilyl)benzene
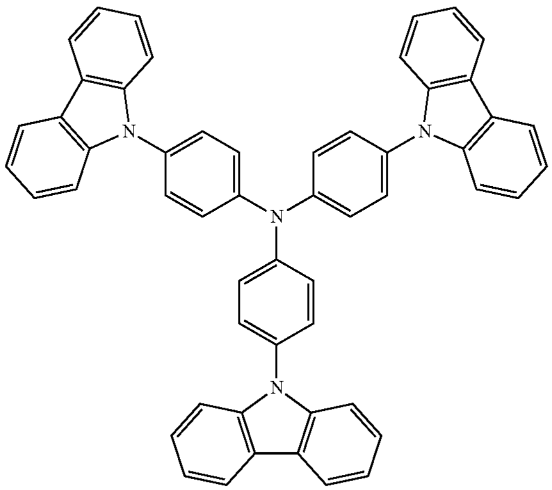
TCTA(4,4′,4″-tris(carbazol-9-yl)triphenylamine)
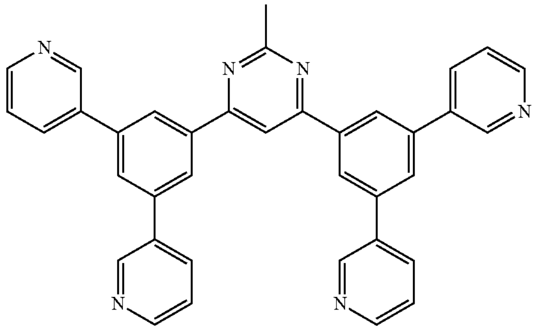
B3PYMPM(4,6-bis(3,5-di(pyridine-3-yl)phenyl)-2-methylpyrimidine)
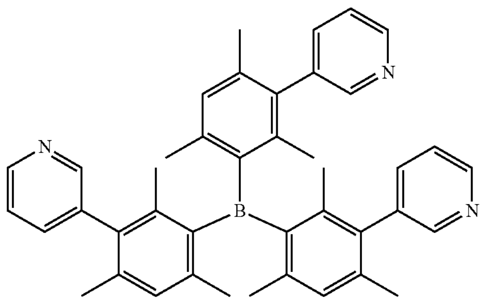
3TPYMB(tris(2,4,6-trimethyl-3-(pyridine-3-yl)phenyl)borane)

-continued

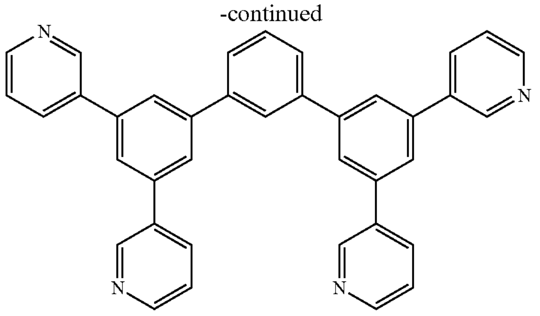

BmPyPhB(1,3-bis[3,5-di(pyridine-3-yl)phenyl]benzene)

Hereinbefore, the light-emitting device has been described in connection with FIGURE, but embodiments are not limited thereto.

According to another aspect, the light-emitting device may be included in an electronic apparatus. Thus, an electronic apparatus including the light-emitting device is provided. The electronic apparatus may include, for example, a display, an illumination, a sensor, or the like.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with at least one of a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, a propoxy group, a butoxy group, a pentoxy group, or the like.

The term "$C_1$-$C_{60}$ alkylthio group" as used herein refers to a monovalent group having the formula of —$SA_{101}$ (where $A_{101}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group may include a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, a bicyclo[2.2.2]octyl group, or the like.

The term "$C_1$-$C_{10}$ heterocycloalkyl group" as used herein refers to a monovalent saturated cyclic group that includes at least one hetero atom selected from N, O, P, Si, S, Se, Ge, and B as a ring-forming atom and 1 to 10 carbon atoms, and the term "$C_1$-$C_{10}$ heterocycloalkylene group" as used herein refers to a divalent group having the same structure as the $C_1$-$C_{60}$ heterocycloalkyl group.

Examples of the $C_1$-$C_{10}$ heterocycloalkyl group may include a silolanyl group, a silinanyl group, tetrahydrofuranyl group, a tetrahydro-2H-pyranyl group, a tetrahydrothiophenyl group, or the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include two or more rings, the rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group that includes at least one hetero atom selected from N, O, P, Si, S, Se, Ge, and B as a ring-forming atom and a cyclic aromatic system having 1 to 60 carbon atoms, and the term "$C_1$-$C_{60}$ heteroarylene group" as used herein refers to a divalent group that includes at least one hetero atom selected from N, O, P, Si, S, Se, Ge, and B as a ring-forming atom and a cyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein indicates —$OA_{102}$ (wherein $A_{102}$ indicates the $C_6$-$C_{60}$ aryl group), the term "$C_6$-$C_{60}$ arylthio group" as used herein indicates —$SA_{103}$ (wherein $A_{103}$ indicates the $C_6$-$C_{60}$ aryl group), and the term "$C_1$-$C_{60}$ alkylthio group" as used herein indicates —$SA_{104}$ (wherein $A_{104}$ indicates the $C_1$-$C_{60}$ alkyl group). The term "$C_1$-$C_{60}$ heteroaryloxy group" as used herein indicates —$OA_{102'}$ (wherein $A_{102'}$ indicates the $C_1$-$C_{60}$ heteroaryl group), and the term "$C_1$-$C_{60}$ heteroarylthio group" as used herein indicates —$SA_{103'}$ (wherein $A_{103'}$ indicates the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, including at least one hetero atom selected from N, O, P, Si, S, Se, Ge, and B, other than carbon atoms, as a ring-forming atom, and having no aromaticity in its entire molecular structure. Examples of the monovalent non-aromatic condensed heteropolycyclic group include a carbazolyl group or the like. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" used herein are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

In one or more embodiments, examples of the "$C_5$-$C_{30}$ carbocyclic group" and "$C_1$-$C_{30}$ heterocyclic group" as used herein include i) a first ring, ii) a second ring, iii) a condensed ring in which two or more first rings are condensed with each other, iv) a condensed ring in which two or more second rings are condensed with each other, or v) a condensed ring in which at least one first ring and at least one second ring are condensed with each other, the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein is substituted with at least one of deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein is not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" as used herein respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, or a dibenzothiophene 5,5-dioxide group," in which, in each group, at least one carbon selected from ring-forming carbons is substituted with nitrogen.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_6$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof.

$Q_1$ to $Q_9$, $Q_{11}$ to $Q_{19}$, $Q_{21}$ to $Q_{29}$, and $Q_{31}$ to $Q_{39}$ herein may each independently be: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, a $C_1$-$C_{60}$ alkyl group, a $C_6$-$C_{60}$ aryl group, or a combination thereof.

For example, $Q_1$ to $Q_9$, $Q_{11}$ to $Q_{19}$, $Q_{21}$ to $Q_{29}$, and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

Hereinafter, a compound and a light-emitting device according to one or more example embodiments are described in further detail with reference to Synthesis Example and Examples. However, the light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Synthesis of Compound 1)

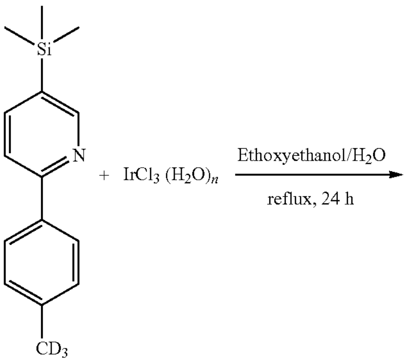

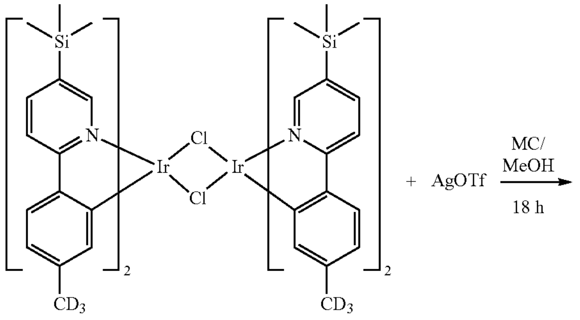

1A

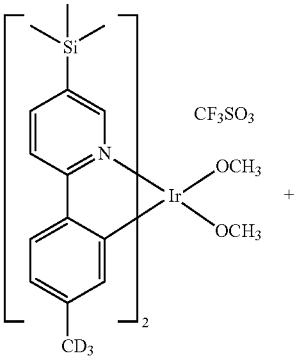

1B

-continued

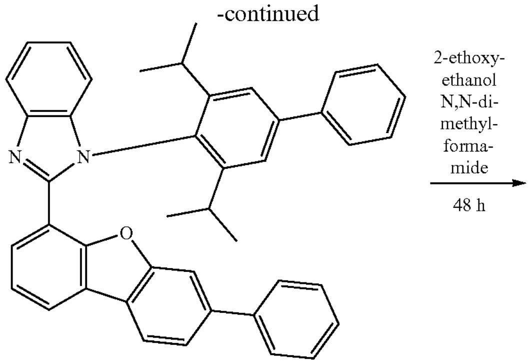

1C

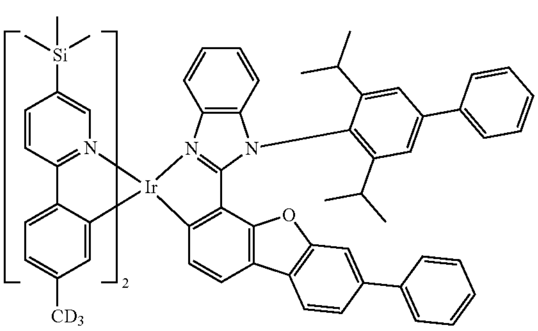

1

Synthesis of Compound 1A 2-(4-(methyl-d3)phenyl)-5-(trimethylsilyl)pyridine (4.52 grams (g), 18.5 millimoles (mmol)) and iridium chloride hydrate ($IrCl_3 \cdot (H_2O)_n$, n=3) (2.96 g, 8.40 mmol) were mixed with 30 milliliters (mL) of 2-ethoxyethanol and 10 mL of deionized (DI) water and then stirred while heating at reflux for 24 hours, and then, the temperature was allowed to cool to room temperature. The resulting solid was separated by filtration, washed sufficiently with water, methanol, and hexanes, in this stated order, and then dried in a vacuum oven to obtain 5.22 g (yield of 87%) of Compound 1A.

Synthesis of Compound 1B

Compound 1 Å (2.4 g, 1.68 mmol) and 60 mL of methylene chloride (MC) were mixed together, and then, silver trifluoromethanesulfonate (silver triflate, AgOTf) (0.86 g, 3.36 mmol) were mixed with 20 mL of methanol (MeOH) and then added thereto. Afterwards, the mixture was stirred for 18 hours at room temperature while light was blocked from the reaction contents with aluminum foil, and then the resulting product was filtered through diatomaceous earth to remove the resulting solid, and the filtrate was subjected to reduced pressure to obtain a resulting product (Compound 1B). Compound 1B was used in the next reaction without an additional purification process.

Synthesis of Compound 1

Compound 1B (2.66 g, 2.98 mmol) and Compound 1C (1-(3,5-diisopropyl-[1,1'-biphenyl]-4-yl)-2-(7-phenyldibenzo[b,d]furan-4-yl)-1H-benzo[d]imidazole) (1.78 g, 2.98 mmol) were mixed with 30 mL of 2-ethoxyethanol and 30 mL of N,N-dimethylformamide and then stirred while heating at reflux for 48 hours, and then the temperature was allowed to cool to room temperature. The obtained mixture was subjected to a reduced pressure to obtain a solid, on which column chromatography (eluent: ethyl acetate (EA) and hexanes) was performed to obtain 1.13 g (yield of 30%) of Compound 1. The obtained compound was identified by high resolution mass spectrometry (HRMS) with matrix assisted laser desorption ionization (MALDI) and by high performance liquid chromatography (HPLC) analysis.

HRMS (MALDI) calcd for $C_{73}H_{65}D_6IrN_4OSi_2$: m/z 1274.5172 Found: 1274.5171.

Synthesis Example 2 (Synthesis of Compound 2)

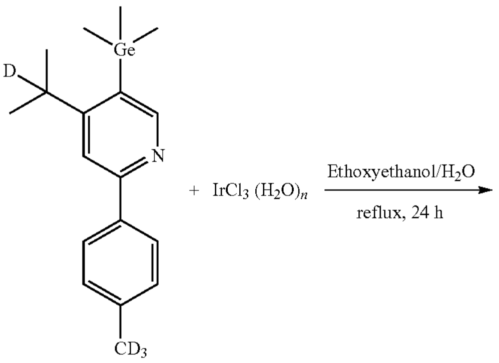

2A(1)

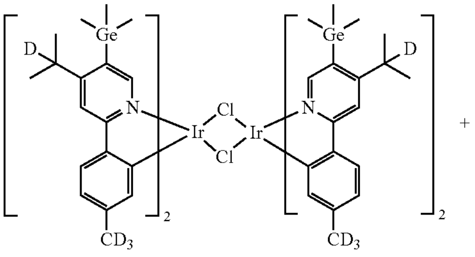

2A

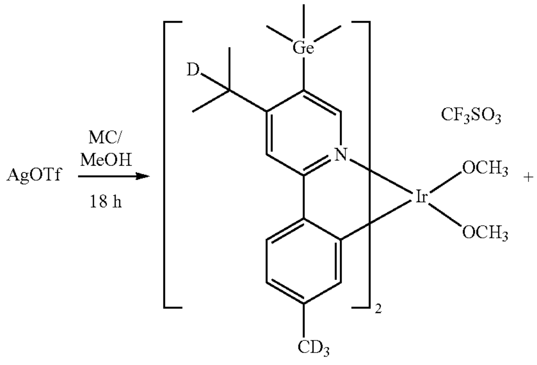

2B

-continued

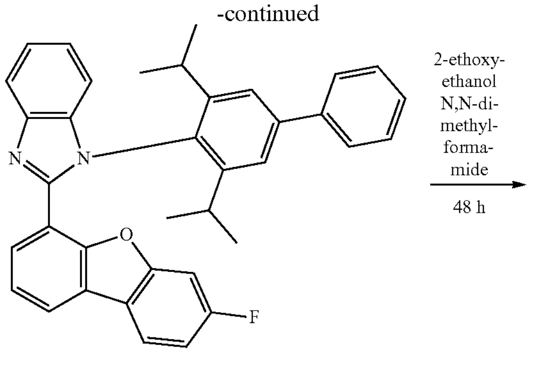

2C

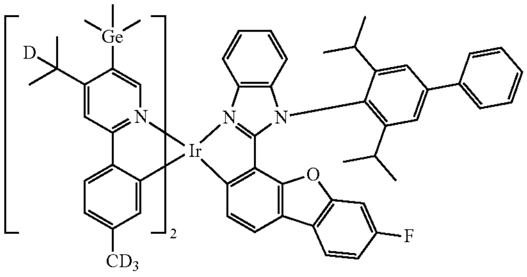

2

Synthesis of Compound 2A 6.3 g (yield of 90%) of Compound 2A was obtained in a similar manner as used to obtain Compound 1A of Synthesis Example 1, except that Compound 2A(1) (2-(4-methyl-d3)phenyl-4-(propan-2-yl-2-d)-5-(trimethylgermyl)pyridine) was used instead of 2-(4-(methyl-d3)phenyl)-5-(trimethylsilyl)pyridine.

Synthesis of Compound 2B

Compound 2B was obtained in a similar manner as used to obtain Compound 1B of Synthesis Example 1, except that Compound 2A was used instead of Compound 1A. The obtained Compound 2B was used in the next reaction without an additional purification process.

Synthesis of Compound 2

1.61 g (yield of 40%) of Compound 2 was obtained in a similar manner as used to obtain Compound 1 of Synthesis Example 1, except that Compound 2B was used instead of Compound 1B and Compound 2C (1-(3,5-diisopropyl-[1,1'-biphenyl]-4-yl)-2-(7-fluorodibenzo[b,d]furan-4-yl)-1H-naphtho[1,2-d]imidazole) was used instead of Compound 1C.

HRMS (MALDI) calcd for $C_{77}H_{72}D_8FIrN_4OGe_2$: m/z 1444.4871 Found: 1444.4870.

Synthesis Example 3 (Synthesis of Compound 3)

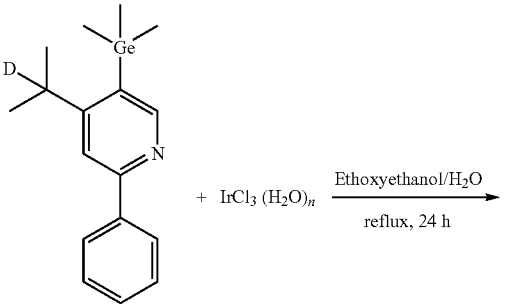

3A(1)

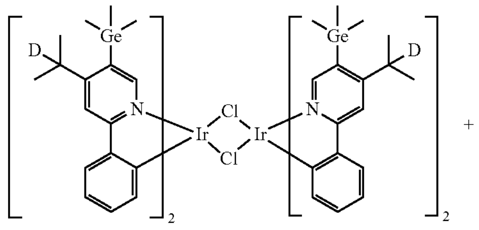

3A

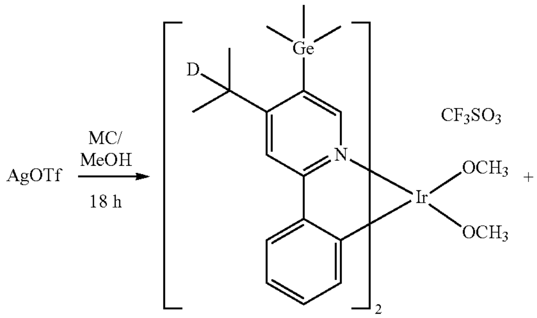

3B

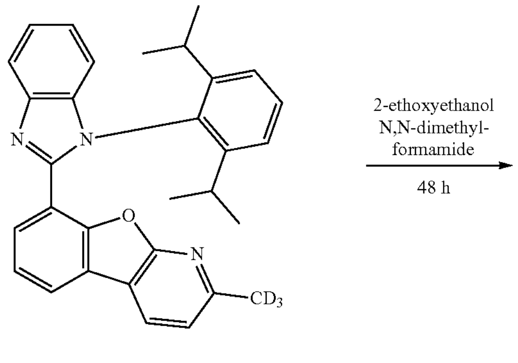

3C

-continued

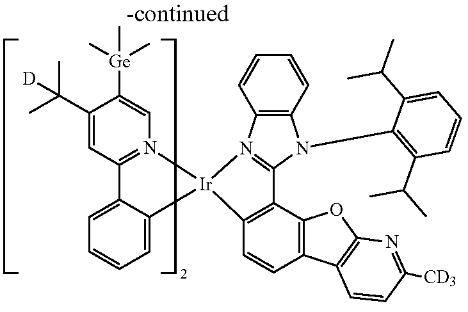

3

Synthesis of Compound 3A 6.13 g (yield of 88%) of Compound 3A was obtained in a similar manner as used to obtain Compound 1A of Synthesis Example 1, except that Compound 3A(1) (2-phenyl-4-(propan-2-yl-2-d)-5-(trimethylgermyl)pyridine) was used instead of 2-(4-(methyl-d3)phenyl)-5-(trimethylsilyl)pyridine.

Synthesis of Compound 3B

Compound 3B was obtained in a similar manner as used to obtain Compound 1B of Synthesis Example 1, except that Compound 3A was used instead of Compound 1A. The obtained Compound 3B was used in the next reaction without an additional purification process.

Synthesis of Compound 3

1.32 g (yield of 36%) of Compound 3 was obtained in a similar manner as used to obtain Compound 1 of Synthesis Example 1, except that Compound 3B was used instead of Compound 1B and Compound 3C (8-(1-(2,6-diisopropylphenyl)-1H-benzo[d]imidazol-2-yl)-2-(methyl-d3)benzofuro[2,3-b]pyridine) was used instead of Compound 1C.

HRMS (MALDI) calcd for $C_{65}H_{67}D_5Ge_2IrN_5O$: m/z 1284.4104 Found: 1281.4106.

Synthesis Example 4 (Synthesis of Compound 4)

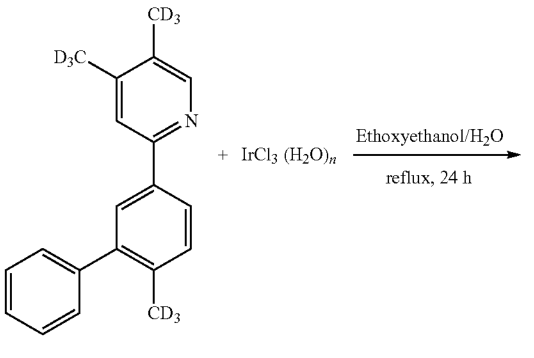

4A(1)

-continued

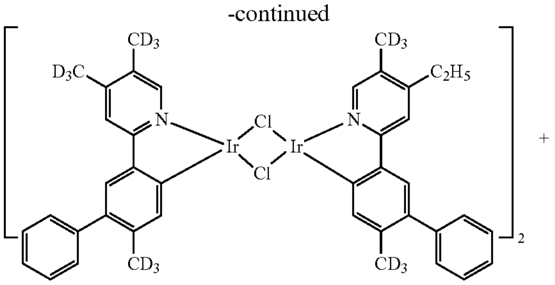

4A

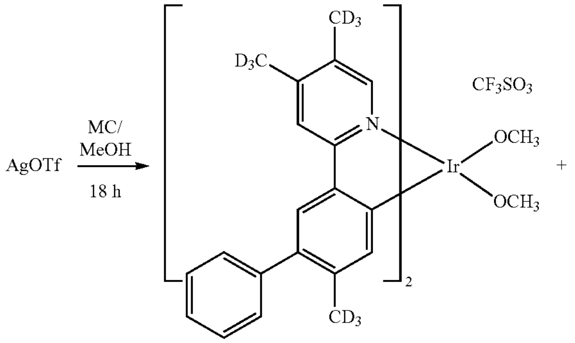

4B

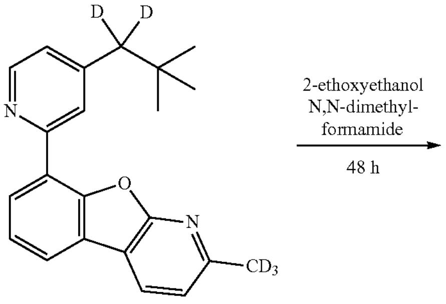

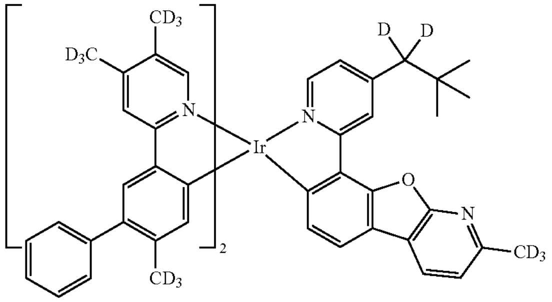

4

Synthesis of Compound 4A 4.31 g (yield of 81%) of Compound 4A was obtained in a similar manner as used to obtain Compound 1A of Synthesis Example 1, except that Compound 4A(1) (4,5-bis(methyl-d3)-2-(6-(methyl-d3)-[1,1'-biphenyl]-3-yl)pyridine) was used instead of 2-(4-(methyl-d3)phenyl)-5-(trimethylsilyl)pyridine.

Synthesis of Compound 4B

Compound 4B was obtained in a similar manner as used to obtain Compound 1B of Synthesis Example 1, except that Compound 4A was used instead of Compound 1A. The obtained Compound 4B was used in the next reaction without an additional purification process.

Synthesis of Compound 4

1.44 g (yield of 38%) of Compound 4 was obtained in a similar manner as used to obtain Compound 1 of Synthesis Example 1, except that Compound 4B was used instead of Compound 1B and Compound 4C (8-(4-(2,2-dimethylpropyl-1,1-d2)pyridin-2-yl)-2-(methyl-d3)benzofuro[2,3-b] pyridine) was used instead of Compound 1C.

HRMS (MALDI) calcd for $C_{62}H_{34}D_{23}IrN_4O$: m/z 1089.5605 Found: 1089.5606.

Synthesis Example 5 (Synthesis of Compound 5)

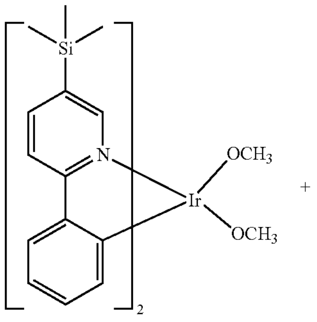

5B

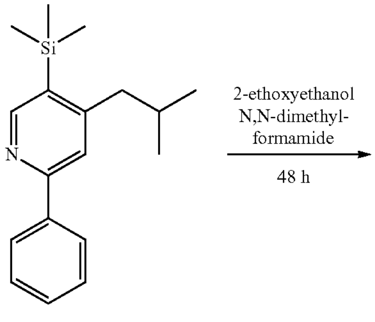

5C

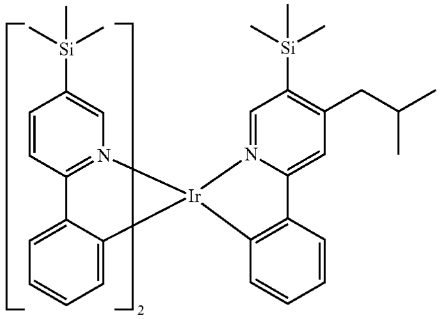

5

0.98 g (yield of 36%) of Compound 5 was obtained in a similar manner as used to obtain Compound 1 of Synthesis Example 1, except that Compound 5B was used instead of Compound 1B and Compound 5C was used instead of Compound 1C.

HRMS (MALDI) calcd for $C_{46}H_{56}IrN_3Si_3$: m/z 927.3411 Found: 927.3412.

Synthesis Example 6 (Synthesis of Compound 6)

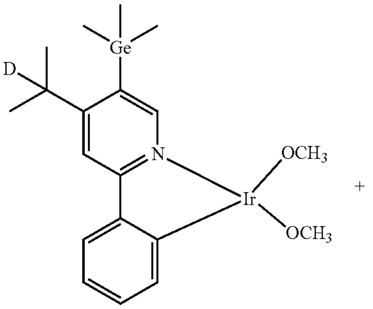

3B

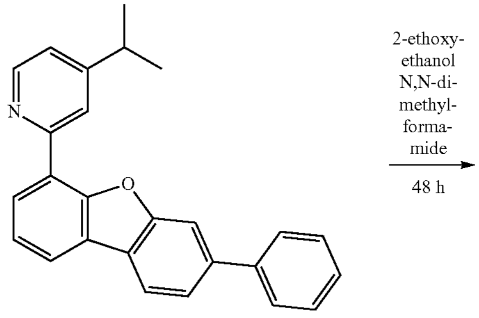

6C

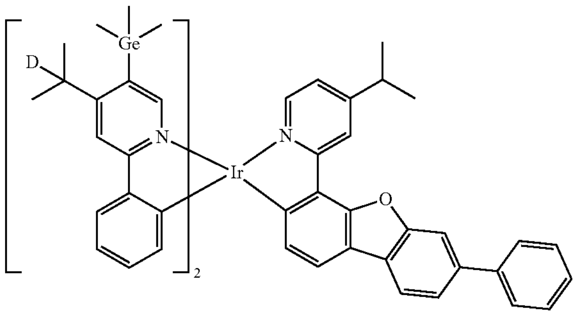

6

1.12 g (yield of 32%) of Compound 6 was obtained in a similar manner as used to obtain Compound 1 of Synthesis Example 1, except that Compound 3B was used instead of Compound 1B and Compound 6C was used instead of Compound 1C.

HRMS (MALDI) calcd for $C_{60}H_{62}D_2Ge_2IrN_3O$: m/z 1185.3228 Found: 1185.3226.

Synthesis Example 7 (Synthesis of Compound 7)

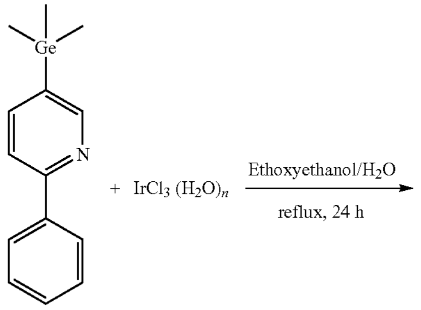

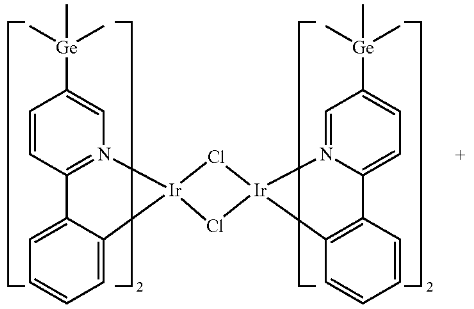

7A

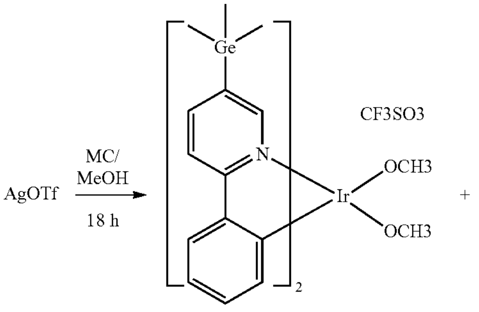

7B

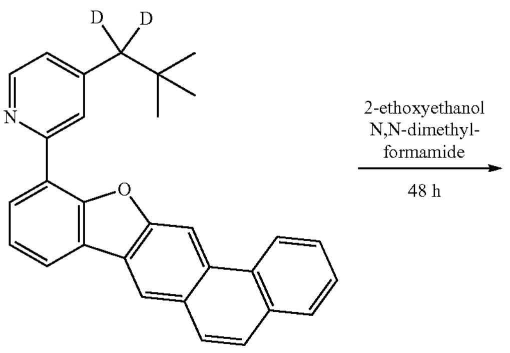

7C

-continued

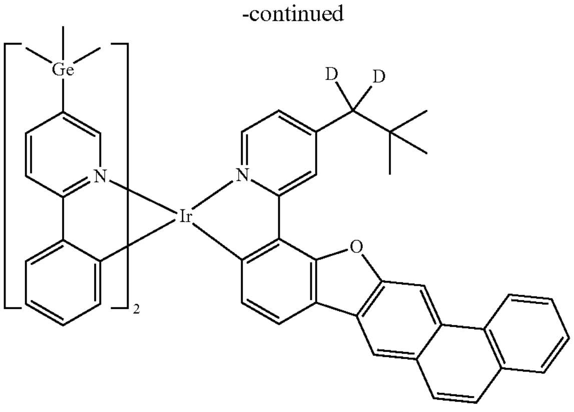

7

Synthesis of Compound 7A 4.53 g (yield of 91%) of Compound 7A was obtained in a similar manner as used to obtain Compound 1A of Synthesis Example 1, except that 2-phenyl-5-(trimethylgermyl)pyridine was used instead of 2-(4-(methyl-d3)phenyl)-5-(trimethylsilyl)pyridine.

Synthesis of Compound 7B

Compound 7B was obtained in a similar manner as used to obtain Compound 1B of Synthesis Example 1, except that Compound 7A was used instead of Compound 1A. The obtained Compound 7B was used in the next reaction without an additional purification process.

Synthesis of Compound 7

1.25 g (yield of 37%) of Compound 7 was obtained in a similar manner as used to obtain Compound 1 of Synthesis Example 1, except that Compound 7B was used instead of Compound 1B and Compound 7C was used instead of Compound 1C.

HRMS (MALDI) calcd for $C_5H_{54}D_2Ge_2IrN_3O$: m/z 1153.2602 Found: 1153.2600.

Synthesis Example 8: (Synthesis of Compound 8)

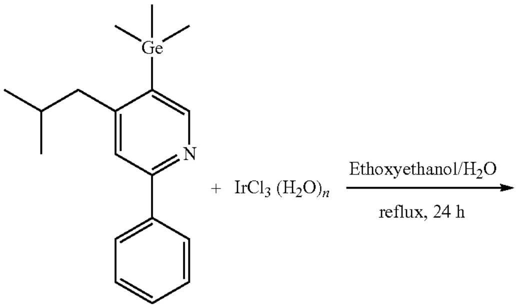

8A(1)

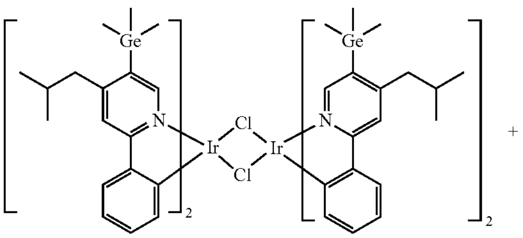

8A

-continued

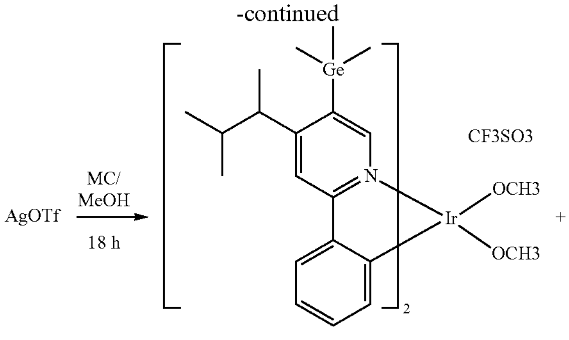

8B

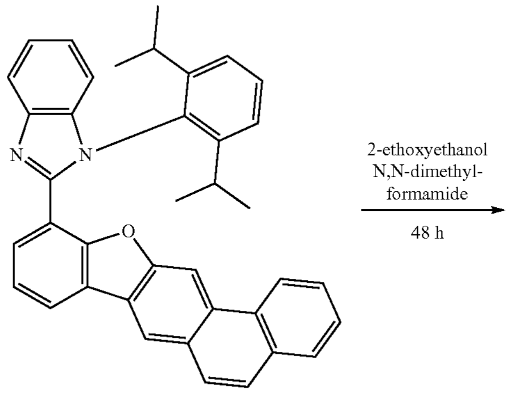

8C

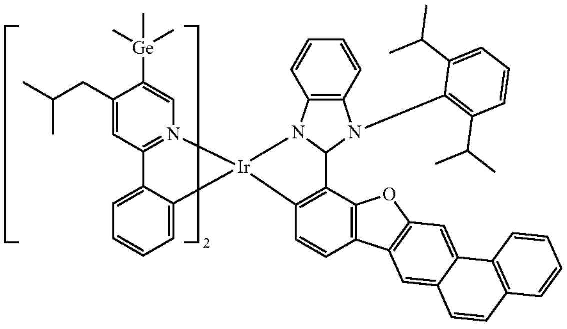

8

Synthesis of Compound 8A 4.32 g (yield of 86%) of Compound 8A was obtained in a similar manner as used to obtain Compound 1A of Synthesis Example 1, except that Compound 8A(1) was used instead of 2-(4-(methyl-d3)phenyl)-5-(trimethylsilyl)pyridine.

Synthesis of Compound 8B

Compound 8B was obtained in a similar manner as used to obtain Compound 1B of Synthesis Example 1, except that Compound 8A was used instead of Compound 1A.

The obtained Compound 8B was used in the next reaction without an additional purification process.

Synthesis of Compound 8

1.49 g (yield of 36%) of Compound 8 was obtained in a similar manner as used to obtain Compound 1 of Synthesis Example 1, except that Compound 8B was used instead of Compound 1B and Compound 8C was used instead of Compound 1C.

HRMS (MALDI) calcd for $C_{75}H_{79}Ge_2IrN_4O$: m/z 1392.4307 Found: 1392.4305.

Manufacture of OLED 1

As an anode, an ITO-patterned glass substrate was cut to a size of 50 millimeters (mm)×50 mm×0.5 mm, sonicated with isopropyl alcohol and DI water, each for 5 minutes, and then cleaned by irradiation of ultraviolet light and exposure of ozone for 30 minutes. The resultant ITO-patterned glass substrate was loaded onto a vacuum deposition apparatus.

HT3 and F6-TCNNQ were vacuum co-deposited on the anode at the weight ratio of 98:2 to form a hole injection layer having a thickness of 100 Å, and then, HT3 was vacuum-deposited on the hole injection layer to form a hole transport layer having a thickness of 1,350 Å. H-H1 was vacuum-deposited on the hole transport layer to form an electron blocking layer having a thickness of 300 Å.

Next, a host and a dopant were co-deposited on the electron blocking layer at a weight ratio described in Table 12 to form an emission layer having a thickness of 400 Å. H-H1 and H-H2 were used at a weight ratio of 5:5 as the host, and the first compound and second compound described in Table 12 were used at a weight ratio of 1:1 as the dopant.

Afterwards, ET3 and ET-D1 were co-deposited on the emission layer at a volume ratio of 50:50 to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of OLED 1.

HT3

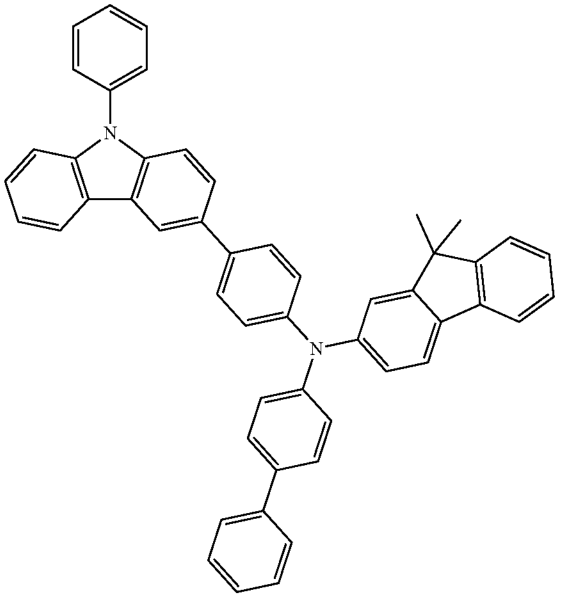

F6-TCNNQ

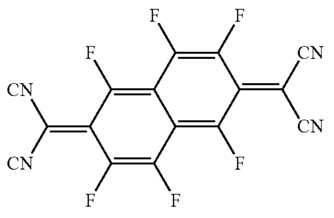

-continued

H-H1

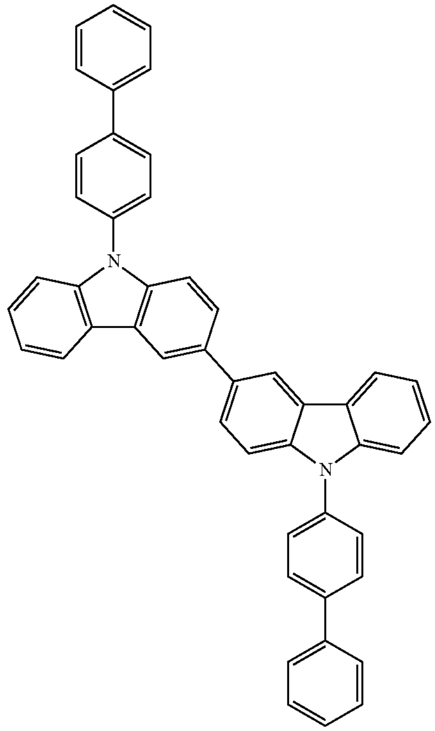

-continued

ET3

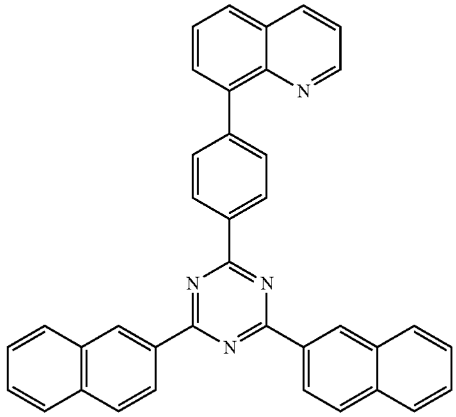

ET-D1

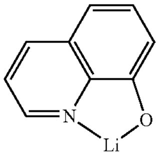

Manufacture of OLEDs 2 to 6 and A to C

OLEDs 2 to 6 and A to C were manufactured in a similar manner as used to manufacture OLED 1, except that, in forming an emission layer, compounds described in Table 12 below were used as a dopant.

H-H2

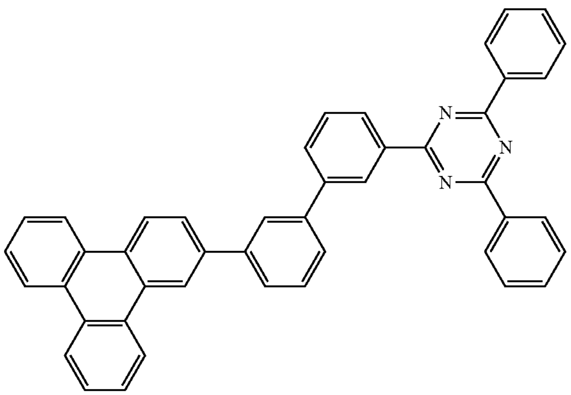

Evaluation Example 1

A driving voltage (volts, V), emission peak wavelength ($\lambda_{max}$, nm), maximum value of external quantum efficiency (Max EQE, relative % to OLED A), and lifespan ($LT_{97}$, relative % to OLED A) (hr) of each of OLEDs 1 to 6 and A to C were evaluated, and the results are shown in Tables 12 to 14. A current-voltage meter (Keithley 2400) and a luminance meter (Minolta Cs-1000A) were used as an apparatus for evaluation, the lifespan ($LT_{97}$) (at 16,000 candela per square meter ($cd/m^2$) or nit) was obtained by measuring the amount of time (hour, hr) that elapsed until luminance was reduced to 97% of the initial brightness (from the initial luminance, which is set as 100%), and the results are expressed as a relative value (%) to OLED A. Max EQE of Tables 12 to 14 was also expressed as a relative value (%) to OLED A.

TABLE 12

| | Dopant in emission layer First compound | Dopant in emission layer Second compound | Weight ratio of host to dopant in emission layer | Driving Voltage (V) | $\lambda_{max}$ (nm) | Max EQE (Relative value, %) | $LT_{97}$ (Relative value, %) |
|---|---|---|---|---|---|---|---|
| OLED 1 | 1 | 4 | 90:10 | 4.29 | 531 | 98 | 154 |
| OLED 3 | 1 | 6 | 90:10 | 4.12 | 531 | 98 | 142 |
| OLED 4 | 1 | 7 | 90:10 | 4.13 | 531 | 97 | 150 |
| OLED A | 1 | | 95:5 | 4.00 | 531 | 100 | 100 |
| OLED B | 4 | | 95:5 | 4.36 | 525 | 91 | 39 |
| OLED C | C-1 | C-2 | 90:10 | 5.4 | 516 | 42 | <10 |

TABLE 13

| | Dopant in emission layer First compound | Dopant in emission layer Second compound | Weight ratio of host to dopant in emission layer | Driving Voltage (V) | $\lambda_{max}$ (nm) | Max EQE (Relative value, %) | $LT_{97}$ (Relative value, %) |
|---|---|---|---|---|---|---|---|
| OLED 5 | 3 | 4 | 90:10 | 4.28 | 530 | 102 | 75 |
| OLED 6 | 8 | 4 | 90:10 | 4.30 | 530 | 102 | 140 |
| OLED B | 4 | | 95:5 | 4.36 | 525 | 91 | 39 |
| OLED C | C-1 | C-2 | 90:0 | 5.4 | 516 | 42 | <10 |

TABLE 14

| | Dopant in emission layer First compound | Dopant in emission layer Second compound | Weight ratio of host to dopant in emission layer | Driving Voltage (V) | $\lambda_{max}$ (nm) | Max EQE (Relative value, %) | $LT_{97}$ (Relative value, %) |
|---|---|---|---|---|---|---|---|
| OLED 2 | 2 | 5 | 90:10 | 4.15 | 525 | 86 | 85 |
| OLED C | C-1 | C-2 | 90:10 | 5.4 | 516 | 42 | <10 |

1

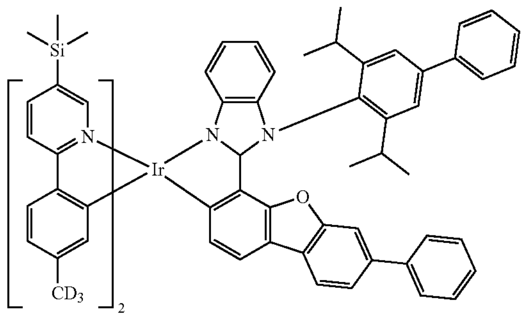

2

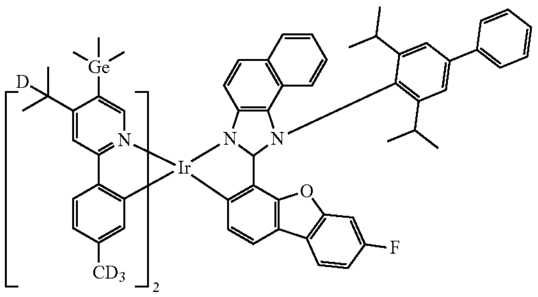

-continued

3

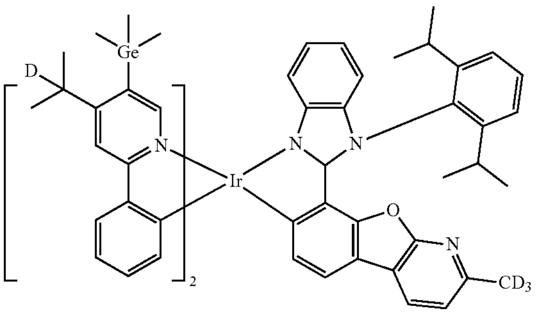

4

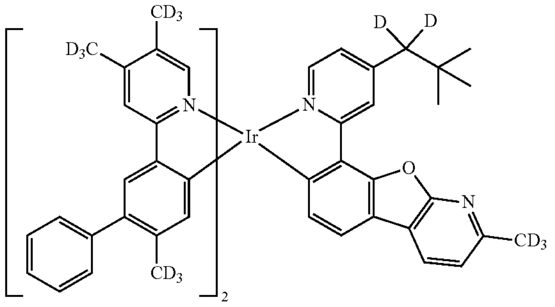

-continued

5

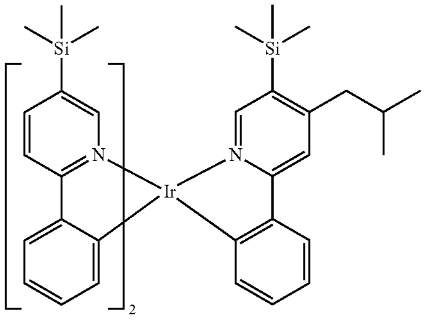

6

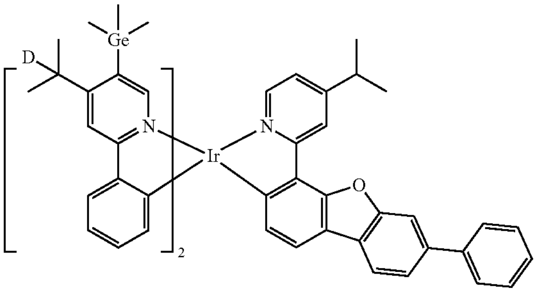

7

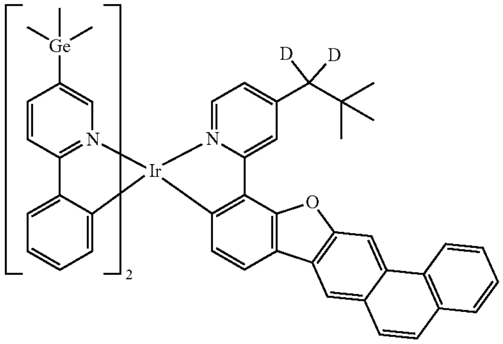

8

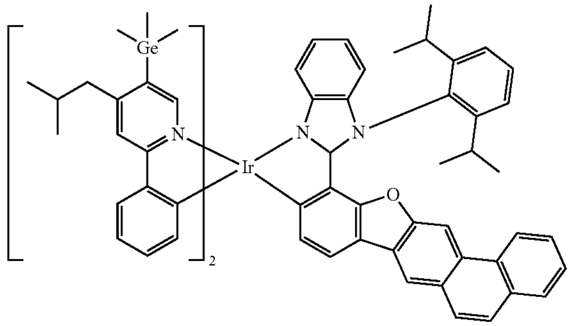

C-1

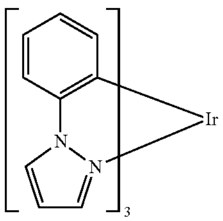

-continued

C-2

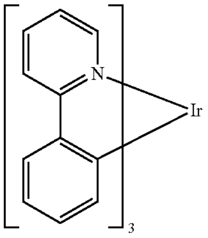

It was confirmed that 1) referring to Table 12, OLED 1 emits green light, and improved or equivalent external quantum efficiency and improved lifespan characteristics, compared to those of each of OLEDs A to C, 2) referring to Table 12, each of OLEDs 3 and 4 emit green light, and have improved driving voltage, improved external quantum efficiency, and improved lifespan characteristics compared to those of each of OLED C, 3) referring to Table 13, each of OLEDs 5 and 6 emit green light, and have improved driving voltage, improved external quantum efficiency, and improved lifespan characteristics compared to those of each of OLEDs B and C, and 3) referring to Table 14, OLED 2 emits green light, and has improved driving voltage, improved external quantum efficiency, and improved lifespan characteristics compared to those of OLED C.

An electronic device, for example, a light-emitting device, including the composition may have improved driving voltage, improved external quantum efficiency, and improved lifespan characteristics.

It should be understood that the one or more exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. A composition, comprising a first compound represented by Formula 1 and a second compound represented by Formula 2:

$$Ir(L_{11})_{n11}(L_{12})_{n12}(L_{13})_{n13}$$ Formula 1

$$Ir(L_{21})_{n21}(L_{22})_{n22}(L_{23})_{n23}$$ Formula 2 wherein, in Formulae 1 and 2, $L_{11}$ is a ligand represented by Formula 1-1, $L_{12}$ is a ligand represented by Formula 1-2, $L_{13}$ is a ligand represented by Formula 1-1 or a ligand represented by Formula 1-2, $L_{21}$ is a ligand represented by Formula 2-1, $L_{22}$ is a ligand represented by Formula 2-2, $L_{23}$ is a ligand represented by Formula 2-1 or a ligand represented by Formula 2-2, $L_{11}$, $L_{12}$, and $L_{13}$ are different from one another, n11 and n12 are each independently 1 or 2, n13 is 0 or 1, a sum of n11, n12, and n13 is 3, $L_{21}$, $L_{22}$, and $L_{23}$ are different from one another, n21 and n22 are each independently 1 or 2, n23 is 0 or 1, a sum of n21, n22, and n23 is 3, $L_{11}$ and $L_{21}$ are different from each other:

Formula 1-1

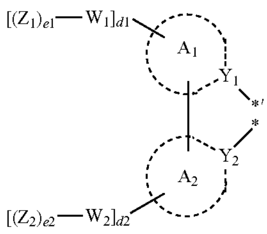

Formula 1-2

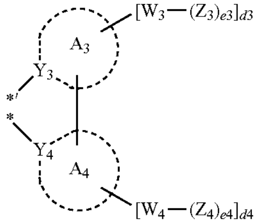

Formula 2-1

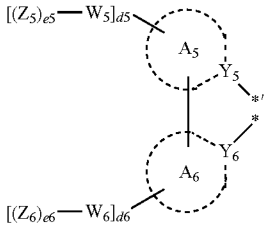

Formula 2-2

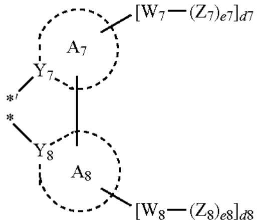

wherein, in Formulae 1-1, 1-2, 2-1, and 2-2, $Y_1$, $Y_3$, $Y_5$, and $Y_7$ are N, $Y_2$, $Y_4$, $Y_6$, and $Y_8$ are C, ring $A_1$, ring $A_3$, ring $A_5$, and ring $A_7$ are each a $C_1$-$C_{30}$ heterocyclic group, ring $A_2$, ring $A_4$, ring $A_6$, and ring $A_5$ are each independently a $C_5$-$C_{30}$ carbocyclic group or a $C_1$-$C_{30}$ heterocyclic group, ring $A_1$ and ring $A_3$ are different from each other, a $Y_3$-containing monocyclic group in $A_3$ is a 5-membered ring, $W_1$ to $W_8$ are each independently a single bond, a $C_1$-$C_{20}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $Z_1$ to $Z_8$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-Coo aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, e1 to e8 and d1 to d8 are each independently an integer from 0 to 20, one or more of i) two or more of a plurality of $Z_1$(s), ii) two or more of a plurality of $Z_2$(s), iii) two or more of a plurality of $Z_3$(s), iv) two or more of a plurality of $Z_4$(s), v) two or more of a plurality of $Z_5$(s), vi) two or more of a plurality of $Z_6$(s), vii) two or more of a plurality of $Z_7$(s), and viii) two or more of a plurality of $Z_8$(s) are respectively optionally bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is as described in connection with $Z_1$,

* and *' in Formulae 1-1, 1-2, 2-1, and 2-2 each indicate a binding site to iridium in Formulae 1 and 2, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_2$-$C_{60}$ heteroarylthio group, the substituted monovalent non-aromatic condensed polycyclic group, and the substituted monovalent non-aromatic condensed heteropolycyclic group is:

deuterium, —F, —$C_1$, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —$C_1$, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —$C_1$, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof; or —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$;

and $Q_1$ to $Q_9$, $Q_{11}$ to $Q_{19}$, $Q_{21}$ to $Q_{29}$, and $Q_{31}$ to $Q_{39}$ are each independently: hydrogen, deuterium, —F, —$C_1$, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, a $C_1$-$C_{60}$ alkyl group, a $C_6$-$C_{60}$ aryl group, a $C_7$-$C_{60}$ alkyl aryl group, a $C_7$-$C_{60}$ aryl alkyl group, or a combination thereof.

2. The composition of claim 1, wherein n13 of Formula 1 is 0, and n23 of Formula 2 is 0.

3. The composition of claim 1, wherein ring $A_1$ and ring $A_5$ are each independently:

a pyridine group, a pyrimidine group, a pyridazine group, or a pyrazine group; or a pyridine group, a pyrimidine group, a pyridazine group, or a pyrazine group, each condensed with at least one of a cyclohexane group, a norbornane group, a benzene group, or a combination thereof ring $A_3$ is an imidazole group, a benzimidazole group, a naphthoimidazole group, a phenanthrenoimidazole group, a pyridinoimidazole group, an oxazole group, a benzoxazole group, a naphthooxazole group, a phenanthrenooxazole group, a pyridinooxazole group, a thiazole group, a benzothiazole group, a naphthothiazole group, a phenanthrenothiazole group, or a pyridinothiazole group, ring $A_7$ is:

a pyridine group, a pyrimidine group, a pyridazine group, or a pyrazine group;

a pyridine group, a pyrimidine group, a pyridazine group, or a pyrazine group, each condensed with at least one of a cyclohexane group, a norbornane group, a benzene group, or a combination thereof; or an imidazole group, a benzimidazole group, a naphthoimidazole group, a phenanthrenoimidazole group, a pyridinoimidazole group, an oxazole group, a benzoxazole group, a naphthooxazole group, a phenanthrenooxazole group, a pyridinooxazole group, a thiazole group, a benzothiazole group, a naphthothiazole group, a phenanthrenothiazole group, or a pyridinothiazole group.

4. The composition of claim 1, wherein ring $A_2$ and ring $A_4$ are different from each other.

5. The composition of claim 1, wherein ring $A_6$ and ring $A_5$ are different from each other.

6. The composition of claim 1, wherein ring $A_2$ and ring $A_6$ are each independently:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with at least one of a cyclohexane group, a norbornane group, a benzene group, or a combination thereof, and ring $A_4$ and ring $A_5$ are each independently:

a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, an azadibenzosilole group or a phenanthrobenzofuran group; or a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or an azadibenzosilole group, each condensed with at least one of a benzene group, a pyridine group, a pyrimidine group, a pyridazine group, a pyrazine group, a cyclohexane group, a norbornane group, a furan group, a thiophene group, a selenophene group, a pyrrole group, a cyclopentadiene group, a silole group, a pyrazole group, an imidazole group, an oxazole group, a thiazole group, an isoxazole group, an isothiazole group, or a combination thereof.

7. The composition of claim 1, wherein e1 and d1 are each not 0, one or more Z(s) are each independently:

a $C_1$-$C_{20}$ alkyl group that is unsubstituted or substituted with at least one of deuterium, —F, a phenyl group, or a combination thereof;

—$Si(Q_3)(Q_4)(Q_5)$; or

—$Ge(Q_3)(Q_4)(Q_5)$.

8. The composition of claim 1, wherein e5 and d5 are each not 0, one or more $Z_5$(s) are each independently:

a $C_1$-$C_{20}$ alkyl group that is unsubstituted or substituted with at least one of deuterium, —F, a phenyl group, or a combination thereof;

—$Si(Q_3)(Q_4)(Q_5)$; or

—$Ge(Q_3)(Q_4)(Q_5)$.

9. The composition of claim 1, wherein a group represented by

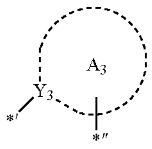

in Formula 1-2 is a group represented by one of Formulae NR29 to NR48, and a group represented by

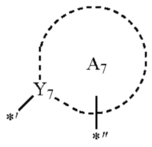

in Formula 2-2 is a group represented by one of Formulae NR1 to NR48:

NR1

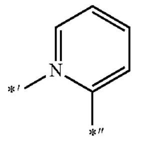

NR2

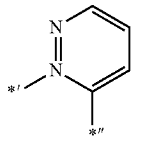

NR3

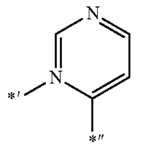

NR4

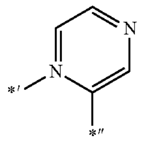

NR5

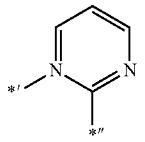

NR6

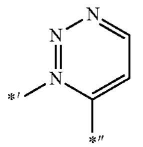

NR7

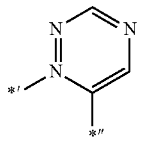

NR8

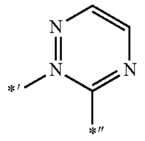

NR9

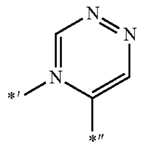

RN10

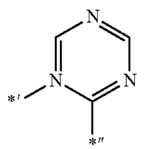

NR11
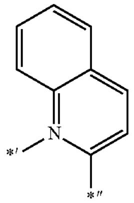
NR12
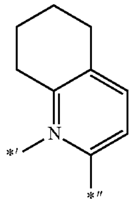
NR13
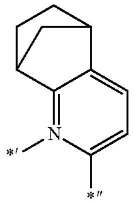
NR14
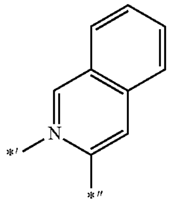
NR15
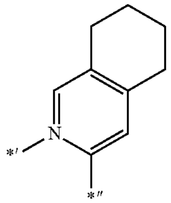
NR16
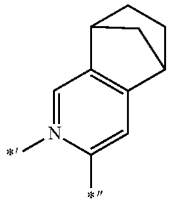
NR17
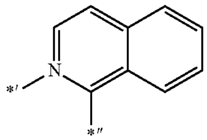
NR18
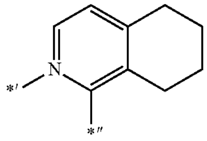
NR19
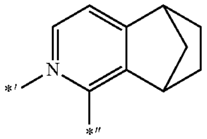
NR20
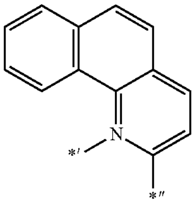
NR21
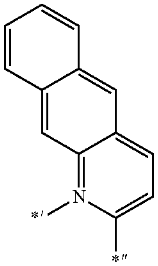
NR22
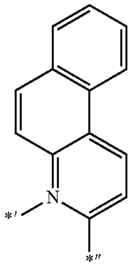
NR23
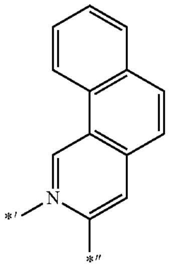
NR24
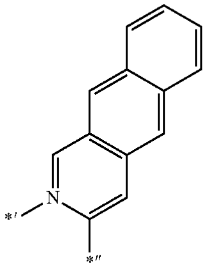

-continued
NR25
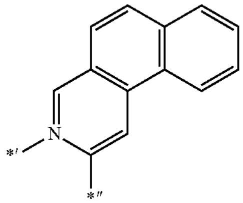
NR26
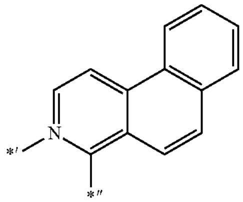
NR27
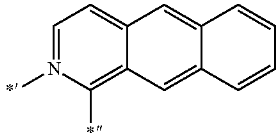
NR28
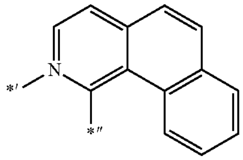
NR29
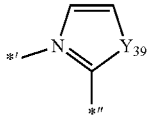
NR30
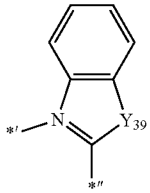
NR31
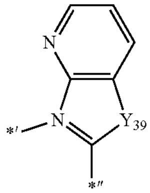
NR32
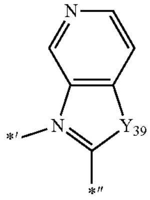
-continued
NR33
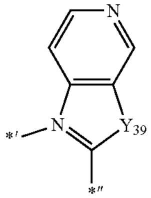
NR34
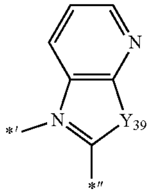
NR35
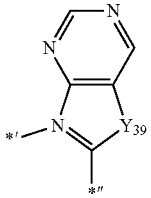
NR36
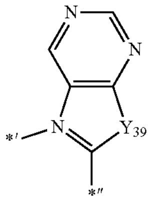
NR37
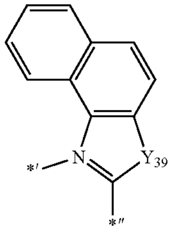
NR38
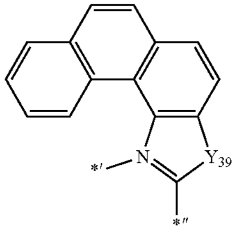
NR39
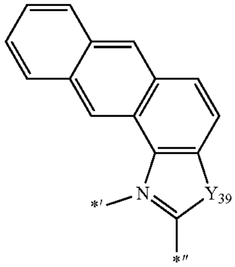

-continued

NR40

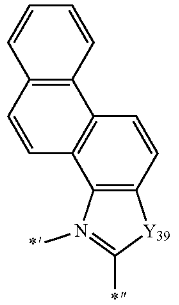

NR41

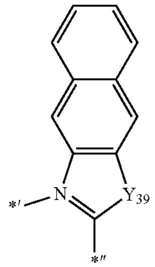

NR42

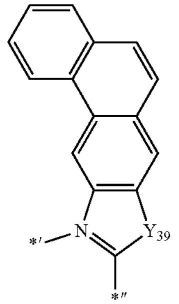

NR43

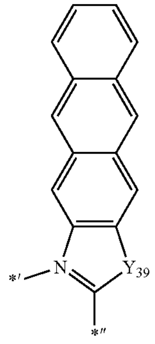

NR44

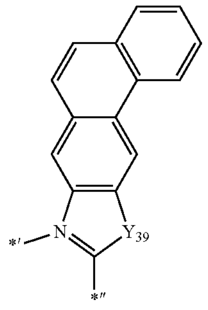

-continued

NR45

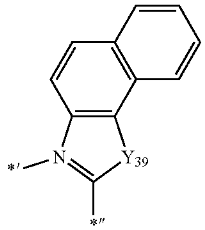

NR46

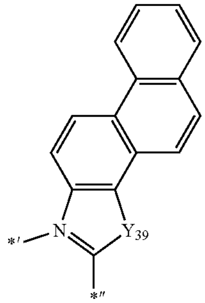

NR47

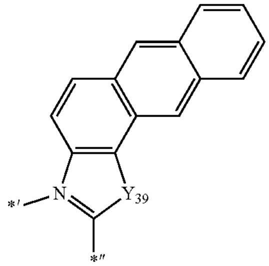

NR48

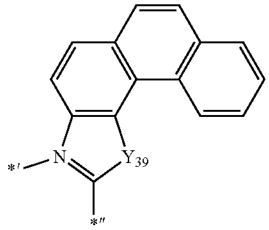

wherein, in Formulae NR1 to NR48, $Y_{39}$ is O, S, Se, N—[$W_3$—$(Z_3)_{e3}$], N—[$W_7$—$(Z_7))_{e7}$], C($Z_{39a}$)($Z_{39b}$), C($Z_{79a}$)($Z_{79b}$), Si($Z_{39a}$)($Z_{39b}$), or Si($Z_{79a}$)($Z_{79b}$), $W_3$, $W_7$, $Z_3$, $Z_7$, e3, and e7 are respectively as described in claim 1, $Z_{39a}$ and $Z_{39b}$ are respectively as described in connection with $Z_3$ in claim 1, and $Z_{79a}$ and $Z_{79b}$ are respectively as described in connection with $Z_7$ in claim 1,

*' indicates a binding site to iridium in Formula 1 or 2, and *" indicates a binding site to ring $A_4$ or ring $A_8$.

10. The composition of claim 9, wherein a group represented by

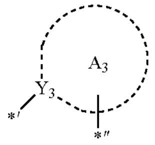

in Formula 1-2 is a group represented by one of Formulae NR30 to NR48, wherein Formulae NR30 to NR48 are as described in claim 9.

11. The composition of claim 1, wherein a group represented by

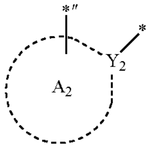

in Formula 1-1, a group represented by

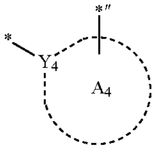

in Formula 1-2, a group represented by

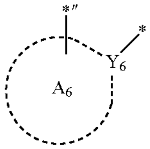

in Formula 2-1, and a group represented by

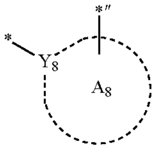

in Formula 2-2 are each independently a group represented by one of Formulae CR1 to CR29:

CR1

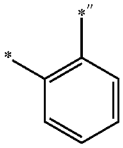

CR2

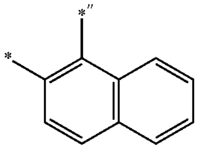

-continued

CR3

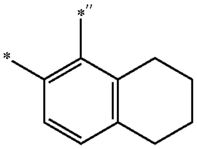

CR4

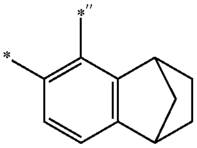

CR5

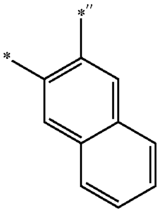

CR6

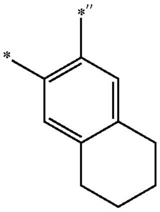

CR7

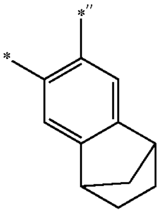

CR8

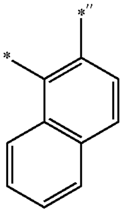

CR9

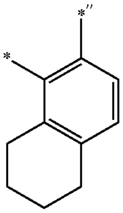

-continued
CR10
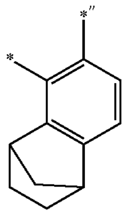
CR11
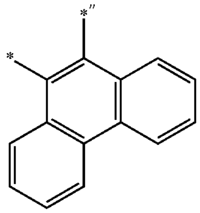
CR12
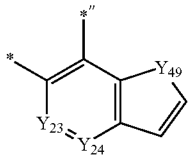
CR13
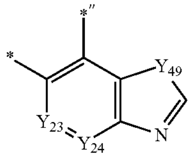
CR14
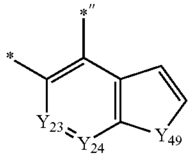
CR15
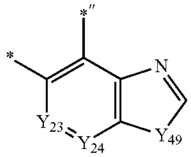
CR16
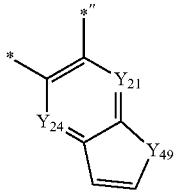
CR17
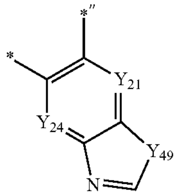
-continued
CR18
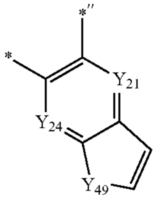
CR19
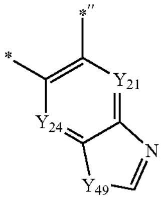
CR20
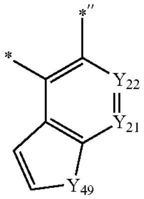
CR21
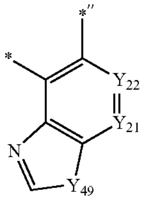
CR22
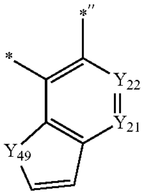
CR23
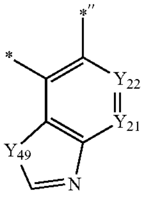
CR24
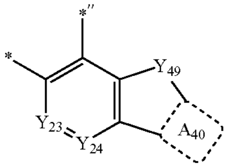

-continued

CR25

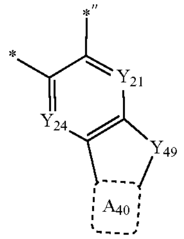

CR26

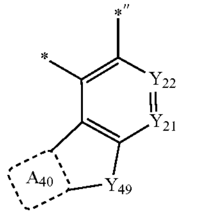

CR27

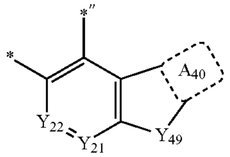

CR28

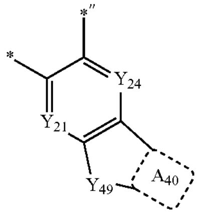

CR29

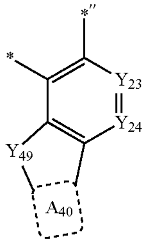

wherein, in Formulae CR1 to CR29, $Y_{49}$ is O, S, Se, N—[$W_2$—$(Z_2)_{e2}$], N—[$W_4$—$(Z_4)_{e4}$], N—[$W_6$—$(Z_6)_{e6}$], N—[$W_8$—$(Z_8)_{e8}$], C($Z_{29a}$)($Z_{29b}$), C($Z_{49a}$)($Z_{49b}$), C($Z_{69a}$)($Z_{69b}$), C($Z_{89a}$)($Z_{89b}$), Si($Z_{29a}$)($Z_{29b}$), Si($Z_{49a}$)($Z_{49b}$), Si($Z_{69a}$)($Z_{69b}$), or Si($Z_{89a}$)($Z_{89b}$), $W_2$, $W_4$, $W_6$, $W_8$, $Z_2$, $Z_4$, $Z_6$, $Z_8$, e2, e4, e6, and e8 are respectively as described in claim 1, $Z_{29}$a and $Z_{29}$b are respectively as described in connection with $Z_2$ in claim 1, $Z_{49}$a and $Z_{49}$b are respectively as described in connection with $Z_4$ in claim 1, $Z_{69}$a and $Z_{69}$b are respectively as described in connection with $Z_6$ in claim 1, and $Z_{89}$a and $Z_{89}$b are respectively as described in connection with $Z_8$ in claim 1, $Y_{21}$ to $Y_{24}$ are each independently N or C, ring $A_{40}$ is a $C_5$-$C_{30}$ carbocyclic group or a $C_1$-$C_{30}$ heterocyclic group,

* indicates a binding site to iridium in Formulae 1 and 2, and

*" indicates a binding site to ring $A_1$, ring $A_3$, ring $A_5$, and ring $A_7$.

12. The composition of claim 1, wherein the first compound emits a first light comprising a first spectrum, and λP(1) is an emission peak wavelength in nanometers of the first spectrum, the second compound emits a second light comprising a second spectrum, and λP(2) is an emission peak wavelength in nanometers of the second spectrum, and λP(1) and λP(2) are each 480 nanometers to 580 nanometers.

13. The composition of claim 1, wherein the first compound emits a first light comprising a first spectrum, and λP(1) is an emission peak wavelength in nanometers of the first spectrum, the second compound emits a second light comprising a second spectrum, and λP(2) is an emission peak wavelength in nanometers of the second spectrum, and an absolute value of a difference between λP(1) and λP(2) is 0 nanometers to 30 nanometers.

14. A layer, comprising the composition of claim 1.

15. A light-emitting device, comprising:

a first electrode;

a second electrode; and an organic layer located between the first electrode and the second electrode, wherein the organic layer comprises an emission layer, and wherein the organic layer comprises the composition of claim 1.

16. The light-emitting device of claim 15, wherein the emission layer comprises the composition.

17. An electronic apparatus, comprising the light-emitting device of claim 15.

* * * * *